US009313393B2

(12) United States Patent
Olsen et al.

(10) Patent No.: US 9,313,393 B2
(45) Date of Patent: Apr. 12, 2016

(54) DIGITAL CAMERA WITH MULTIPLE PIPELINE SIGNAL PROCESSORS

(71) Applicant: CALLAHAN CELLULAR L.L.C., Wilmington, DE (US)

(72) Inventors: Richard Ian Olsen, Truckee, CA (US); Darryl L. Sato, Irvine, CA (US); Borden Moller, Laguna Beach, CA (US); Olivera Vitomirov, Foothill Ranch, CA (US); Jeffrey A. Brady, Newport Beach, CA (US); Ferry Gunawan, Diamond Bar, CA (US); Remzi Oten, Irvine, CA (US); Feng-Qing Sun, Irvine, TX (US); James Gates, Carlsbad, CA (US)

(73) Assignee: CALLAHAN CELLULAR L.L.C., Wilmington, DE (US)

( * ) Notice: Subject to any disclaimer, the term of this patent is extended or adjusted under 35 U.S.C. 154(b) by 196 days.

(21) Appl. No.: 14/171,963

(22) Filed: Feb. 4, 2014

(65) Prior Publication Data

US 2014/0232894 A1 Aug. 21, 2014

Related U.S. Application Data

(60) Continuation of application No. 13/786,803, filed on Mar. 6, 2013, now Pat. No. 8,664,579, which is a continuation of application No. 13/006,351, filed on Jan. 13, 2011, now Pat. No. 8,415,605, which is a (Continued)

(51) Int. Cl.
*H04N 5/228* (2006.01)
*G02B 7/04* (2006.01)

(Continued)

(52) U.S. Cl.
CPC .............. *H04N 5/228* (2013.01); *G02B 3/0062* (2013.01); *G02B 3/0075* (2013.01); *G02B 7/04* (2013.01);

(Continued)

(58) Field of Classification Search
CPC .... H04N 5/228; G02B 3/0062; G02B 3/0075; G02B 7/04; G02B 9/12
USPC ....................................... 250/208.1
See application file for complete search history.

(56) References Cited

U.S. PATENT DOCUMENTS 3,609,367 A 9/1971 Barron
3,971,065 A 7/1976 Bayer (Continued)

FOREIGN PATENT DOCUMENTS

EP 0 599 470 6/1994
EP 1 032 045 8/2000
JP 62-011264 1/1987

OTHER PUBLICATIONS

Communication from the European Patent Office on European Patent Application 05793927.4, mailed Feb. 10, 2012.

(Continued)

*Primary Examiner* — Seung C Sohn

(57) ABSTRACT

A method includes sampling a first intensity of light with a first array of photo detectors of a digital camera. A second intensity of light is sampled with a second array of photo detectors of the digital camera. A first channel processor coupled to the first array of photo detectors generates a first image using first array data which is representative of the first intensity of light sampled by the first array of photo detectors. A second channel processor coupled to the second array of photo detectors generates a second image using second array data which is representative of the second intensity of light sampled by the second array of photo detectors. The first array of photo detectors, the second array of photo detectors, the first channel processor, and the second channel processor are integrated on or in a semiconductor substrate.

20 Claims, 239 Drawing Sheets

Related U.S. Application Data continuation of application No. 11/888,582, filed on Aug. 1, 2007, now Pat. No. 7,884,309, which is a division of application No. 11/212,803, filed on Aug. 25, 2005, now abandoned.

(60) Provisional application No. 60/604,854, filed on Aug. 25, 2004, provisional application No. 60/695,946, filed on Jul. 1, 2005.

(51) Int. Cl.

| | | |
|---|---|---|
| *G02B 9/12* | (2006.01) | |
| *G02B 13/00* | (2006.01) | |
| *G03B 13/18* | (2006.01) | |
| *H01L 27/146* | (2006.01) | |
| *H01L 31/0232* | (2014.01) | |
| *H04N 5/225* | (2006.01) | |
| *H04N 5/235* | (2006.01) | |
| *H04N 5/33* | (2006.01) | |
| *H04N 5/335* | (2011.01) | |
| *H04N 5/353* | (2011.01) | |
| *H04N 9/04* | (2006.01) | |
| *H04N 9/09* | (2006.01) | |
| *H04N 9/097* | (2006.01) | |
| *H04N 13/02* | (2006.01) | |
| *G02B 3/00* | (2006.01) | |

(52) U.S. Cl.
CPC .............. *G02B 9/12* (2013.01); *G02B 13/0035* (2013.01); *G03B 13/18* (2013.01); *H01L 27/1469* (2013.01); *H01L 27/14618* (2013.01); *H01L 27/14621* (2013.01); *H01L 27/14625* (2013.01); *H01L 27/14634* (2013.01); *H01L 27/14645* (2013.01); *H01L 31/0232* (2013.01); *H04N 5/2253* (2013.01); *H04N 5/2254* (2013.01); *H04N 5/2257* (2013.01); *H04N 5/2353* (2013.01); *H04N 5/332* (2013.01); *H04N 5/335* (2013.01); *H04N 5/3532* (2013.01); *H04N 9/045* (2013.01); *H04N 9/09* (2013.01); *H04N 9/097* (2013.01); *H04N 13/0214* (2013.01); *H04N 13/0253* (2013.01); *G02B 3/0031* (2013.01); *G02B 3/0043* (2013.01); *H01L 2924/0002* (2013.01); *H04N 2209/049* (2013.01)

(56) References Cited

U.S. PATENT DOCUMENTS

| | | | |
|---|---|---|---|
| 4,323,925 | A | 4/1982 | Abell et al. |
| 4,385,373 | A | 5/1983 | Howe |
| 4,688,080 | A | 8/1987 | Wagner |
| 4,894,672 | A | 1/1990 | Tanaka |
| 5,005,083 | A | 4/1991 | Grage et al. |
| 5,051,830 | A | 9/1991 | Von Hoessle |
| 5,436,660 | A | 7/1995 | Sakamoto |
| 5,604,534 | A | 2/1997 | Hedges et al. |
| 5,654,752 | A | 8/1997 | Yamazaki |
| 5,691,765 | A | 11/1997 | Schieltz et al. |
| 5,694,165 | A | 12/1997 | Yamazaki et al. |
| 5,742,659 | A | 4/1998 | Atac et al. |
| 5,760,832 | A | 6/1998 | Yamanaka et al. |
| 5,766,980 | A | 6/1998 | Ohtagaki et al. |
| 5,850,479 | A | 12/1998 | Terry et al. |
| 6,100,937 | A | 8/2000 | DiMeo |
| 6,137,535 | A | 10/2000 | Meyers |
| 6,195,126 | B1 | 2/2001 | Kikuchi et al. |
| 6,375,075 | B1 | 4/2002 | Ackley et al. |
| 6,381,072 | B1 | 4/2002 | Burger |
| 6,429,898 | B1 | 8/2002 | Shoda et al. |
| 6,437,335 | B1 | 8/2002 | Bohn |
| 6,570,613 | B1 | 5/2003 | Howell |
| 6,611,289 | B1 | 8/2003 | Yu et al. |
| 6,617,565 | B2 | 9/2003 | Wu |
| 6,714,239 | B2 | 3/2004 | Guidash |
| 6,727,521 | B2 | 4/2004 | Merrill |
| 6,765,617 | B1 | 7/2004 | Tangen et al. |
| 6,833,873 | B1 | 12/2004 | Suda |
| 6,834,161 | B1 | 12/2004 | Stiehler |
| 6,841,816 | B2 | 1/2005 | Merrill et al. |
| 6,859,299 | B1 | 2/2005 | Chiao |
| 6,882,368 | B1 | 4/2005 | Suda |
| 6,885,398 | B1 | 4/2005 | Sladen |
| 6,885,404 | B1 | 4/2005 | Suda |
| 6,885,508 | B2 | 4/2005 | Yamaguchi et al. |
| 6,903,770 | B1 | 6/2005 | Kobayashi et al. |
| 6,946,647 | B1 | 9/2005 | O'Neill et al. |
| 6,952,228 | B2 | 10/2005 | Yoneda et al. |
| 6,999,130 | B2 | 2/2006 | Tanigawa |
| 7,095,159 | B2 | 8/2006 | Machida |
| 7,115,853 | B2 | 10/2006 | Jiang et al. |
| 7,123,298 | B2 | 10/2006 | Schroeder et al. |
| 7,170,665 | B2 | 1/2007 | Kaneko et al. |
| 7,199,348 | B2 | 4/2007 | Olsen et al. |
| 7,206,136 | B2 | 4/2007 | Labaziewicz et al. |
| 7,214,926 | B2 | 5/2007 | Gruhlke et al. |
| 7,223,954 | B2 | 5/2007 | McNulty |
| 7,236,306 | B2 | 6/2007 | Janson, Jr. et al. |
| 7,239,345 | B1 | 7/2007 | Rogina |
| 7,256,944 | B2 | 8/2007 | Labaziewicz et al. |
| 7,280,290 | B2 | 10/2007 | Araki et al. |
| 7,305,180 | B2 | 12/2007 | Labaziewicz et al. |
| 7,358,483 | B2 | 4/2008 | Mitsugi et al. |
| 7,362,357 | B2 | 4/2008 | Brown et al. |
| 7,379,104 | B2 | 5/2008 | Hattori et al. |
| 7,417,674 | B2 | 8/2008 | Gruhlke |
| 7,436,038 | B2 | 10/2008 | Engelmann et al. |
| 7,460,160 | B2 | 12/2008 | Hershey et al. |
| 7,570,809 | B1 * | 8/2009 | Srinivasa ................ G06T 5/007 382/162 |
| 7,864,211 | B2 * | 1/2011 | Mowry ................ G02B 3/0056 348/195 |
| 2002/0020845 | A1 | 2/2002 | Ogura et al. |
| 2002/0024606 | A1 | 2/2002 | Yuki et al. |
| 2002/0051071 | A1 | 5/2002 | Itano et al. |
| 2002/0067416 | A1 | 6/2002 | Yoneda et al. |
| 2002/0075481 | A1 | 6/2002 | Roustaei |
| 2002/0089596 | A1 | 7/2002 | Suda |
| 2002/0113888 | A1 | 8/2002 | Sonoda et al. |
| 2002/0122124 | A1 | 9/2002 | Suda |
| 2002/0142798 | A1 | 10/2002 | Miyake |
| 2003/0020814 | A1 | 1/2003 | Ono |
| 2003/0086013 | A1 | 5/2003 | Aratani |
| 2003/0095711 | A1 | 5/2003 | McGuinness et al. |
| 2003/0151685 | A1 | 8/2003 | La Grone |
| 2003/0160886 | A1 | 8/2003 | Misawa et al. |
| 2003/0209651 | A1 | 11/2003 | Iwasaki |
| 2003/0234907 | A1 | 12/2003 | Kawai |
| 2004/0012688 | A1 | 1/2004 | Tinnerino et al. |
| 2004/0012689 | A1 | 1/2004 | Tinnerino et al. |
| 2004/0017620 | A1 | 1/2004 | Kaneko et al. |
| 2004/0027687 | A1 | 2/2004 | Bittner et al. |
| 2004/0080638 | A1 | 4/2004 | Lee |
| 2004/0095495 | A1 | 5/2004 | Inokuma et al. |
| 2004/0183918 | A1 | 9/2004 | Squilla et al. |
| 2005/0024731 | A1 | 2/2005 | Mitchell et al. |
| 2005/0128335 | A1 | 6/2005 | Kolehmainen et al. |
| 2005/0128509 | A1 | 6/2005 | Tokkonen et al. |
| 2005/0134712 | A1 | 6/2005 | Gruhlke et al. |
| 2005/0160112 | A1 | 7/2005 | Makela et al. |
| 2005/0248667 | A1 | 11/2005 | Schweng et al. |
| 2005/0285955 | A1 | 12/2005 | Utz et al. |
| 2006/0087572 | A1 | 4/2006 | Schroeder |
| 2006/0108505 | A1 | 5/2006 | Gruhlke et al. |
| 2006/0125936 | A1 | 6/2006 | Gruhlke et al. |
| 2006/0187322 | A1 | 8/2006 | Janson, Jr. et al. |
| 2006/0187338 | A1 | 8/2006 | May et al. |

(56) References Cited

U.S. PATENT DOCUMENTS

2006/0222220 A1 10/2006 Yamano et al.
2007/0002159 A1 1/2007 Olsen et al.

OTHER PUBLICATIONS

Duparre et al., "Artificial apposition compound eye fabricated by micro-optics technology," Applied Optics, vol. 43, No. 22, Aug. 2004, pp. 4303-4310.
Duparre et al., "Artificial compound eyes—different concepts and their application to ultra flat image acquisition sensors," Proceedings of SPIE, vol. 5346 (SPIE, Bellingham, WA, 2004), pp. 89-100.
Duparre et al., "Microoptical telescope compound eyet," Optics Express, vol. 13, No. 3, Feb. 2005, pp. 889-903.
Duparre et al., "Theoretical analysis of an artificial superposition compound eye for application in ultra flat digital image acquisition devices," Proceedings of SPIE, vol. 5249, 2004, pp. 408-418.
Duparre et al., "Ultra-Thin Camera Based on Artificial Apposition Compound Eyes," Proc. 10th Microoptics Conference MOC '04, Jena, 2004, Paper E-2 (2 pages).
Final Office Action on U.S. Appl. No. 11/212,803, mailed Sep. 20, 2007.
First Office Action for Chinese Application 200580032374.0, notification date Feb. 5, 2010.
International Preliminary Report on Patentability for PCT/US2005/030256 issued Mar. 17, 2009.
International Preliminary Report on Patentability for PCT/US2006/025781 issued Mar. 10, 2009.
International Search Report and Written Opinion for PCT/US05/30256 mailed Jul. 7, 2008.
International Search Report and Written Opinion for PCT/US06/25781 mailed Jul. 22, 2008.
Kitamura et al., "Reconstruction of a high-resolution image on a compound-eye image-capturing system," Applied Optics, vol. 43, No. 8, Mar. 2004, pp. 1719-1727.
Miki et al., "A Study of Multi-Stack Silicon-Direct Wafer Donding for MEMS Manufacturing," 2002, IEEE, pp. 407-410.
Miyatake et al., "Thin observation module by bound optics (TOMBO0 with color filters," SPEI and IS&T, vol. 5301, 2004, pp. 7-12.
Non-final Office Action on U.S. Appl. No. 11/212,803, mailed Feb. 7, 2007.
Non-Final Office Action on U.S. Appl. No. 11/265,669, mailed Feb. 28, 2006.
Non-Final Office Action on U.S. Appl. No. 11/322,959, mailed Aug. 8, 2007.
Non-Final Office Action on U.S. Appl. No. 11/788,122, mailed Jun. 27, 2008.
Non-Final Office Action on U.S. Appl. No. 11/888,546, mailed May 1, 2008.
Non-Final Office Action on U.S. Appl. No. 11/888,570, mailed May 28, 2008.
Norvell, Robin, "Shellcase Debuts Ultra-Thin Miniaturization for Optics," Jul. 8, 2005, 1 page.
Notice of Allowance for U.S. Appl. No. 11/478,242, mailed Dec. 30, 2009.
Notice of Allowance for U.S. Appl. No. 11/888,546, mailed Dec. 14, 2009.
Notice of Allowance of U.S. Appl. No. 11/825,382, mailed May 5, 2010.
Notice of Allowance on U.S. Appl. No. 11/729,132, mailed Oct. 11, 2011.
Notice of Allowance on U.S. Appl. No. 11/265,669, mailed Oct. 27, 2006.
Notice of Allowance on U.S. Appl. No. 11/788,122, mailed Mar. 9, 2009.
Notice of Allowance on U.S. Appl. No. 11/788,279, mailed Oct. 28, 2010.
Notice of Allowance on U.S. Appl. No. 11/810,623, mailed Feb. 2, 2011.
Notice of Allowance on U.S. Appl. No. 11/888,546, mailed Dec. 2, 2008.
Notice of Allowance on U.S. Appl. No. 11/888,546, mailed Jun. 3, 2009.
Notice of Allowance on U.S. Appl. No. 11/888,582, mailed Aug. 6, 2010.
Notice of Allowance on U.S. Appl. No. 12/496,854, mailed Feb. 16, 2012.
Notice of Allowance on U.S. Appl. No. 13/006,351, mailed May 17, 2011.
Notice of Allowance on U.S. Appl. No. 13/006,351, mailed Dec. 21, 2012.
Notice of Allowance on U.S. Appl. No. 13/100,725, mailed Jul. 23, 2012.
Notice of Allowance on U.S. Appl. No. 13/345,007, mailed Jan. 14, 2013.
Notice of Allowance on U.S. Appl. No. 13/465,229, mailed Aug. 20, 2012.
Notice of Allowance on U.S. Appl. No. 13/647,708, mailed Sep. 13, 2013.
Notice of Allowance on U.S. Appl. No. 13/681,603, mailed Jul. 22, 2013.
Notice of Allowance on U.S. Appl. No. 13/786,803, mailed Oct. 10, 2013.
Office Action on U.S. Appl. No. 11/825,382, mailed Oct. 29, 2009.
Office Action on U.S. Appl. No. 11/788,279, mailed Jan. 21, 2010.
Office Action on U.S. Appl. No. 11/810,623, mailed Aug. 18, 2010.
Office Action on U.S. Appl. No. 11/478,242, mailed Sep. 16, 2009.
Office Action on U.S. Appl. No. 11/729,132, mailed Feb. 3, 2011.
Office Action on U.S. Appl. No. 11/788,120, mailed Apr. 16, 2010.
Office Action on U.S. Appl. No. 11/788,120, mailed May 19, 2009.
Office Action on U.S. Appl. No. 11/788,120, mailed Jul. 30, 2010.
Office Action on U.S. Appl. No. 11/788,120, mailed Sep. 18, 2009.
Office Action on U.S. Appl. No. 11/788,279, mailed Aug. 4, 2010.
Office Action on U.S. Appl. No. 11/810,623 mailed Feb. 4, 2010.
Search Report for EP Application 05793927.4, dated Feb. 26, 2010.
Second Office Action on Chinese Application 200580032374.0, issued Sep. 9, 2010.
Shogenji et al., "Bimodal fingerprint capturing system based on compound-eye imaging module," Applied Optics, vol. 43, No. 6, Feb. 2004, pp. 1355-1359.
Shogenji et al., "Multispectral imaging using compact compound optics," Optics Express, vol. 12, No. 8, Apr. 2004, pp. 1643-1655.
Stager et al., "Replicated Micro-Optics for Automotive Applications," SPIE European Workshop on Photonics in the Automobile, Geneva, 2004, (8 pages).
Tanida et al., "Compact image capturing system based on compound imaging and idgital reconstruction," Proceedings of SPIE, vol. 4455, 2001, pp. 34-41.
Tanida, "Color imaging with an integrated compound imaging system," Optics Express, vol. 11, No. 18, Sep. 2003, pp. 2109-2117.
Third Office Action issued on Chinese Application 200580032374.0, mailed May 24, 2011 (with English translation).
Volkel et al., "Miniaturization of Imaging Systems," mstnews, Feb. 2003, pp. 36-38.
Volkel et al., "Miniaturized imaging systems," Elsevier Science B.V., Microelectronic Engineering 67-68 (2003), pp. 461-472.
Wood et al., "Resolution Improvement for Compound Eye Images Through Lens Diversity," IEEE, Signal Processing Society, DSP/SPE Workshop, Aug. 2, 2004 (5 pages).
Communication on EP Application 05793927.4, mailed Jul. 8, 2015.
Notice of Allowance on U.S. Appl. No. 14/063,236, mailed Sep. 2, 2015.
Notice of Allowance on U.S. Appl. No. 14/149,024 mailed Nov. 12, 2015.

\* cited by examiner

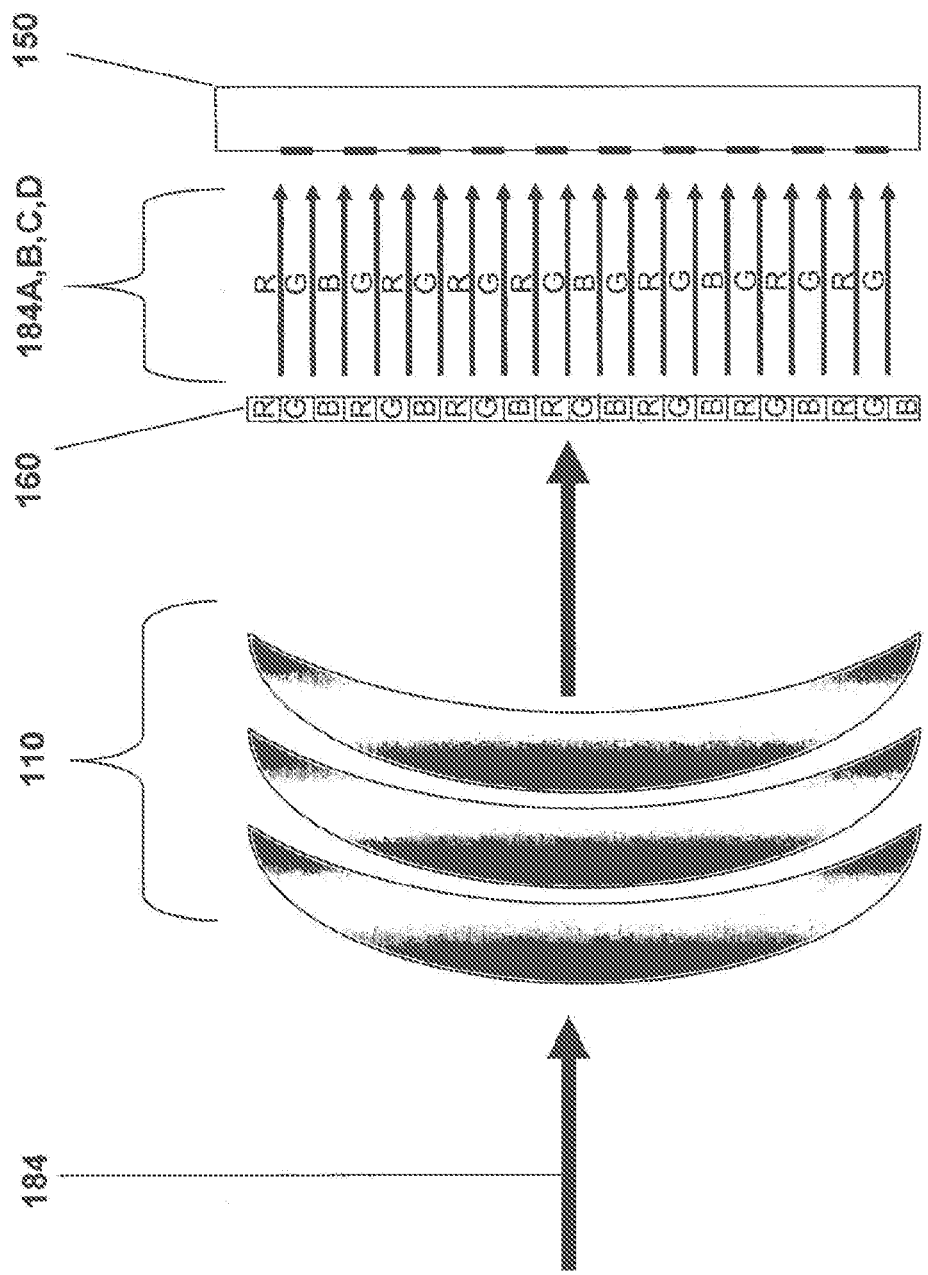

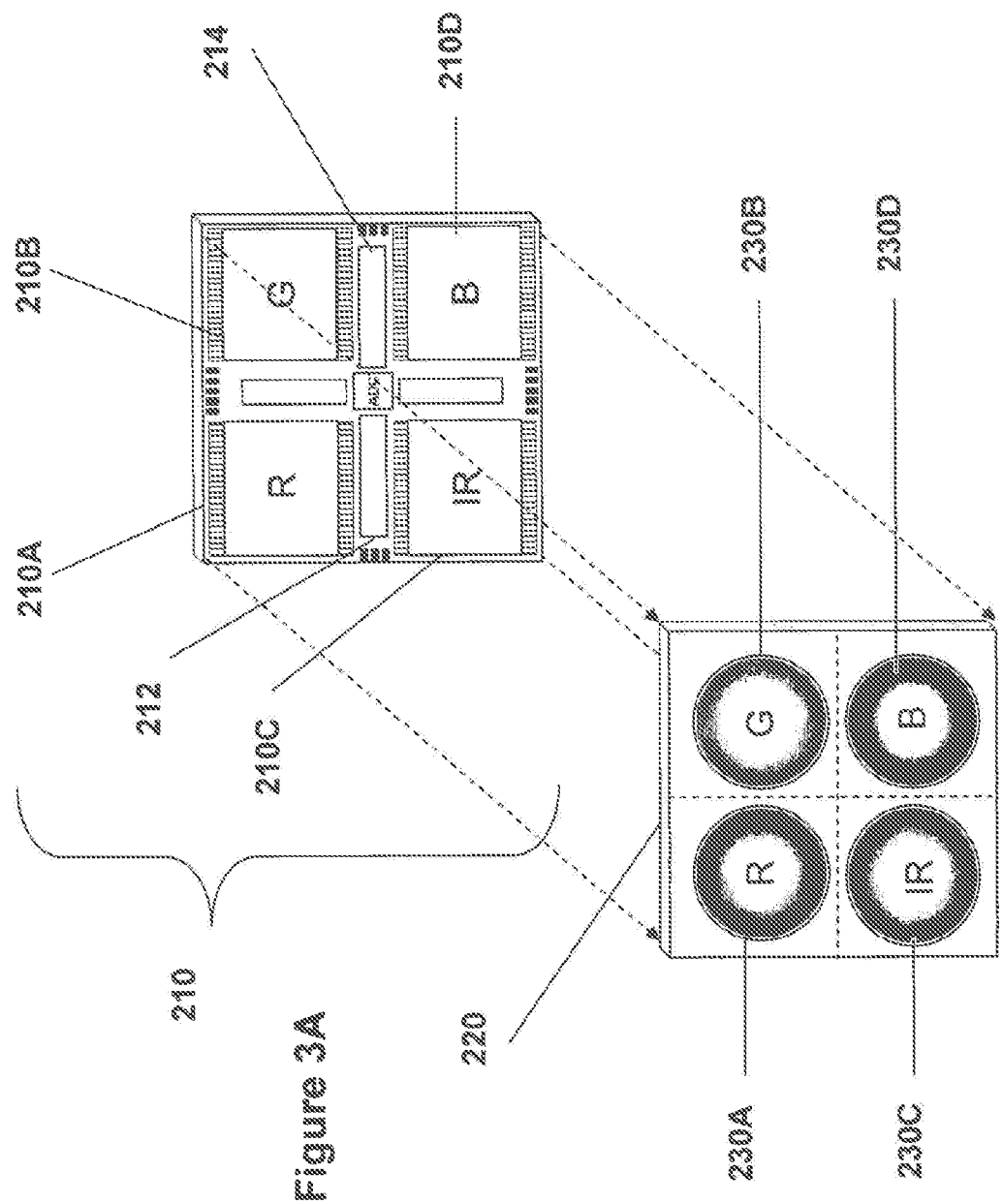

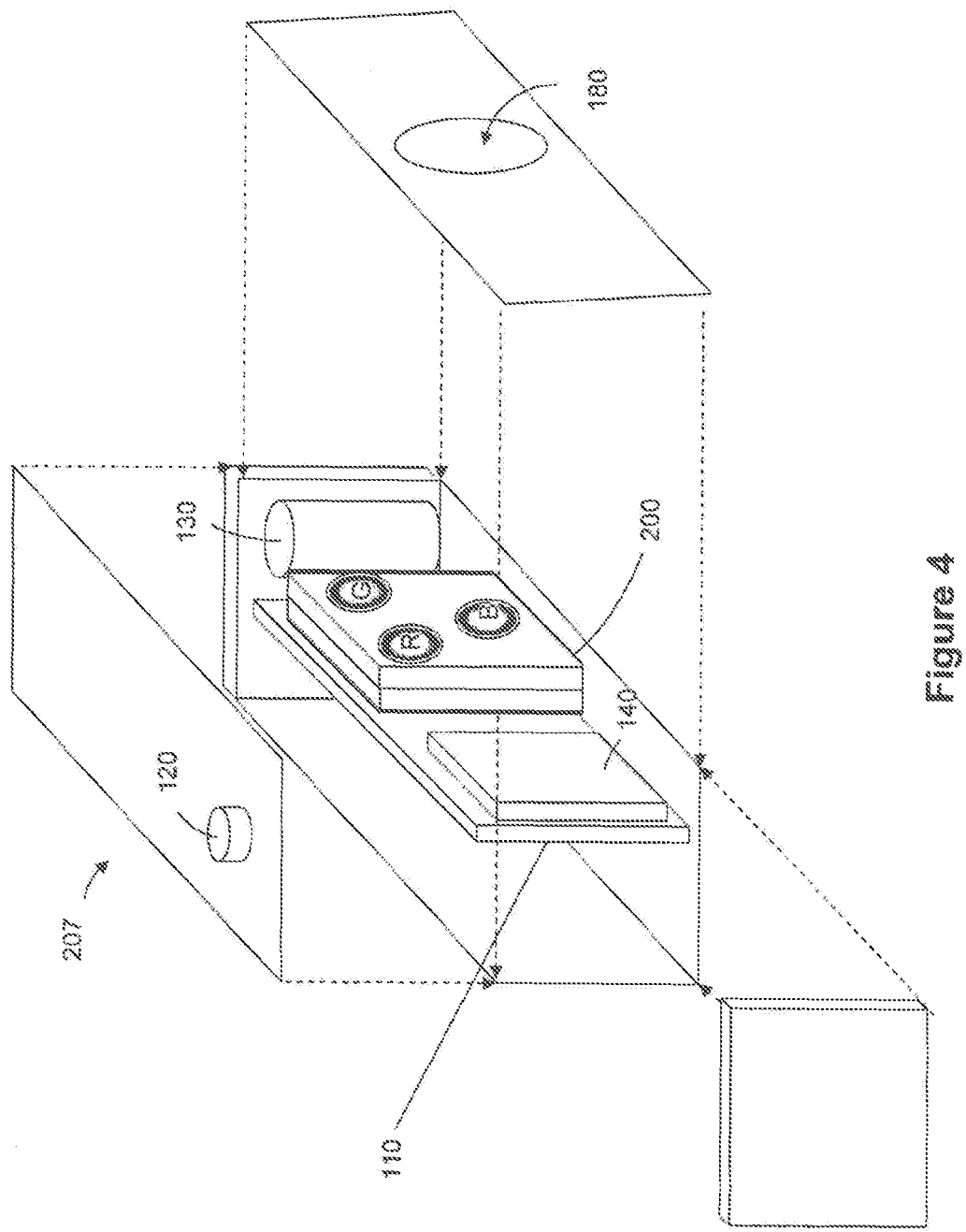

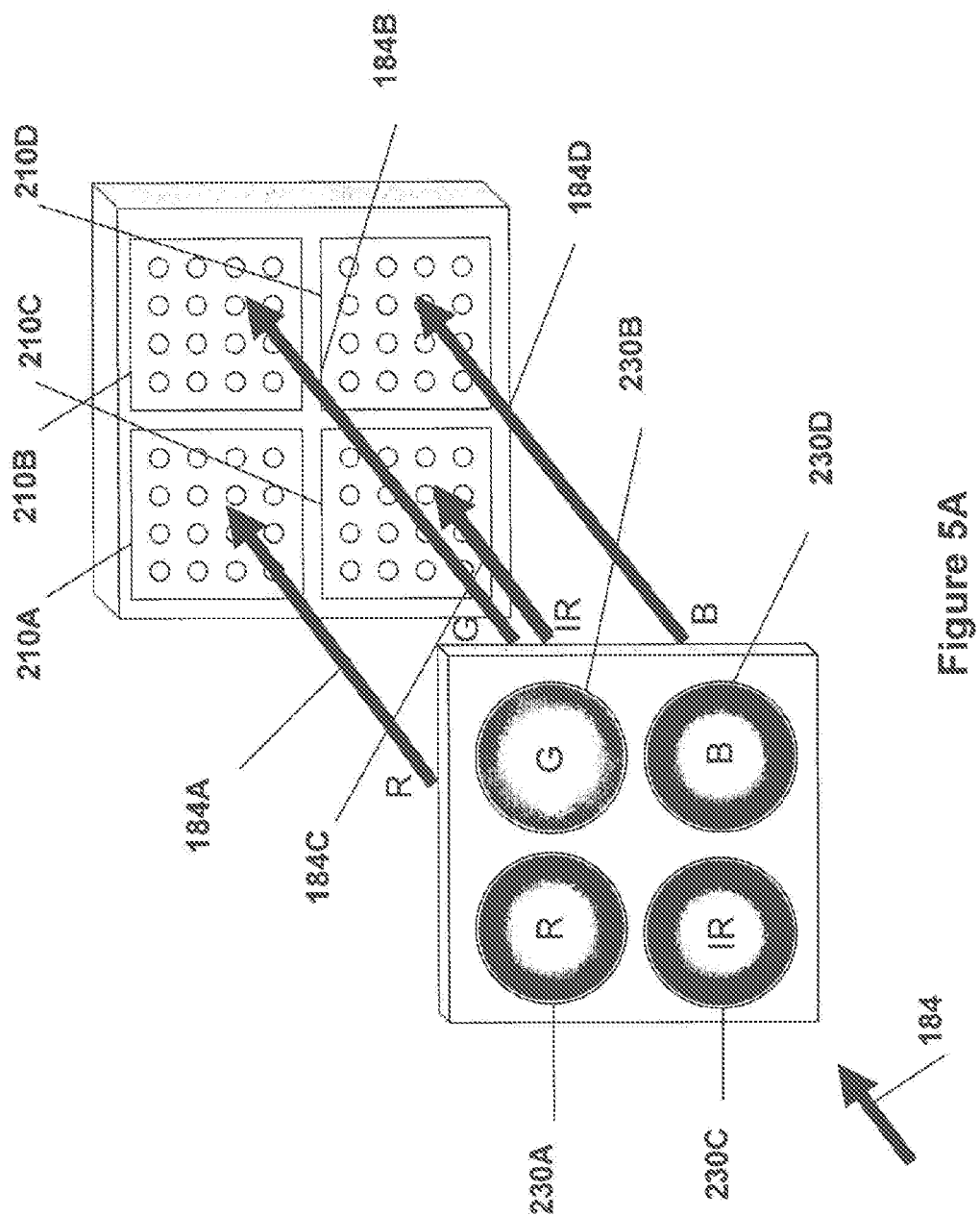

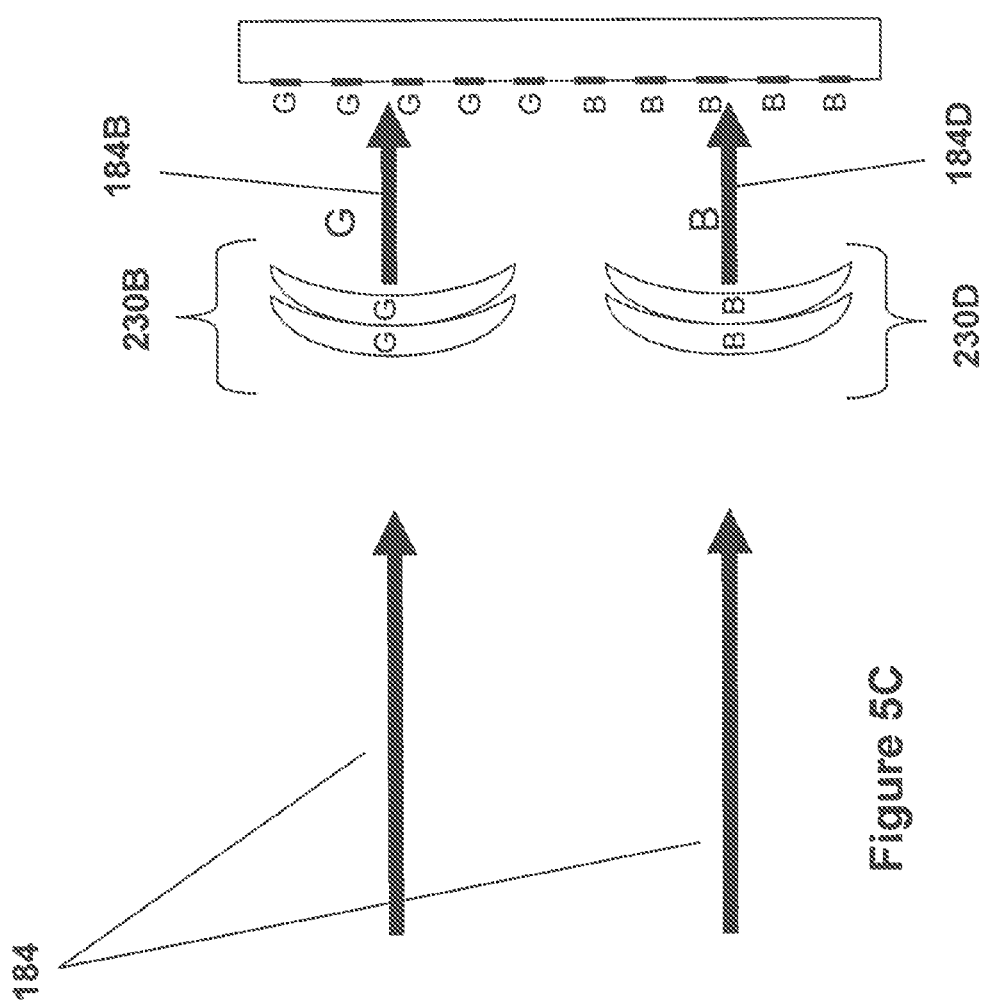

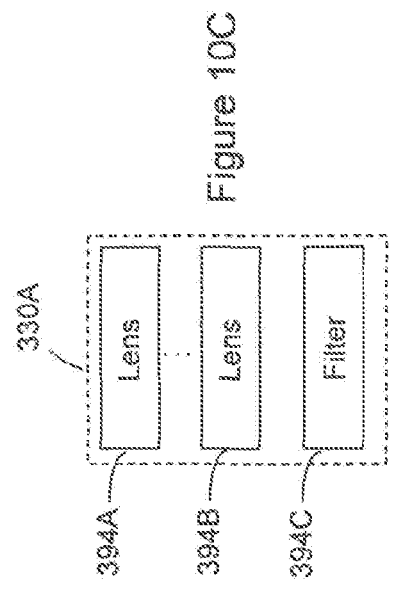
Figure 10C
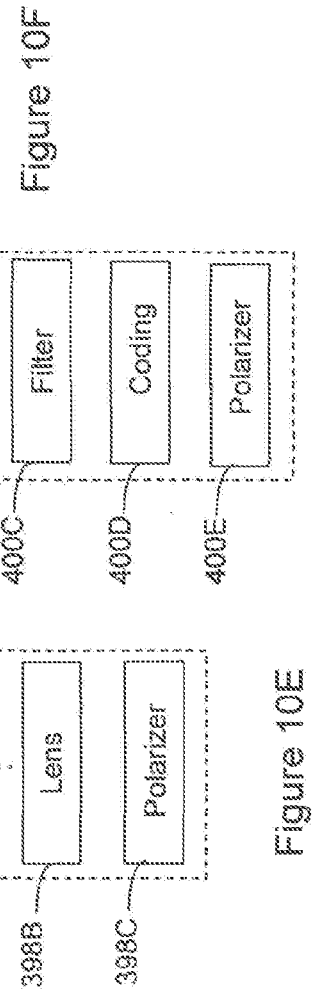
Figure 10F
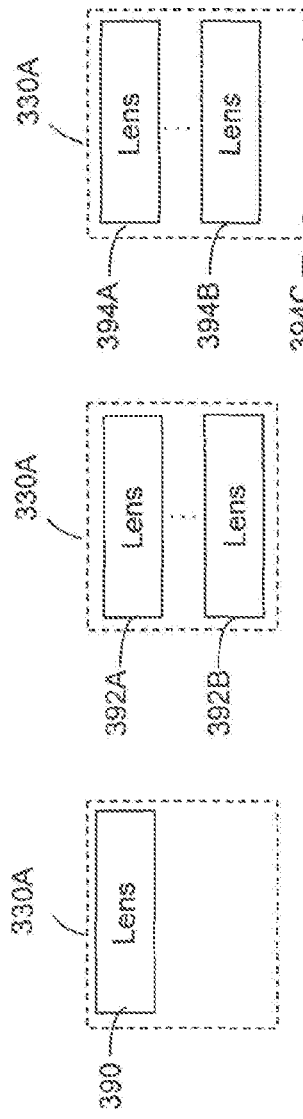
Figure 10A
Figure 10B
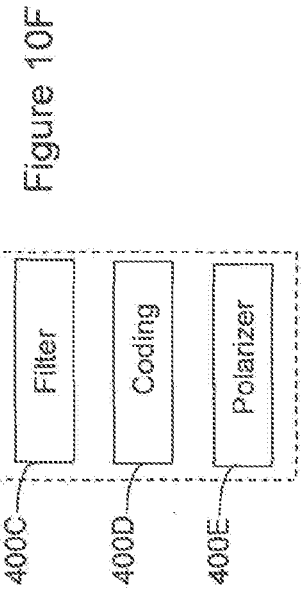
Figure 10E
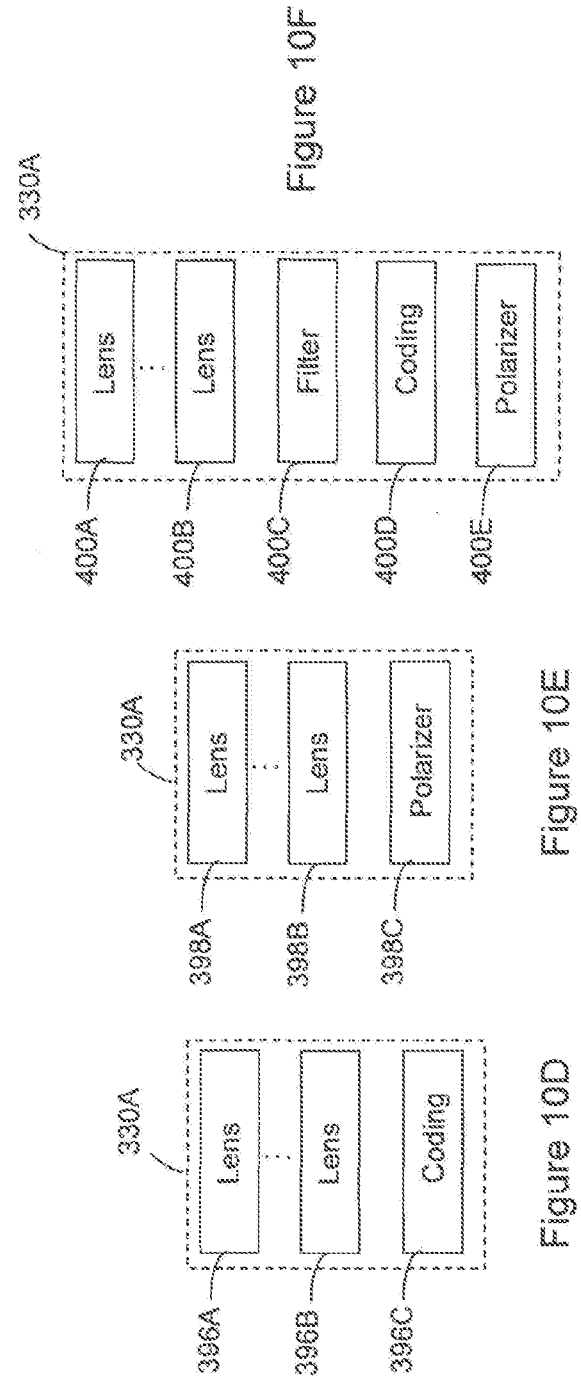
Figure 10D

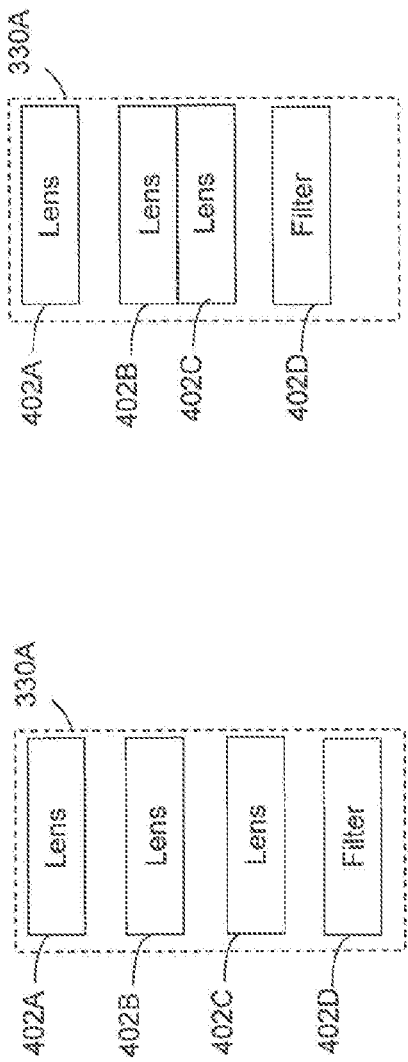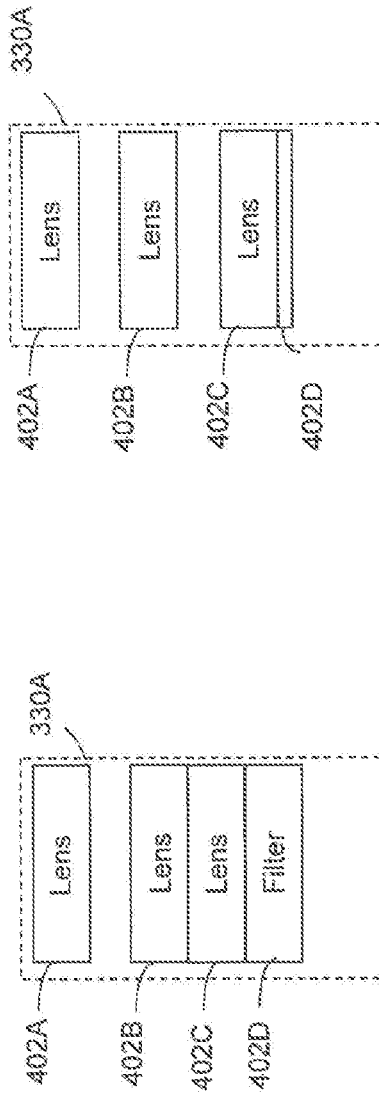

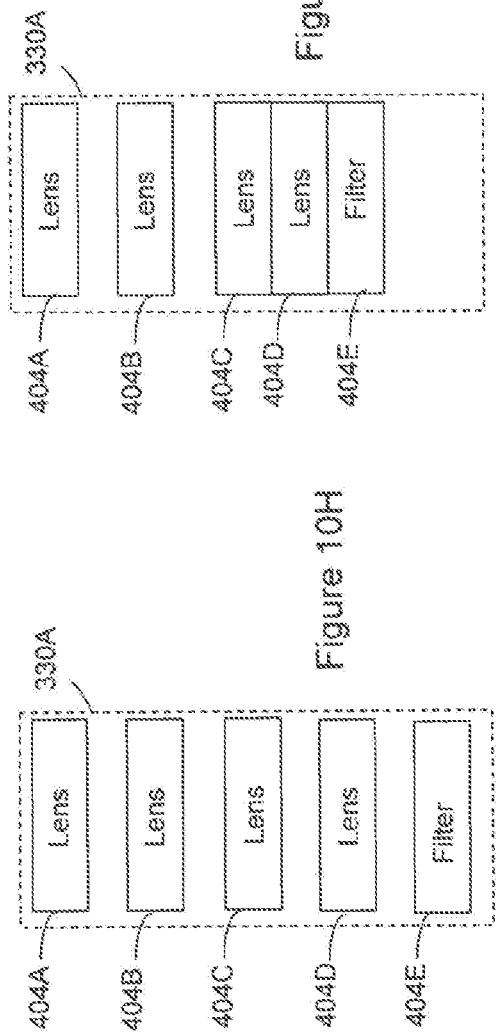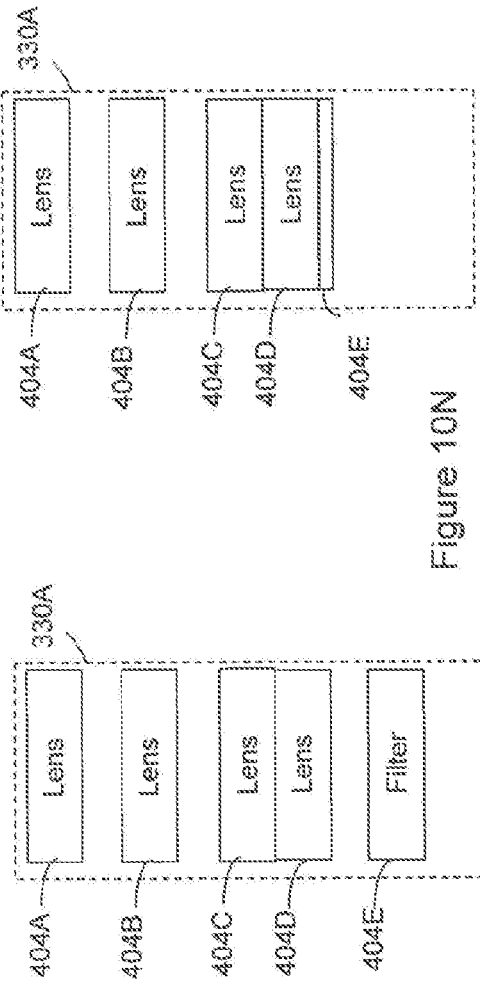

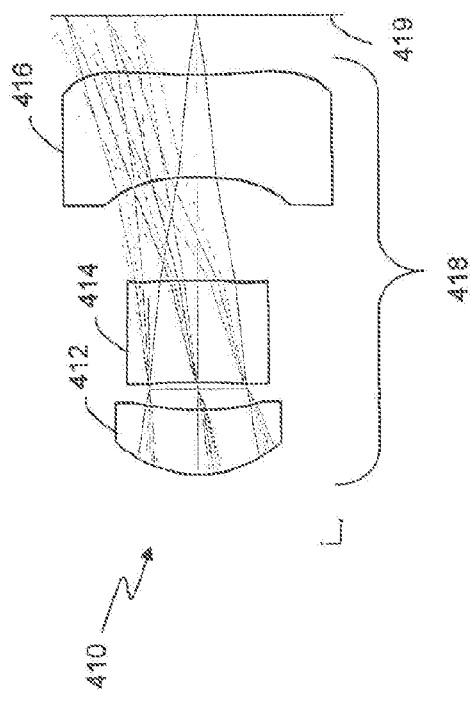
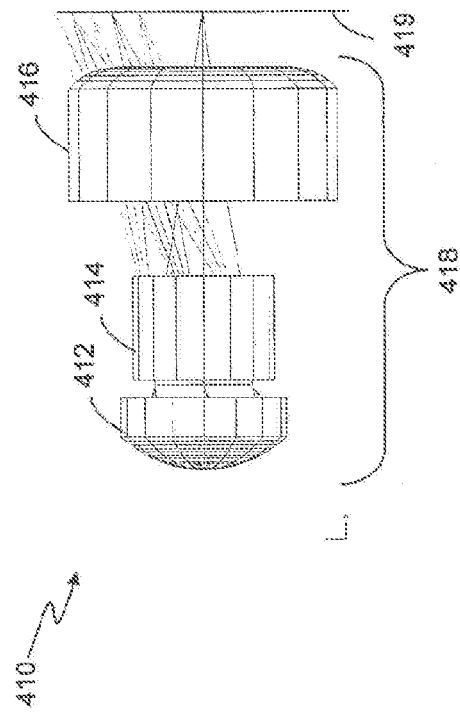
Figure 11A
Figure 11B

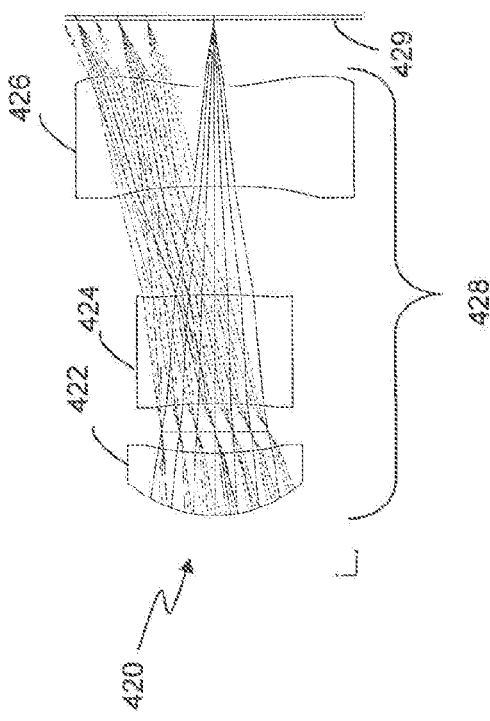
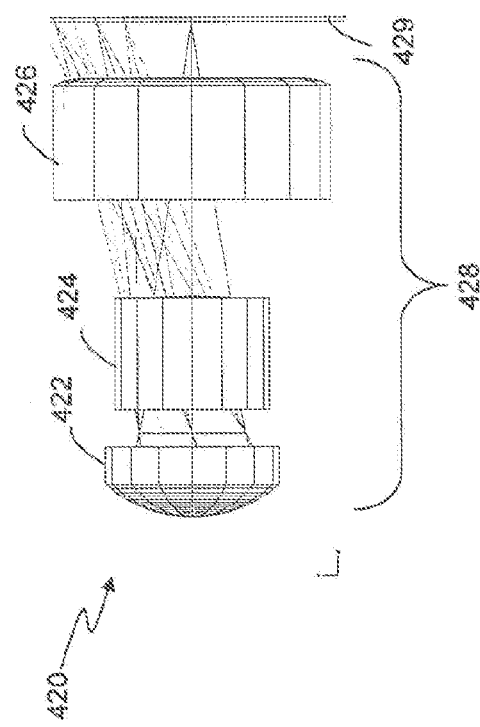
Figure 12A
Figure 12B

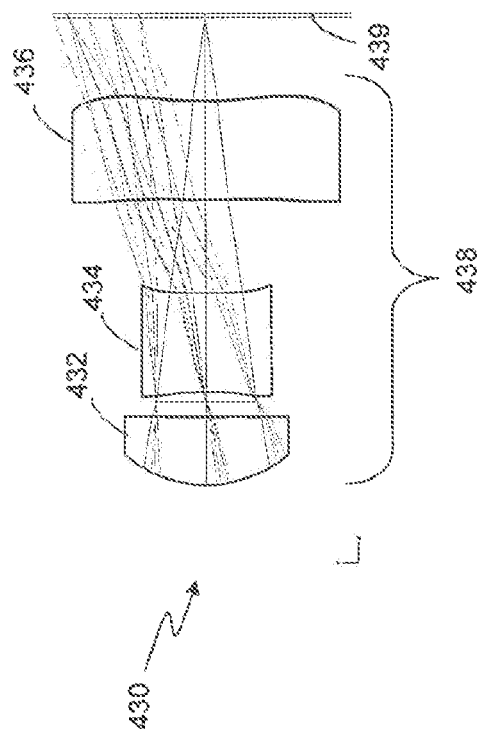
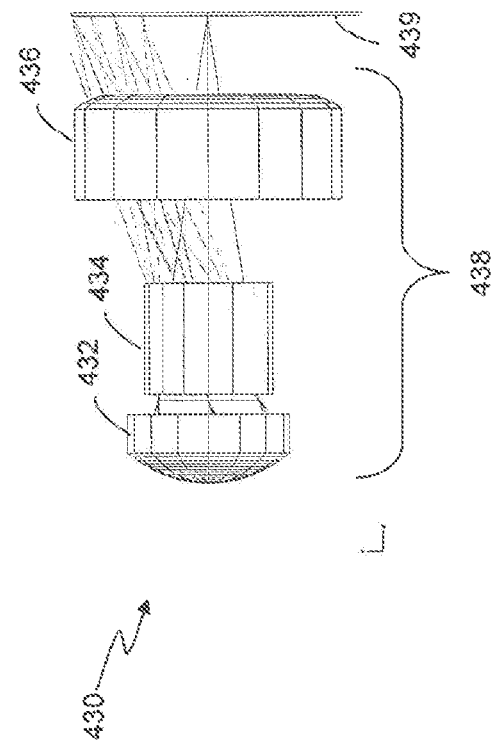
Figure 13A
Figure 13B

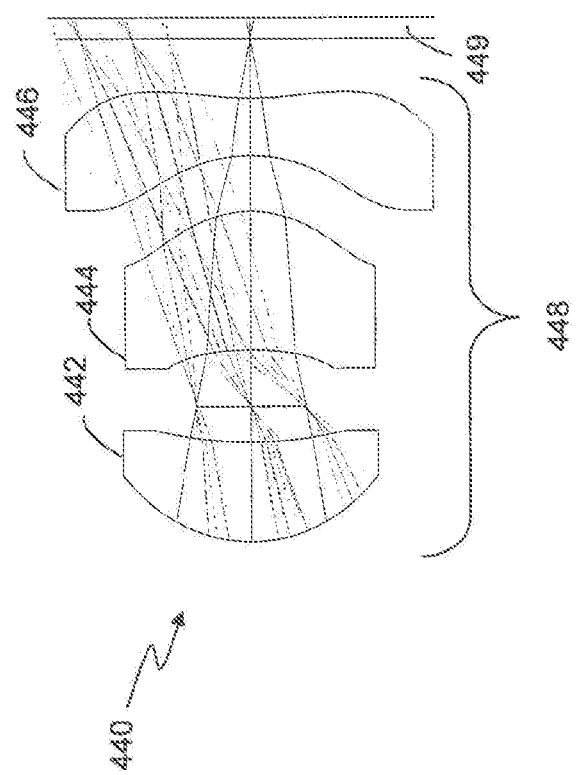

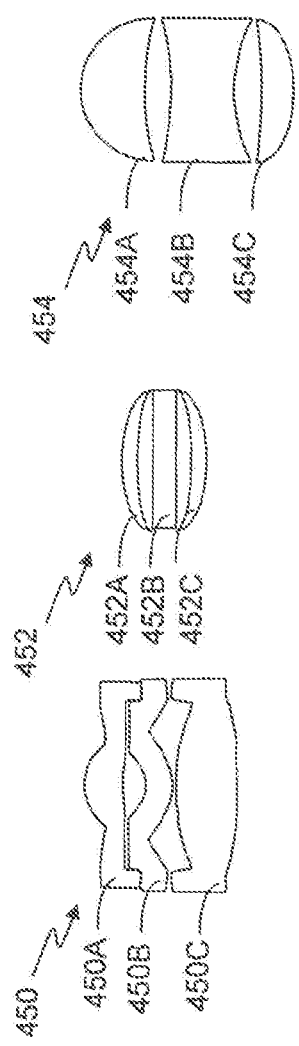
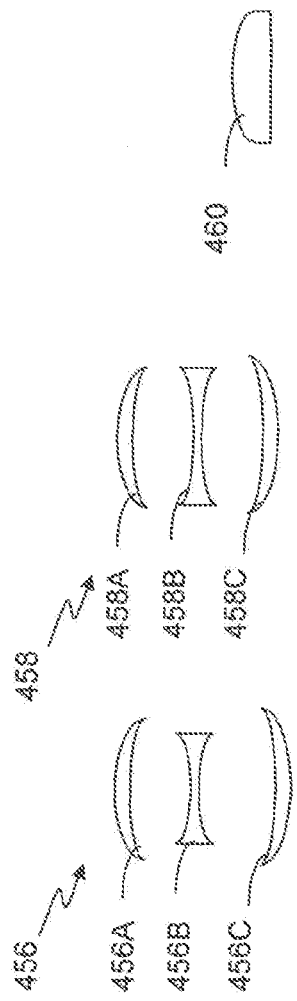
Figure 15A, Figure 15B, Figure 15C, Figure 15D, Figure 15E, Figure 15F

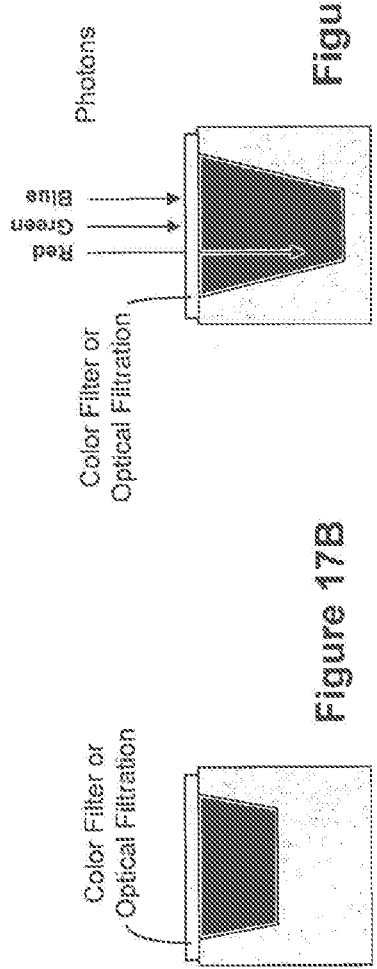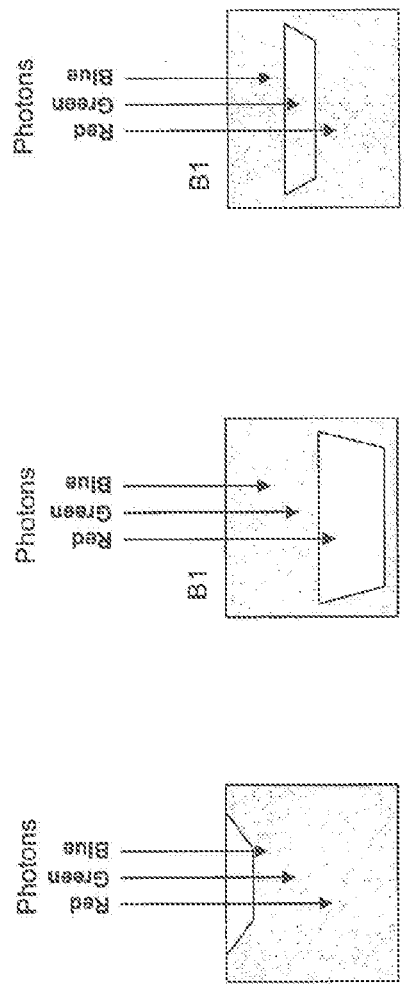

4 color regions
- red
- green
- blue
- other: Ir, UV, B/W

Color Tuning:
- By Well Depth
- By Pixel Regions in the silicon

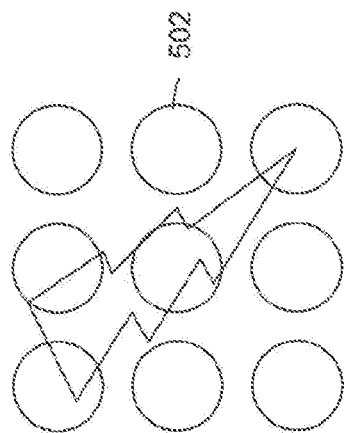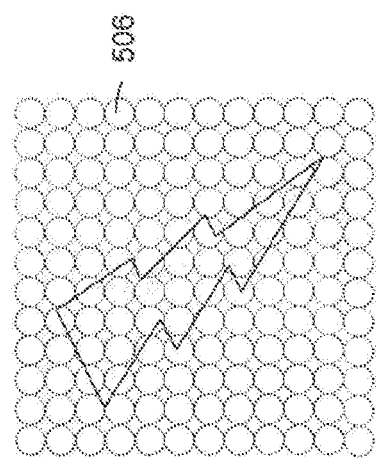

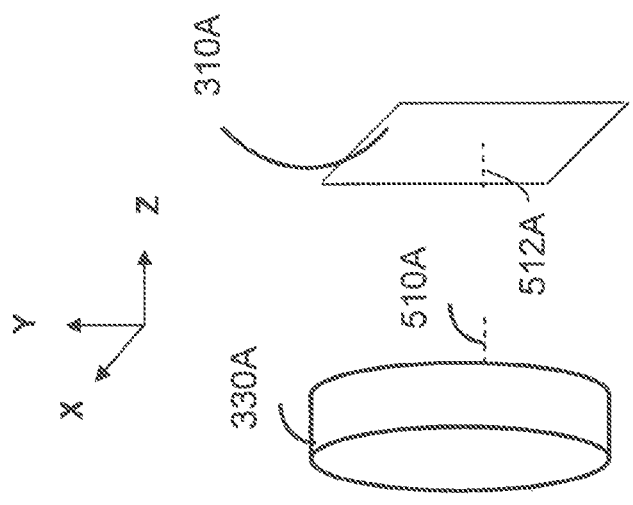
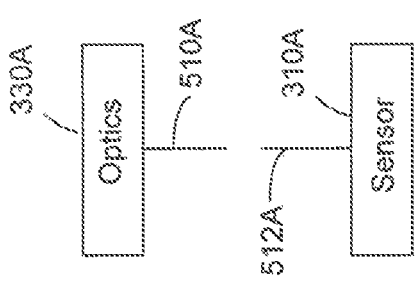

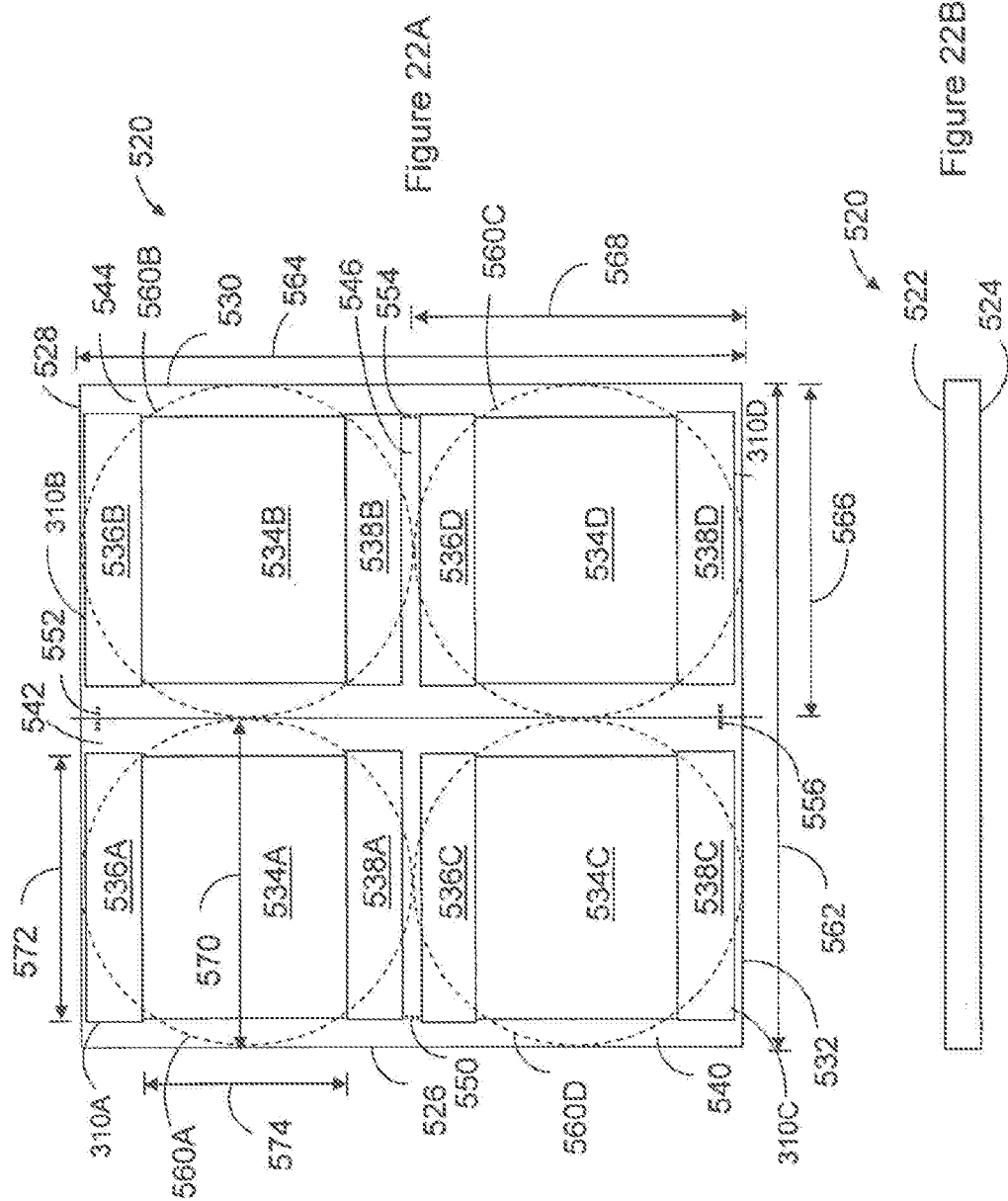

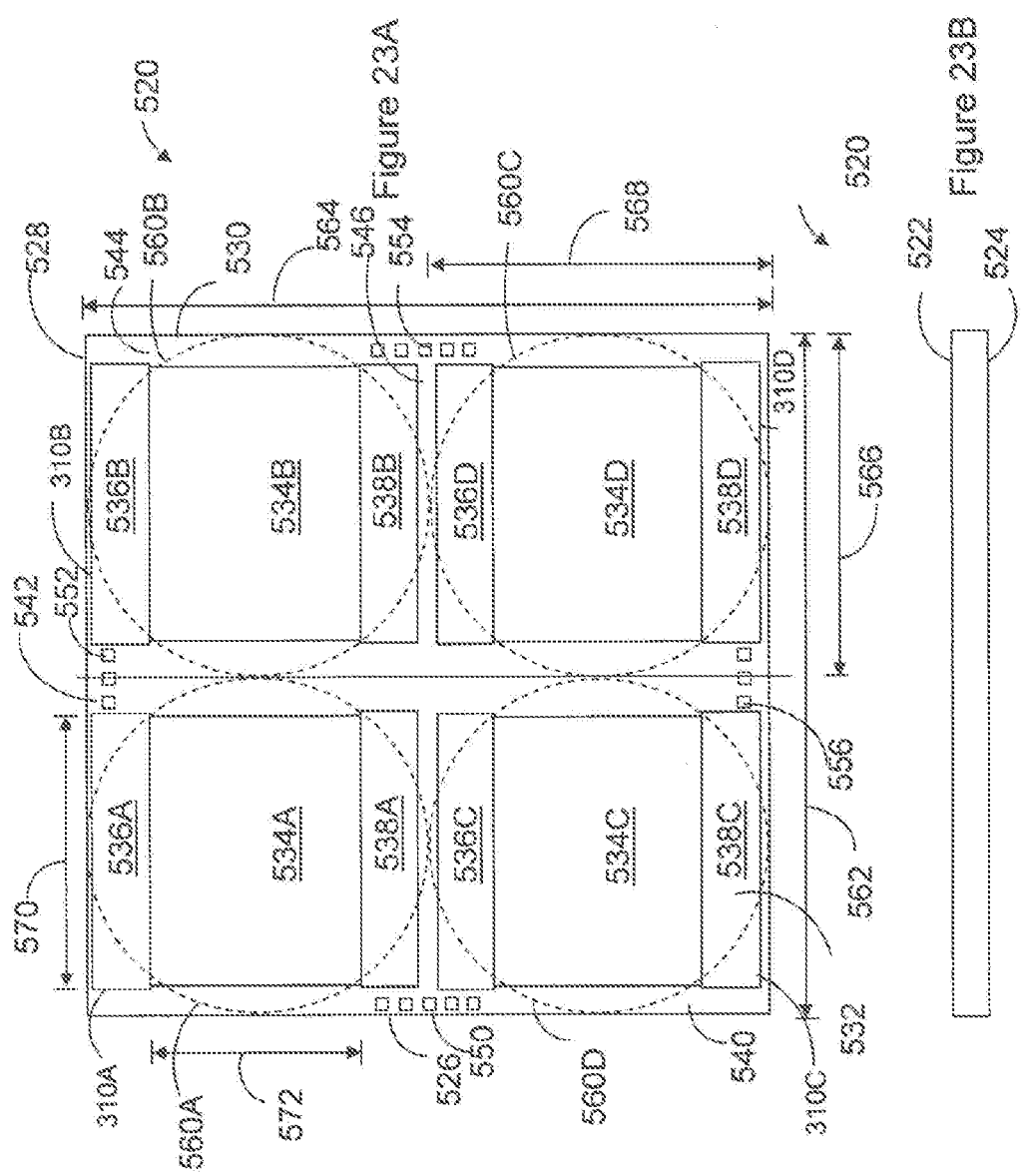

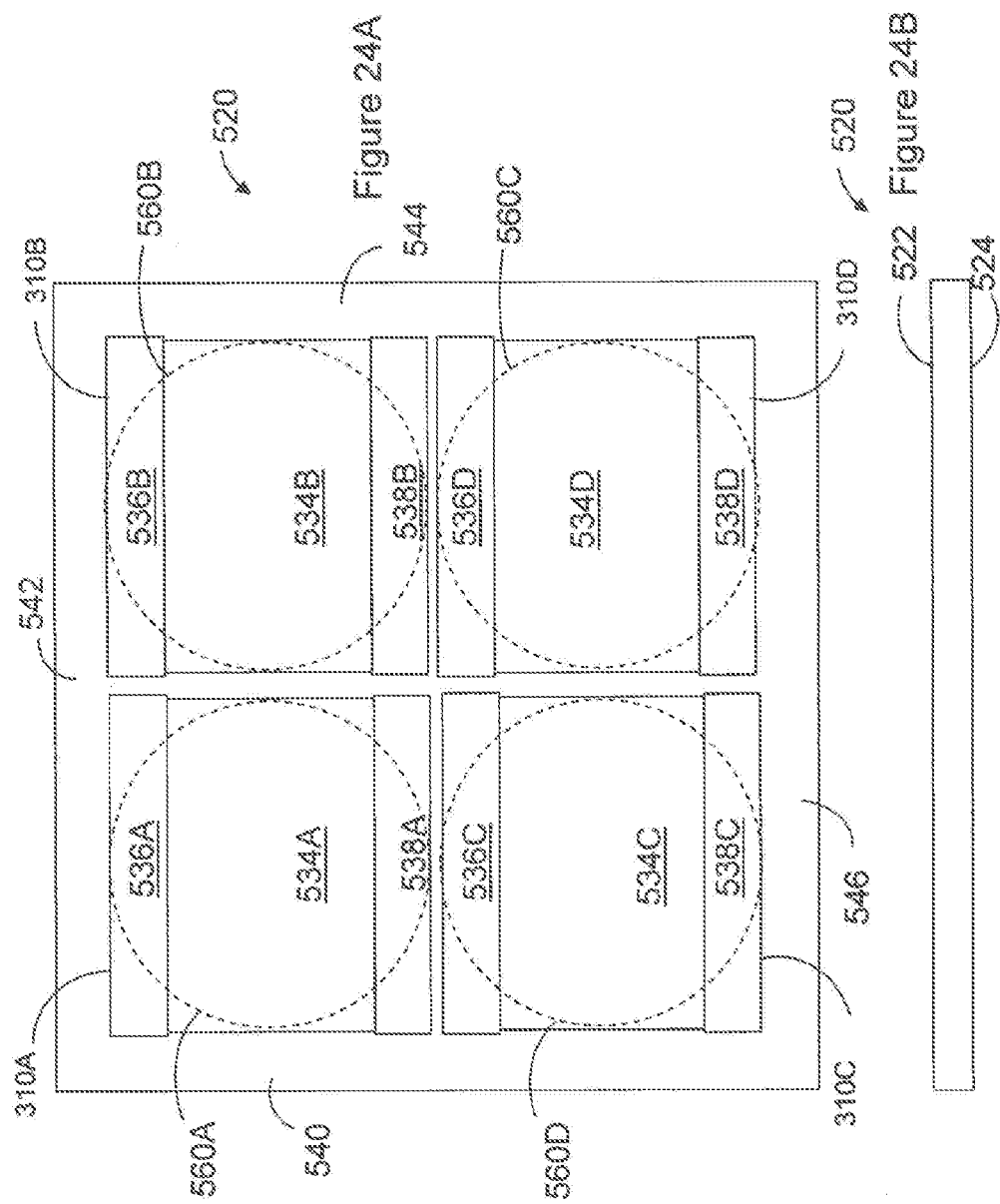

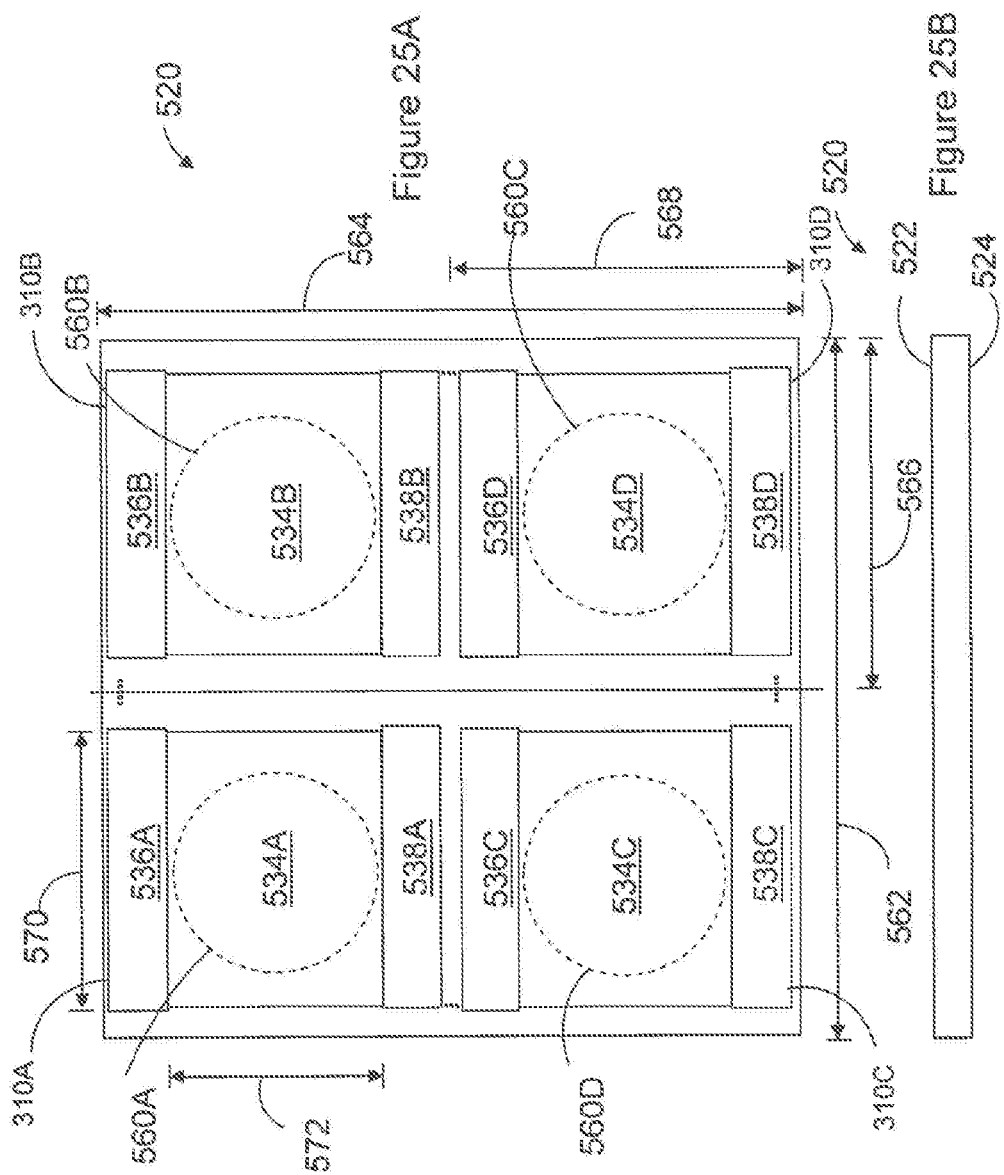

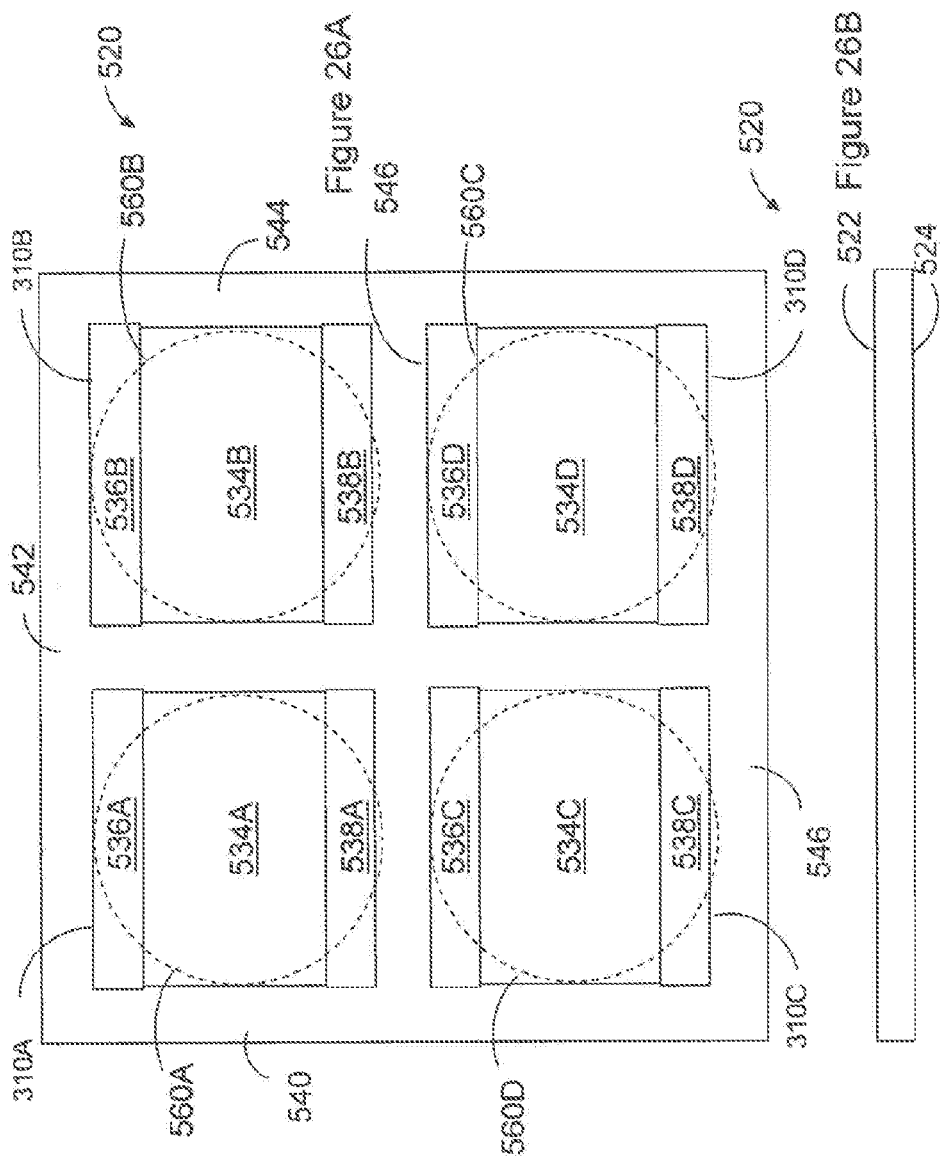

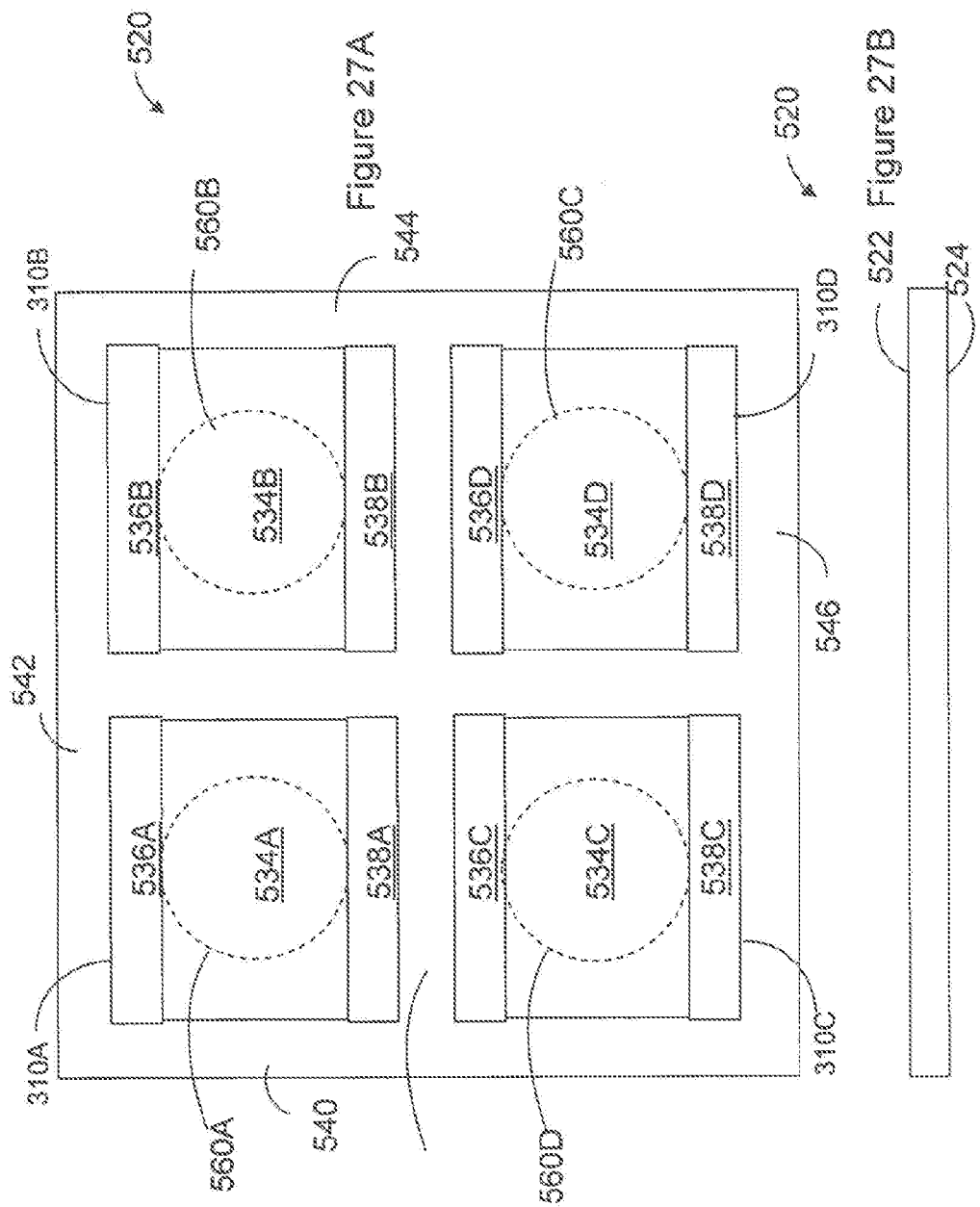

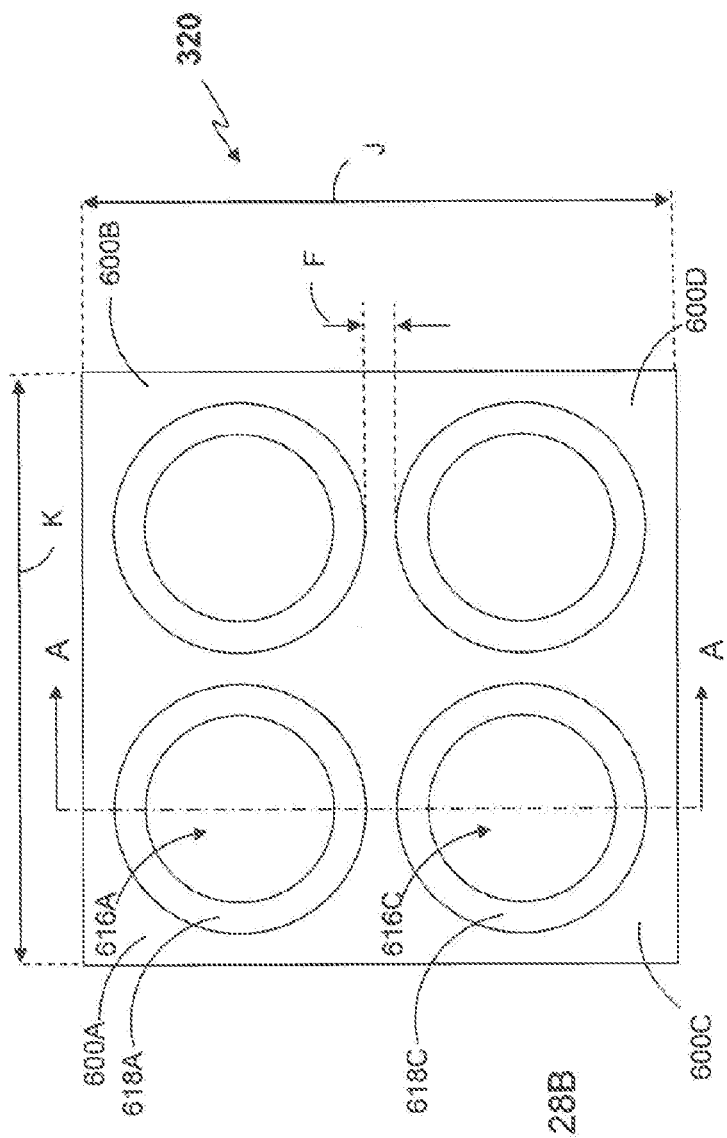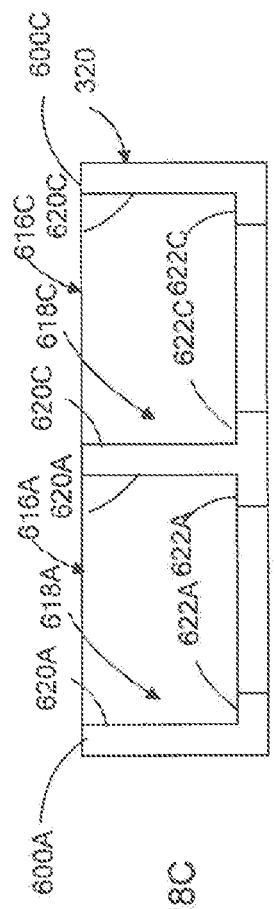
Figure 28B
Figure 28C

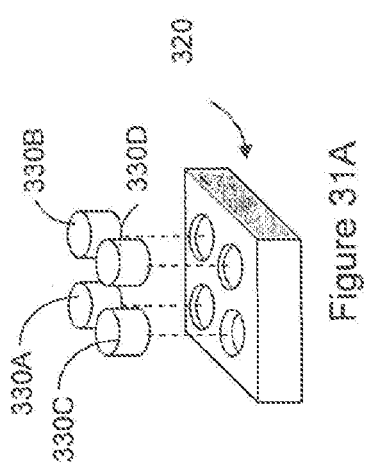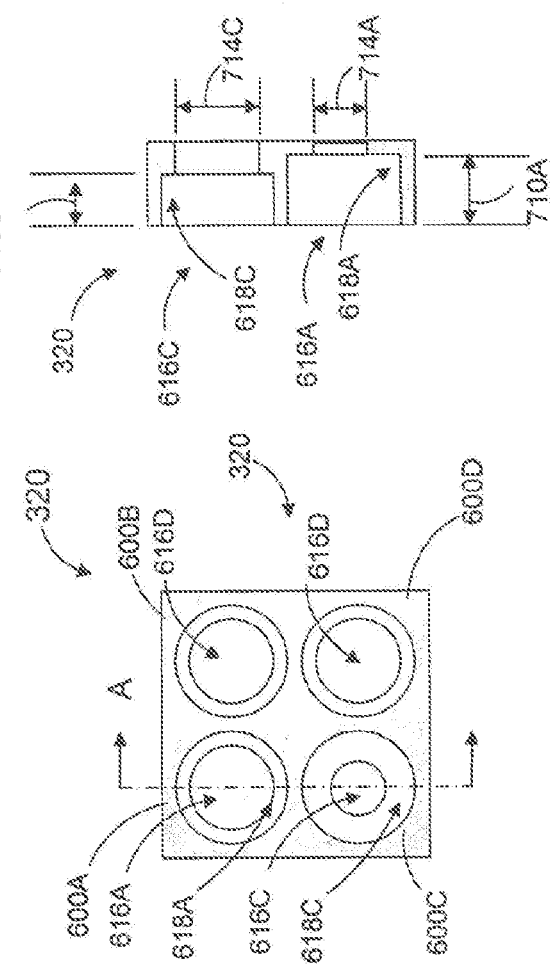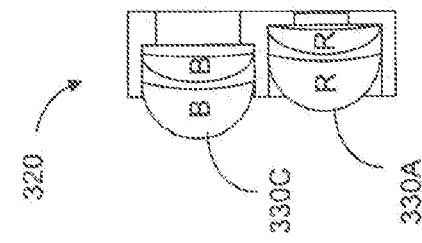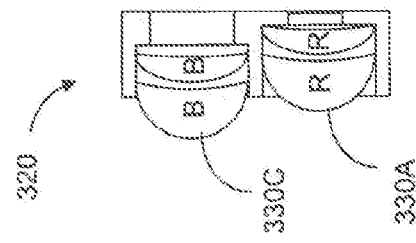

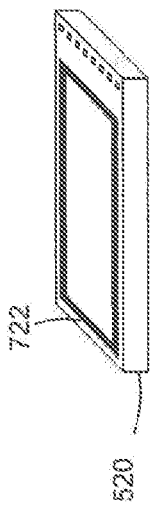
Figure 33A
Figure 33C
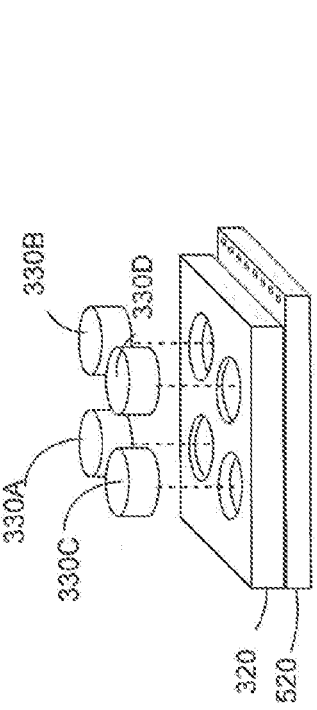
Figure 33B
Figure 33D
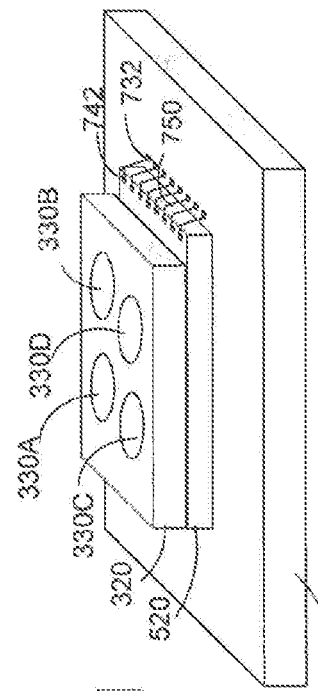
Figure 33E
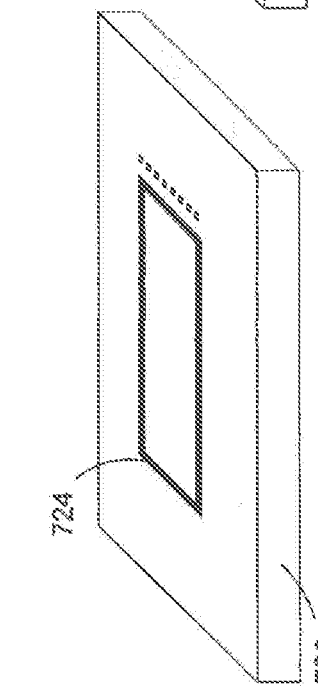
Figure 33F

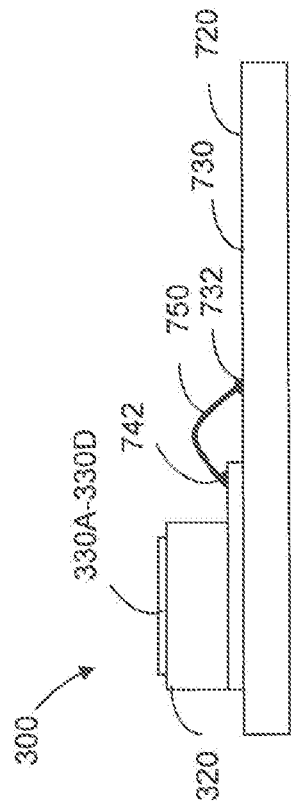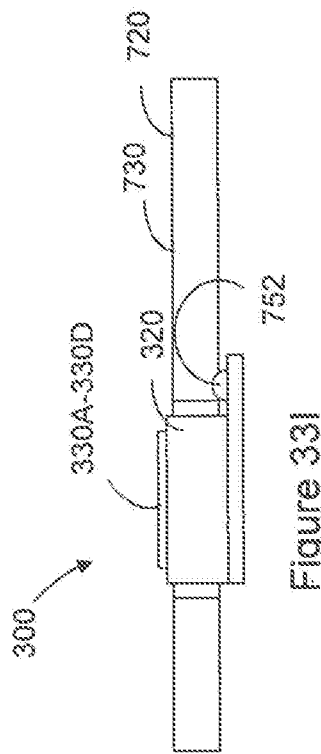
Figure 33G
Figure 33J
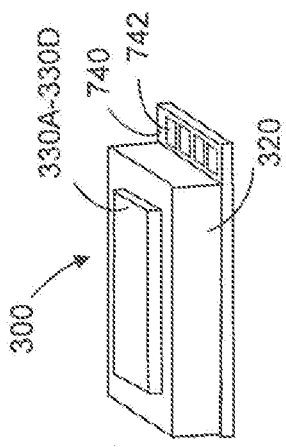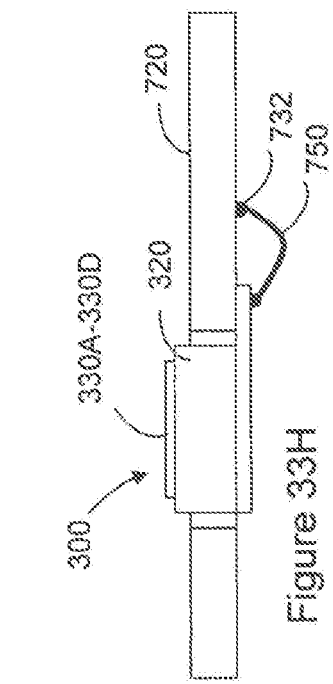
Figure 33H
Figure 33I

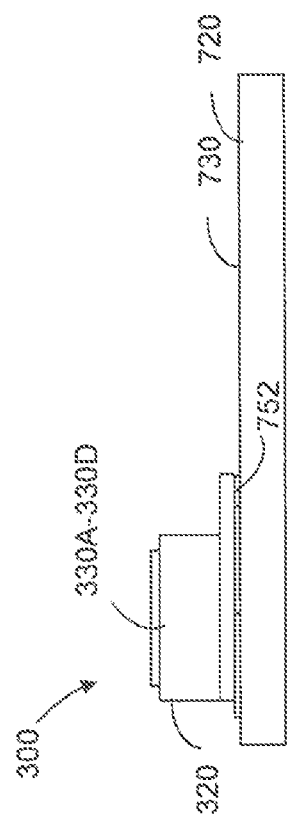

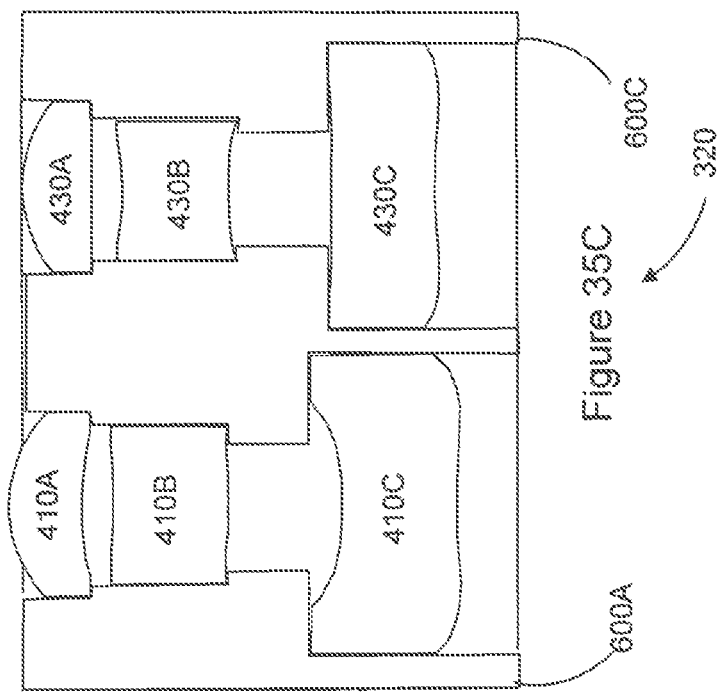

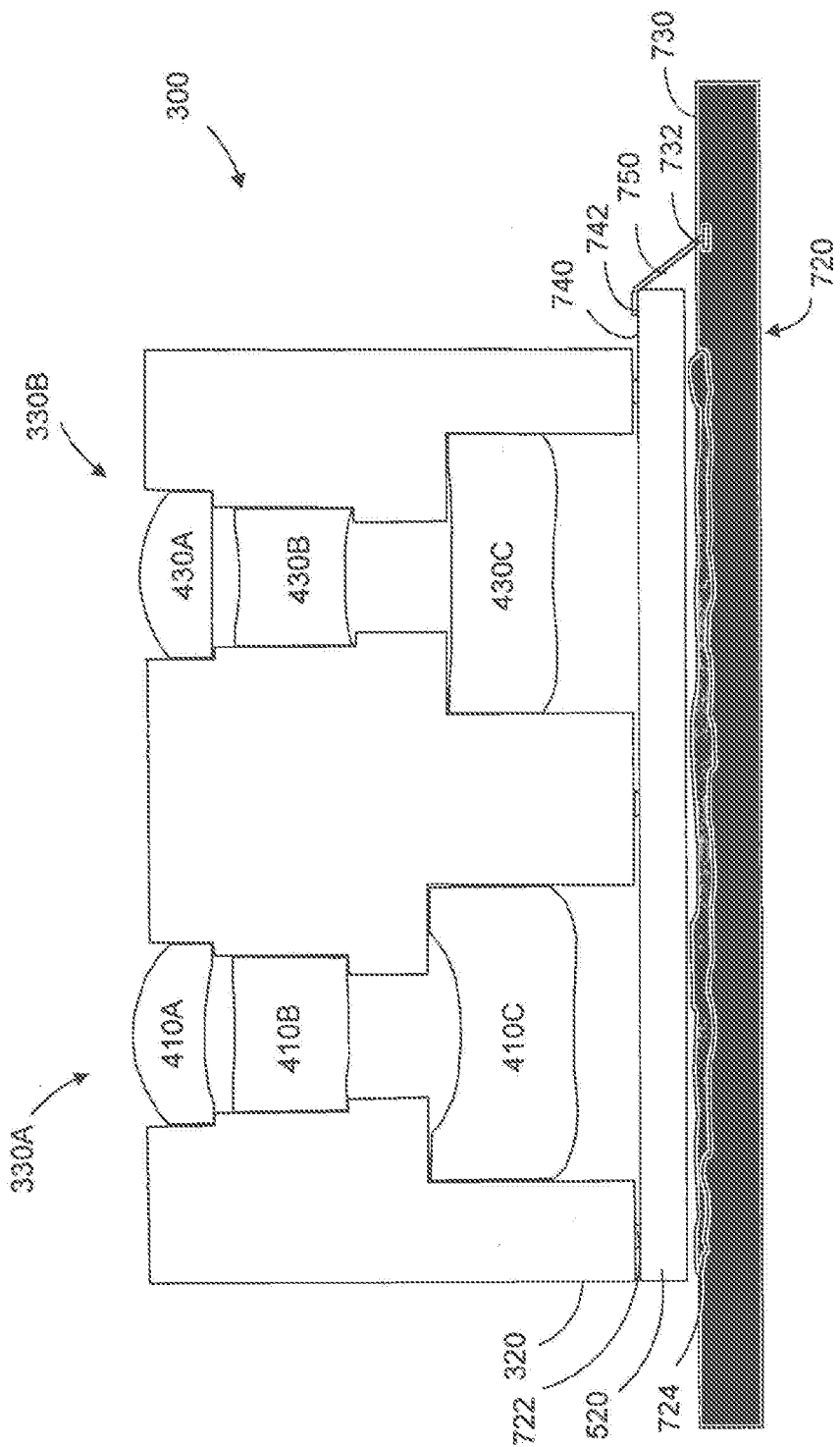

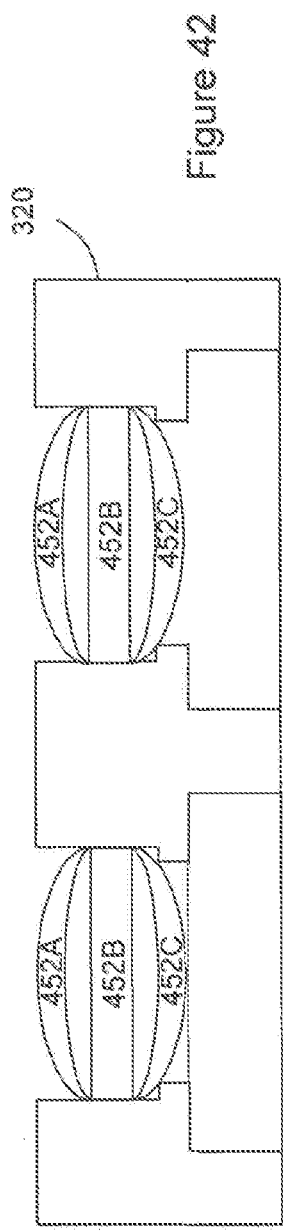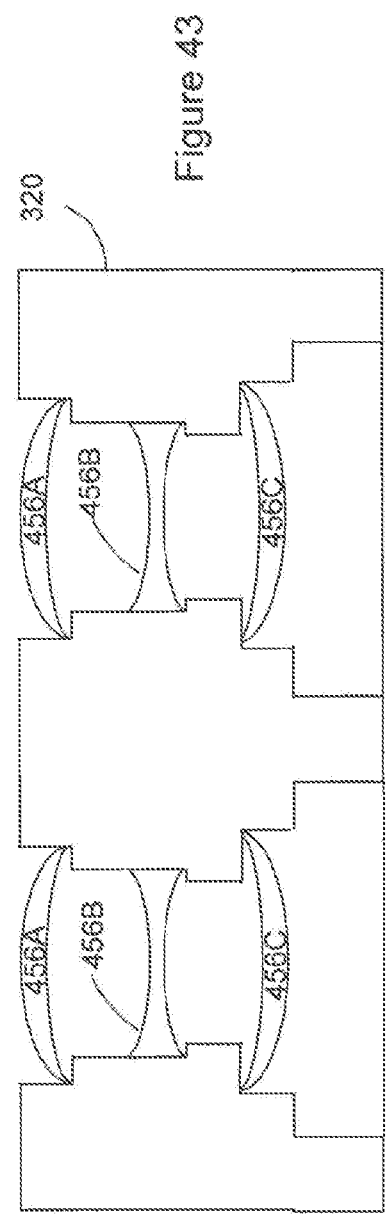

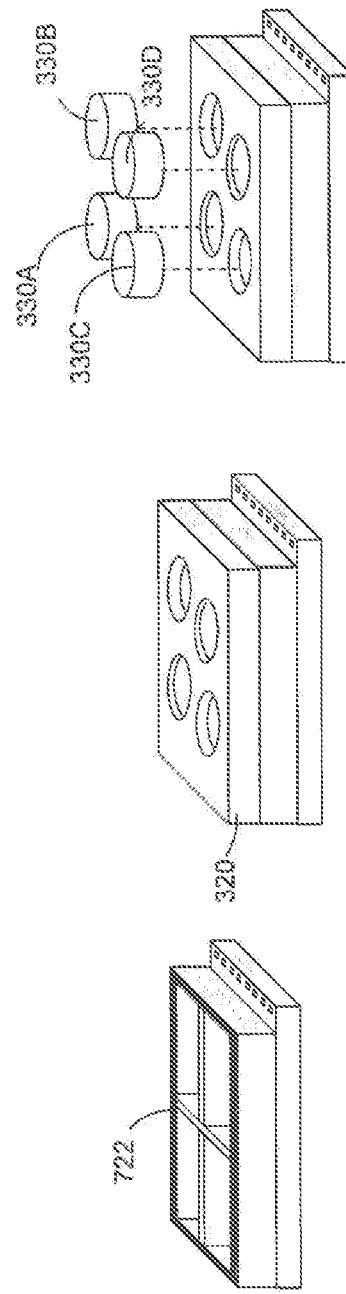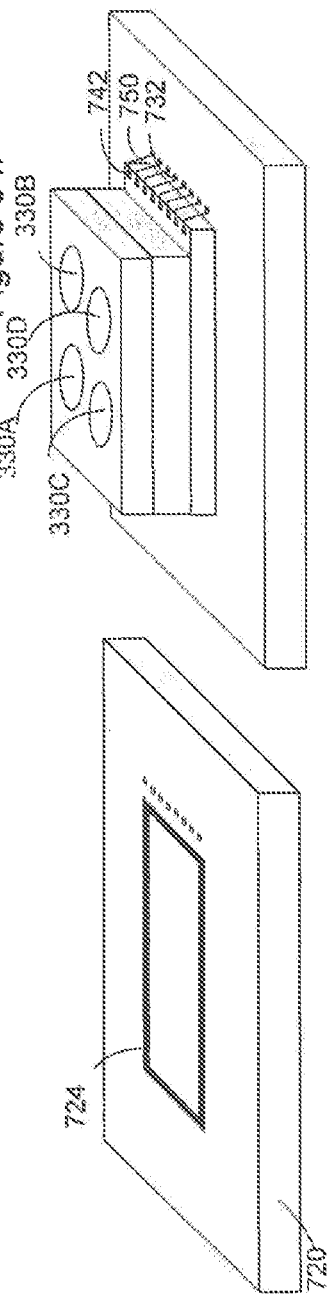

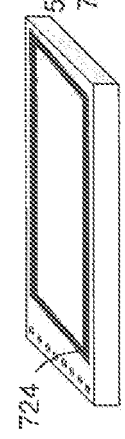
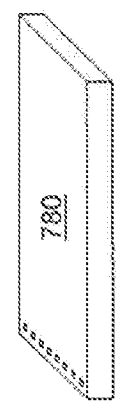
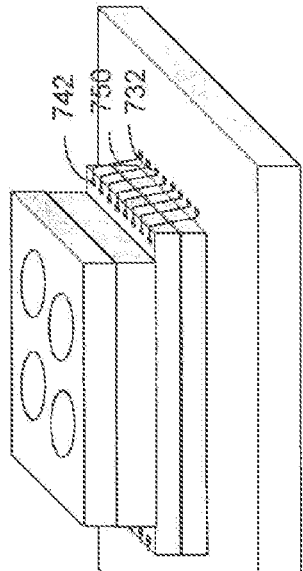
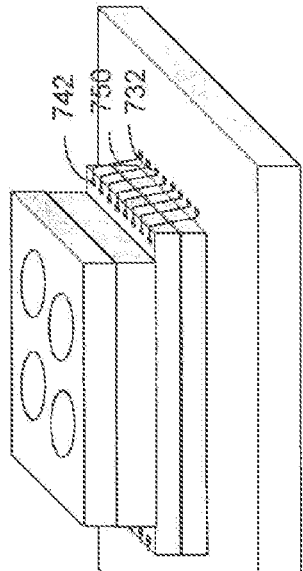
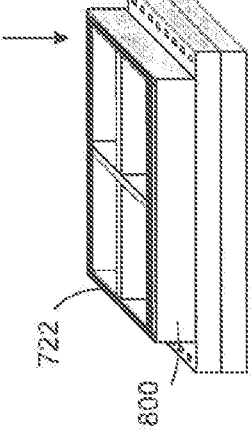
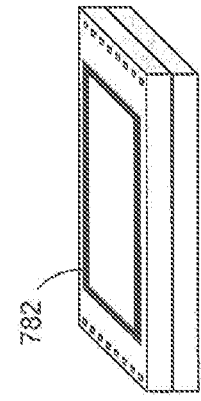
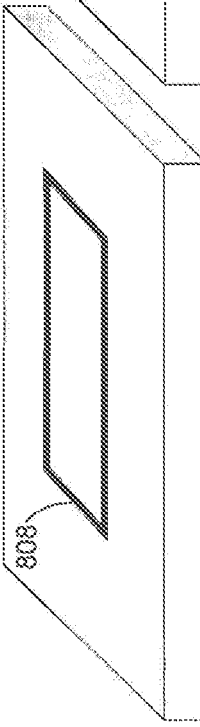

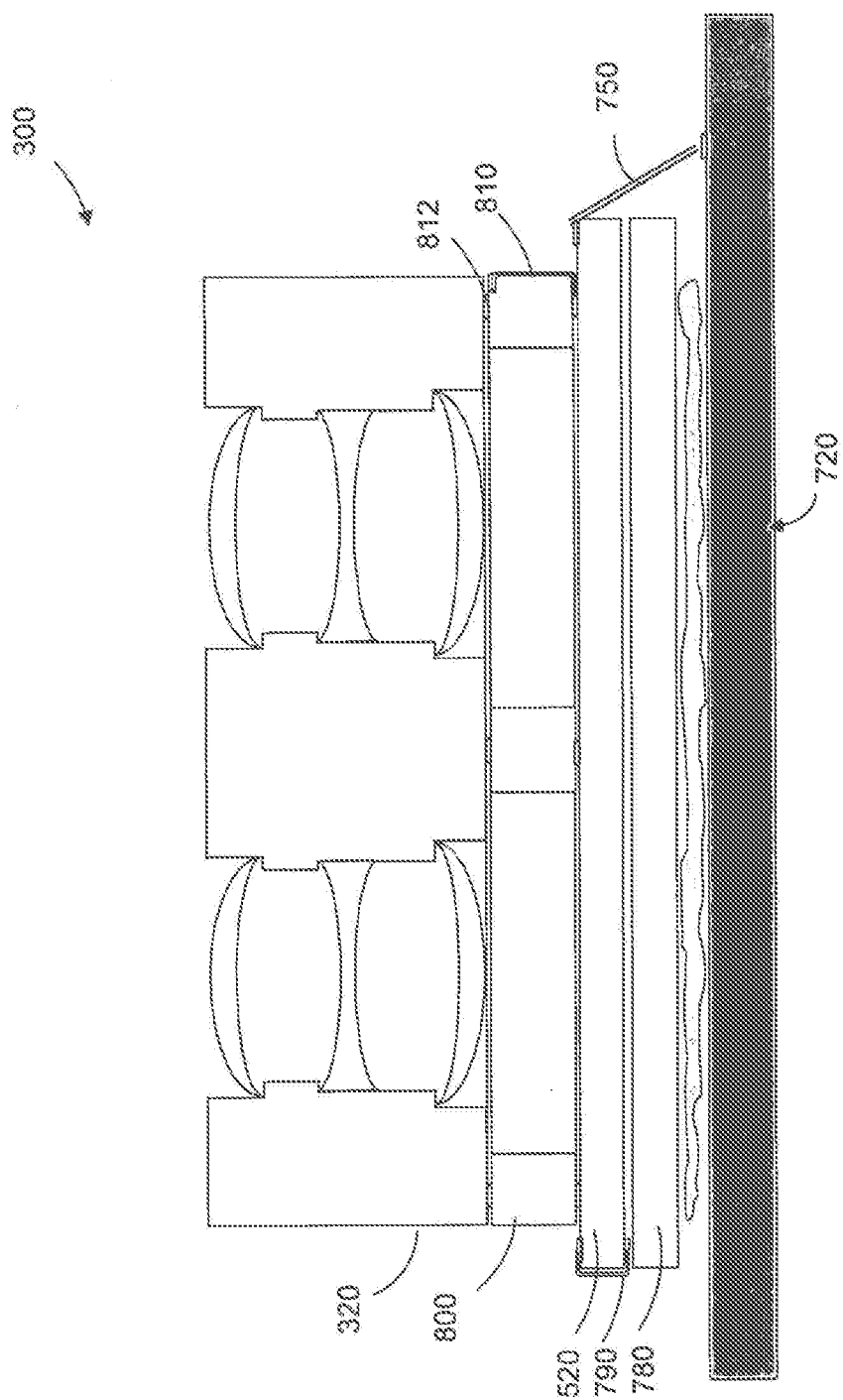

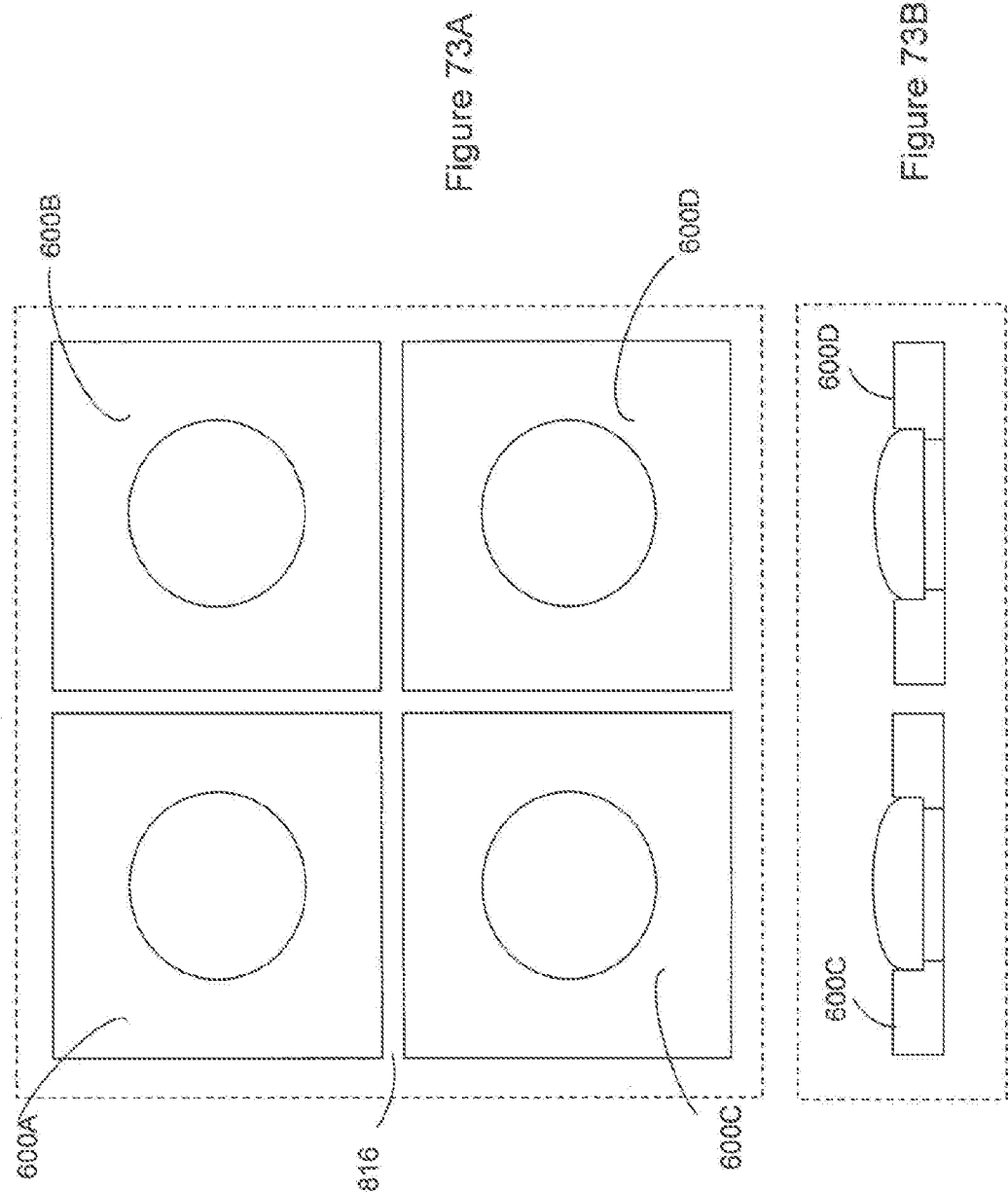

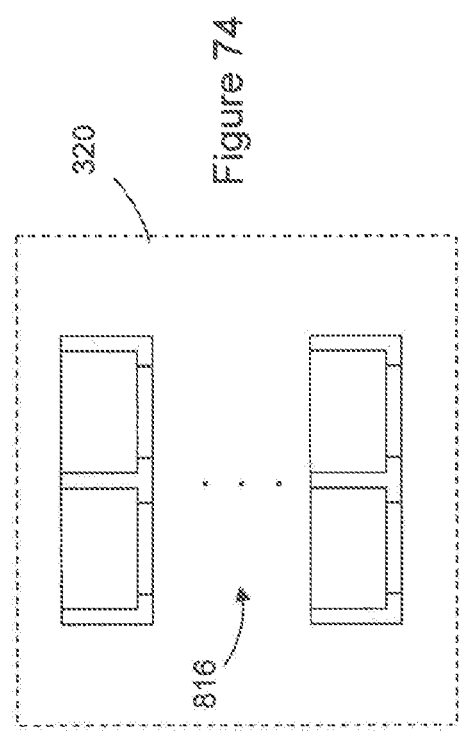
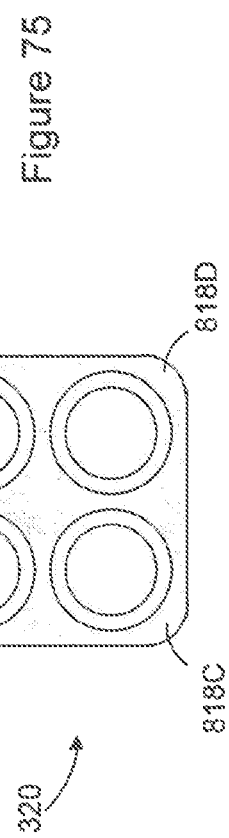

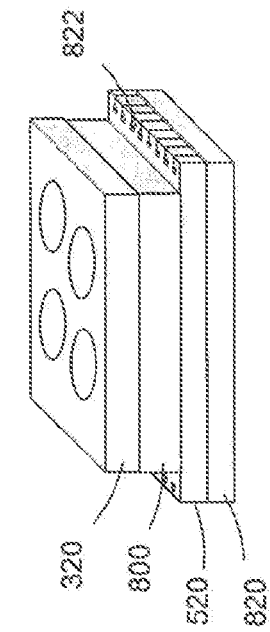
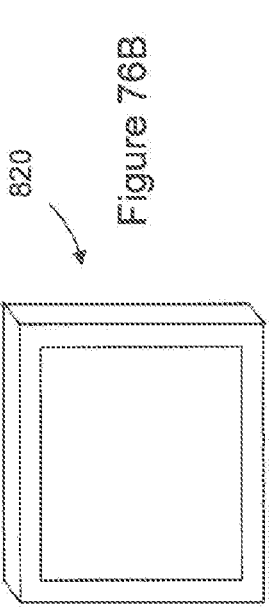
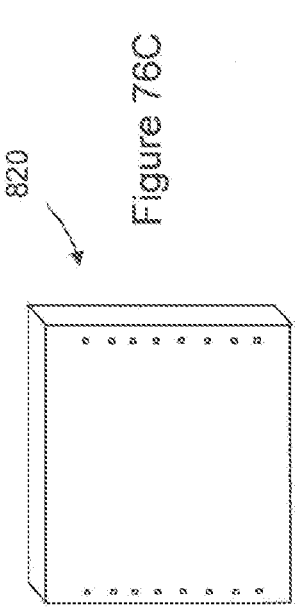

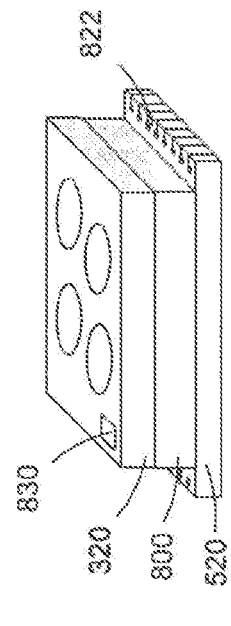
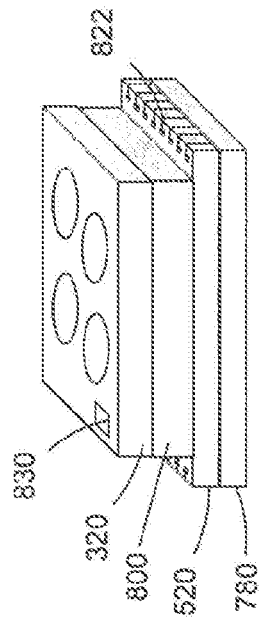
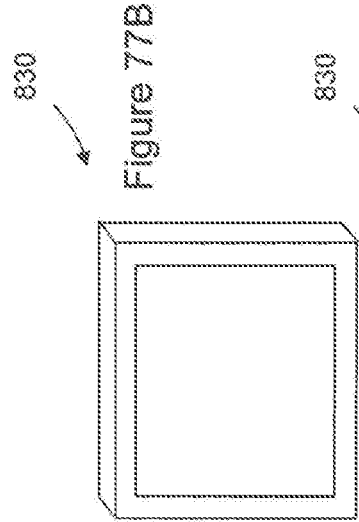
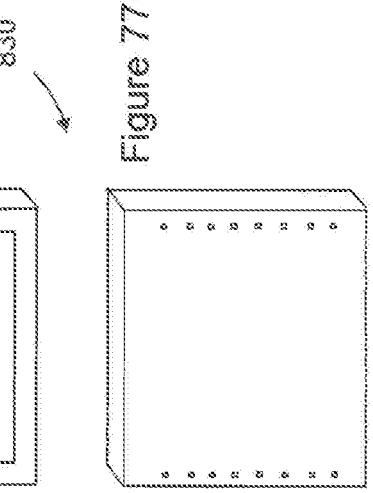
Figure 77A
Figure 77B
Figure 77C
Figure 77D
Figure 77E
Figure 77F

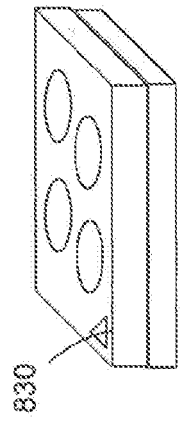
Figure 77G
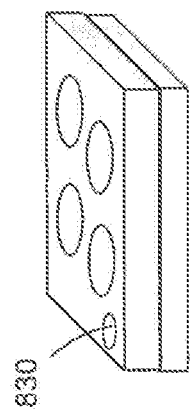
Figure 77J
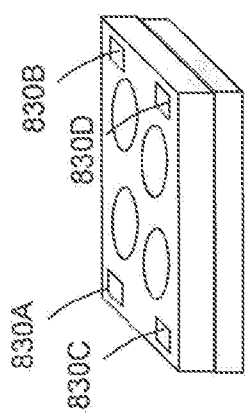
Figure 77H
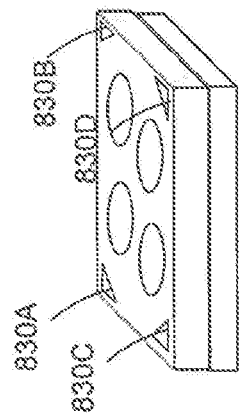
Figure 77M
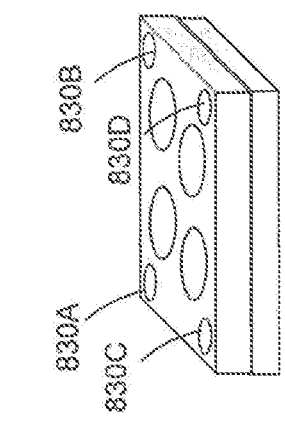
Figure 77K
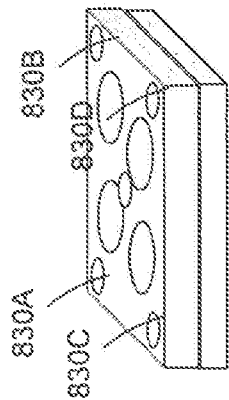
Figure 77N
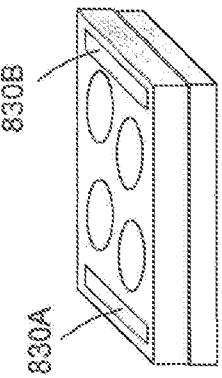
Figure 77I
Figure 77L

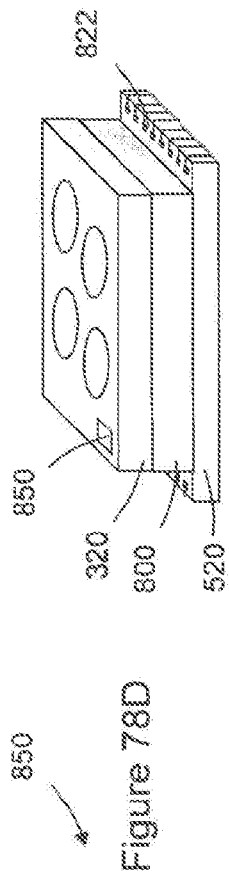
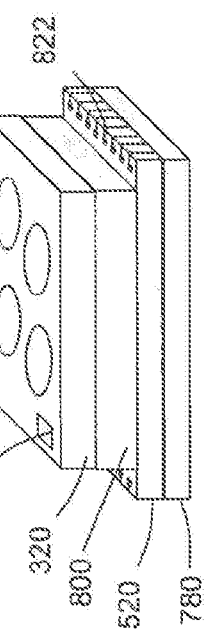
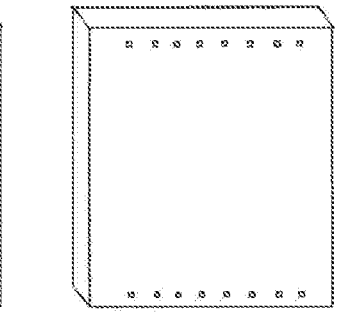

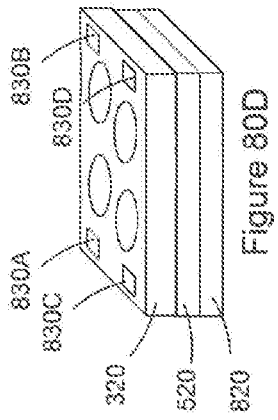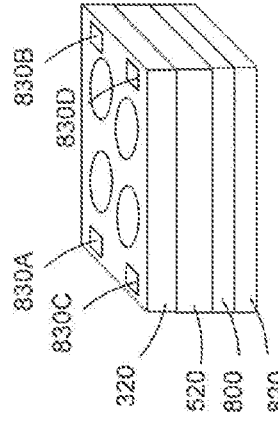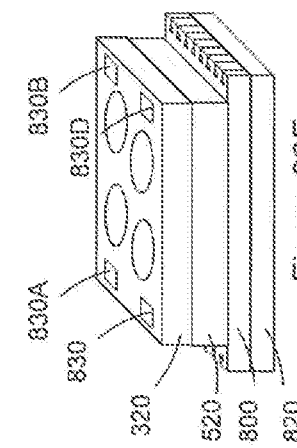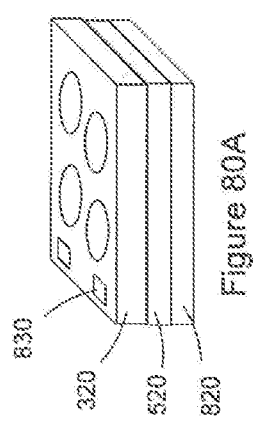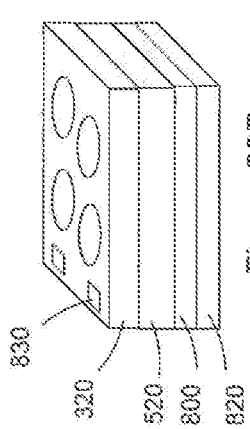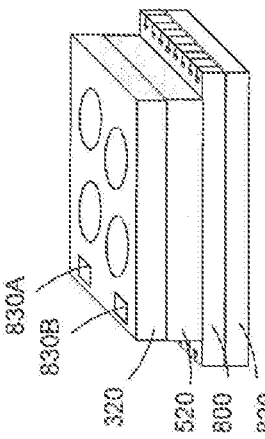

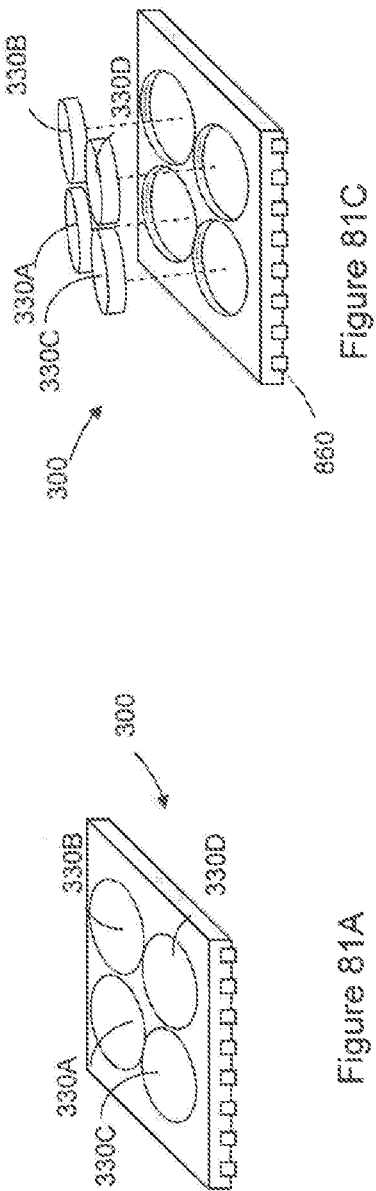
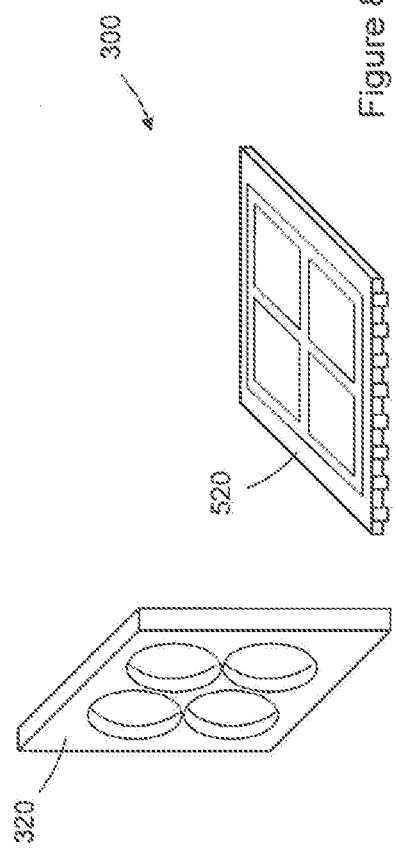
Figure 81A
Figure 81B
Figure 81C

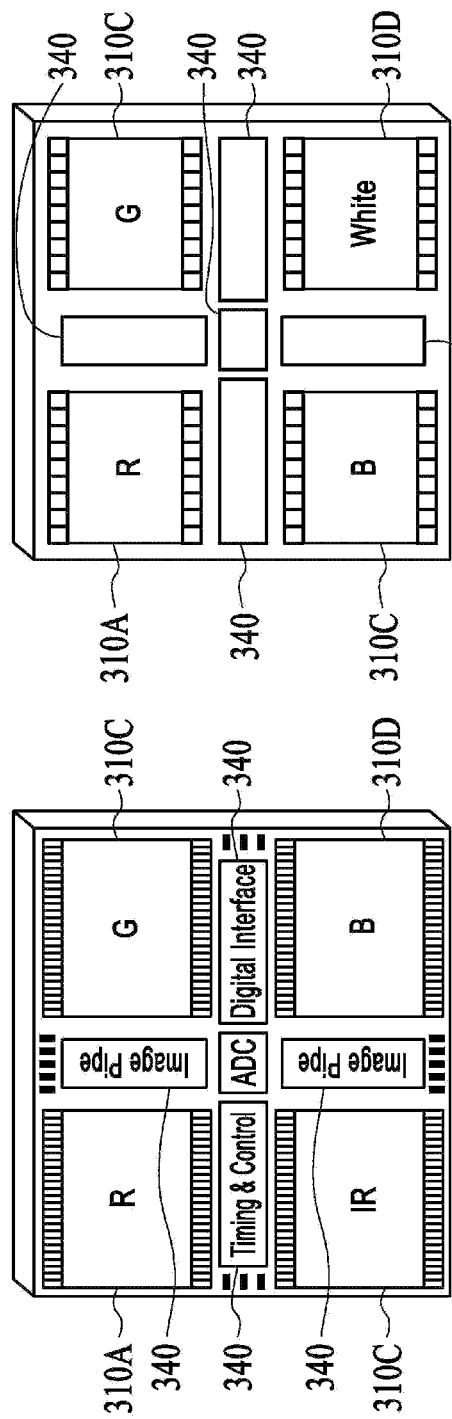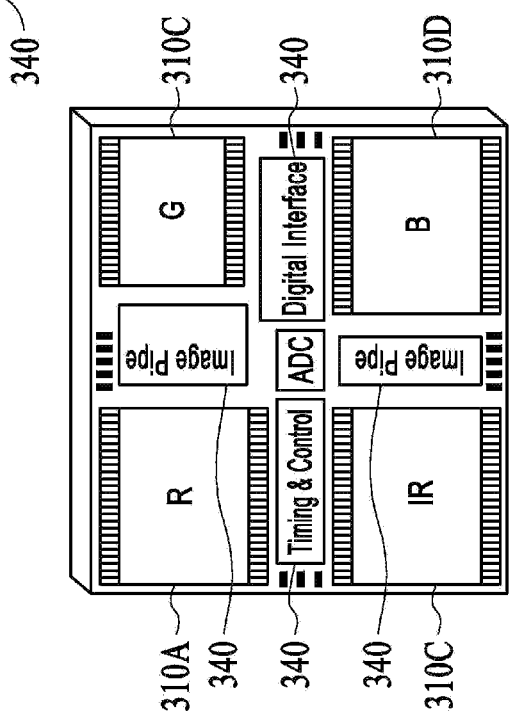
FIG.83A
FIG.83B
FIG.83C

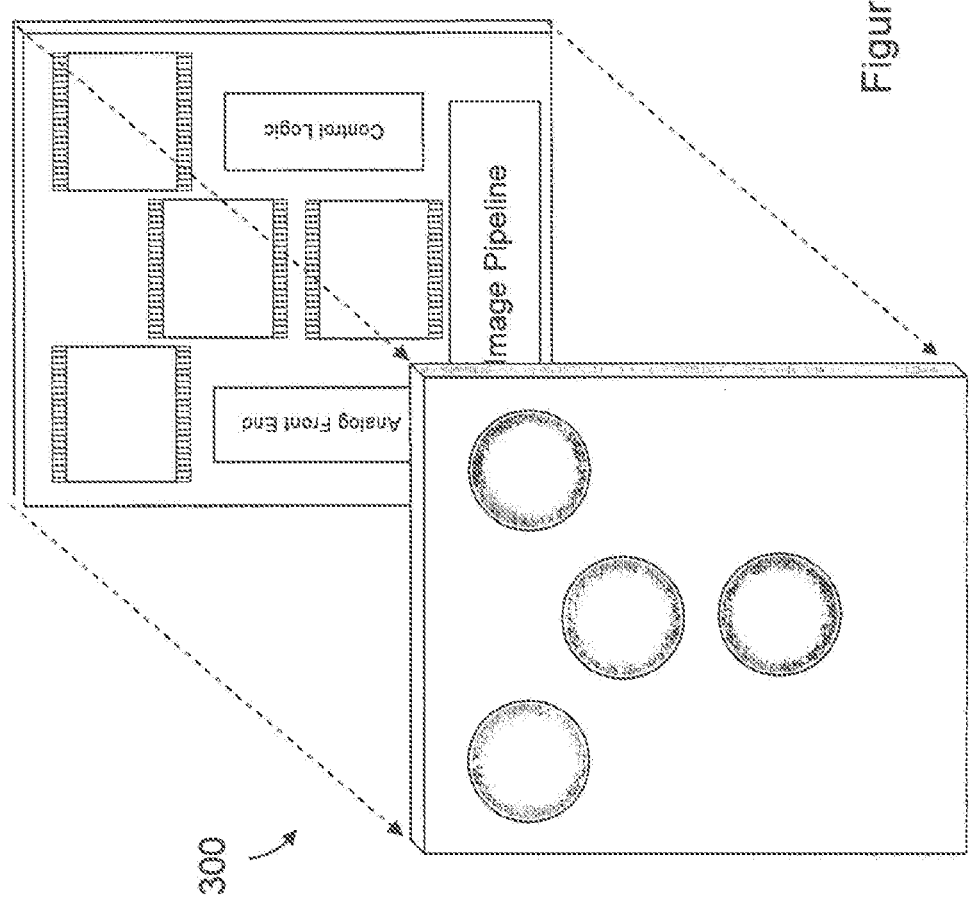

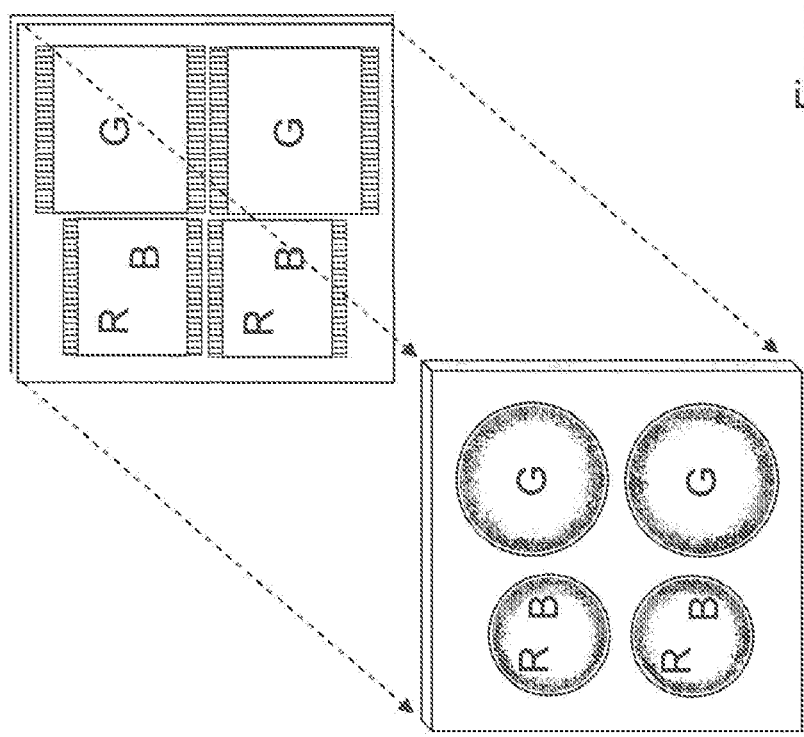

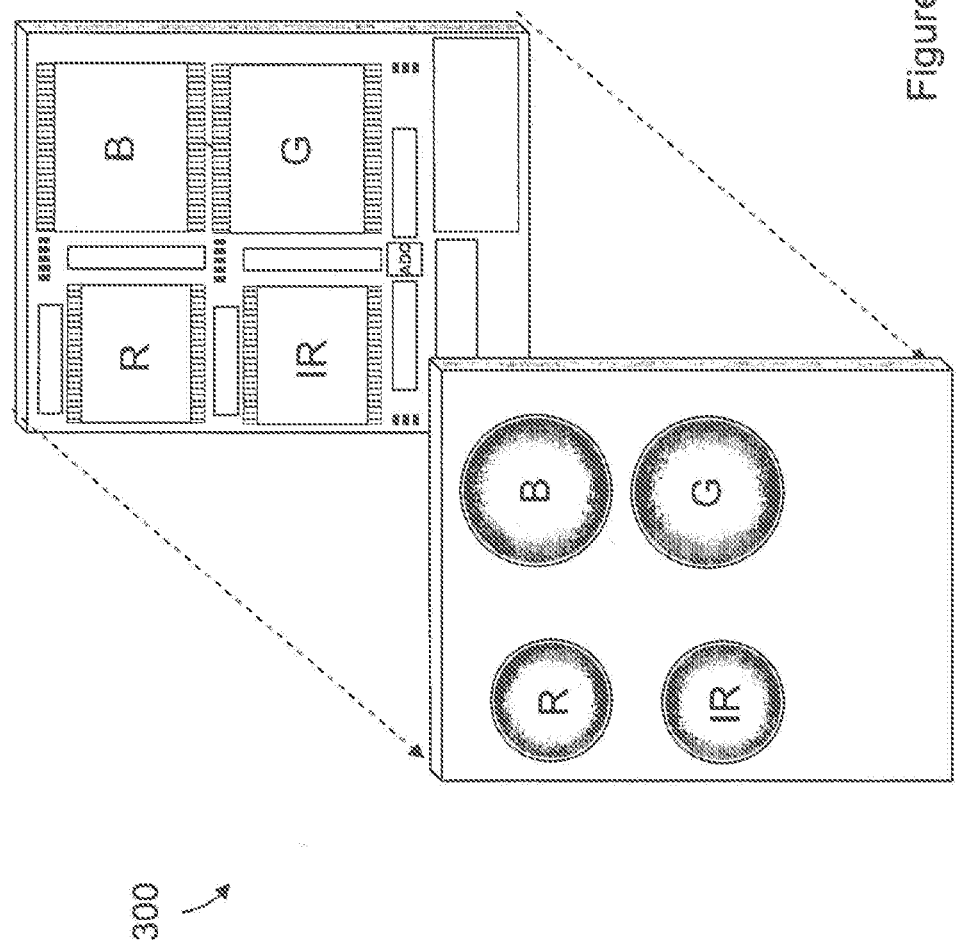

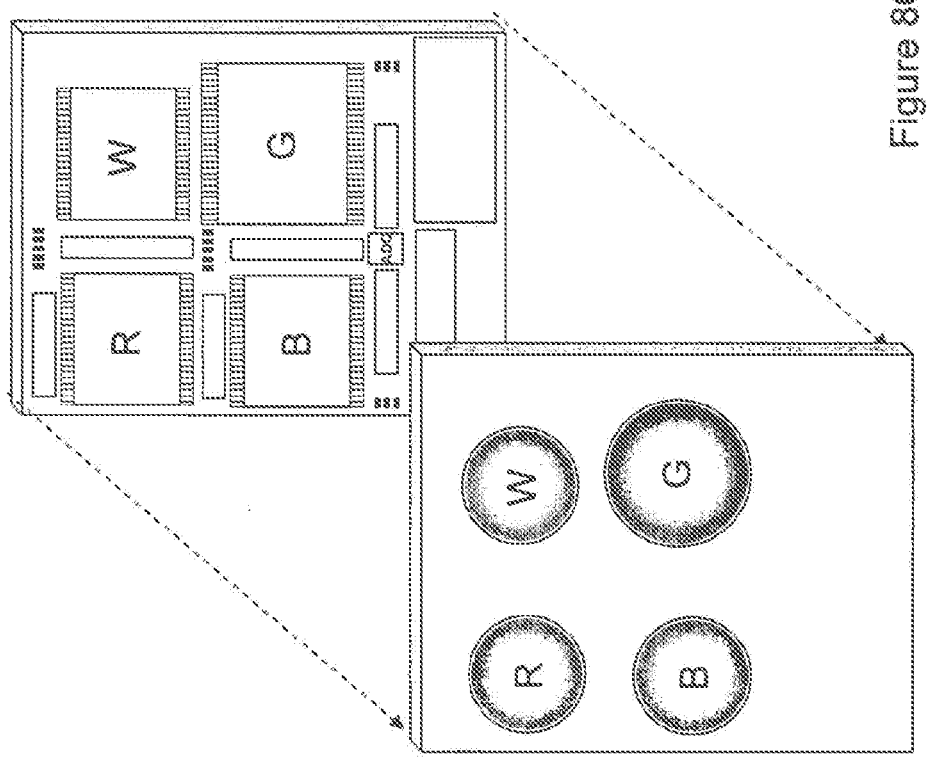

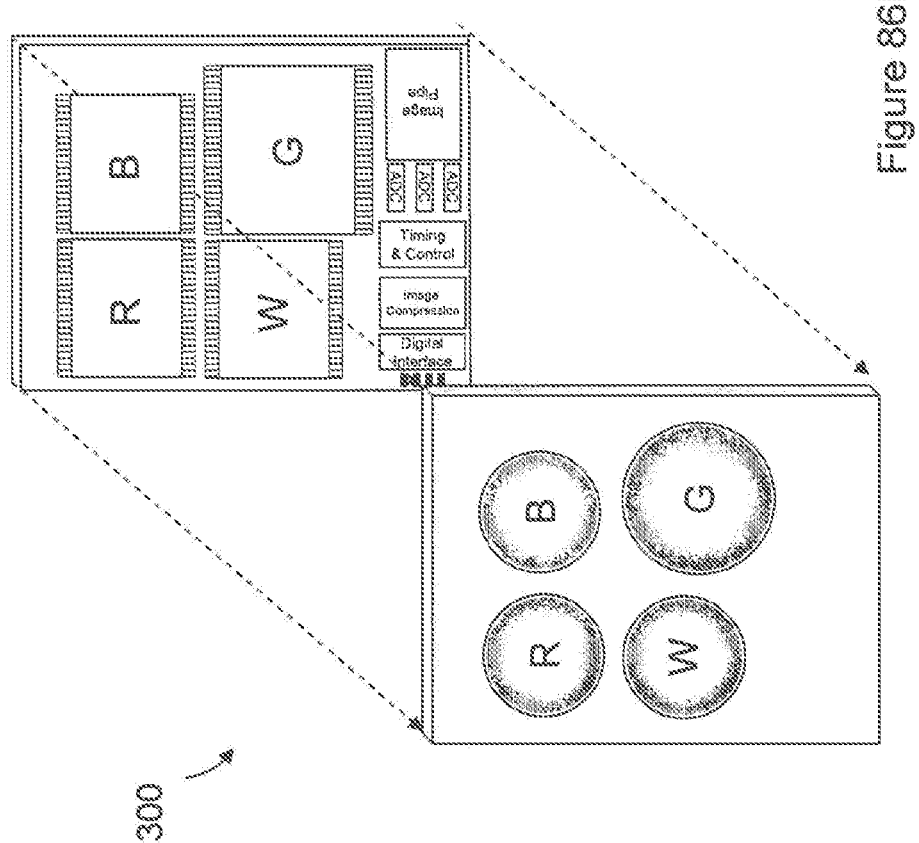

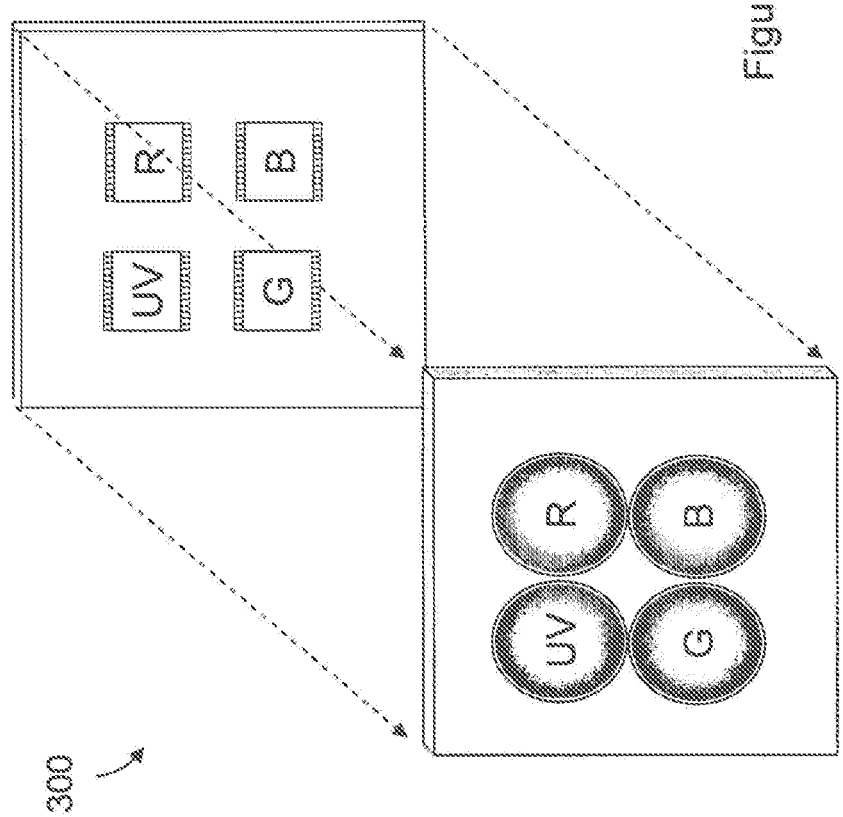

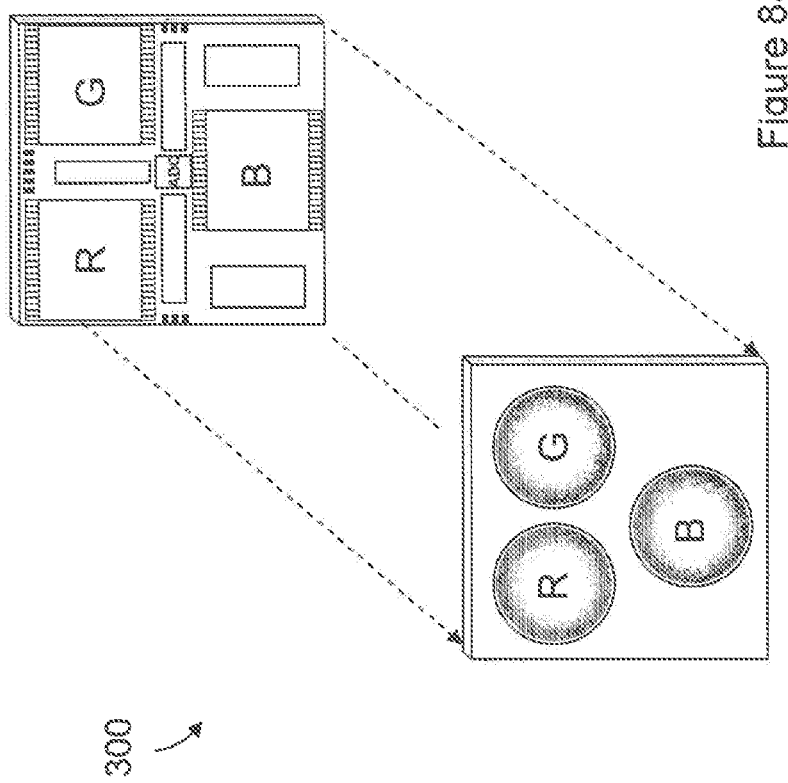

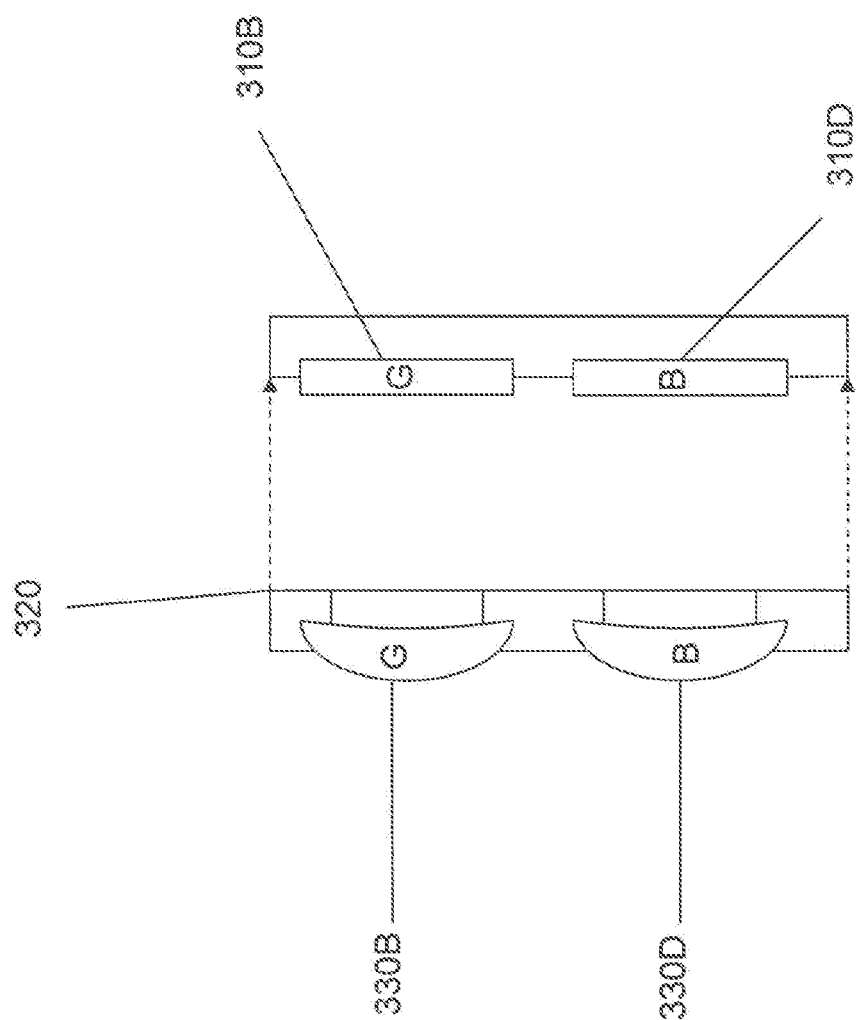

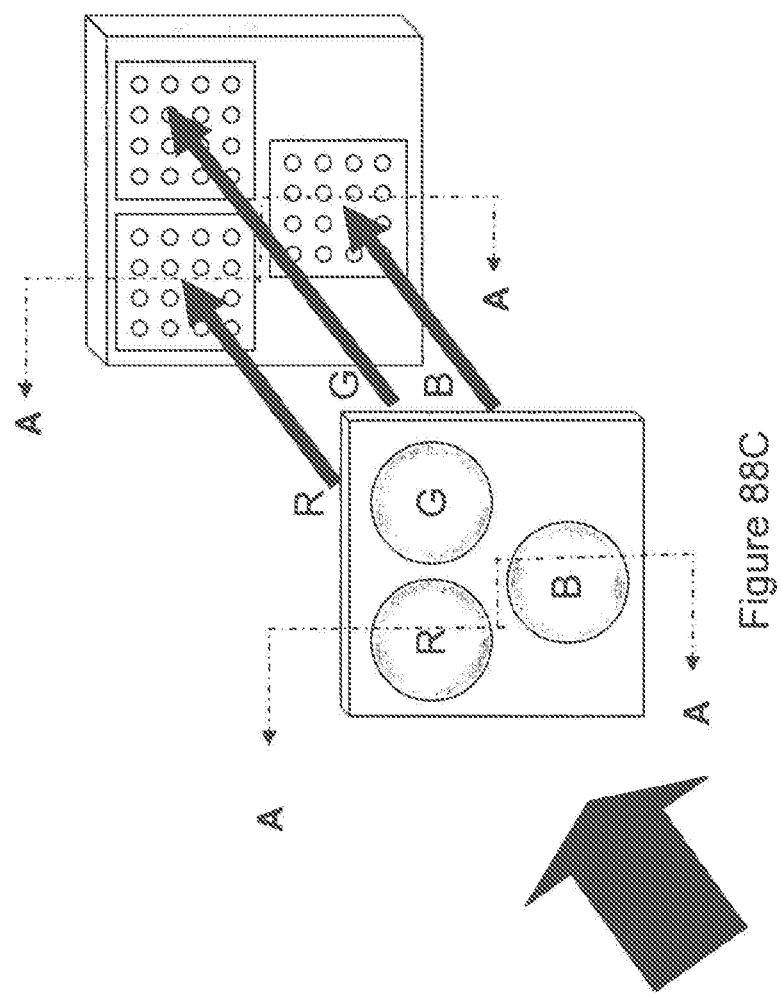

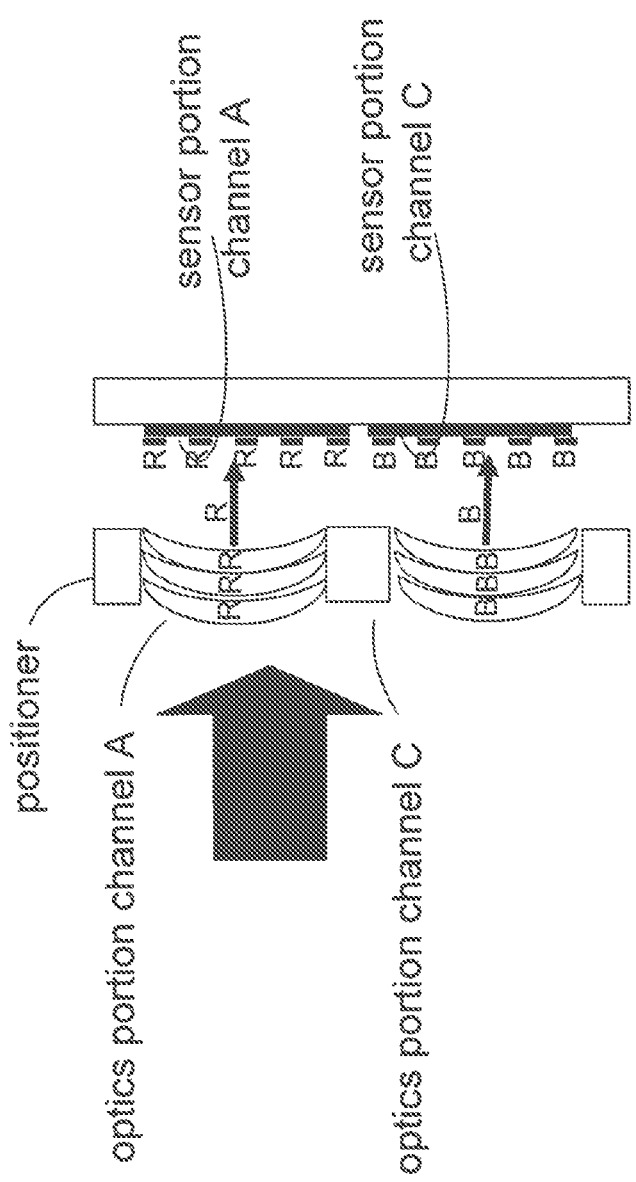

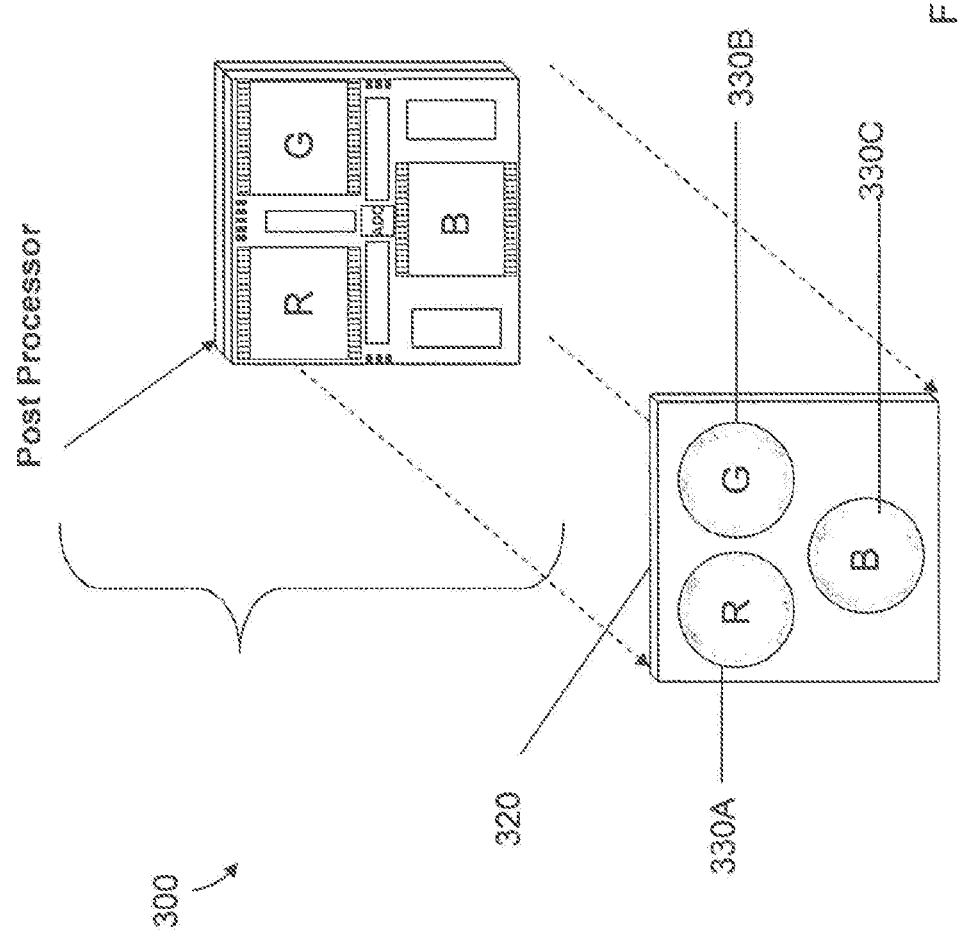

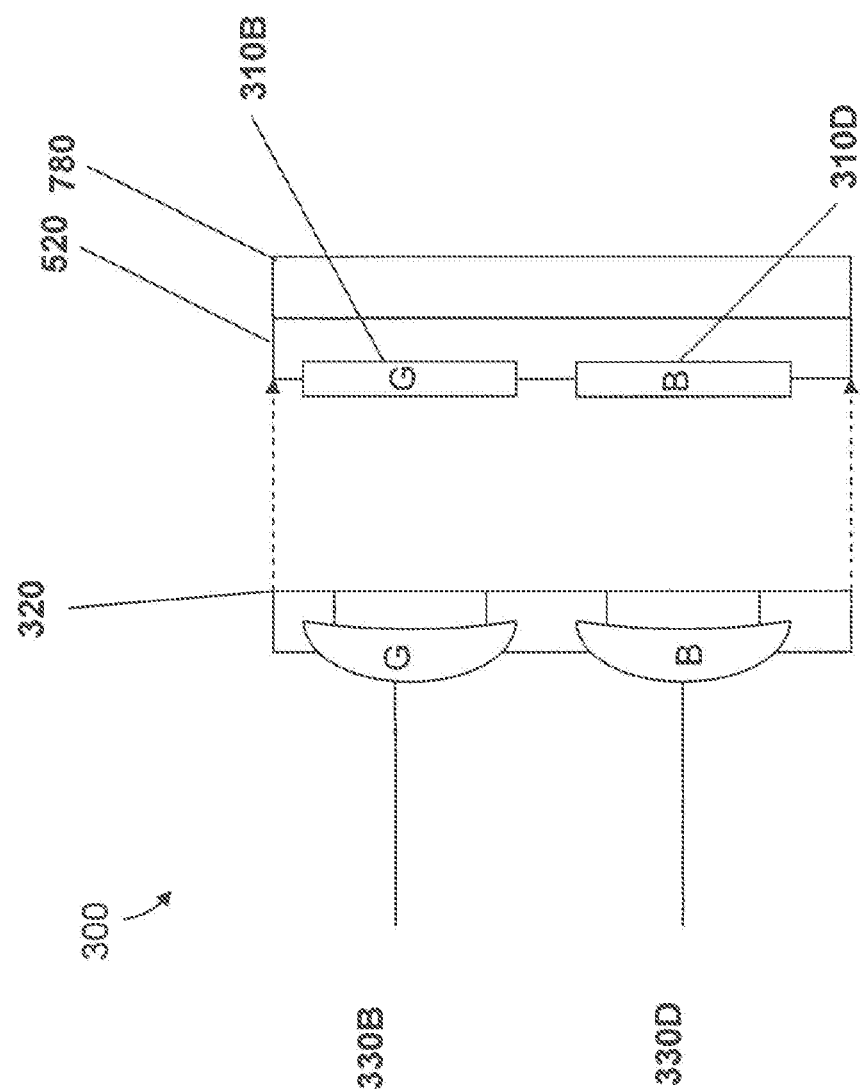

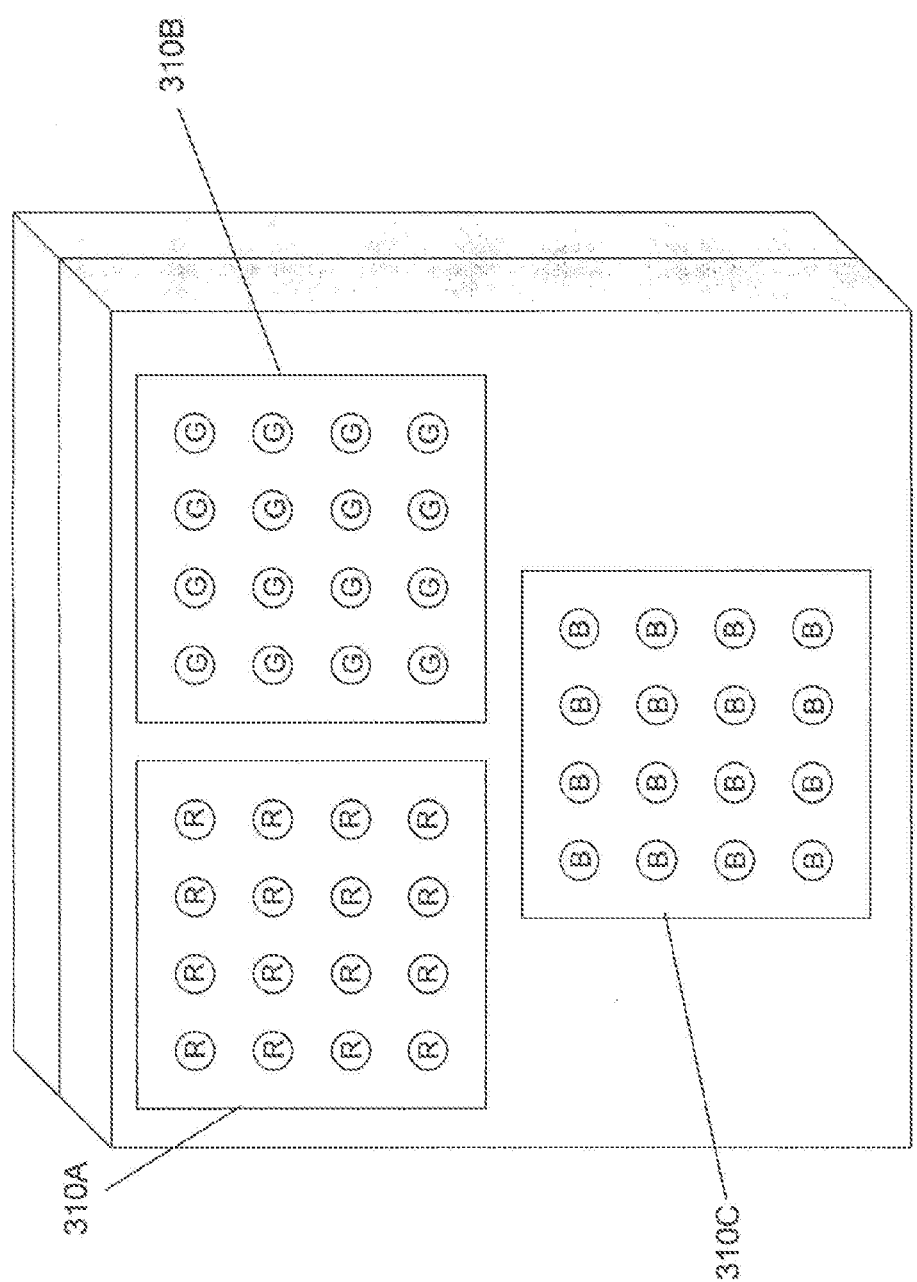

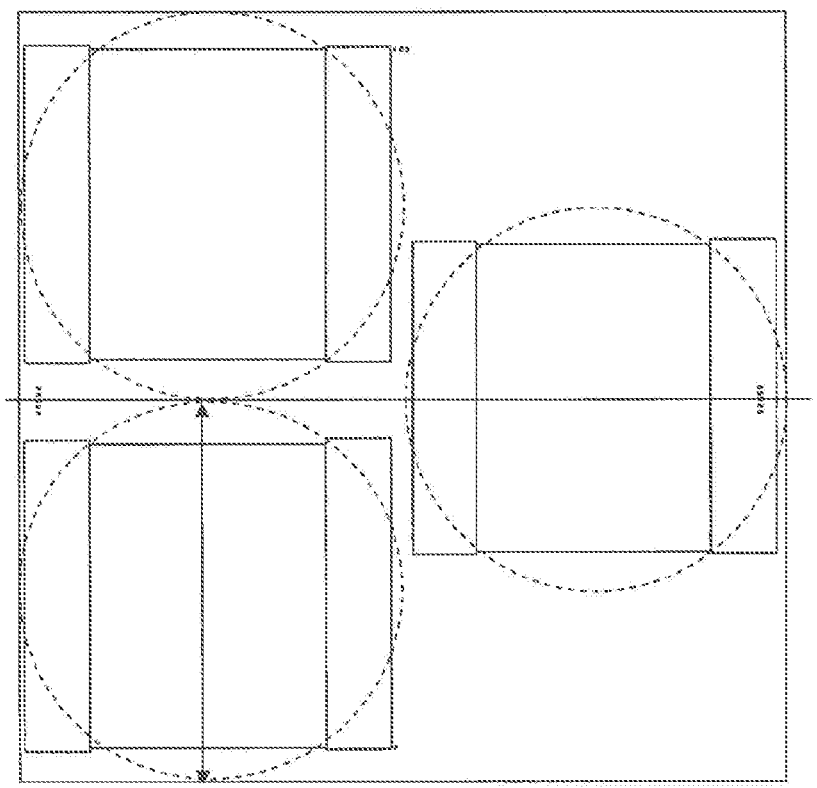
Figure 91A
Figure 91B

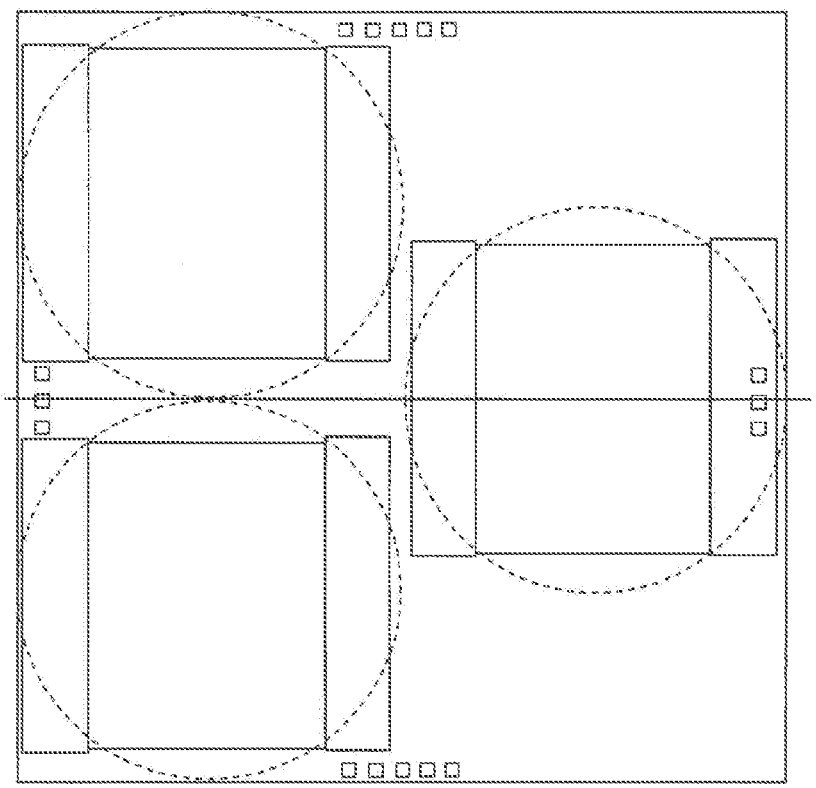
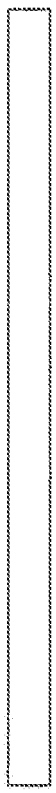
Figure 92A
Figure 92B

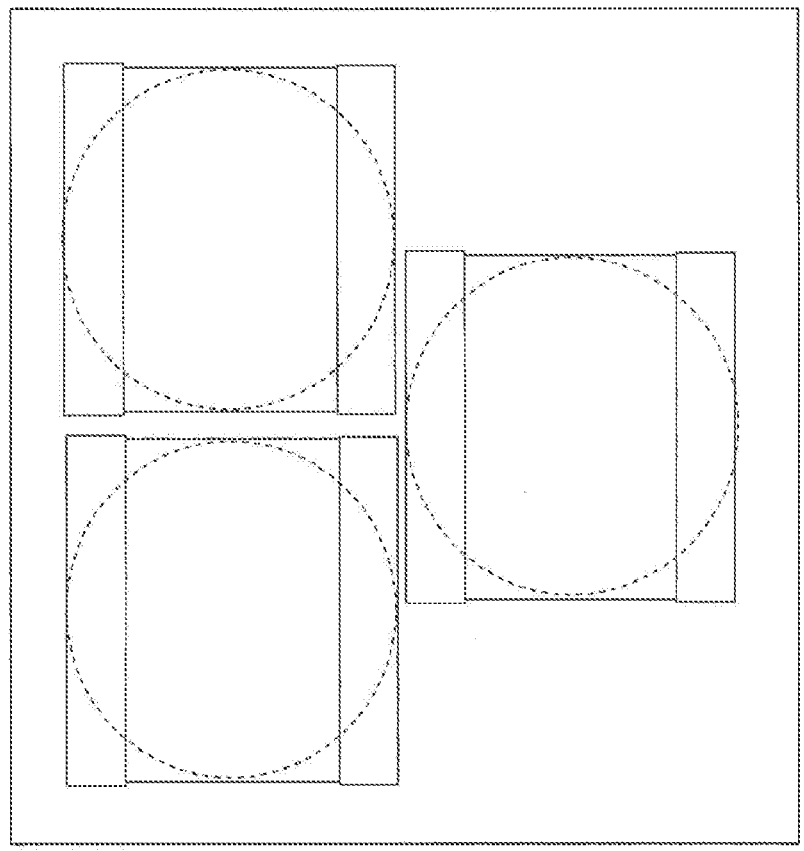
Figure 93A
Figure 93B

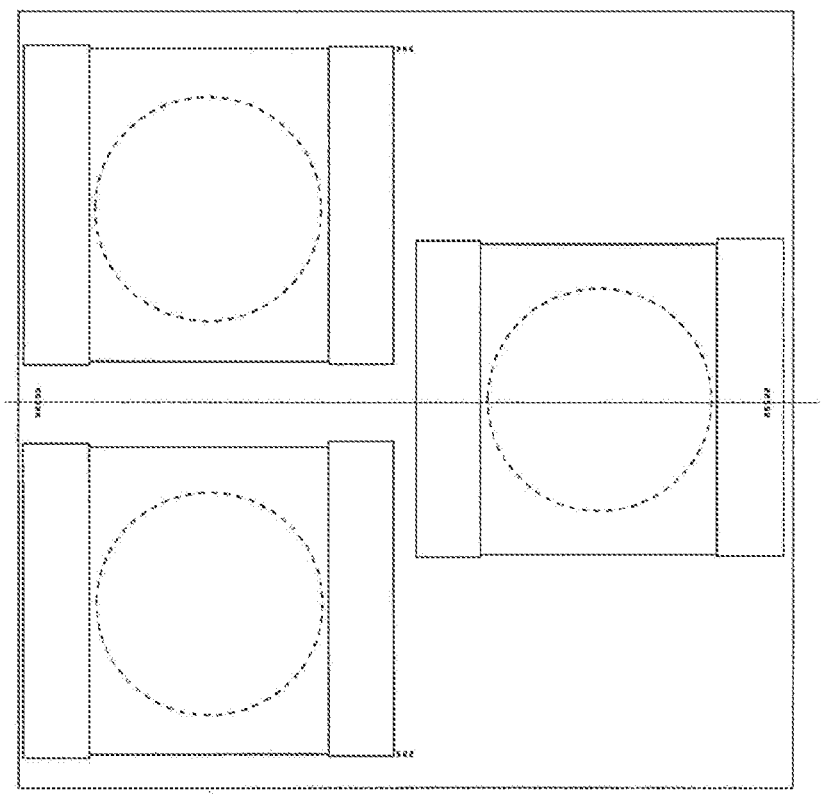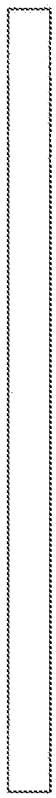

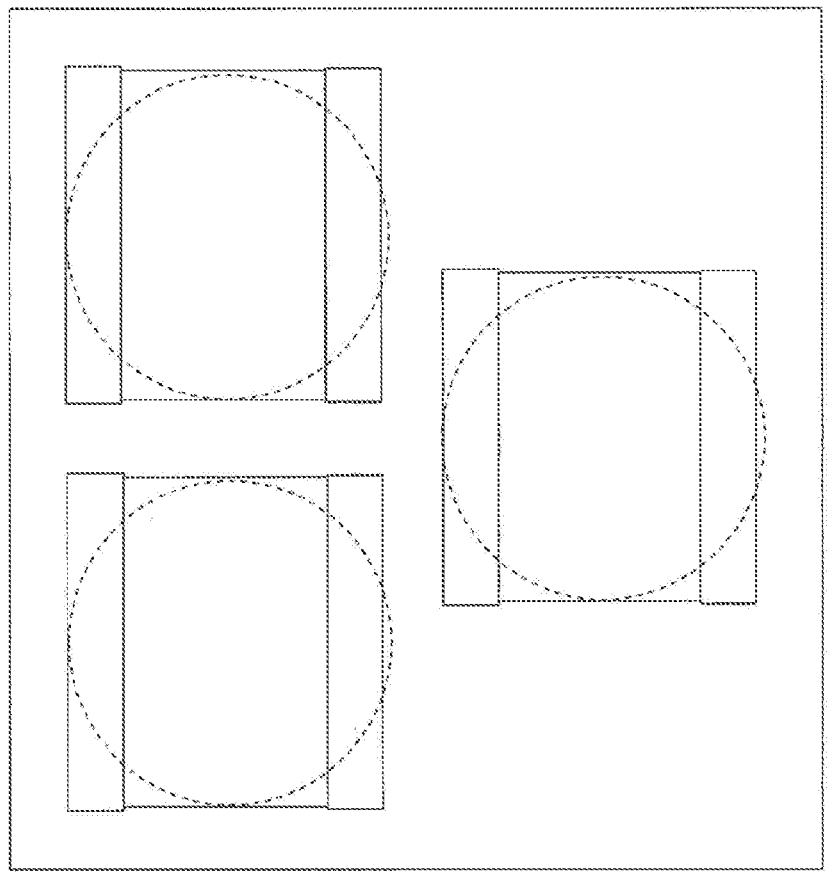
Figure 95A
Figure 95B

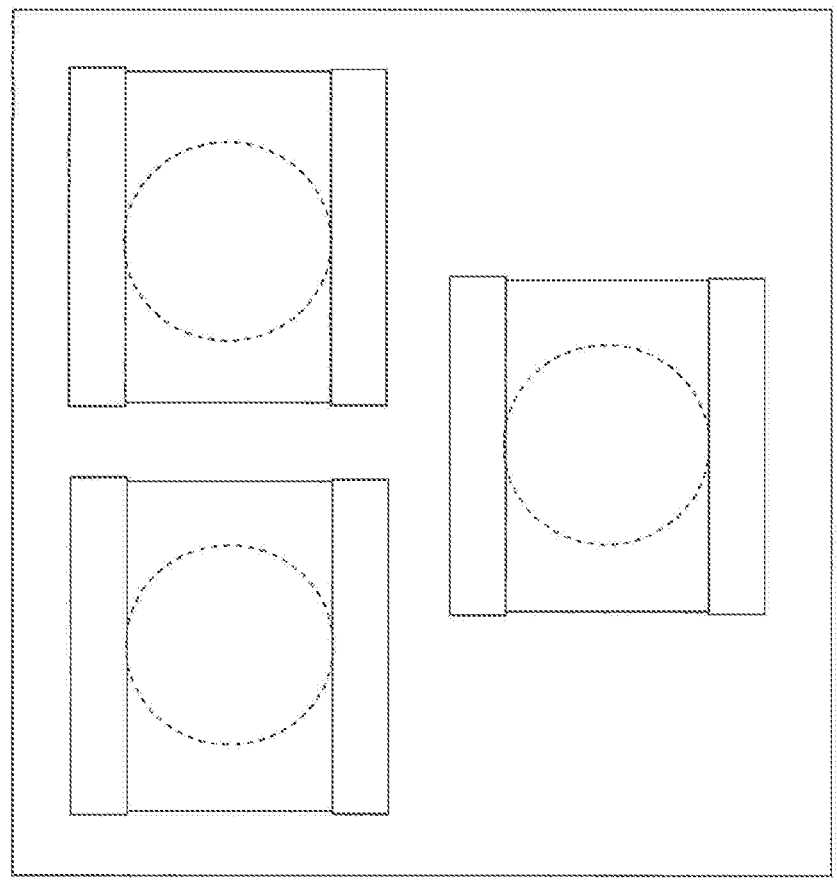
Figure 96A
Figure 96B

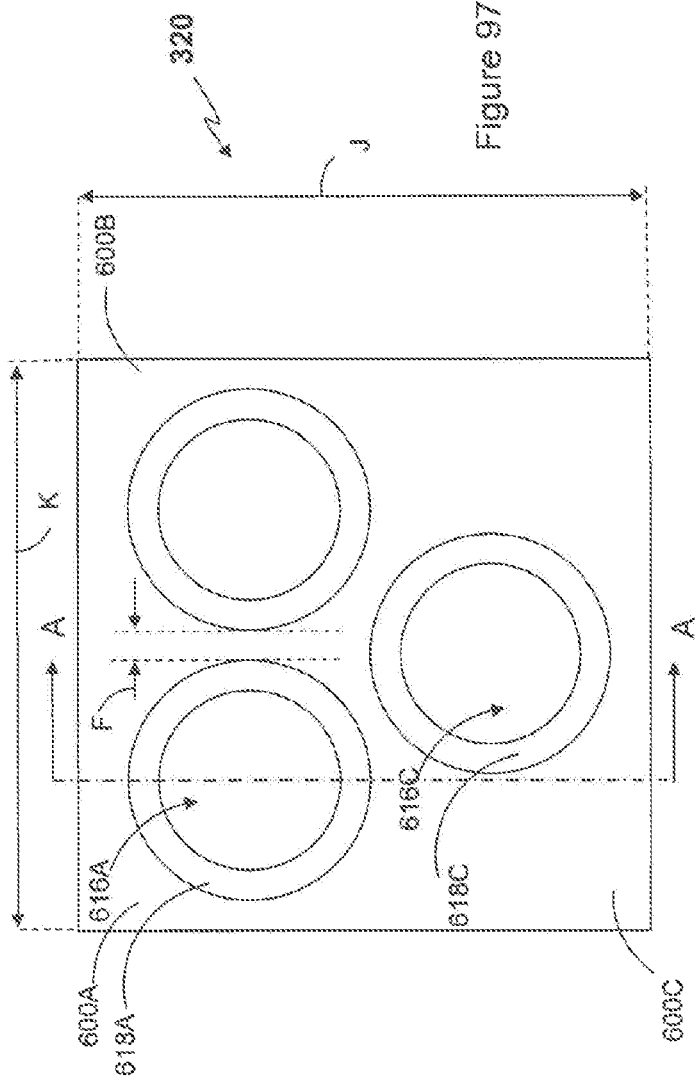
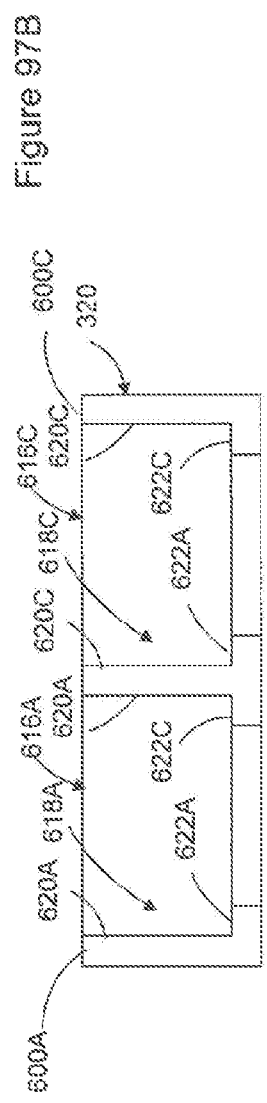

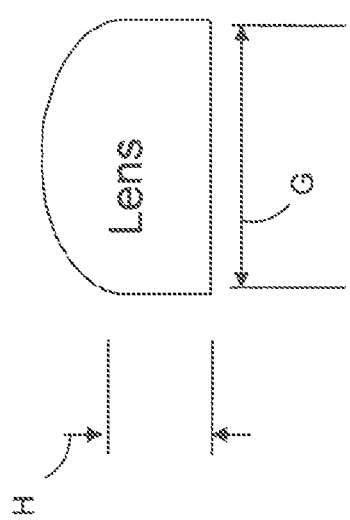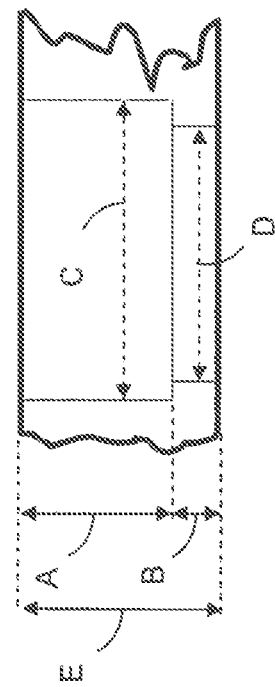

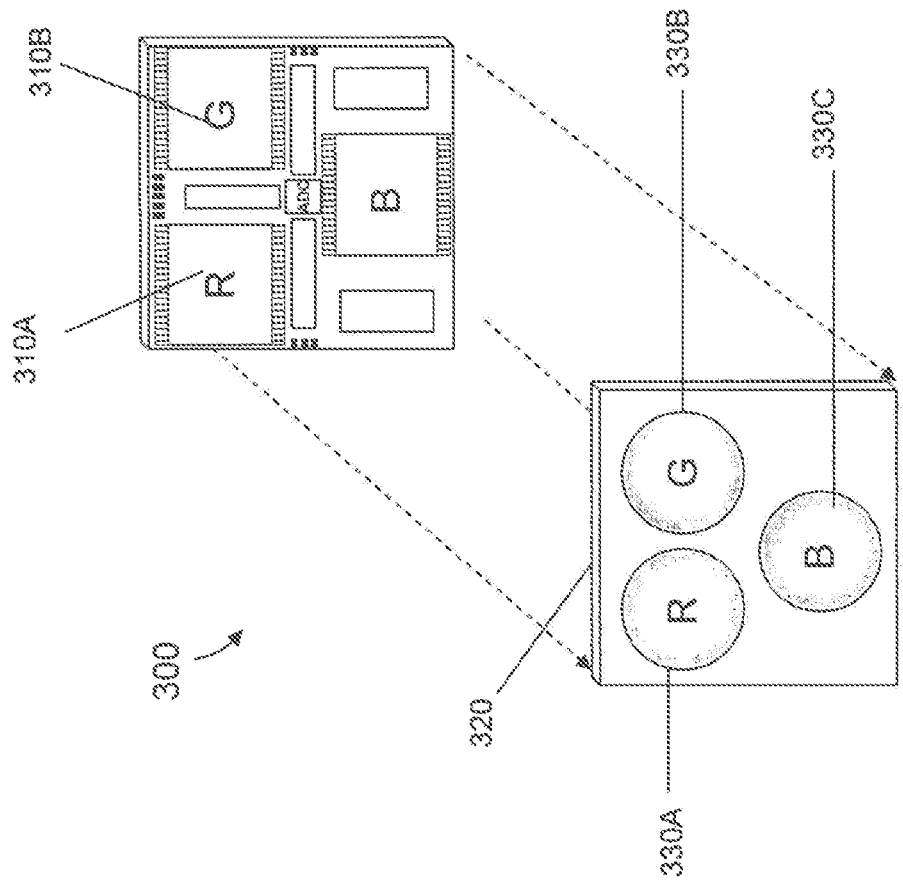
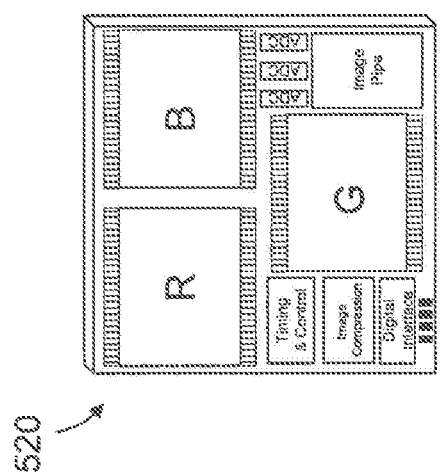
Figure 98A
Figure 98B

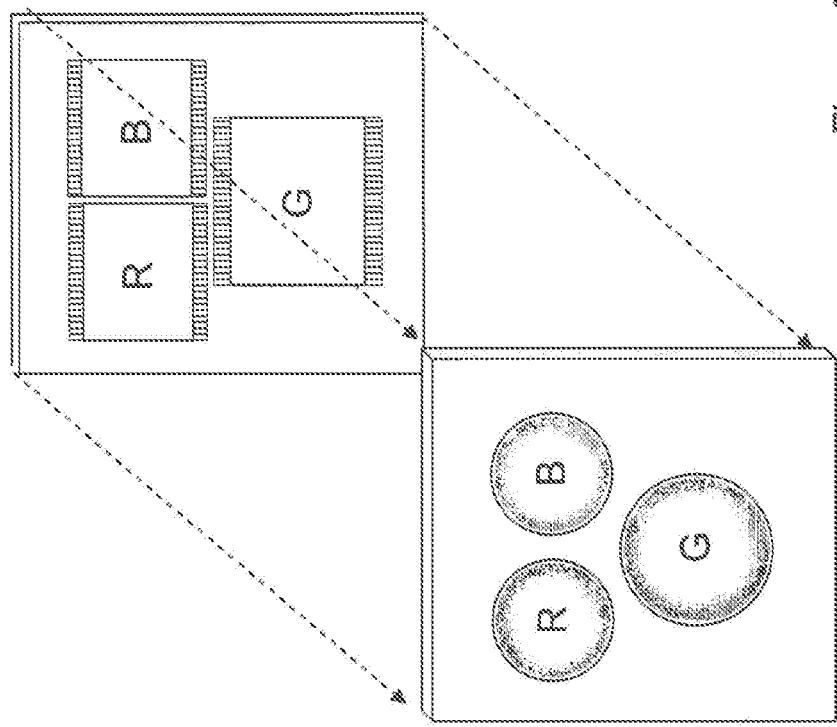

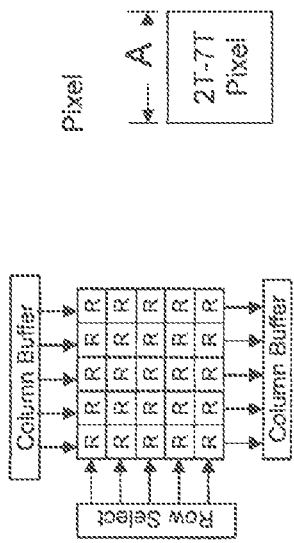
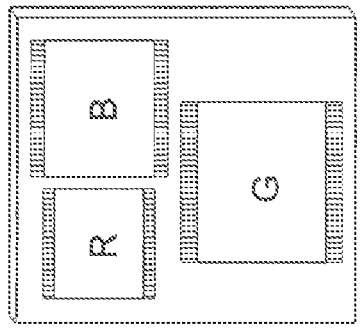
Figure 101A
Figure 101B
Figure 101C
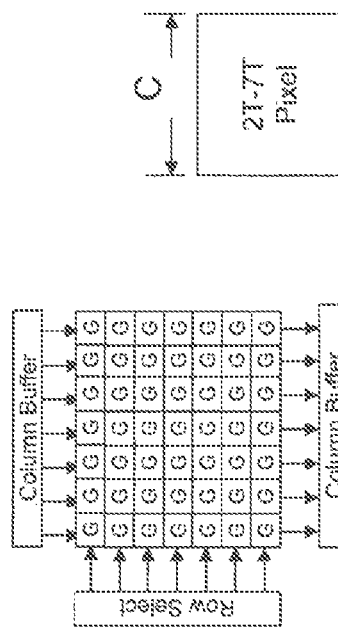
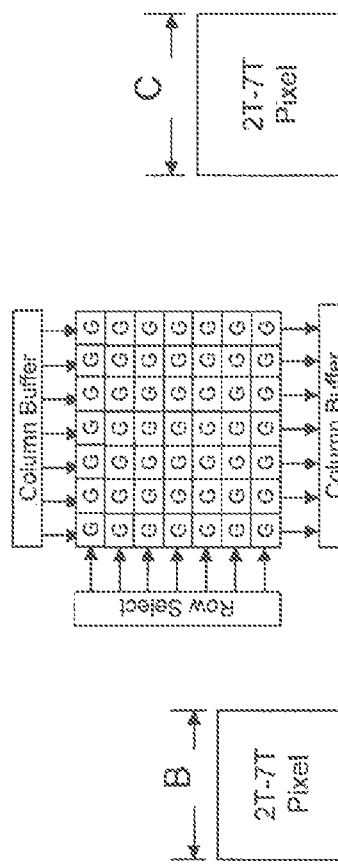
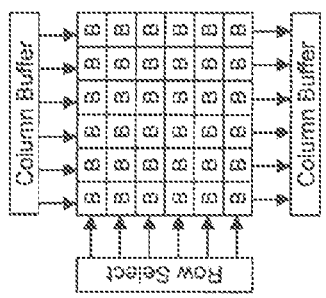
Figure 101D
Figure 101E
Figure 101F
Figure 101G

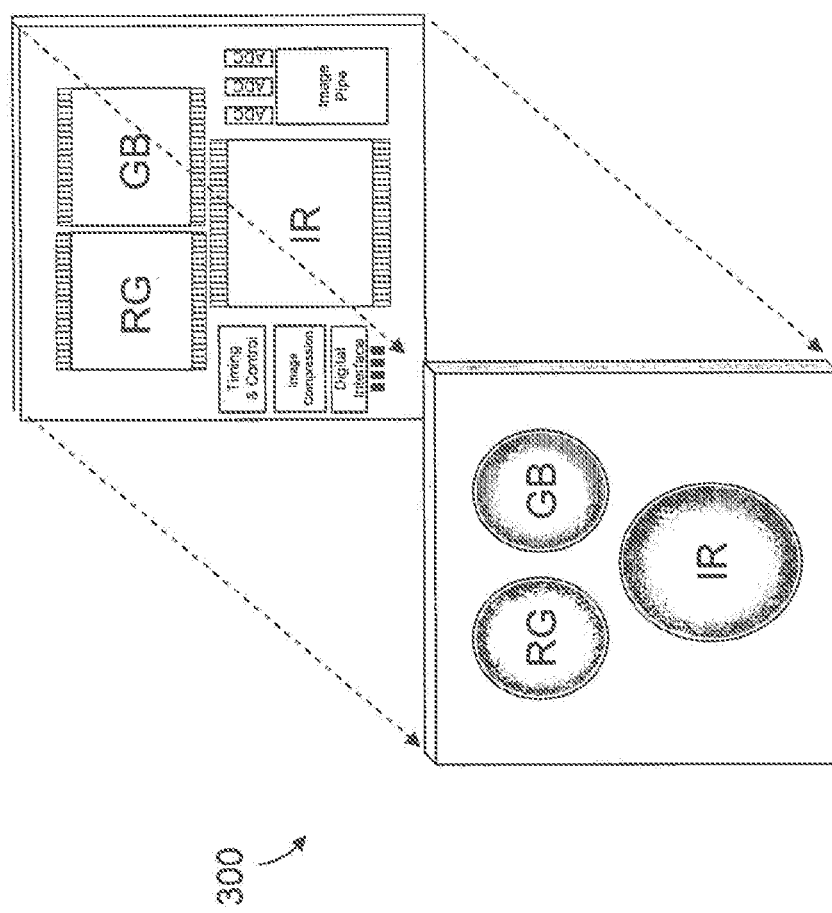

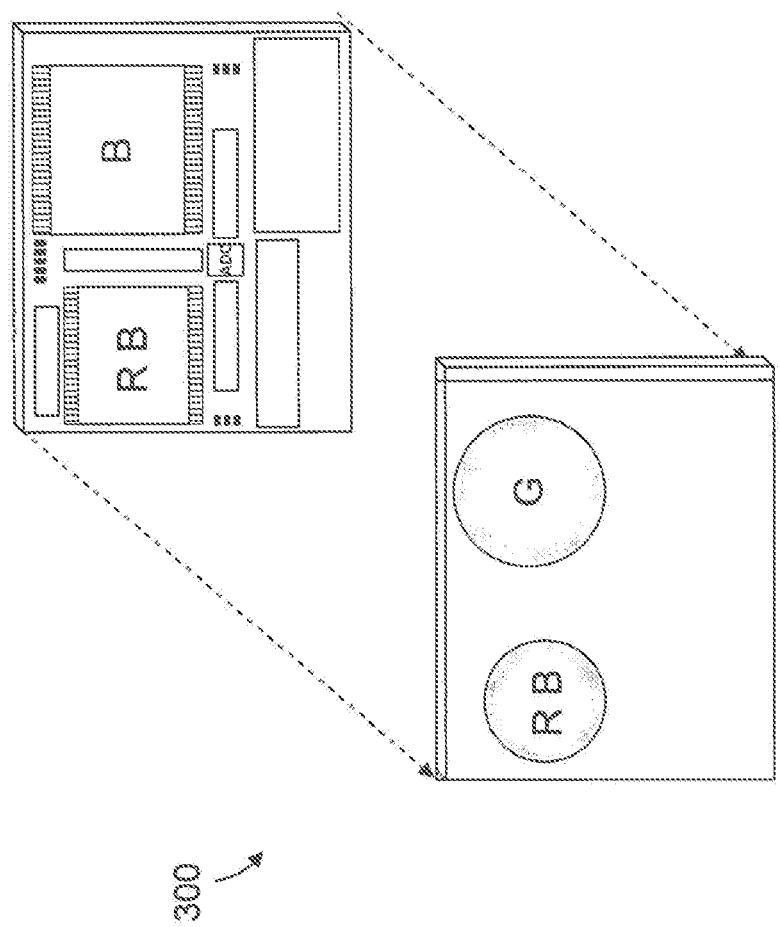

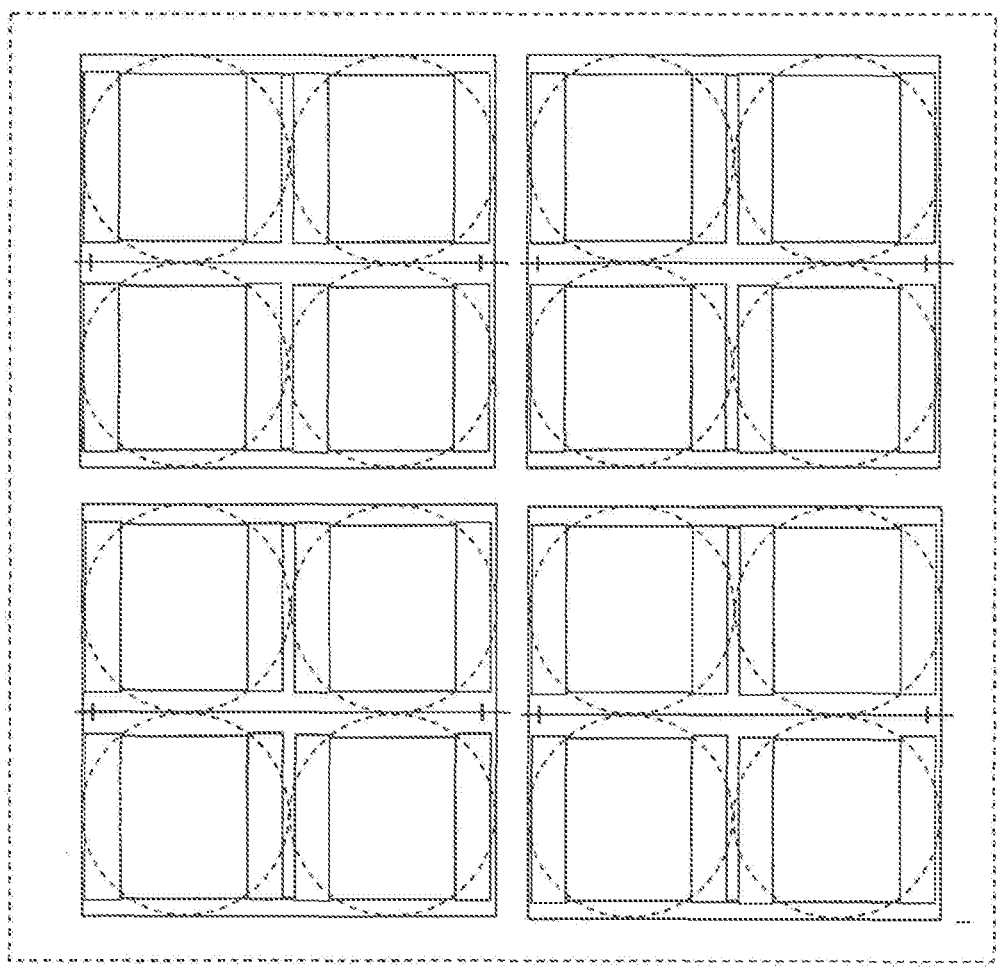

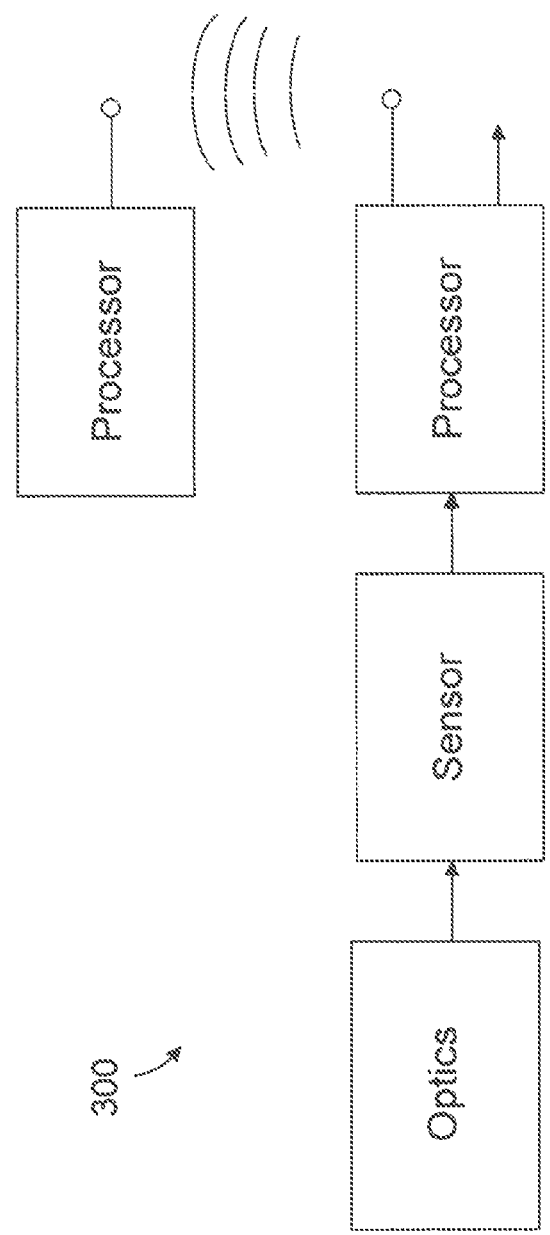

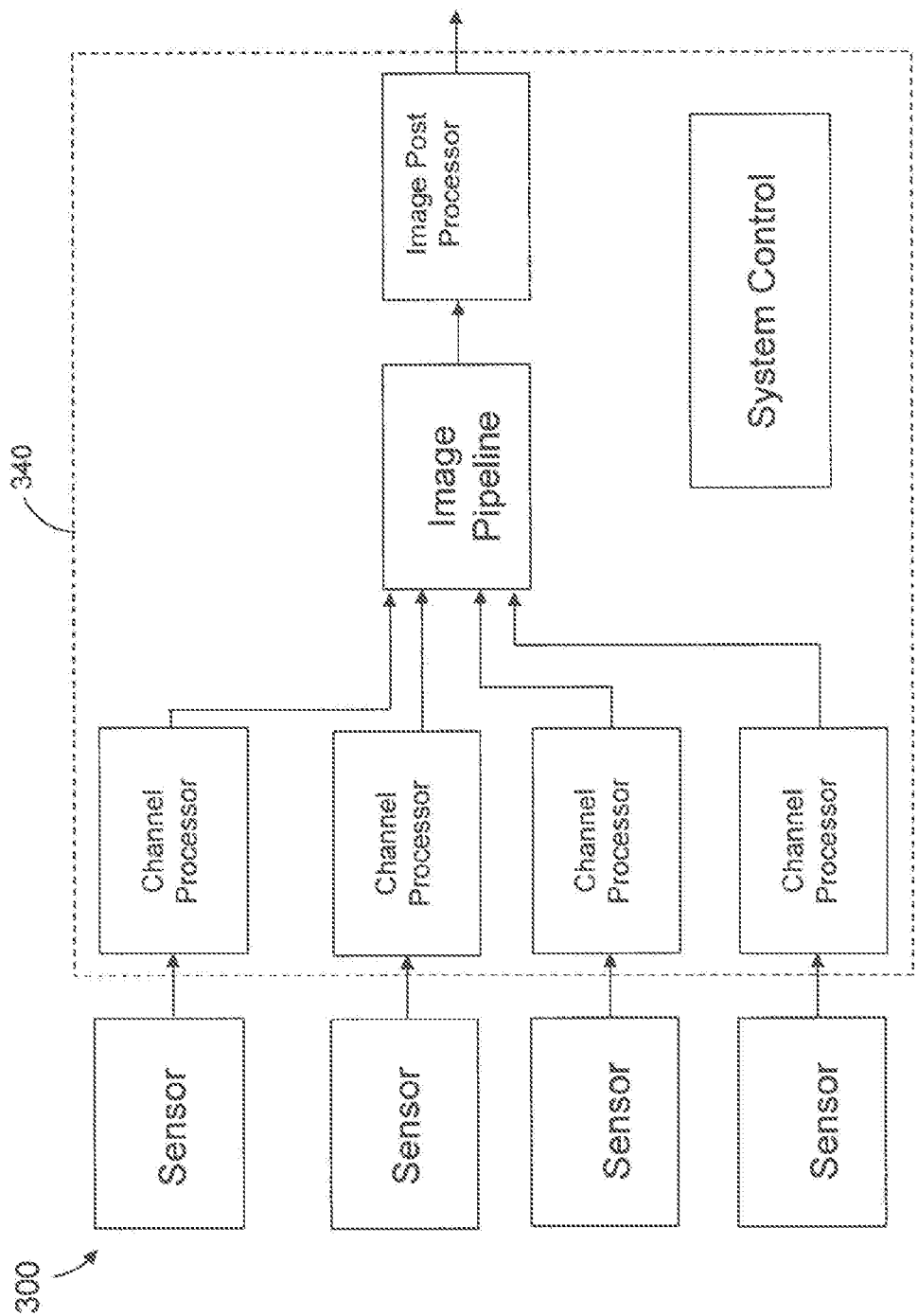

COMBINE channel id1, channel id2, channel id3, channel id4 ...

Figure 110F

HLL Interface Instruction Set 1

Camera Set-up:

1. Reset                Manual/Auto
2. White Balance        ON/OFF
3. Auto Gamma           Manual/Auto
4. Auto Exposure        ON/OFF
5. Flash Mode           ON/OFF
6. View Finder

Figure 110G

HLL Interface Instruction Set 2:

Camera Operation:
- Single Frame Capture
- Best Shot Capture
- HD Video Capture
- DV Capture
- Std Video Capture
- Zoom in
- Zoom out
- Flash Toggle
- Stabilization Toggle
- Self Timer Set
- Brightness up
- Brightness down

Figure 110H

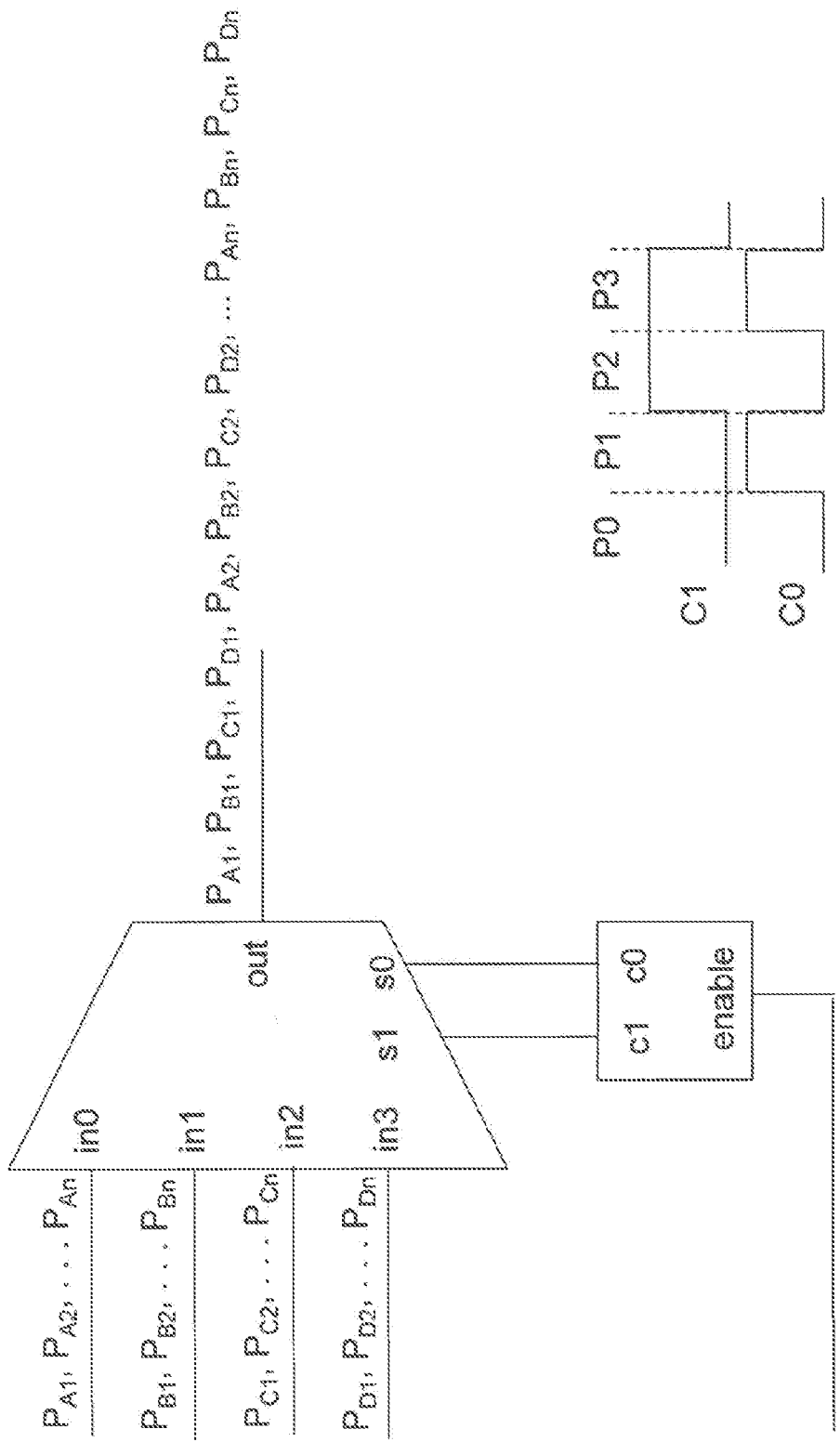

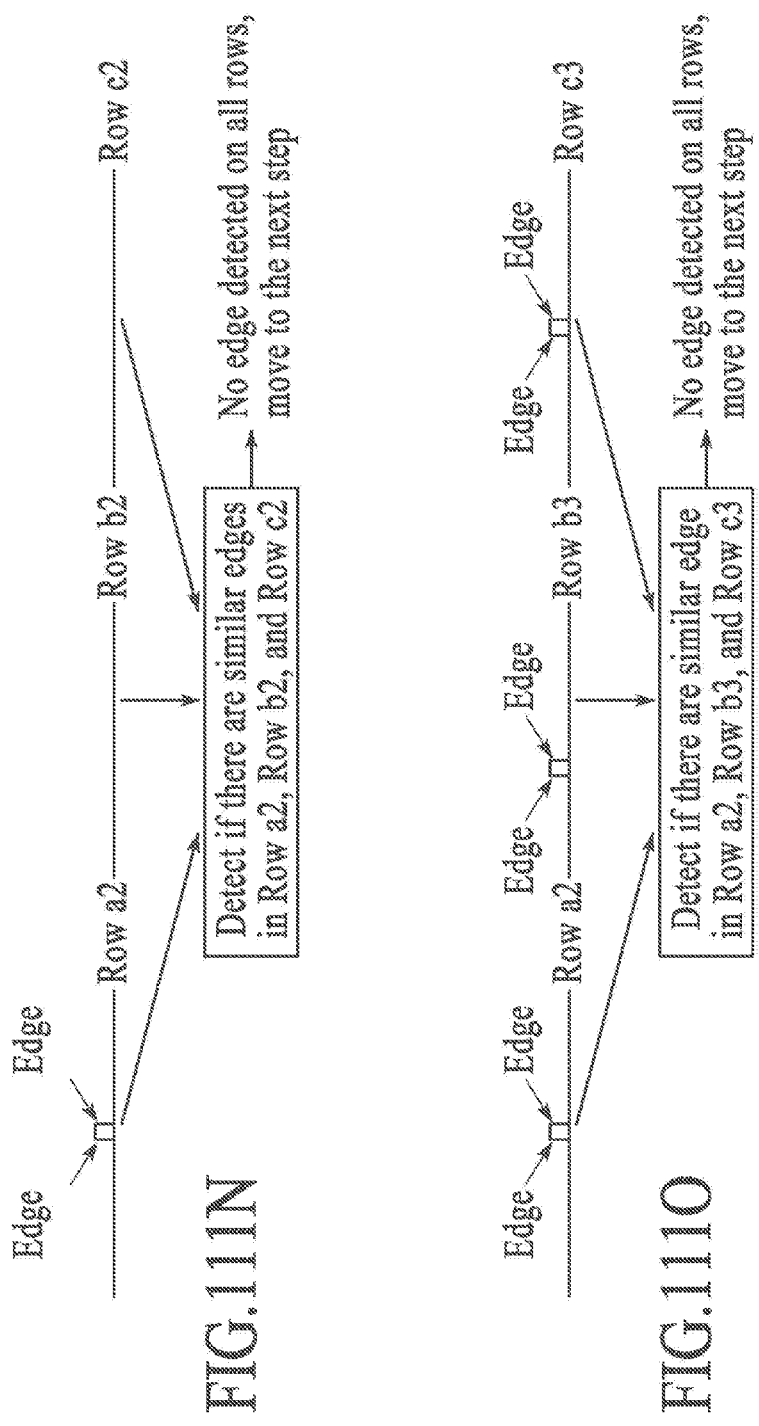

FIG.111P
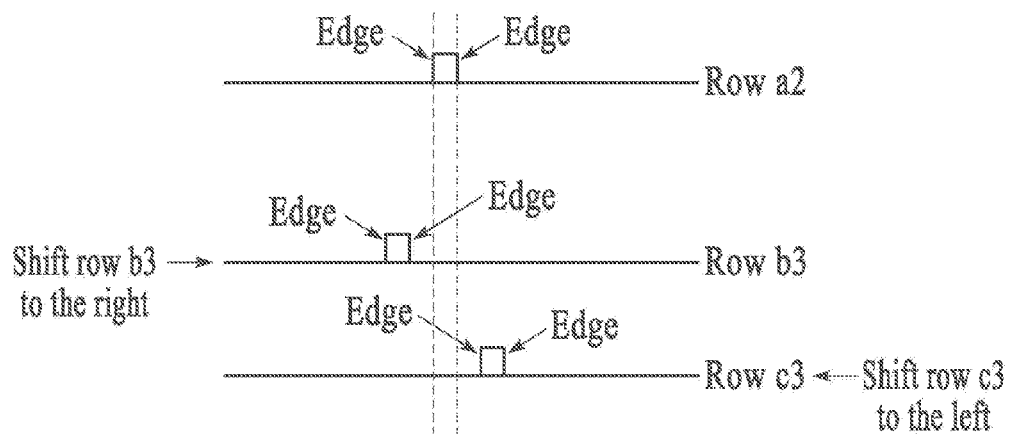
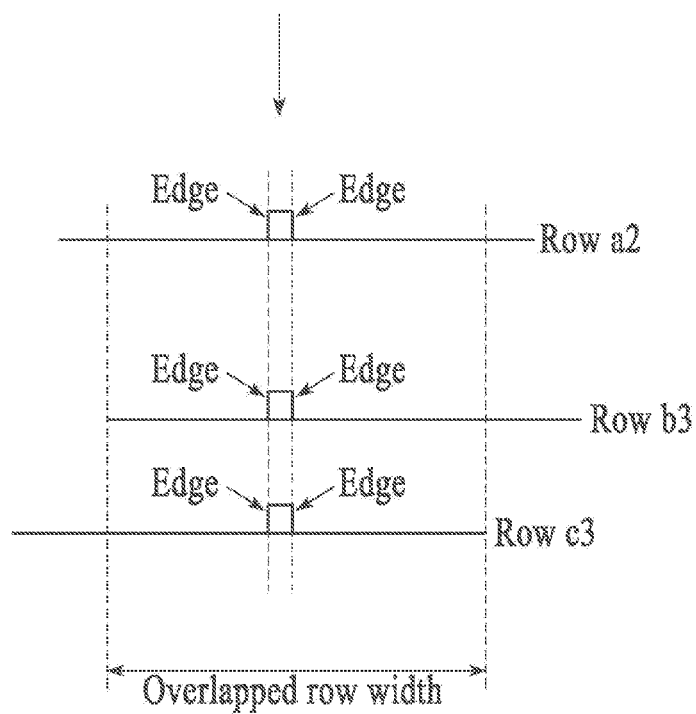
FIG.111Q

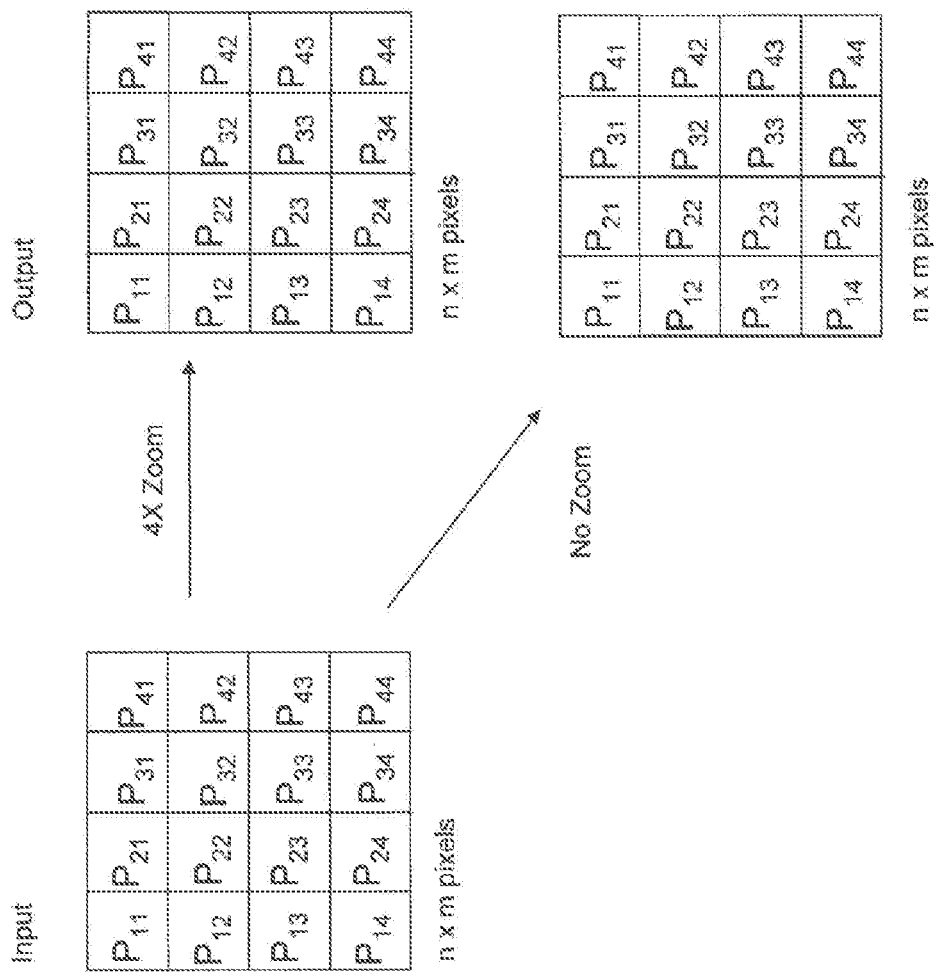

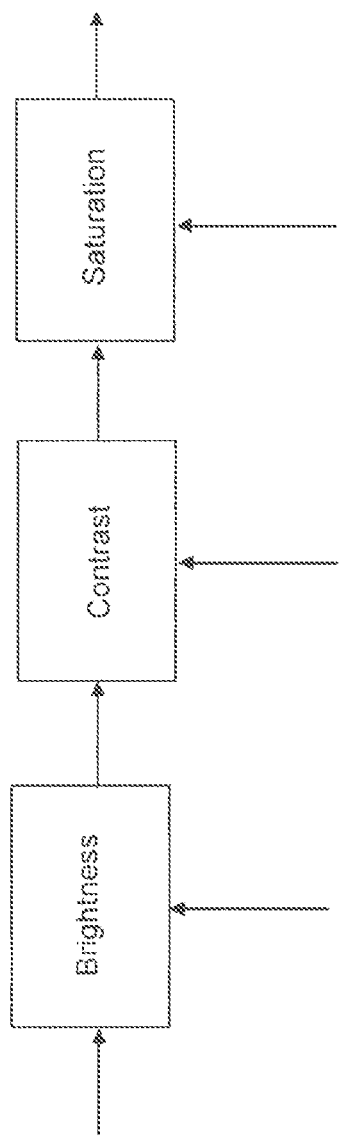

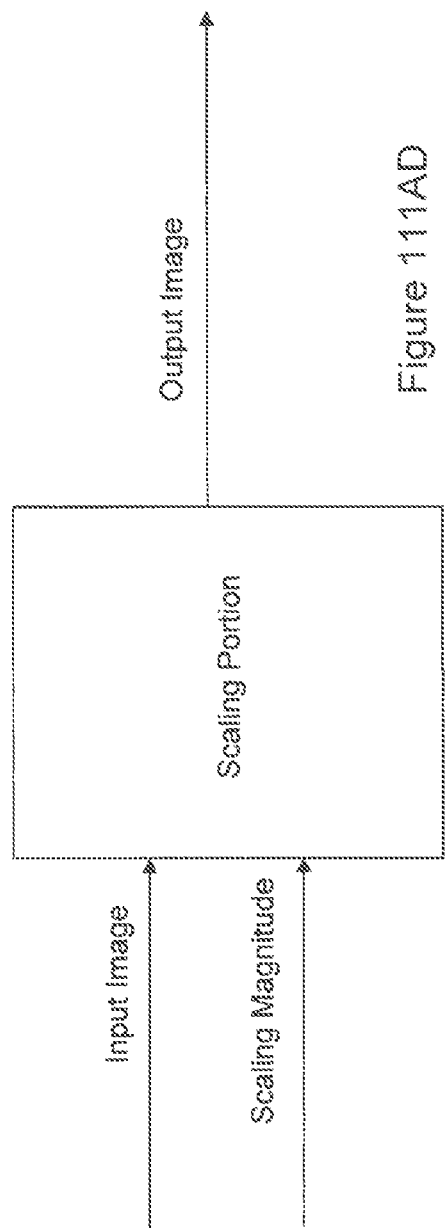

|   | 1 | 2 | 3 | 4 | 5 |
|---|---|---|---|---|---|
| 1 | A | B | C | D | E |
| 2 | F | G | H | I | J |
| 3 | K | L | M | N | O |
| 4 | P | Q | R | S | T |
| 5 | U | V | W | X | Y |

|   | 1 | 2 | 3 |
|---|---|---|---|
| 1 | $P_{11}$ | $P_{12}$ | $P_{13}$ |
| 2 | $P_{21}$ | $P_{22}$ | $P_{23}$ |
| 3 | $P_{31}$ | $P_{32}$ | $P_{33}$ |

Figure 111AE

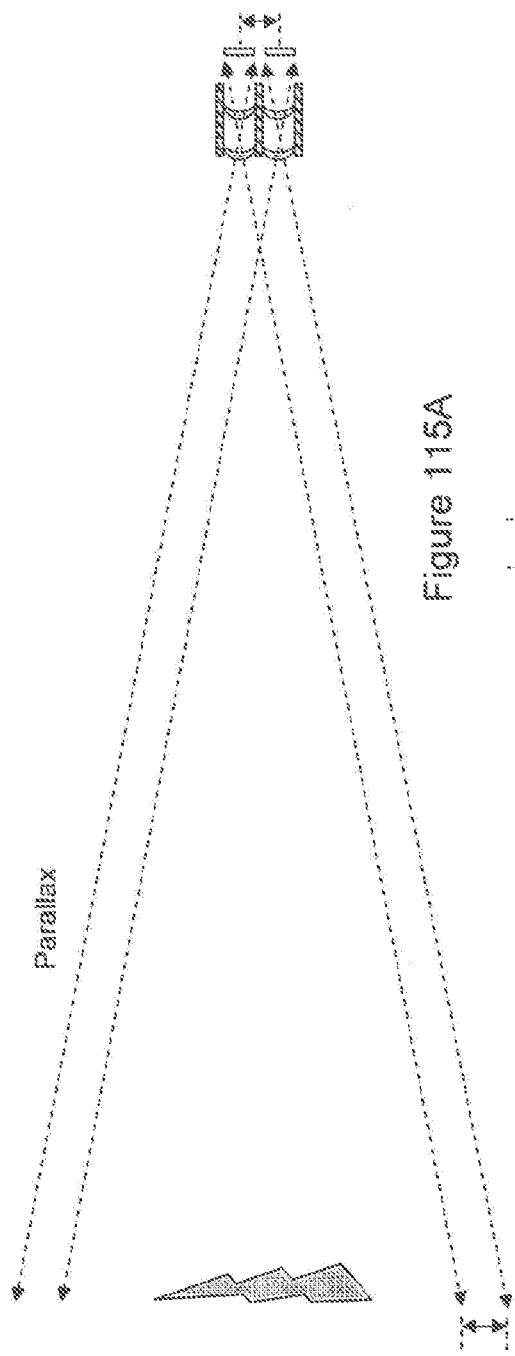
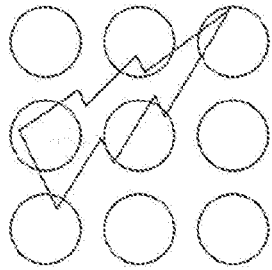
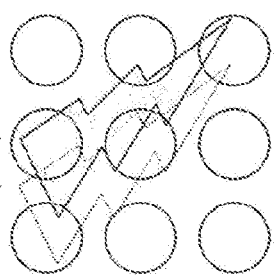
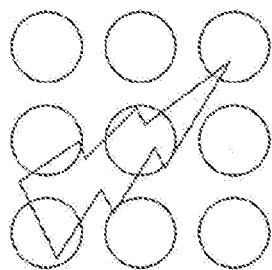

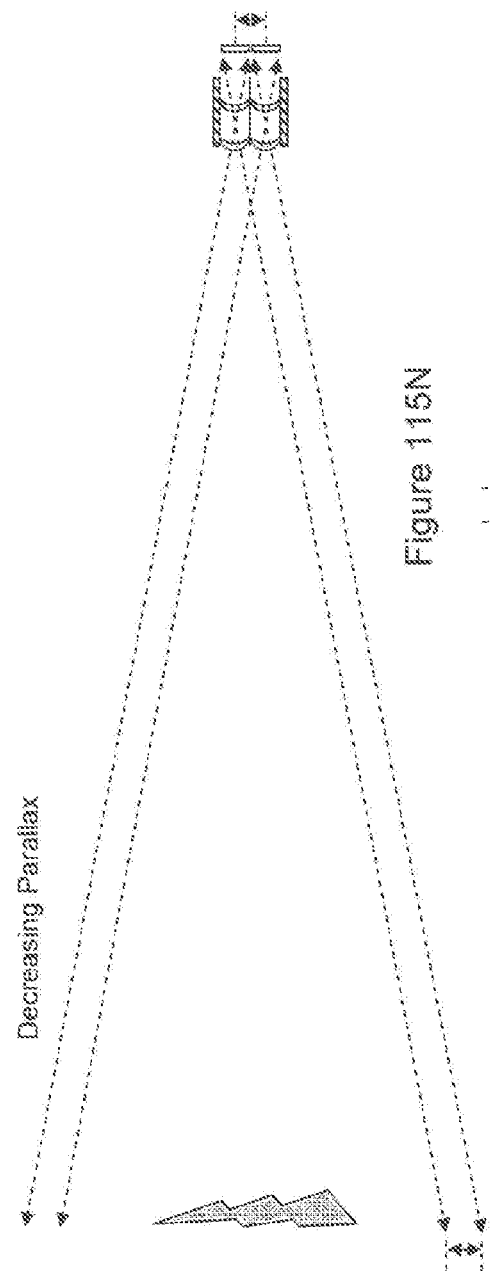
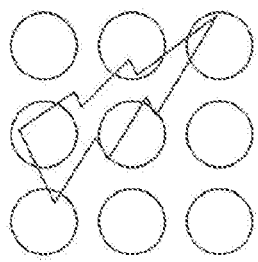
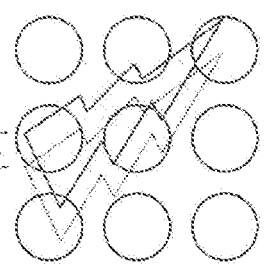
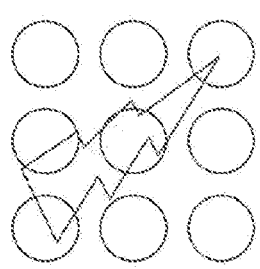
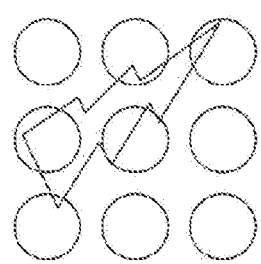

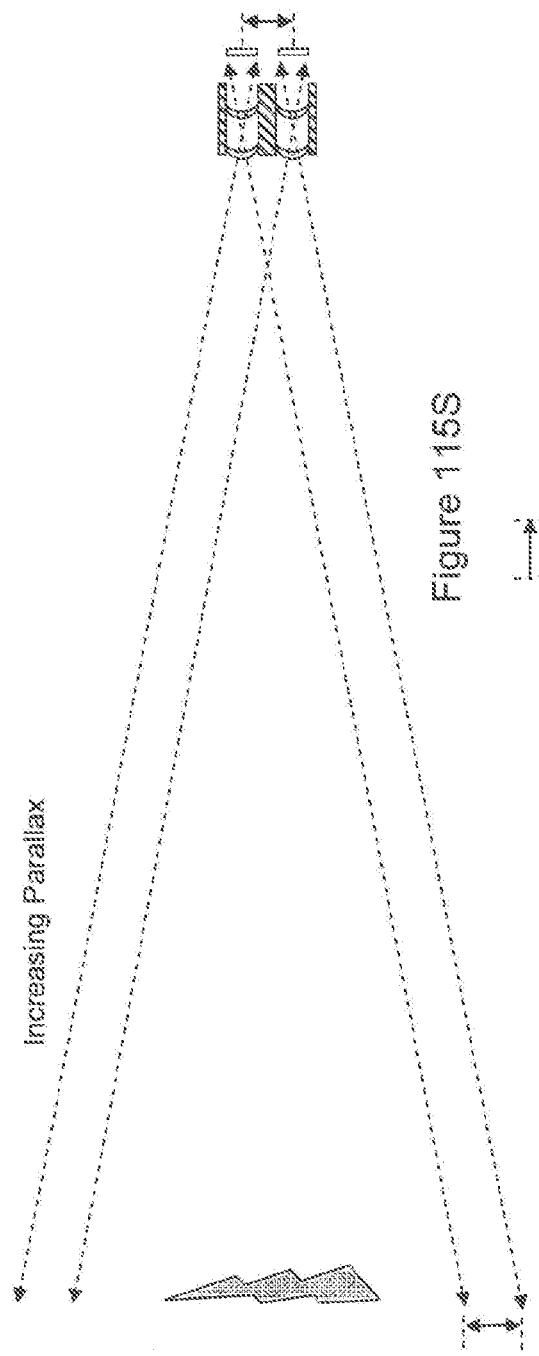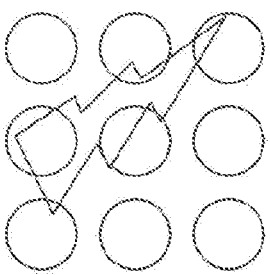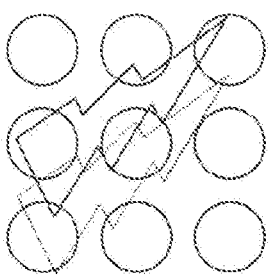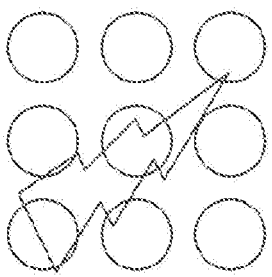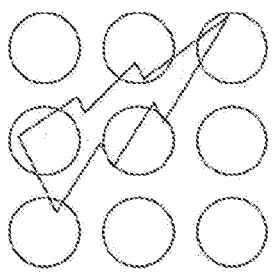

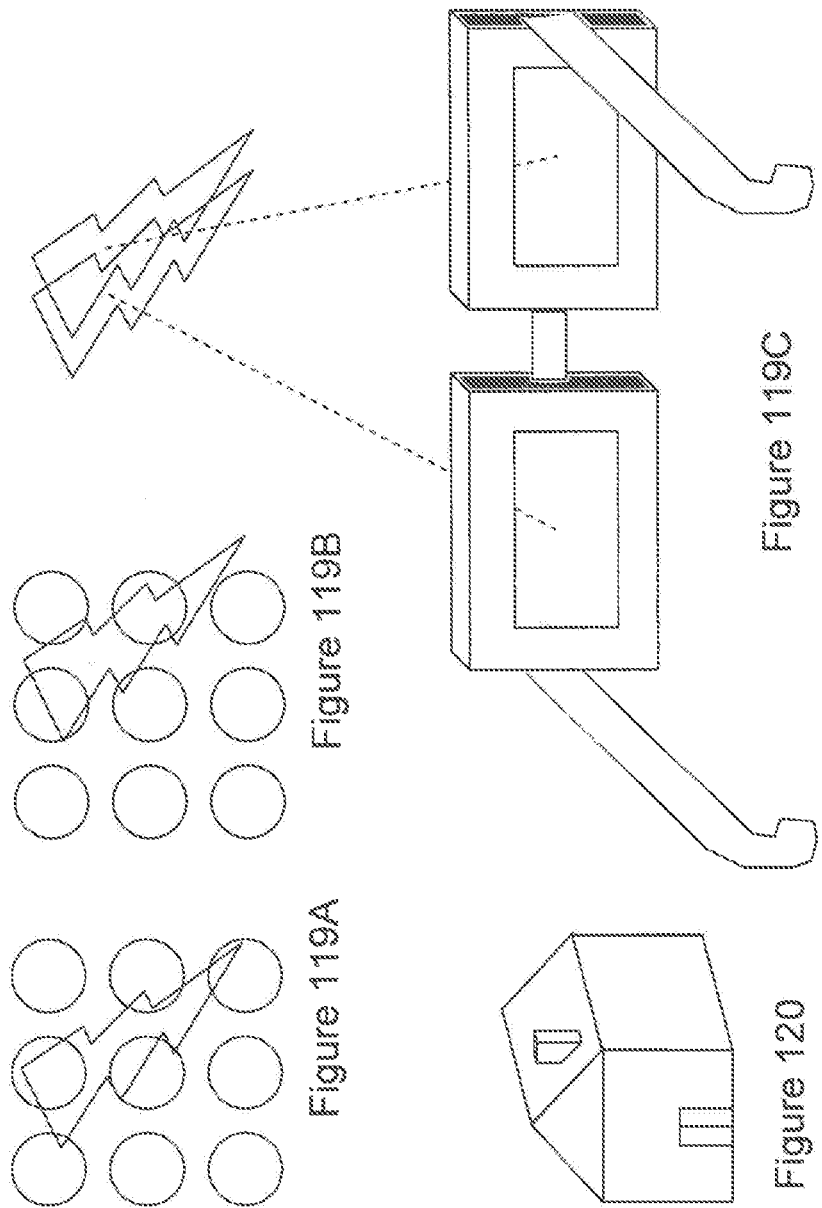

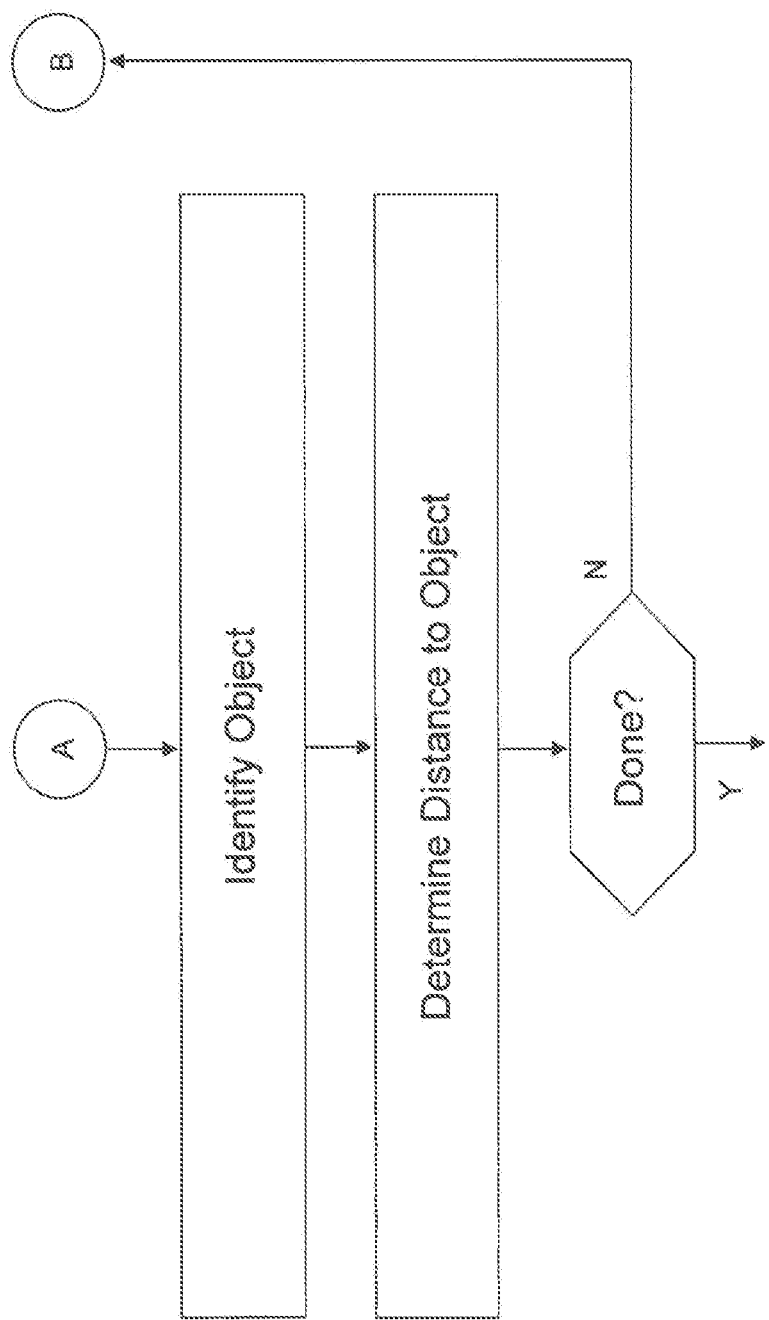

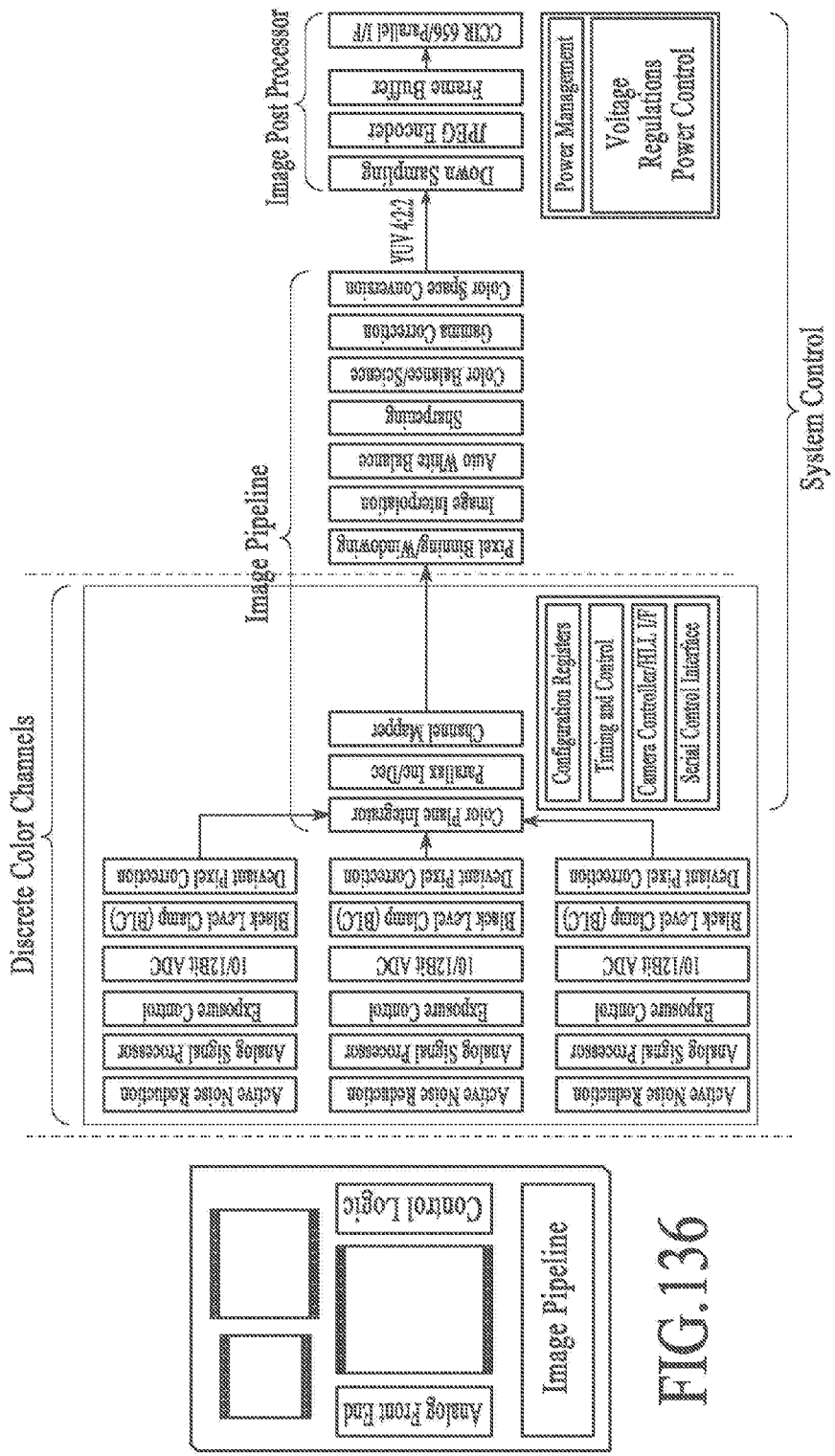

DIGITAL CAMERA WITH MULTIPLE PIPELINE SIGNAL PROCESSORS

CROSS-REFERENCE TO RELATED PATENT APPLICATIONS

This application is a continuation of U.S. application Ser. No. 13/786,803, filed Mar. 6, 2013, which is a continuation of Ser. No. 13/006,351, filed Jan. 13, 2011, (now U.S. Pat. No. 8,415,605), which is a continuation of U.S. application Ser. No. 11/888,582, filed Aug. 1, 2007 (now U.S. Pat. No. 7,884,309), which is a divisional of U.S. patent application Ser. No. 11/212,803, filed Aug. 25, 2005. U.S. patent application Ser. No. 11/212,803 claims priority to U.S. Provisional Patent Application No. 60/604,854 filed Aug. 25, 2004 and to U.S. Provisional Patent Application No. 60/695,946 filed Jul. 1, 2005.

BACKGROUND

The recent technology transition from film to "electronic media" has spurred the rapid growth of the imaging industry with applications including still and video cameras, cell phones, other personal communications devices, surveillance equipment, automotive applications, computer based video communication and conferencing, manufacturing and inspection devices, medical appliances, toys, plus a wide range of other and continuously expanding applications. The lower cost and size of digital cameras (whether as stand-alone products or imbedded in other appliances) is a primary driver for this growth and market expansion.

Although traditional component manufacturers continue to shrink the components to take advantage of the electronic media, it is difficult to achieve the ever tightening demand of digital camera producers for smaller sizes, lower costs and higher performance. Several important issues remain, including: 1) the smaller the size of a digital camera (e.g., in cell phones), the poorer the image quality; 2) complex "lenses", shutter and flash are still required for medium to higher quality imaging, thus negating much of the size advantage afforded by the electronic media; and 3) the cost advantage afforded by the electronic media is somewhat negated by the traditional complex and costly lens systems and other peripheral components.

Most applications are continuously looking for all or some combination of higher performance (image quality), features, smaller size and/or lower cost. These market needs can often be in conflict: higher performance often requires larger size, improved features can require higher cost as well as a larger size, and conversely, reduced cost and/or size can come at a penalty in performance and/or features. As an example, consumers look for higher quality images from their cell phones, but are unwilling to accept the size or cost associated with putting stand-alone digital camera quality into their pocket sized phones.

One driver to this challenge is the lens system for digital cameras. As the number of photo-detectors (pixels) increases, which increases image resolution, the lenses must become larger to span the increased size of the image sensor which carries the photo detectors. The pixel size can be reduced to maintain a constant image sensor and optics size as the number of pixels increases but pixel performance is reduced (reduced photo-signal and increased crosstalk between pixels). Also, the desirable "zoom lens" feature adds additional moveable optical components, size and cost to a lens system. Zoom, as performed by the lens system, known as "optical zoom", changes the focal length of the optics and is a highly desired feature. These attributes (for example, increased number of pixels in the image sensor and optical zoom), although benefiting image quality and features, may adversely impact the camera size and cost. In some cases, such as cell phones or other appliances where size and/or cost are critical, this approach to good image quality (high resolution and sensitivity) is not optimum.

Digital camera suppliers have one advantage over traditional film providers in the area of zoom capability. Through electronic processing, digital cameras can provide "electronic zoom" which provides the zoom capability by cropping the outer regions of an image and then electronically enlarging the center region to the original size of the image. In a manner similar to traditional enlargements, a degree of resolution is lost when performing this process. Further, since digital cameras capture discrete input to form a picture rather than the ubiquitous process of film, the lost resolution is more pronounced. As such, although "electronic zoom" is a desired feature, it is not a direct substitute for "optical zoom."

Conventional digital cameras typically use a single aperture and lens system to image the scene onto one or more image sensors. Color separation (if desired), such as red, green and blue (RGB), is typically achieved by three methods: 1) a color filter array on a single integrated circuit image sensor, 2) multiple image sensors with a color separation means in the optical path (such as prisms), or 3) an imager with color separation and multiple signal collection capability within each pixel. These three color separation method have limitations as noted below.

The color filter array, such as the often used Bayer pattern, changes the incident color between adjacent pixels on the array and color crosstalk occurs that prevents accurate color rendition of the original image. Since the array is populated with pixels of different color capability, interpolation techniques are required to create a suitable color image. The color filter array may also have low and variable optical transmission that reduces received optical signal levels and creates pixel-to-pixel image non-uniformity.

The use of multiple imagers, with color separation methods such as a prism, provides accurate color rendition but the optical assembly is large and expensive.

Color separation methods within the pixel create crosstalk of colors and inaccurate color rendition. Since multiple color charge collection and readout means are required in each pixel, pixel size reduction is limited.

Technology advances in lenslet optical design and fabrication, integrated circuit imager pixel size reduction and digital post-processing have opened new possibilities for cameras and imaging systems which differ dramatically in form fit and function from time-honored digital camera designs. The use of multiple camera channels (multiple optics, image sensors and electronics) in a compact assembly allows fabrication of a digital camera with improved image quality, reduced physical thickness and increased imaging functionality not achievable with a conventional single aperture/optical system digital camera architecture.

SUMMARY

It should be understood that there are many inventions described and illustrated herein. Indeed, the present invention is neither limited to any single aspect nor embodiment thereof, nor to any combinations and/or permutations of such aspects and/or embodiments. Moreover, each of the aspects of the present invention, and/or embodiments thereof, may be employed alone or in combination with one or more of the other aspects of the present invention and/or embodiments thereof. For the sake of brevity, many of those permutations and combinations will not be discussed separately herein.

In one aspect of the present invention, an image sensor comprises separate first and second arrays of photo detectors and a signal processing circuitry that combines signals from the arrays to produce a composite image.

Preferred embodiments include three or more arrays of photo detectors, wherein the signal processing circuitry processes the signals from each array and then combines the signals from all of the arrays to produce a composite image. Such use of multiple arrays allows each of the arrays to be optimized in some respect, such as for receipt of particular colors. Thus, for example, the arrays can be optimized to detect light of different colors, or other wavelengths. The "colors" can be narrow bands, or broad bands such as red, green, or blue. The bands can even be overlapping.

Optimization can be accomplished in any desired manner, including for example having different average pixel depths, column logic, analog signal logic, black level logic, exposure control, image processing techniques, and lens design and coloration.

A sensor having two or more different arrays could advantageously have a different lens over each of the different arrays. Preferred lenses can employ a die coating, defused dye in the optical medium, a substantially uniform color filter or any other filtering technique through which light passes to the underlying array.

The processing circuitry can comprise any suitable mechanism and/or logic. Of particular interest are circuitries that produce multiple separate images from the different arrays, and then combines the multiple separate images to form a single image. During the process the signal processing circuitry can advantageously execute image enhancement functions, such as address saturation, sharpness, intensity, hue, artifact removal, and defective pixel correction.

As far as integration, it is desirable for the various arrays to be physically located on the same chip. In addition, it is desirable to couple a frame to the chip, and to couple at least one of the lenses to the frame. The lenses can be independently positionable during manufacture, and then sealed to the frame using a sealant or other bonding technique. The integration of these elements is called the "Digital Camera Subsystem" (DCS).

Preferred image sensors contain at least several hundred thousand of the photo detectors, and have a total thickness of no more than 10, 15, or 20 mm, including the lens and frame. Such small DCS devices may be incorporated into a semiconductor "package" or directly attached to a circuit board ("packageless"), using wave soldering, die on board, or other techniques. The DCS and/or board can then be incorporated into cameras or other devices having user interface elements, memory that stores images derived from the arrays, and at least one power supply that provides power to the system. The DCS, cameras and other devices of the invention can be used for any suitable purpose, including especially still and video imaging, calculating a distance, and creating a 3D effect.

In another aspect of the present invention a compact solid-state camera (compact digital camera) comprises a first and second camera channel, located in close proximity to each other, where each camera channel contains its own optics, image sensor and signal processing circuitry. The two camera channels (being identical or different) can combine their output signals to form a composite image or each camera channel can provide a separate image. The electronics to combine images from any combination of camera channels or to display/store/transmit channels individually or combined is included in the compact solid-state camera assembly (CSSC).

Other embodiments include three or more camera channels (identical or different), wherein the signal processing circuitry processes the signals from each channel and then combines the signals from some or all the channels to produce a composite image or each camera channel can provide a separate image by itself in conjunction with a composite image. The use of multiple camera channels allows each of the channels to be optimized in some respect, if desired, such as imaging of particular incident light colors. Thus, for example, the arrays can be optimized to detect light of different colors, or other wavelengths. The "colors" of each camera channel can be narrow bands, or broad bands such as red, green, or blue. The bands can even be overlapping. Each camera channel can image one or more colors.

Optimization of each camera channel can be accomplished in any desired manner, including optics, image sensor and signal processing electronics to obtain a desired image capability, for example the optics can optimized for a certain image sensor size, wavelength (color), focal length and f-number. The image sensor can be optimized by number of pixels, pixel size, pixel design (photo-detector and circuitry), frame rate, integration time, and peripheral circuitry external to the pixel circuitry. The signal processing electronics can be optimized for color correction, image compression, bad pixel replacement and other imaging functions. The camera channels can be identical or unique; however all located in close proximity.

Color filters (or other color separation techniques), if desired, can be incorporated into the optical materials or optics surfaces, as separate filter layers, on the image sensor surface or built into the pixel semiconductor by design. Each camera channel can have its own color imaging characteristics. The image sensor can have a single color capability or multiple color capability; this multiple color capability can be within a single pixel, or between adjacent pixels (or combinations of single and adjacent pixels)

The processing circuitry can comprise any suitable mechanism and/or logic to optimize the image quality. Of particular interest are circuitries that produce separate images from the camera channels, and then combines the multiple separate images to form a composite single image. During the process, the signal processing circuitry can advantageously execute image enhancement functions, such as dynamic range management (auto gain/level), image sharpening, intensity correction, hue, artifact removal, defective pixel correction and other imaging optimization functions. The processing circuitry can operate in an analog or digital mode.

As far as mechanical integration, it is desirable for the various image sensors of the camera channels be physically located on the same integrated circuit (chip) to reduce manufacturing costs and reduce electrical interconnects and size. In addition, it is desirable to assemble a mechanical frame to the chip, and to couple one or more of the lenses to the frame. The lenses can be independently positionable during manufacture, and then sealed to the frame using a sealant or other bonding technique. The integration of these elements is called the "Digital Camera Subsystem" (DCS). The vertical integration of other layers to the DCS (such as camera system electronics and even display capability), can form a compact solid-state camera (CSSC)

Preferred camera channels contain at least several hundred thousand of the photo detectors (pixels). The thickness of the camera channels (including image sensors and optics) can be thinner than conventional camera systems (for equivalent image resolution) where only one optical assembly is utilized. Such small DCS devices may be incorporated into a semiconductor "package" or directly attached to a circuit board ("packageless"), using wave soldering, die on board, or other techniques. The DCS and/or board can then be incorporated into cameras or other devices having user interface elements, memory that stores images derived from the arrays, and at least one power supply that provides power to the system. The DCS, cameras and other devices of the invention can be used for any suitable purpose, including especially still and video imaging.

Notably, in certain aspects, a digital camera subassembly includes two or more complete camera channels in a single layered assembly that contains all desired components (optics, mechanical structures and electronics) in one heterogeneous assembly or package.

In another embodiment, the digital camera subassembly has the form of a multi-layer laminate.

In another embodiment, two or more of the camera channels includes channel specific optics, optical alignment structures (mechanical frame), packaging, color filters and other optical elements, image sensors, mixed signal interface, image and/or color processing logic, memory, control and timing logic, power management logic and parallel and/or serial device interface.

In another embodiment, each camera channel also includes one or more of the following: single or multi-channel image compression logic and/or image output formatting logic, wired or wireless communications, and optical display capability.

In another embodiment, the output of each channel can provide either discrete processed images or integrated images comprising a color or partial color images.

In another embodiment, the camera channels are co-located, in close proximity defined by number of, type of, and position of, and optical diameter constraints of the lens system, on a two-dimensional focal plane that comprises one component layer of the CSSC.

In another embodiment, each camera channel further contains an image sensor to provide a photon sensing capability that makes up part of the overall compact solid-state camera using semiconductor-based detection mechanisms (no film). The single assembly may be formed by two or more component layers that are assembled sequentially in the vertical dimension (orthogonal to the focal plane).

In another embodiment, the assembly, comprising the vertically integrated component layers, with multiple camera channel capability, provides camera system capability and performance not achievable with conventional camera systems using a single camera channel.

In another embodiment, some or the entire vertically integrated component layers are be formed by methods of wafer scale integration or laminated assembly to create portions of many camera systems simultaneously.

In another embodiment, the wafers or layers may contain optical, mechanical and electrical components, electrical interconnects and other devices (such as a display).

In another embodiment, the electrical interconnect between component layers may be formed by lithography and metallization, bump bonding or other methods. Organic or inorganic bonding methods can be used to join the component layers. The layered assembly process starts with a "host" wafer with electronics used for the entire camera and/or each camera channel. Then another wafer or individual chips are aligned and bonded to the host wafer. The transferred wafers or chips can have bumps to make electrical interconnect or connects can be made after bonding and thinning. The support substrate from the second wafer or individual chips is removed, leaving only a few microns material thickness attached to the host wafer containing the transferred electronics. Electrical interconnects are then made (if needed) between the host and the bonded wafer or die using standard integrated circuit processes. The process can be repeated multiple times. The layers transferred in this fashion can contain electrical, mechanical or optical features/components. This process allows multiple layers to form a heterogeneous assembly with electrical, mechanical and optical capabilities required in a compact solid-state camera.

In another embodiment, the camera channels are comprised of linear or area array imagers, of any size, format, pixel number, pixel design or pixel pitch.

In another embodiment, the camera channels provide full color, single color, multi-color or mono chromatic (black and white) capability in any wavelength range from ultraviolet (UV) to infrared (IR). Color filters, if desired, may be on an image sensor or within the optical component layer or a combination of both. The camera channels may also provide color capability by utilizing the semiconductor absorption properties in a pixel. For example, a pixel may provide one or more color capability via the optical absorption depth properties. The pixel color separation properties may also be combined with color filters in the optical path.

In another embodiment, a high spatial image resolution may be achieved by using multiple camera channels to observe the same field of view from a slightly different perspective.

In another embodiment, two or more camera channels observe the same field of view, although from a different perspective as a result of a spatial offset between such camera channels. In some of such embodiments, images from such two or more camera channels may be combined to result in an image that provides high spatial resolution. It may be advantageous to employ a parallax correction algorithm in order to reduce and/or eliminate the effects of the parallax. Alternatively, images from the two or more camera channels (with the same field of view but different perspectives) may be combined to provide three dimensional feature imaging. In this regard, it may be advantageous to increase and/or enhance the effects of the parallax, for example, by applying a parallax correction algorithm "inversely". Three dimensional feature imaging may be used, for example, in finger print and/or retinal feature imaging and/or analysis. Any parallax correction algorithm whether now known or later developed may be employed in conjunction with any of the embodiments herein. Any of the previous embodiments can be employed in association with an increase in parallax and/or a decrease in parallax.

In another embodiment, optical features may be added to the optical stack of one or more camera channels to provide additional imaging capability such as single, dual or tunable color filters, wave front modification for increased depth of focus and auto focus, and glare reduction polarization filters. Notably, any optical feature whether now known or later developed may be incorporated in one or more of the camera channels to provide additional imaging capability.

In another embodiment, the optical portion may include one or more filters, e.g., color filters, to provide one or more wavelengths or one or more bands of wavelengths to one or more associated sensor arrays. Such filters may be for example, single or dual, fixed or tunable filters. In one embodiment, the user, operator and/or manufacturer may employ a tunable filter to control or determine the one or more wavelengths or the one or more bands of wavelengths.

In another embodiment, one or more filters are employed in association with one, some or all of the camera channels. Such filters may or may not be the same as one another. For example, the filters may or may not provide the same wavelength or bands of wavelengths. In addition, some of the filters may be fixed and others may be tunable.

In another embodiment, the optical portion includes a wave front modification element, for example, to increase the depth of focus and/or for use in implementing auto focus. In addition, in another embodiment, the optical portion may include one or more glare reduction polarization filters, to polarize the light and thereby reduce "glare". Such filters may be employed alone or in combination with any of the embodiments disclosed herein.

Any of the embodiments of the present invention may include one or more illumination units to improve and/or enhance image acquisition by the one or more camera channels (and, in particular, the one or more sensor arrays), facilitate range detection to an object, shape detection of an object, and covert imaging (i.e., imaging that is not observable to the human eye).

The illumination units may provide passive (for example, no illumination), active (for example, constant illumination), constant and/or gated active illumination (for example, pulsed illumination that is predetermined, preset or processor controlled, and/or pulsed illumination that is user/operator programmable). The one or more illumination units may be disposed on or integrated in the support frame and/or the substrate of the sensor arrays. Indeed, the one or more illumination units may be disposed on or integrated in any element or component of the one or more of the camera channels.

In some embodiments, the illumination units are dedicated to one or more camera channels. In this regard, the illumination unit is "enabled" cooperatively with the operation of one or more dedicated channels. In another embodiment, the illumination units are shared by all of the camera channels. As such, in this embodiment, the illumination unit is enabled cooperatively with the operation of the camera channels. Indeed, in certain embodiments, one or more illumination units may be dedicated to one or more camera channels and one or more illumination units may be shared by one or more camera channels (including those channels that are associated with one or more dedicated illumination units). In this embodiment, the dedicated illumination units are "enabled" cooperatively with the operation of one or more dedicated channels and the shared illumination units are enabled cooperatively with the operation of all of the camera channels.

As noted above, one or more of the camera channels may be optimized, modified and/or configured according to a predetermined, an adaptively determined, an anticipated and/or a desired spectral response of the one or more camera channels. For example, the dimensions, characteristics, operation, response and/or parameters of a sensor array (and/or pixels thereof) as well as image processing circuitry may be configured, designed and/or tailored in accordance with predetermined, adaptively determined, anticipated and/or desired spectral response of the one or more camera channels. In this way, one or more aspects of the digital camera of the present inventions may be configured, designed and/or tailored to provide a desired, suitable, predetermined and/or particular response in the environment in which the camera is to be employed.

In some embodiments, each camera channel may be uniquely configured, designed and/or tailored. For example, one or more camera channels may be configured to include a field of view that is different than one or more camera channels. As such, one or more camera channels have a first field of view and one or more other camera channels have a second field of view. In this way, a digital camera may simultaneously capture an image using different fields of view.

The field of view may be fixed or programmable (for example, in situ). The field of view may be adjusted using a number of techniques or configurations including adjustment or modification of the optics focal length and/or adjustment or modification of the effective size of the array. Indeed, any technique or configuration to adjust the field of view, whether now known or later developed, is intended to come within the scope of the present inventions.

Further, the digital camera of the present inventions may include programmable (in situ or otherwise) or fixed integration times for one or more (or all) of the camera channels. In this regard, integration time of one or more camera channels may be configured, designed and/or tailored to facilitate capture of, for example, a large scene dynamic range. As such, in this embodiment, single color band camera channels may be used to create a combined color image capability (including, for example, UV and IR if desired), configuring and/or designing the integration time of each camera channel to provide desired signal collection it its wavelength acquisition band.

Moreover, two or more integration times can be implemented to simultaneously acquire low to high light levels in the image. The combined dynamic range of the multiple camera channels provides greater dynamic range than from a single camera channel (having a one integration time for all channels). As such, the image sensor(s) or array(s) of each camera channel may be configured and/or designed to operate using a specific (predetermined, preset or programmable) integration time range and illumination level.

Notably, the dimensions, characteristics, operation, response and/or parameters of the camera channels (for example, field of view, integration time, sensor array (and/or pixels thereof), and/or image processing circuitry) may be configured, designed and/or tailored (in situ or otherwise) in accordance with predetermined, an adaptively determined, anticipated and/or desired response of the one or more camera channels. For example, the camera channels may be configured, designed and/or tailored to include different fields of view each having the same or different frame rates and/or integration times. As such, in one embodiment, the digital camera of the present inventions may include a first large/wide field of view camera channel capability to acquire objects and a second narrower field of view camera channel to identify objects. Moreover, the resolution of the first large/wide field of view camera channel and second narrower field of view camera channel may also be different in order to, for example, provide an enhanced image or acquisition.

In addition, the sensor array and/or pixel size (pitch) may be configured, designed and/or tailored in accordance with a predetermined, an anticipated and/or a desired response of the one or more camera channels. For example, the pixel size may be configured in order to optimize, enhance and/or obtain a particular response. In one embodiment, the pixel size of associated sensor arrays may be selected in order to provide, enhance and/or optimize a particular response of the digital camera. In this regard, where the sensor array includes a plurality of camera channels (for example, UV, B, R, G and IR), implementing different pixel sizes in one or more of the sensor arrays (for example, an increasing pixel pitch from UV (smallest) to IR (largest)) may provide, enhance and/or optimize a particular response of the digital camera.

The size of the pixels may be based on a number of considerations including providing a predetermined, adaptively determined, anticipated or a desired resolution and/or obtaining a predetermined, enhanced and/or suitable acquisition characteristics for certain wavelength or bands of wavelengths) for example, reducing the size of the pixel (reducing the size of the pitch) may enhance the acquisition of shorter wavelengths of light. This may be advantageous when matching the corresponding reduction in optical blur size. The pixel design and process sequence (a subset of the total wafer process) may be selected and/or determined to optimize and/ or enhance photo-response of a particular camera channel color. Moreover, the number of pixels on the sensor array may be adjusted, selected and/or determined to provide the same field of view notwithstanding different sizes of the pixel in the plurality of arrays.

Further, the image processing circuitry (for example, the image processing and color processing logic) may be configured, designed and/or tailored to provide a predetermined, an adaptively determined, an anticipated and/or a desired response of the one or more camera channels. For example, the image processing and color processing logic may be configured to optimize, accelerate and/or reduce the complexity by "matching" the optics, sensor, and image processing when discretely applied to each channel separately. Any final sequencing of a full or partial color image may, in turn, be simplified and quality greatly improved via the elimination of Bayer pattern interpolation.

It should be noted that any of the digital camera channels (for example RGB capable or other color filter combinations) may be combined with one or more full color, dual color, single color or B/W camera channels. The combination of camera channels may be used to provide increased wavelength range capability, different simultaneous fields of view, different simultaneous integrations times, active and passive imaging capability, higher resolution using multiple camera channels and parallax correction, 3D imaging (feature extraction) using multiple camera channels and increased parallax, and increased color band capability.

In some embodiments, different color camera channels share components, for example, data processing components. In this regard, in one embodiment, one camera channel may employ a sensor array that acquires data which is representative of a first color image (for example, blue) as well as a second color image (green). Other camera channels may employ sensor arrays that are dedicated to a particular/predetermined wavelength or band of wavelengths (for example, red or green) or such camera channels may employ sensor arrays that acquires data which is representative of two or more predetermined wavelengths or bands of wavelengths (for example, (i) red and green or (ii) cyan and green). The camera channels, in combination, may provide full color capabilities.

For example, in one embodiment, a first sensor array may acquire data which is representative of first and second predetermined wavelengths or band of wavelengths (for example, wavelengths that are associated with red and blue) and a second sensor array may acquire data which is representative of third predetermined wavelength or band of wavelengths (for example, wavelengths that are associated with green). In this embodiment, the camera channels, in combination, may provide a full color image using only two sensor array.

Notably, in the exemplary embodiment discussed above, it may be advantageous to employ a third sensor array to acquire IR. In this way, a "true" YCrCb output camera may be provided while minimizing and/or eliminating the cost complexity and/or power considerations necessary to perform the transformation in the digital image domain.

Where a sensor array acquires two or more predetermined wavelengths or bands of wavelengths, the pixels of the sensor array may be designed to collect photons at two or more depths or areas within the pixels of the semiconductor arrays which are associated with the two or more predetermined wavelengths or bands of wavelengths. In this regard, the color "selection" for such a sensor array may be based on color band separation and/or pixel design to color separate by optical absorption depth.

Moreover, the two color capability in one or more camera channel may be accomplished or provided using color filter arrays that are disposed before the sensor array (for example, in the optical assembly). Notably, additional color band separation can be provided in the optical assembly layer if desired.

It may be advantageous to employ programmable (in situ or otherwise) or fixed integration techniques for one or more (or all) of the camera channels in conjunction with a sensor array that acquires two or more predetermined or adaptively determined wavelengths or bands of wavelengths. In this regard, integration time(s) of one or more camera channels may be configured, designed and/or tailored to facilitate capture of, for example, multiple predetermined wavelengths or bands of wavelengths in order to enhance, optimize and or provide an enhanced, designed, desired adaptively determined and/or predetermined acquisition technique. Notably, any of the embodiments discussed herein in relation to integration times of the camera channels may be incorporated with a sensor array that acquires two or more predetermined wavelengths or bands of wavelength. For the sake of brevity, those discussions will not be repeated here.

The present inventions may be implemented using three sensor arrays (each acquiring one or more predetermined wavelengths or band of wavelengths for example, wavelengths that are associated with red, blue and green). In this embodiment, the three sensor arrays may be arranged in a triangular configuration (for example, a symmetrical, non-symmetrical, isosceles, obtuse, acute and/or right triangle) to provide full color (RGB) capability. The triangular configuration will provide symmetry in parallax and thereby simplify the algorithm computation to address parallax. The triangular configuration will also provide enhanced and/or optimal layout of a three image sensor array system/device and associated assembly layers for a more compact assembly.

In the triangular configuration/layout embodiment, it may be advantageous to employ programmable (in situ or otherwise) or fixed integration techniques for one or more (or all) of the camera channels. In this regard, integration time of one or more camera channels may be configured, designed and/or tailored to facilitate capture of, for example, multiple predetermined wavelengths or bands of wavelengths in order to enhance, optimize and or provide an enhanced, desired, designed adaptive determined and/or predetermined acquisition techniques. Notably, any of the embodiments discussed above herein in relation to integration times of the camera channels may be incorporated with triangular configuration/layout. For the sake of brevity, those discussions will not be repeated here.

As mentioned above, the digital camera according to the present inventions may include two or more camera channels. In one embodiment, the digital camera includes a plurality of sensor arrays (for example, greater than five sensor arrays) each acquiring a narrow predetermined number of wavelengths or band of wavelengths (for example, wavelengths that are associated with four to ten color bands). In this way, the digital camera may provide multi-spectral (for example, 4-10 color bands) or hyper-spectral (for example, 10-100 color bands) simultaneous imaging capability.

In another embodiment, the digital camera may employ black and white (B/W) sensor arrays that acquire multiple broadband B/W images. The combination of B/W camera channels may be used to provide increased wavelength range capability, different simultaneous fields of view, different simultaneous integrations times, active and passive imaging capability, higher resolution using multiple camera channels and parallax correction, 3D imaging (feature extraction) using multiple camera channels and increased parallax. Indeed, the multiple B/W camera channels can be combined with other camera channels for full or partial color capability. Notably, gray scale sensor arrays may be employed in conjunction with or in lieu of the B/W sensor arrays described herein.

In another embodiment, the digital camera subsystem includes a display. The display may be disposed in a display layer and/or integrated in or on the sensor array substrate.

In yet another embodiment, the digital camera subsystem provides one or more interfaces for communicating with the digital camera subsystem.

In another embodiment, the digital camera subsystem includes the capability for wired, wireless and/or optical communication. In some embodiments, the digital camera subsystem includes one or more circuits, or portions thereof, for use in such communication. The circuits may be disposed in a layer dedicated for use in such communication and/or may be incorporated into one of the other layers (for example, integrated in or on the sensor array substrate).

In one aspect of the present invention, a "scene" is imaged onto multiple sensor arrays. The sensor arrays may be in close proximity and may be processed on a single integrated circuit or fabricated individually and assembled close together. Each sensor array is located in or beneath an optical assembly. The optical assembly, can be processed of the sensor subsystem wafer, applied to the image wafer by a separate wafer transfer, transferred individually by pick and place method, or attached at die level.

Where color filters are employed, the color filters can be built into the optical material, disposed as a layer or coating on the associated sensor array, applied as a lens coating or as a separate color filter in the optical assembly. Color separation mechanisms can also be provided on each imaging area by means of color filters or by an in-pixel color separation mechanism if desired. Other optical features can be added to the optical system of each sensor array to provide additional imaging capability.

In some embodiments, the design and electrical operation of each sensor array is optimized for sensing the incident wavelengths of light to that sensor array. The use of multiple optical assemblies with individually optimized sensor arrays results is a compact camera capable of high resolution, high sensitivity and excellent color rendition.

In one aspect, the present invention is a digital camera comprising a plurality of arrays of photo detectors, including a first array of photo detectors to sample an intensity of light of, for example, light of a first wavelength (which may be associated with a first color) and a second array of photo detectors to sample an intensity of light of, for example, light of a second wavelength (which may be associated with a second color). The digital camera may include signal processing circuitry, coupled to the first and second arrays of photo detectors, to generate a composite image using (i) data which is representative of the intensity of light sampled by the first array of photo detectors, and (ii) data which is representative of the intensity of light sampled by the second array of photo detectors. In this aspect of the present invention, the first array of photo detectors, the second array of photo detectors, and the signal processing circuitry are integrated on or in the same semiconductor substrate.

The digital camera may further include a third array of photo detectors to sample the intensity of light of a third wavelength (which may be associated with a third color). In this embodiment, the signal processing circuitry is coupled to the third array of photo detectors and generates a composite image using (i) data which is representative of the intensity of light sampled by the first array of photo detectors, (ii) data which is representative of the intensity of light sampled by the second array of photo detectors, and (ii) data which is representative of the intensity of light sampled by the third array of photo detectors. The first, second and third arrays of photo detectors may be relatively arranged in a triangular configuration (for example, an isosceles, obtuse, acute or a right triangular configuration).

In certain embodiments, the first array of photo detectors may sample the intensity of light of the first wavelength for a first integration time; the second array of photo detectors sample the intensity of light of the second wavelength for a second integration time. Where the digital camera includes a third array of photo detectors, the third array of photo detectors sample the intensity of light of the third wavelength for the first integration time, the second integration time, or a third integration time.

The digital camera may include a first array wherein each photo detector of the first array includes a semiconductor portion at which the intensity of light is sampled. Further, each photo detector of the second array includes a semiconductor portion at which the intensity of light is sampled. In certain embodiments, the semiconductor portion of each photo detector of the first array is located at a different depth, relative to a surface of each of the photo detectors, from than semiconductor portion of each photo detector of the second array.

The digital camera may further include a first lens disposed in and associated with an optical path of the first array of photo detectors as well as a second lens disposed in and associated with an optical path of the second array of photo detectors. A substantially uniform color filter sheet may be disposed in the optical path of the first array of detectors. Further, a first colored lens disposed in and associated with an optical path of the first array of detectors.

Notably, the digital camera may further including a first lens (passes light of a first wavelength and filters light of a second wavelength) disposed in and associated with an optical path of the first array of photo detectors, wherein the first array of photo detectors sample an intensity of light of a first wavelength and the second array of photo detectors sample an intensity of light of a second wavelength.

The digital camera may include a first array of photo detectors that samples an intensity of light of a first wavelength and an intensity of light of a second wavelength and a second array of photo detectors sample an intensity of light of a third wavelength, wherein the first wavelength is associated with a first color, the second wavelength is associated with a second color and the third wavelength is associated with a third color. Each photo detector of the first array may include a first semiconductor portion at which the intensity of light of the first wavelength is sampled and a second semiconductor portion at which the intensity of light of the second wavelength is sampled; and each photo detector of the second array may include a semiconductor portion at which the intensity of light of the third wavelength is sampled; and wherein the first and second semiconductor portions of each photo detector of the first array are located at a different depth, relative to each other and to a surface of each of the photo detectors from the semiconductor portion of each photo detector of the second array.

In this embodiment, the digital camera may further include a first lens disposed in and associated with an optical path of the first array of photo detectors and a second lens disposed in and associated with an optical path of the second array of photo detectors wherein the first lens passes light of the first and second wavelengths and filters light of the third wavelength. Indeed, the digital camera may include an optical filter disposed in and associated with an optical path of the first array of photo detectors wherein the optical filter passes light of the first and second wavelengths and filters light of the third wavelength. Moreover, the first array of detectors may sample the intensity of light of the first wavelength for a first integration time and the intensity of light of the second wavelength for a second integration time; and the second array of photo detectors may sample the intensity of light of the third wavelength for a third integration time.

The signal processing circuitry of the digital camera may generate a first image using data which is representative of the intensity of light sampled by the first array of photo detectors, and a second image using data which is representative of the intensity of light sampled by the second array of photo detectors. Thereafter, the signal processing circuitry may generate the composite image using the first image and the second image.

The digital camera may further include a memory to store (i) data which is representative of the intensity of light sampled by the first array of photo detectors, and (ii) data which is representative of the intensity of light sampled by the second array of photo detectors. The memory, the first array of photo detectors, the second array of photo detectors, and the signal processing circuitry may be integrated on or in the same semiconductor substrate.

Further, timing and control logic may be included to provide timing and control information to the signal processing circuitry, the first array of photo detectors and/or the second array of photo detectors. In addition, communication circuitry (wireless, wired and/or optical communication circuitry) to output data which is representative of the composite image. The communication circuitry, memory, the first array of photo detectors, the second array of photo detectors, and the signal processing circuitry may be integrated on or in the same semiconductor substrate.

In any of the embodiments above, the first array of photo detectors may include a first surface area and the second array of photo detectors includes a second surface area wherein the first surface area is different from the second surface area. Moreover, the photo detectors of the first array may include a first active surface area and the photo detectors of the second array may include a second active surface area wherein the first active surface area is different from the second active surface area.

In addition, in any of the embodiments, the first array of photo detectors may include a first surface area and the second array of photo detectors includes a second surface area wherein the first surface area is substantially the same as the second surface area. The photo detectors of the first array may include a first active surface area and the photo detectors of the second array may include a second active surface area wherein the first active surface area is different from the second active surface area.

A digital camera comprising a plurality of arrays of photo detectors, including a first array of photo detectors to sample an intensity of light of a first wavelength (which may be associated with a first color) and a second array of photo detectors to sample an intensity of light of a second wavelength (which may be is associated with a second color). The digital camera further may also include a first lens (which may pass light of the first wavelength onto an image plane of the photo detectors of the first array and may filter/attenuate light of the second wavelength) disposed in an optical path of the first array of photo detectors, wherein the first lens includes a predetermined optical response to the light of the first wavelength, and a second lens (which may pass light of the second wavelength onto an image plane of the photo detectors of the second array and may filter/attenuate light of the first wavelength) disposed in with an optical path of the second array of photo detectors wherein the second lens includes a predetermined optical response to the light of the second wavelength. In addition, the digital camera may include signal processing circuitry, coupled to the first and second arrays of photo detectors, to generate a composite image using (i) data which is representative of the intensity of light sampled by the first array of photo detectors, and (ii) data which is representative of the intensity of light sampled by the second array of photo detectors; wherein the first array of photo detectors, the second array of photo detectors, and the signal processing circuitry are integrated on or in the same semiconductor substrate.

The digital camera may further include a third array of photo detectors to sample the intensity of light of a third wavelength (which may be is associated with a third color) and a third lens disposed in with an optical path of the third array of photo detectors wherein the third lens includes a predetermined optical response to the light of the third wavelength. As such, the signal processing circuitry is coupled to the third array of photo detectors and generates a composite image using (i) data which is representative of the intensity of light sampled by the first array of photo detectors, (ii) data which is representative of the intensity of light sampled by the second array of photo detectors, and (ii) data which is representative of the intensity of light sampled by the third array of photo detectors. The first, second and third arrays of photo detectors may be relatively arranged in a triangular configuration (for example, an isosceles, obtuse, acute or a right triangular configuration).

In one embodiment, the first lens filters light of the second and third wavelengths, the second lens filters light of the first and third wavelengths, and the third lens filters light of the first and second wavelengths.

In one embodiment, the first array of photo detectors sample the intensity of light of the first wavelength for a first integration time and the second array of photo detectors sample the intensity of light of the second wavelength for a second integration time. Where the digital camera includes a third array, the third array of photo detectors may sample the intensity of light of the third wavelength for a third integration time.

The digital camera may further include a housing, wherein the first and second lenses, first and second arrays of photo detectors, and the signal processing circuitry are attached to the housing, and wherein the first and second lenses are independently positionable relative to the associated array of photo detectors.

In some embodiments, the first array of photo detectors sample an intensity of light of the first wavelength (which is associated with a first color) and an intensity of light of a third wavelength (which is associated with a third color) and the second array of photo detectors sample an intensity of light of a second wavelength (which is associated with a second color). Here, each photo detector of the first array may include a first semiconductor portion at which the intensity of light of the first wavelength is sampled and a second semiconductor portion at which the intensity of light of the third wavelength is sampled. Further, each photo detector of the second array may include a semiconductor portion at which the intensity of light of the second wavelength is sampled. In this embodiment, the first and second semiconductor portions of each photo detector of the first array are located at a different depth, relative to each other and to a surface of each of the photo detectors from the semiconductor portion of each photo detector of the second array.

Further, in one or more of these embodiments, the first lens may pass light of the first and third wavelengths and filters light of a second wavelength. In addition to, or in lieu thereof, an optical filter disposed in and associated with an optical path of the first array of photo detectors wherein the optical filter passes light of the first and third wavelengths and filters light of the second wavelength.

Moreover, the first array of photo detectors may sample the intensity of light of the first wavelength for a first integration time and the intensity of light of the third wavelength for a third integration time. The second array of photo detectors sample the intensity of light of the third wavelength for a second integration time.

The signal processing circuitry of the digital camera may generate a first image using data which is representative of the intensity of light sampled by the first array of photo detectors, and a second image using data which is representative of the intensity of light sampled by the second array of photo detectors. Thereafter, the signal processing circuitry may generate the composite image using the first image and the second image.

The digital camera may further include a memory to store (i) data which is representative of the intensity of light sampled by the first array of photo detectors, and (ii) data which is representative of the intensity of light sampled by the second array of photo detectors. The memory, the first array of photo detectors, the second array of photo detectors, and the signal processing circuitry may be integrated on or in the same semiconductor substrate.

Further, timing and control logic may be included to provide timing and control information to the signal processing circuitry, the first array of photo detectors and/or the second array of photo detectors. In addition, communication circuitry (wireless, wired and/or optical communication circuitry) to output data which is representative of the composite image. The communication circuitry, memory, the first array of photo detectors, the second array of photo detectors, and the signal processing circuitry may be integrated on or in the same semiconductor substrate.

The signal processing circuitry may include first signal processing circuitry and second signal processing circuitry wherein the first signal processing circuitry is coupled to and associated with the first array of photo detectors and second signal processing circuitry is coupled to and associated with the second array of photo detectors. In addition, the signal processing circuitry includes first analog signal logic and second analog signal logic wherein the first analog signal logic is coupled to and associated with the first array of photo detectors and second analog signal logic is coupled to and associated with the second array of photo detectors. Moreover, the signal processing circuitry may include first black level logic and second black level logic wherein the first black level logic is coupled to and associated with the first array of photo detectors and second black level logic is coupled to and associated with the second array of photo detectors. Notably, the signal processing circuitry includes first exposure control circuitry and second exposure control circuitry wherein the first exposure control circuitry is coupled to and associated with the first array of photo detectors and second exposure control circuitry is coupled to and associated with the second array of photo detectors.

The digital camera may include a frame, wherein the first and second arrays of photo detectors, the signal processing circuitry, and the first and second lenses are fixed to the frame.

In any of the embodiments above, the first array of photo detectors may include a first surface area and the second array of photo detectors includes a second surface area wherein the first surface area is different from the second surface area. Moreover, the photo detectors of the first array may include a first active surface area and the photo detectors of the second array may include a second active surface area wherein the first active surface area is different from the second active surface area.

In addition, in any of the embodiments, the first array of photo detectors may include a first surface area and the second array of photo detectors includes a second surface area wherein the first surface area is substantially the same as the second surface area. The photo detectors of the first array may include a first active surface area and the photo detectors of the second array may include a second active surface area wherein the first active surface area is different from the second active surface area.

Again, there are many inventions described and illustrated herein. This Summary of the Invention is not exhaustive of the scope of the present inventions. Moreover, this Summary of the Invention is not intended to be limiting of the invention and should not be interpreted in that manner. Thus, while certain embodiments have been described and/or outlined in this Summary of the Invention, it should be understood that the present invention is not limited to such embodiments, description and/or outline. Indeed, many others embodiments, which may be different from and/or similar to, the embodiments presented in this Summary, will be apparent from the description, illustrations and/or claims, which follow.

In addition, although various features, attributes and advantages have been described in this Summary of the Invention and/or are apparent in light thereof, it should be understood that such features, attributes and advantages are not required whether in one, some or all of the embodiments of the present inventions, and indeed, except where stated otherwise, need not be present in any of the aspects and/or embodiments of the present invention.

Various objects, features and/or advantages of one or more aspects and/or embodiments of the present invention will become more apparent from the following detailed description and the accompanying drawings in which like numerals represent like components. It should be understood however, that any such objects, features, and/or advantages are not required, and indeed, except where stated otherwise, need not be present in any of the aspects and/or embodiments of the present invention.

It should be understood that the various aspects and embodiments of the present invention that do not appear in the claims that follow are preserved for presentation in one or more divisional/continuation patent applications.

BRIEF DESCRIPTION OF THE DRAWINGS

In the course of the detailed description to follow, reference will be made to the attached drawings. These drawings show different aspects and embodiments of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 1B-1D are schematic illustrations of the prior art image capturing elements of the prior art digital camera of FIG. 1A;

FIGS. 3A-3B are schematics of a digital camera subsystem (DCS);

FIG. 4 illustrates a digital camera subsystem having a three array/lens configuration.

FIGS. 5A-5C is a schematic of image capture using the digital camera subsystem (DCS) of FIGS. 2-3;

FIGS. 10A-10N are schematic representations of optics portions that may be employed in a digital camera apparatus in accordance with further embodiments of the present invention;

FIGS. 11A-11B are schematic and side elevational views, respectively, of a lens used in an optics portion adapted to transmit red light or a red band of light, e.g., for a red camera channel, in accordance with another embodiment of the present invention;

FIGS. 12A-12B are schematic and side elevational views, respectively, of a lens used in an optics portion adapted to transmit green light or a green band of light, e.g., for a green camera channel, in accordance with another embodiment of the present invention;

FIGS. 13A-13B are schematic and side elevational views, respectively, of a lens used in an optics portion adapted to transmit blue light or a blue band of light, e.g., for a blue camera channel, in accordance with another embodiment of the present invention;

FIG. 14 is a schematic view of a lens used in an optics portion adapted to transmit red light or a red band of light, e.g., for a red camera channel, in accordance with another embodiment of the present invention;

FIGS. 15A-15F are schematic representations of lenses that may be employed in a digital camera apparatus in accordance with further embodiments of the present invention;

FIGS. 17B-17K are schematic cross sectional views of various embodiments of one or more pixels in accordance with further embodiments of the present invention; such pixel embodiments may be implemented in any of the embodiments described and/or illustrated herein;

FIGS. 18A-18B depict an image being captured by a portion of a sensor array, in accordance with one embodiment of the present invention;

FIGS. 19A-19B depict an image being captured by a portion of a sensor array in accordance with another embodiment of the present invention;

FIGS. 20A-20B are schematic representations of a relative positioning provided for an optics portion and a respective sensor array in accordance with further embodiments of the present invention;

FIGS. 22A-22B are a schematic plan view and a schematic cross sectional view, respectively, of an image device in accordance with one embodiment of the present invention;

FIGS. 23A-23B are a schematic plan view and a schematic cross sectional view, respectively, of an image device in accordance with another embodiment of the present invention;

FIGS. 24A-24B are a schematic plan view and a schematic cross sectional view, respectively, of an image device in accordance with another embodiment of the present invention;

FIGS. 25A-25B are a schematic plan view and a schematic cross sectional view, respectively, of an image device in accordance with another embodiment of the present invention;

FIGS. 26A-26B are a schematic plan view and a schematic cross sectional view, respectively, of an image device in accordance with another embodiment of the present invention;

FIGS. 27A-27B are a schematic plan view and a schematic cross sectional view, respectively, of an image device in accordance with another embodiment of the present invention;

FIG. 28B is an enlarged schematic plan view of the support of FIG. 28A;

FIG. 28C is an enlarged schematic cross sectional view of the support of FIG. 28A, taken along the direction A-A of FIG. 28B;

FIG. 31A is a schematic perspective view of a support and optics portions that may be seated therein, in accordance with another embodiment of the present invention;

FIG. 31B is a schematic plan view of the support of FIG. 31A;

FIG. 31C is a schematic cross sectional view of the support of FIG. 31A, taken along the direction A-A of FIG. 31B;

FIG. 31D is a schematic cross sectional view of the support of FIG. 31A, taken along the direction A-A of FIG. 31B; and a lens that may be seated therein;

FIGS. 33A-33F shows one embodiment for assembling and mounting the digital camera apparatus of FIG. 32;

FIG. 33G is a schematic perspective view of a digital camera apparatus in accordance with another embodiment of the present invention;

FIGS. 33H-33K are schematic elevational views of mounting and electrical connector configurations that may be employed in association with a digital camera apparatus in accordance with further embodiments of the present invention;

FIGS. 35A-35C show one embodiment for assembling three lenslets of an optics portion in the support.

FIG. 40 is a schematic cross-sectional view of a digital camera apparatus that includes the support of FIG. 38 and the optics portions of FIGS. 11A-11B, 13A-13B, and a printed circuit board on which the digital camera apparatus may be mounted; in accordance with one embodiment of the present invention;

FIGS. 42-44 are schematic cross sectional views of supports that employ the seating configurations of FIGS. 41B-41D, respectively, and may be employed to support the lenses shown in FIGS. 15B-15D, respectively, at least in part, in accordance with further embodiments of the present invention;

FIGS. 54A-54H shows one such embodiment for assembling and mounting the digital camera apparatus of FIG. 53.

FIGS. 57A-57H shows one such embodiment for assembling and mounting the digital camera apparatus of FIG. 56;

FIGS. 68-72 are schematic cross-sectional views of digital camera apparatus and printed circuit boards of digital cameras on which the digital camera apparatus may be mounted, in accordance with further embodiments of the present invention;

FIGS. 73A-73B are schematic elevational and cross sectional views, respectively, of a support in accordance with another embodiment of the present invention;

FIG. 74 is a schematic cross sectional view of a support in accordance with another embodiment of the present invention;

FIG. 75 is a schematic plan view of a support in accordance with another embodiment of the present invention;

FIG. 76A is a schematic view of a digital camera apparatus that includes one or more output devices in accordance with another embodiment of the present invention;

FIGS. 76B-76C are schematic front and rear elevational views respectively, of a display device that may be employed in the digital camera apparatus of FIG. 76A, in accordance with one embodiment of the present invention;

FIGS. 76D-76E are schematic views of digital camera apparatus that include one or more output devices in accordance with further embodiments of the present invention;

FIG. 77A is a schematic view of a digital camera apparatus that includes one or more input devices in accordance with another embodiment of the present invention;

FIGS. 77B-77C are enlarged schematic front and rear perspective views respectively, of an input device that may be employed in the digital camera apparatus of FIG. 77A, in accordance with one embodiment of the present invention;

FIGS. 77D-77L are schematic views of digital camera apparatus that include one or more output devices in accordance with further embodiments of the present invention;

FIGS. 77M-77N are schematic plan and cross sectional views, respectively, of a support in accordance with another embodiment of the present invention;

FIGS. 78B-78C are enlarged schematic front and rear perspective views respectively, of an illumination device that may be employed in the digital camera apparatus of FIG. 78A, in accordance with one embodiment of the present invention;

FIGS. 78D-78L are schematic perspective views of digital camera apparatus that include one or more illumination devices in accordance with further embodiments of the present invention;

FIGS. 80A-80F are schematic perspective views of digital camera apparatus that include one or more input devices, one or more display devices and one or more illumination devices, in accordance with further embodiments of the present invention.

FIG. 81A is a schematic perspective view a digital camera apparatus that includes molded plastic packaging in accordance with one embodiment of the present invention;

FIGS. 81B-81C are schematic exploded perspective views of the digital camera apparatus of FIG. 81A;

FIGS. 83A-83C are schematic front perspective views of sensor array and processor configurations, in accordance with further embodiments of the present invention;

FIGS. 84A-84E are schematic representations of digital camera apparatus in accordance with further embodiments of the present invention;

FIGS. 85A-85E are schematic representations of digital camera apparatus in accordance with further embodiments of the present invention;

FIGS. 86A-86E are schematic representations of digital camera apparatus in accordance with further embodiments of the present invention;

FIGS. 87A-87B are schematic representations of digital camera apparatus in accordance with further embodiments of the present invention;

FIGS. 88A-88E are schematic representations of a digital camera apparatus in accordance with another embodiment of the present invention;

FIGS. 89A-89E are schematic representation of digital camera apparatus in accordance with further embodiments of the present invention;

FIGS. 91A-91B are a schematic plan view and a schematic cross sectional view, respectively, of an image device in accordance with another embodiment of the present invention;

FIGS. 92A-92B are a schematic plan view and a schematic cross sectional view, respectively, of an image device in accordance with another embodiment of the present invention;

FIGS. 93A-93B are a schematic plan view and a schematic cross sectional view, respectively, of an image device in accordance with another embodiment of the present invention;

FIGS. 94A-94B are a schematic plan view and a schematic cross sectional view, respectively, of an image device in accordance with another embodiment of the present invention;

FIGS. 95A-95B are a schematic plan view and a schematic cross sectional view, respectively, of an image device in accordance with another embodiment of the present invention;

FIGS. 96A-96B are a schematic plan view and a schematic cross sectional view, respectively, of an image device in accordance with another embodiment of the present invention;

FIG. 97A is a schematic plan view of a support and optics portions that may be seated therein, in accordance with one embodiment of the present invention;

FIG. 97B is a schematic cross sectional view of the support of FIG. 97A, taken along the direction A-A of FIG. 97B;

FIGS. 97C and 97D are schematic cross sectional views of a portion of the support of FIG. 97A and a lens that may be seated therein;

FIGS. 98A-98B are schematic representations showing example layouts for the processor of digital camera apparatus in the present invention;

FIGS. 99A-99D are schematic representations of digital camera apparatus in accordance with further embodiments of the present invention;

FIGS. 100A-100D are schematic representations of digital camera apparatus in accordance with further embodiments of the present invention;

FIG. 101A is schematic front perspective view of an image device in accordance with another embodiment of the present invention;

FIG. 101B is a schematic representation of a sensor array and circuits connected thereto, which may be employed in the image device of FIG. 101A, in accordance with one embodiment of the present invention;

FIG. 101C is a schematic representation of a pixel of the sensor array of FIG. 101B;

FIG. 101D is a schematic representation of a sensor array and circuits connected thereto, which may be employed in the image device of FIG. 101A, in accordance with one embodiment of the present invention;

FIG. 101E is a schematic representation of a pixel of the sensor array of FIG. 101D;

FIG. 101F is a schematic representation of a sensor array and circuits connected thereto, which may be employed in the image device of FIG. 101A, in accordance with one embodiment of the present invention;

FIG. 101G is a schematic representation of a pixel of the sensor array of FIG. 101F;

FIG. 102A is schematic front perspective view of an image device in accordance with another embodiment of the present invention;

FIG. 102B is a schematic representation of a sensor array and circuits connected thereto, which may be employed in the image device of FIG. 102A, in accordance with one embodiment of the present invention;

FIG. 102C is a schematic representation of a pixel of the sensor array of FIG. 102B;

Figure 102A:
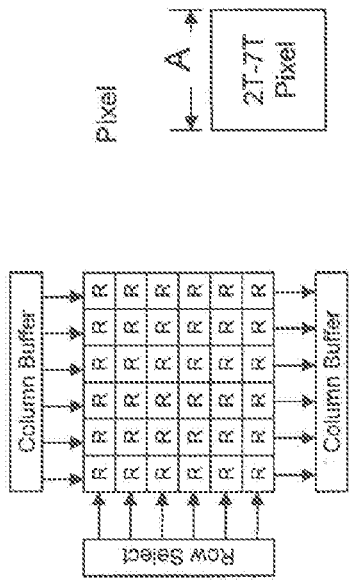
Figure 102C:
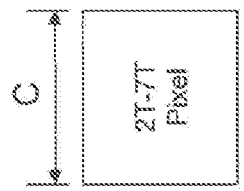
Figure 102B:
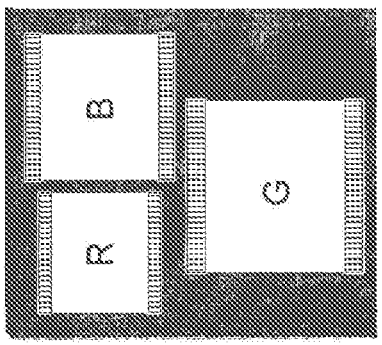
Figure 102G:
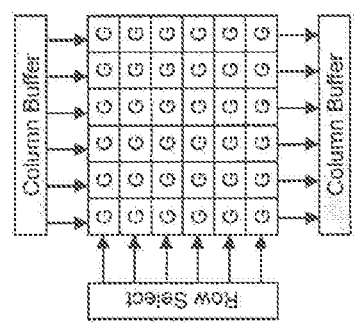
Figure 102E:
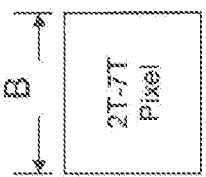
Figure 102F:
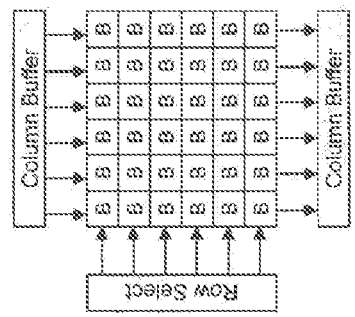
Figure 102D:
Figure 103A:
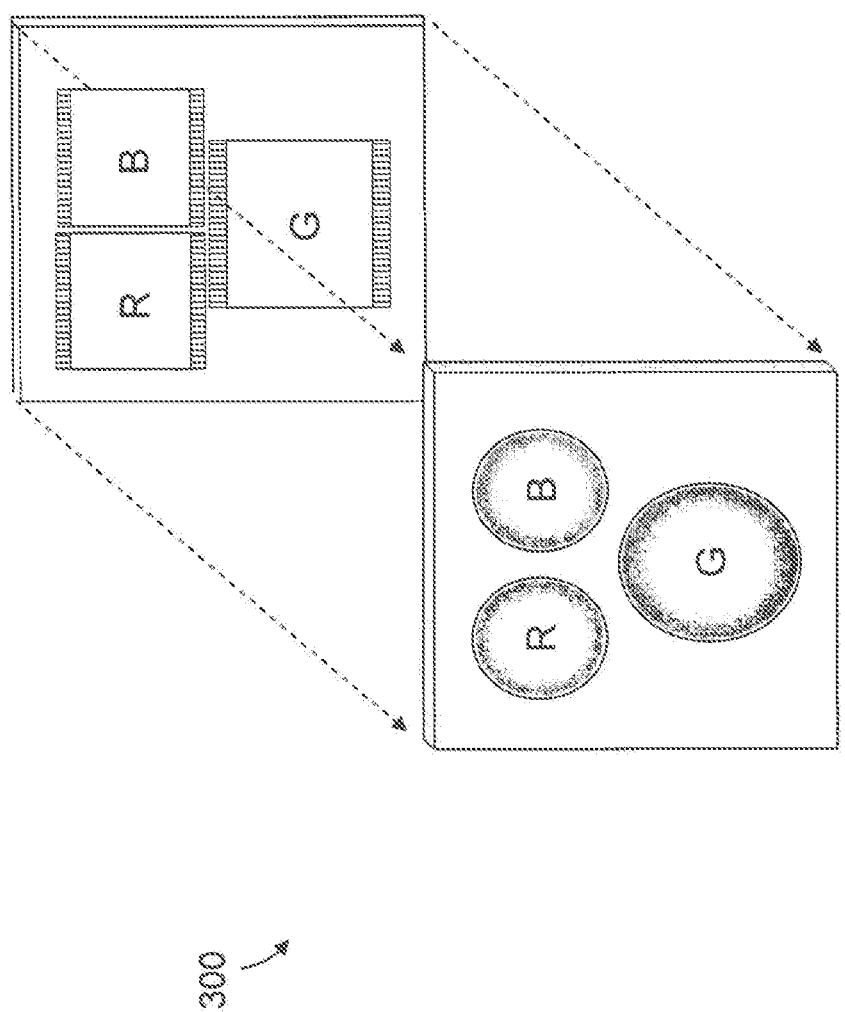
Figure 103B:
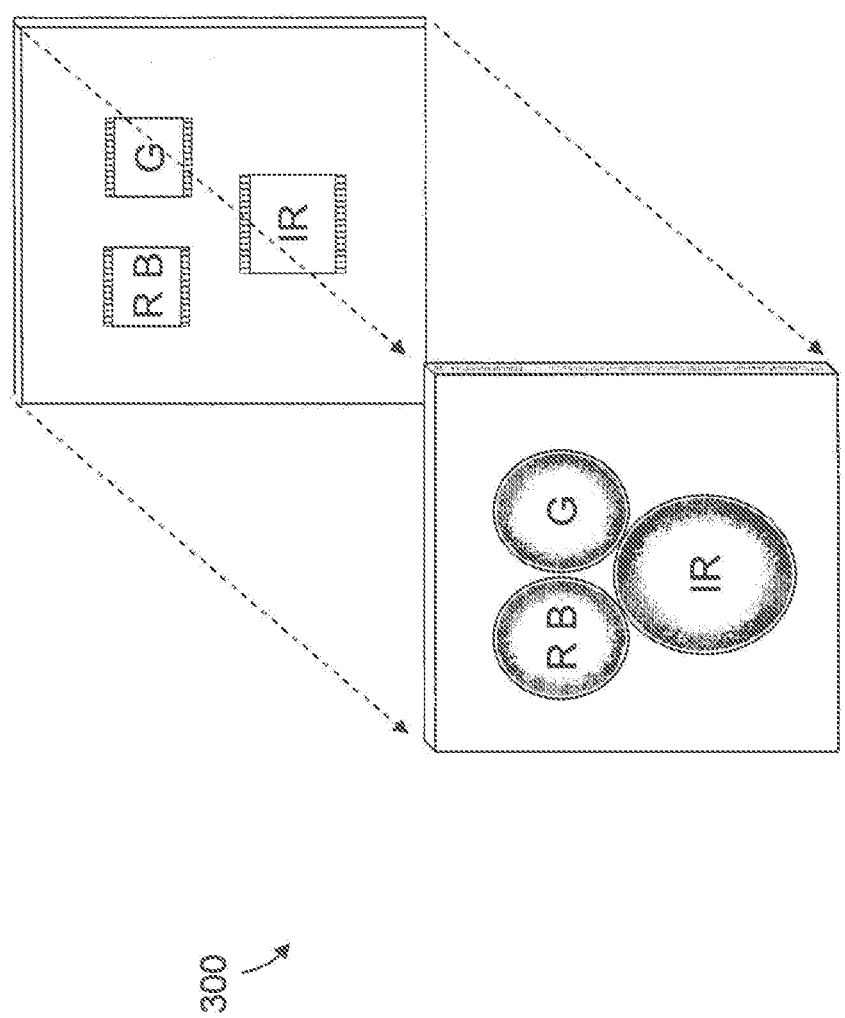
Figure 103C:
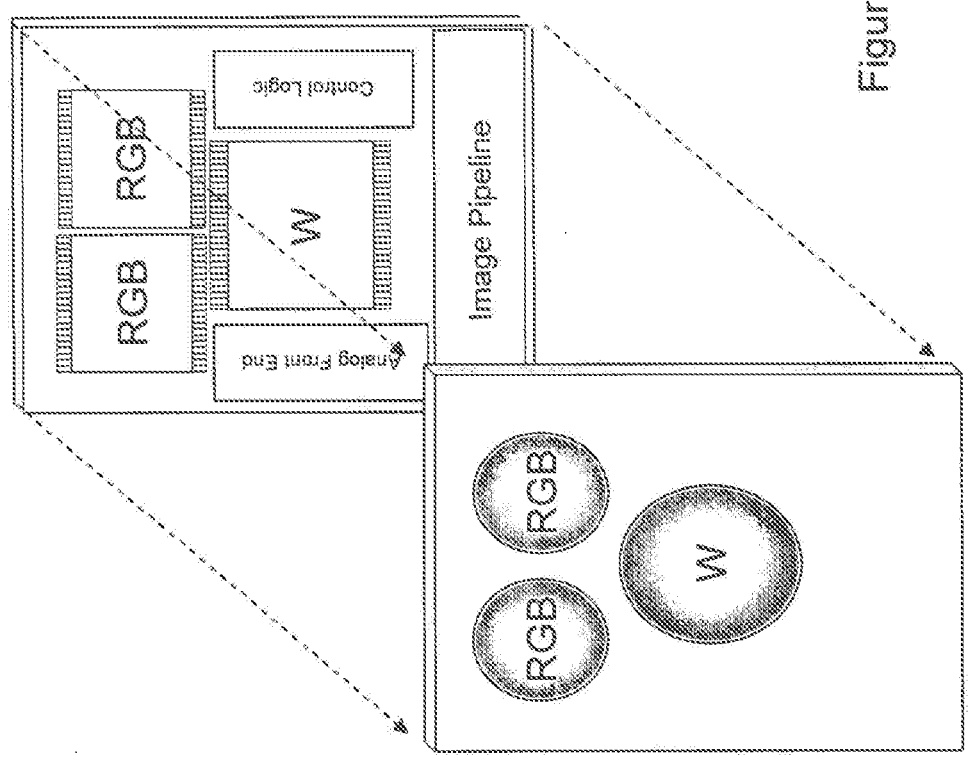
Figure 103D:
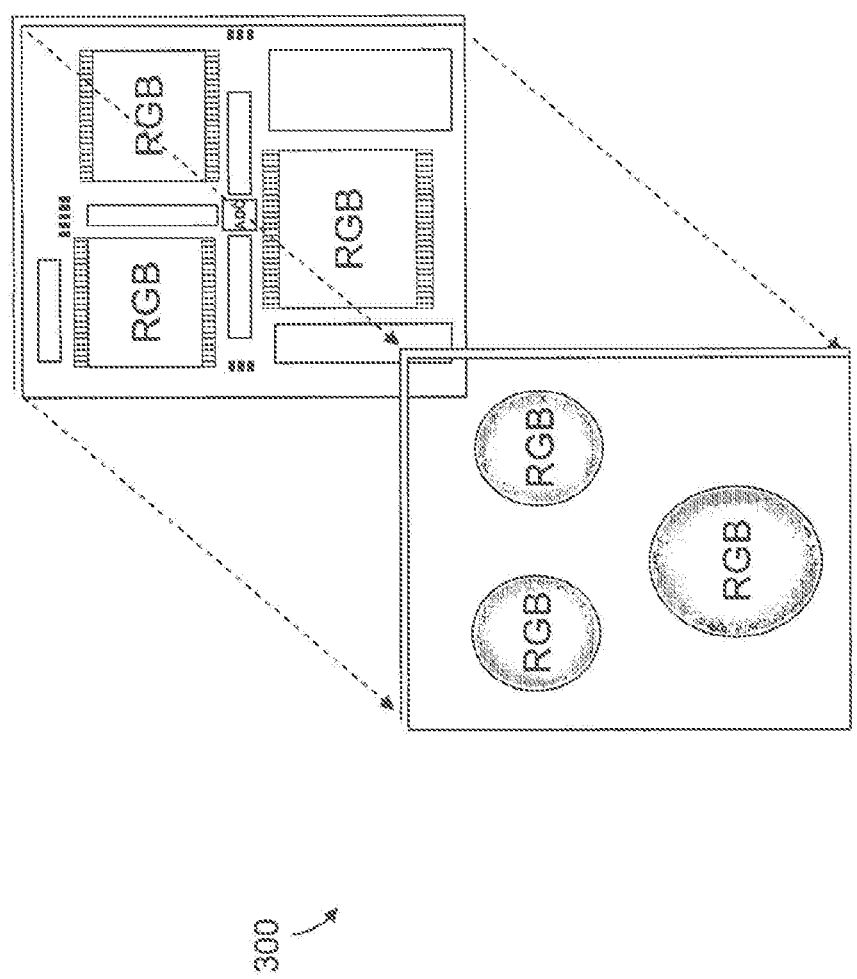
Figure 104A:
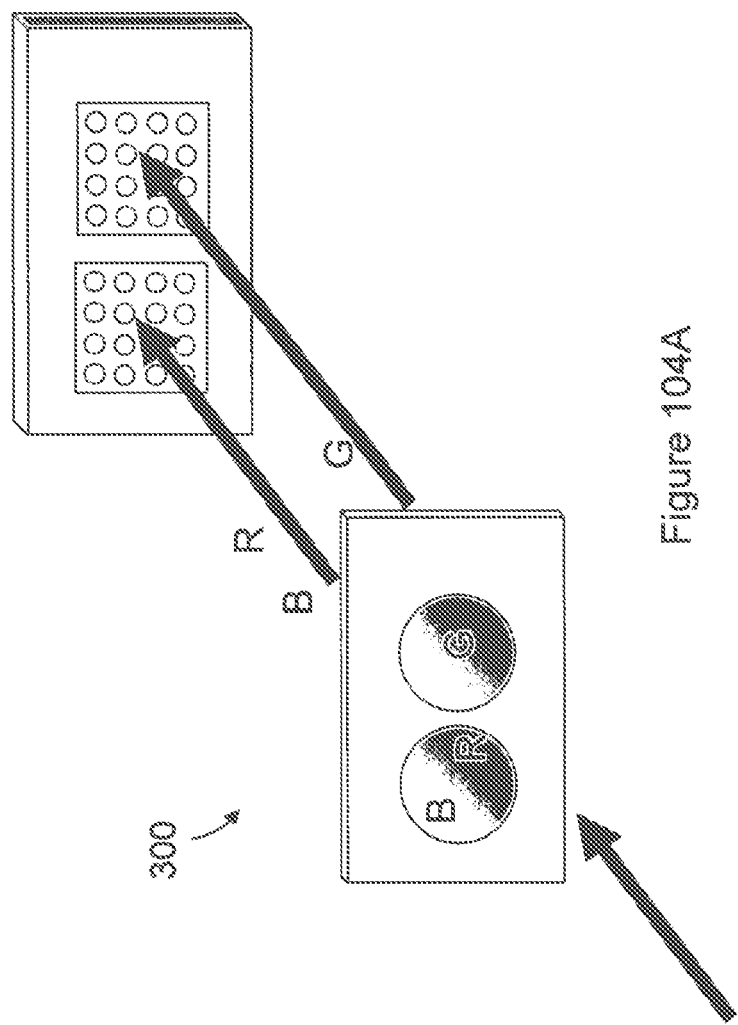
Figure 104B:
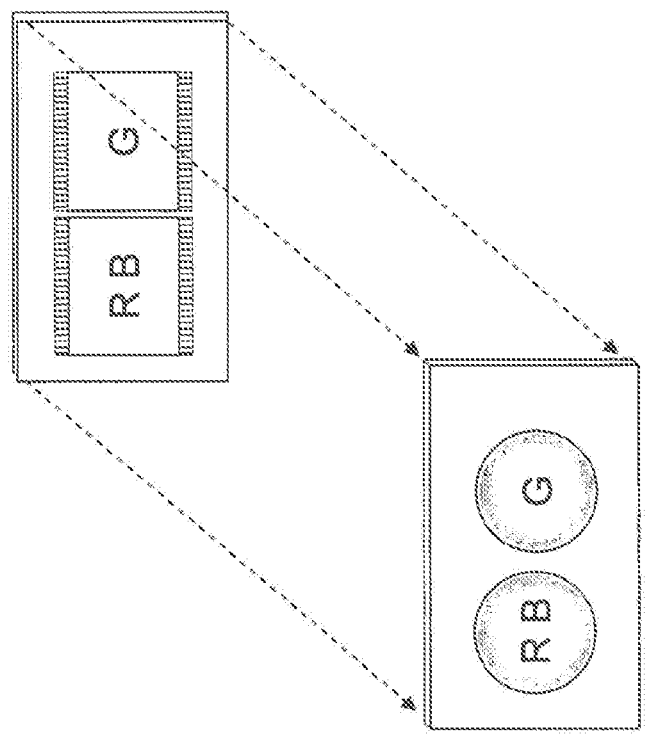
Figure 104C:
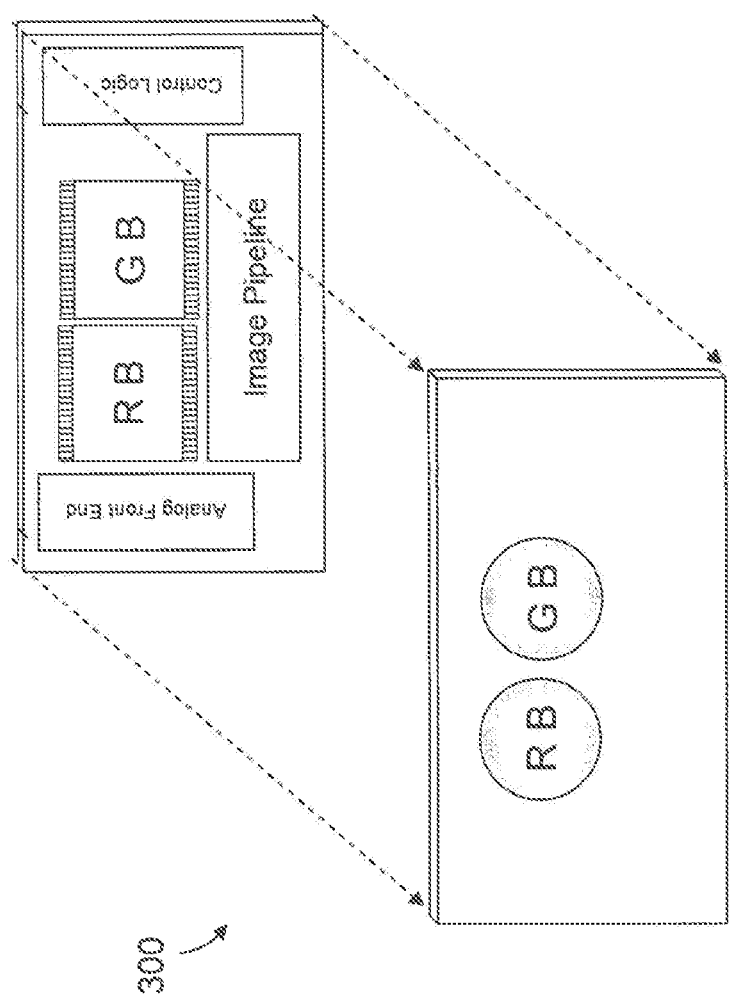
Figure 104D:
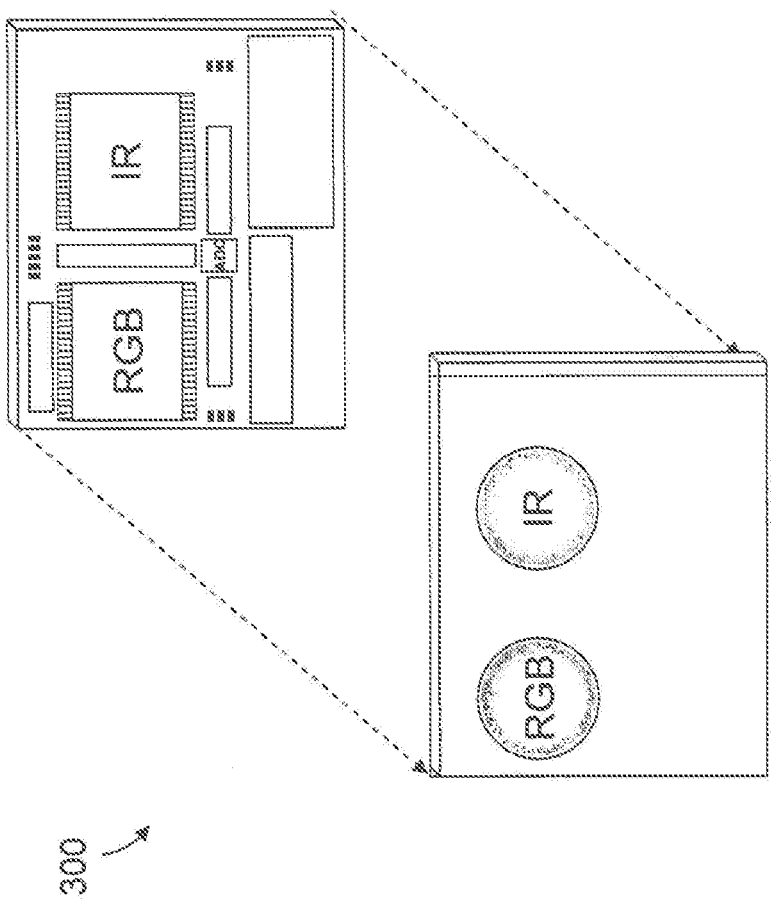
Figure 104E:
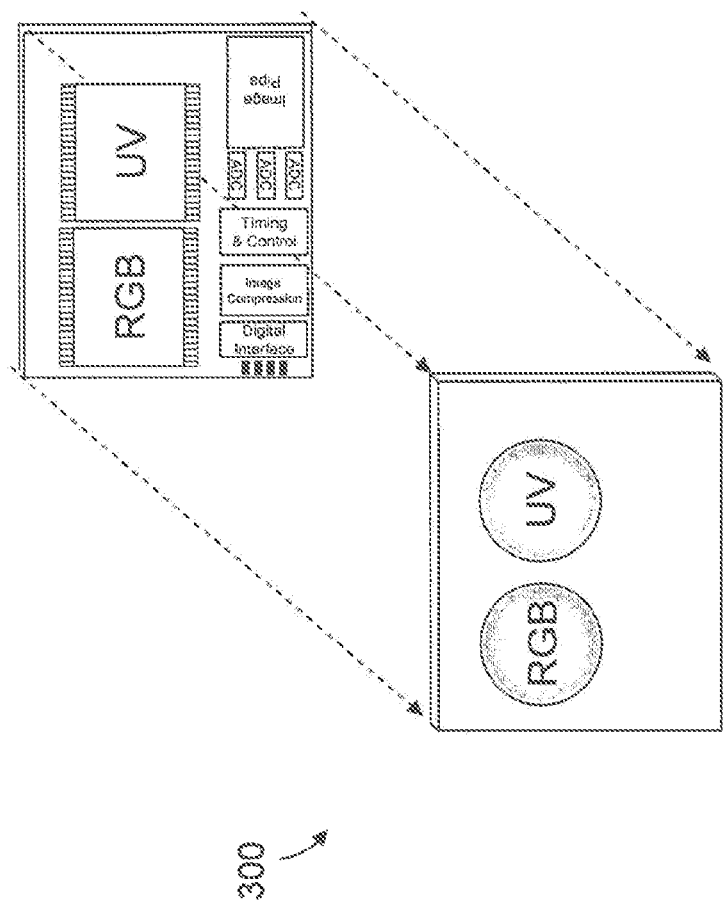
Figure 105A:
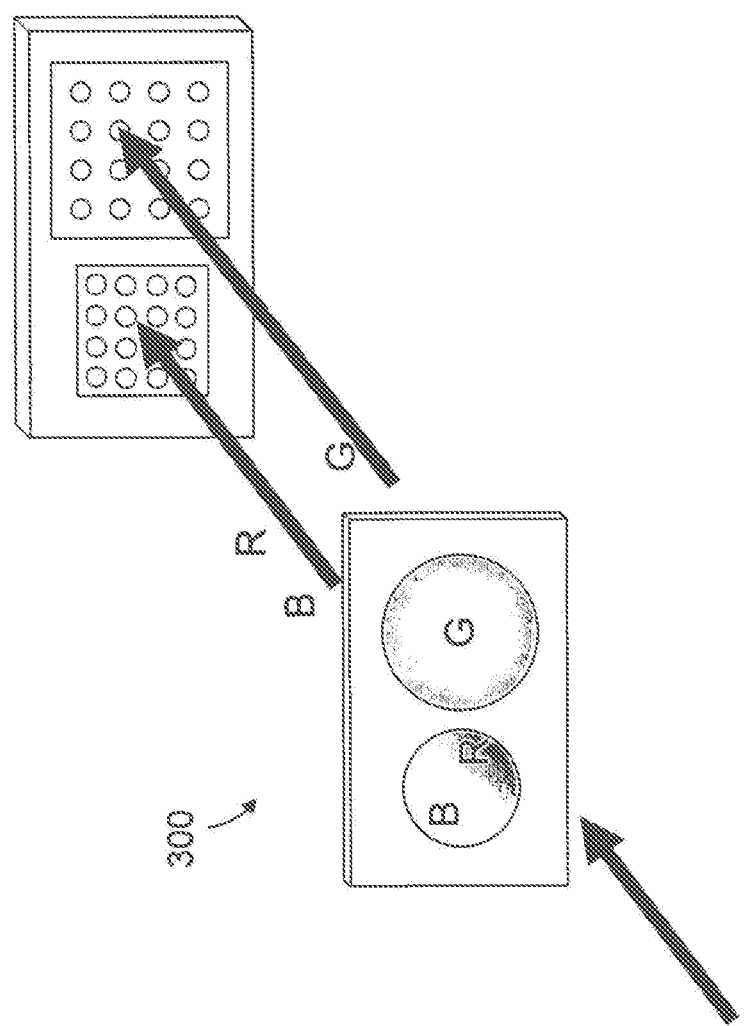
Figure 105B:
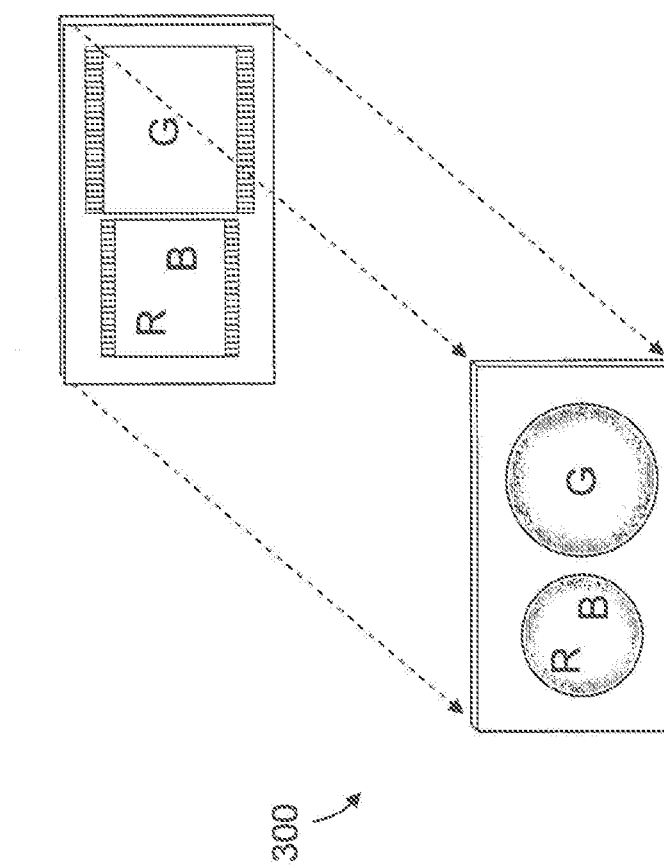
Figure 105C:
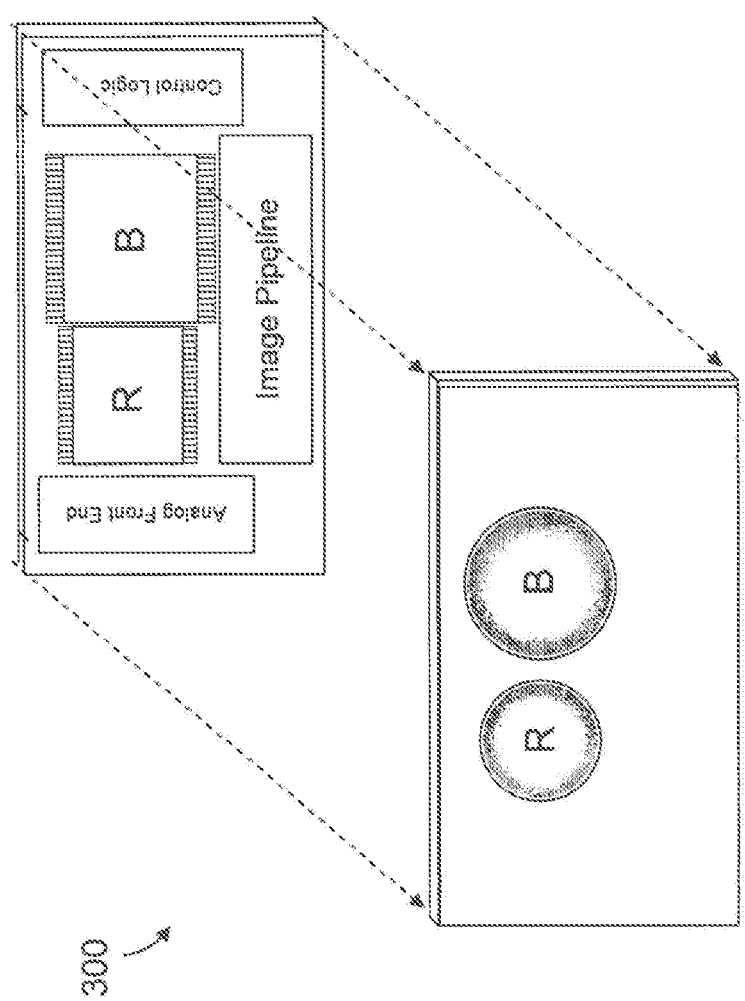
Figure 105E:
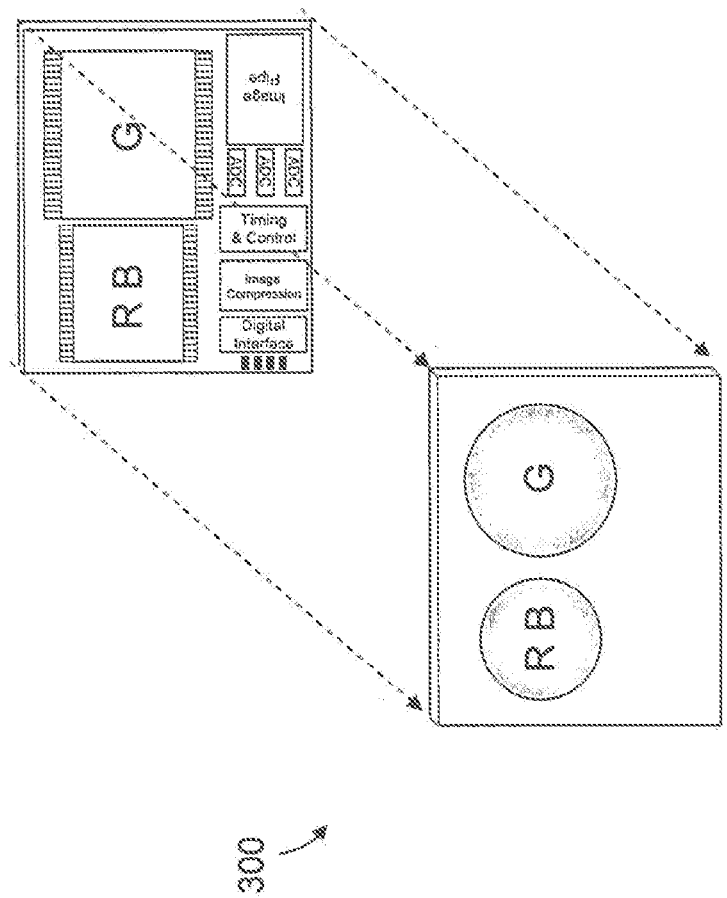
Figure 106B:
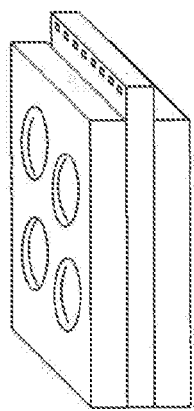
Figure 106C:
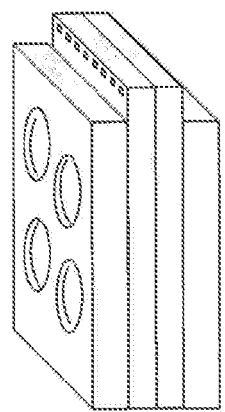
Figure 106A:
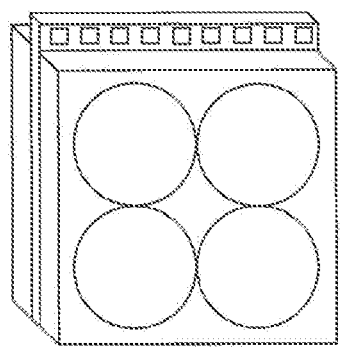
Figure 107A:
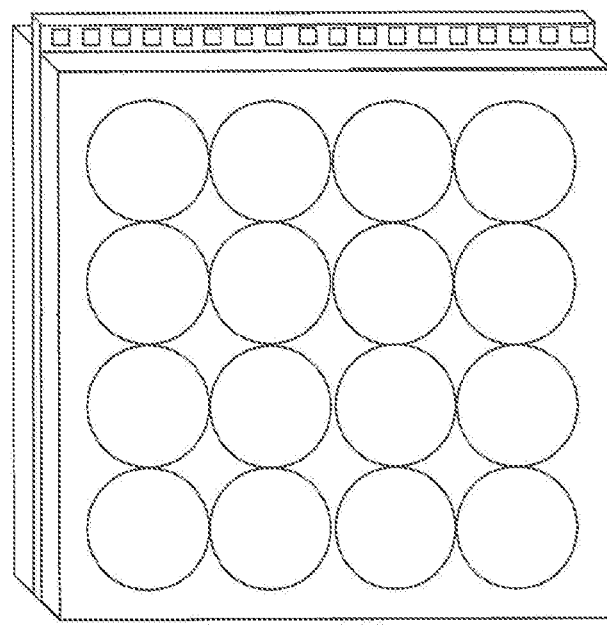
Figure 108A:
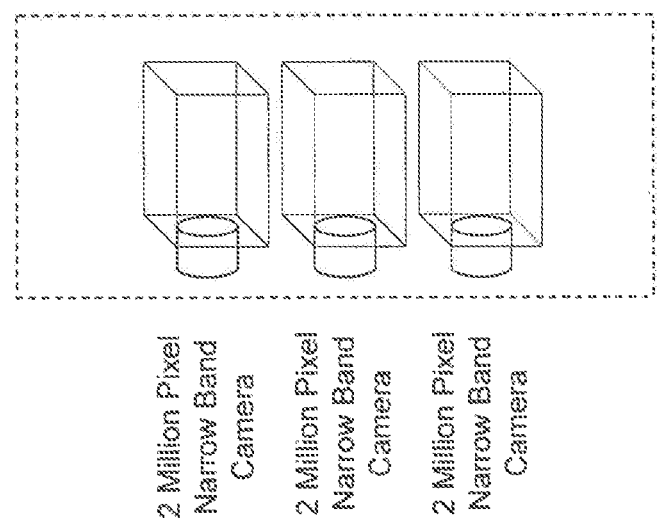
Figure 108B:
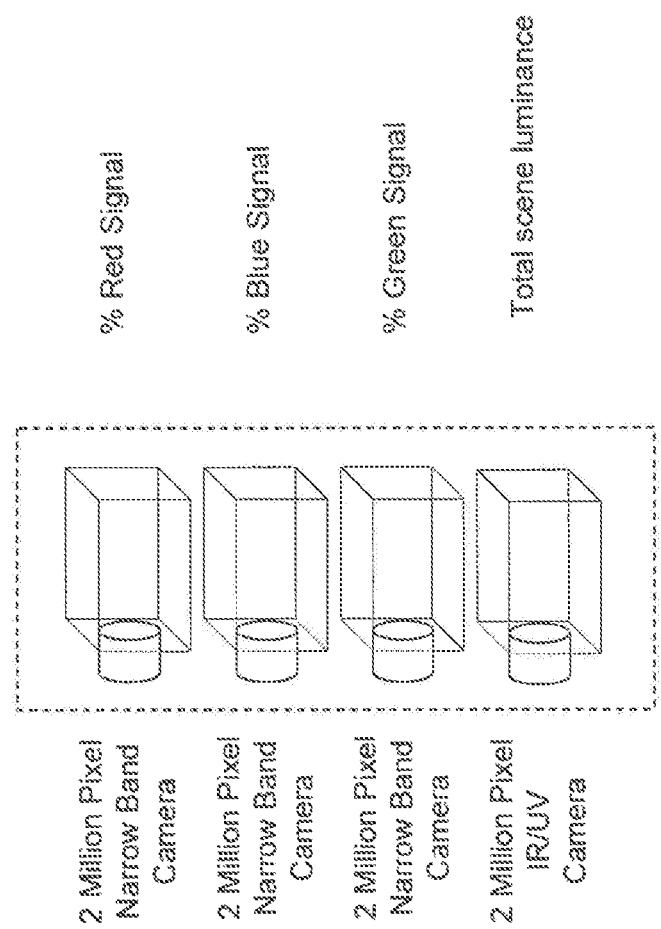
Figure 109A:
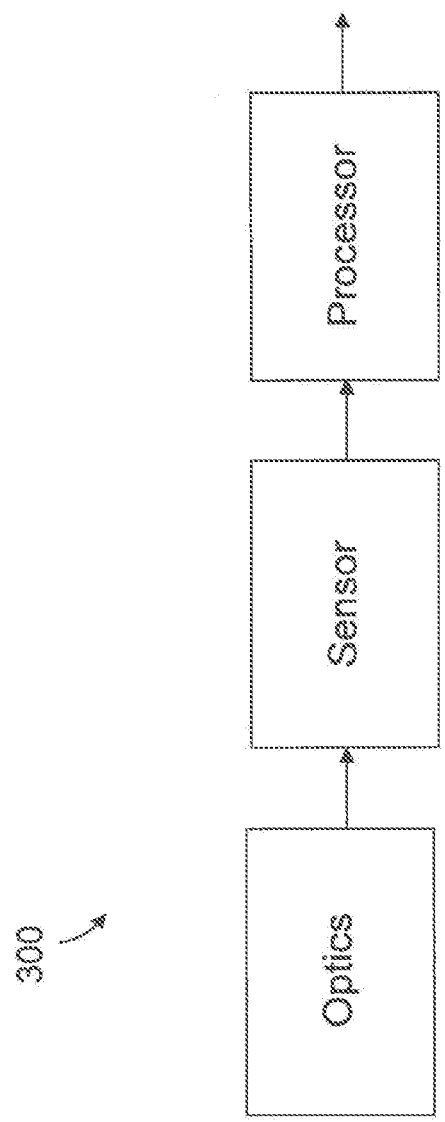
Figure 109B:
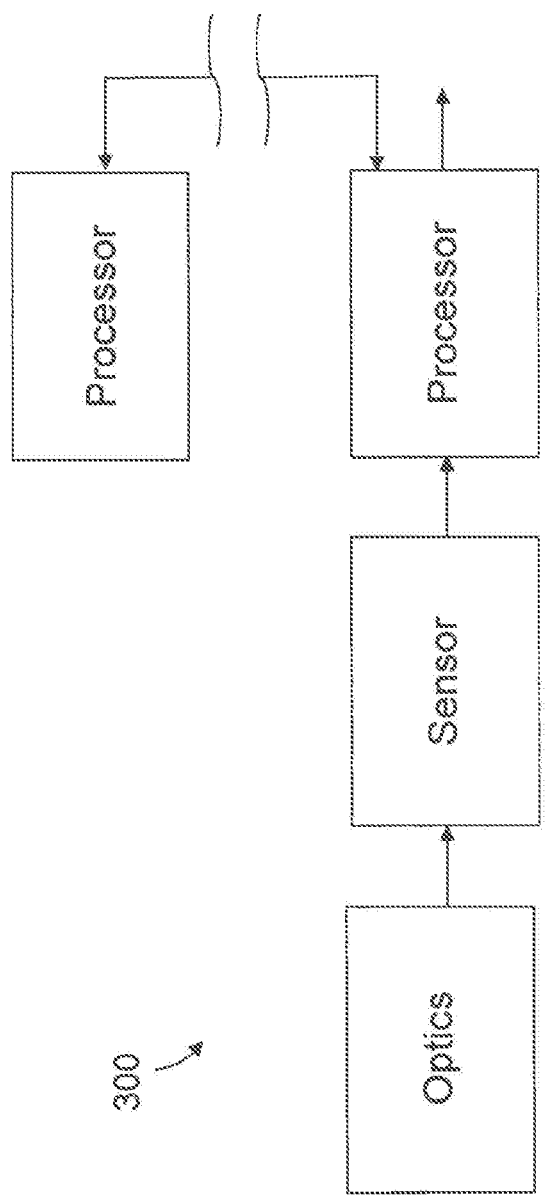
Figure 109D:
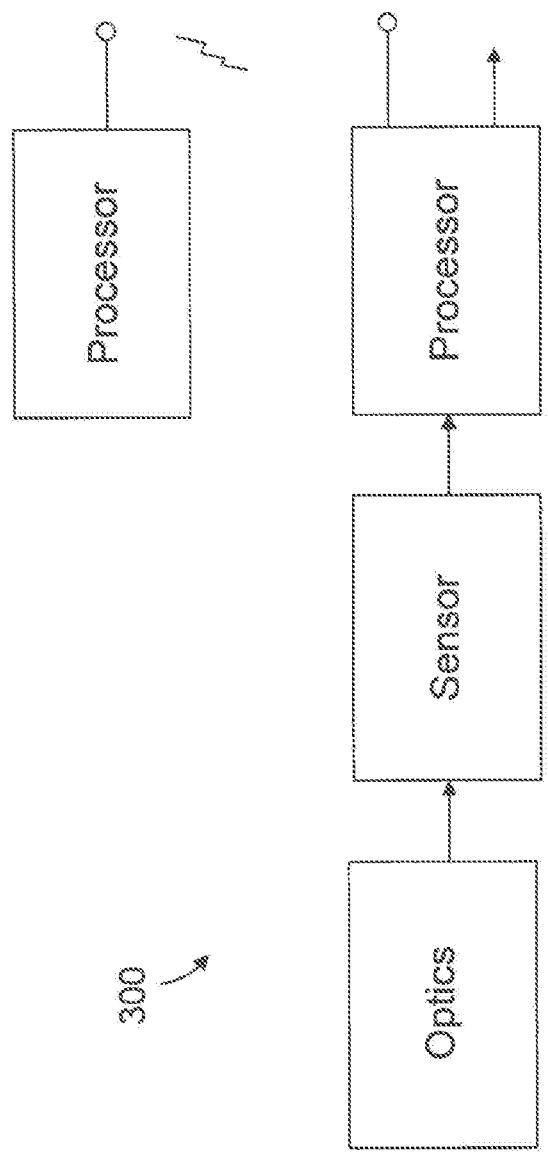
Figure 109E:
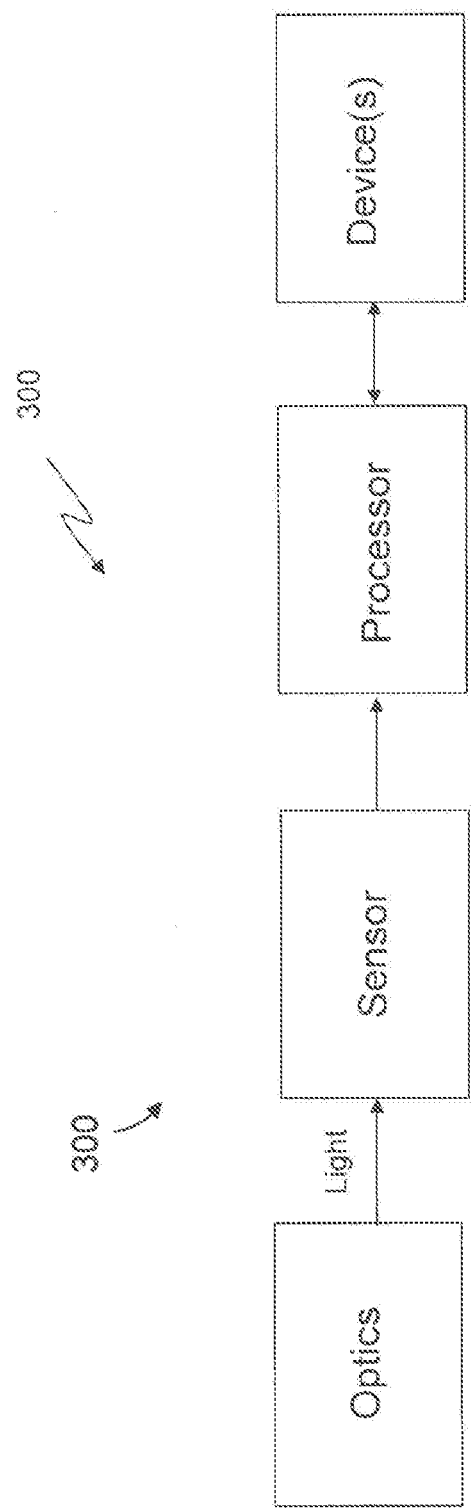
Figure 110B:
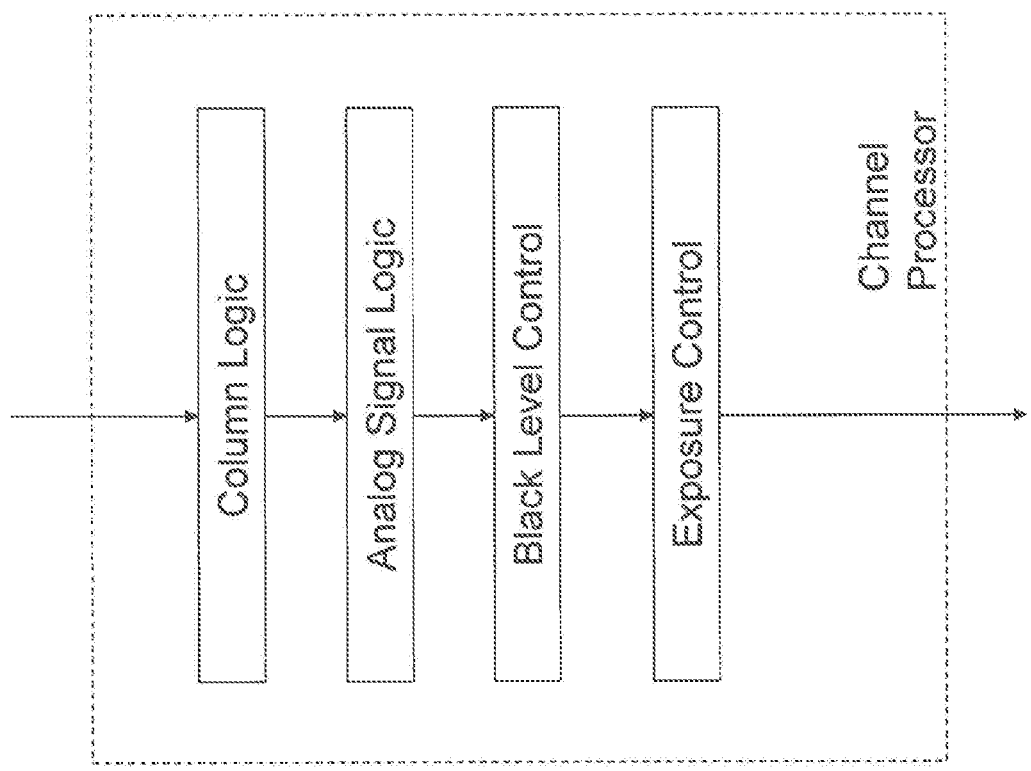
Figure 110C:
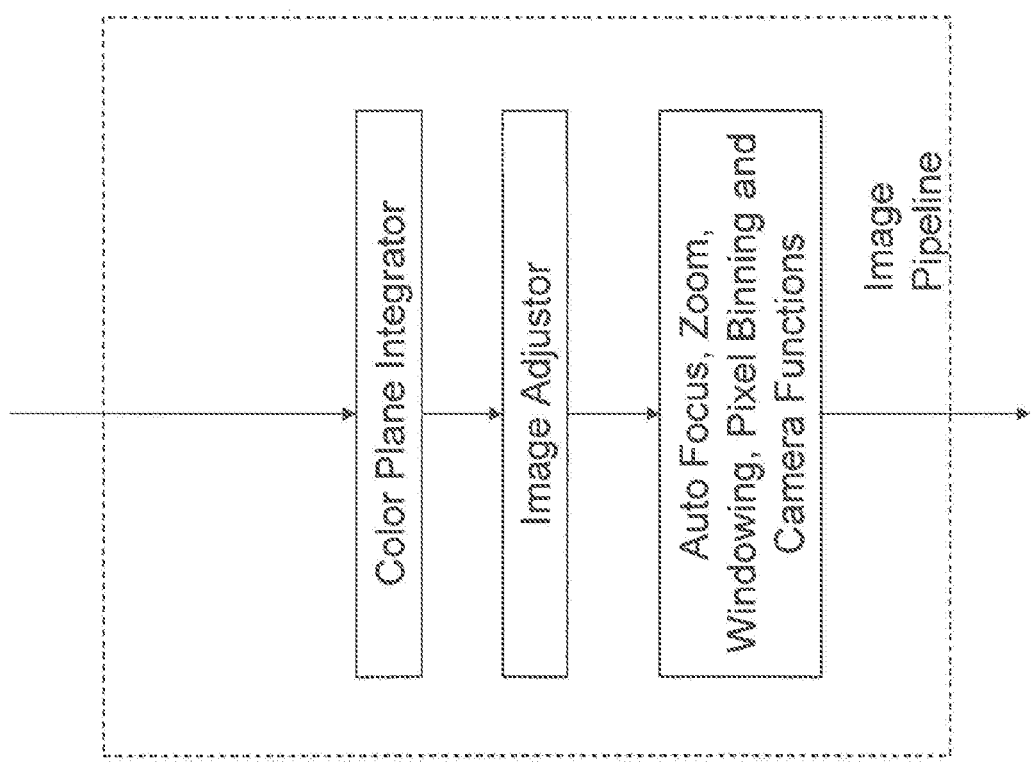
Figure 110D:
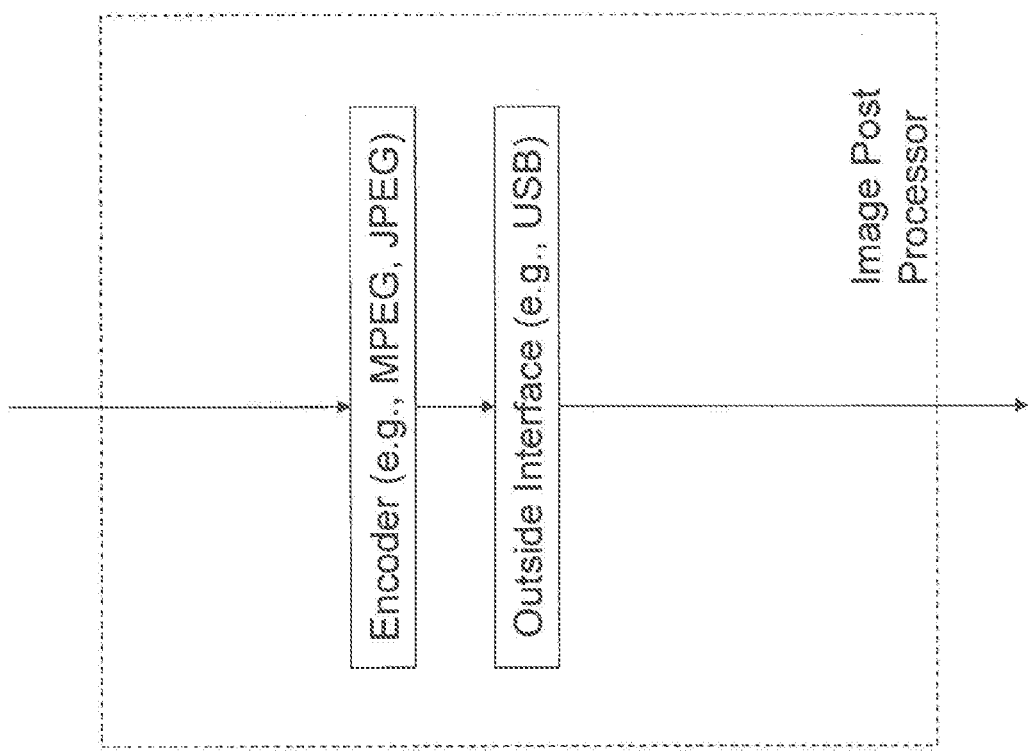
Figure 110E:
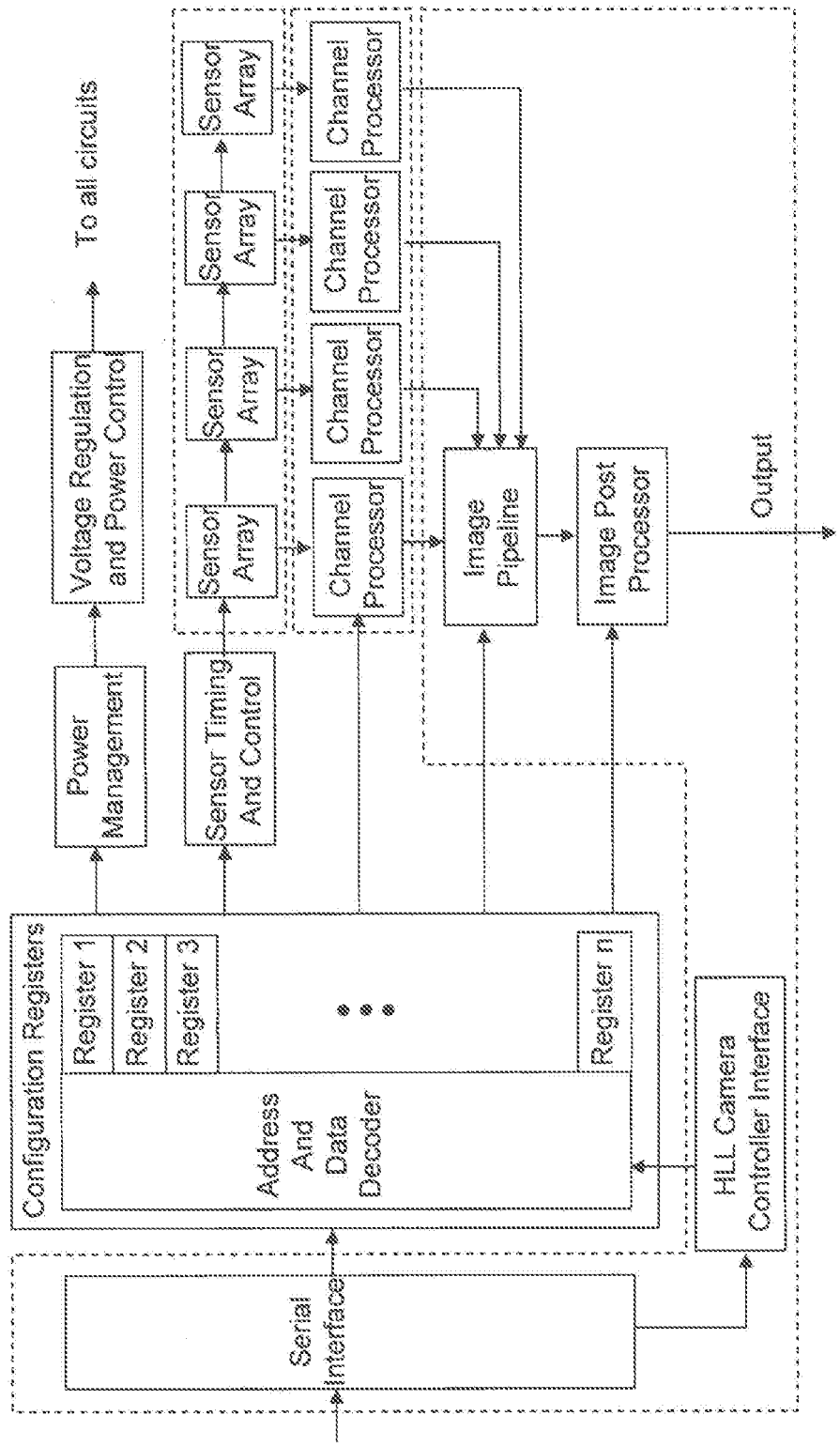
Figure 111A:
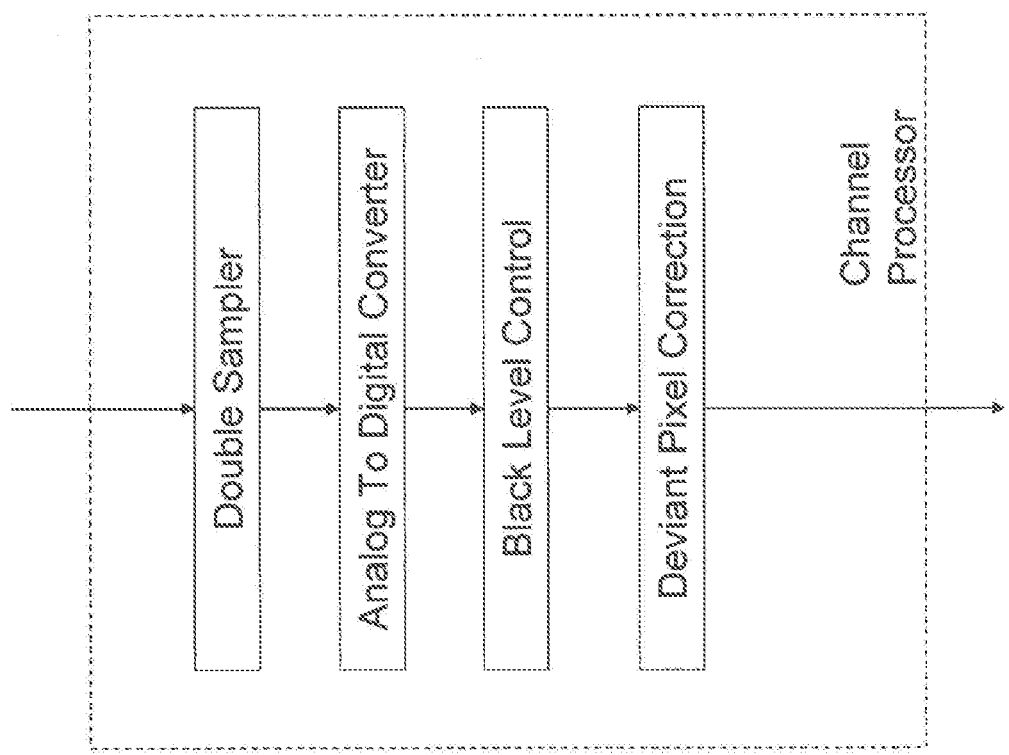
Figure 111B:
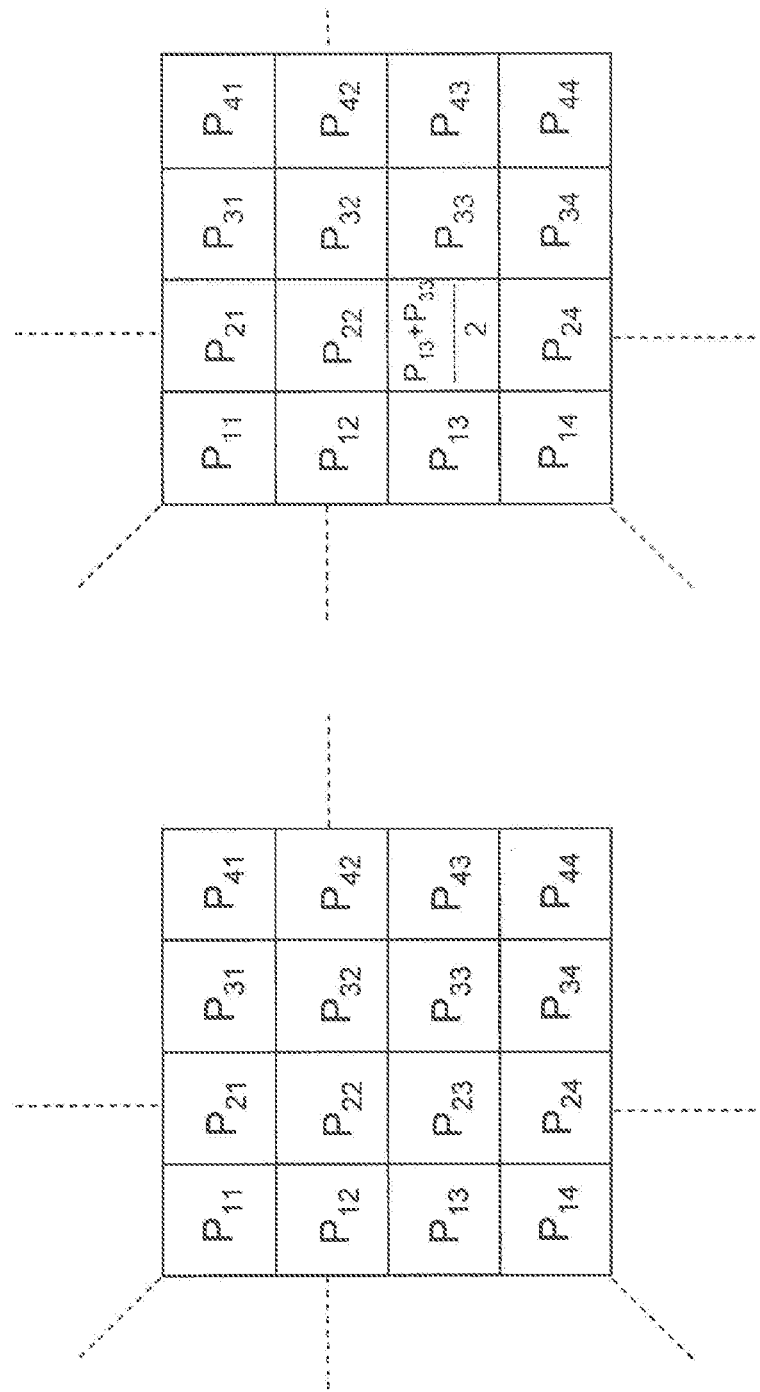

FIG. 102D is a schematic representation of a sensor array and circuits connected thereto, which may be employed in the image device of FIG. 102A, in accordance with one embodiment of the present invention;

FIG. 102E is a schematic representation of a pixel of the sensor array of FIG. 102D;

FIG. 102F is a schematic representation of a sensor array and circuits connected thereto, which may be employed in the image device of FIG. 102A, in accordance with one embodiment of the present invention;

FIG. 102G is a schematic representation of a pixel of the sensor array of FIG. 102F;

FIGS. 103A-103E are schematic representations of digital camera apparatus in accordance with further embodiments of the present invention;

FIGS. 104A-104E are schematic representations of digital camera apparatus in accordance with further embodiments of the present invention;

FIGS. 105A-105E are schematic representations of digital camera apparatus in accordance with further embodiments of the present invention;

FIGS. 106A-106C are schematic perspective views of a system having a plurality of digital camera apparatus, in accordance with another embodiment of the present invention;

FIG. 107A is a schematic perspective view of a system having a plurality of digital camera apparatus, in accordance with another embodiment of the present invention;

FIG. 107B is a schematic elevational view of image devices that may be employed in the system of FIG. 107A;

FIGS. 108A-108B are schematic representations of digital camera apparatus in accordance with further embodiments of the present invention;

FIGS. 109A-109E are block diagram representations showing configurations of digital camera apparatus in accordance embodiments of the present invention;

FIG. 110A is a block diagram of a processor in accordance with one embodiment of the present invention;

FIG. 110B is a block diagram of a channel processor that may be employed in the processor of FIG. 110A, in accordance with one embodiment of the present invention;

FIG. 110C is a block diagram of an image pipeline that may be employed in the processor of FIG. 110A, in accordance with one embodiment of the present invention;

FIG. 110D is a block diagram of a post processor that may be employed in the processor of FIG. 110A, in accordance with one embodiment of the present invention;

FIG. 110E is a block diagram of a system control and other portions of a digital camera apparatus, in accordance with one embodiment of the present invention;

FIGS. 110E-110H show an instruction format and instruction sets according to one embodiment of the present invention;

FIG. 111A is a block diagram of a channel processor in accordance with another embodiment of the present invention;

FIG. 111B is a graphical representation of a neighborhood of pixel values.

Figure 111C:
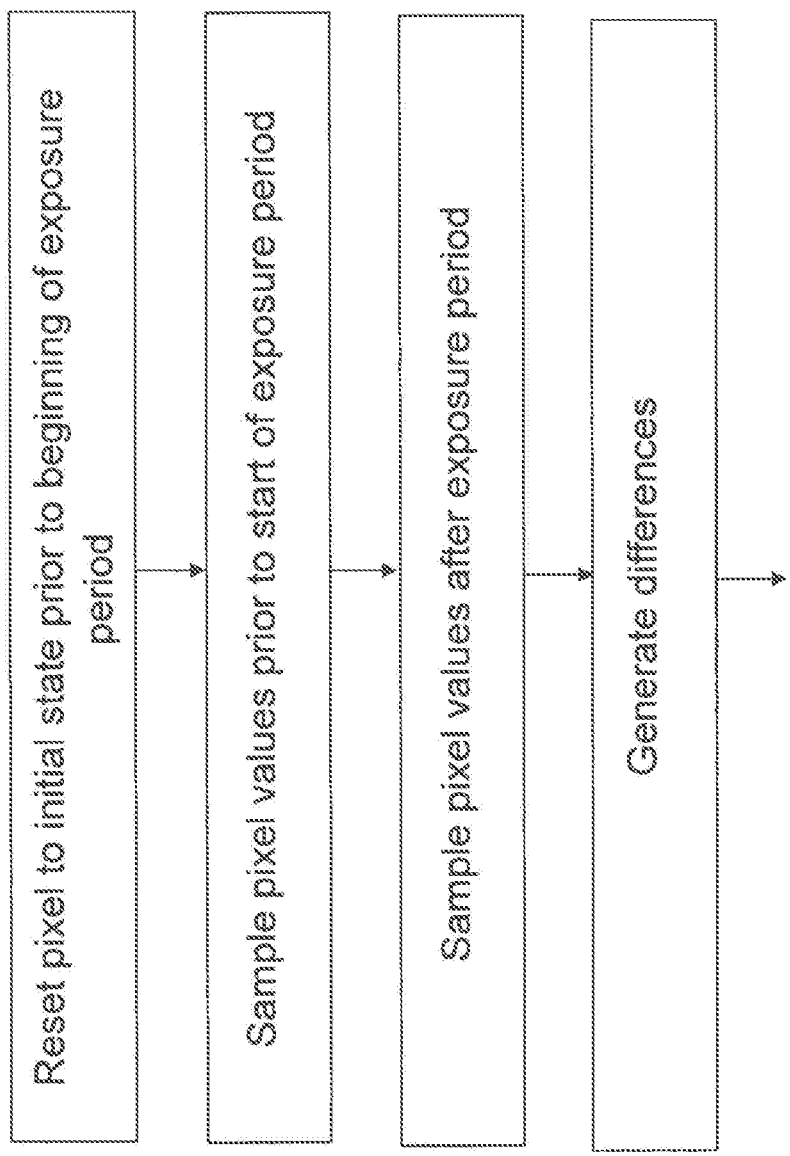
Figure 111D:
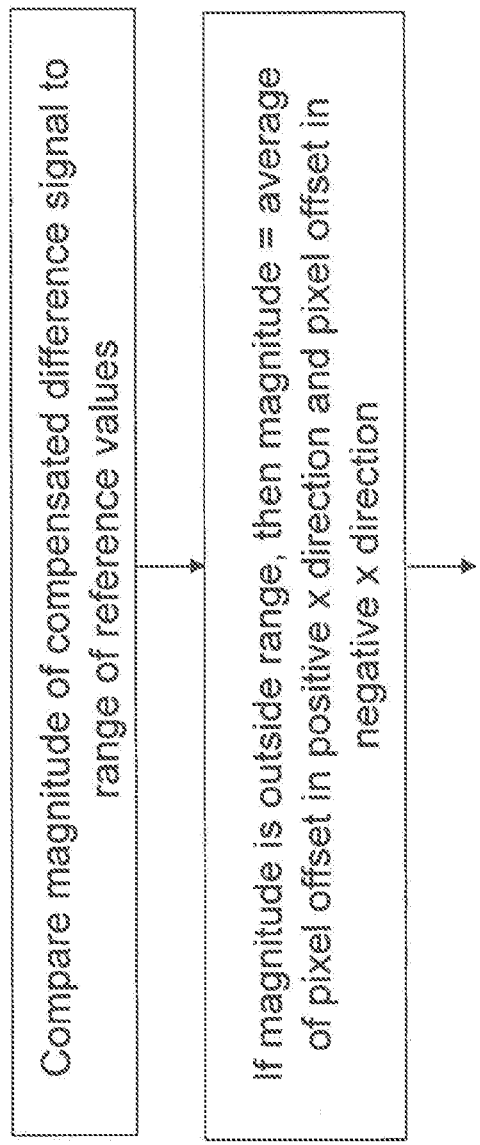
Figure 111E:
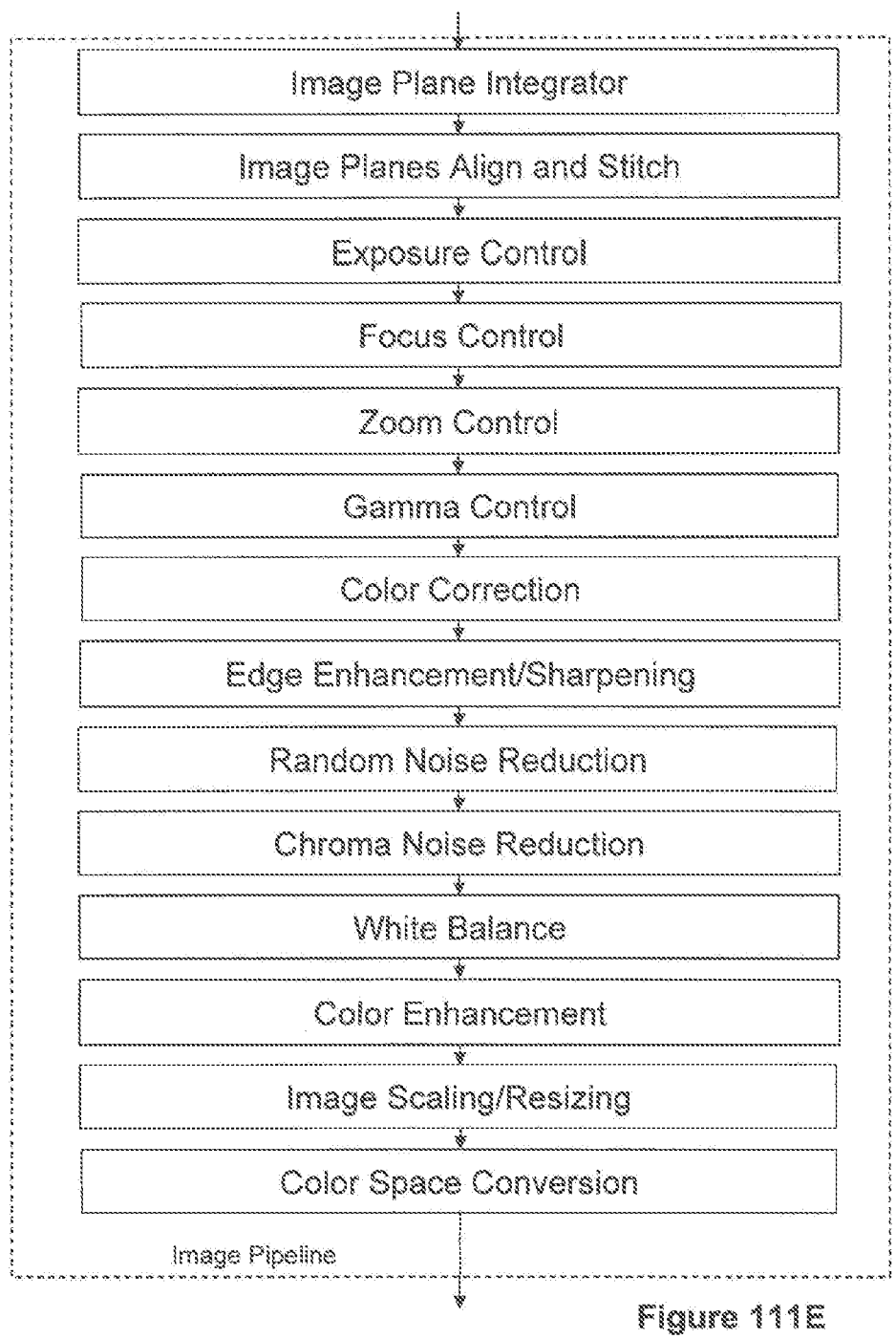
Figure 111H:
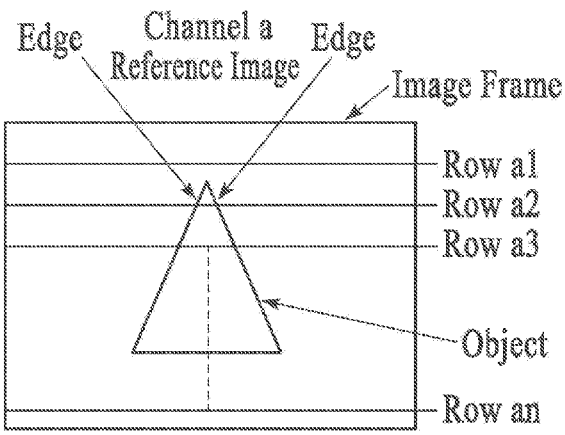
Figure 111I:
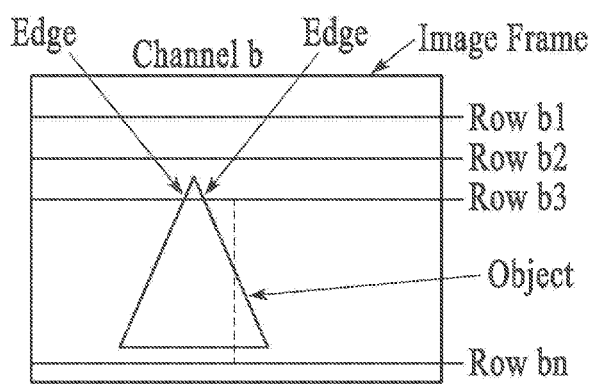
Figure 111J:
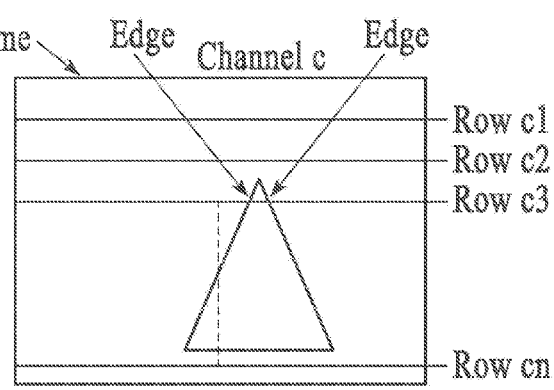
Figure 111K:
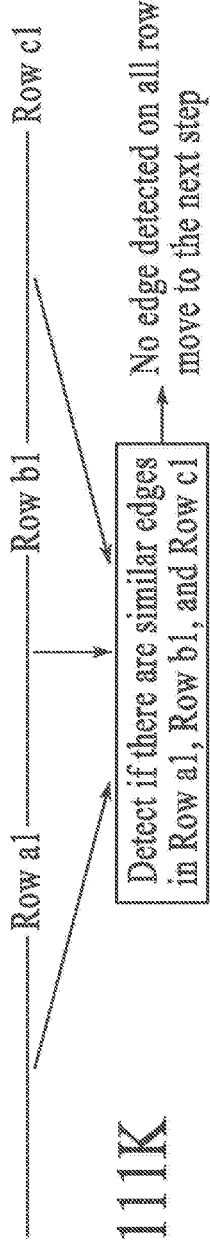
Figure 111L:
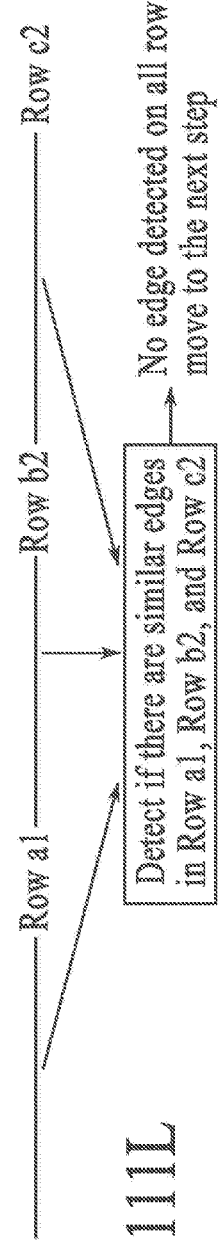
Figure 111M:
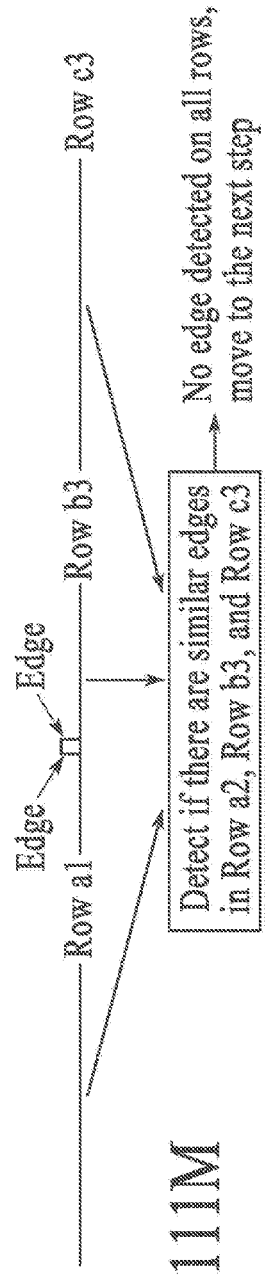
Figure 111R:
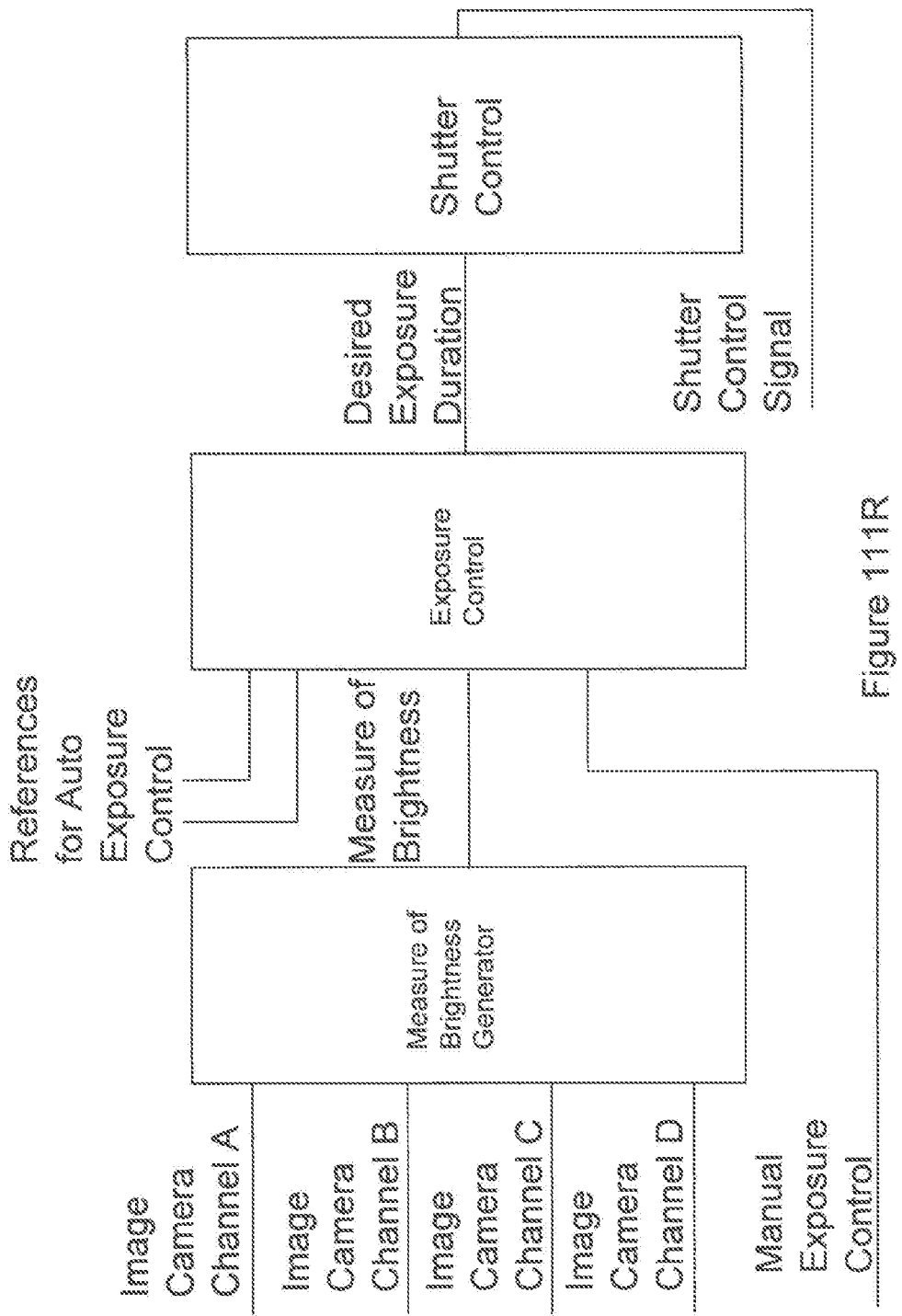
Figure 111S:
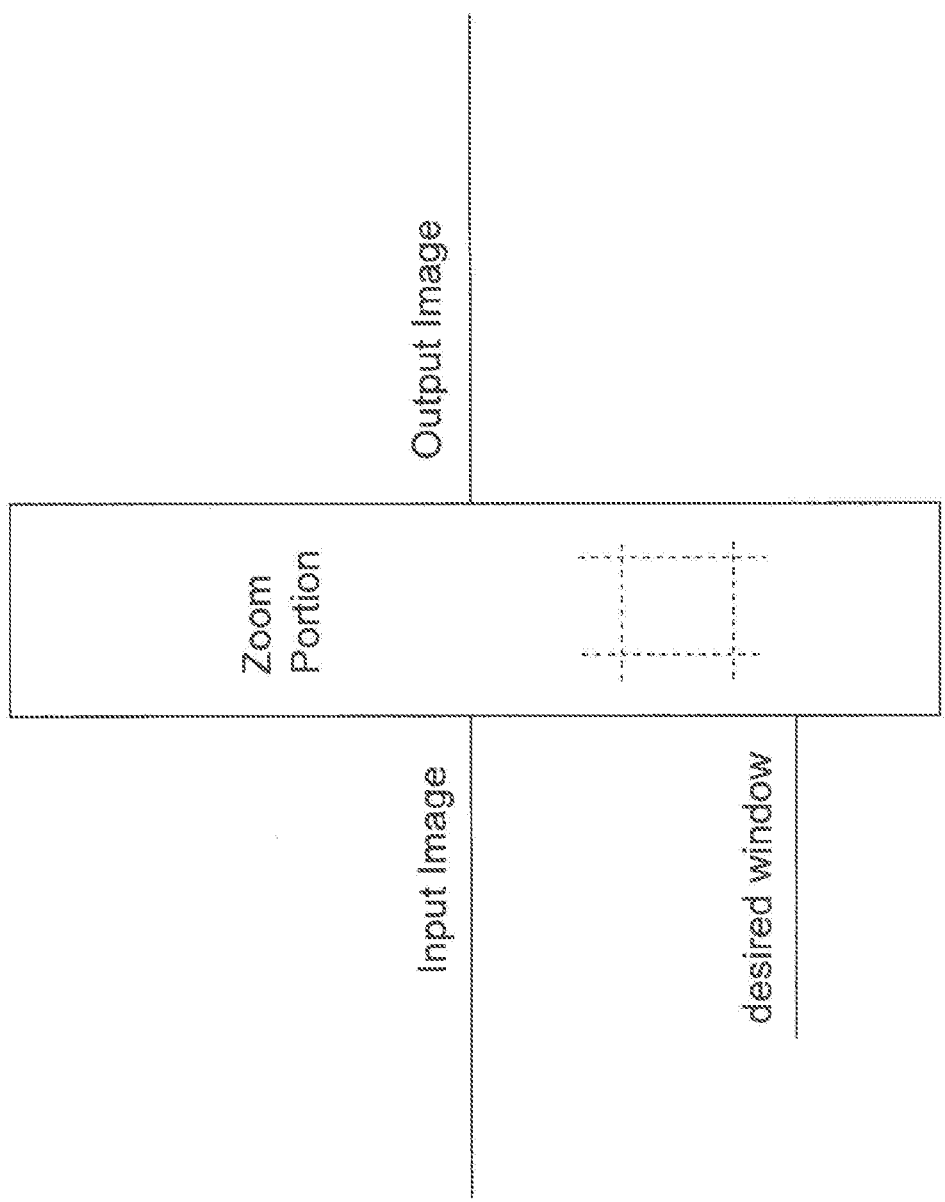
Figure 111T:
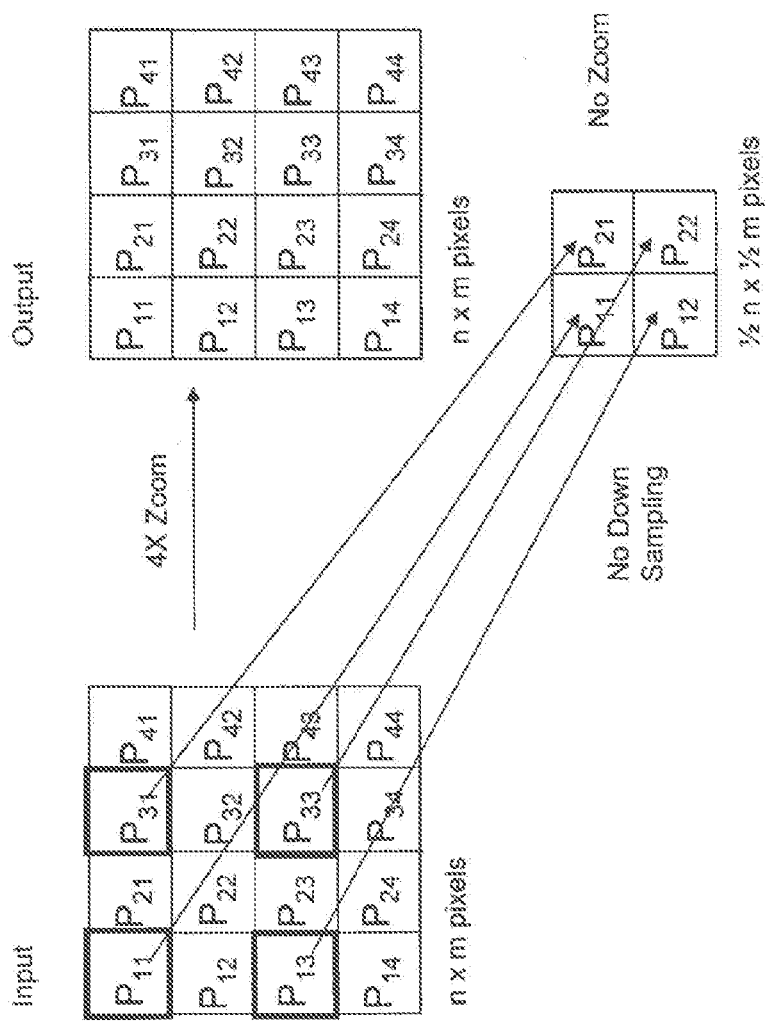
Figure 111U:
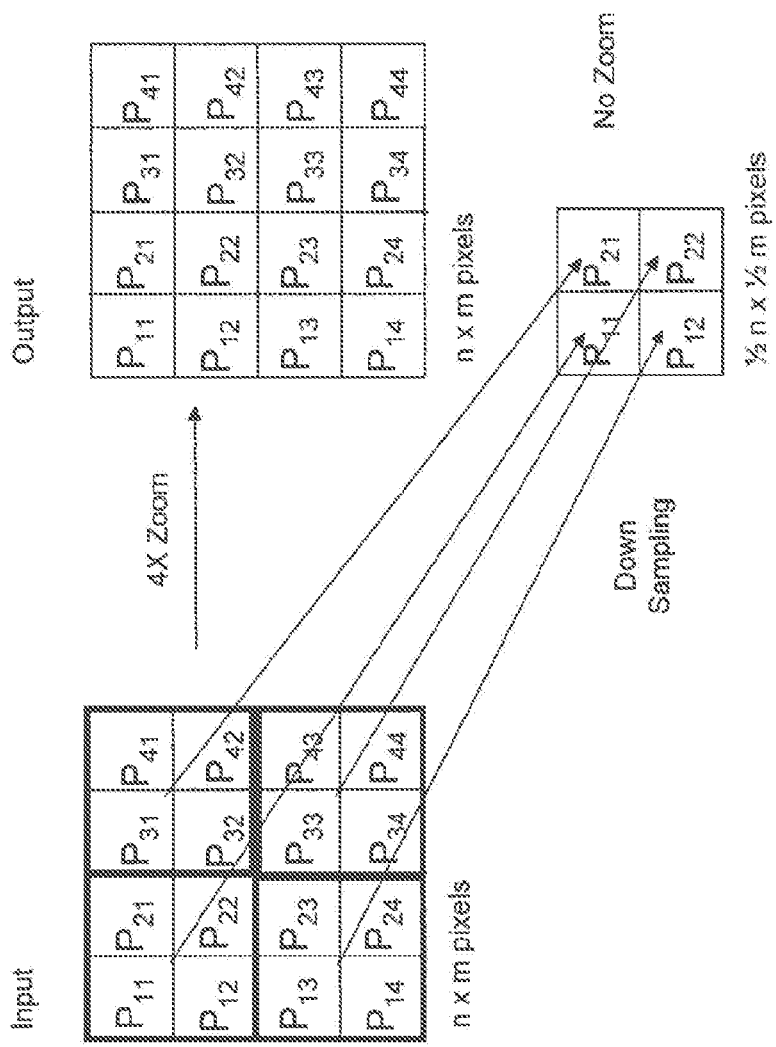
Figure 111W:
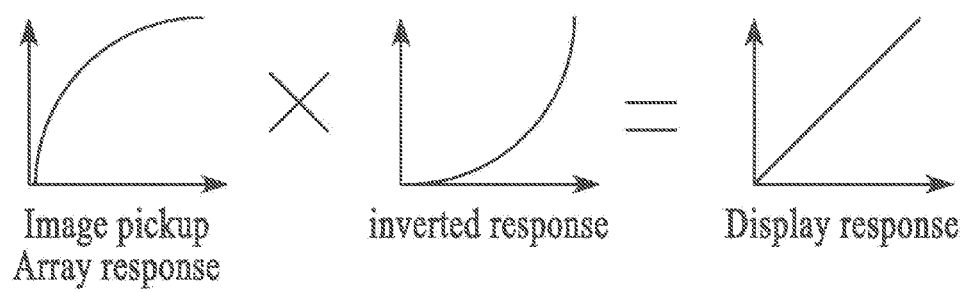
Figure 111X:
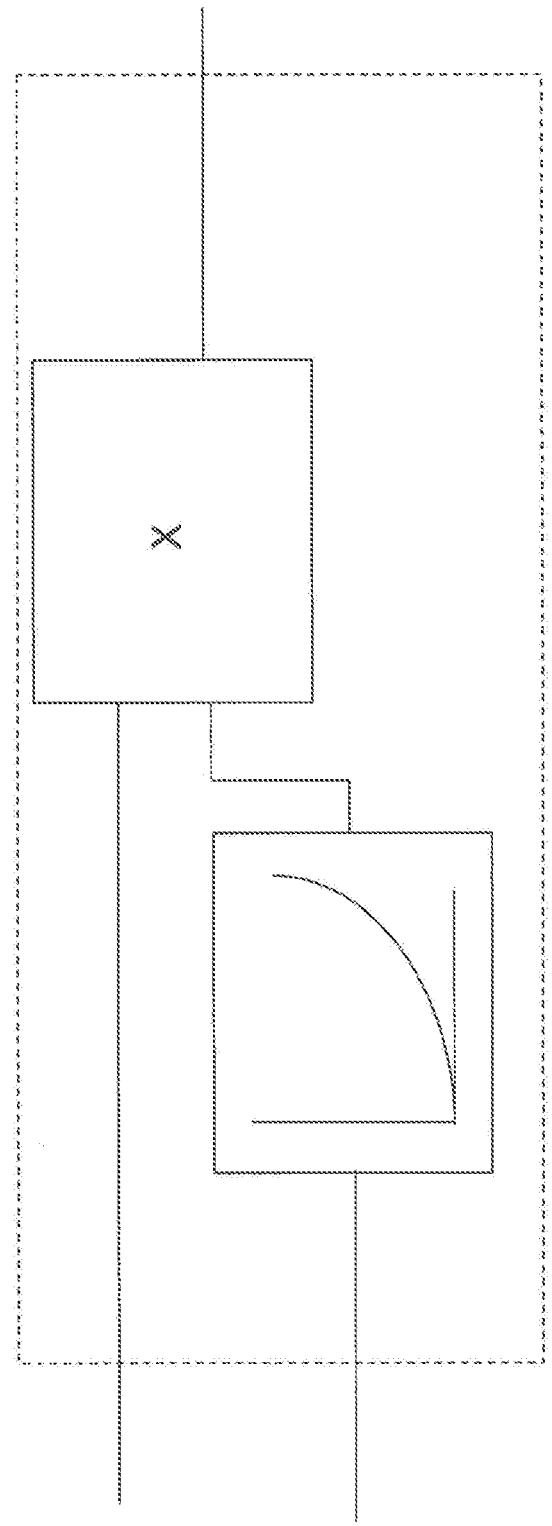
Figure 111Y:
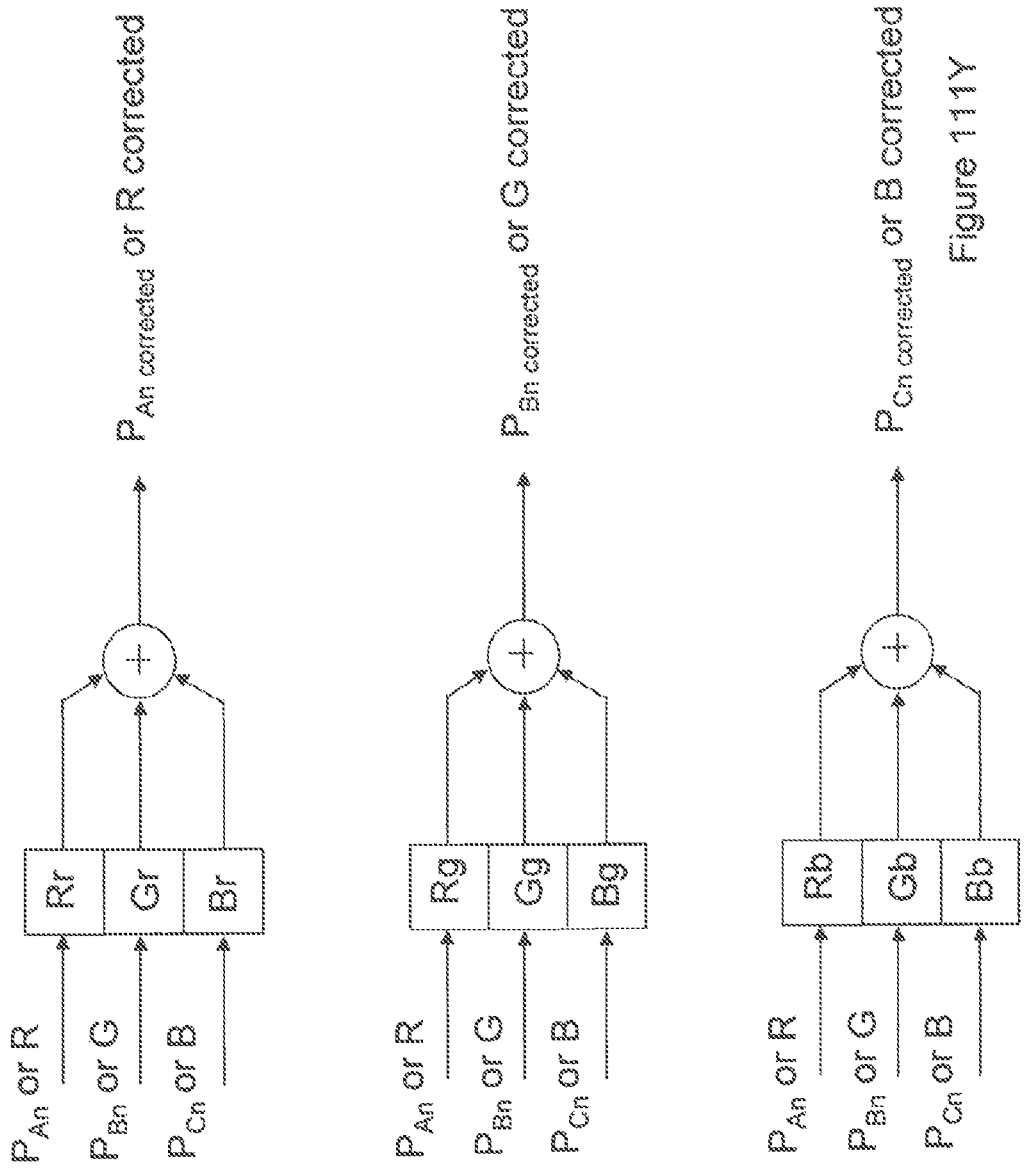
Figure 111Z:
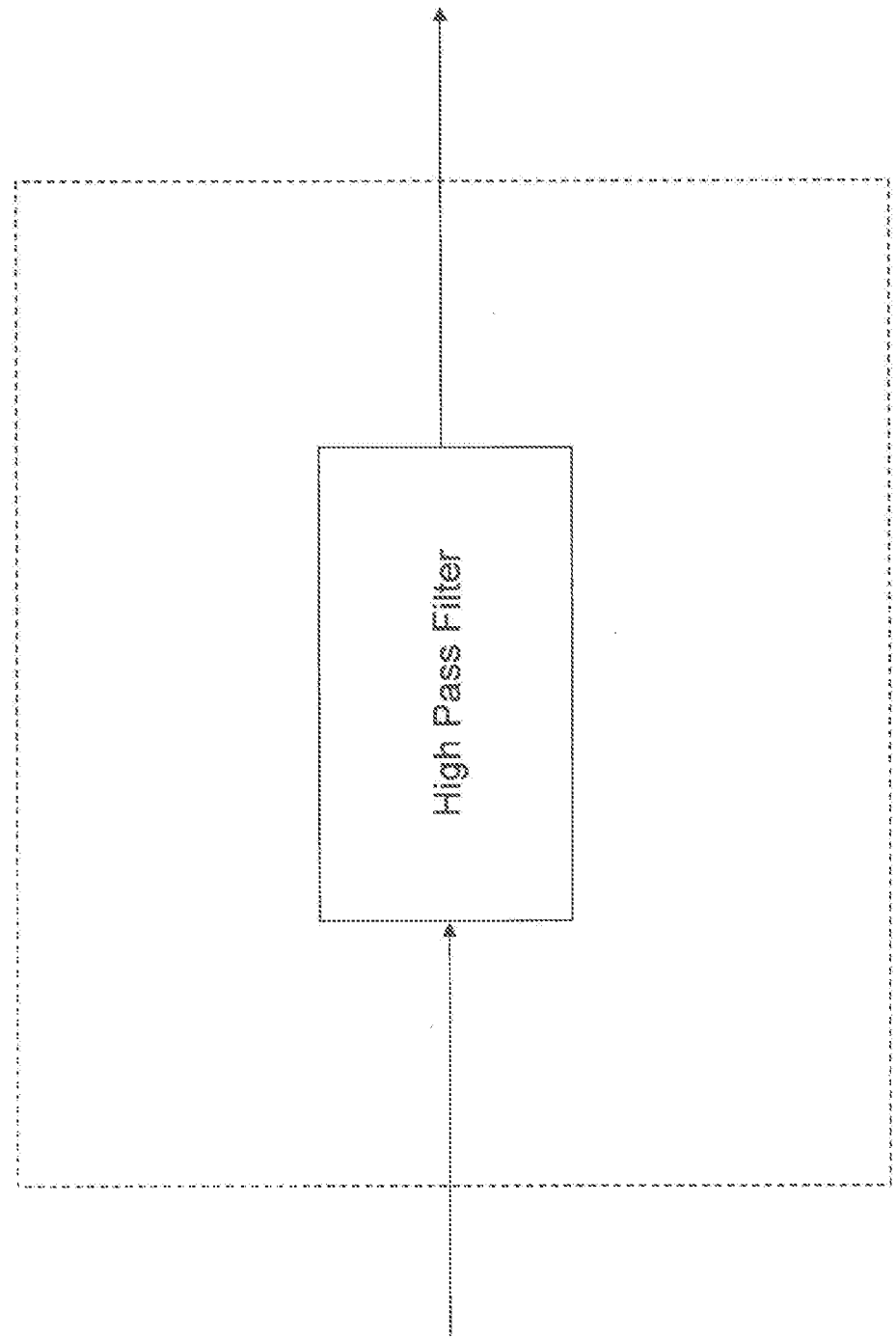
Figure 111A:
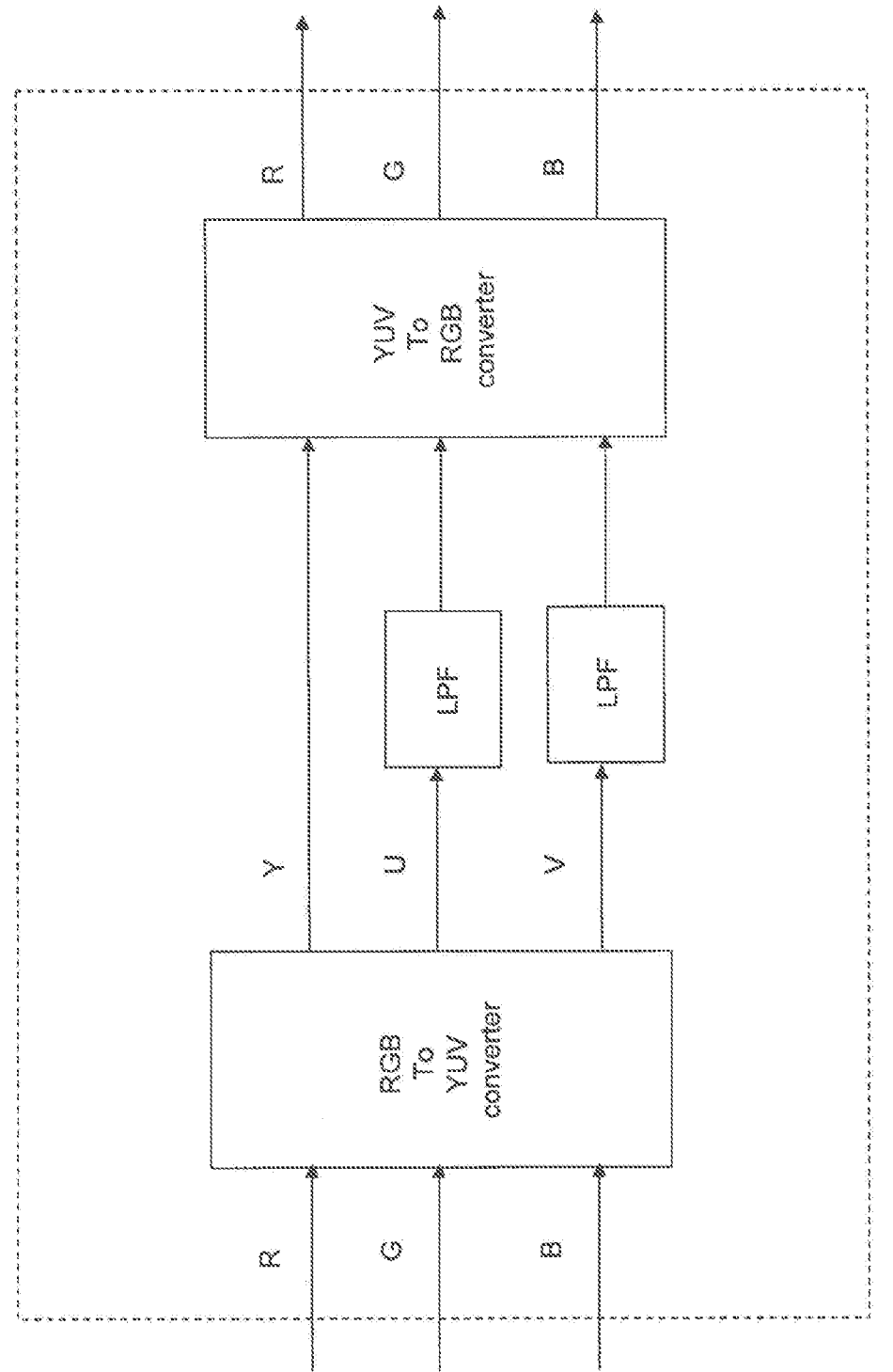
Figure 111A:
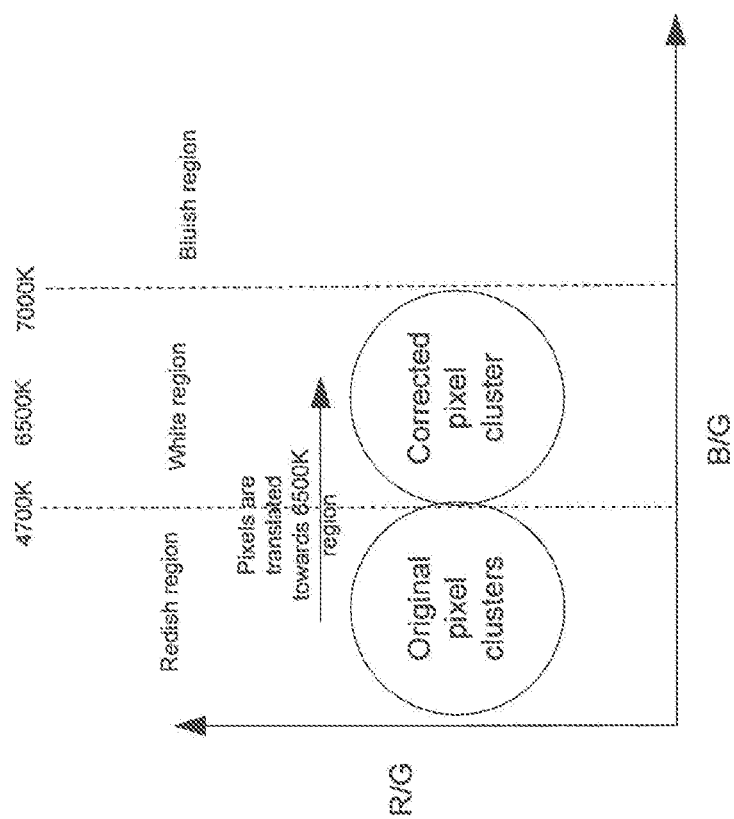
Figure 111A:
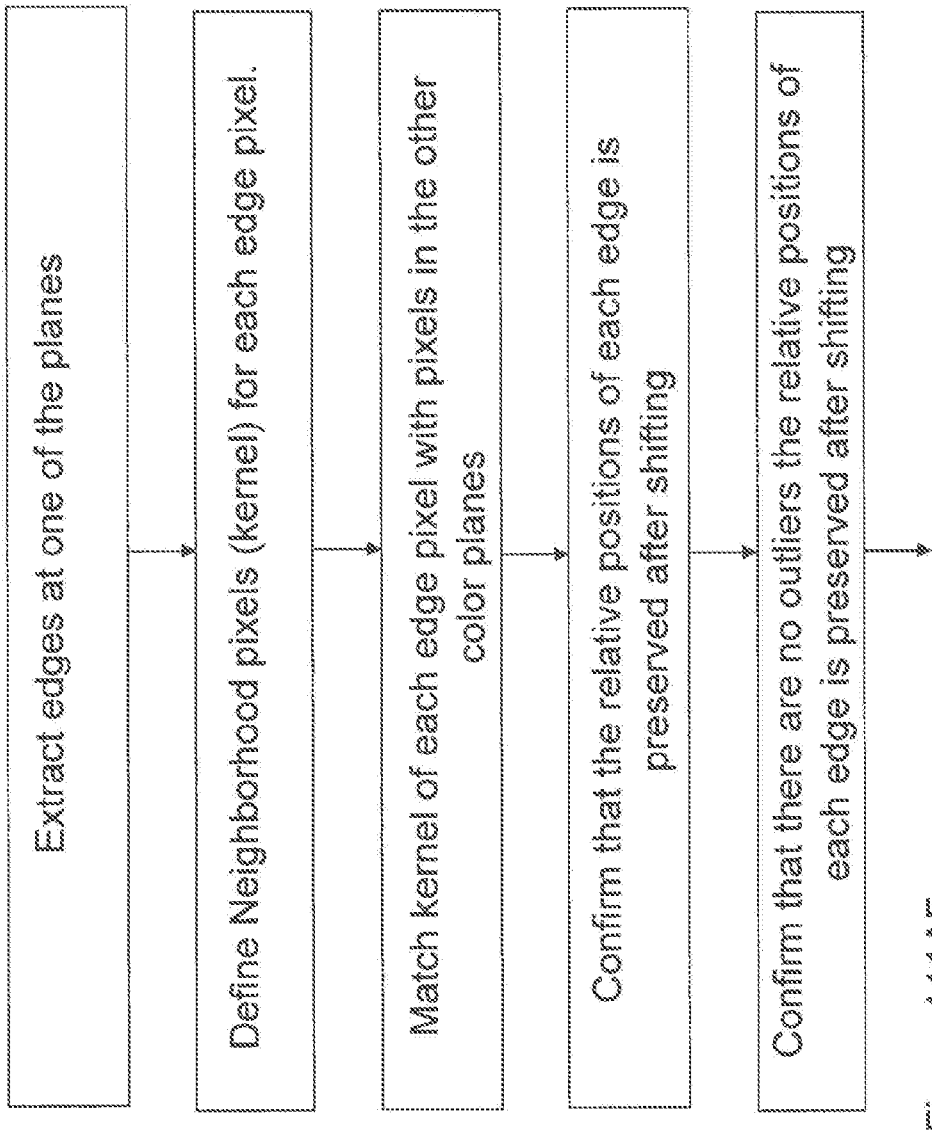
Figure 112:
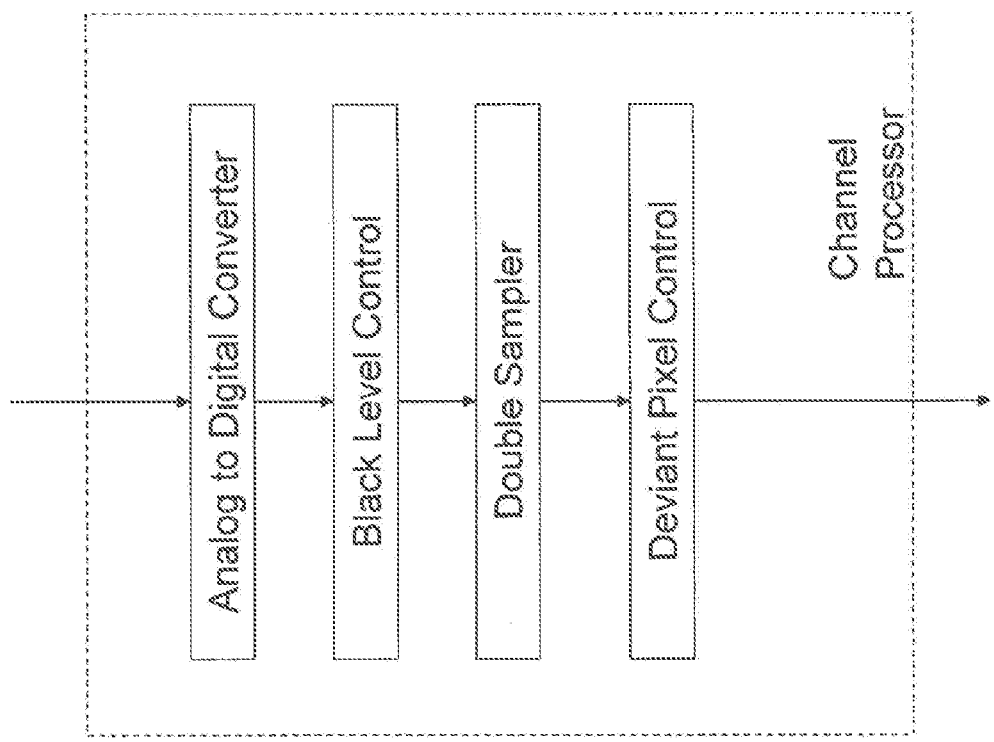
Figure 113:
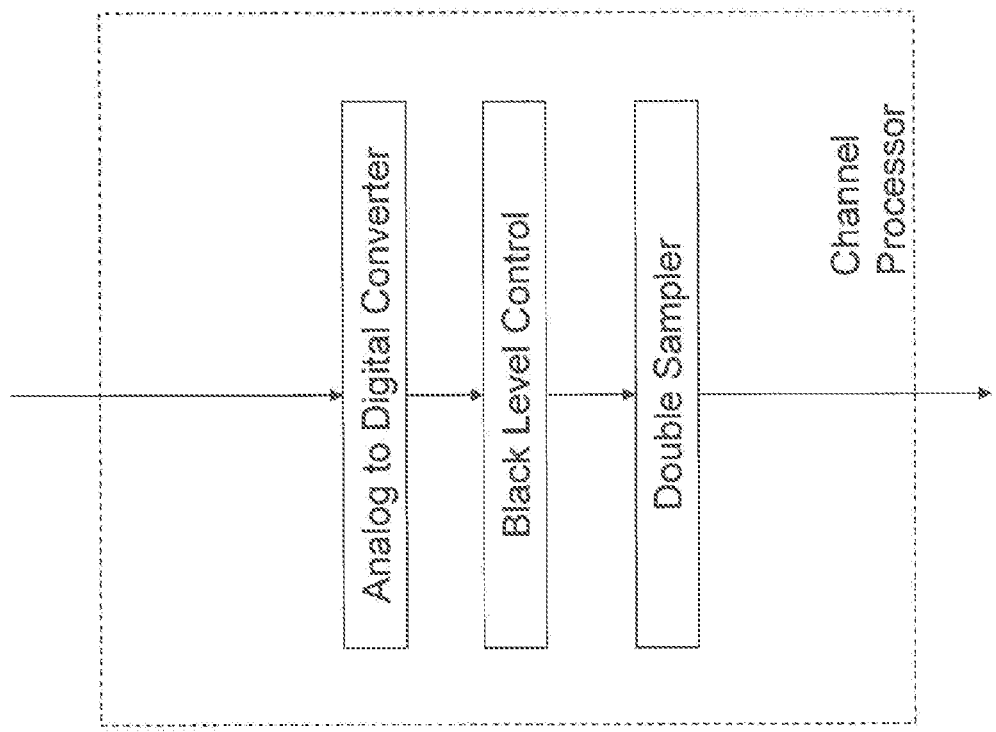
Figure 114A:
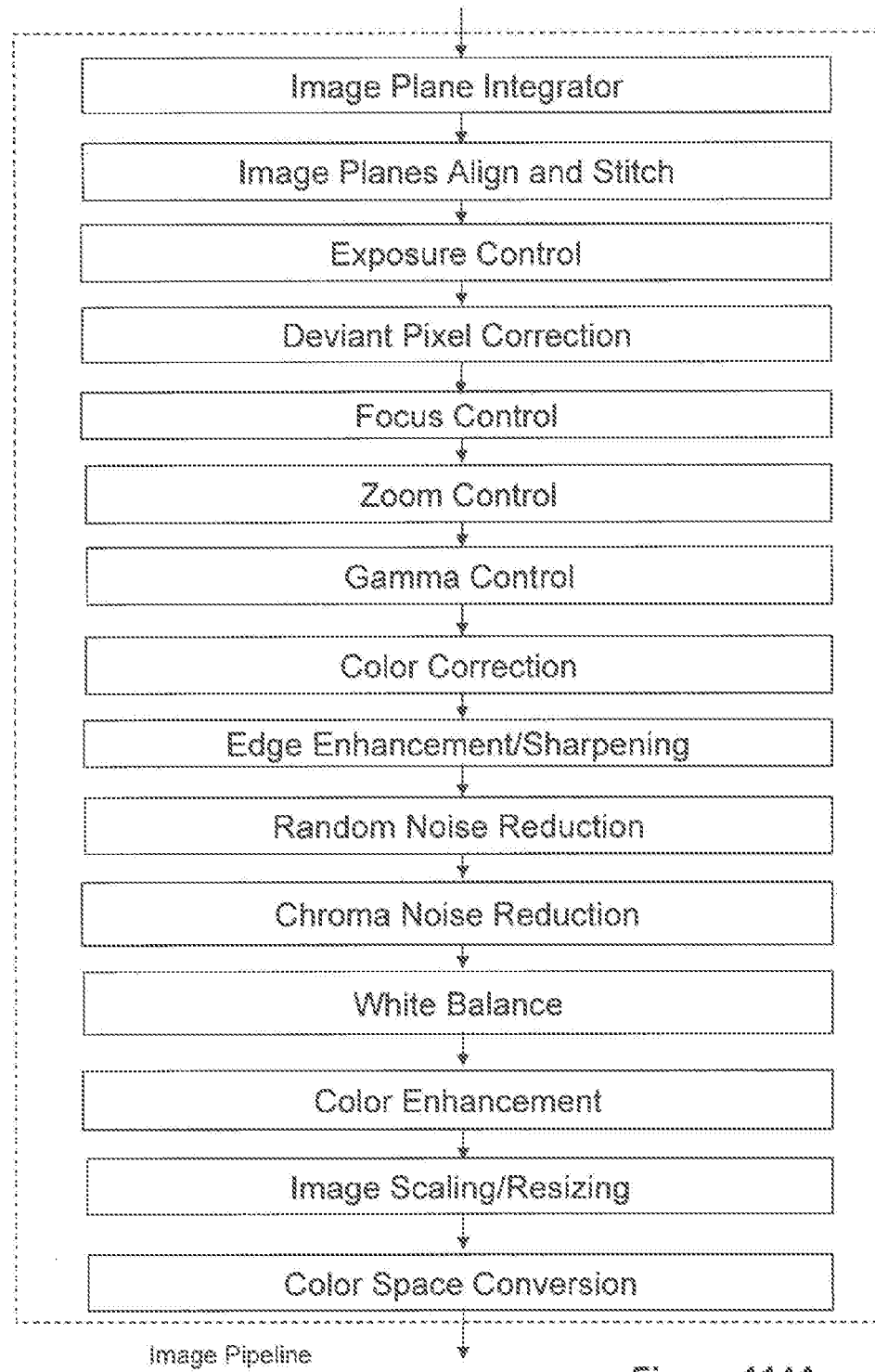
Figure 114B:
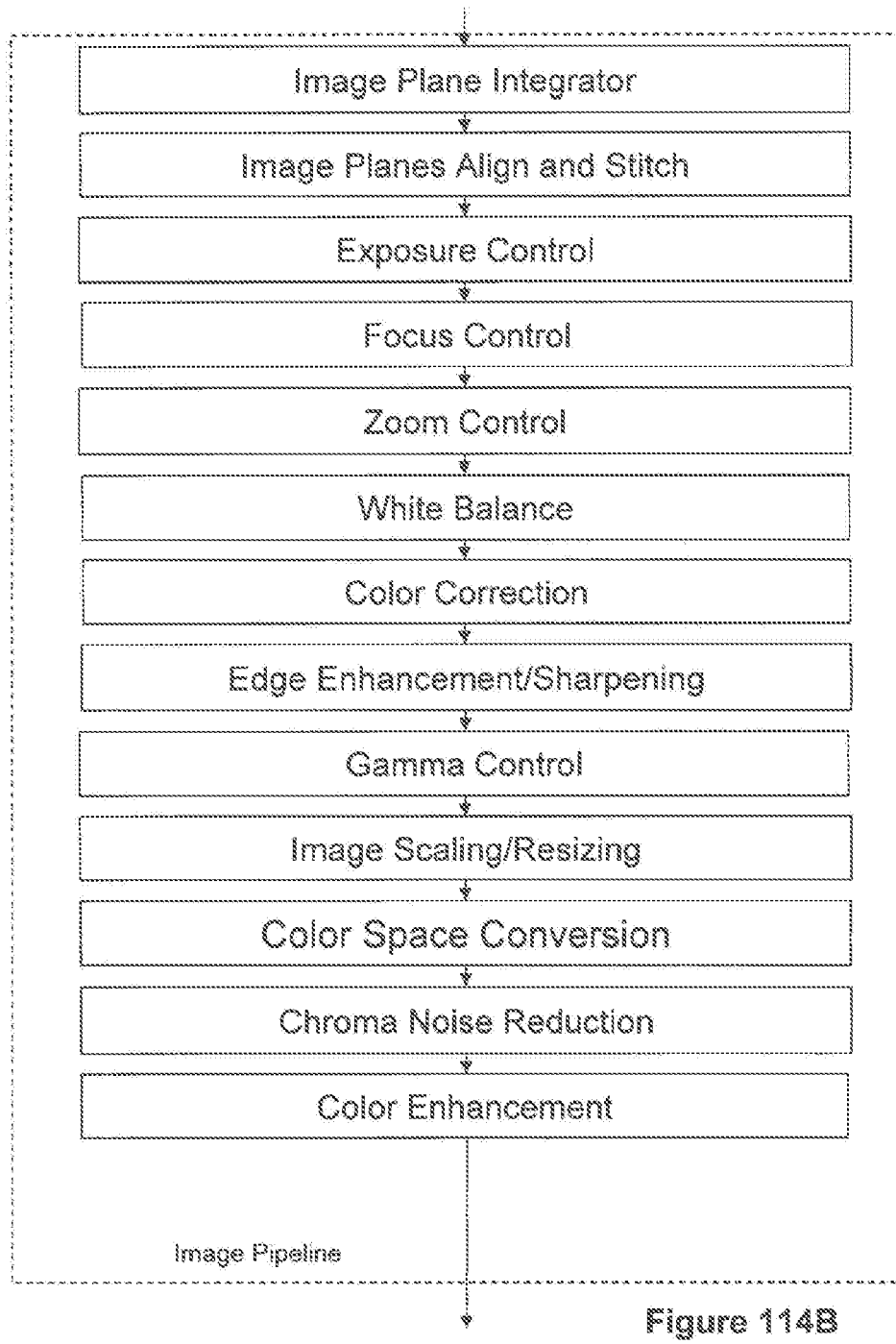
Figure 114C:
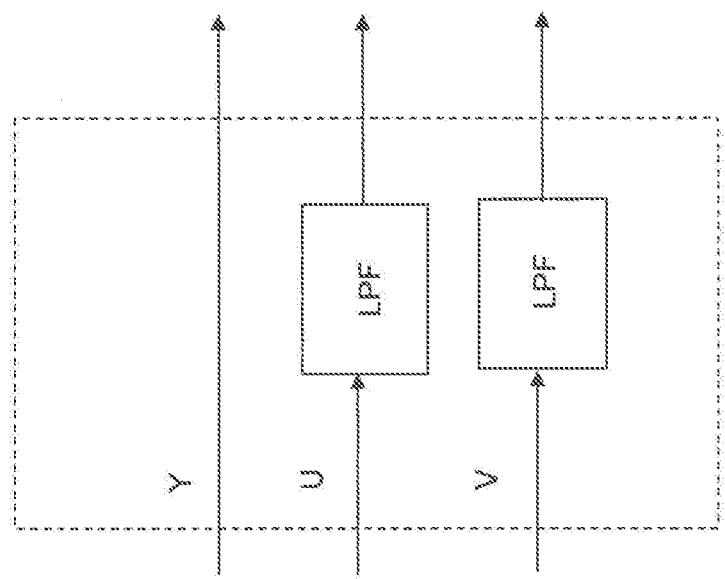
Figure 115F:
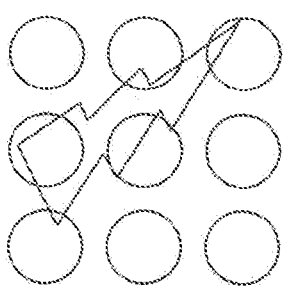
Figure 115G:
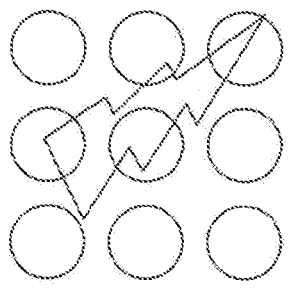
Figure 115H:
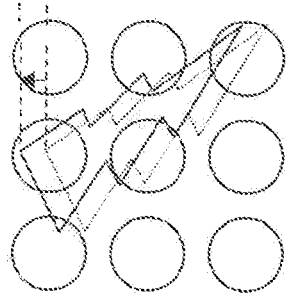
Figure 115I:
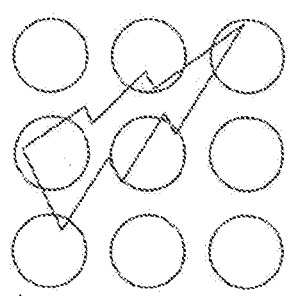
Figure 115J:
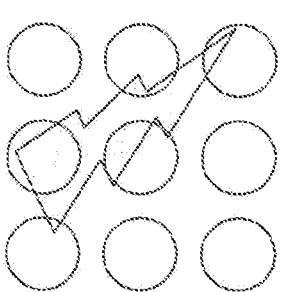
Figure 115K:
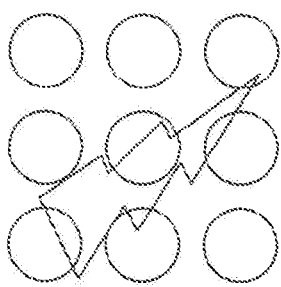
Figure 115L:
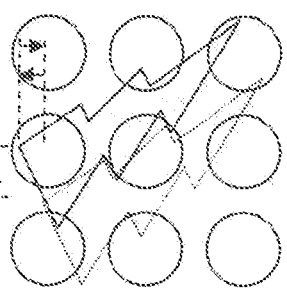
Figure 115M:
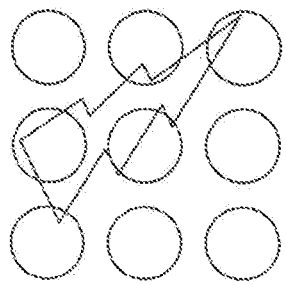
Figure 116:
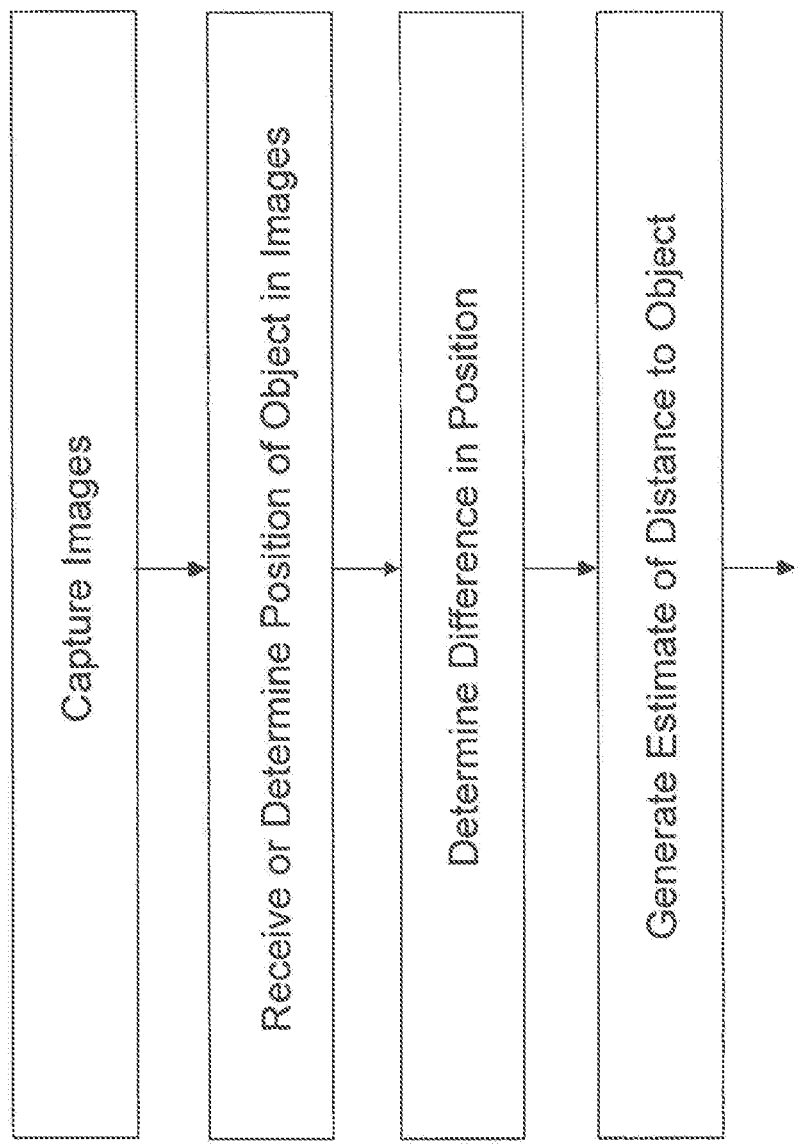

FIG. 111C shows a flowchart of operations employed in one embodiment of a double sampler;

FIG. 111D shows a flowchart of operations employed in one embodiment of a defective pixel identifier;

FIG. 111E is a block diagram of an image pipeline in accordance with another embodiment of the present invention;

FIG. 111F is a schematic diagram of an image plane integrator, in accordance with one embodiment of the present invention;

FIG. 111G is an explanatory representation of a multi-phase clock that may be employed in the image plane integrator of FIG. 111G;

FIGS. 111H-111J are explanatory views showing representations of images generated by three camera channels, in accordance with one embodiment of the present invention;

FIGS. 111K-111Q are explanatory views showing a representation of a process carried out by the automatic image alignment portion for the images of FIGS. 111H-111J, in accordance with one embodiment of the present invention;

FIG. 111R is a schematic block diagram of an automatic exposure control, in accordance with one embodiment of the present invention;

FIG. 111S is a schematic block diagram of a zoom controller, in accordance with one embodiment of the present invention;

FIGS. 111T-111V are explanatory views of a process carried out by the zoom controller of FIG. 111S, in accordance with one embodiment of the present invention;

FIG. 111W is a graphical representation showing an example of the operation of a gamma correction portion, in accordance with one embodiment of the present invention FIG. 111X is a schematic block diagram of a gamma correction portion employed in accordance with one embodiment of the present invention;

FIG. 111Y is a schematic block diagram of a color correction portion, in accordance with one embodiment of the present invention;

FIG. 111Z is a schematic block diagram of an edge enhancer/sharpener, in accordance with one embodiment of the present invention;

FIG. 111AA is a schematic block diagram of a chroma noise reduction portion in accordance with one embodiment of the present invention;

FIG. 111AB is an explanatory view showing a representation of a process carried out by a white balance portion, in accordance with one embodiment of the present invention;

FIG. 111AC is a schematic block diagram of a color enhancement portion, in accordance with one embodiment of the present invention;

FIG. 111AD is a schematic block diagram of a scaling portion, in accordance with one embodiment of the present invention;

FIG. 111AE is an explanatory view, showing a representation of upscaling, in accordance with one embodiment;

FIG. 111AF is a flowchart of operations that may be employed in the alignment portion, in accordance with another embodiment of the present invention;

FIG. 112 is a block diagram of a channel processor in accordance with another embodiment of the present invention;

FIG. 113 is a block diagram of a channel processor in accordance with another embodiment of the present invention;

FIG. 114A is a block diagram of an image pipeline in accordance with another embodiment of the present invention;

FIG. 114B is a block diagram of an image pipeline in accordance with another embodiment of the present invention;

FIG. 114C is a schematic block diagram of a chroma noise reduction portion in accordance with another embodiment of the present invention FIGS. 115A-115L are explanatory views showing examples of parallax;

FIG. 115M is an explanatory view showing an image viewed by a first camera channel superimposed with an image viewed by a second camera channel if parallax is eliminated, in accordance with one embodiment of the present invention;

FIGS. 115N-115R are explanatory representations showing examples of decreasing the parallax;

FIGS. 115S-115W are explanatory views showing examples of increasing the parallax;

FIG. 116 shows a flowchart of operations that may be employed in generating an estimate of a distance to an object, or portion thereof, according to one embodiment of the present invention.

Figure 117:
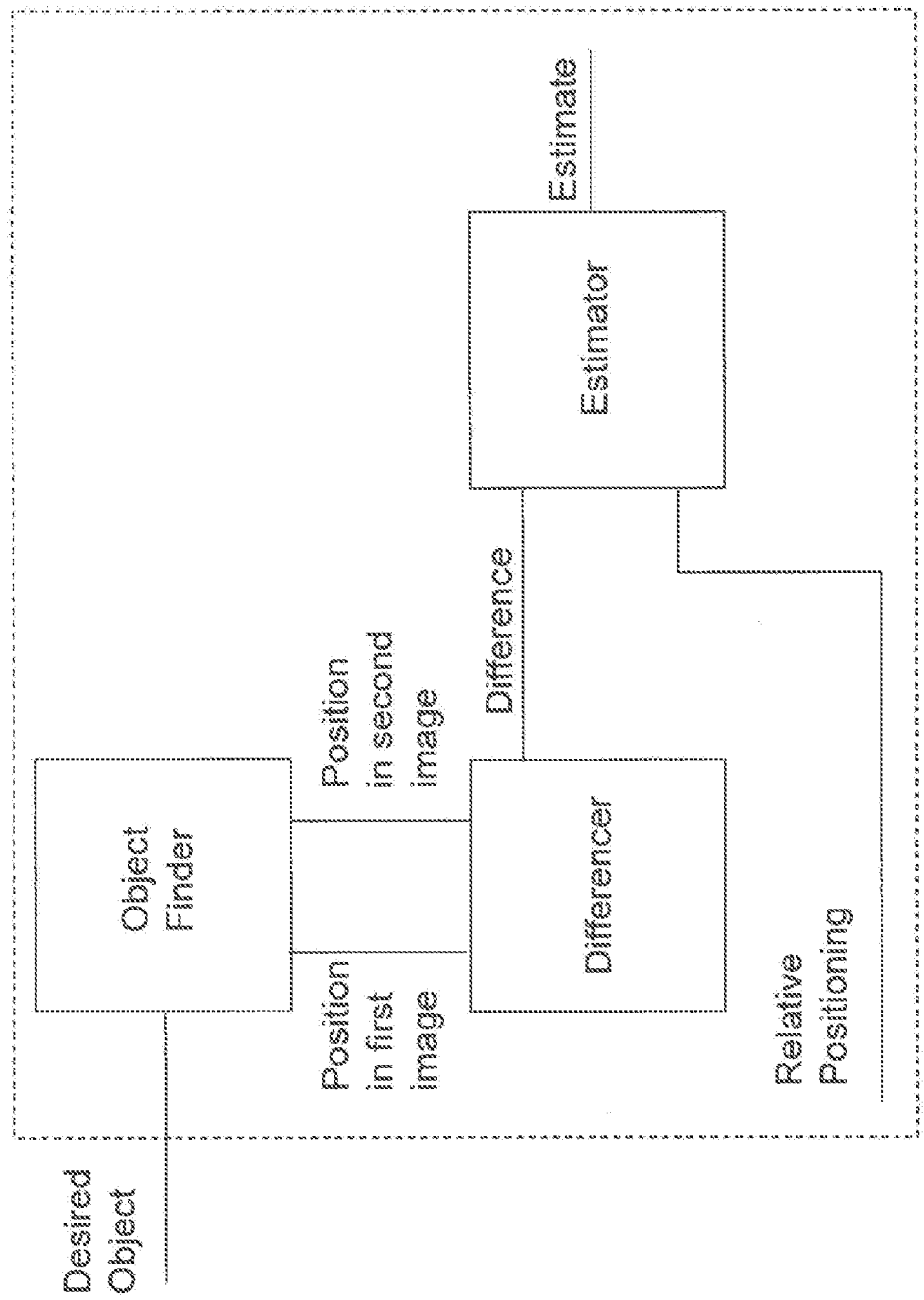
Figure 118:
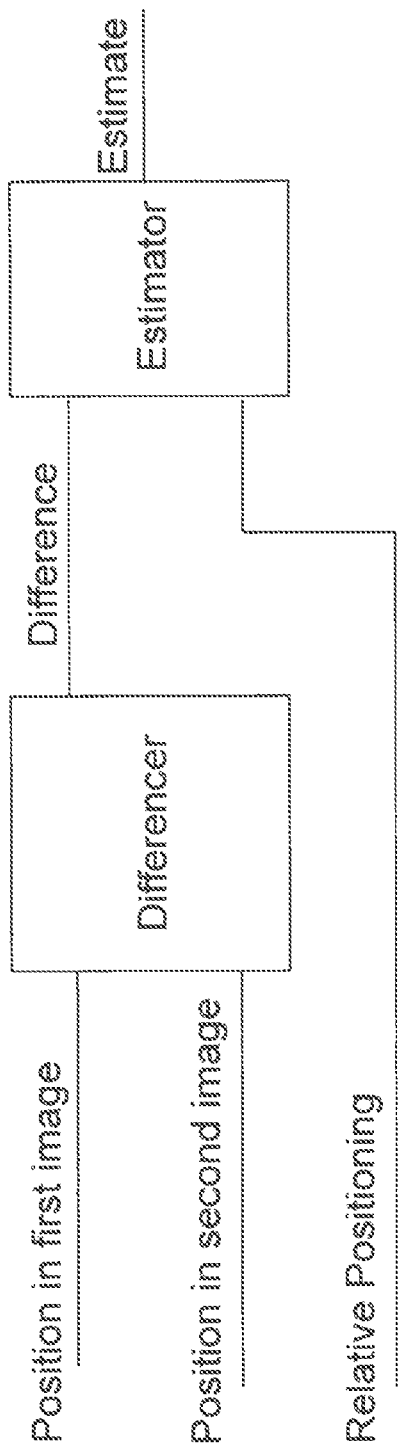
Figure 121:
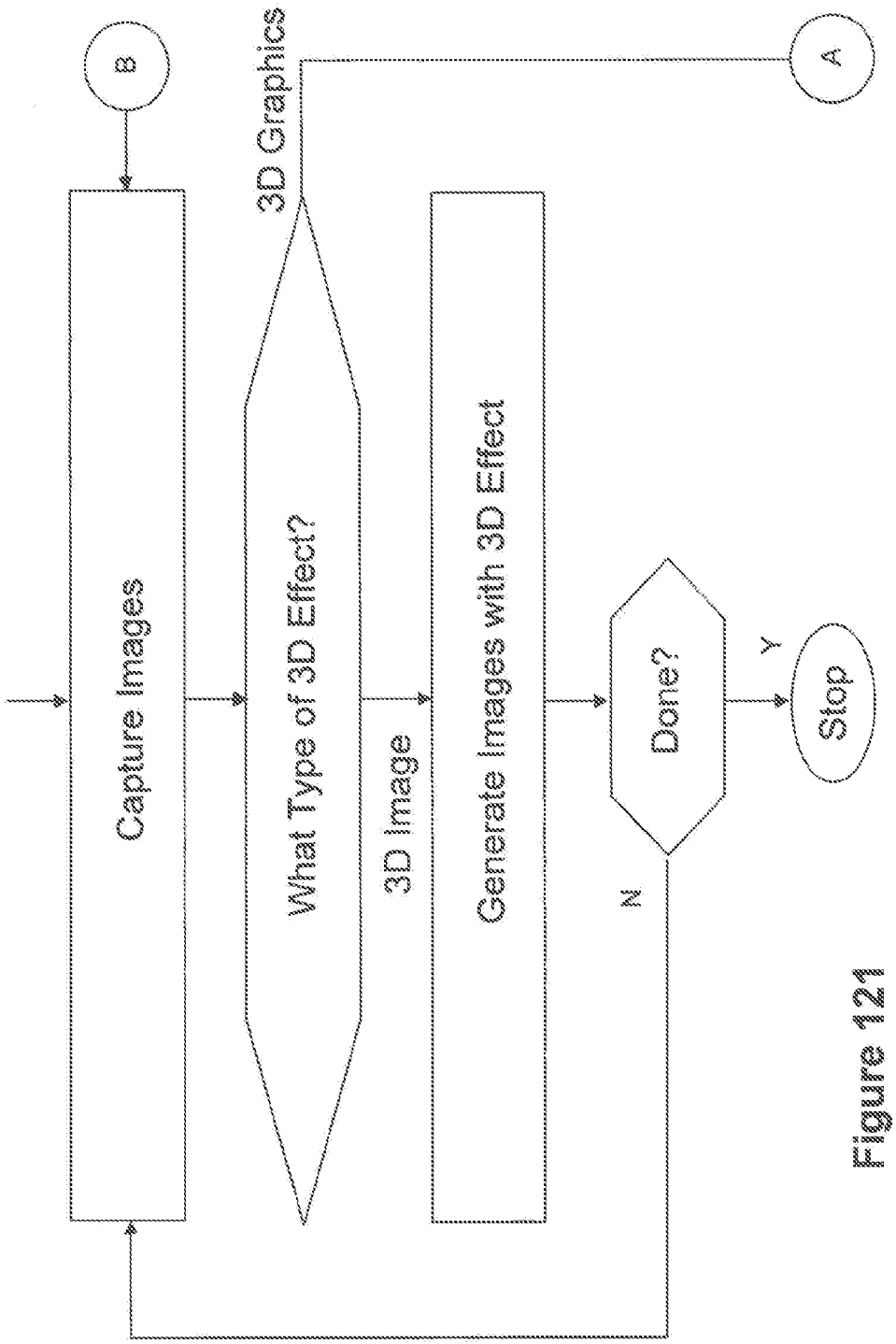
Figure 122:
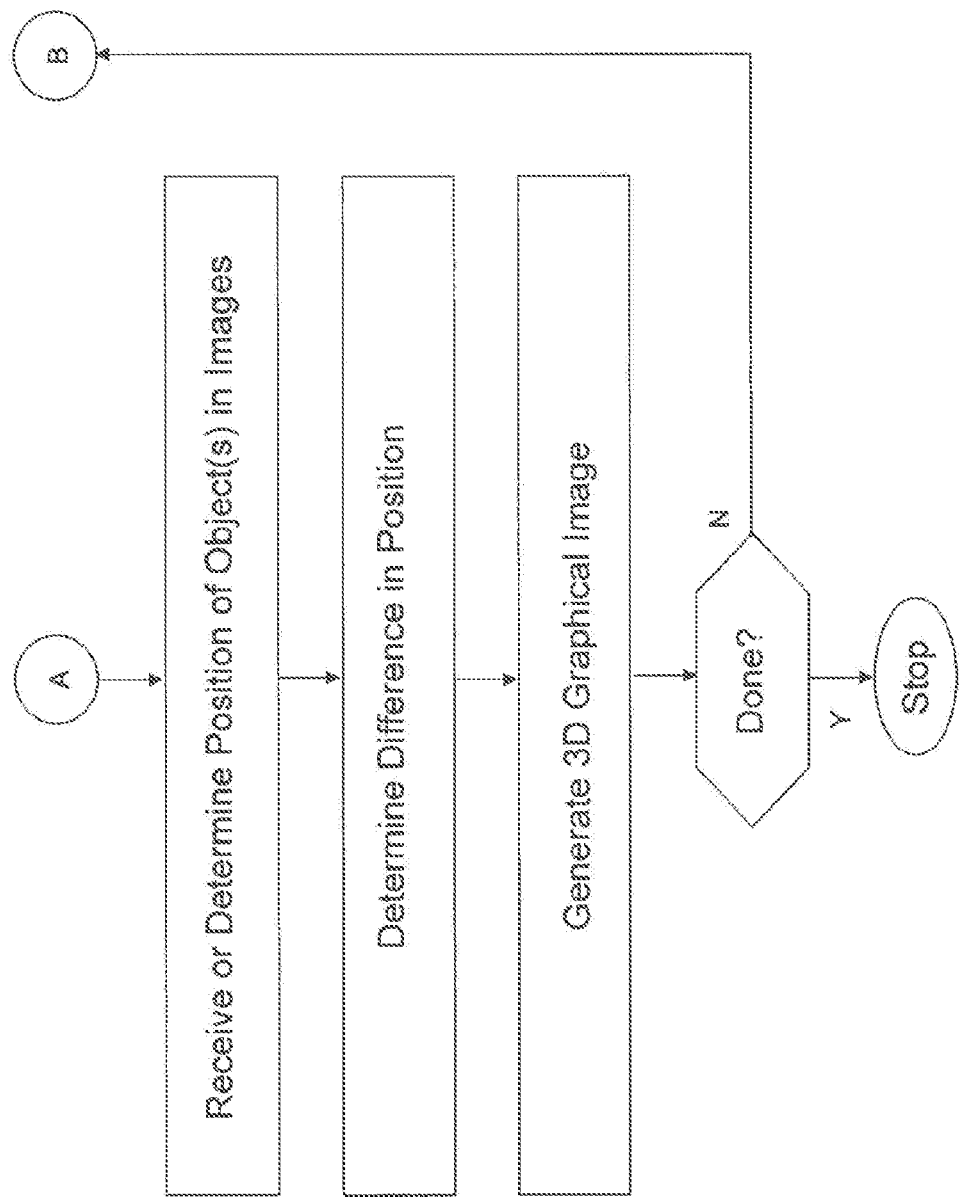
Figure 123:
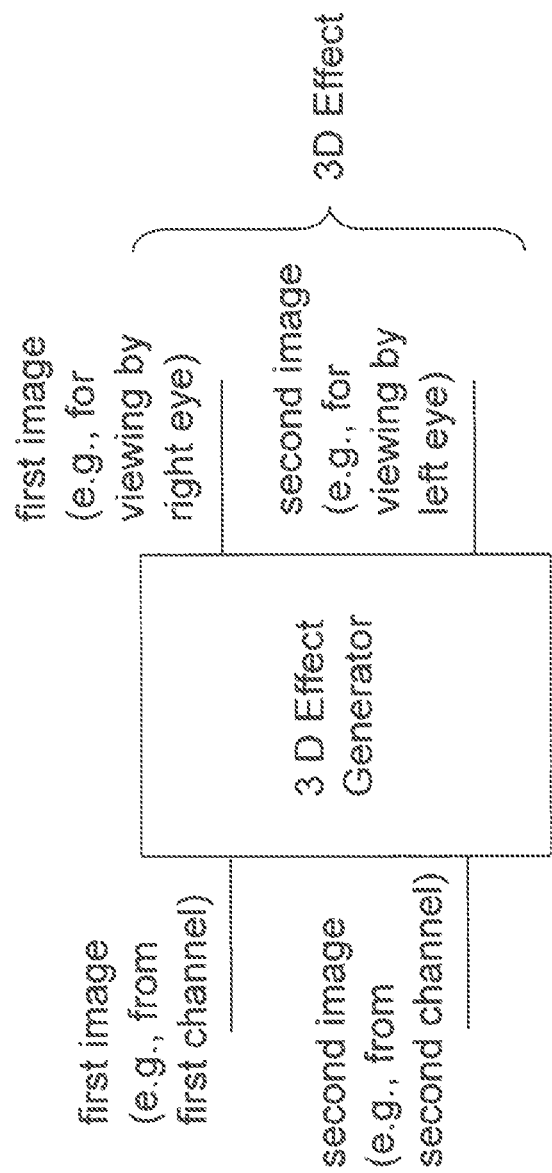
Figure 124:
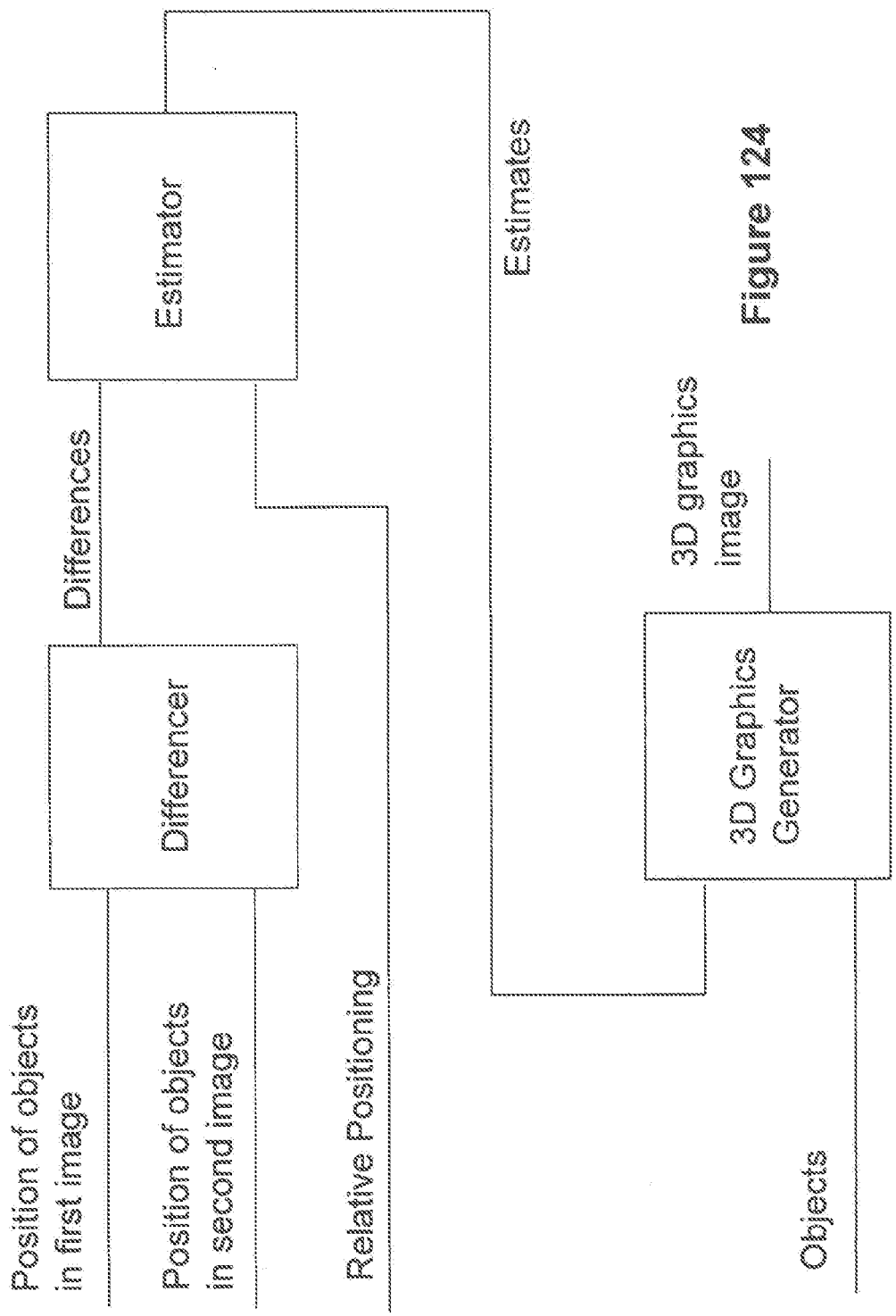
Figure 125:
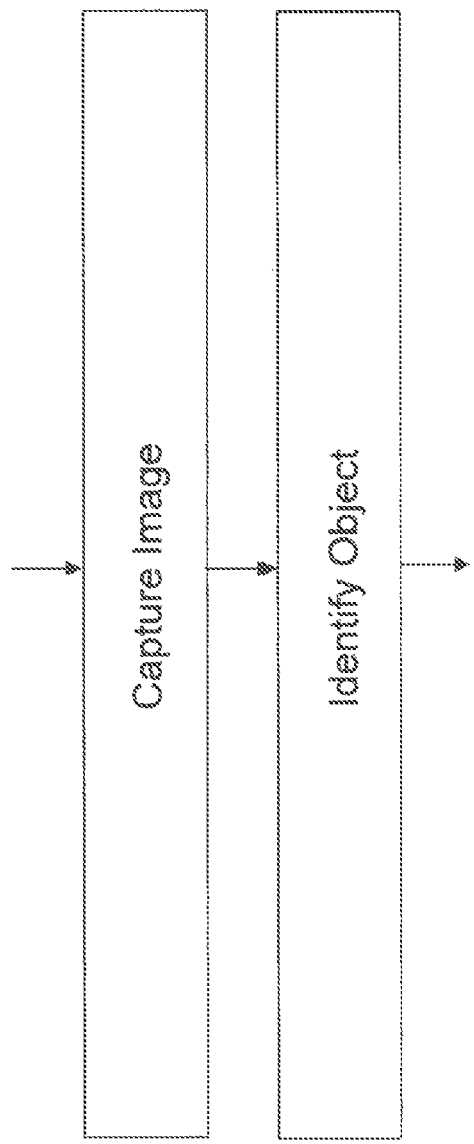
Figure 126A:
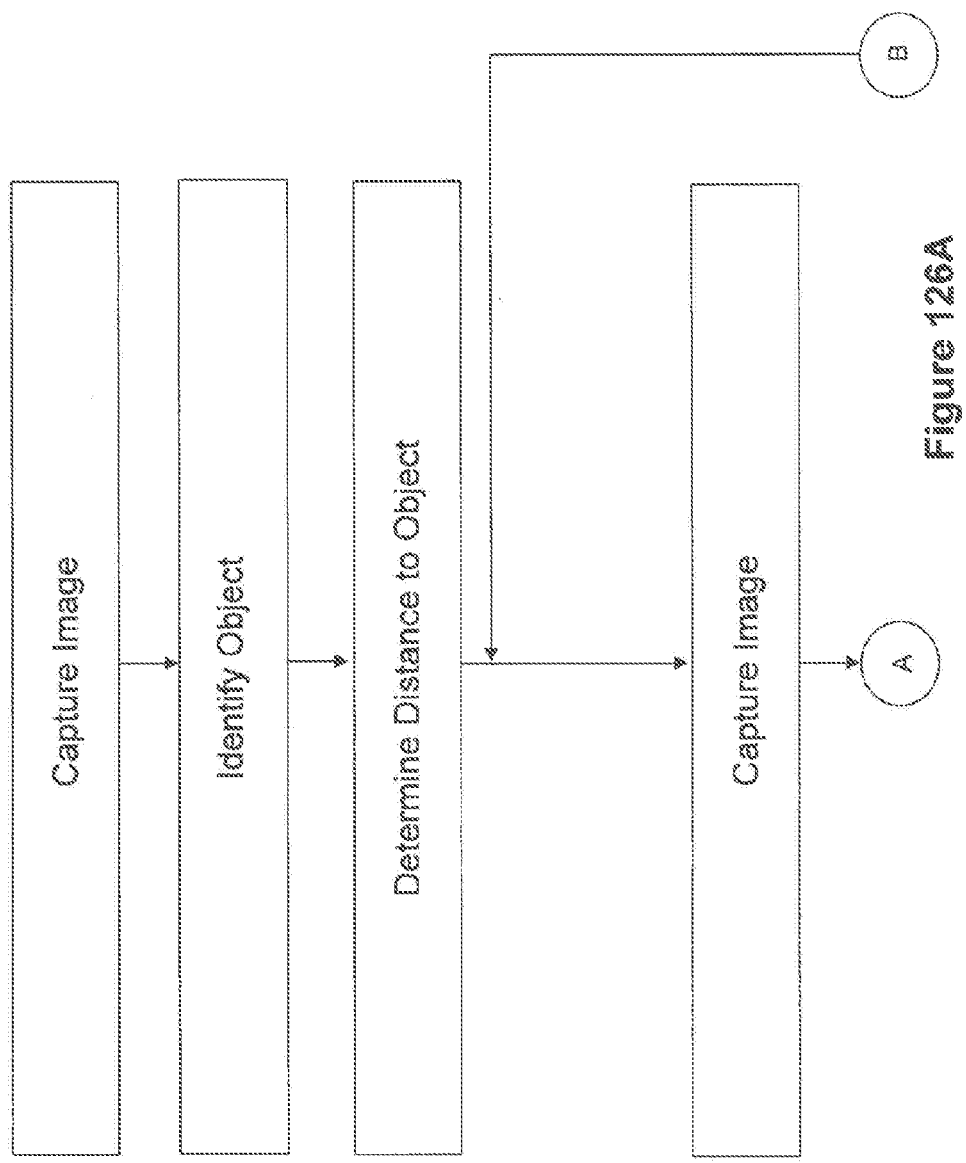
Figure 127:
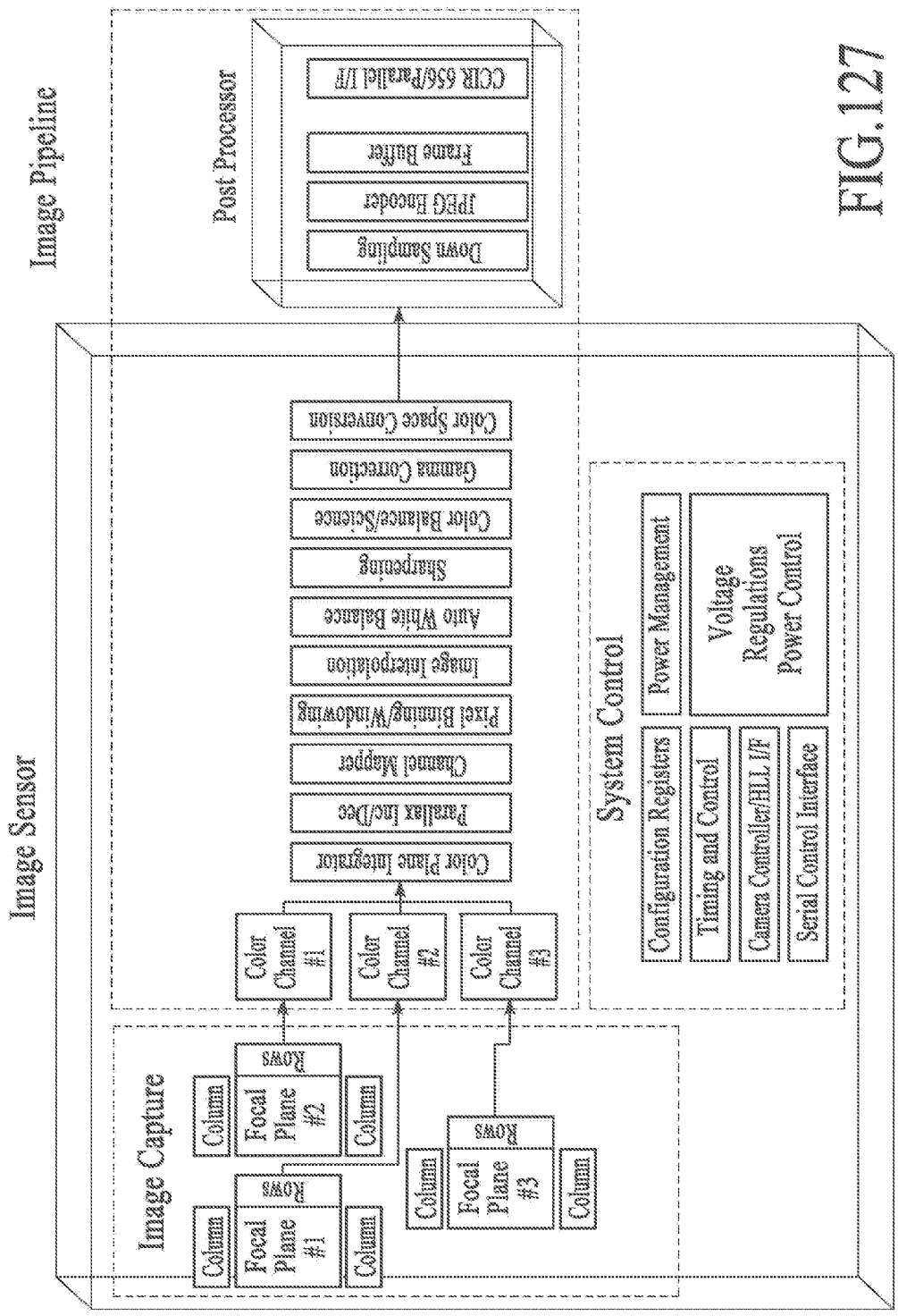
Figure 128:
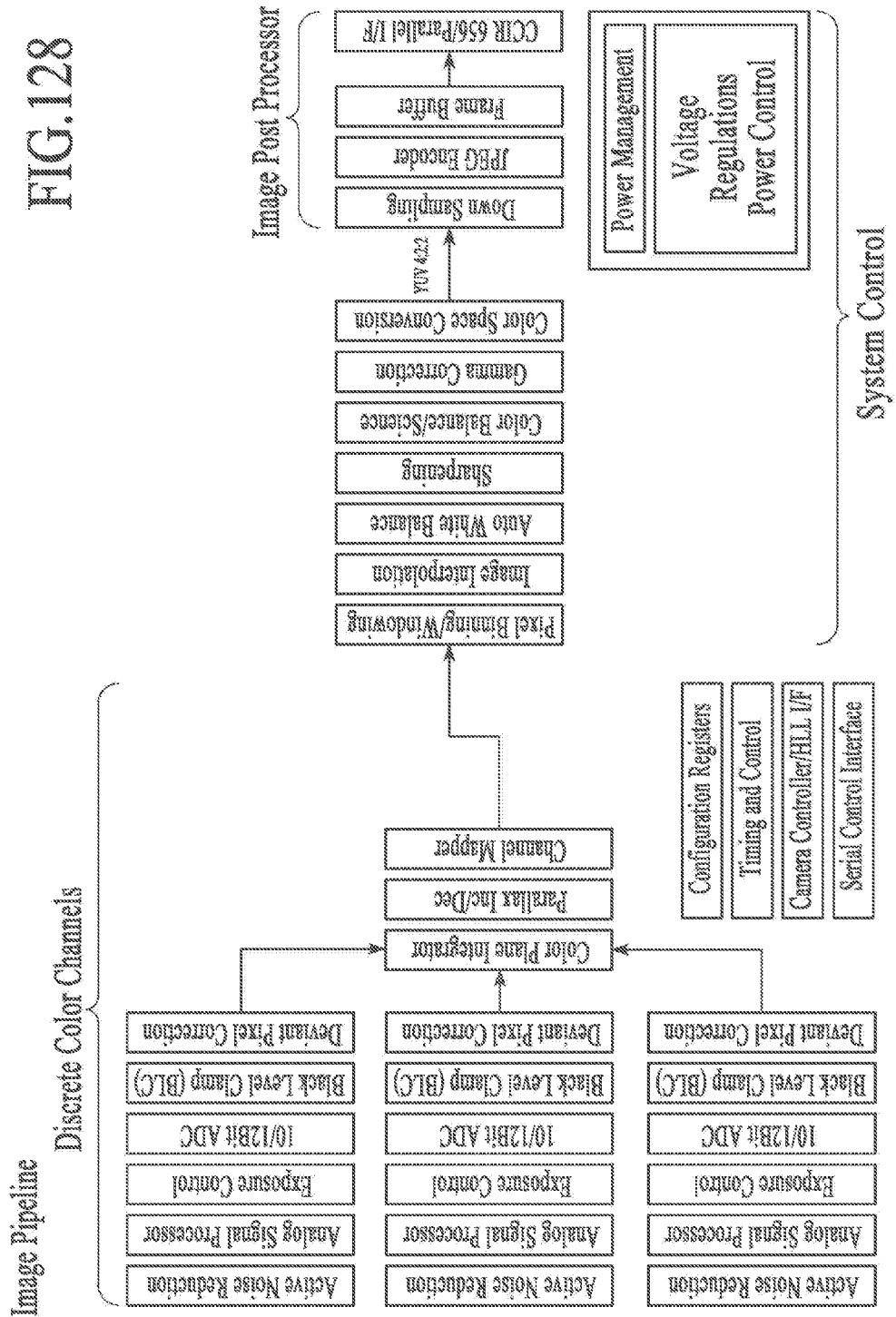
Figure 129:
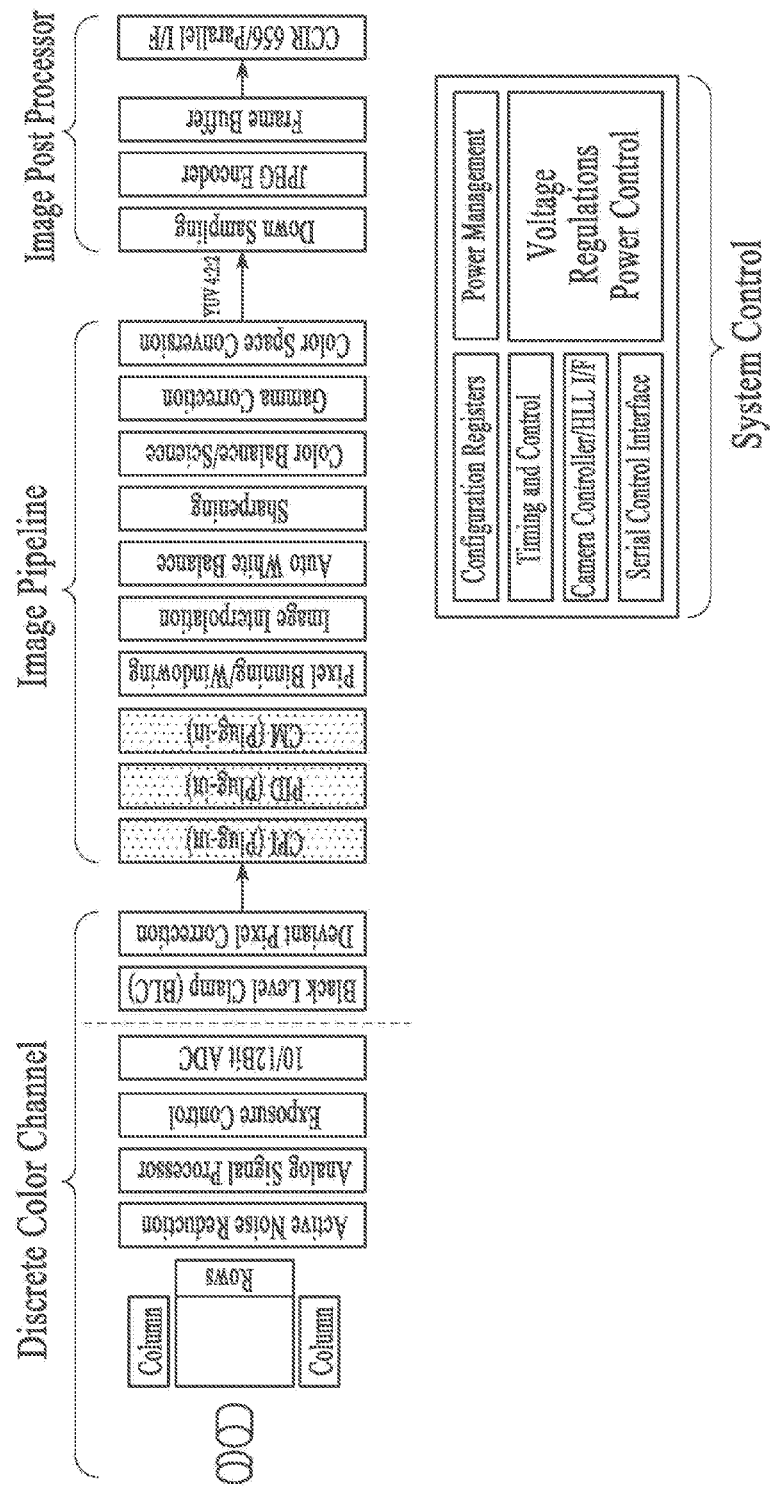
Figure 130:
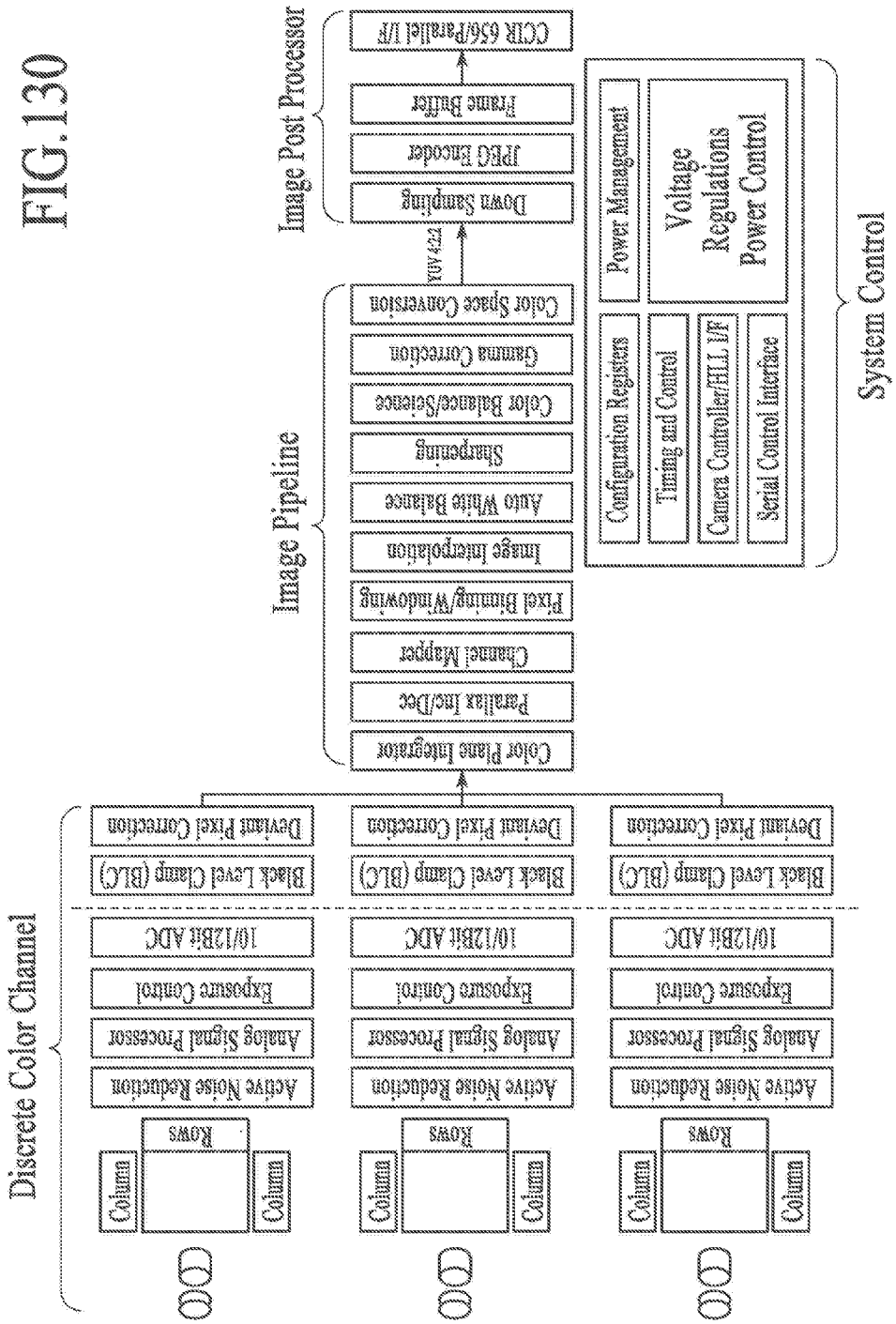
Figure 131:
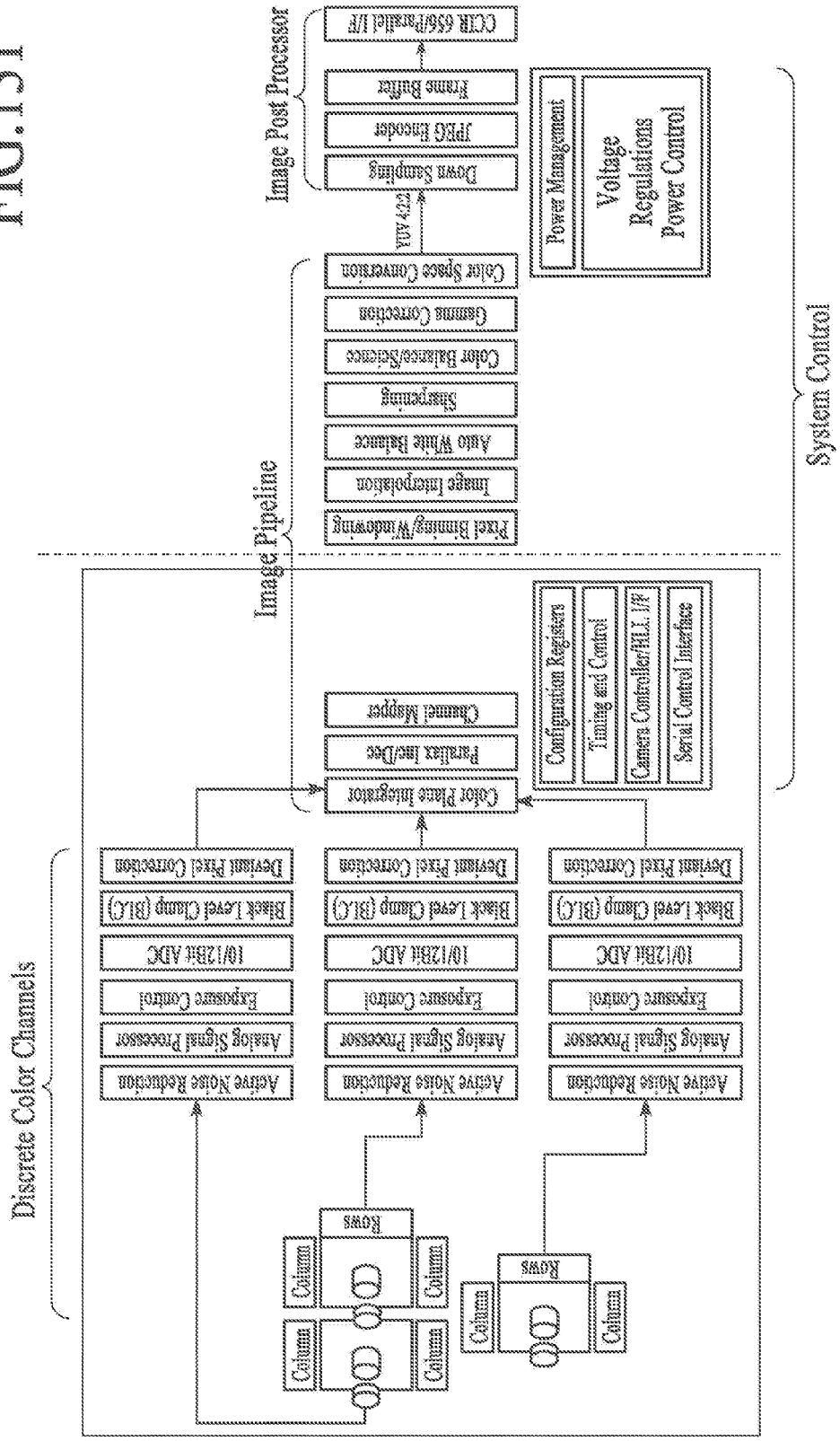
Figure 132:
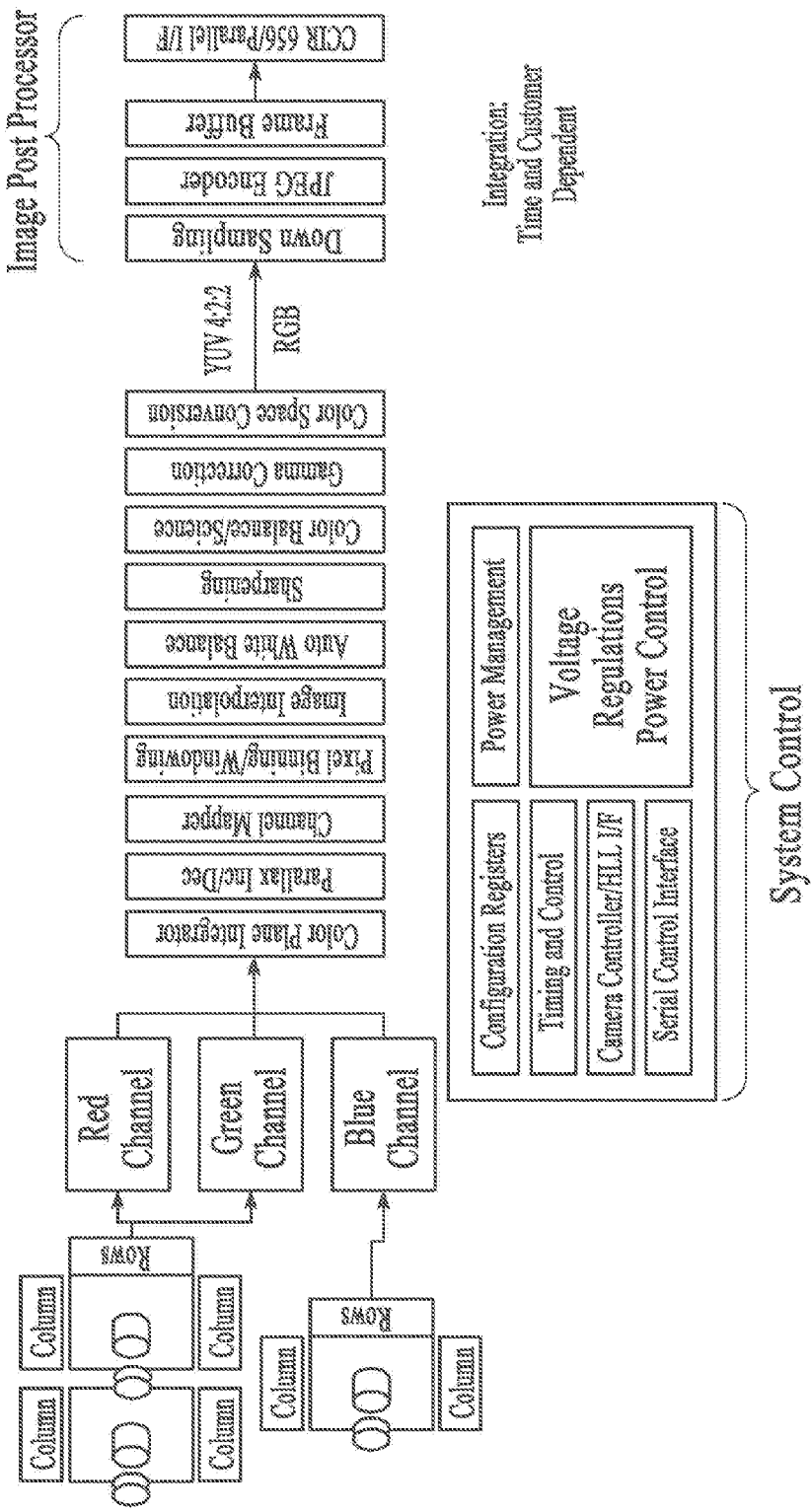
Figure 133:
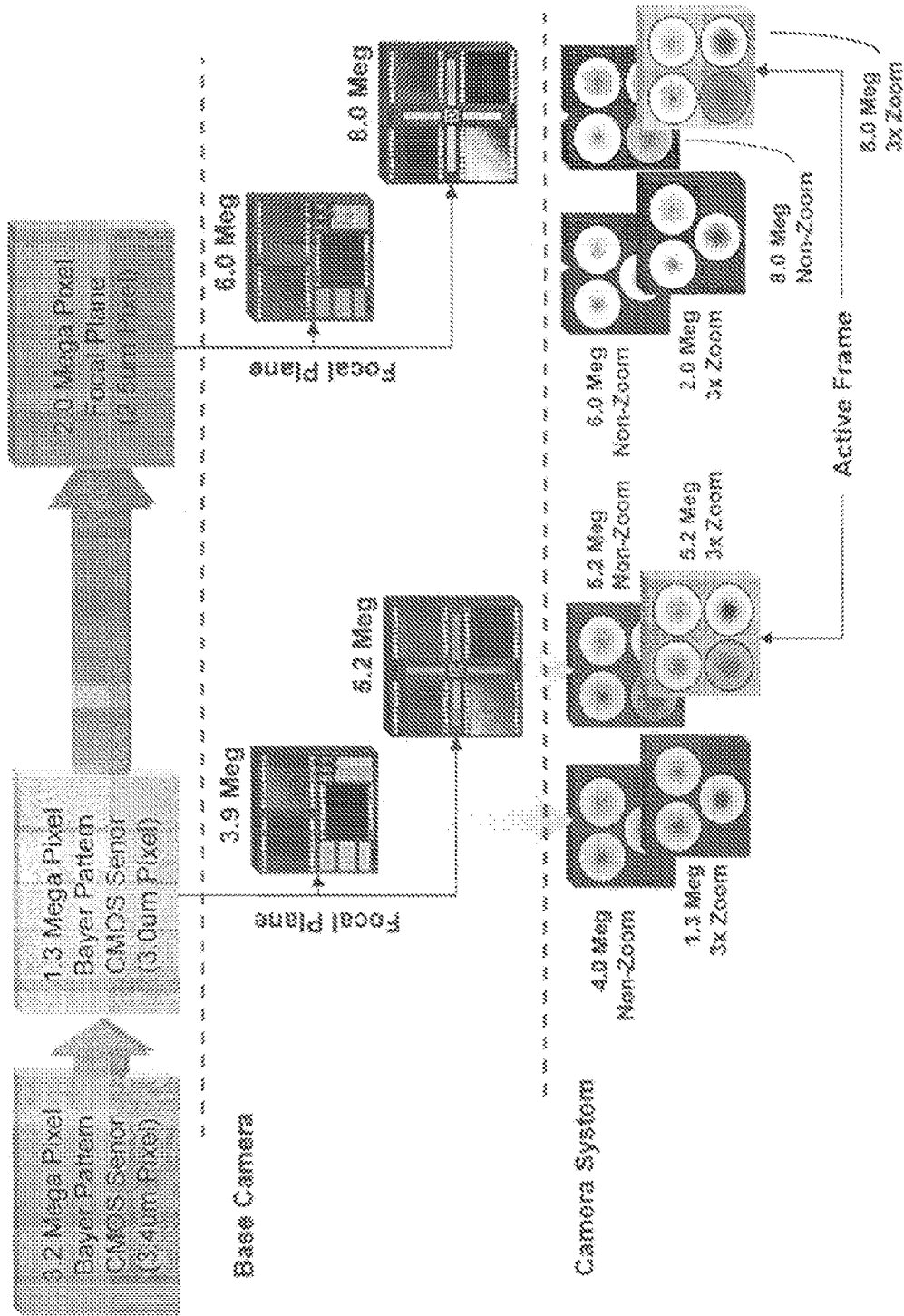
Figure 134:
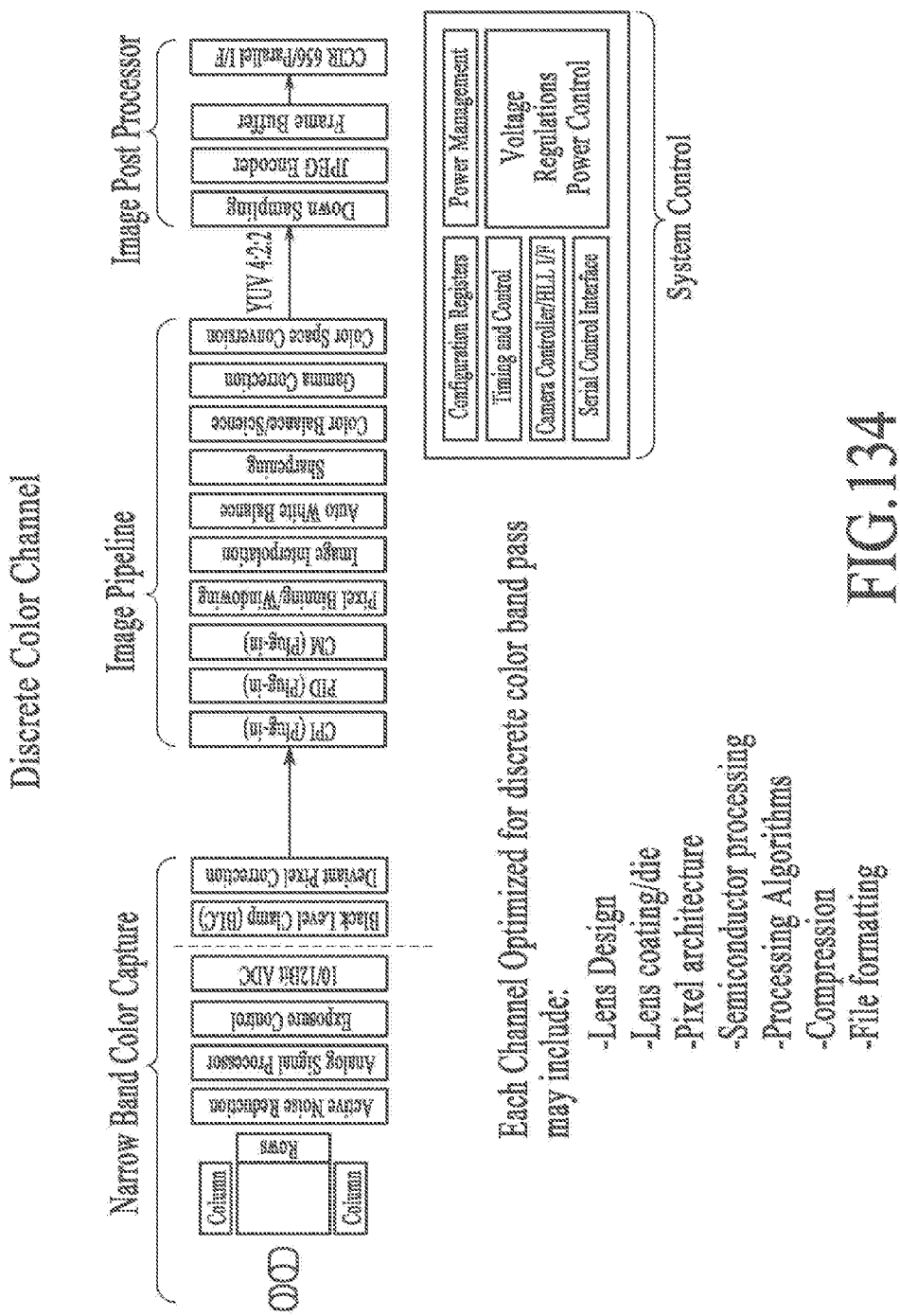
Figure 135:
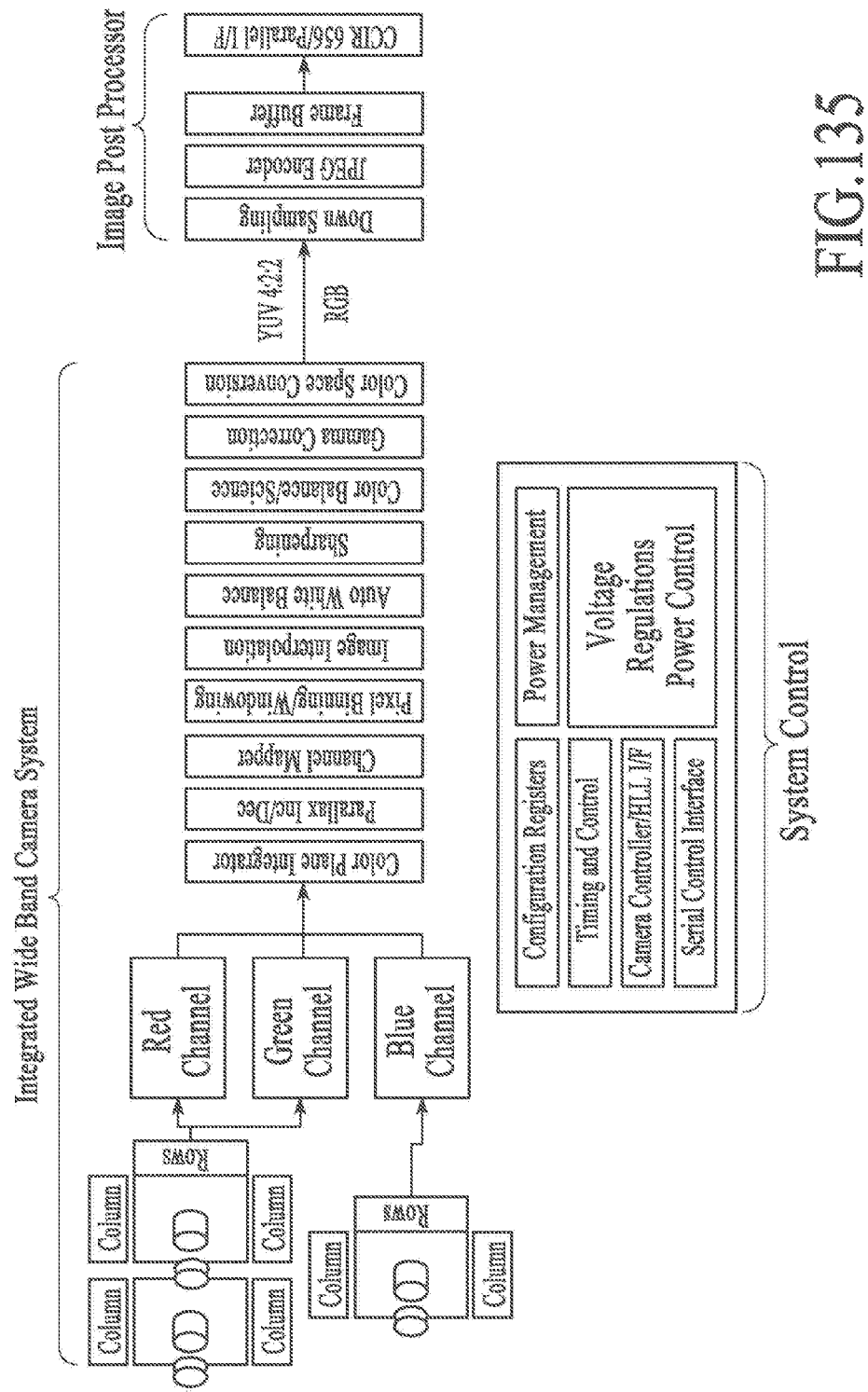
Figure 138:
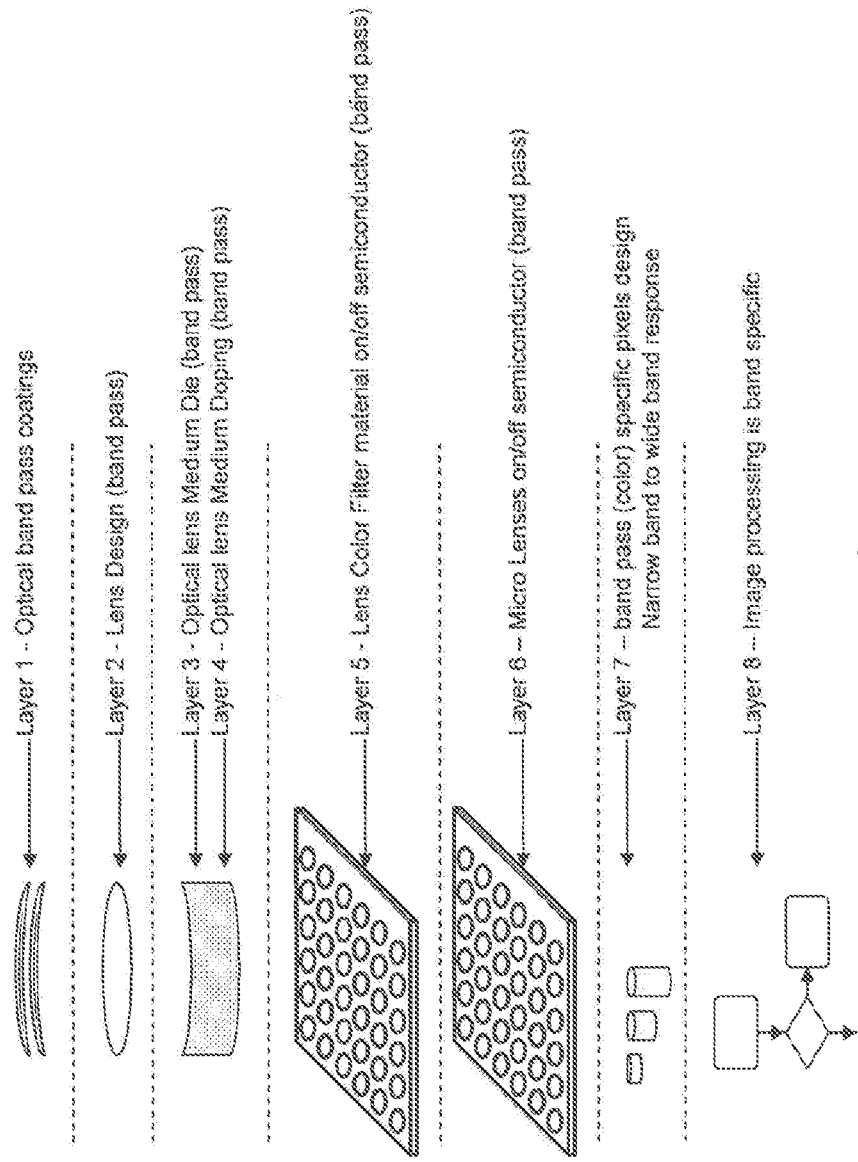

FIG. 117 is a schematic block diagram of a portion of a range finder, in accordance with one embodiment of the present invention;

FIG. 118 is a schematic block diagram of a locator portion of the range finder, in accordance with one embodiment of the present invention;

FIGS. 119A-119C are explanatory representations showing examples of 3D imaging;

FIG. 120 is an explanatory representation of another type of 3D imaging;

FIGS. 121-122 show a flowchart of operations that may be employed in 3D imaging, according to another embodiment of the present invention;

FIG. 123 is a schematic block diagram of a 3D effect generator in accordance with one embodiment of the present invention;

FIG. 124 is a schematic block diagram of a 3D effect generator in accordance with one embodiment of the present invention;

FIG. 125 shows a flowchart of operations that may be employed in image discrimination, according to another embodiment of the present invention;

FIGS. 126A-126B illustrate a flowchart of operations that may be employed in image discrimination, according to another embodiment of the present invention;

FIG. 127 is a schematic block diagram representation of one or more portions of a digital camera apparatus in accordance with another embodiment of the present invention;

FIG. 128 is a schematic block diagram representation of one or more portions of a digital camera apparatus in accordance with another embodiment of the present invention;

FIG. 129 is a schematic block diagram representation of one or more portions of a digital camera apparatus in accordance with another embodiment of the present invention;

FIG. 130 is a schematic block diagram representation of one or more portions of a digital camera apparatus in accordance with another embodiment of the present invention;

FIG. 131 is a schematic block diagram representation of one or more portions of a digital camera apparatus in accordance with another embodiment of the present invention;

FIG. 132 is a schematic block diagram representation of one or more portions of a digital camera apparatus in accordance with another embodiment of the present invention;

FIG. 133 is a schematic block diagram representation of one or more portions of a digital camera apparatus in accordance with another embodiment of the present invention;

FIG. 134 is a schematic block diagram representation of one or more portions of a digital camera apparatus in accordance with another embodiment of the present invention;

FIG. 135 is a schematic block diagram representation of one or more portions of a digital camera apparatus in accordance with another embodiment of the present invention;

FIG. 136 is a schematic block diagram representation of one or more portions of a digital camera apparatus in accordance with another embodiment of the present invention;

FIG. 137 is a schematic block diagram representation of one or more portions of a digital camera apparatus in accordance with another embodiment of the present invention; and FIG. 138 is one or more aspects/techniques/embodiments for implementing spectral optimization of one or more components of a digital camera apparatus in accordance with further embodiments of the present invention; one or more of the aspects/techniques/embodiments may be implemented in any of the embodiments described and/or illustrated herein.

DETAILED DESCRIPTION

Figure 1A:
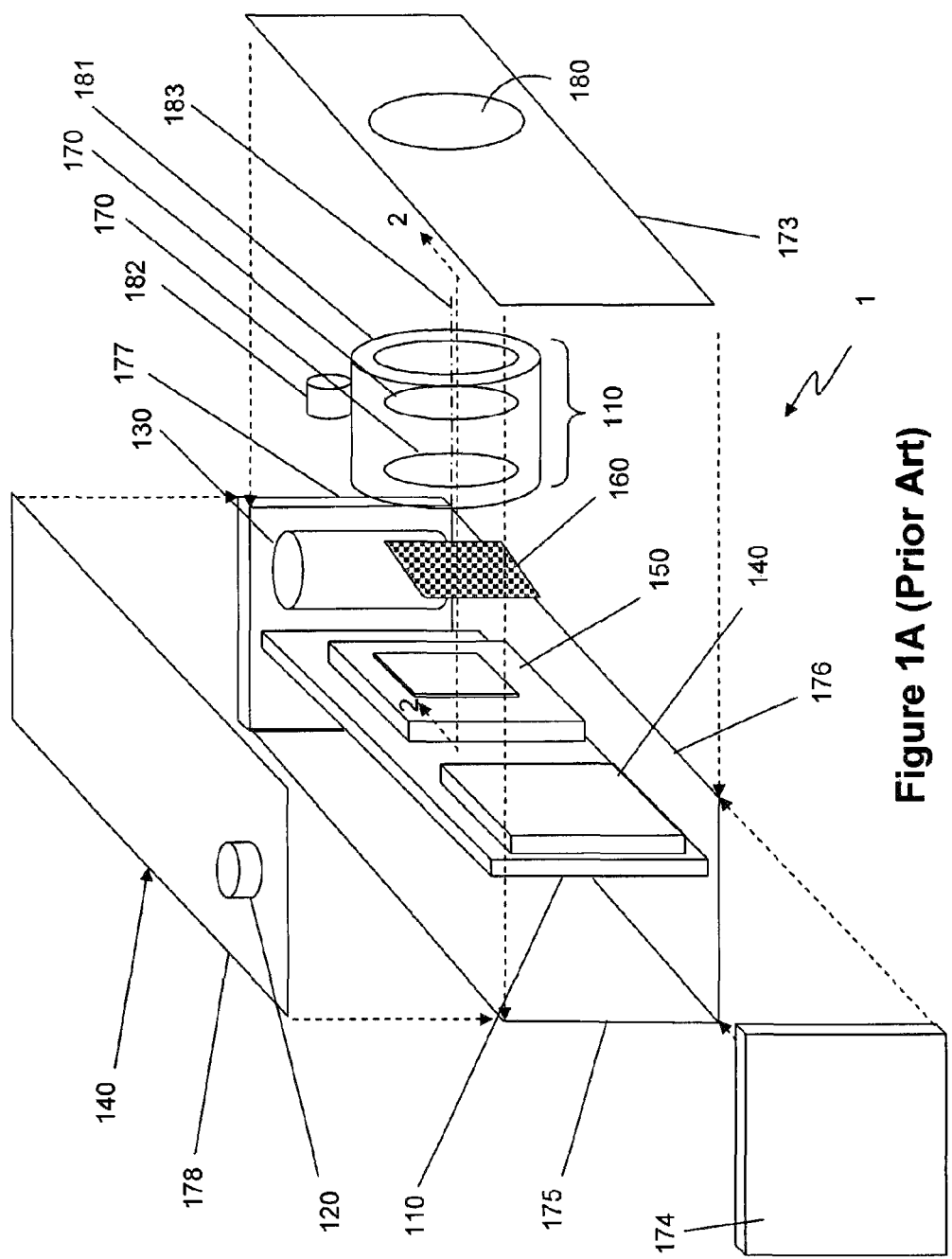
FIG. 1A illustrates a prior art digital camera, and its primary components.

In FIG. 1A a prior art digital camera 1 generally includes the primary image capturing elements of an image sensor 150, a color filter sheet 160 and a series of lenses 170 (in a lens assembly). Additional electronic components typically include a circuit board 110, a peripheral user interface electronics 120 (here represented as a shutter button, but could also include display, settings, controls, etc), power supply 130, and electronic image storage media 140

The digital camera 1 further includes a housing (including housing portions 173, 174, 175, 176, 177 and 178) and a shutter assembly (not shown), which controls an aperture 180 and passage of light into the digital camera 1. A mechanical frame 181 is used to hold the various parts of the lens assembly together. The lens assembly includes the lenses 170 and one or more electro-mechanical devices 182 to move the lenses 170 along an axis 183. The mechanical frame 181 and the one or more electro-mechanical devices 182 may be made up of numerous components and/or complex assemblies.

The color filter sheet 160 has an array of color filters arranged in a Bayer pattern. A Bayer pattern historically uses filters of red, green, blue and typically a second green (e.g., a 2×2 matrix of colors with alternating red and green in one row and alternating green and blue in the other row, although other colors may be used) although patterns may vary depending on the need of the customer. The Bayer pattern is repeated throughout the color filter array 112 as illustrated in FIGS. 1A-1D. This pattern is repeated over the entire array as illustrated.

The image sensor 150 contains a plurality of identical photo detectors (sometimes referred to as "picture elements" or "pixels") arranged in a matrix. The number of photo detectors is usually in the range of hundreds of thousands to millions. The lens assembly spans the diagonal of the array.

The color filter array 160 is laid over the image sensor 150 such that each of the color filters in the color filter sheet 160 is disposed above a respective one of the photo detectors in the image sensor 150, whereby each photo detector in the image sensor receives a specific band of visible light (e.g., red, green or blue).

Figure 1B:
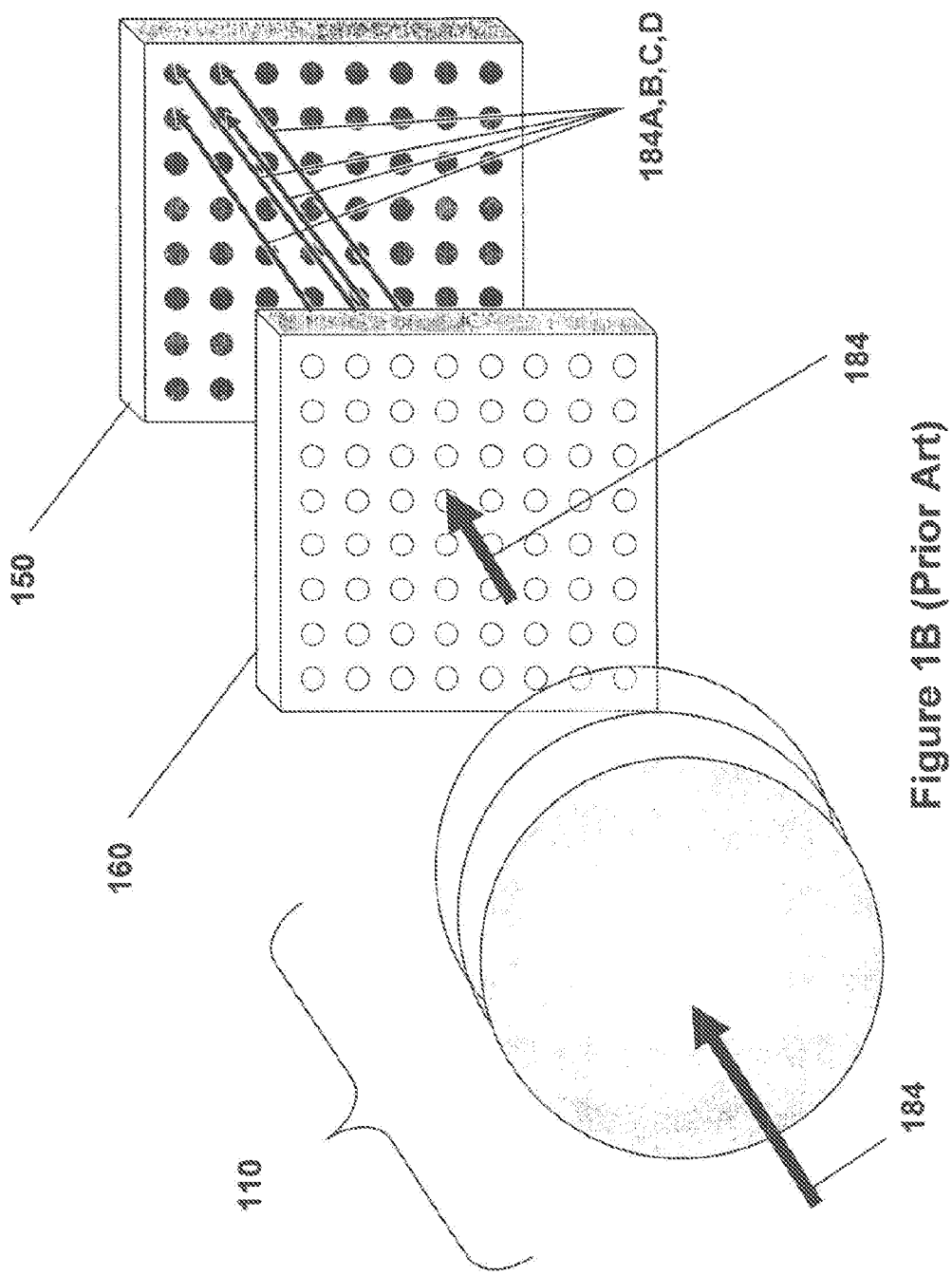
Figure 1D:
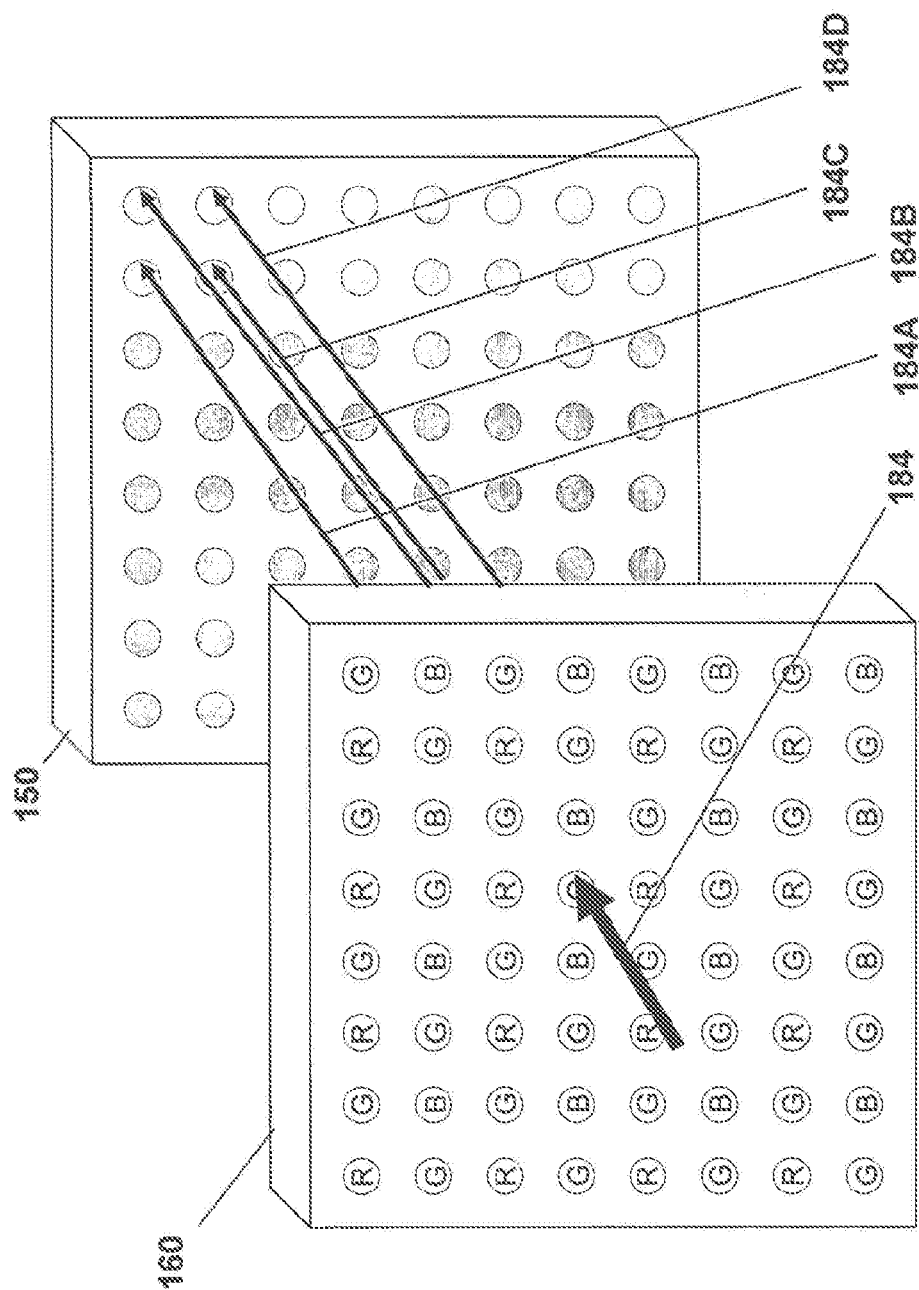

FIGS. 1B-1D illustrate the photon capture process used by the prior art digital camera 1 in creating a color image. The full spectrum of visible light 184 strikes the set of lenses 110, which essentially passes along the full spectrum. The full spectrum then strikes the color filters of the color filter sheet 160 and each of the individual color filters of the color filter sheet 160 passes its specific band of spectrum on to a specific pixel of image sensor 150. This process is repeated for every pixel. Each pixel provides a signal indicative of the color intensity received thereby. Signal processing circuitry (not shown) receives alternating color signals from the photo detectors, processes them in uniform fashion by integrating each set of four pixels (red/green/blue/green or variation thereof) into a single full color pixel, and ultimately outputs a color image.

Figure 1E:
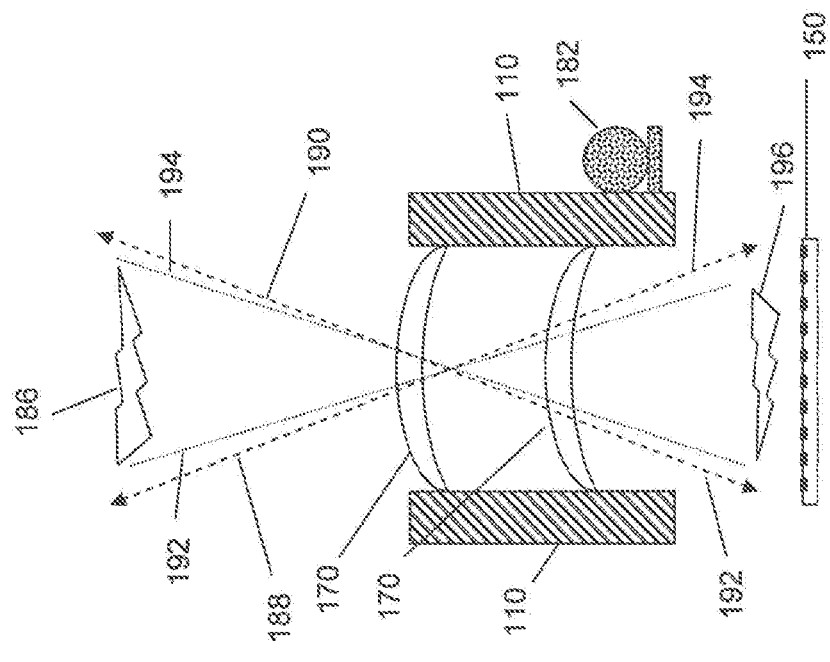
FIG. 1E shows the operation of the lens assembly of the prior art camera of FIG. 1A, in a retracted mode.

FIG. 1E shows the operation of the lens assembly in a retracted mode (sometimes referred to as normal mode or a near focus setting). The lens assembly is shown focused on a distant object (represented as a lightning bolt) 186. A representation of the image sensor 150 is included for reference purposes. A field of view for the camera 1 is defined between reference lines 188, 190. The width of the field of view may be for example, 50 millimeters (mm). To achieve this field of view 188, 190, the one or more electro-mechanical devices 182 have positioned lenses 170 relatively close together. The lens assembly passes the field of view through the lenses 170 and onto the image sensor 150 as indicated by reference lines 192, 194. An image of the object (indicated at 196) is presented onto the image sensor 150 in the same ratio as the width of the actual image 186 relative to the actual field of view 188, 190.

Figure 1F:
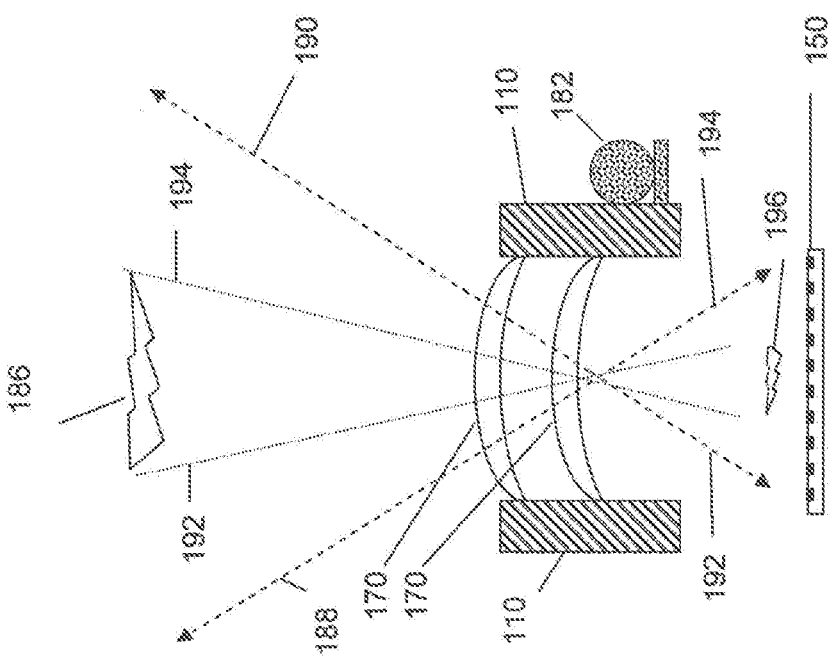
FIG. 1F shows the operation of the lens assembly of the prior art camera of FIG. 1A, in an optical zoom mode.

FIG. 1F shows the operation of the lens assembly 110 in an optical zoom mode (sometimes referred to as a far focus setting). In this mode, the one or more electro-mechanical devices 182 of the lens assembly re-position the lens 170 so as to reduce the field of view 188, 190 over the same image area, thus making the object 186 appear closer (i.e., larger). One benefit of the lens assembly is that the resolution with the lens assembly in zoom mode is typically equal to the resolution with the lens assembly in retracted mode. One drawback, however, is that the lens assembly can be costly and complex. Moreover, providing a lens with zoom capability results in less light sensitivity and thus increases the F-stop of the lens, thereby making the lens less effective in low light conditions.

Some other drawbacks associated with the traditional digital camera 1 are as follows.

Traditional digital cameras, employing one large array on an image sensor, also employ one lens that must span the entire array. That creates two physical size related issues: 1) a lens that spans a large array (e.g. 3 Meg pixels) will be physically larger than a lens that spans a smaller array (e.g., 1 Meg pixels) in both diameter and thickness; and 2) a larger lens/array combination will likely have a longer focal length which will increase the height of the lens.

Also, since the traditional lens must resolve the entire spectrum of visible light wavelengths, they are complex, usually with 3-8 separate elements. This also adds to the optical stack height, complexity and cost.

Further, since the traditional lens must pass all bandwidths of color, it must be a clear lens (no color filtering). The needed color filtering previously described is accomplished by depositing a sheet of tiny color filters beneath the lens and on top of the image sensor. For example, an image sensor with one million pixels will require a sheet of one million individual color filters. This color filter array technique is costly (non-standard integrated circuit processing), presents a limiting factor in shrinking the size of the pixels (cross-talk of colors between pixels in the imaging sensor), plus the color filter array material attenuates the in-band photon stream passing through it (i.e., reduces light sensitivity) since in-band transmission of the color filter array material is less than 100%.

Further, since the lens must be moved forward and backwards with respect to the image sensor, additional time and power are required. This is an undesirable aspect of digital cameras as it creates long delays in capture response time as well as diminished battery capacity.

One or more of the above drawbacks associated with traditional digital cameras may be addressed by one or more embodiments of one or more aspects of the present invention, although this is not required.

Figure 2:
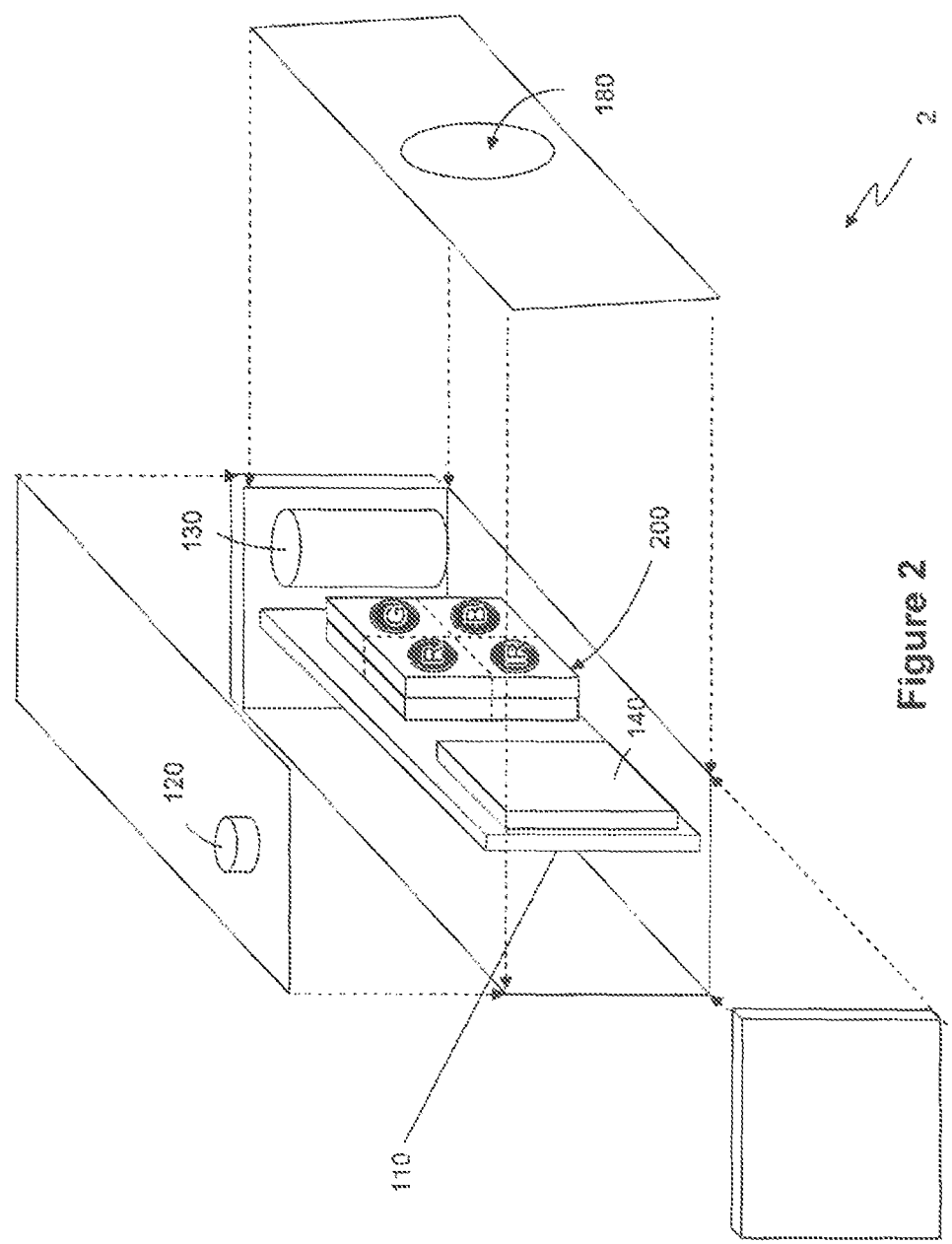
FIG. 2 illustrates a digital camera, and its primary components, including a digital camera subsystem (DCS) in accordance with one embodiment of aspects of the invention.

FIG. 2 shows an example of a digital camera 2, and components thereof, in accordance with one embodiment of certain aspects of the present invention. The digital camera includes a digital camera subsystem 200, a circuit board 110, a peripheral user interface electronics (here represented as a shutter button, but could also include display and/or one or more other output devices, setting controls and/or one or more additional input devices etc) 120, a power supply 130, and electronic image storage media 140.

The digital camera of FIG. 2 may further include a housing and a shutter assembly (not shown), which controls an aperture 180 and passage of light into the digital camera 2.

Figure 3B:
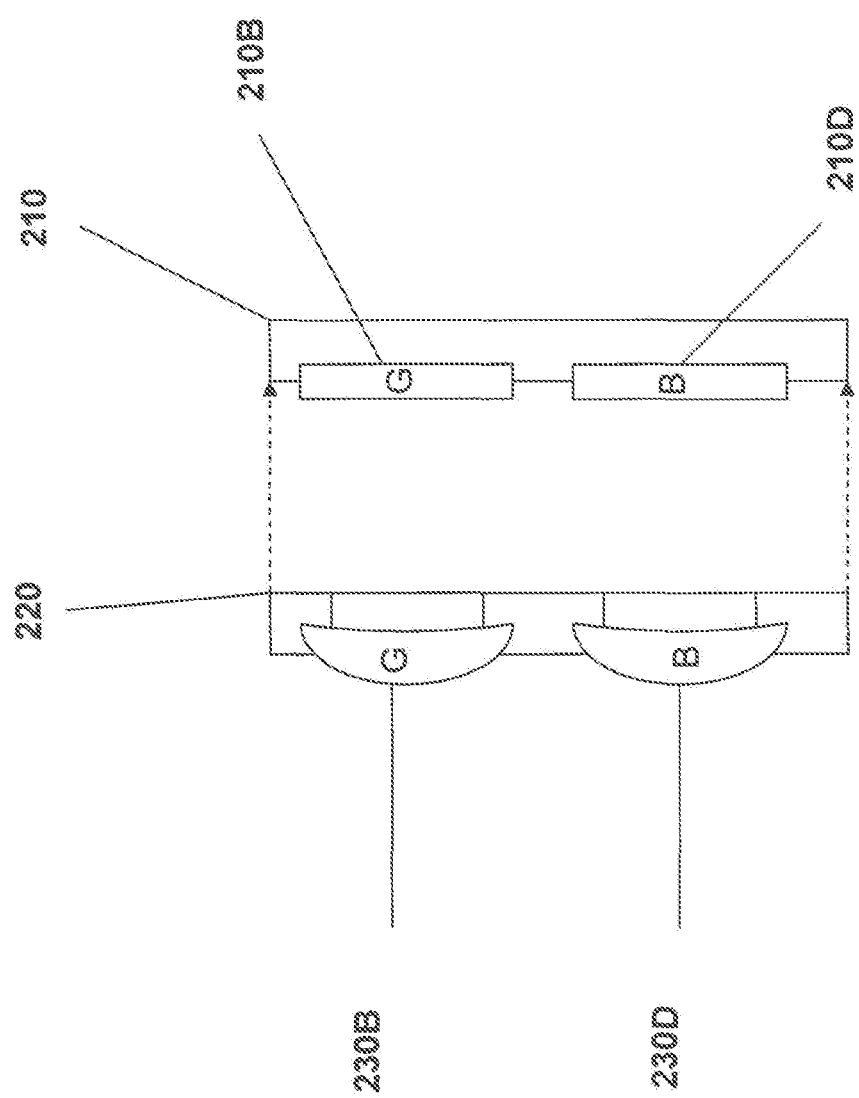

FIGS. 3A-3B are partially exploded, schematic views of one embodiment of the digital camera subsystem 200. In this embodiment, the digital camera subsystem includes an image sensor 210, a frame 220 (FIGS. 7A-7C) and lenses 230A-230D. The image sensor 210 generally includes a semiconductor integrated circuit or "chip" having several higher order features including multiple arrays 210A-210D and signal processing circuitries 212, 214. Each of the arrays 210A-210D captures photons and outputs electronic signals. The signal processing circuitry 212, in certain embodiments, processes signals for each of the individual arrays 210. The signal processing circuitry 214 may combine the output from signal processing 212 into output data (usually in the form of a recombined full color image). Each array and the related signal processing circuitry may be preferably tailored to address a specific band of visible spectrum.

Each of lenses 230A-230D may be advantageously tailored for the respective wavelength of the respective array. Lenses will generally be about the same size as the underlying array, and will therefore differ from one another in size and shape depending upon the dimensions of the underlying array. Of course, there is no requirement that a given lens cover all, or only, the underlying array. In alternative embodiments a lens could cover only a portion of an array, and could extend beyond the array. Lenses can comprise any suitable material or materials, including for example, glass and plastic. Lenses can be doped in any suitable manner, such as to impart a color filtering, polarization, or other property. Lenses can be rigid or flexible.

The frame 220 (FIGS. 7A-7C) is used to mount the lenses 230A-230D to the image sensor 210.

In this exemplary embodiment, each lens, array, and signal processing circuitry constitutes an image generating subsystem for a band of visible spectrum (e.g., red, blue, green, etc). These individual images are then combined with additional signal processing circuitry within the semiconductor chip to form a full image for output.

Those skilled in the art will appreciate that although the digital camera subsystem 210 is depicted in a four array/lens configuration, the digital camera subsystem can be employed in a configuration having any multiple numbers and shapes of arrays/lenses.

FIG. 4 depicts a digital camera subsystem having a three array/lens configuration.

Figure 5B:
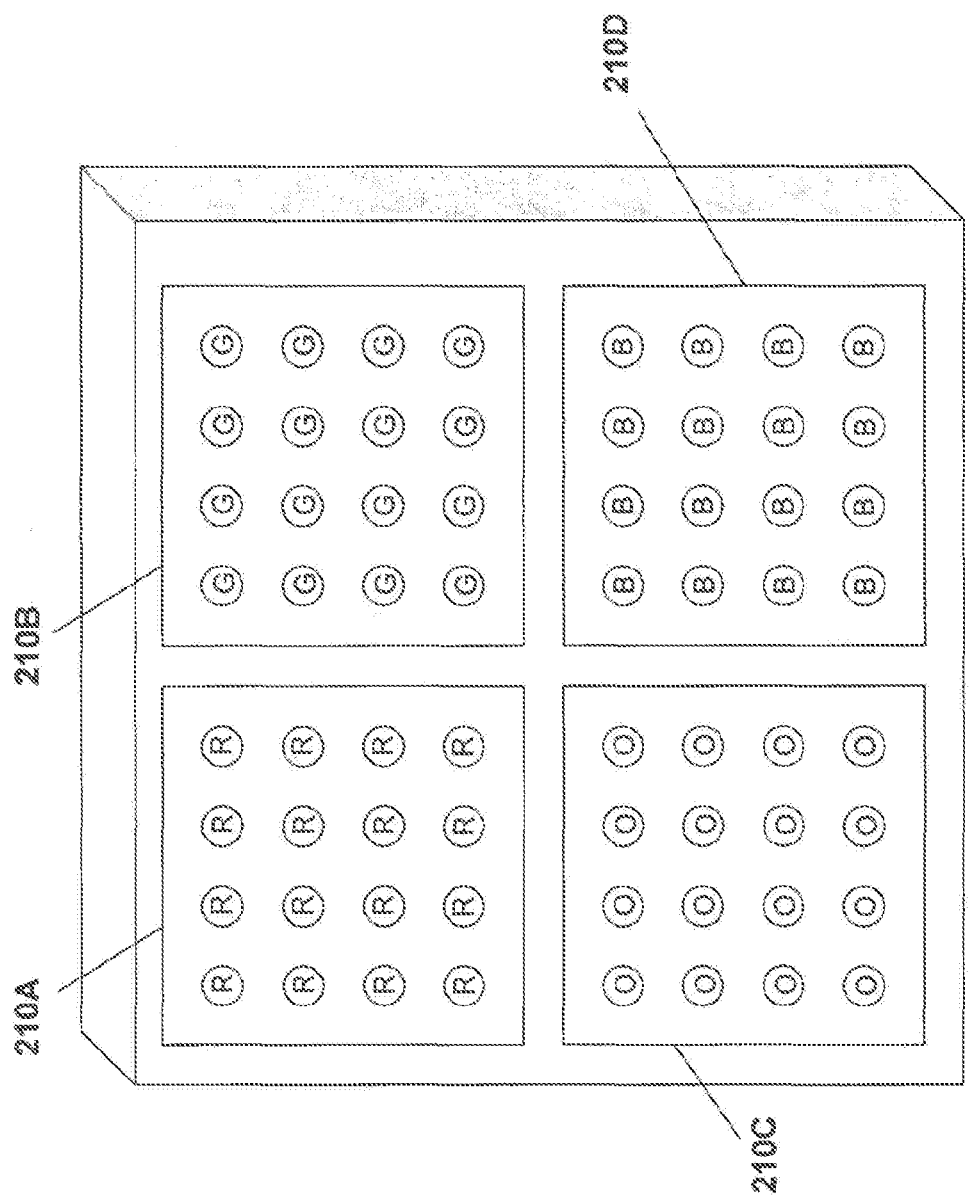

In FIGS. 5A-5C, the digital camera subsystem employs the separate arrays, e.g., arrays 210A-210D, on one image sensor to supplant the prior art approach (which employs a Bayer pattern (or variations thereof), operations across the array (a pixel at a time) and integrates each set of four pixels (for example, red/green/blue/green or variation thereof) from the array into a single full color pixel). Each of such arrays focuses on a specific band of visible spectrum. As such, each array may be tuned so that it is more efficient in capturing and processing the image in that particular color. Individual lenses (230A-D) can be tailored for the array's band of spectrum. Each lens only needs to pass that color (184A-184D) on to the image sensor. The traditional color filter sheet is eliminated. Each array outputs signals to signal processing circuitry. Signal processing circuitry for each of these arrays is also tailored for each of the bands of visible spectrum. In effect, individual images are created for each of these arrays. Following this process, the individual images are combined to form one full color or black/white image. By tailoring each array and the associated signal processing circuitry, a higher quality image can be generated than the image resulting from traditional image sensors of like pixel count.

Figure 6A:
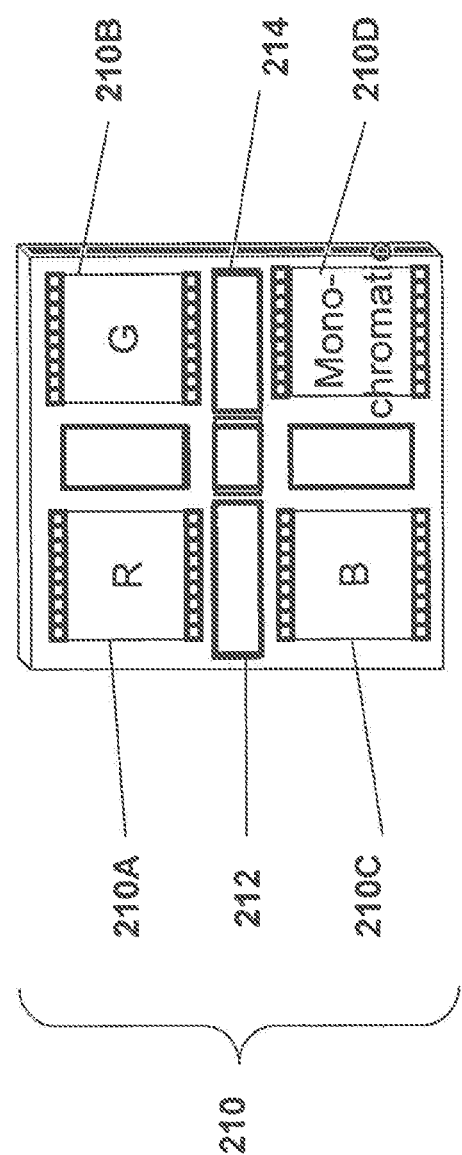
FIG. 6A is an alternative digital camera subsystem (DCS) having four arrays.
Figure 6B:
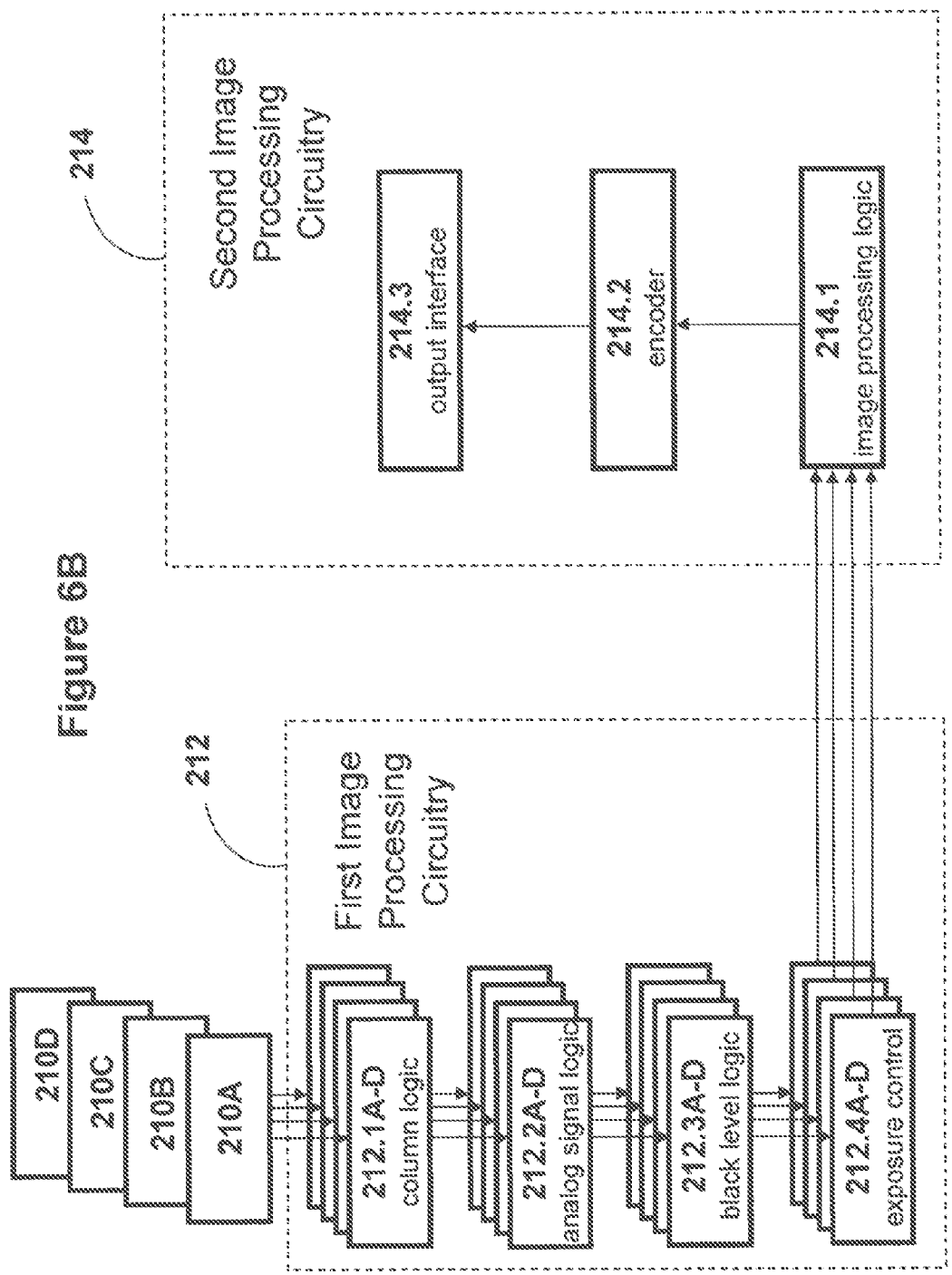
FIG. 6B is a flow chart for the alternative digital camera subsystem (DCS) of FIG. 6A.

FIGS. 6A-6B illustrate some of the many processing operations that can be advantageously used. As stated above, each array outputs signals to the signal processing circuitry 212. Within the signal processing circuitry, each array can be processed separately to tailor the processing to the respective bands of spectrum. Several functions occur:

The column logic (212.1A-D) is the portion of the signal processing circuitry that reads the signals from the pixels. For example, the column logic 212.1A reads signals from the pixels in array 210A. Column logic 212.1B reads signals from the pixels in array 210B. Column logic 212.1C reads signals from the pixels in array 210C. Column logic 212.1D reads signals from the pixels in array 210D.

Since the array is targeting a specific wavelength, wavelengths, band of wavelength, or band of wavelengths, the column logic may have different integration times for each array enhancing dynamic range and/or color specificity. Signal processing circuitry complexity for each array can be substantially reduced since logic may not have to switch between extreme color shifts.

The Analog Signal Logic (ASL) (212.2A-D) for each array may be color specific. As such, the ASL processes a single color and therefore can be optimized for gain, noise, dynamic range, linearity, etc. Due to color signal separation, dramatic shifts in the logic and settling time are not required as the amplifiers and logic do not change on a pixel by pixel (color to color) basis as in traditional Bayer patterned designs.

The black level logic (212.3A-D) assesses the level of noise within the signal, and filters it out. With each array focused upon a narrower band of visible spectrum than traditional image sensors, the black level logic can be more finely tuned to eliminate noise.

The exposure control (212.4A-D) measures the overall volume of light being captured by the array and will adjust the capture time for image quality. Traditional cameras must make this determination on a global basis (for all colors). Our invention allows for exposure control to occur for each array and targeted band of wavelengths differently.

These processed images are then passed to the second group of signal processing circuitry 214. First, the image processing logic 214.1 integrates the multiple color planes into a single color image. The image is adjusted for saturation, sharpness, intensity, hue, artifact removal, and defective pixel correction. The IPL also provides the algorithmic auto focus, zoom, windowing, pixel binning and camera functions.

The final two operations are to encode the signal into standard protocols 214.2 such as MPEG, JPEG, etc. before passing to a standard output interface 214.3, such as USB.

Although the signal processing circuitries 212, 214 are shown at specific areas of the image sensor, the signal processing circuitries 212, 214 can be placed anywhere on the chip and subdivided in any fashion. The signal processing circuitries in fact will likely be placed in multiple locations.

As previously stated, the image sensor 210 (FIGS. 3A-3B) generally includes a semiconductor chip having several higher order features including multiple arrays (210A-210D), and signal processing circuitry 212, in which each array and the related signal processing circuitry is preferably tailored to address a specific band of visible spectrum. As noted above, the image sensor array can be configured using any multiple numbers and shapes of arrays.

The image sensor 210 can be constructed using any suitable technology, including especially silicon and germanium technologies. The pixels can be formed in any suitable manner, can be sized and dimensioned as desired, and can be distributed in any desired pattern. Pixels that are distributed without any regular pattern could even be used.

Any range of visible spectrum can be applied to each array depending on the specific interest of the customer. Further, an infrared array could also be employed as one of the array/lens combinations giving low light capabilities to the sensor.

As previously described, arrays 210A-D may be of any size or shape. FIG. 3 shows the arrays as individual, discrete sections of the image sensor. These arrays may also be touching. There may also be one large array configured such that the array is subdivided into sections whereby each section is focused upon one band of spectrum, creating the same effect as separate arrays on the same chip.

Although the well depth of the photo detectors (for example, an area or portion of the photo detector that captures, collects, is responsive to, detects and/or senses for example, the intensity illumination of incident light; in some embodiments, the well depth is the distance from the surface of the photo detector to a doped region—see, for example, FIGS. 17B-E) across each individual array (designated 210A-D) may be the same, the well depth of any given array may be different from that of one or more or all of other arrays of the sensor subsystem. Selection of an appropriate well depth could depend on many factors, including most likely the targeted band of visible spectrum. Since each entire array is likely to be targeted at one band of visible spectrum (e.g., red) the well depth can be designed to capture that wavelength and ignore others (e.g., blue, green).

Doping of the semiconductor material in the color specific arrays can further be used to enhance the selectivity of the photon absorption for color specific wavelengths.

Figure 7C:
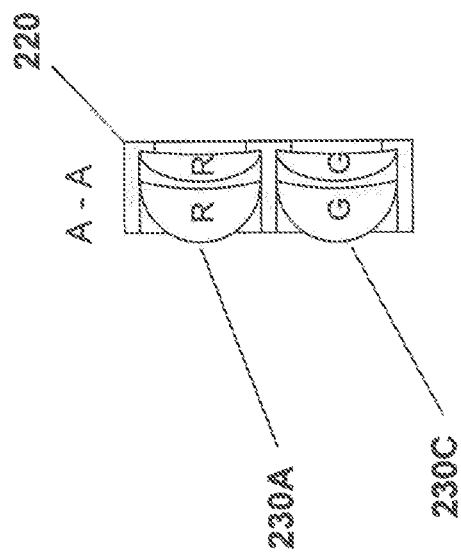
FIGS. 7A-7C are a schematic of a four-lens system used in the DCS of FIG. 3.
Figure 7B:
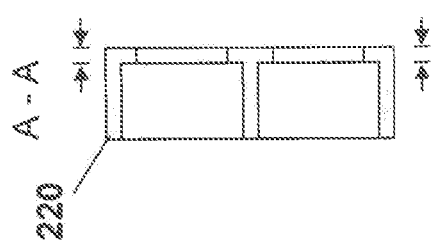
Figure 7A:
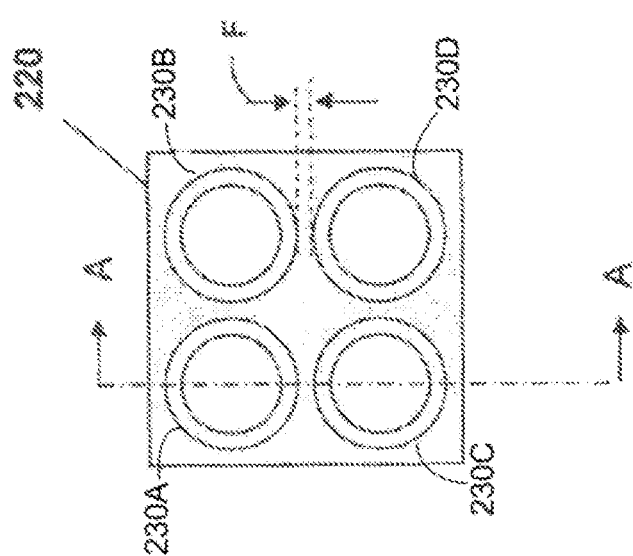

In FIGS. 7A-7C, frame 220 is a thin plate bored to carry the individual lenses (represented by 230A, 230C) over each array. Lenses may be fixed to the frame in a wide range of manners: adhesive, press fit, electronic bonding, etc. The mounting holes may have a small "seat" at the base to control the depth of the lens position. The depth may be different for each lens and is a result of the specific focal length for the particular lens tailored for each array.

The frames shown in FIGS. 7A-7C are solid devices that offer a wide range of options for manufacturing, material, mounting, size, and shape. Of course, other suitable frames can be readily designed, all of which fall within the inventive scope.

Although the Figures show individual lenses per array, assembled into a frame, the lenses could be manufactured such that the lenses per image sensor come as one mold or component. Further, this one-body construction could also act as the frame for mounting to the image sensor.

The lens and frame concept can be applied to traditional image sensors (without the traditional color filter sheet) to gain physical size, cost and performance advantages.

As shown in FIGS. 7A-7C, the digital camera subsystem can have multiple separate arrays on a single image sensor, each with its own lens (represented by 230A, 230C). The simple geometry of smaller, multiple arrays allows for a smaller lens (diameter, thickness and focal length), which allows for reduced stack height in the digital camera.

Each array can advantageously be focused on one band of visible and/or detectable spectrum. Among other things, each lens may be tuned for passage of that one specific band of wavelength. Since each lens would therefore not need to pass the entire light spectrum, the number of elements may be reduced, for example, to one or two.

Further, due to the focused bandwidth for each lens, each of the lenses may be dyed during the manufacturing process for its respective bandwidth (e.g., red for the array targeting the red band of visible spectrum). Alternatively, a single color filter may be applied across each lens. This process eliminates the traditional color filters (the sheet of individual pixel filters) thereby reducing cost, improving signal strength and eliminating the pixel reduction barrier.

Elimination of the color filter sheet allows for reductions in the physical size of the pixel for further size reductions of the overall DCS assembly.

Although FIGS. 2, 3A-3B and 5A-5C illustrates a 4 array/lens structure, and FIG. 4 depicts a three array/lens configuration, any multiple number of arrays/lenses as well as various combinations thereof is possible.

The above-described devices can include any suitable number of combinations, from as few as 2 arrays/lenses or in a broader array. Examples include:

2 arrays/lenses: red/green and blue
2 arrays/lenses: red and blue/green
3 arrays/lenses: red, green, blue
4 arrays/lenses: red, blue, green, emerald (for color enhancement)
4 arrays/lenses: red, blue, green, infrared (for low light conditions)
8 arrays/lenses: double the above configurations for additional pixel count and image quality.

Although FIG. 2 reflects a digital still camera, the camera is intended to be emblematic of a generic appliance containing the digital camera subsystem. Thus, FIG. 2 should be interpreted as being emblematic of still and video cameras, cell phones, other personal communications devices, surveillance equipment, automotive applications, computers, manufacturing and inspection devices, toys, plus a wide range of other and continuously expanding applications. Of course these alternative interpretations of the Figure may or may not include the specific components as depicted in FIG. 2. For example, the circuit board may not be unique to the camera function but rather the digital camera subsystem may be an add-on to an existing circuit board, such as in a cell phone.

Thus, it should be understood that any or all of the methods and/or apparatus disclosed herein may be employed in any type of apparatus or process including, but not limited to still and video cameras, cell phones, other personal communications devices, surveillance equipment, automotive applications, computers, manufacturing and inspection devices, toys, plus a wide range of other and continuously expanding applications.

As used herein, the following terms are interpreted as described below, unless the context requires a different interpretation.

"Array" means a group of photo detectors, also know as pixels, which operate in concert to create one image. The array captures the photons and converts the data to an electronic signal. The array outputs this raw data to signal processing circuitry that generates the image sensor image output.

"Digital Camera" means a single assembly that receives photons, converts them to electrical signals on a semiconductor device ("image sensor"), and processes those signals into an output that yields a photographic image. The digital camera would included any necessary lenses, image sensor, shutter, flash, signal processing circuitry, memory device, user interface features, power supply and any mechanical structure (e.g. circuit board, housing, etc) to house these components. A digital camera may be a stand-alone product or may be imbedded in other appliances, such as cell phones, computers or the myriad of other imaging platforms now available or may be created in the future, such as those that become feasible as a result of this invention.

"Digital Camera Subsystem" (DCS) means a single assembly that receives photons, converts them to electrical signals on a semiconductor device ("image sensor") and processes those signals into an output that yields a photographic image. At a minimum, the Digital Camera Subsystem would include any necessary lenses, image sensor, signal processing circuitry, shutter, flash and any frame to hold the components as may be required. The power supply, memory devices and any mechanical structure are not necessarily included.

"Electronic media" means that images are captured, processed and stored electronically as opposed to the use of film.

"Frame" or "thin plate" means the component of the DCS that is used to hold the lenses and mount to the image sensor.

"Image sensor" means the semiconductor device that includes the photon detectors ("pixels"), processing circuitry and output channels. The inputs are the photons and the output is the image data.

"Lens" means a single lens or series of stacked lenses (a column one above the other) that shape light rays above an individual array. When multiple stacks of lenses are employed over different arrays, they are called "lenses."

"Package" means a case or frame that an image sensor (or any semiconductor chip) is mounted in or on, which protects the imager and provides a hermetic seal. "Packageless" refers to those semiconductor chips that can be mounted directly to a circuit board without need of a package.

The terms "Photo-detector" and "pixels" mean an electronic device that senses and captures photons and converts them to electronic signals. These extremely small devices are used in large quantities (hundreds of thousands to millions) in a matrix to capture an image much like film.

"Semiconductor Chip" means a discrete electronic device fabricated on a silicon or similar substrate, which is commonly used in virtually all electronic equipment.

"Signal Processing Circuitry" means the hardware and software within the image sensor that translates the photon input information into electronic signals and ultimately into an image output signal.

The inventive subject matter can provide numerous benefits in specific applications. For example, traditional color filters are limited in their temperature range, which limits end user manufacturing flexibility. Wave soldering processes, low cost, mass production soldering processes, cannot be used due to the color filters' temperature limitations. At least some embodiments of the inventive subject matter do not have that limitation. Indeed, one, some or all of the embodiments described and illustrated herein need not employ wave soldering processes or other low cost, mass production soldering processes.

In addition, once the imager sensor, frame, and lenses are assembled, the assembly can be a hermetically sealed device. The device does not need a "package" and as such, if desired, can be mounted directly to a circuit board which saves parts and manufacturing costs.

Because multiple images are created from separate locations (albeit a small distance between the arrays on the same image sensor), parallax is created, which can be eliminated in the signal processing circuitry or utilized/enhanced for numerous purposes, including for example, to measure distance to the object, and to provide a 3-D effect.

Although each array and the related signal processing circuitry is preferably tailored to address a specific band of visible spectrum and each lens may be tuned for passage of that one specific band of wavelength, it should be clear that there is no requirement that each such array and the related signal processing circuitry be tailored to address a specific band of the visible spectrum. Nor is there any requirement that each lens be tuned for passage of a specific band of wavelength or that each of the arrays be located on the same semiconductor device. Indeed, the embodiments described and illustrated herein, including the specific components thereof, need not employ wavelength specific features. For example, the arrays and/or signal processing circuitry need not be tailored to address a specific wavelength or band of wavelengths.

Notably, in certain embodiments, certain components thereof may be tailored to address a specific wavelength or band of wavelengths while other components of the embodiment are not tailored to address a specific wavelength or band of wavelengths. For example, the lenses and/or arrays may be tailored to address a specific wavelength or band of wavelengths and the associated signal processing circuitry is not tailored to address a specific wavelength or band of wavelengths. Moreover, in other embodiments, one or more lenses (of the same or different optical channels) may be tailored to address a specific wavelength or band of wavelengths and the associated array and signal processing circuitry is not tailored to address a specific wavelength or band of wavelengths. All such permutations and combinations are intended to come within the scope of the present inventions. For the sake of brevity, all such permutations and combinations are not discussed in detail herein.

In addition, although a digital camera subsystem includes any necessary lenses, image sensor, signal processing circuitry, shutter, flash and any frame to hold the components as may be required, some digital camera subsystems may not have any requirement for one or more of such. For example, some digital camera systems may not require a shutter, a flash and/or a frame to hold the components. Further, some of the digital camera subsystems may not require an image sensor that includes each of the detectors, the processing circuitry and output channels. For example, in some embodiments, one or more of the detectors (or portions thereof), one or more portions of the processing circuitry and/or one or more portions of the output channels may be included in separate devices and/or disposed in separate locations. All such permutations and combinations are intended to come within the scope of the present inventions. For the sake of brevity, all such permutations and combinations are not discussed in detail herein.

Figure 8:
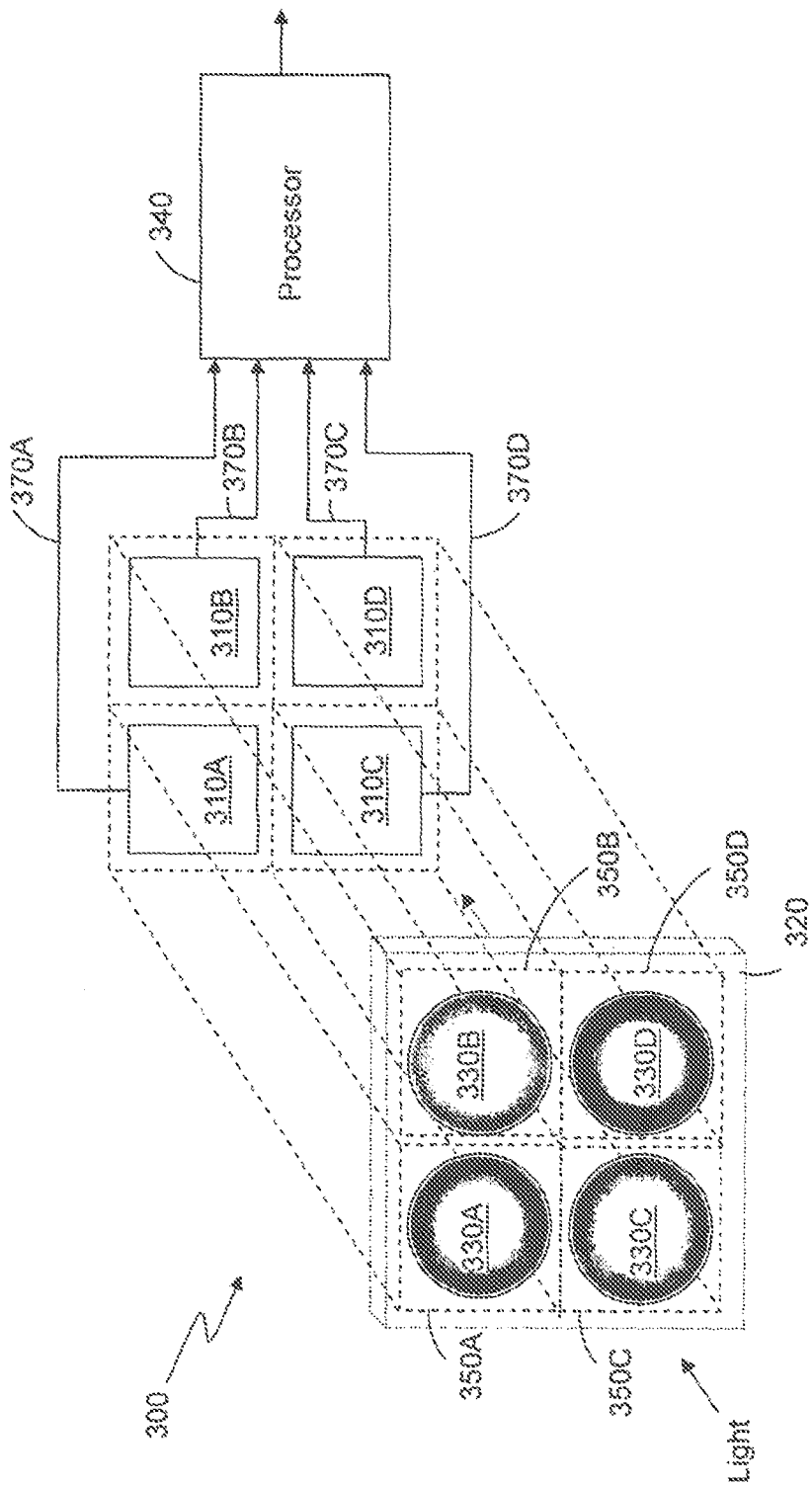
FIG. 8 is a schematic representation of a digital camera apparatus in accordance with another embodiment of aspects of the present invention.

FIG. 8 is a schematic exploded perspective view of a digital camera apparatus 300 in accordance with another embodiment of the present invention. The digital camera apparatus 300 includes one or more sensor arrays, e.g., four sensor arrays 310A-310D, one or more optics portions, e.g., four optics portions 330A-330D, and a processor 340. Each of the one or more optics portions, e.g., optics portions 330A-330D, may include, for example, but is not limited to, a lens, and may be associated with a respective one of the one or more sensor arrays, e.g., sensor arrays 310A-310D. In some embodiments, a support 320 (see for example, FIGS. 28A-28D), for example, but not limited to, a frame, is provided to support the one or more optics portions, e.g., optics portions 330A-330D, at least in part. Each sensor array and the respective optics portion may define a camera channel. For example, a camera channel 350A may be defined by the optics portion 330A and the sensor array 310A. Camera channel 350B may be defined by the optics portion 330B and the sensor array 310B. Camera channel 350C may be defined by optics portion 330C and the sensor array 310C. Camera channel 350D may be defined by optics portion 330D and a sensor array 310D. The optics portions of the one or more camera channels are collectively referred to herein as an optics subsystem. The sensor arrays of the one or more camera channels are collectively referred to herein as a sensor subsystem. The two or more sensor arrays may be integrated in or disposed on a common substrate, referred to hereinafter as an image device, on separate substrates, or any combination thereof (for example, where the system includes three or more sensor arrays, two or more sensor arrays may be integrated in a first substrate and one or more other sensor arrays may be integrated in or disposed on a second substrate).

In that regard, with continued reference to FIG. 8, the one or more sensor arrays, e.g., sensor arrays 310A-310D, may or may not be disposed on a common substrate with one another. For example, in some embodiments two or more of the sensor arrays are disposed on a common substrate. In some embodiments, however, one or more of the sensor arrays is not disposed on the same substrate as one or more of the other sensor arrays.

The one or more camera channels may or may not be identical to one another. For example, in some embodiments, the camera channels are identical to one another. In other embodiments, one or more of the camera channels are different, in one or more respects, from one or more of the other camera channels. In some of the latter embodiments, each camera channel may be used to detect a different color (or band of colors) and/or band of light than that detected by the other camera channels.

In some embodiments, one of the camera channels, e.g., camera channel 350A, detects red light, one of the camera channels, e.g., camera channel 350B, detects green light, one of the camera channels, e.g., camera channel 350C, detects blue light. In some of such embodiments, one of the camera channels, e.g., camera channel 350D, detects infrared light, cyan light, or emerald light. In some other embodiments, one of the camera channels, e.g., camera channel 350A, detects cyan light, one of the camera channels, e.g., camera channel 350B, detects yellow light, one of the camera channels, e.g., camera channel 350C, detects magenta light and one of the camera channels, e.g., camera channel 350D, detects clear light (black and white). Any other wavelength or band of wavelengths (whether visible or invisible) combinations can also be used.

The processor 340 is connected to the one or more sensor arrays, e.g., sensor arrays 310A-310D, via one or more communication links, e.g., communication links 370A-370D, respectively. A communication link may be any kind of communication link including but not limited to, for example, wired (e.g., conductors, fiber optic cables) or wireless (e.g., acoustic links, electromagnetic links or any combination thereof including but not limited to microwave links, satellite links, infrared links), and combinations thereof, each of which may be public or private, dedicated and/or shared (e.g., a network). A communication link may employ for example circuit switching or packet switching or combinations thereof. Other examples of communication links include dedicated point-to-point systems, wired networks, and cellular telephone systems. A communication link may employ any protocol or combination of protocols including but not limited to the Internet Protocol.

The communication link may transmit any type of information. The information may have any form, including, for example, but not limited to, analog and/or digital (a sequence of binary values, i.e. a bit string). The information may or may not be divided into blocks. If divided into blocks, the amount of information in a block may be predetermined or determined dynamically, and/or may be fixed (e.g., uniform) or variable.

As will be further described hereinafter, the processor may include one or more channel processors, each which is coupled to a respective one (or more) of the camera channels and generates an image based at least in part on the signal(s) received from the respective camera channel, although this is not required. In some embodiments, one or more of the channel processors are tailored to its respective camera channel, for example, as described herein. For example, where one of the camera channels is dedicated to a specific wavelength or color (or band of wavelengths or colors), the respective channel processor may be adapted or tailored to such wavelength or color (or band of wavelengths or colors). For example, the gain, noise reduction, dynamic range, linearity and/or any other characteristic of the processor, or combinations of such characteristics, may be adapted to improve and/or optimize the processor to such wavelength or color (or band of wavelengths or colors). Tailoring the channel processing to the respective camera channel may facilitate generate an image of a quality that is higher than the quality of images resulting from traditional image sensors of like pixel count. In addition, providing each camera channel with a dedicated channel processor may help to reduce or simplify the amount of logic in the channel processors as the channel processor may not need to accommodate extreme shifts in color or wavelength, e.g., from a color (or band of colors) or wavelength (or band of wavelengths) at one extreme to a color (or band of colors) or wavelength (or band of wavelengths) at another extreme.

In operation, an optics portion of a camera channel receives light from within a field of view and transmits one or more portions of such light, e.g., in the form of an image at an image plane. The sensor array receives one or more portions of the light transmitted by the optics portion and provides one or more output signals indicative thereof. The one or more output signals from the sensor array are supplied to the processor. In some embodiments, the processor generates one or more output signals based, at least in part, on the one or more signals from the sensor array. For example, in some embodiments, each of the camera channels is dedicated to a different color (or band of colors) or wavelength (or band of wavelengths) than the other camera channels and the processor generates a separate image for each of such camera channels. In some other embodiments, the processor may generate a combined image based, at least in part, on the images from two or more of such camera channels. For example, in some embodiments, each of the camera channels is dedicated to a different color (or band of colors) or wavelength (or band of wavelengths) than the other camera channels and the processor combines the images from the two or more camera channels to provide a partial or full color image.

Although the processor 340 is shown separate from the one or more sensor arrays, e.g., sensor arrays 310A-310D, the processor 340, or portions thereof, may have any configuration and may be disposed in one or more locations. In some embodiments, one, some or all portions of the processor 340 are integrated in or disposed on the same substrate or substrates as one or more of the one or more of the sensor arrays, e.g., sensor arrays 310A-310D. In some embodiments one, some or all portions of the processor are disposed on one or more substrates that are separate from (and possibly remote from) one or more substrates on which one or more of the one or more sensor arrays, e.g., sensor arrays 310A-310D, may be disposed. For example, certain operations of the processor may be distributed to or performed by circuitry that is integrated in or disposed on the same substrate or substrates as one or more of the one or more of the sensor arrays and certain operations of the processor are distributed to or performed by circuitry that is integrated in or disposed on one or more substrates that are different from (whether such one or more different substrates are physically located within the camera or not) the substrates the one or more of the sensor arrays are integrated in or disposed on.

The digital camera apparatus 300 may or may not include a shutter, a flash and/or a frame to hold the components together.

Figure 9A:
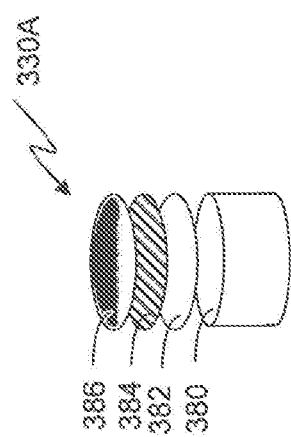
FIG. 9A is a schematic exploded representation of an optics portion that may be employed in a digital camera apparatus in accordance with one embodiment of the present invention.

FIG. 9A is a schematic exploded representation of one embodiment of an optics portion, e.g., optics portions 330A. In this embodiment, the optics portion 330A includes one or more lenses, e.g., a complex aspherical lens module 380, one or more color coatings, e.g., a color coating 382, one or more masks, e.g., an auto focus mask 384, and one or more IR coatings, e.g., an IR coating 386.

Lenses can comprise any suitable material or materials, including for example, glass and plastic. Lenses can be doped in any suitable manner, such as to impart a color filtering, polarization, or other property. Lenses can be rigid or flexible. In this regard, some embodiments employ a lens (or lenses) having a dye coating, a dye diffused in an optical medium (e.g., a lens or lenses), a substantially uniform color filter and/or any other filtering technique through which light passes to the underlying array.

The color coating 382 helps the optics portion filter (i.e., substantially attenuate) one or more wavelengths or bands of wavelengths. The auto focus mask 384 may define one or more interference patterns that help the digital camera apparatus perform one or more auto focus functions. The IR coating 386 helps the optics portion 330A filter a wavelength or band of wavelength in the IR portion of the spectrum.

Figure 9B:
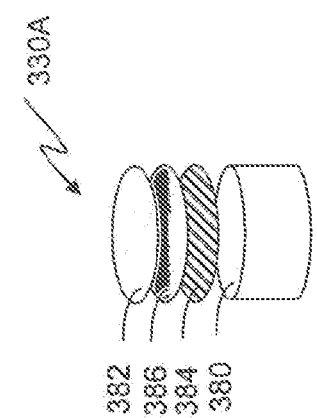
FIGS. 9B-9D are schematic exploded representations of optics portions that may be employed in a digital camera apparatus in accordance with further embodiments of the present invention.
Figure 9C:
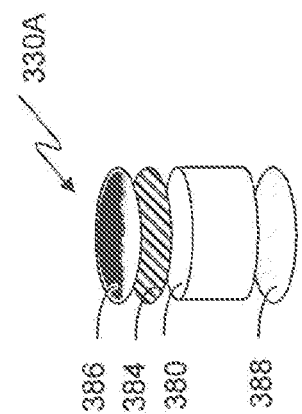
Figure 9D:
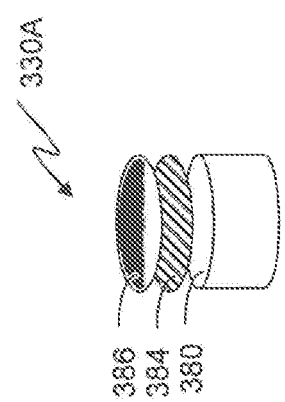

The one or more color coatings, e.g., color coating 382, one or more masks, e.g., mask 384, and one or more IR coatings, e.g., IR coating 386 may have any size, shape and/or configuration. In some embodiments, one or more of the one or more color coatings, e.g., the color coating 382, are disposed at the top of the optics portion (see, for example, FIG. 9B). Some embodiments of the optics portion (and/or components thereof) may or may not include the one or more color coatings, one or more masks and one or more IR coatings and may or may not include features in addition thereto or in place thereof. In some embodiments, for example, one or more of the one or more color coatings, e.g., the color coating 382, are replaced by one or more filters 388 disposed in the optics portion, e.g., disposed below the lens (see, for example, FIG. 9C). In other embodiments, one or more of the color coatings are replaced by one or more dyes diffused in the lens (see, for example, FIG. 9D).

The one or more optics portions, e.g., optics portions 330A-330D, may or may not be identical to one another. In some embodiments, for example, the optics portions are identical to one another. In some other embodiments, one or more of the optics portions are different, in one or more respects, from one or more of the other optics portions. For example, in some embodiments, one or more of the characteristics (for example, but not limited to, its type of element(s), size, response, and/or performance) of one or more of the optics portions is tailored to the respective sensor array and/or to help achieve a desired result. For example, if a particular camera channel is dedicated to a particular color (or band of colors) or wavelength (or band of wavelengths) then the optics portion for that camera channel may be adapted to transmit only that particular color (or band of colors) or wavelength (or band of wavelengths) to the sensor array of the particular camera channel and/or to filter out one or more other colors or wavelengths. In some of such embodiments, the design of an optical portion is optimized for the respective wavelength or bands of wavelengths to which the respective camera channel is dedicated. It should be understood, however, that any other configurations may also be employed. Each of the one or more optics portions may have any configuration.

In some embodiments, each of the optics portions, e.g., optics portions 330A-330D, comprises a single lens element or a stack of lens elements (or lenslets), although, as stated above, the present invention is not limited to such. For example, in some embodiments, a single lens element, multiple lens elements and/or compound lenses, with or without one or more filters, prisms and/or masks are employed.

An optical portion can also contain other optical features that are desired for digital camera functionality and/or performance. This can be things such as electronically tunable filters, polarizers, wavefront coding, spatial filters (masks), and other features not yet anticipated. Some of the new features (in addition to the lenses) can be electrically operated (such as a tunable filter) or be moved mechanically with MEMs mechanisms.

Referring to FIG. 10A-10F, an optics portion, such as for example, optics portion 330A, may include, for example, any number of lens elements, optical coating wavelength filters, optical polarizers and/or combination thereof. Other optical elements may be included in the optical stack to create desired optical features. FIG. 10A is a schematic representation of one embodiment of optics portion 330A in which the optics portion 330A comprises a single lens element 390. FIG. 10B is a schematic representation of another embodiment of the optics portion 330A in which the optics portion 330A includes two or more lens elements, e.g., lens elements 392A, 392B. The portions of an optics portion may be separate from one another, integral with one another, and/or any combination thereof. Thus, for example, the two lens elements 392A, 392B represented in FIG. 10B may be separate from one another or integral with one another.

FIGS. 10C-10F show schematic representations of example embodiments of optics portion 330A in which the optics portion 330A has one or more lens elements, e.g., lens elements 394A, 394B, and one or more filters, e.g., filter 394C. The one or more lens elements and desired optical features and/or optical elements may be separate from one another, integral with one another, and/or any combination thereof. Moreover, the one or more lens elements features and/or elements may be disposed in any configuration and/or sequence, for example, a lens-filter sequence (see for example FIG. 10C), lens-coding sequence (see for example FIG. 10D), a lens-polarizer sequence (see for example FIG. 10E), a lens-filter-coding-polarizer sequence (see for example FIG. 10F) and combinations and/or variations thereof.

In some embodiments, the filter 394C shown in FIG. 10C is a color filter that is made within the lenses, deposited on a lens surface or in the optical system as a separate layer on a support structure. The filter may be a single band pass or multiple bandpass filter. The coding 396C (FIG. 10D) may be applied or formed on a lens and/or provided as a separate optical element. In some embodiments, the coding 396C is used to modify the optical wavefront to allow improved imaging capability with additional post image processing. The optical polarizer 400E (FIG. 10E), may be of any type to improve image quality such as glare reduction. The polarizer 400E may be applied or formed on one or more optical surfaces and/or provided as a dedicated optical element.

FIGS. 10G-10H are schematic representations of optics portions in accordance with further embodiments of the present invention.

As stated above, the portions of an optics portion may be separate from one another, integral with one another and/or any combination thereof. If the portions are separate, they may be spaced apart from one another, in contact with one another or any combination thereof. For example, two or more separate lens elements may be spaced apart from one another, in contact with one another, or any combination thereof. Thus, some embodiments of the optics portion shown in FIG. 10G may be implemented with the lens elements 402A-402C spaced apart from one another, as is schematically represented in FIG. 10G, or with two or more of the lens elements 402A-402C in contact with one another, as is schematically represented in FIG. 10I. Further, a filter, e.g., 402D, may be implemented, for example, as a separate element 402D, as is schematically represented in FIG. 10G, or as a coating 402D disposed on the surface of a lens, for example, as schematically represented in FIG. 10J. The coating may have any suitable thickness and may be, for example, relatively thin compared to the thickness of a lens, as is schematically represented in FIG. 10K. Similarly, some embodiments of the optics portion shown in FIG. 10H may be implemented with the lens elements 404A-404D spaced apart from one another, as is schematically represented in FIG. 10H, or with two or more of the lens elements 404A-404D in contact with one another, as is schematically represented in FIG. 10L. The filter, e.g., filter 404E, may be implemented, for example, as a separate element 404E, as is schematically represented in FIG. 10H, or as a coating 404E disposed on the surface of a lens, for example, as schematically represented in FIG. 10M. The coating may have any suitable thickness and may be, for example, relatively thin compared to the thickness of a lens, as is schematically represented in FIG. 10N.

It should be understood that such techniques may be employed in combination with any of the embodiments disclosed herein, however, for purposes of brevity, such embodiments may or may not be individually shown and/or discussed herein.

In addition, as with each of the embodiments disclosed herein, it should be understood that any of the embodiments of FIGS. 10A-10N may be employed in combination with any other embodiments, or portion thereof, disclosed herein. Thus, the embodiments of the optics portions shown in FIGS. 10G-10N may further include a coding and/or a polarizer.

One or more of the camera channels, e.g., 350A-350D, may employ an optical portion that transmits a narrower band of wavelengths (as compared to broadband), for example, R, G or B, which in some embodiments, may help to simplify the optical design. For example, in some embodiments, image sharpness and focus is easier to achieve with an optics portion having a narrow color band than with a traditional digital camera that uses a single optical assembly and a Bayer color filter array. In some embodiments, the use of multiple camera channels to detect different bands of colors allows a reduction in the number of optical elements in each camera channel. Additional optical approaches such as diffractive and aspherical surfaces may result in further optical element reduction. In addition, in some embodiments, the use of optical portions that transmits a narrower band of wavelengths allows the use of color filters that can be applied directly in the optical material or as coatings. In some embodiments, the optical transmission in each band is greater than that traditionally provided by the color filters utilized with on-chip color filter arrays. In addition, the transmitted light does not display the pixel to pixel variation that is observed in color filter array approaches. Further, in some embodiments, the use of multiple optics and corresponding sensor arrays helps to simplify the optical design and number of elements because the chromatic aberration is much less in a narrower wavelength band as compared to broadband optics.

In some embodiments, each optical portion transmits a single color or band of colors, multiple colors or bands of colors, or broadband. In some embodiments, one or more polarizers that polarize the light, which may enhance image quality.

In certain embodiments, e.g., if an optical portion transmits multiple bands of colors or broadband, a color filter array (e.g., a color filter array with a Bayer pattern) may be disposed between the lens and the sensor array and/or the camera channel may employ a sensor array capable of separating the colors or bands of colors.

In some embodiments, an optical portion may itself have the capability to provide color separation, for example, similar to that provided by a color filter array (e.g., a Bayer pattern or variation thereof).

In certain embodiments, a wide range of optics material choices are available for the optical portions, including, for example, but not limited to, molded glasses and plastics.

In some embodiments, one or more photochromic (or photochromatic) materials are employed in one or more of the optical portions. The one or more materials may be incorporated into an optical lens element or as another feature in the optical path, for example, above one or more of the sensor arrays. In some embodiments, photochromatic materials may be incorporated into a cover glass at the camera entrance (common aperture) to all optics (common to all camera channels), or put into the lenses of one or more camera channels, or into one or more of the other optical features included into the optical path of an optics portion over any sensor array.

Some embodiments employ an optics design having a single lens element. Some other embodiments employ a lens having multiple lens elements (e.g., two or more elements). Lenses with multiple lens elements may be used, for example, to help provide better optical performance over a broad wavelength band (such as conventional digital imagers with color filter arrays on the sensor arrays). For example, some multi-element lens assemblies use a combination of single elements to help minimize the overall aberrations. Because some lens elements have positive aberrations and others have negative aberrations, the overall aberrations can be reduced. The lens elements may be made of different materials, may have different shapes and/or may define different surface curvatures. In this way, a predetermined response may be obtained. The process of determining a suitable and/or optimal lens configuration is typically performed by a lens designer with the aid of appropriate computer software.

Some embodiments employ an optics portion having three lens elements or lenslets. The three lenslets may be arranged in a stack of any configuration and spaced apart from one another, wherein each of the lenslets defines two surface contours such that the stack collectively defines six surface curvatures and two spaces (between the lenslets). In some embodiments, a lens with three lenslets provides sufficient degrees of freedom to allow the designer to correct all third order aberrations and two chromatic aberrations as well as to provide the lens with an effective focal length, although this is not a requirement for every embodiment nor is it a requirement for embodiments having three lenslets arranged in a stack.

In that regard, FIGS. 11A-11B are schematic and side elevational views, respectively, of a lens 410 used in an optics portion adapted to transmit red light or a red band of light, e.g., for a red camera channel, in accordance with another embodiment of the present invention. In this embodiment, the lens 410 includes three lenslets, i.e., a first lenslet 412, a second lenslet 414 and a third lenslet 416, arranged in a stack 418. The lens 410 receives light from within a field of view and transmits and/or shapes at least a portion of such light to produce an image in an image area at an image plane 419. More particularly, the first lenslet 412 receives light from within a field of view and transmits and/or shapes at least a portion of such light. The second lenslet 414 receives at least a portion of the light transmitted and/or shaped by the first lenslet and transmits and/or shapes a portion of such light. The third lenslet 416 receives at least a portion of the light transmitted and/or shaped by the second lenslet and transmits and/or shapes a portion of such light to produce the image in the image area at the image plane 419.

FIGS. 12A-12B are schematic and side elevational views, respectively, of a lens 420 used in an optics portion adapted to transmit green light or a green band of light, e.g., for a green camera channel, in accordance with another embodiment of the present invention. In this embodiment, the lens 420 includes three lenslets, i.e., a first lenslet 422, a second lenslet 424 and a third lenslet 426, arranged in a stack 428. The stack 428 receives light from within a field of view and transmits and/or shapes at least a portion of such light to produce an image in an image area at an image plane 429. More particularly, the first lenslet 422 receives light from within a field of view and transmits and/or shapes at least a portion of such light. The second lenslet 424 receives at least a portion of the light transmitted and/or shaped by the first lenslet and transmits and/or shapes a portion of such light. The third lenslet 426 receives at least a portion of the light transmitted and/or shaped by the second lenslet and transmits and/or shapes a portion of such light to produce the image in the image area at the image plane 429.

FIGS. 13A-13B are schematic and side elevational views, respectively, of a lens 430 used in an optics portion adapted to transmit blue light or a blue band of light, e.g., for a blue camera channel, in accordance with another embodiment of the present invention. In this embodiment, the lens 430 includes three lenslets, i.e., a first lenslet 432, a second lenslet 434 and a third lenslet 436, arranged in a stack 438. The lens 430 receives light from within a field of view and transmits and/or shapes at least a portion of such light to produce an image in an image area at an image plane 439. More particularly, the first lenslet 432 receives light from within the field of view and transmits and/or shapes at least a portion of such light. The second lenslet 434 receives at least a portion of the light transmitted and/or shaped by the first lenslet and transmits and/or shapes a portion of such light. The third lenslet 436 receives at least a portion of the light transmitted and/or shaped by the second lenslet and transmits and/or shapes a portion of such light to produce the image in the image area at the image plane 439.

FIG. 14 is a schematic view of a lens 440 used in an optics portion adapted to transmit red light or a red band of light, e.g., for a red camera channel, in accordance with another embodiment of the present invention. The lens 440 in this embodiment may be characterized as 60 degree, full field of view. In this embodiment, the lens 440 includes three lenslets, i.e., a first lenslet 442, a second lenslet 444, and a third lenslet 446, arranged in a stack 448. The lens 440 receives light from within a field of view and transmits and/or shapes at least a portion of such light to produce an image in an image area at an image plane 449. More particularly, the first lenslet 442 receives light from within a field of view and transmits and/or shapes at least a portion of such light. The second lenslet 444 receives at least a portion of the light transmitted and/or shaped by the first lenslet and transmits and/or shapes a portion of such light. The third lenslet 446 receives at least a portion of the light transmitted and/or shaped by the second lenslet and transmits and/or shapes a portion of such light to produce the image in the image area at the image plane 449.

FIGS. 15A-15F are schematic representations of some other types of lenses that may be employed. More particularly, FIGS. 15A-15E are schematic representations of other lenses 450-458 that include a stack having three lenslets 450A-450C, 452A-452C, 454A-454C, 456A-456C, 458A-458C. FIG. 15F is a schematic representation of a lens 460 having only one lens element. It should be understood however, that an optics portion may have any number of components and configuration.

Figure 16C:
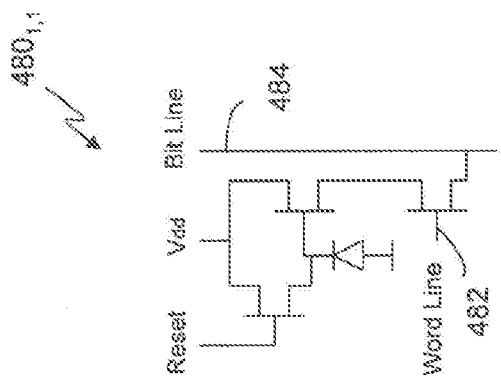
FIG. 16C is a schematic representation of circuit that may be employed in the pixel of FIG. 16B, in accordance with one embodiment of the present invention.
Figure 16A:
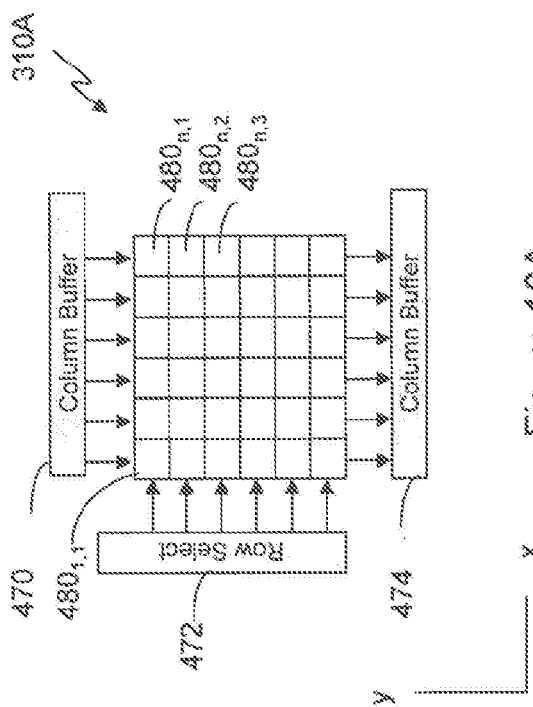
FIG. 16A is a schematic representation of a sensor array and circuits connected thereto, which may be employed in a digital camera apparatus in accordance with one embodiment of the present invention.
Figure 16B:
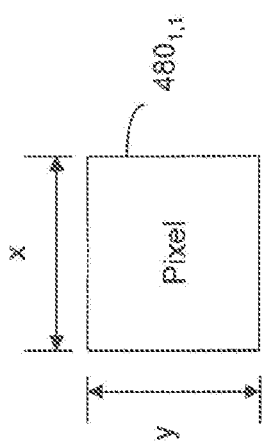
FIG. 16B is a schematic representation of a pixel of the sensor array of FIG. 16A.

FIGS. 16A-16C are representations of one embodiment of a sensor array, e.g., sensor array 310A, and circuits connected thereto, e.g., 470-474. The purpose of the sensor array, e.g., sensor array 310A, is to capture light and convert it into one or more signals (e.g., electrical signals) indicative thereof, which are supplied to one or more of the circuits connected thereto, for example as described below. Referring to FIG. 16A, the sensor array includes a plurality of sensor elements such as for example, a plurality of identical photo detectors (sometimes referred to as "picture elements" or "pixels"), e.g., pixels $480_{1,1}$-$480_{n,m}$. The photo detectors, e.g., photo detectors $480_{1,1}$-$480_{n,m}$ are arranged in an array, for example a matrix type array. The number of pixels in the array may be, for example, in a range from hundreds of thousands to millions. The pixels may be arranged for example, in a 2 dimensional array configuration, for example, having a plurality of rows and a plurality of columns, e.g., 640×480, 1280×1024 etc. However, the pixels can be sized and dimensioned as desired, and can be distributed in any desired pattern. Pixels that are distributed without any regular pattern could even be used. Referring to FIG. 16B, a pixel, e.g., pixel $480_{1,1}$, may be viewed as having dimensions, e.g., x and y dimensions, although it should be recognized that the photon capturing portion of a pixel may or may not occupy the entire area of the pixel and may or may not have a regular shape. In some embodiments, the sensor elements are disposed in a plane, referred to herein as a sensor plane. The sensor may have orthogonal sensor reference axes, including for example, an x axis, a y axis, and a z axis, and may be configured so as to have the sensor plane parallel to the xy plane XY and directed toward the optics portion of the camera channel. Each camera channel has a field of view corresponding to an expanse viewable by the sensor array. Each of the sensor elements may be, for example, associated with a respective portion of the field of view.

The sensor array may employ any type of technology, for example, but not limited to MOS pixel technologies (meaning that one or more portions of the sensor are implemented in "Metal Oxide Semiconductor" technology), charge coupled device (CCD) pixel technologies or combination of both (hybrid) and may comprise any suitable material or materials, including, for example, silicon, germanium and/or combinations thereof. The sensor elements or pixels may be formed in any suitable manner.

In operation, the sensor array, e.g., sensor array 310A, is exposed to light, for example, on a sequential line per line basis (similar to scanner) or globally (similar to conventional film camera exposure). After being exposed to light for certain period of time (exposure time), the pixels, e.g., pixels $480_{1,1}$-$480_{n,m}$ may be read out, e.g., on a sequential line per line basis.

In some embodiments, circuitry sometimes referred to as column logic, e.g., column logic 470, is used to read the signals from the pixels, e.g., pixels $480_{1,1}$-$480_{n,m}$. Referring to FIG. 16C, a schematic representation of a pixel circuit, in some of such embodiments, the sensor elements, e.g., pixel $480_{1,1}$, may be accessed one row at a time by asserting one of the word lines, e.g., word line 482, which run horizontally through the sensor array, e.g., sensor array 310A. Data may passed into and/or out of the sensor elements, e.g., pixel $480_{1,1}$, via bit lines which run vertically through the sensor array, e.g., sensor array 310A.

It should be recognized that pixels are not limited to the configurations shown in FIGS. 16A-16C. As stated above, each of the one or more sensor arrays may have any configuration (e.g., size, shape, pixel design).

The sensor arrays, e.g., sensor arrays 310A-310D, may or may not be identical to one another. In some embodiments, for example, the sensor arrays are identical to one another. In some other embodiments, one or more of the sensor arrays are different, in one or more respects, from one or more of the other sensor arrays. For example, in some embodiments, one or more of the characteristics (for example, but not limited to, its type of element(s), size (for example, surface area), and/or performance) of one or more of the sensor arrays is tailored to the respective optics portion and/or to help achieve a desired result. For example, if a particular camera channel is dedicated to a particular color (or band of colors) or wavelength (or band of wavelengths), the sensor array for that camera channel may be adapted to have a sensitivity that is higher to that particular color (or band of colors) or wavelength (or band of wavelengths) than other colors or wavelengths and/or to sense only that particular color (or band of colors) or wavelength (or band of wavelengths). In some of such embodiments, the design, operation, array size (for example, surface area of the active portion of the array), shape of the pixel of a sensor array (for example, the shape of the active area (surface area of the pixel that is sensitive to light) of the pixel) and/or pixel size of a sensor array (for example, the active area of the surface of the pixel) is determined, selected, tailored and/or optimized for the respective wavelength or bands of wavelengths to which the camera channels are dedicated. It should be understood, however, that any other configurations may also be employed. Each of the one or more sensor arrays may have any configuration (e.g., size and shape).

As described herein, each sensor array may be, for example, dedicated to a specific band of light (visible and/or invisible), for example, one color or band of colors. If so, each sensor array may be tuned so as to be more efficient in capturing and/or processing an image or images in its particular band of light.

In this embodiment, the well depth of the photo detectors across each individual array is the same, although in some other embodiments, the well depth may vary. For example, the well depth of any given array can readily be manufactured to be different from that of other arrays of the sensor subsystem. Selection of an appropriate well depth could depend on many factors, including most likely the targeted band of visible spectrum. Since each entire array is likely to be targeted at one band of visible spectrum (e.g., red) the well depth can be designed to capture that wavelength and ignore others (e.g., blue, green).

Doping of the semiconductor material in the color specific arrays may enhance the selectivity of the photon absorption for color specific wavelengths.

In some embodiments, the pixels may be responsive to one particular color or band of colors (i.e., wavelength or band of wavelengths). For example, in some such embodiments, the optics portion may include lenses and/or filters that transmit only the particular color or band of colors and/or attenuate wavelength or band of wavelengths associated with other colors or band of colors. Is some others of such embodiments, a color filter and/or color filter array is disposed over and/or on one or more portions of one or more sensor arrays. In some other embodiments, there is no color filter or color filter array disposed on any of the sensor arrays. In some embodiments, the sensor array separates colors or bands of colors. In some such embodiments, the sensor array may be provided with pixels that have multiband sensing capability, e.g., two or three colors. For example, each pixel may comprise two or three photodiodes, wherein a first photodiode is adapted to detect a first color or first band of colors, a second photodiode is adapted to detect a second color or band of colors and a third photodiode is adapted to detect a third color or band of colors. One way to accomplish this is to provide the photodiodes with different structures/characteristics that make them selective, such that first photodiode has a higher sensitivity to the first color or first band of colors than to the second color or band of colors, and the second photodiode has a higher sensitivity to the second color or second band of colors than to the first color or first band of colors. Another way is to dispose the photodiodes at different depths in the pixel, which takes advantage of the different penetration and absorption characteristics of the different colors or bands of colors. For example, blue and blue bands of colors penetrate less (and are thus absorbed at a lesser depth) than green and green bands of colors, which in turn penetrate less (and are thus absorbed at a lesser depth) than red and red bands of colors. In some embodiments, such a sensor array is employed even though the pixels may see only one particular color or band of colors, for example, in order to adapt such sensor array to the particular color or band of colors. Indeed, a layer of material that attenuates certain wavelengths and passes other wavelengths may be disposed on or integrated into the surface of the photodiode. In this way, each pixel function as a plurality of photodiodes that is adapted to sense multiple wavelengths.

Figure 17A:
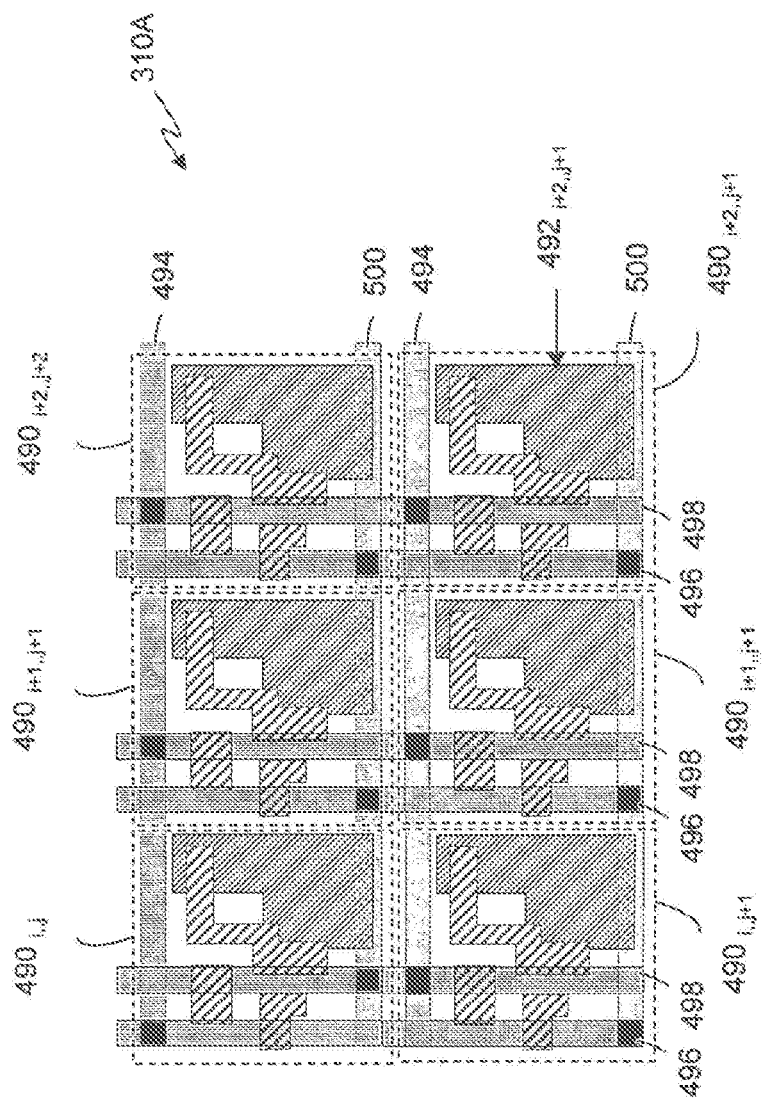
FIG. 17A is a schematic representation of a portion of a sensor array in accordance with another embodiment of the present invention.

FIG. 17A is a schematic plan view of a portion of a sensor array, e.g., a portion of sensor array 310A, in accordance with one embodiment of the present invention. The portion of the array includes six unit cells, e.g., cells $490_{i,j}$-$490_{i+2,j+1}$. Each unit cell has a pixel region, e.g., unit cell $490_{i+2,j+1}$ has a pixel region $492_{i+2,j+1}$. The pixel region may be, for example, but is not limited to, a p implant region. The sensor elements, e.g., pixels $492_{i,j}$-$492_{i+2,j+1}$, may be accessed one row at a time by asserting one of the word lines, e.g., word lines 494, which may run, for example, horizontally through the sensor array, e.g., sensor array 30A. Power may be provided on power lines, e.g., power lines 496, which may for example, run vertically through the sensor array. Data may passed into and/or out of the sensor elements, e.g., pixels $492_{i,j}$-$492_{i+2,j+1}$, via bit lines, e.g., bit lines 498, which may run, for example, vertically through the sensor array, e.g., sensor array 310A. Reset may be initiated via reset lines, e.g., reset lines 500, which may run, for example, horizontally through the sensor array.

In some embodiments, each sensor array has 1.3 M pixels. In such embodiments, three camera channels may provide an effective resolution of about 4 M pixels. Four camera channels may provide an effective resolution of about 5.2 M pixels.

In some other embodiments, each sensor array has 2 M pixels. In such embodiments, three camera channels may provide an effective resolution of about 6 M pixels. Four camera channels may provide an effective resolution of about 8 M pixels.

It should be recognized that the sensor arrays are not limited to the design shown in FIG. 17A. As stated above, each of the one or more sensor arrays may have any configuration (e.g., size, shape, pixel design).

FIG. 17B is exemplary schematic cross section of the implant portion of a pixel having a single well to capture all wavelengths.

For example, FIG. 17C is exemplary schematic cross section of an implant portion of a pixel having a well formed "deep" in the semiconductor (for example, silicon) such that the depth of the implant is adapted or suitable to improve capture or collect of light having wavelengths in the range associated with the color red (among others). As such, the embodiment illustrated in FIG. 17C includes a deep implant formation of the junction to create a high efficiency red detector in which photons are collected, detected or captured deep in the semiconductor. In this embodiment, it may be advantageous to employ a color filter or optical filtration of the light prior to incidence on the pixel in order to substantially attenuate light having wavelengths associated with colors other than red (photons having wavelengths in the range associated with red).

The well depth of the pixel or photo detector may be predetermined, selected and/or designed to tune the response to the photo detector. In this regard, with reference to FIG. 17D, a pixel "tuned" to capture, collect or respond to photons having wavelengths in the range associated with the color blue is illustrated. The exemplary schematic cross section of an implant portion of a pixel includes a well formed "near the surface" in the semiconductor (for example, silicon) such that the depth of the implant is adapted or suitable to improve capture or collect of light having wavelengths in the range associated with the color blue. Accordingly, relative to FIG. 17C, a shallow junction is formed in the semiconductor which is optimized for collecting, detecting or capturing wavelengths in the range associated with the color blue near the surface of the detector (relative to FIG. 17C). As such, in this embodiment, a filter may be omitted due to selectively implanting the region at a particular depth. That is, filter material may be unnecessary as both green and red photons pass through the collection region collecting, detecting or capturing mainly the blue signal (photons having wavelengths in the range associated with the color blue).

With reference to FIG. 17E, the pixel or photo detector may be "tuned" to capture, collect or respond to photons having wavelengths primarily in the range associated with the color red. Here, the well region is formed and/or confined at a depth that is associated primarily with wavelengths of the color red.

With reference to FIG. 17F, the pixel or photo detector may be "tuned" to capture, collect or respond to photons having wavelengths primarily in the range associated with the color green. Here, the well region is formed and/or confined at a depth that is associated primarily with wavelengths of the color green.

Notably, the pixel or photo detector may be "tuned" to capture, collect or respond to photons having wavelengths primarily in the range associated with any color. In this regard, the well region of the pixel or photo detector is formed and/or confined at a depth that is associated primarily with wavelengths of the color to be captured or collected. In these embodiments, the specific regions for collection can be formed by buried junctions within the semiconductor base material. In this case by varying the buried junction depth and shape, wavelength selectivity can be achieved. Together with the optical path further selectivity and wavelength responsivity can allow for single or multiple band pass detectors.

Figure 17G:
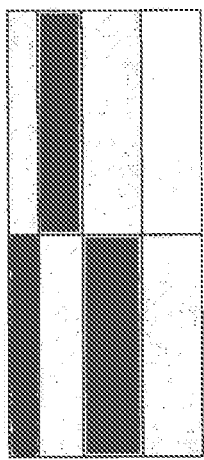

The pixel or photo detector may be "tuned" to capture, collect or respond to photons having wavelengths primarily in the range associated with more than one color. For example, with reference to FIG. 17G, a first pixel (located on the left) includes well regions formed and/or confined at a depth that are associated primarily with wavelengths of the colors red (deep) and blue (more shallow). As such, this pixel or photo detector is "tuned" to capture or collect incident photons having wavelengths primarily in the range associated with two colors. The pixel on the right includes a well region formed and/or confined at a depth that is associated primarily with wavelengths of one color, here green. The sensor array may include one, some or all of the pixels (located on the left or the right). Moreover, the sensor array may include a pattern of both types of pixels.

Figure 17H:
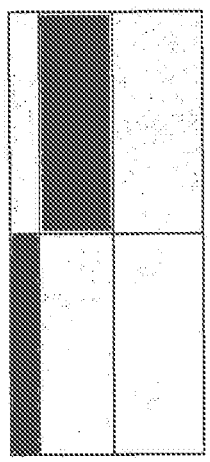

Notably, the pixel or photo detector may be "tuned" to capture, collect or respond to photons having wavelengths primarily in the range associated with any two or more colors (provided that such colors are sufficiently spaced to permit appropriate sensing). (See for example, FIG. 17H—blue and green sensed via the pixel located on the left and green and red sensed via the pixel located on the right).

Figure 17J:
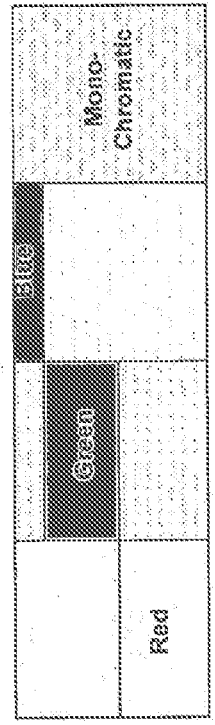
Figure 17I:
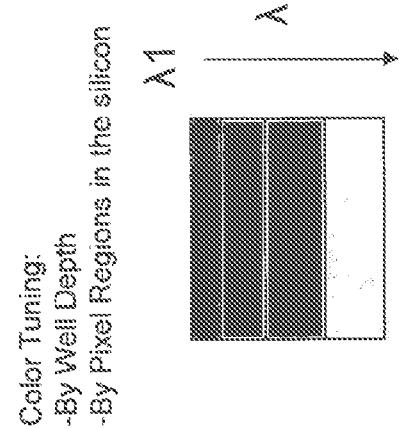
Figure 17K:
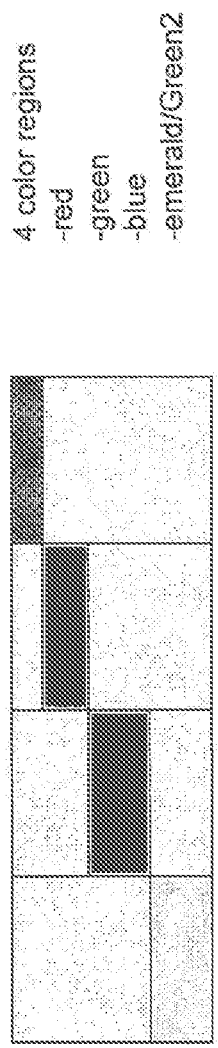

There are many embodiments related to tuning the depth of the well and/or region of the pixel or photo detector, for example,

- λ3/λ2/λ1 (e.g. R/G/B) color filter array on individual pixels
- λ3/μ2/λ1 (e.g. R/G/B) photodiodes in individual pixels
- λ3/λ1 (e.g. R/B) photodiodes in one pixel, λ2 (e.g. G) in one pixel
- λ3/λ2/λ1 (e.g. R/G/B) photodiodes in one pixel [0448] λ4/λ2 (e.g. R/G1) photodiodes in one pixel, λ3/λ1 (e.g. G2/B) in one pixel
- λ4/λ3/λ2/λ1 (e.g. R/G2/G1/B) color filter arrays on individual pixels
- λ4/λ3/λ2/λ1 (e.g. R/G2/G1/B) photodiodes in one pixel (see for example, FIG. 17I)
- λ4/λ3/λ2/λ1 (e.g. R/G2/G1/B) photodiodes in individual pixels (see for example, FIGS. 17J-17K)

Note: wavelength bands from λ1 to λ4 represent increasing wavelengths and can range from the UV to IR (e.g. 200-1100 nm for silicon photodiodes)

All embodiments for related to tuning the depth of the well and/or region of the pixel or photo detector, are intended to fall within the scope of the present invention and, as such, may be implemented in any of the embodiments described and illustrated herein.

In sum, since each array of photo detectors is separate from the other, and unlike conventional arrays which can only be processed in a like manner due to the proximity of adjacent photo detectors, various implant and junction configurations may be achieved by this invention. Using one or more of the techniques and/or embodiments described above or a combination of filters and wavelength specific detectors, various photo detector topologies can be achieved.

The configuration of a sensor array (e.g., number, shape, size type and arrangement of sensor elements) may impact the characteristics of the sensed images. For example, FIGS. 18A-18B are explanatory representations depicting an image being captured by a portion of a sensor array, e.g., 310A. More particularly, FIG. 18A is a explanatory view of an image of an object (a lightning bolt) striking a portion of the sensor array. In this example, the photon capturing portions (or active area), e.g., photon capturing portion 502, of the sensor elements are represented generally represented by circles although in practice, a pixel can have any shape including for example, an irregular shape. For purposes of this example, photons that strike the photon capturing portion or active area of the pixel or photo detector (e.g., photons that strike within the circles 502) are sensed and/or captured thereby. FIG. 18B shows the portion of the photons, e.g., portion 504, that are captured by the sensor in this example. Photons that do not strike the sensor elements (e.g., photons that striking outside circles 502) are not sensed/captured.

FIGS. 19A-19B are explanatory representations depicting an image being captured by a portion of a sensor, e.g., sensor array 310A, that has more sensor elements and closer spacing of such elements than is provided in the sensor of FIG. 18A. More particular, FIG. 19A shows an image of an object (a lightning bolt) striking the sensor. For purposes of this example, photons that strike the photon capturing portion, e.g., photon capturing portion 506, are sensed and/or captured thereby. FIG. 19B shows the portions of the photons, e.g., portion 508, that are captured by the sensor in this example. Notably, the sensor of FIG. 19A captures more photons than the sensor of FIG. 18A.

FIGS. 20A-20B are schematic representations of a relative positioning provided for an optics portion, e.g., optics portion 330A, and a respective sensor array, e.g., sensor array 310A, in some embodiments. In that regard, it should be understood that, although, FIGS. 20A-20B shows the optics portion having an axis, e.g., axis 510A, aligned with an axis, e.g., axis 512A, of the sensor array, some embodiments may not employ such an alignment. In addition, in some embodiments, the optics portion and/or the sensor array may not have an axis.

Figure 21:
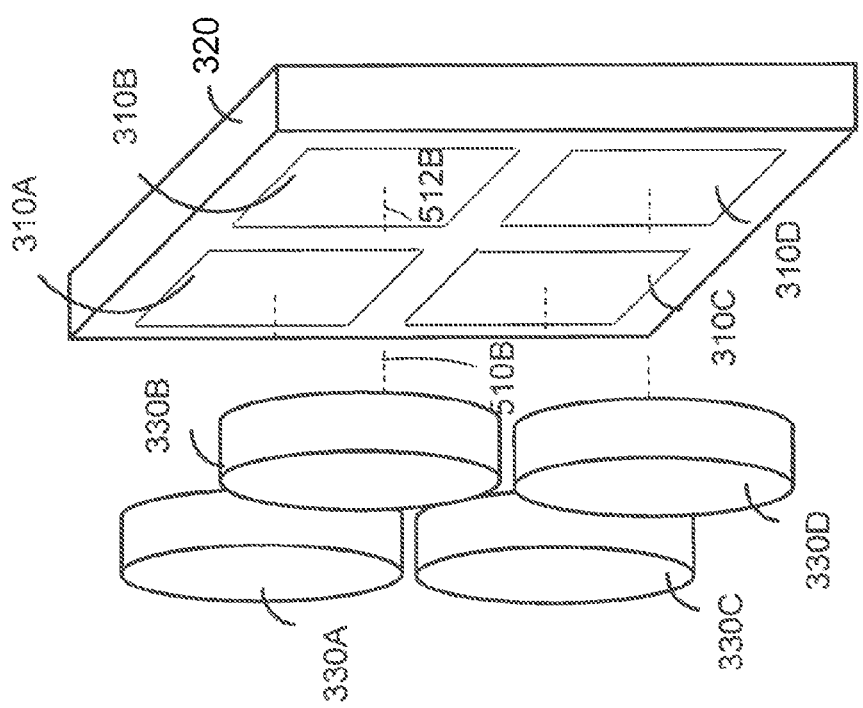
FIG. 21 is a schematic representation of a relative positioning that may be provided for four optics portions and four sensor arrays, in accordance with one embodiment of the present invention.

FIG. 21 is a schematic representation of a relative positioning provided for four optics portions, e.g., optics portions 330A-330D, and four sensor arrays, e.g., sensor arrays 310A-310D, in some embodiments. Although FIG. 21 shows each of the optics portions, e.g., optics portion 330B, having an axis, e.g., axis 510B, aligned with an axis, e.g., axis 512B, of the respective sensor array, e.g., sensor array 310B, it should be understood that some embodiments may not employ such an alignment. In addition, in some embodiments, the one or more of the optics portions and/or one or more of the sensor arrays may not have an axis.

In some embodiments, the optics portion is generally about the same size as the respective sensor array, and may therefore differ from one another in size and shape depending upon the dimensions of the underlying array. There is, however, no requirement that a given optics portion cover all, or only, the underlying array. In some alternative embodiments an optics portion could cover only a portion of an array and/or could extend beyond the array.

FIGS. 22A-22B are a schematic plan view and a schematic cross sectional view, respectively, of one embodiment of an image device 520 in or on which one or more sensor arrays, e.g., sensor arrays 310A-310D, may be disposed and/or integrated, and the image areas of the respective optics portions, e.g., optics portions 330A-330D, in accordance with one embodiment of the present invention. In this embodiment, the image device 520 has first and second major surfaces 522, 524 and an outer perimeter defined by edges 526, 528, 530 and 532. The image device 520 defines the one or more regions, e.g., regions 534A-534D, for the active areas of the one or more sensor arrays, e.g., sensor arrays 310A-310D, respectively. The image device further defines one or more regions, e.g., regions 536A-536D, respectively, and 538A-538D, respectively, for the buffer and/or logic associated with the one or more sensor arrays, e.g., sensor arrays 310A-310D, respectively.

The image device may further define one or more additional regions, for example, regions 540, 542, 544, 546 disposed in the vicinity of the perimeter of the image device (e.g., extending along and adjacent to one, two, three or four of the edges of the image device) and/or between the regions for the sensor arrays. In some embodiments, one or more electrically conductive pads, e.g., pads 550, 552, 554, 556, one or more portions of the processor, one or more portions of additional memory, and/or any other types of circuitry or features may be disposed in one or more of these regions, or portions thereof. One or more of such pads may be used in supplying one or more electrical signals and/or from one or more circuits on the image device to one or more other circuits located on or off of the image device.

In some embodiments, the major outer surface defines one or more support surfaces to support one or more portions of a support, e.g., support 320. Such support surfaces may be disposed in any region, or portion thereof, e.g., regions 540-546, however in some embodiments, it is advantageous to position the support surfaces outside the active areas of the sensor array so as not to interfere with the capture of photons by pixels in such areas.

The one or more optics portions, e.g., optics portions 330A-330D, produce image areas, e.g., image areas 560A-560D, respectively, at an image plane.

The image device, sensor arrays and image areas may each have any size(s) and shape(s). In some embodiments, the image areas are generally about the same size as the respective sensor arrays, and therefore, the image areas may differ from one another in size and shape depending upon the dimensions of the underlying sensor arrays. Of course, there is no requirement that an image area cover all, or only, the underlying array. In alternative embodiments an image area could cover only a portion of an array, and could extend beyond the array.

In this embodiment, the image areas, e.g., image areas 560A-560D, extend beyond the outer perimeter of the sensor arrays, e.g., sensor arrays 310A-310D, respectively. The image device has a generally square shape having a first dimension 562 equal to about 10 mm and a second dimension 564 equal to about 10 mm, with each quadrant having a first dimension 566 equal to 5 mm and a second dimension 568 equal to 5 mm. Each of the image areas has a generally circular shape and a width or diameter 570 equal to about 5 millimeters (MM). Each of the active areas has a generally rectangular shape having a first dimension 572 equal to about 4 mm and a second dimension 574 equal to about 3 mm. The active area, may define for example, a matrix of 1200×900 pixels (i.e., 1200 columns, 900 rows).

FIGS. 23A-23B are a schematic plan view and a schematic cross sectional view, respectively, of the image device and image areas in accordance with another embodiment. In this embodiment, the image device 520 has one or more pads, e.g., 550-556, disposed in a configuration that is different than the configuration of the one or more pads in the embodiments shown above. The image device 520, sensor arrays, and image areas 560A-560D may have, for example, the same shape and dimensions as set forth above with respect to the embodiment of the image device shown in FIGS. 22A-22B.

FIGS. 24A-24B are a schematic plan view and a schematic cross sectional view, respectively, of the image device 520 and image areas in accordance with another embodiment. In this embodiment, the image device 520 has a vertically extending region, disposed between the sensor arrays, that is narrower than a vertically extending region, disposed between the sensor arrays, in the embodiment of the image device shown in FIGS. 22A-22B. Horizontally extending regions 542, 546, disposed along the perimeter are wider than horizontally extending regions 542, 546, disposed along the perimeter of the image device 520 shown in FIGS. 22A-22B. The image device 520 may have, for example, the same shape and dimensions as set forth above with respect to the embodiment of the image device shown in FIGS. 22A-22B.

FIGS. 25A-25B are a schematic plan view and a schematic cross sectional view, respectively, of the image device 520 and image areas, e.g., image areas 560A-560D, in accordance with another embodiment. In this embodiment, the image areas, e.g., image areas 560A-560D, do not extend beyond the outer perimeter of the sensor arrays, e.g., sensor arrays 310A-310D, respectively. The image device 520 and the sensor arrays may have, for example, the same shape and dimensions as set forth above with respect to the embodiment of the image device 520 shown in FIGS. 22A-22B.

FIGS. 26A-26B are a schematic plan view and a schematic cross sectional view, respectively, of the image device and image areas in accordance with another embodiment. In this embodiment, regions 540-546 disposed between the sensor arrays and the edges of the image device are wider than the regions 540-546 disposed between the sensor arrays and the edge of the image device in the embodiments of FIGS. 22A-22B. Such regions may be used, for example, for one or more pads, one or more portions of the processor, as a seat and/or mounting region for a support and/or any combination thereof.

In addition, in this embodiment, a horizontally extending region 564 disposed between the sensor arrays is wider than the horizontally extending region 546 between the sensor arrays in the embodiment of FIGS. 22A-22B. Such region 546 may be used, for example, for one or more pads, one or more portions of the processor, as a seat and/or mounting region for a support and/or any combination thereof. The image device and the sensor arrays may have, for example, the same shape and dimensions as set forth above.

As with each of the embodiments disclosed herein, this embodiment may be employed alone or in combination with one or more of the other embodiments disclosed herein, or portions thereof.

To that effect, for example, FIGS. 27A-27B are a schematic plan view and a schematic cross sectional view, respectively, of the image device 540 and image areas 560A-560D in accordance with another embodiment. This embodiment of the image device 520 and image areas 560A-560D is similar to the embodiment of the image device and image areas shown in FIGS. 26A-26B, except that the image areas, e.g., image areas 560A-560D, do not extend beyond the outer perimeter of the sensor arrays, e.g., sensor arrays 310A-310D, respectively.

Figure 28D:
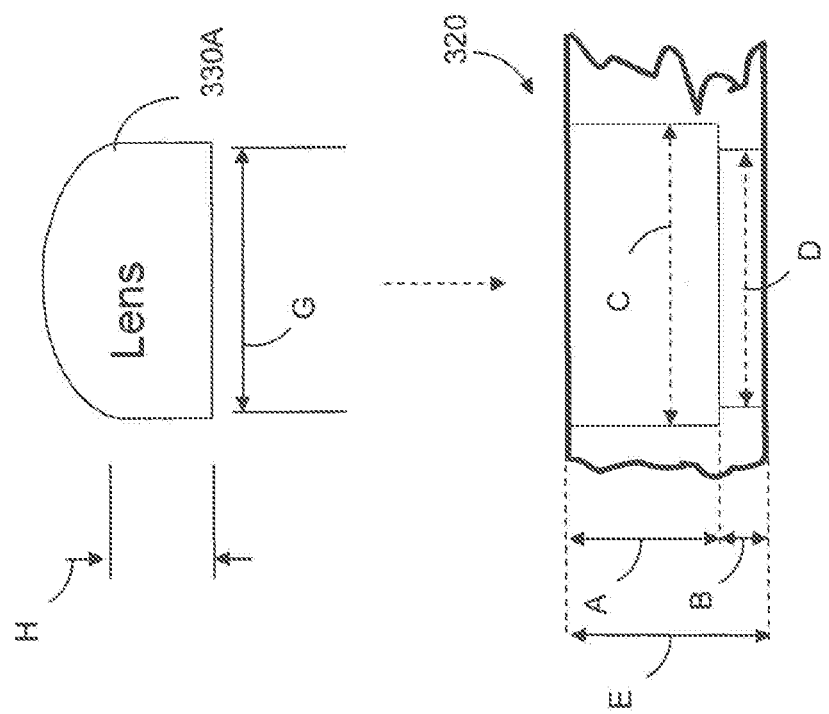
FIG. 28D is an enlarged exploded schematic cross sectional view of a portion of the support of FIG. 28A, taken along the direction A-A of FIG. 28B; and a lens that may be seated therein.
Figure 28A:
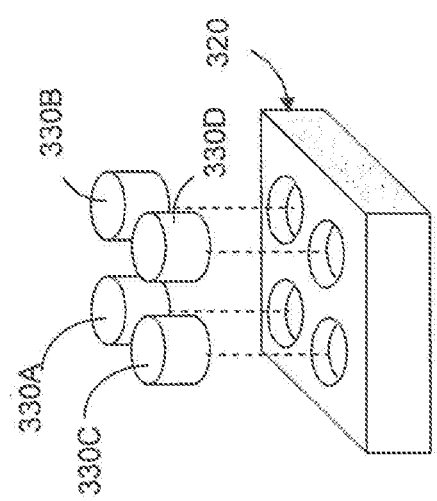
FIG. 28A is a schematic perspective view of a support and optics portions that may be seated therein, in accordance with one embodiment of the present invention.

FIG. 28A is a schematic perspective view of a support 320 in accordance with another embodiment of the present invention. The support 320 may have any configuration and may comprise, for example, but is not limited to, a frame. FIGS. 28B-28D are enlarged cross sectional views of the support 320. Referring to FIGS. 28A-28D, the optics portions of the one or more camera channels, e.g., optics portions 330A-330D, are supported by one or more supports, e.g., the support 320, which position(s) each of the optics portions in registration with a respective sensor array, at least in part. In this embodiment, for example, optics portion 330A is positioned in registration with sensor array 310A. Optics portion 330B is positioned in registration with sensor array 310B. Optics portion 330C is positioned in registration with sensor array 310C. Optics portion 330B is positioned in registration with sensor array 310B. Optics portion 330D is positioned in registration with sensor array 310D.

In some embodiments, the support 320 may also help to limit, minimize and/or eliminate light "cross talk" between the camera channels and/or help to limit, minimize and/or eliminate "entry" of light from outside the digital camera apparatus.

In some embodiments, the support 320 defines one or more support portions, e.g., four support portions 600A-600D, each of which supports and/or helps position a respective one of the one or more optics portions. In this embodiment, for example, support portion 600A supports and positions optics portion 330A in registration with sensor array 310A. Support portion 600B supports and positions optics portion 330B in registration with sensor array 310B. Support portion 600C supports and positions optics portion 330C in registration with sensor array 310C. Support portion 600D supports and positions optics portion 330D in registration with sensor array 310D.

In this embodiment, each of the support portions, e.g., support portions 600A-600D, defines an aperture 616 and a seat 618. The aperture 616 defines a passage for the transmission of light for the respective camera channel. The seat 618 is adapted to receive a respective one of the optics portions (or portion thereof) and to support and/or position the respective optics portion, at least in part. In this regard, the seat 618 may include one or more surfaces (e.g., surfaces 620, 622) adapted to abut one or more surfaces of the optics portion to support and/or position the optics portion, at least in part, relative to the support portion and/or one or more of the sensor arrays 310A-310D. In this embodiment, surface 620 is disposed about the perimeter of the optics portion to support and help position the optics portion in the x direction and the y direction). Surface 622 (sometimes referred to herein as "stop" surface) positions or helps position the optics portion in the z direction.

The position and/or orientation of the stop surface 622 may be adapted to position the optics portion at a specific distance (or range of distance) and/or orientation with respect to the respective sensor array. In this regard, the seat 618 controls the depth at which the lens is positioned (e.g., seated) within the support 320. The depth may be different for each lens and is based, at least in part, on the focal length of the lens. For example, if a camera channel is dedicated to a specific color (or band of colors), the lens or lenses for that camera channel may have a focal length specifically adapted to the color (or band of colors) to which the camera channel is dedicated. If each camera channels is dedicated to a different color (or band of colors) than the other camera channels, then each of the lenses may have a different focal length, for example, to tailor the lens to the respective sensor array, and each of the seats have a different depth.

Each optics portion may be secured in respective seat 618 in any suitable manner, for example, but not limited to, mechanically (e.g., press fit, physical stops), chemically (e.g., adhesive), electronically (e.g., electronic bonding) and/or combination thereof. The seat 618 may include dimensions adapted to provide a press fit for the respective optics portion.

The aperture (or portions thereof) may have any configuration (e.g., shape and/or size) including for example, cylindrical, conical, rectangular, irregular and/or any combination thereof. The configuration may be based, for example, on the desired configuration of the optical path, the configuration of the respective optical portion, the configuration of the respective sensor array and/or any combination thereof.

It should be understood that the support 320 may or may not have exactly four support portions, e.g., support portions 600A-600D. In some embodiments, for example, the support includes fewer than four support portions (e.g., one, two or three support portions) are used. In some other embodiments, the support includes more than four support portions. Although the support portions, 600A-600D are shown as being identical to one another, this is not required. Moreover, in some embodiments, one or more of the support portions may be isolated at least in part from one or more of the other support portions. For example, the support 320 may further define clearances or spaces that isolate the one or more inner support portions, in part, from one or more of the other support portions.

The support 320 may comprise any type of material(s) and may have any configuration and/or construction. In some embodiments, for example, the support 320 comprises silicon, semiconductor, glass, ceramic, plastic, or metallic materials and/or a combination thereof. If the support 320 has more than one portion, such portions may be fabricated separate from one another, integral with one another and/or any combination thereof. If the support defines more than one support portion, each of such support portions, e.g., support portions 600A-600D, may be coupled to one, some or all of the other support portions, as shown, or completely isolated from the other support portions. The support may be a solid device that may offer a wide range of options for manufacturing and material, however other forms of devices may also be employed. In some embodiments, for example, the support 320 comprises a plate (e.g., a thin plate) that defines the one or more support portions, with the apertures and seats being formed by machining (e.g., boring) or any other suitable manner. In some other embodiments, the support 320 is fabricated as a casting with the apertures defined therein (e.g., using a mold with projections that define the apertures and seats of the one or more support portions).

In some embodiments, the lens and support are manufactured as a single molded component. In some embodiments the lens may be manufactured with tabs that may be used to form the support.

In some embodiments, the support 320 is coupled and/or affixed directly or indirectly, to the image device. For example, the support 320 may be directly coupled and affixed to the image device (e.g., using adhesive) or indirectly coupled and/or or affixed to the image device via an intermediate support member (not shown).

The x and y dimensions of the support 320 may be, for example, approximately the same (in one or more dimensions) as the image device, approximately the same (in one or more dimensions) as the arrangement of the optics portions 330A-330D and/or approximately the same (in one or more dimensions) as the arrangement of the sensor arrays 310A-310D. One advantage of such dimensioning is that it helps keep the x and y dimensions of the digital camera apparatus as small as possible.

In some embodiments, it may be advantageous to provide the seat 618 with a height A that is the same as the height of a portion of the optics that will abut the stop surface 620. It may be advantageous for the stop surface 622 to be disposed at a height B (e.g., the distance between the stop surface 622 and the base of the support portion) that is at least as high as needed to allow the seat 618 to provide a firm stop for an optics portion (e.g., the lens) to be seated thereon. The width or diameter C of the portion of the aperture 616 disposed above the height of the stop surface 622 may be based, for example, on the width or diameter of the optics portion (e.g., the lens) to be seated therein and the method used to affix and/or retain that optics portion in the seat 618. The width of the stop surface 622 is preferably large enough to help provide a firm stop for the optics portion (e.g., the lens) yet small enough to minimize unnecessary blockage of the light transmitted by the optics portion. It may be desirable to make the width or diameter D of the portion of the aperture 616 disposed below the height of the stop surface 622 large enough to help minimize unnecessary blockage of the light transmitted by the optics portion. It may be desirable to provide the support with a height E equal to the minimum dimension needed to result in a support sturdy enough to support the one or more optics portions to be seated therein, in view of the considerations above, and may be advantageous to space the one or more apertures 616A-616D of the one or more support portions 600A-600D by a distance F that is as small as possible yet large enough that the support will be sturdy enough to support the optics portions to be seated therein. The support may have a length J and a width K.

In some embodiments, it is desirable to provide the seat 618 with a height A equal to 2.2 mm, to provide the stop surface 622 at a height B in the range of from 0.25 mm to 3 mm, to make the width or diameter C of the portion of the aperture above the height B of the stop surface 622 equal to approximately 3 mm, to make the width or diameter D of the lower portion of the aperture approximately 2.8 mm, to provide the support portion with a height E in the range from 2.45 mm to 5.2 mm and to space the apertures apart by a distance F of at least 1 mm. In some of such embodiments, it may be desirable to provide the support with a length J equal to 10 mm and a width K equal to 10 mm. In some other embodiments, it may be desirable to provide the support with a length J equal to 10 mm and a width K equal to 8.85 mm.

In some embodiments, one or more of the optics portions, e.g., optics portion 330A, comprises a cylindrical type of lens, e.g., a NT45-090 lens manufactured by Edmunds Optics, although this is not required. Such lens has a cylindrical portion with a diameter G up to 3 millimeters (mm) and a height H of 2.19 mm. In such embodiments, it may be desirable to employ a support having the dimensions and ranges set forth in the paragraph above.

In some embodiments, the support has a length J equal to 10 mm and a width K equal to 10 mm. In some other embodiments, it may be desirable to provide the support with a length J equal to 10 mm and a width K equal to 8.85 mm.

Figure 29B:
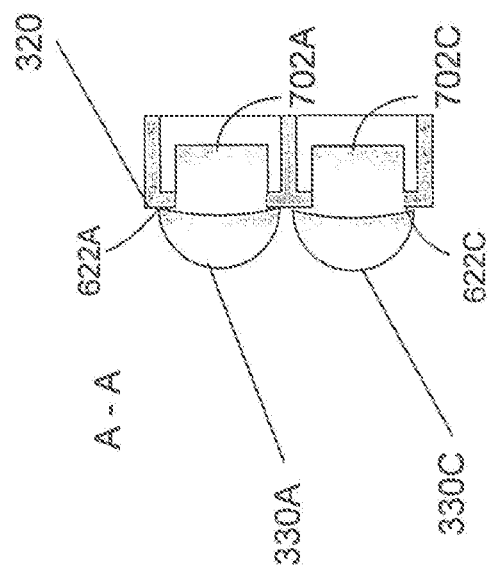
FIG. 29B is a schematic cross sectional view of a support and optics portions seated therein, in accordance with another embodiment of the present invention.
Figure 29A:
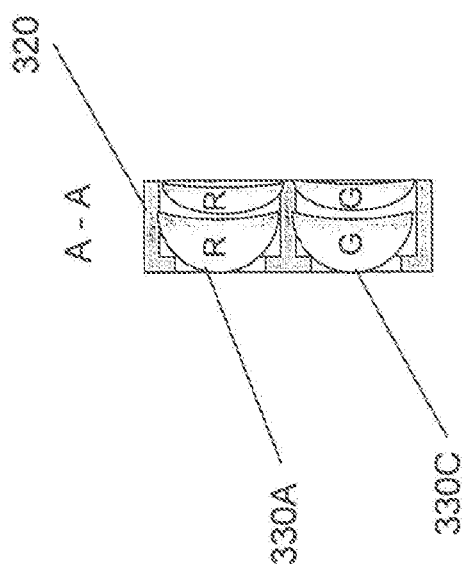
FIG. 29A is a schematic cross sectional view of a support and optics portions seated therein, in accordance with another embodiment of the present invention.
Figure 30D:
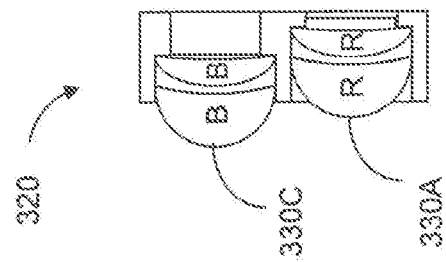
FIG. 30D is a schematic cross sectional view of the support of FIG. 30A, taken along the direction A-A of FIG. 30B; and a lens that may be seated therein.
Figure 30C:
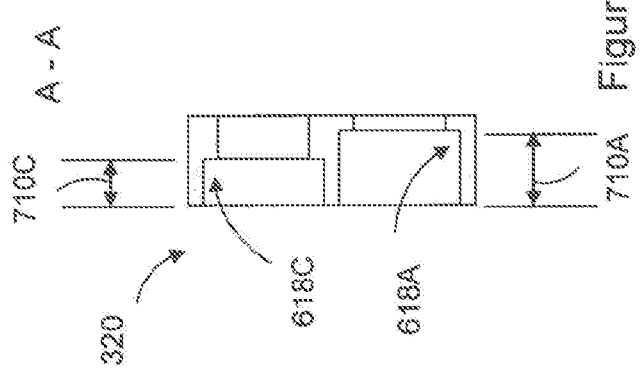
FIG. 30C is a schematic cross sectional view of the support of FIG. 30A, taken along the direction A-A of FIG. 30B.
Figure 30A:
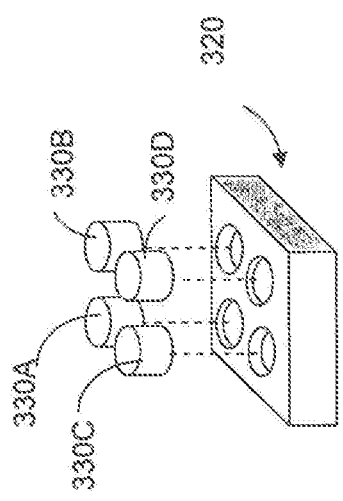
FIG. 30A is a schematic perspective view of a support and optics portions that may be seated therein, in accordance with another embodiment of the present invention.
Figure 30B:
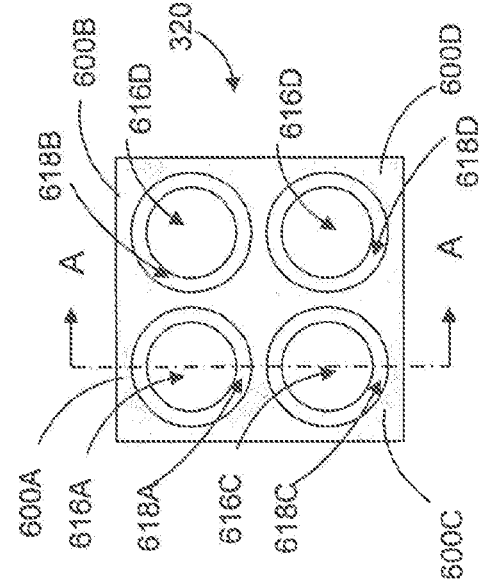
FIG. 30B is a schematic plan view of the support of FIG. 30A.

FIG. 29A is a schematic cross sectional view of a support 320 and optics portions, e.g., 330A-330D, seated therein in accordance with another embodiment. In this embodiment, the optics portions have an orientation that is inverted compared to the orientation of the optics portions in the embodiment of FIGS. 7A-7C.

FIG. 29B is a schematic cross sectional view of a support and optics portions, e.g., 330A-330D, seated therein in accordance with another embodiment. In this embodiment, each of the optics portions includes a single lens element having a shank portion 702A-702D, respectively. The support 320 has an orientation that is inverted compared to the orientation of the support in the embodiment of FIGS. 6A-6C, such that the optics portions are seated on stop surfaces 622A-622D, respectively, that face in a direction away from the sensor arrays (not shown).

It should be understood that the features of the various embodiments described herein may be used alone and/or in any combination thereof.

FIGS. 30A-30D show a support 320 having four support portions 600A-600D each defining an aperture, e.g., aperture 616A-616D, for a respective optics portion, wherein the seat, e.g., seat 618A, defined by one or more of the support portions, e.g., support portion 600A, is disposed at a depth 710A that is different than the depths, e.g., depth 710C, of the seat, e.g., seat 618C, of one or more other support portions, for example, to adapt the one or more support portions to the focal length of the respective optics portions. As stated above, the position and/or orientation of the stop surface 622 may be adapted to position the optics portion at a specific distance (or range of distance) and/or orientation with respect to the respective sensor array. In this regard, the seat 618 controls the depth at which the lens is positioned (e.g., seated) within the support 320. In some embodiments, one of the optics portions is adapted for blue light or a band of blue light and another one of the optics portions is adapted for red light or a band of red light, however other configurations may also be employed.

FIGS. 31A-31D show a support 320 having four support portions 600A-600D each defining an aperture 616A-616D and a seat 618A-618D, respectively, for a respective optics portion, wherein the aperture, e.g., aperture 616A, of one or more of the support portions, e.g., support portion 600A, has a diameter 714A that is less than the diameter 714C of the aperture 616 of one or more of the other support portions, e.g., support portion 600C.

As with each of the embodiments disclosed herein, this embodiment may be employed alone or in combination with one or more of the other embodiments disclosed herein, or portions thereof. In that regard, in some embodiments, the seat defined by one or more of the support portions is at a depth that is different than the depths of the seats of the other support portions so as to adapt such one or more support portions to the focal length of the respective optics portions, as in the embodiment of the support shown in FIGS. 30A-30D.

In some embodiments, one of the optics portions is adapted for blue light or a band of blue light and another one of the optics portions is adapted for red light or a band of red light, however other configurations may also be employed.

Figure 32:
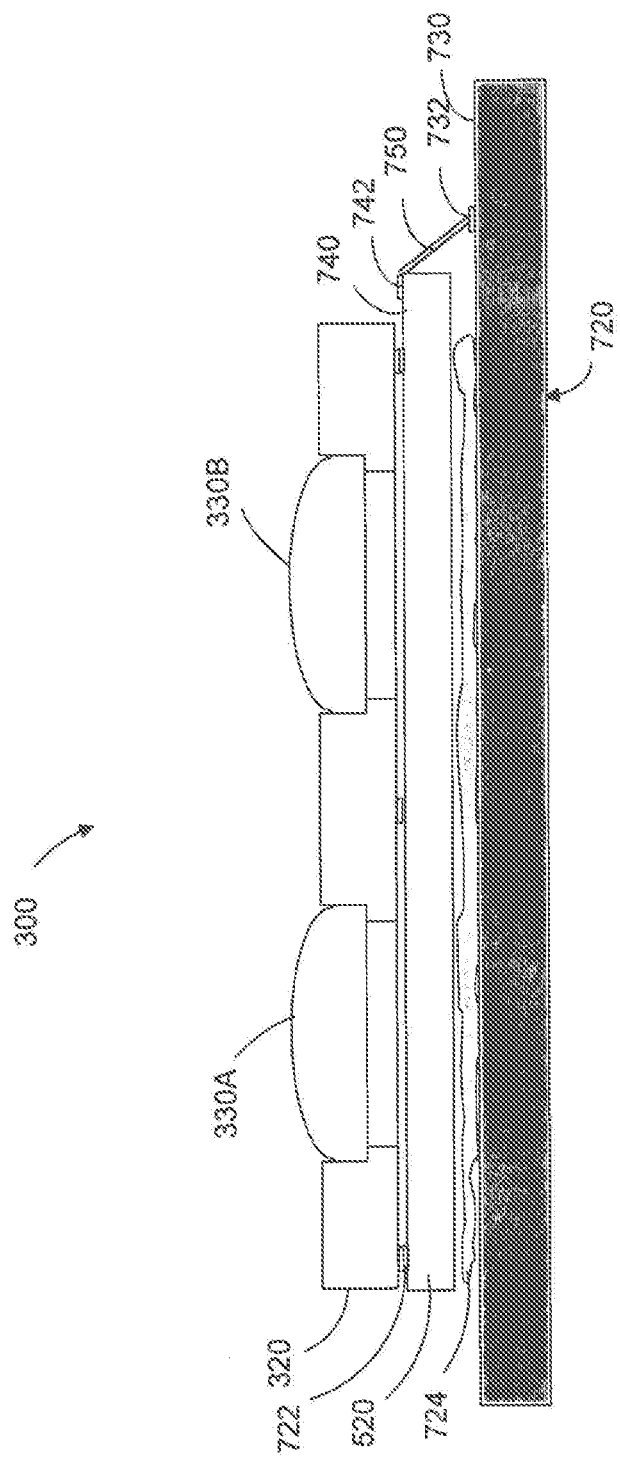
FIG. 32 is a schematic cross-sectional view of a digital camera apparatus and a printed circuit board on which the digital camera apparatus may be mounted; in accordance with one embodiment of the present invention.

FIG. 32 is a schematic cross-sectional view of a digital camera apparatus 300 and a printed circuit board 720 of a digital camera on which the digital camera apparatus 300 may be mounted, in accordance with one embodiment of the present invention. In this embodiment, the one or more optics portions, e.g., optics portions 330A-330D are seated in and/or affixed to the support 320. The support 320 is disposed superjacent a first bond layer 722, which is disposed superjacent an image device, e.g., image device 520, in or on which the one or more sensor portions, e.g., sensor portions 310A-310D, are disposed and/or integrated. The image device 520 is disposed superjacent a second bond layer 724 which is disposed superjacent the printed circuit board 110.

The printed circuit board includes a major outer surface 730 that defines a mounting region on which the image device is mounted. The major outer surface 730 may further define and one or more additional mounting regions (not shown) on which one or more additional devices used in the digital camera may be mounted. One or more pads 732 are provided on the major outer surface 730 of the printed circuit board to connect to one or more of the devices mounted thereon.

The image device 520 includes the one or more sensor arrays, e.g., sensor arrays 310A-310D, and one or more electrically conductive layers. In some embodiments, the image device further includes one, some or all portions of the processor for the digital camera apparatus. The image device 520 further includes a major outer surface 740 that defines a mounting region on which the support 320 is mounted.

The one or more electrically conductive layers may be patterned to define one or more pads 742 and one or more traces (not shown) that connect the one or more pads to one or more of the one or more sensor arrays. The pads 742 are disposed, for example, in the vicinity of the perimeter of the image device 520, for example, along one, two, three or four sides of the image device. The one or more conductive layers may comprise, for example, copper, copper foil, and/or any other suitably conductive material(s).

A plurality of electrical conductors 750 may connect one or more of the pads 742 on the image device 520 to one or more of the pads 732 on the circuit board 720. The conductors 750 may be used, for example, to connect one or more circuits on the image device to one or more circuits on the printed circuit board.

The first and second bond layers 722, 724 may comprise any suitable material(s), for example, but not limited to adhesive, and may comprise any suitable configuration. The first and second bond layers 722, 724 may comprise the same material(s) although this is not required. As used herein, a bond layer may be continuous or discontinuous. For example, a conductive layer may be an etched printed circuit layer. Moreover, a bond layer may or may not be planar or even substantially planar. For example, a conformal bond layer on a non-planar surface will be non-planar.

A plurality of optics portions, e.g., optics portions 330A-330D are seated in and/or affixed to the support.

In some embodiments, the digital camera apparatus 300 has dimensions of about 2.5 mm.×6 mm×6 mm. For example, the thickness may be equal to about 2.5 mm, the length may be equal to about 6 mm and the width may be equal to about 6 mm. In some of such embodiments, the digital camera apparatus has one or more sensor arrays having a total of 1.3 M pixels, although other configurations may be employed (e.g., different thickness, width, length and number of pixels).

In some embodiments, one or more of the circuits on the image device 520 may communicate with one or more devices through one or more wireless communication links. In some such embodiments, the image device 520 may define one or more circuits for use in such wireless communication link and/or one or more mounting regions for one or more discrete devices employed in such wireless communication link(s).

The digital camera apparatus 300 may be assembled and mounted in any manner. FIGS. 33A-33F shows one embodiment for assembling and mounting the digital camera apparatus. Referring to FIG. 33A, initially, the image device 520 is provided. Referring to FIG. 33B, a first bond layer 722 is provided on one or more regions of one or more surfaces of the image device 520. Such regions define one or more mounting regions for the support. Referring to FIG. 33C, the support 320 is thereafter positioned on the bond layer 722. In some embodiments, force may be applied to help drive any trapped air out from between the image device and support. In some embodiments, heat and/or force may be applied to provide conditions to activate and/or cure the bond layer to form a bond between the image device 520 and the support 320. Referring to FIG. 33D, one or more optics portions, e.g., optics portions 330A-330D may thereafter be seated in and/or affixed to the support 320. Referring to FIG. 33E, a bond layer 724 is provided on one or more regions of one or more surfaces of the printed circuit board 720. Such regions define one or more mounting regions for the digital camera apparatus 300. Referring to FIG. 33F, the digital camera apparatus 300 is thereafter positioned on the bond layer 724. One or more electrical conductors 750 may be installed to connect one or more of pads 742 on the image device to one or more pads on circuit board 720.

In some embodiments, the electrical interconnect between component layers may be formed by lithography and metallization, bump bonding or other methods. Organic or inorganic bonding methods can be used to join the component layers. The layered assembly process may start with a "host" wafer with electronics used for the entire camera and/or each camera channel. Then another wafer or individual chips are aligned and bonded to the host wafer. The transferred wafers or chips can have bumps to make electrical interconnect or connects can be made after bonding and thinning. The support substrate from the second wafer or individual chips is removed, leaving only a few microns material thickness attached to the host wafer containing the transferred electronics. Electrical interconnects are then made (if needed) between the host and the bonded wafer or die using standard integrated circuit processes. The process can be repeated multiple times.

FIGS. 33G-33K are schematic views of a digital camera apparatus, mechanical mountings and electrical connections employed in accordance with further embodiments of the present invention. More particularly, FIG. 33G is a schematic perspective view of the digital camera apparatus 300. FIG. 33H is a schematic elevational view of the digital camera 300 mounted to a major lower surface of a printed circuit board 720. One or more electrical conductors 750 are used to connect pads 732 on the printed circuit 720 to pads on the major outer surface of the image device 520.

FIG. 33H is a schematic elevational view of the digital camera 300 mounted to a major lower surface of a printed circuit board 720. The support 320 is disposed in a through hole defined by the printed circuit board. One or more electrical conductors 750 connect pads 732 on the printed circuit 720 to pads on the major outer lower of the image device 520.

FIG. 33I is a schematic elevational view of the digital camera 300 mounted to a major lower surface of a printed circuit board 720. The support 320 is disposed in a through hole defined by the printed circuit board. A bump bond 752 connects one or more of the pads 742 on the surface 740 of the image device 520 to pads 732 on the major lower surface of the printed circuit board 720.

FIG. 33J is a schematic elevational view of the digital camera 300 mounted to a major upper surface of a printed circuit board 720. One or more electrical conductors 750 connect pads 732 on the printed circuit 720 to pads 742 on the major outer surface 740 of image device 520.

FIG. 33K is a schematic elevational view of the digital camera 300 mounted to a major upper surface of a printed circuit board 720. A bump bond 752 connects one or more pads on a major lower surface of the support 320 to pads on the major upper surface of the printed circuit board 720.

In some embodiments, the manufacture of the optical stacks, and image sensors are done on a single wafer, fabricated on separate wafers (perhaps up to two wafers: one for the IC, and one for optics) and bonded together at the wafer level. It is also possible to use pick and place methods and apparatus to attach the optical assemblies to the wafer IC, or the image sensor die and other assemblies can be assembled individually.

In embodiments that employ MEMS, manufacture of the optical stacks, MEMs and image sensors may be done on a single wafer, fabricated on separate wafers (perhaps up to three wafers: one for the IC, one for MEMs and one for optics) and bonded together at the wafer level. It is also possible to use pick and place methods and apparatus to attach the optical assemblies and MEMs to the wafer IC, or the image sensor die and other assemblies (MEMs and optical stack) can be assembled individually.

Figure 34:
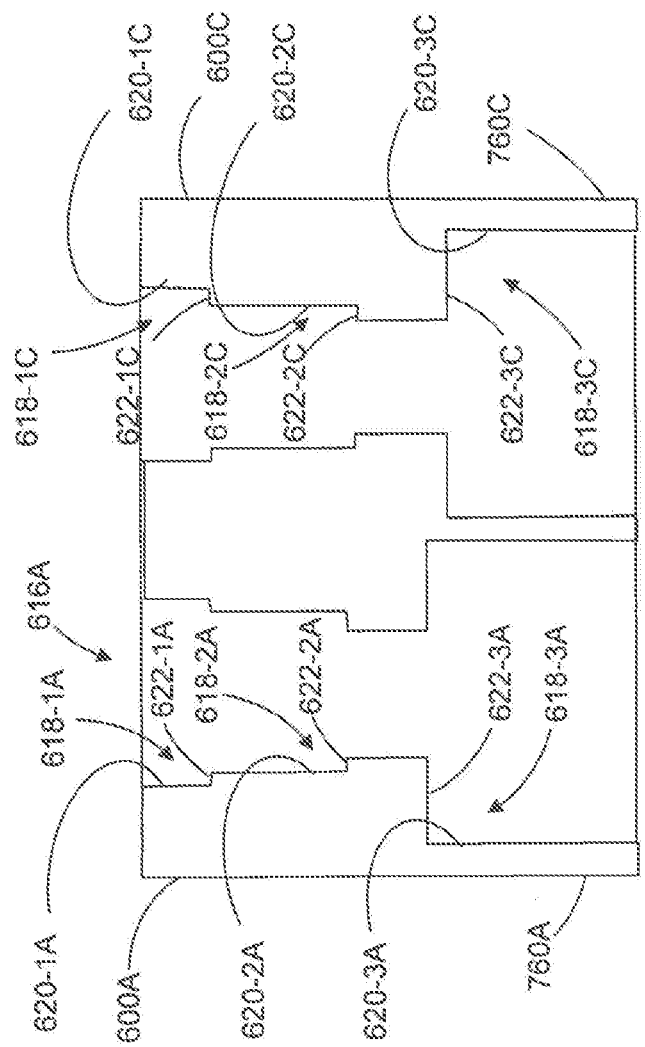
FIG. 34 is a schematic cross section view of a support that may be employed to support the optics portions of FIGS. 11A-11B, 13A-13B, at least in part, in accordance with another embodiment of the present invention.

FIG. 34 is a schematic cross section view of a support that may be employed to support one or more lenses having three lens elements, e.g., lenses 410, 430 (FIGS. 11A-11B, 13A-13B), and to position such lenses in registration with a respective sensor array, at least in part, in accordance with another embodiment of the present invention. In this embodiment, the support 320 defines one or more support portions, e.g., four support portions 600A-600D, each of which supports and/or helps position a respective one of the one or more optics portions.

In some embodiments, the support may also help to limit, minimize and/or eliminate light "cross talk" between the camera channels and/or may also help to limit, minimize and/or eliminate "entry" of light from outside the digital camera apparatus.

Each of the support portions 600A-600D defines an aperture 616 and a plurality of seats 618-1 to 618-3. More particularly, support portion 600A defines an aperture 616A and seats 618-1A to 618-3C. Support portion 600B defines an aperture 616B and seats 618-1B to 618-3B. Support portion 600C defines an aperture 616C and seats 618-1C to 618-3C. Support portion 600D defines an aperture 616D and seats 618-1D to 618-3D. Referring for example, to support portion 600A, the aperture 616A defines a passage for the transmission of light for the respective camera channel. Each of the plurality of seats 618-1A to 618-3A is adapted to receive a respective one of the lenslets of the respective optics portion (or portion thereof) and to support and/or position the respective lenslet, at least in part. In this regard, each of the seats 618-1A to 618-3A may include one or more surfaces (e.g., surfaces 620-1A to 620-3A, respectively, and surfaces 622-1A to 622-3A, respectively) adapted to abut one or more surfaces of the respective lenslet to support and/or position the lenslet, at least in part, relative to the support portion and/or one or more of the sensor arrays 310A-310D. In this embodiment, each of the surfaces 620-1A to 620-3A is disposed about the perimeter of the respective lenslet to support and help position such lenslet in the x direction and the y direction). Each of the surfaces 622-1A to 622-3A (sometimes referred to herein as "stop" surface) positions or helps position the respective lenslet in the z direction.

The positions and/or orientations of the stop surfaces 622-1A to 622-3A may be adapted to position the respective lenslet at a specific distance (or range of distance) and/or orientation with respect to the respective sensor array. In this regard, the seats 618-1A to 618-3A control the depth at which each of the lenslets is positioned (e.g., seated) within the support. The depth may be different for each lenslet and is based, at least in part, on the focal length of the lens. For example, if a camera channel is dedicated to a specific color (or band of colors), the lens or lenses for that camera channel may have a focal length specifically adapted to the color (or band of colors) to which the camera channel is dedicated. If each camera channels is dedicated to a different color (or band of colors) than the other camera channels, then each of the lenses may have a different focal length, for example, to tailor the lens to the respective sensor array, and each of the seats have a different depth.

In this embodiment, each of the support portions includes an elongated portion adapted to help position the respective optics portions at a desired distance from the respective sensor arrays. In this embodiment, the elongated portions extend in an axial direction and define walls 760, which in turn define the lower portions of apertures, respectively, which help limit, minimize and/or eliminate light "cross talk" between the camera channels and help limit, minimize and/or eliminate "entry" of light from outside the digital camera apparatus.

In some embodiments, the a spacer is provided, separately fabricated from the support portions and adapted to be disposed between the support portions and the one or more sensor arrays to help position the one or more optics portions at a desired distance from the one or more sensor arrays. In some of such embodiments, the spacer and support collectively define one or more passages for transmission of light, help to limit, minimize and/or eliminate light "cross talk" between the camera channels and/or help to limit, minimize and/or eliminate "entry" of light from outside the digital camera apparatus.

The support 320 may comprise any type of material(s) and may have any configuration and/or construction. In some embodiments, for example, the support 320 comprises silicon, semiconductor, glass, ceramic, plastic, or metallic materials and/or a combination thereof. If the support 320 has more than one portion, such portions may be fabricated separate from one another, integral with one another and/or any combination thereof. If the support defines more than one support portion, each of such support portions, e.g., support portions 600A-600D, may be coupled to one, some or all of the other support portions, as shown, or completely isolated from the other support portions.

The support 320 may be a solid device that may offer a wide range of options for manufacturing and material, however other forms of devices may also be employed. In some embodiments, for example, the support 320 comprises a plate (e.g., a thin plate) that defines the support and one or more support portions, with the apertures and seats being formed by machining (e.g., boring) or any other suitable manner. In some other embodiments, the support 320 is fabricated as a casting with the apertures defined therein (e.g., using a mold with projections that define the apertures and seats of the one or more support portions).

Each optics portion, e.g., optics portions 330A-330D, may be secured in the respective seats in any suitable manner, for example, but not limited to, mechanically (e.g., press fit, physical stops), chemically (e.g., adhesive), electronically (e.g., electronic bonding) and/or any combination thereof. In some embodiments, each of the seats 618-1A to 618C-3A has dimensions adapted to provide a press fit for the respective lenslets.

Notably, the lenslets of the optics portions may be assembled into the support in any suitable manner.

Figure 35B:
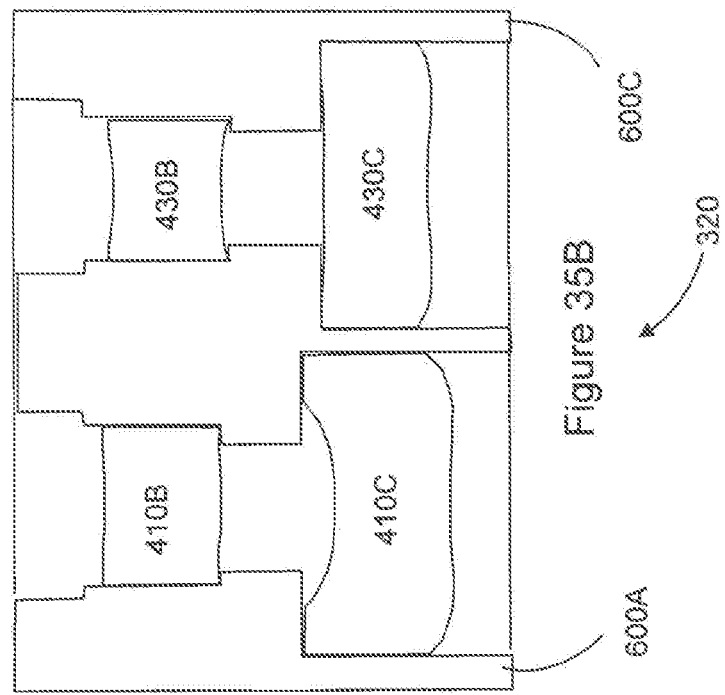
Figure 35A:
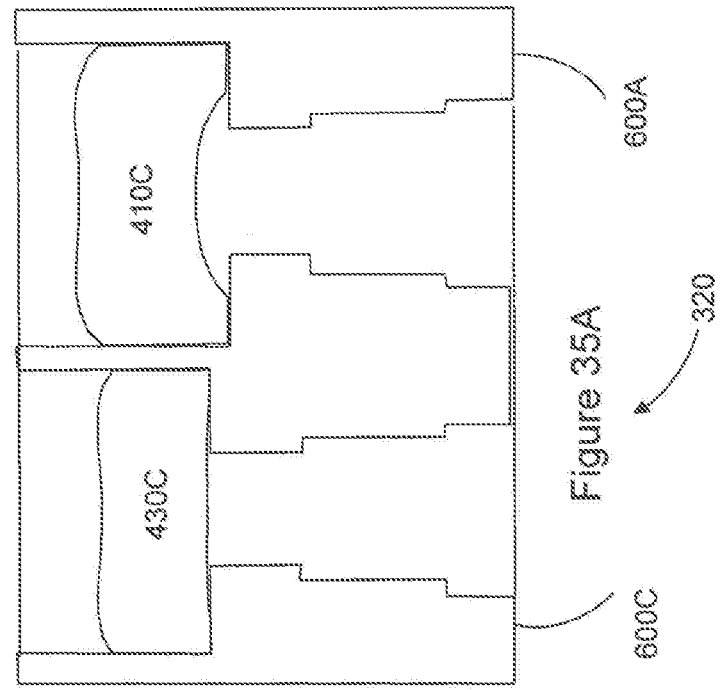

FIGS. 35A-35C show one embodiment for assembling the lenslets of the optics portions in the support. Referring to FIG. 35A, in this embodiment, the support 320 is turned upside down and the bottom lenslets 410C, 430C of each lens 410, 430, respectively, is inserted into the bottom of a respective aperture, seated in a respective seat 618-3 and affixed thereto, if desired. Referring to FIG. 35B, the support 320 is thereafter turned right side up and the middle lenslet 410B, 430B, of each lens 410, 430, respectively, is inserted into the top of the respective aperture, seated in a respective seat 618-2 and affixed thereto, if desired. Referring to FIG. 35C, thereafter, the top lenslet 410A, 430A, of each lens 410, 430, respectively, is inserted into the top of the respective aperture, seated in a respective seat 618-1 and affixed thereto, if desired. In some embodiments, the top lenslet and the middle lenslet are built into one assembly, and inserted together.

In this particularly embodiment, it may be advantageous to insert the bottom lenslet through a bottom portion of the aperture because the stop surface for the bottom lenslet faces toward the bottom of the aperture. Similarly, it may be advantageous to insert the top lenslet and the middle lenslet through a top portion of the aperture because the stop surface for the top lenslet and the stop surface for the middle lenslet each face toward the top portion of the aperture.

It should be understood however, that any suitable configuration may be employed. In some embodiments, for example, the stop surface for the middle lenslet may face toward the bottom portion of the aperture, such that the middle lenslet may be inserted into the support portion through the bottom portion of the aperture, e.g., prior to inserting the bottom lenslet into the support. In some other embodiments, each of the stop surfaces may face in one direction, such that all of the lenslets are inserted through the same portion of the aperture.

In some embodiments, the lens and support are manufactured as a single molded component. In some embodiments the lens may be manufactured with tabs that may be used to form the support.

In some embodiments, the support 320 is coupled and/or affixed directly or indirectly, to the image device. For example, the support 320 may be directly coupled and affixed to the image device (e.g., using adhesive) or indirectly coupled and/or or affixed to the image device via an intermediate support member (not shown).

The x and y dimensions of the support 320 may be, for example, approximately the same (in one or more dimensions) as the image device, approximately the same (in one or more dimensions) as the arrangement of the optics portions 330A-330D and/or approximately the same (in one or more dimensions) as the arrangement of the sensor arrays 310A-310D. One advantage of such dimensioning is that it helps keep the x and y dimensions of the digital camera apparatus as small as possible.

In some embodiments the support may have dimensions similar to one or more of the dimensions of the embodiment of the support shown in FIGS. 28A-28D.

Figure 36:
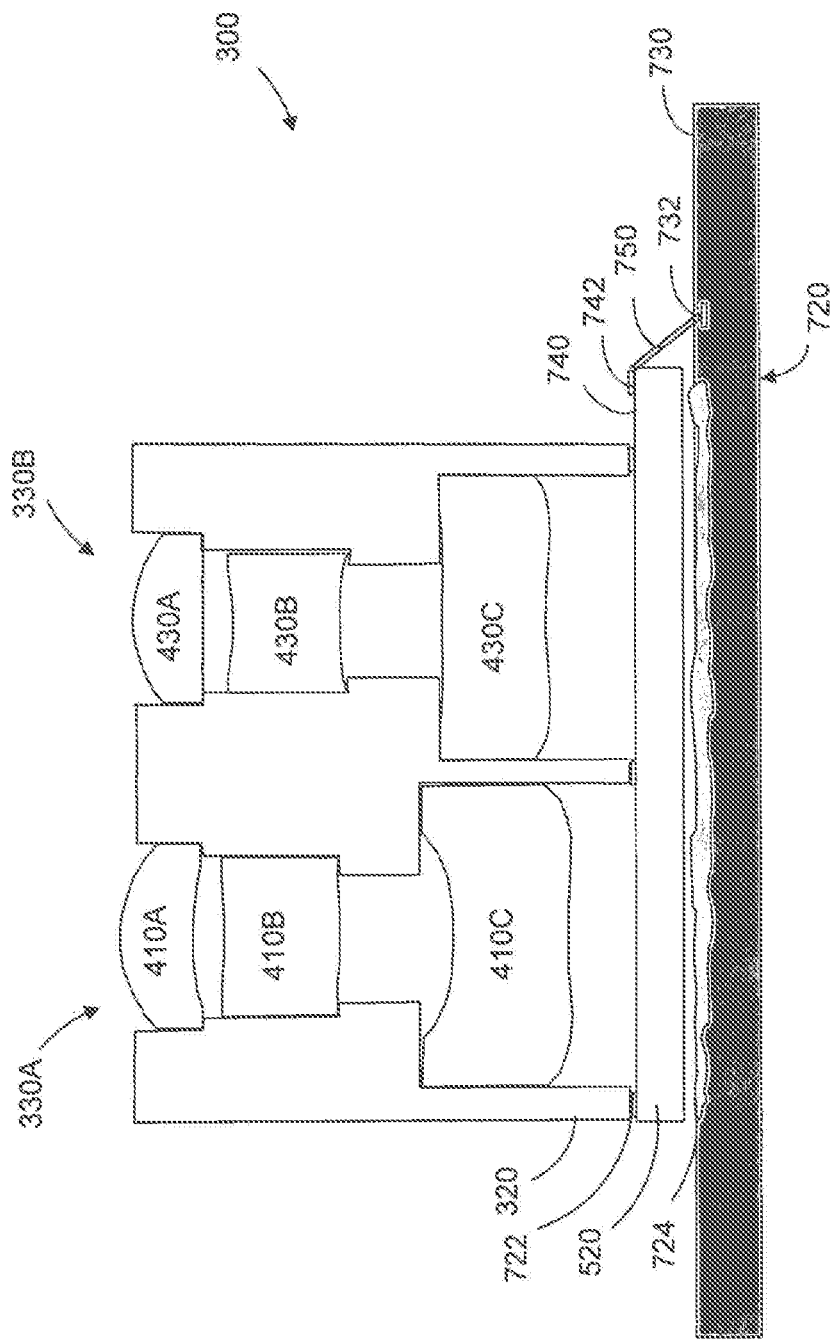
FIG. 36 is a schematic cross-sectional view of a digital camera apparatus that includes the support of FIG. 34 and the optics portions of FIGS. 11A-11B, 13A-13B, and a printed circuit board on which the digital camera apparatus may be mounted; in accordance with one embodiment of the present invention.

FIG. 36 is a schematic cross-sectional view of a digital camera apparatus 300 and a printed circuit board 720 of a digital camera on which the digital camera apparatus 300 may be mounted, in accordance with another embodiment of the present invention. This embodiment is similar to the embodiment of the digital camera apparatus and printed circuit board shown in FIG. 32 except that this embodiment employs the support 320 and lens elements 410, 430 shown in FIGS. 35A-35C.

In some embodiments, the digital camera apparatus 300 has dimensions of about 2.5 mm×6 mm×6 mm. For example, the thickness may be equal to about 2.5 mm, the length may be equal to about 6 mm and the width may be equal to about 6 mm. In some of such embodiments, the digital camera apparatus has one or more sensor arrays having a total of 1.3 M pixels, although other configurations may be employed (e.g., different thickness, width, length and number of pixels).

The digital camera apparatus 300 may be assembled and mounted to the printed circuit board in any manner. In some embodiments, the digital camera apparatus is assembled and mounted to the printed circuit board 720 in a manner that is similar to that set forth above for the embodiment of the digital camera apparatus 300 and printed circuit board shown 720 in FIGS. 33A-33F, except that the bottom lenslets 410C, 430C, may be seated in and affixed to the support, if desired, prior to positioning the support on the second bond layer. The middle and top lenslets of the lenses, respectively, may be seated in and affixed to the support, if desired, after the support is positioned on the second bond layer 724.

Figure 37:
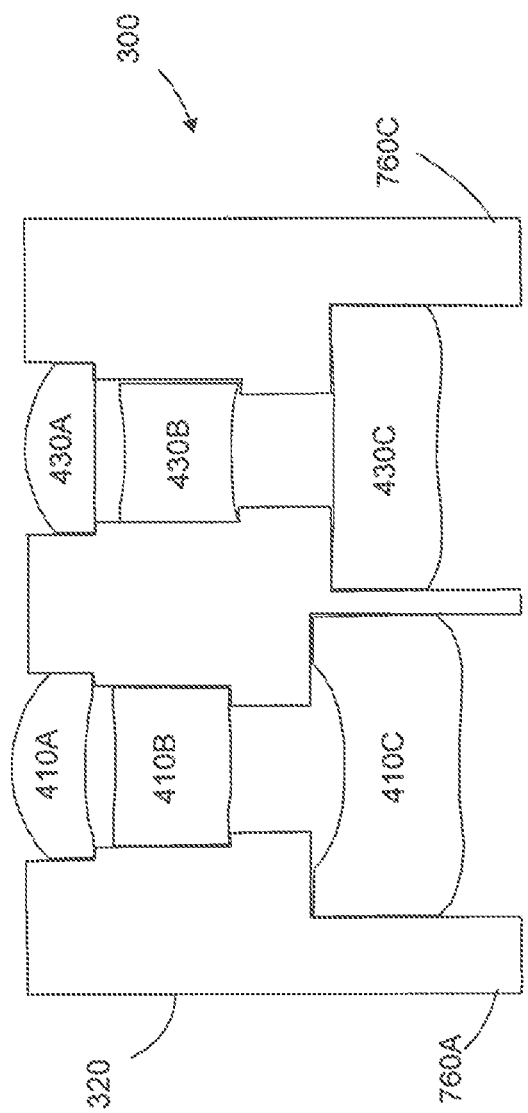
FIG. 37 is a schematic cross sectional view of another support that may be employed to support the optics portions of FIGS. 11A-11B, 13A-13B, at least in part, in accordance with another embodiment of the present invention.

FIG. 37, is a schematic cross section view of an alternative support 320 that may be employed to support the lenses 410, 430 of FIGS. 11A-11B, 13A-13B and to position such lenses in registration with a respective sensor array, at least in part, in accordance with another embodiment of the present invention. The support 320 in this embodiment is similar to the embodiment of the support 320 shown in FIG. 34 except that the support 320 in this embodiment defines outer walls 760A-760D that are wider than outer walls 760A-760D defined by the embodiment of the support shown in FIG. 34.

Each optics portion, e.g., optics portions 330A-330D, may be assembled in and secured in the respective seats in any suitable manner, for example, but not limited to, in the manner set forth above with respect to the embodiment of the support and optics portions shown in FIGS. 35A-35C.

Figure 38:
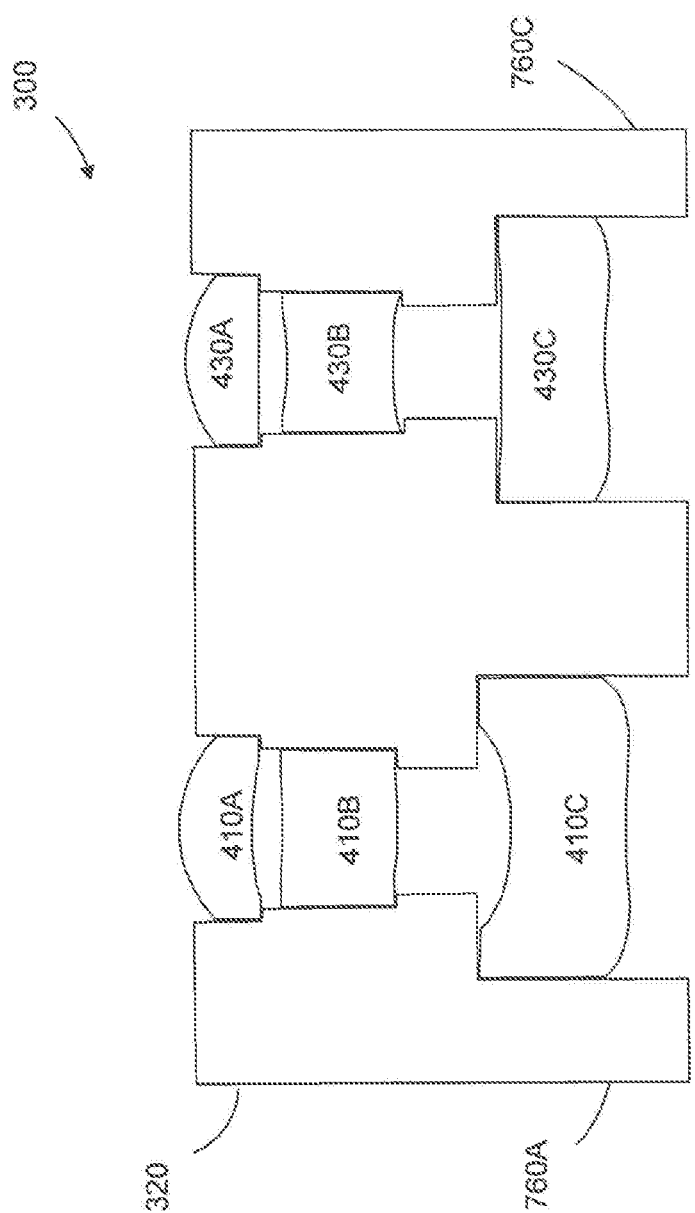
FIG. 38 is a schematic cross sectional view of another support that may be employed to support the optics portions of FIGS. 11A-11B, 13A-13B, at least in part, in accordance with another embodiment of the present invention.

FIG. 38, is a schematic cross section view of an alternative support 320 that may be employed to support the lenses 410, 430 of FIGS. 11A-11B, 13A-13B and to position such lenses in registration with a respective sensor array, at least in part, in accordance with another embodiment of the present invention. The support 320 in this embodiment is similar to the embodiment of the support 320 shown in FIG. 34 except that the support 320 in this embodiment defines outer and inner walls 760A-760D that are wider than outer and inner walls 760A-760D defined by the embodiment of the support 320 shown in FIG. 34.

Each optics portion may be assembled in and secured in the respective seats in any suitable manner, for example, but not limited to, in the manner set forth above with respect to the embodiment of the support and optics portions shown in FIGS. 35A-35C.

Figure 39:
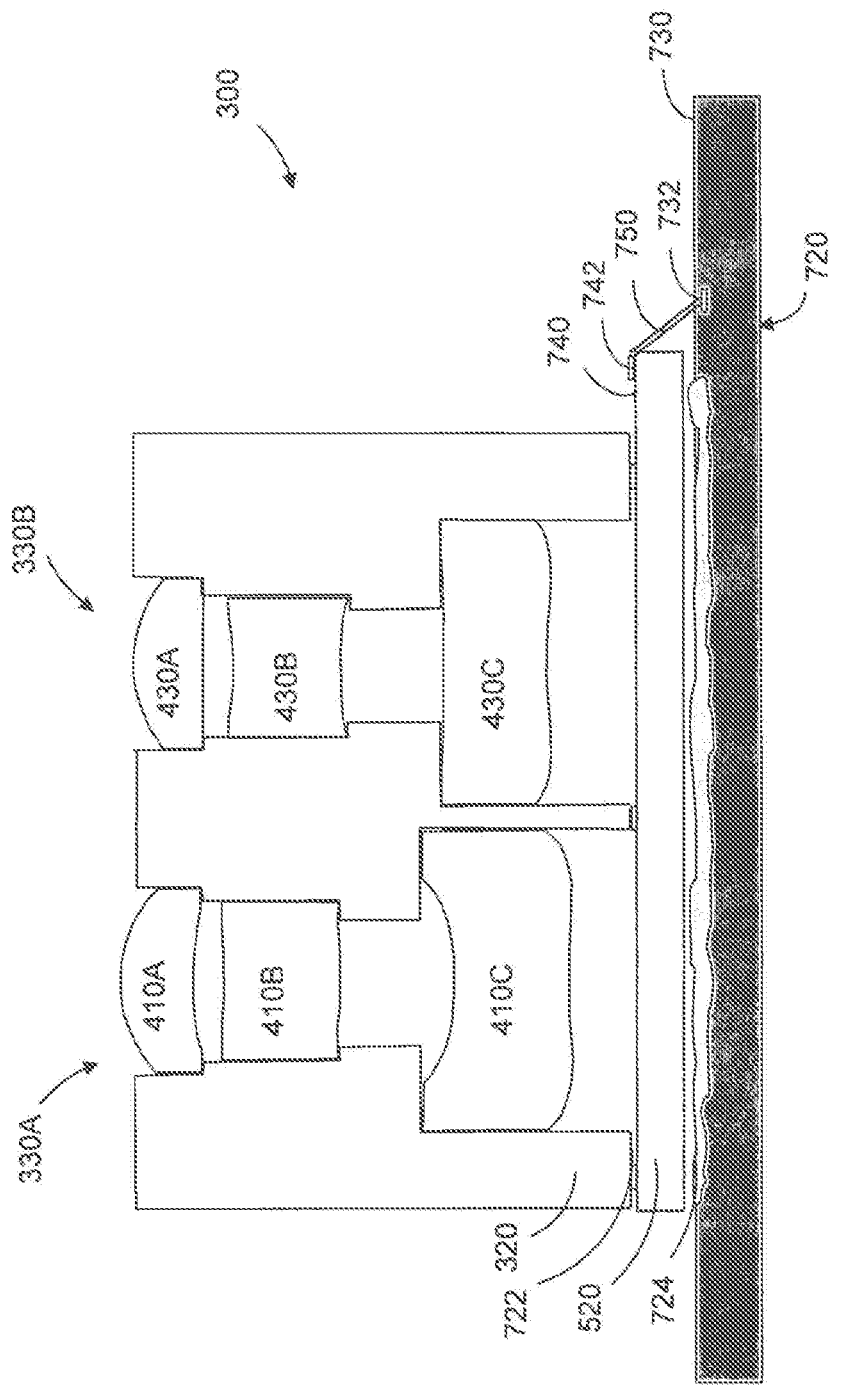
FIG. 39 is a schematic cross-sectional view of a digital camera apparatus that includes the support of FIG. 37 and the optics portions of FIGS. 11A-11B, 13A-13B, and a printed circuit board on which the digital camera apparatus may be mounted; in accordance with one embodiment of the present invention.

FIG. 39 is a schematic cross-sectional view of a digital camera apparatus 300 and a printed circuit board 720 of a digital camera on which the digital camera apparatus 300 may be mounted, in accordance with another embodiment of the present invention. This embodiment is similar to the embodiment of the digital camera apparatus 300 and printed circuit board 720 shown in FIG. 36 except that this embodiment employs the support 320 and lens elements 410, 430 shown in FIG. 37.

The digital camera apparatus may be assembled and mounted to the printed circuit board in any manner. In some embodiments, for example, the digital camera apparatus is assembled and mounted to the printed circuit board in a manner that is similar to that set forth for the embodiment of the digital camera apparatus and printed circuit board shown in FIG. 36.

FIG. 40 is a schematic cross-sectional view of a digital camera apparatus 300 and a printed circuit board 720 of a digital camera on which the digital camera apparatus 300 may be mounted, in accordance with another embodiment of the present invention. This embodiment is similar to the embodiment of the digital camera apparatus 300 and printed circuit board shown in FIG. 36 except that this embodiment employs the support 320 and lens elements 410, 430 shown in FIG. 38.

The digital camera apparatus 300 may be assembled and mounted to the printed circuit board 720 in any manner. In some embodiments, for example, the digital camera apparatus 300 is assembled and mounted to the printed circuit board 720 in a manner that is similar to that set forth for the embodiment of the digital camera apparatus 300 and printed circuit board 720 shown in FIG. 36.

FIGS. 41A-41D, are schematic cross sectional views of seating configurations 770-776 that may be used in supporting and positioning the lenses of FIGS. 15A-15B, 15D-15E, respectively, in accordance with further embodiments.

Figure 41A:
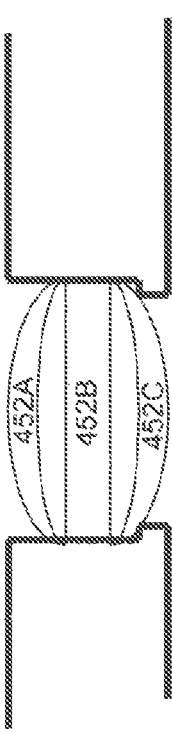
FIGS. 41A-41D, are schematic cross sectional views of seating configurations that may be employed in a digital camera apparatus to support the lenses of FIGS. 15A-15D, respectively, at least in part, in accordance with further embodiments of the present invention.

In the seating configuration shown in FIG. 41A, the top lenslet 450A, middle lenslet 450B and bottom lenslet 450C are each inserted through a bottom portion of an aperture (or through a top portion of an aperture) one at a time, as an assembly, or a combination thereof.

Figure 41B:
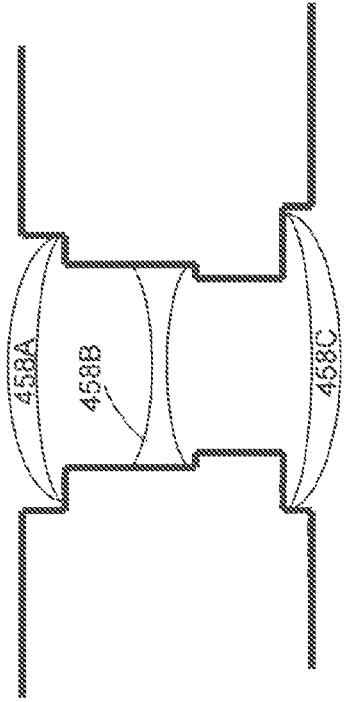

In the seating configuration of FIG. 41B, the top lenslet 452A, middle lenslet 452B and bottom lenslet 452C are each inserted through a top portion of an aperture (or through a bottom portion of an aperture), one at a time, as an assembly, or a combination thereof.

Figure 41C:
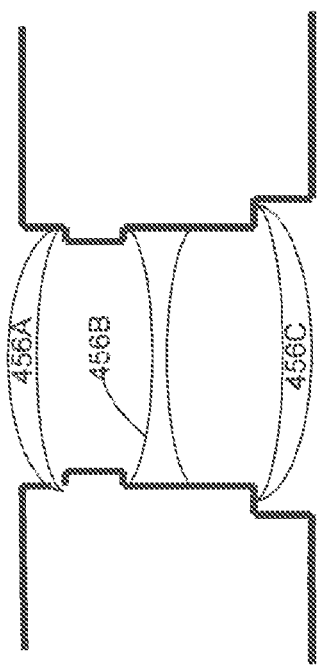

In the seating configuration of FIG. 41C, the top lenslet 456A may be inserted, for example, through a top portion of an aperture. The middle lenslet 456B and the bottom lenslet 456C may be inserted, for example, through a bottom portion of an aperture, one at a time, or alternatively, the middle lenslet and the bottom lenslet may be built into one assembly, and inserted together.

Figure 41D:
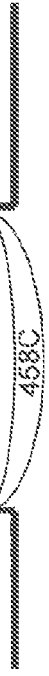

In the seating configuration of FIG. 41D, the middle lenslet 458B and the top lenslet 458A are inserted through a top portion of an aperture, one at a time, or alternatively, the middle lenslet 458B and the top lenslet 458A may be built into one assembly, and inserted together. The bottom lenslet 458C is inserted through a bottom portion of an aperture.

As with each of the embodiments disclosed herein, these embodiments may be employed alone or in combination with one or more of the other embodiments (or portions thereof) disclosed and illustrated herein.

Figure 44:
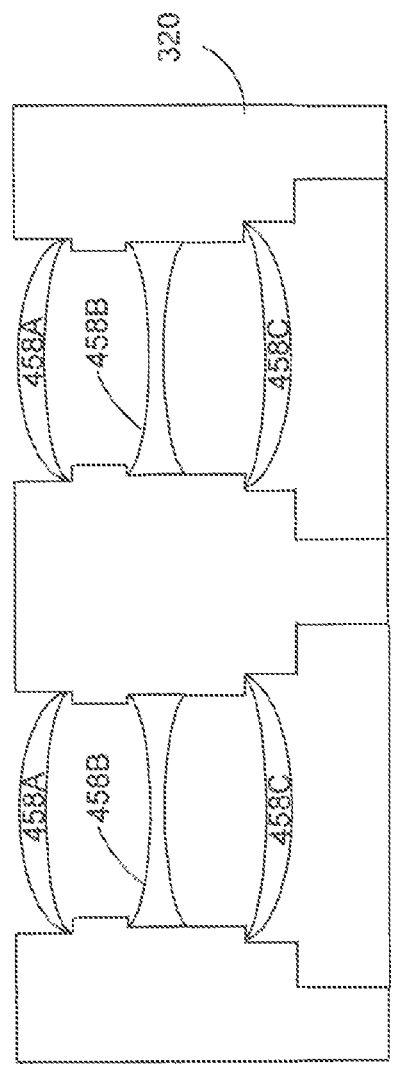

In that regard, FIGS. 42-44 are schematic cross section views of supports 320 that employ the seating configurations of FIGS. 41B, 41D, and 41C, respectively, to support the lens 452A-452C, 458A-458C, 456A-456C, shown in FIGS. 15B, 15E, and 15D, respectively, and to position such lens in registration with a respective sensor array, at least in part, in accordance with further embodiments.

Figure 45:
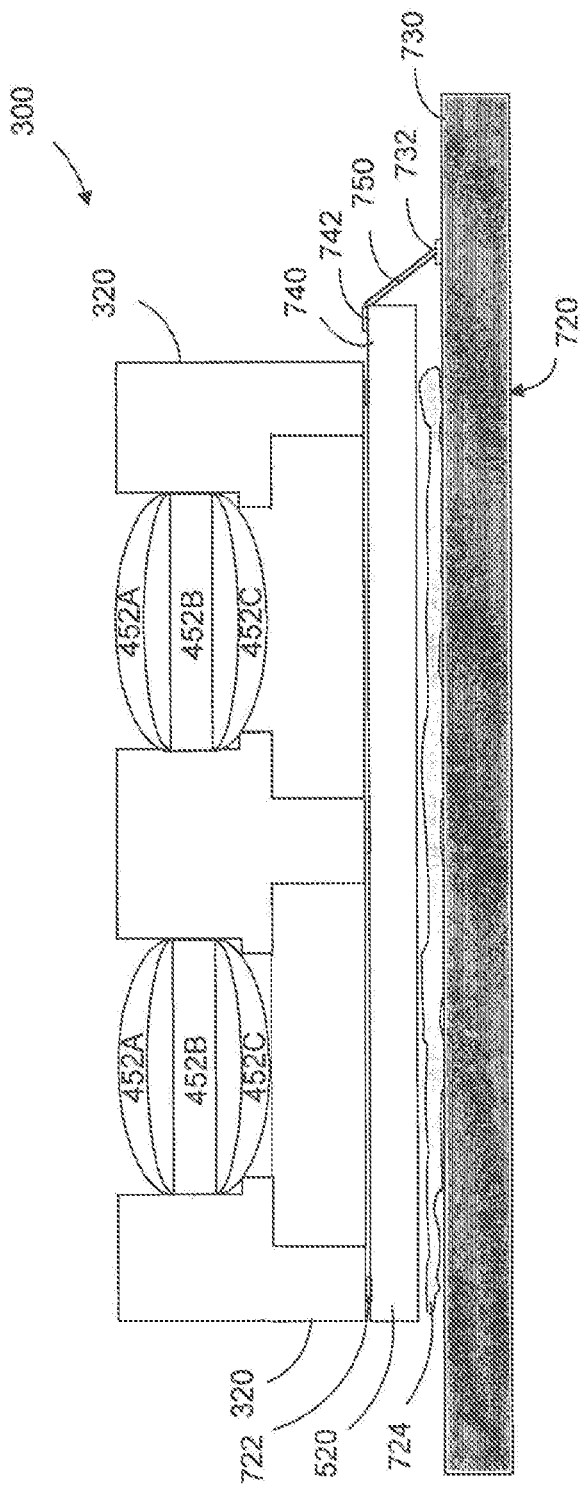
FIG. 45 is a schematic cross-sectional view of a digital camera apparatus that includes the support of FIG. 42 and a printed circuit board on which the digital camera apparatus may be mounted; in accordance with one embodiment of the present invention.

FIG. 45 is a schematic cross-sectional view of a digital camera apparatus 300 and a printed circuit board 720 of a digital camera on which the digital camera apparatus 300 may be mounted, in accordance with another embodiment of the present invention. This embodiment is similar to the embodiment of digital camera apparatus 300 and the printed circuit board shown in FIG. 36 except this embodiment employs support 320 and lens elements shown in FIG. 42.

The digital camera apparatus 300 may be assembled and mounted to the printed circuit board in any manner. In some embodiments, for example, the digital camera apparatus is assembled 300 and mounted to the printed circuit board 720 in a manner that is similar to that set forth for the embodiment of the digital camera apparatus and printed circuit board shown in FIG. 36, although it may be advantageous to assemble the lenslets into the support using a manner similar to the manner set forth above for the seating configuration shown in FIG. 41B.

Figure 46:
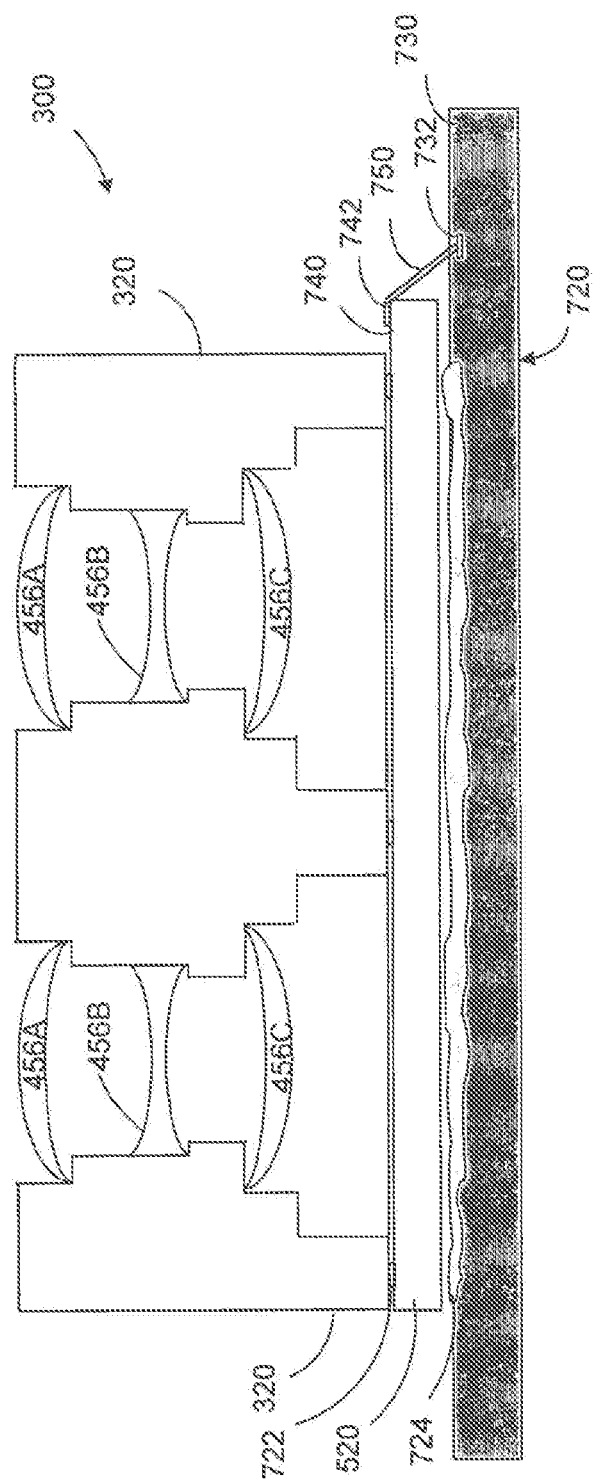
FIG. 46 is a schematic cross-sectional view of a digital camera apparatus that includes the support of FIG. 43 and a printed circuit board on which the digital camera apparatus may be mounted; in accordance with one embodiment of the present invention.

FIG. 46 is a schematic cross-sectional view of digital camera apparatus 300 and printed circuit board 720 of a digital camera on which digital camera apparatus 300 may be mounted, in accordance with another embodiment of the present invention. This embodiment is similar to the embodiment of the digital camera apparatus and printed circuit board shown in FIG. 36 except this embodiment employs the support and lens elements shown in FIG. 43.

The digital camera apparatus 300 may be assembled and mounted to the printed circuit board 720 in any manner. In some embodiments, for example, the digital camera apparatus 300 is assembled and mounted to the printed circuit board in a manner that is similar to that set forth for the embodiment of the digital camera apparatus and printed circuit board shown in FIG. 36, although it may be advantageous to assemble the lenslets into the support using a manner similar to the manner set forth above for the seating configuration shown in FIG. 41D.

Figure 47:
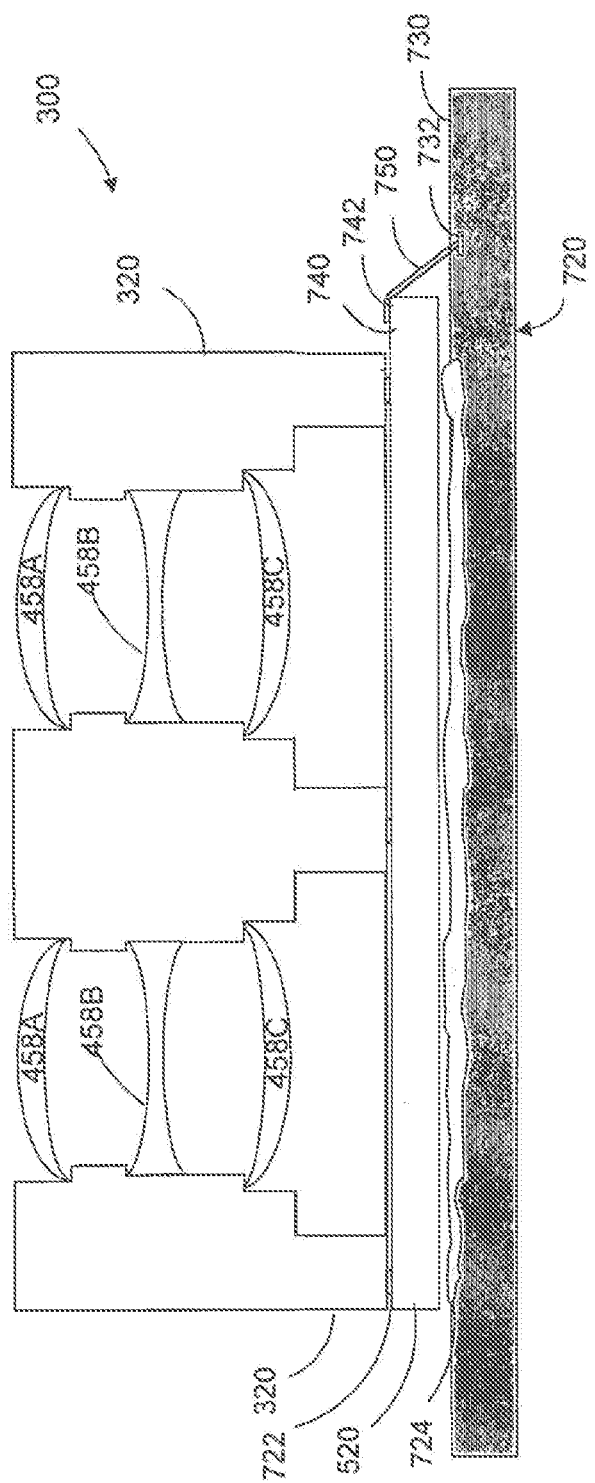
FIG. 47 is a schematic cross-sectional view of a digital camera apparatus that includes the support of FIG. 44 and a printed circuit board on which the digital camera apparatus may be mounted; in accordance with one embodiment of the present invention.

FIG. 47 is a schematic cross-sectional view of a digital camera apparatus 300 and a printed circuit board 720 of a digital camera on which the digital camera apparatus 720 may be mounted, in accordance with another embodiment of the present invention. This embodiment is similar to the embodiment of the digital camera apparatus 300 and printed circuit board 720 shown in FIG. 36 except that this embodiment employs the support and lens elements shown in FIG. 44.

The digital camera apparatus 300 may be assembled and mounted to the printed circuit board 720 in any manner. In some embodiments, for example, the digital camera apparatus 300 is assembled and mounted to the printed circuit board 720 in a manner that is similar to that set forth for the embodiment of the digital camera apparatus and printed circuit board shown in FIG. 36, although it may be advantageous to assemble the lenslets into the support using a manner similar to the manner set forth above for the seating configuration shown in FIG. 41C.

In some embodiments, the digital camera apparatus 300 includes one or more additional structures and/or devices, for example, but not limited to, one or more additional integrated circuits, one or more output devices and/or one or more input devices. The one or more output devices may include any type or types of output devices, for example, but not limited to one or more display devices, one or more speakers and/or any combination thereof. The one or more input devices may include any type or types of input devices, for example, but not limited to one or more microphones. The additional structures and/or devices may be disposed, in any suitable location, for example, but not limited to, adjacent to the image device.

The additional structures and/or devices may comprise any type of material(s) and may have any configuration and/or construction. In some embodiments, for example, the additional structures and/or devices may comprise silicon, semiconductor, glass, ceramic, plastic, or metallic materials and/or a combination thereof. The one or more additional structures and/or devices may be fabricated separate from one another, integral with one another and/or any combination thereof. The one or more additional structures and/or devices may be fabricated separate from the camera channels, integral with the camera channels and/or any combination thereof. The one or more additional structures and/or devices may or may not be physically connected to the processor, the one or more camera channels or any portions thereof. The one or more additional structures and/or devices may or may not be electrically connected to the processor and/or one or more camera channels or portions thereof.

Figure 48:
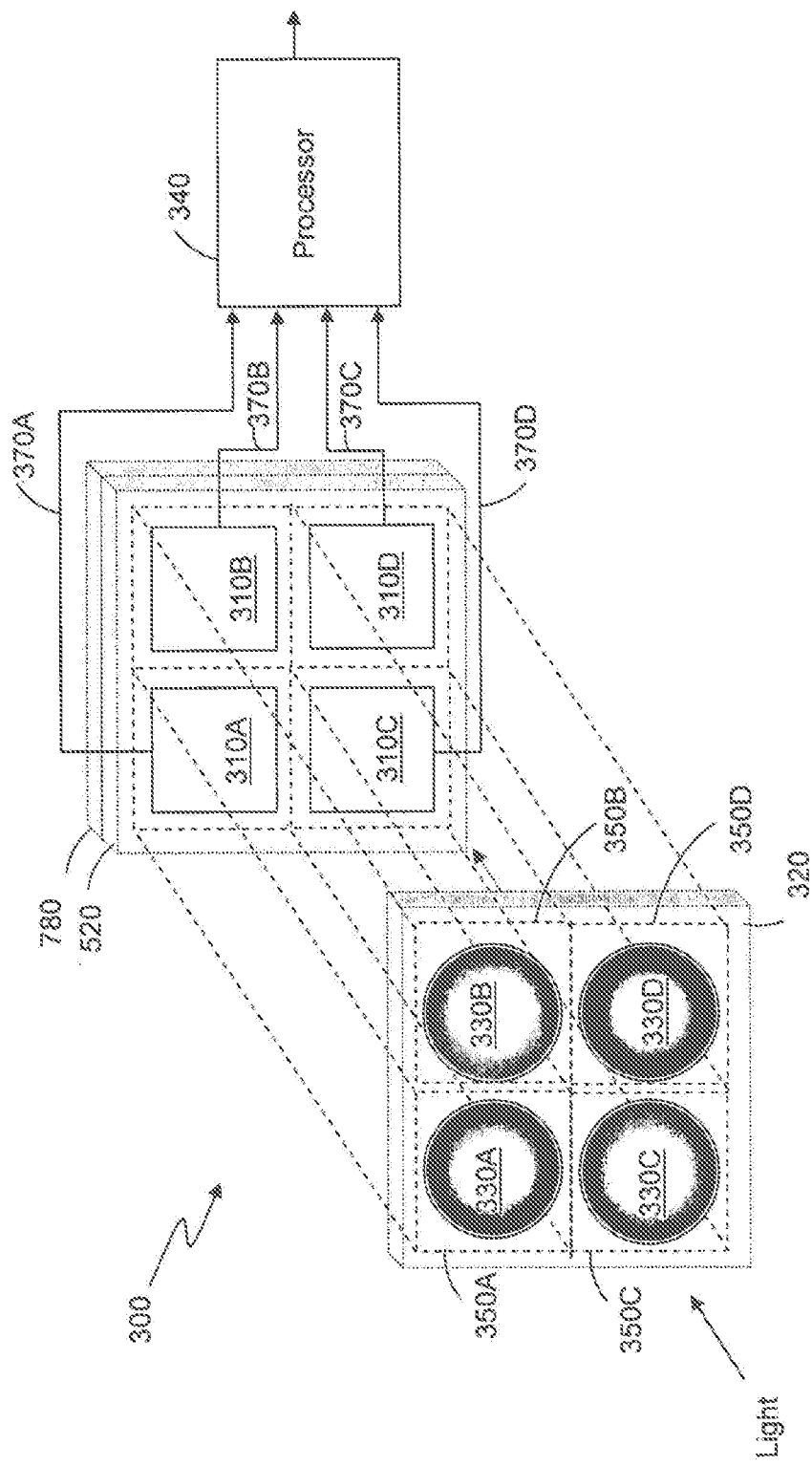
FIG. 48 is a schematic representation of a digital camera apparatus in accordance with another embodiment of the present invention.

FIG. 48 is a schematic representation of a digital camera apparatus 300 that includes a second device 780 in accordance with another embodiment of the present invention. The second device 780 may comprise, for example, but is not limited to, an integrated circuit including any type of circuit or circuits, for example, but not limited to, one or more portions of the processor, one or more portions of a memory or an additional memory, one or more portions of the processor (e.g., one or more portions of a post processor) and/or any other types of circuits.

For example, in some embodiments, the digital camera apparatus 300 includes a memory section that is supplied with and/or stores one, some or all of the images and/or other information generated or used by the digital camera apparatus and/or or any other information from any source and desired to be stored for any duration. The memory section may supply one or more of such images and/or such other information to one or more other devices and/or to one or more portions of the processor, for example, to be further processed and/or to be supplied to one or more other devices. The memory section may be integrated into or disposed on (for example, as a discrete component) the same or different substrate as one some or all of the sensor arrays. The memory section may be, for example, part of or integrated into the processor (which may be integrated into or disposed on (for example, as a discrete component) the same or different substrate as one some or all of the sensor arrays) and/or coupled to one or more portions of the processor via one or more communication links. In some embodiments, the memory section is also coupled to one or more other devices via one or more communication links. In such embodiments, the memory section may supply one or more of the stored images and/or other information to one or more of the one or more other devices, directly (i.e., without passing through the any other portion of the processor) via one or more of the one or more communication links, although this is not required.

The second device 780 may be disposed in any suitable location or locations. However, in some embodiments, the second device 780 is disposed generally adjacent to or in the vicinity of an associated image device, e.g., image device 520, or associated processor.

The circuit or circuits of the second device 780 may be connected, e.g., via one or more communication links, to one or more portions of the processor 340, one or more of the camera channels, one or more other devices and/or any combination thereof. In some embodiments, the one or more communication links include one or more pads on the image device and the second device 780 and one or more electrical connectors having one or more electrically conductive members connecting one or more of the pads on the image device to one or more of the pads on the second device. In some embodiments, the one or more communication links include one or more bump bonds that electrically connect one or more circuits on the image device to one or more circuits on the second device.

The second device 780 may have any size and shape and may or may not have the same configuration as the image device. In some embodiments, the second device 780 has a length and a width that are less than or equal to the length and width, respectively of the optical assembly, the sensor subassembly and/or the image device. In some other embodiments, the second device 780 has a length or a width that is greater than the length or width, respectively of the optical assembly, the sensor subassembly and/or the image device.

Although the processor is shown separate from the image device and second device, it should be understood that the processor may have any configuration and that the processor, or portions thereof, may be disposed in any location or locations. In some embodiments, one, some or all portions of the processor are disposed on or integrated into the image device. In some embodiments one, some or all portions of the processor are disposed on or integrated into the second device. In some of such embodiments one or more portions of the processor are disposed on the image device and one or more portions of the processor are disposed on or integrated into the second device. For example, certain operations of the processor may be distributed to or performed by circuitry that is integrated in or disposed on the same substrate or substrates as one or more of the one or more of the sensor arrays and certain operations of the processor are distributed to or performed by circuitry that is integrated in or disposed on one or more substrates that are different from (whether such one or more different substrates are physically located within the camera or not) the substrates the one or more of the sensor arrays are integrated in or disposed on.

In some embodiments, the digital camera apparatus may further include one or more addition integrated circuits devices, e.g., a third integrated circuit device (not shown). The one or more additional integrated circuits device may have any size and shape and may or may not have the same configuration as one another, the image device or the second device. In some embodiments, the third integrated circuit device has a length and a width that are equal to the length and width, respectively of the optical assembly, the sensor subassembly and/or the image device. In some other embodiments, the third integrated circuit device has a length or a width that is greater than or less than the length or width, respectively of the optical subassembly, the sensor subassembly and/or the image device.

Figure 49:
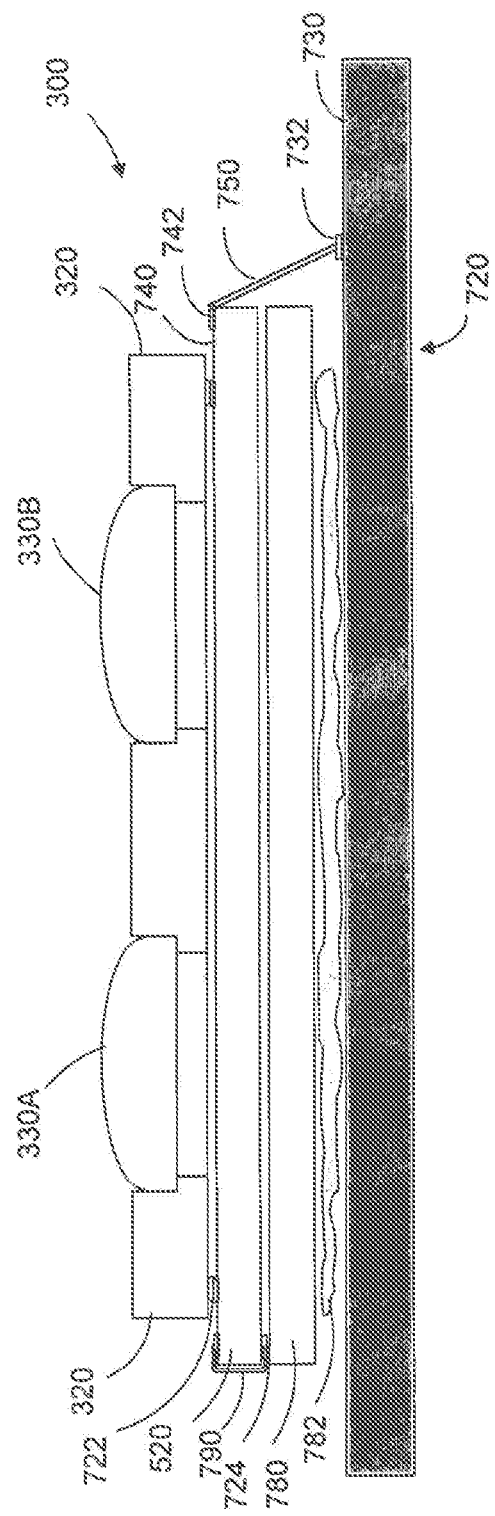
FIG. 49 is a schematic cross-sectional view of a digital camera apparatus and a printed circuit board of a digital camera on which the digital camera apparatus may be mounted, in accordance with another embodiment of the present invention.

FIG. 49 is a schematic cross-sectional view of a digital camera apparatus 300 and a printed circuit board 720 of a digital camera on which the digital camera apparatus may be mounted, in accordance with another embodiment of the present invention. This embodiment is similar to the embodiment of the digital camera apparatus and printed circuit board shown in FIG. 36 except that this embodiment includes a second device 780 such as, for example, as shown in FIG. 48. The second device 780 is disposed superjacent a third bond layer 782, which is disposed superjacent the printed circuit board.

The third bond layer 782 may comprise any suitable material(s), for example, but not limited to adhesive, and may comprise any suitable configuration. The third bond layer 782 may comprise the same material(s) as the first and/or second bond layers 722, 724, although this is not required.

In some embodiments, the digital camera apparatus 300 has dimensions of about 2.5 mm×6 mm×6 mm. For example, the thickness may be equal to about 2.5 mm, the length may be equal to about 6 mm and the width may be equal to about 6 mm. In some of such embodiments, the digital camera apparatus has one or more sensor arrays having a total of 1.3 M pixels, although other configurations may be employed (e.g., different thickness, width, length and number of pixels).

Figure 50:
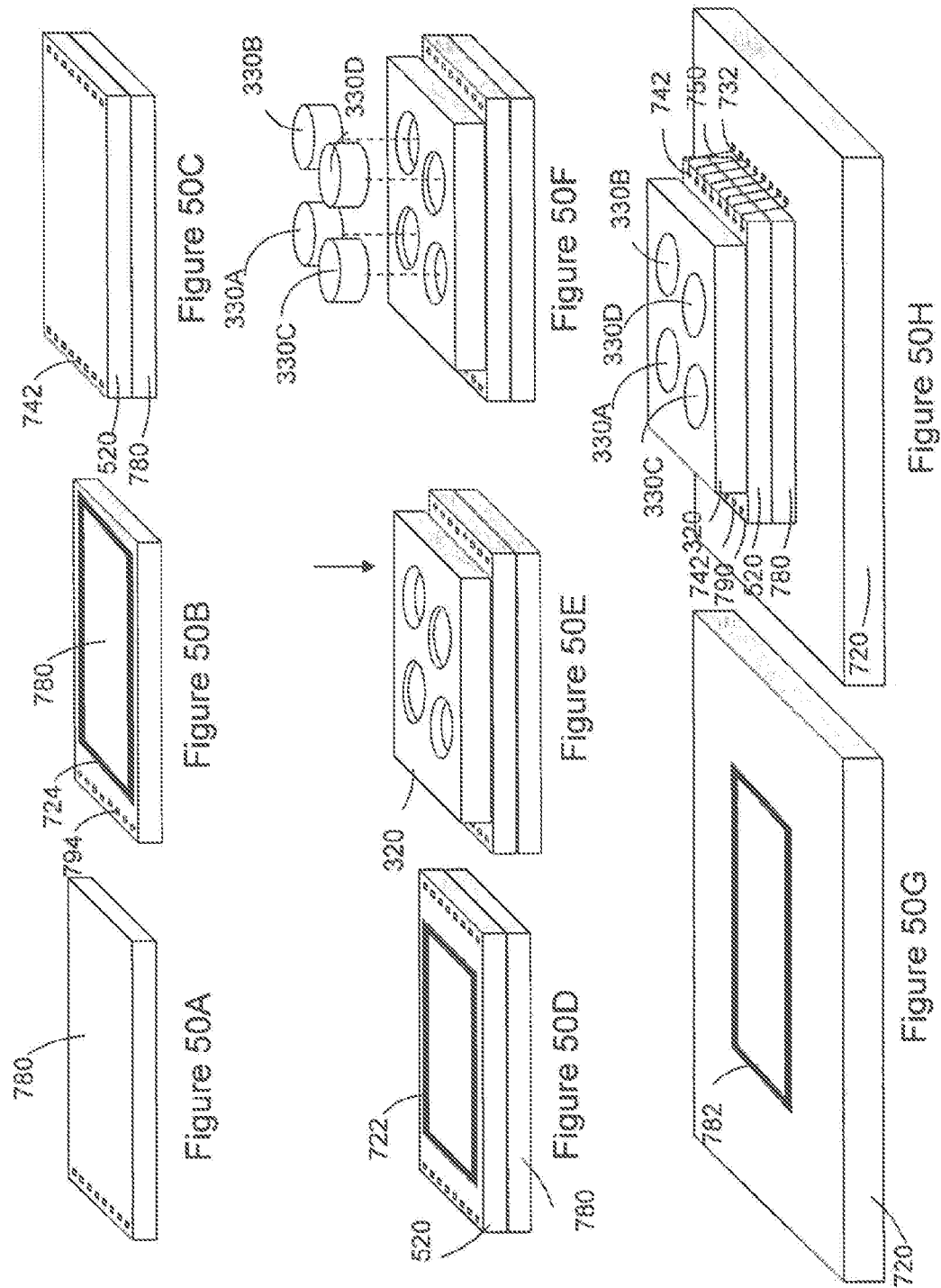
FIGS. 50A-50H shows one embodiment for assembling and mounting the digital camera apparatus of FIG. 49.

The digital camera apparatus 300 may be assembled and/or mounted in any manner. FIGS. 50A-50F shows one such embodiment for assembling and mounting the digital camera apparatus. Referring to FIG. 50A, initially, the second device is provided. Referring to FIG. 50B, a bond layer 724 is provided on one or more regions of one or more surfaces of the second device. Such regions define one or more mounting regions for the image device. Referring to FIG. 50C, the image device 520 is thereafter positioned on the bond layer 724. In some embodiments, force may be applied to help drive any trapped air out from between the image device 520 and second device 780. In some embodiments, heat and/or force may be applied to provide conditions to activate and/or cure the bond layer to form a bond between the image device and the second device. Referring to FIG. 50D, a bond layer 722 is provided on one or more regions of one or more surfaces of the image device 520. Such regions define one or more mounting regions for the support 320. Referring to FIG. 50E, the support 320 is thereafter positioned on the bond layer 722. In some embodiments, force may be applied to help drive any trapped air out from between the image device 520 and support 320. In some embodiments, heat and/or force may be applied to provide conditions to activate and/or cure the bond layer to form a bond between the image device and the support. Referring to FIG. 50F, one or more optics portions, e.g., optics portions 330A-330D may thereafter be seated in and/or affixed to the support 320. Referring to FIG. 50G, a bond layer 782 is provided on one or more regions of one or more surfaces of the printed circuit board 720. Such regions define one or more mounting regions for the digital camera apparatus 300. Referring to FIG. 50H, the digital camera apparatus is thereafter positioned on the bond layer 782. One or more electrical conductors 750 may be installed to connect one or more of the pads 742 on the image device 520 to one or more pads 732 on the circuit board 720. One or more electrical conductors 790 may be installed to connect one or more of the pads 742 on the image device 520 to one or more pads 794 on the second device 780.

Figure 51:
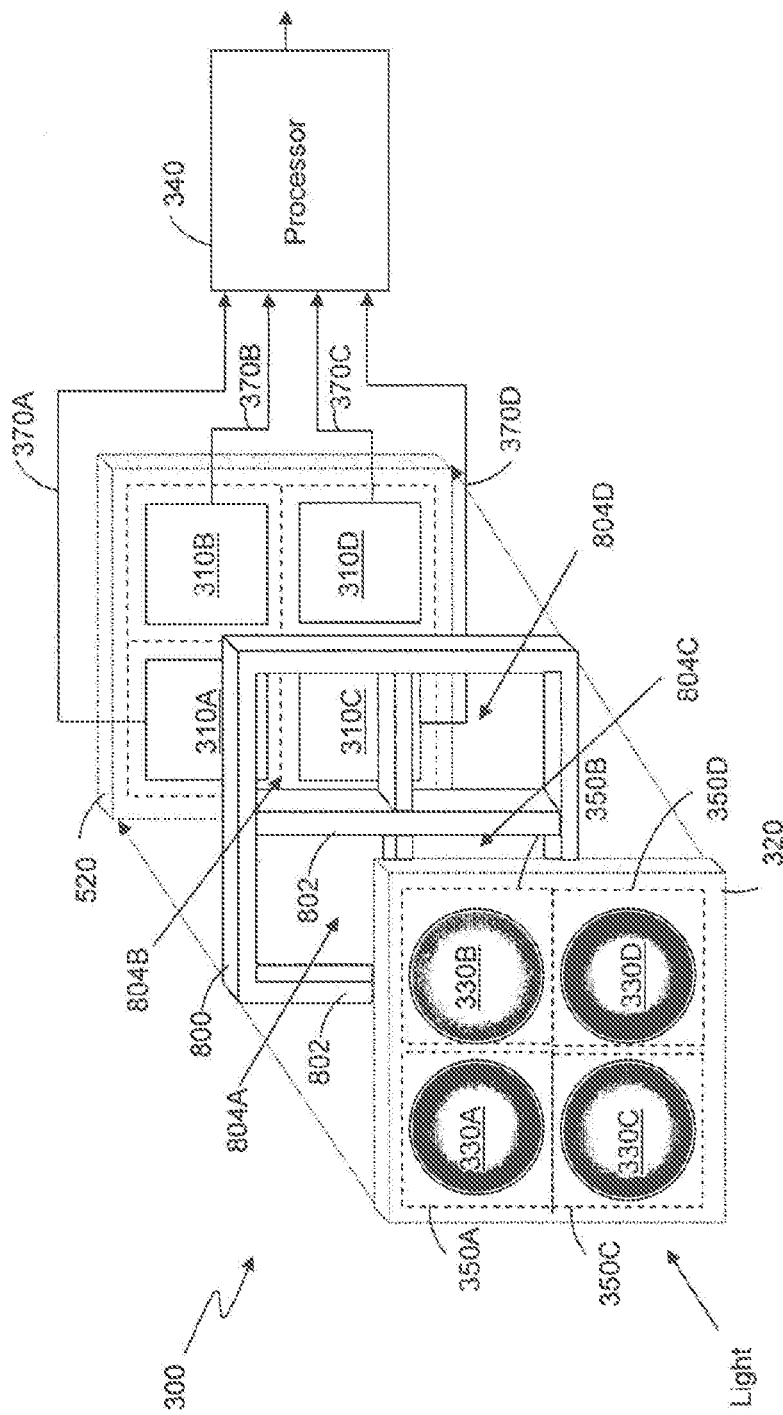
FIG. 51 is a schematic representation of a digital camera apparatus that includes a spacer in accordance with another embodiment of the present invention.

FIG. 51 is a schematic representation of an exemplary digital camera apparatus, digital camera apparatus 300 includes a spacer 800 disposed between the support 320 and the image device 520, in accordance with another embodiment of the present invention. In some embodiments, the spacer 800 helps position the optics portions, e.g., optics portions 330A-330D, at the respective desired distance or distances from the respective sensor arrays, e.g., 310A-310D, respectively. In this embodiment, the spacer 800 extend in an axial direction and defines walls 802, which define apertures, e.g., apertures 804A-804D (e.g., for camera channels 350A-350D, respectively), for transmission of light, to help limit, minimize and/or eliminate light "cross talk" between the camera channels and to help limit, minimize and/or eliminate "entry" of light from outside the digital camera apparatus.

The spacer 800 may comprise any type of material(s) and may have any configuration and/or construction. In some embodiments, for example, the spacer 800 comprises silicon, semiconductor, glass, ceramic, plastic, or metallic materials and/or a combination thereof. If the spacer has more than one portion, such portions may be fabricated separate from one another, integral with one another and/or any combination thereof.

The spacer 800 may be fabricated separately from and/or integral with the support 320 or support portions 600A-600D.

The spacer 800 may be a solid device that may offer a wide range of options for manufacturing and material, however other forms of devices may also be employed. In some embodiments, for example, the spacer comprises a plate (e.g., a thin plate) that defines the walls and apertures of the spacer. Apertures, e.g. apertures 804A-804D, may be formed by machining (e.g., boring) or any other suitable manner. In some embodiments, the spacer is fabricated as a casting with the apertures defined therein (e.g., using a mold with projections that define the apertures and seats of the one or more support portions of the spacer).

Although the processor is shown separate from the image device, it should be understood that the processor may have any configuration and that the processor, or portions thereof, may be disposed in any location or locations. In some embodiments, one, some or all portions of the processor are disposed on the image device.

As with each of the embodiments of the present invention, this embodiment may be employed alone or in combination with one or more of the other embodiments disclosed herein, or portions thereof.

Figure 52:
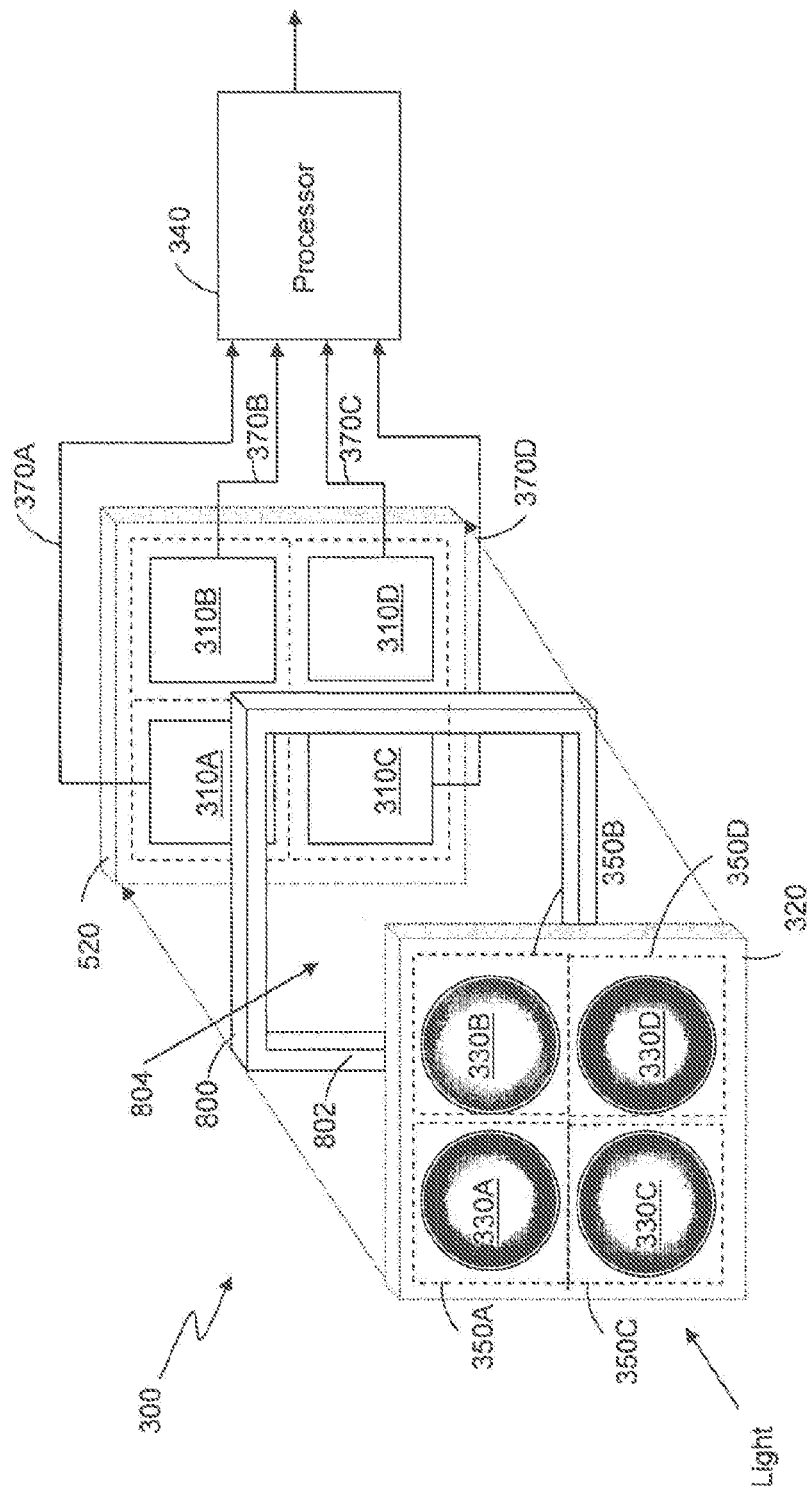
FIG. 52 is a schematic representation of a digital camera apparatus that includes a spacer, in accordance with another embodiment of the present invention.

FIG. 52 is a schematic representation of a digital camera apparatus 300 that includes a spacer 800 disposed between the support 320 and the image device 520, in accordance with another embodiment of the present invention. This embodiment of the spacer 800 is similar to the embodiment of the spacer 800 shown in FIG. 51 except that the spacer 800 in this embodiment defines only one aperture 804 for transmission of light and may not help limit, minimize and/or eliminate light "cross talk" between the camera channels, e.g., camera channels 350A-350D.

Figure 53:
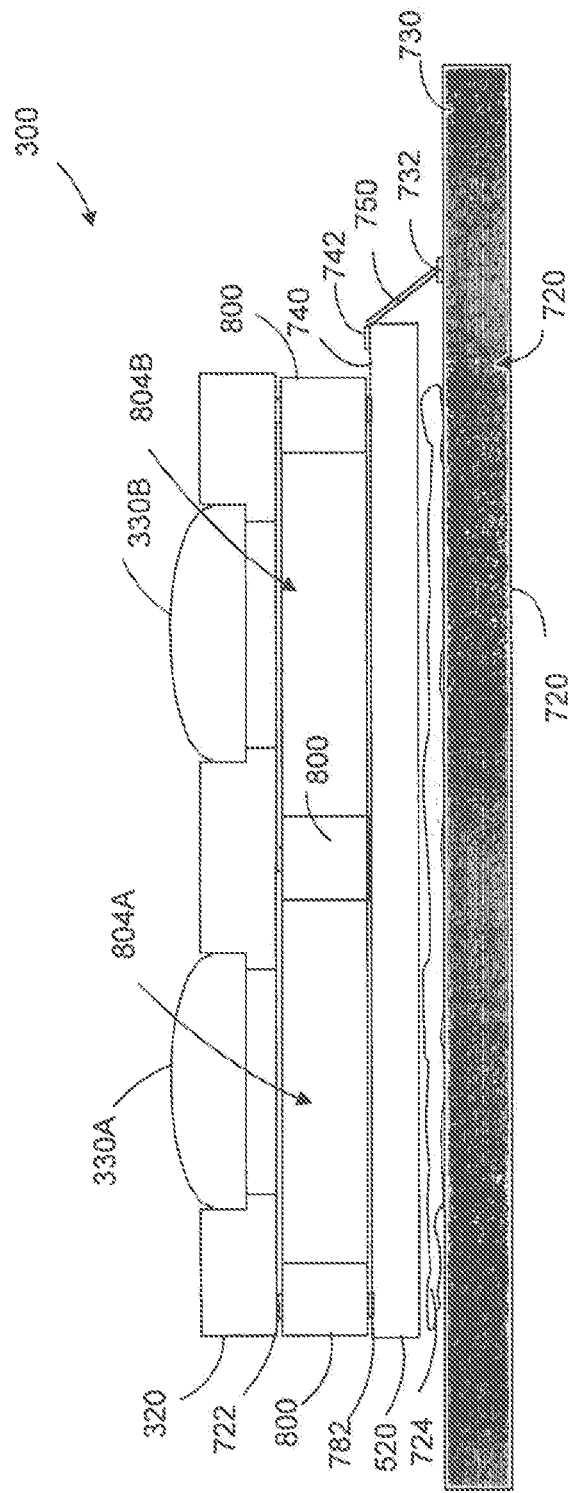
FIG. 53 is a schematic cross-sectional view of a digital camera apparatus and a printed circuit board of a digital camera on which the digital camera apparatus may be mounted, in accordance with another embodiment of the present invention.

FIG. 53 is a schematic cross-sectional view of a digital camera apparatus 300 and a printed circuit board 720 of a digital camera on which the digital camera apparatus 300 may be mounted, in accordance with another embodiment of the present invention. This embodiment is similar to the embodiment of the digital camera apparatus and printed circuit board shown in FIG. 36 except that this embodiment includes a spacer 800 such as, for example, as shown in FIG. 51. The spacer 800 is disposed superjacent a bond layer 782, which is disposed superjacent the image device 520.

The bond layer 782 may comprise any suitable material(s), for example, but not limited to adhesive, and may comprise any suitable configuration. The bond layer may comprise the same material(s) as other bond layers although this is not required.

In some embodiments, the digital camera apparatus has dimensions of about 2.5 mm×6 mm×6 mm. For example, the thickness may be equal to about 2.5 mm, the length may be equal to about 6 mm and the width may be equal to about 6 mm. In some of such embodiments, the digital camera apparatus has one or more sensor arrays having a total of 1.3 M pixels, although other configurations may be employed (e.g., different thickness, width, length and number of pixels).

The digital camera apparatus may be assembled and mounted in any manner. FIGS. 54A-54F shows one such embodiment for assembling and mounting the digital camera apparatus 300. Referring to FIG. 54A, initially, the image device 520 is provided. Referring to FIG. 54B, a bond layer 782 is provided on one or more regions of one or more surfaces of the image device. Such regions define one or more mounting regions for the spacer 800. Referring to FIG. 54C, the spacer 800 is thereafter positioned on the bond layer 782. In some embodiments, force may be applied to help drive any trapped air out from between the spacer 800 and the image device 520. In some embodiments, heat and/or force may be applied to provide conditions to activate and/or cure the bond layer to form a bond between the spacer and the image device. Referring to FIGS. 54D-54E, a bond layer 722 is provided on one or more regions of one or more surfaces of the spacer 800. Such regions define one or more mounting regions for the one or more support portions of the support 320, which is thereafter positioned on the bond layer 722. In some embodiments, force may be applied to help drive any trapped air out from between the spacer 800 and the one or more support portions of the support 320. In some embodiments, heat and/or force may be applied to provide conditions to activate and/or cure the bond layer to form a bond between the spacer and the one or more support portions of the support. Referring to FIG. 54F, one or more optics portions, e.g., optics portions 330A-330D may thereafter be seated in and/or affixed to the support 320. Referring to FIG. 54G, a bond layer 724 is provided on one or more regions of one or more surfaces of the printed circuit board 720. Such regions define one or more mounting regions for the digital camera apparatus 300. Referring to FIG. 54H, the digital camera apparatus is thereafter positioned on the bond layer 724. One or more electrical conductors 750 may be installed to connect one or more of the pads 742 on the image device to one or more pads 732 on the circuit board.

As with each of the embodiments of the present invention, this embodiment may be employed alone or in combination with one or more of the other embodiments disclosed herein, or portions thereof.

Figure 55:
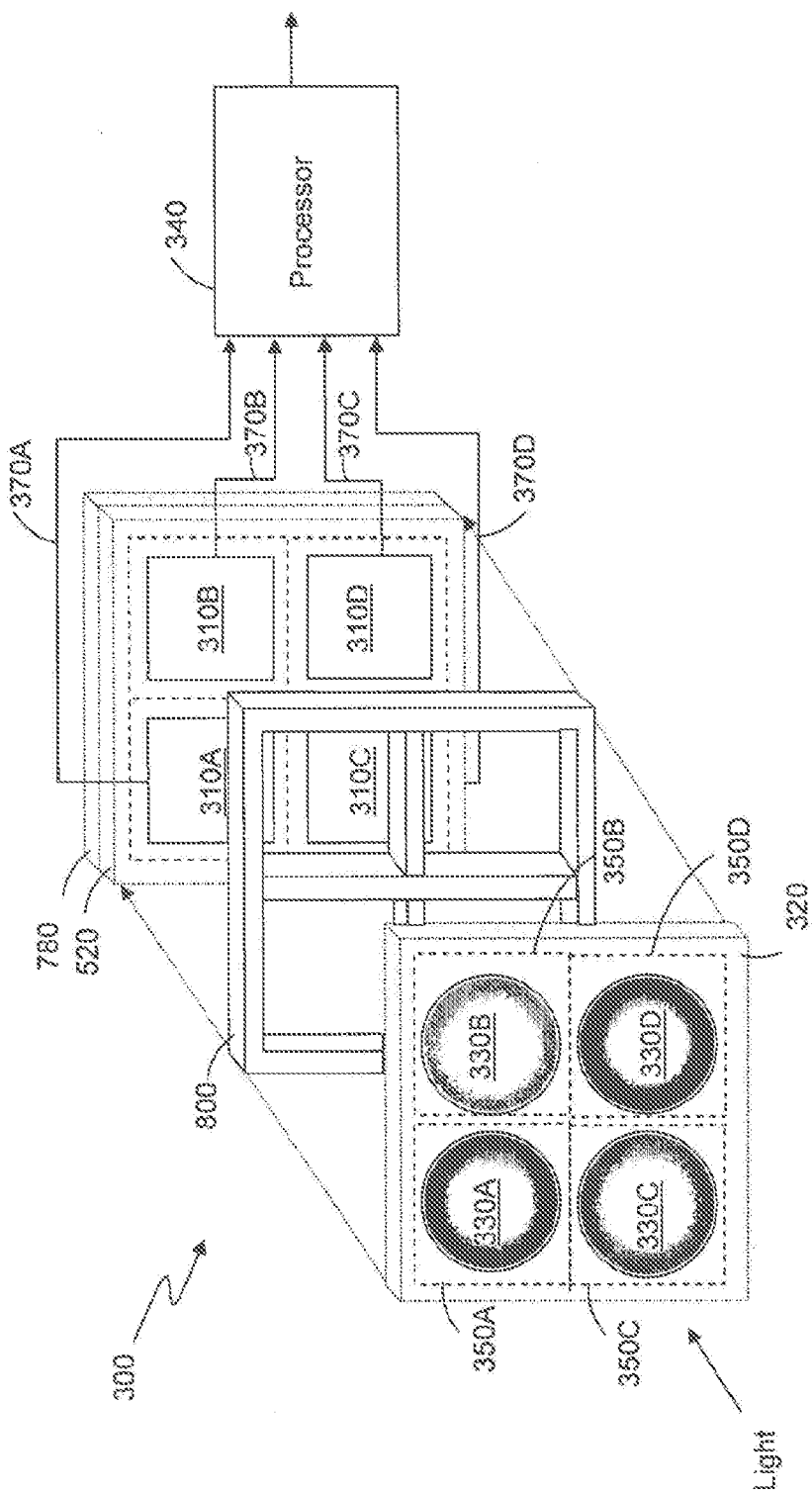
FIG. 55 is a schematic representation of a digital camera apparatus that includes a second device and a spacer, in accordance with another embodiment of the present invention.

For example, FIG. 55 is a schematic representation of a digital camera apparatus 300 that includes a second device and a spacer 800, in accordance with another embodiment of the present invention.

Although the processor is shown separate from the image device and second device, it should be understood that the processor 340 may have any configuration and that the processor, or portions thereof, may be disposed in any location or locations. In some embodiments, one, some or all portions of the processor are disposed on the image device. In some embodiments one, some or all portions of the processor are disposed on the second device. In some of such embodiments one or more portions of the processor are disposed on the image device and one or more portions of the processor are disposed on the second device.

Figure 56:
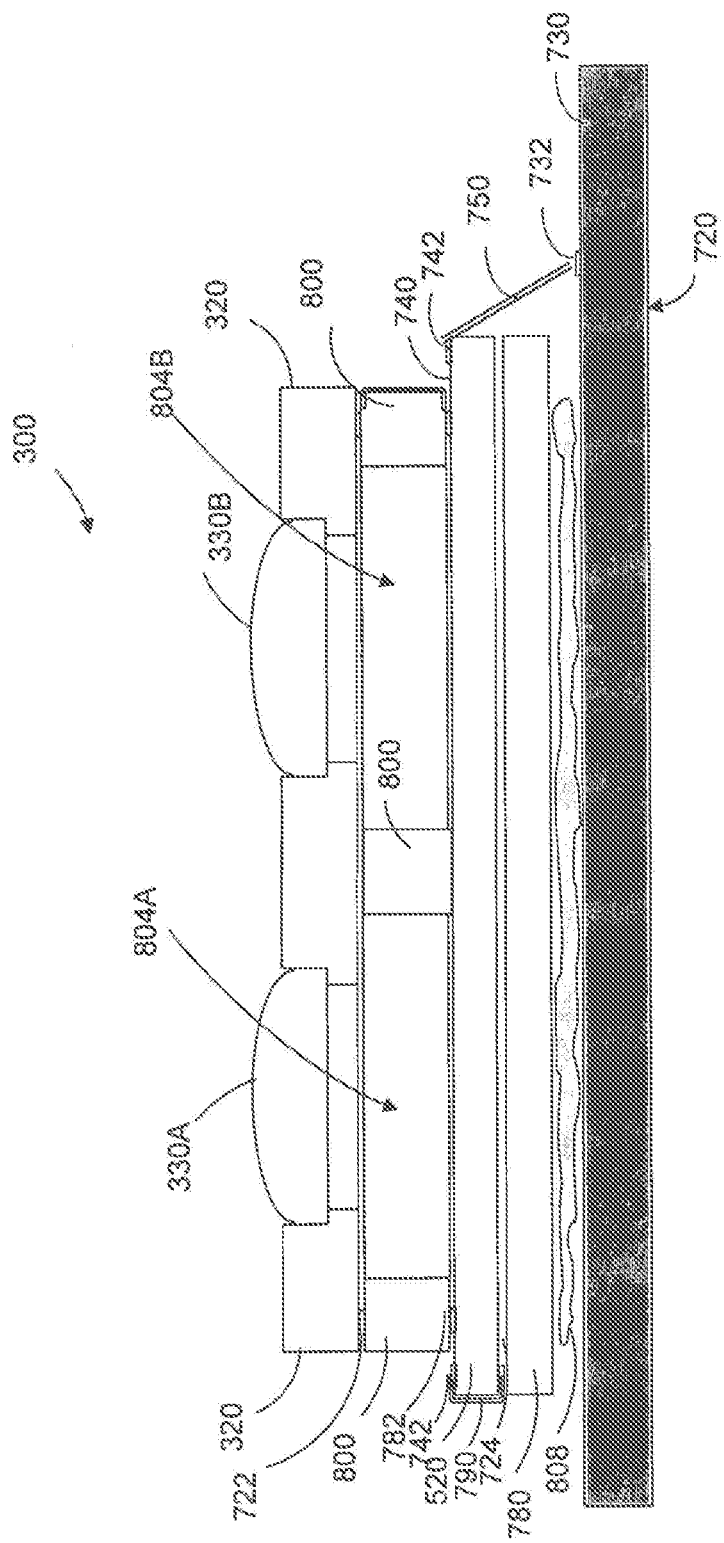
FIG. 56 is a schematic cross-sectional view of a digital camera apparatus and a printed circuit board of a digital camera on which the digital camera apparatus may be mounted, in accordance with another embodiment of the present invention.
Figure 58:
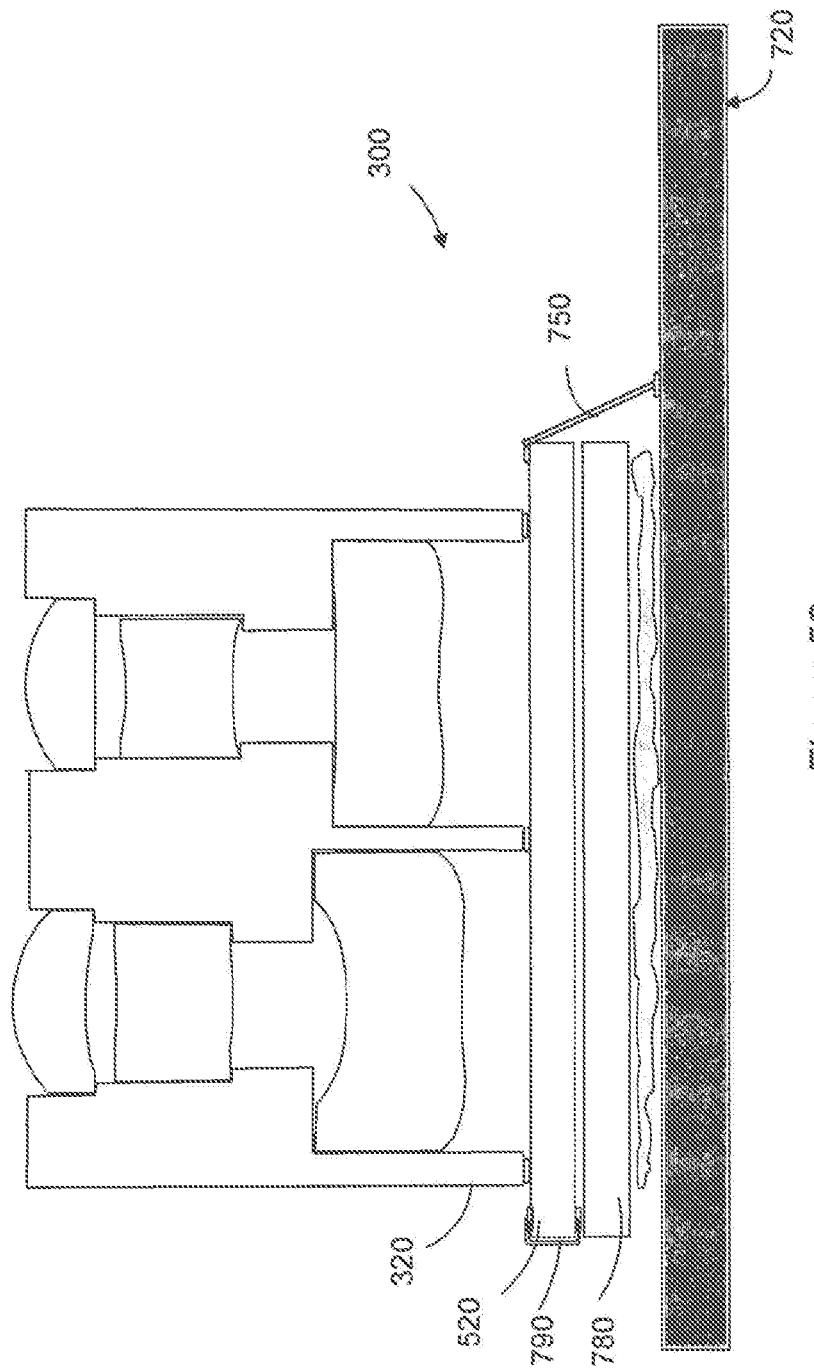
FIGS. 58-62 are schematic cross-sectional views of digital camera apparatus and printed circuit boards of digital cameras on which the digital camera apparatus may be mounted, in accordance with further embodiments of the present invention.
Figure 59:
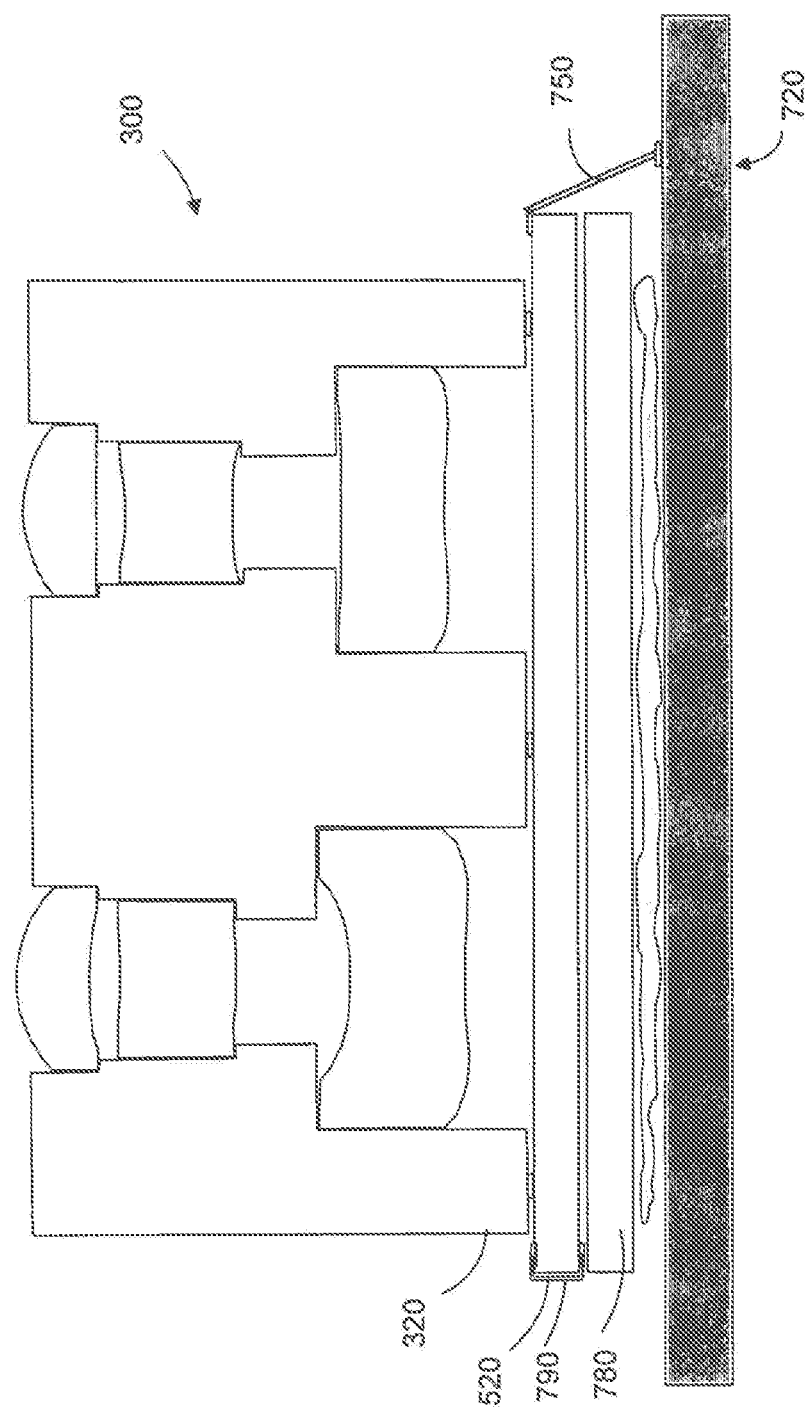
Figure 60:
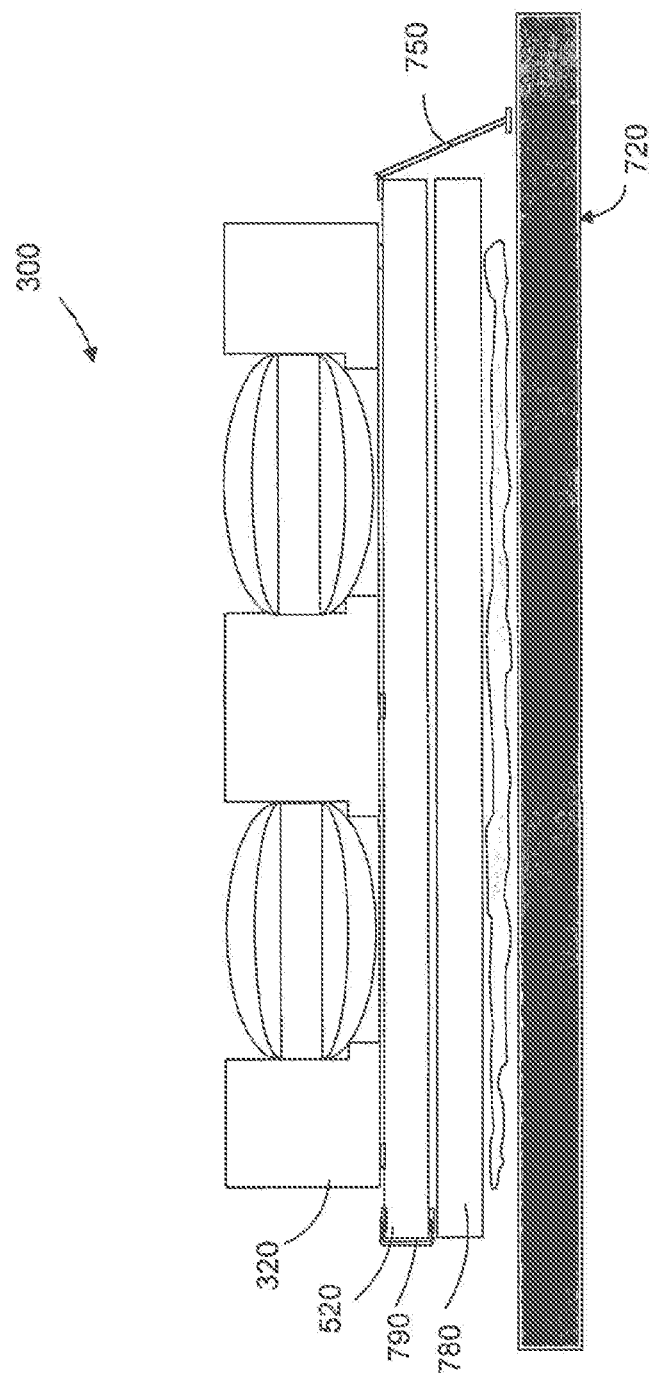
Figure 61:
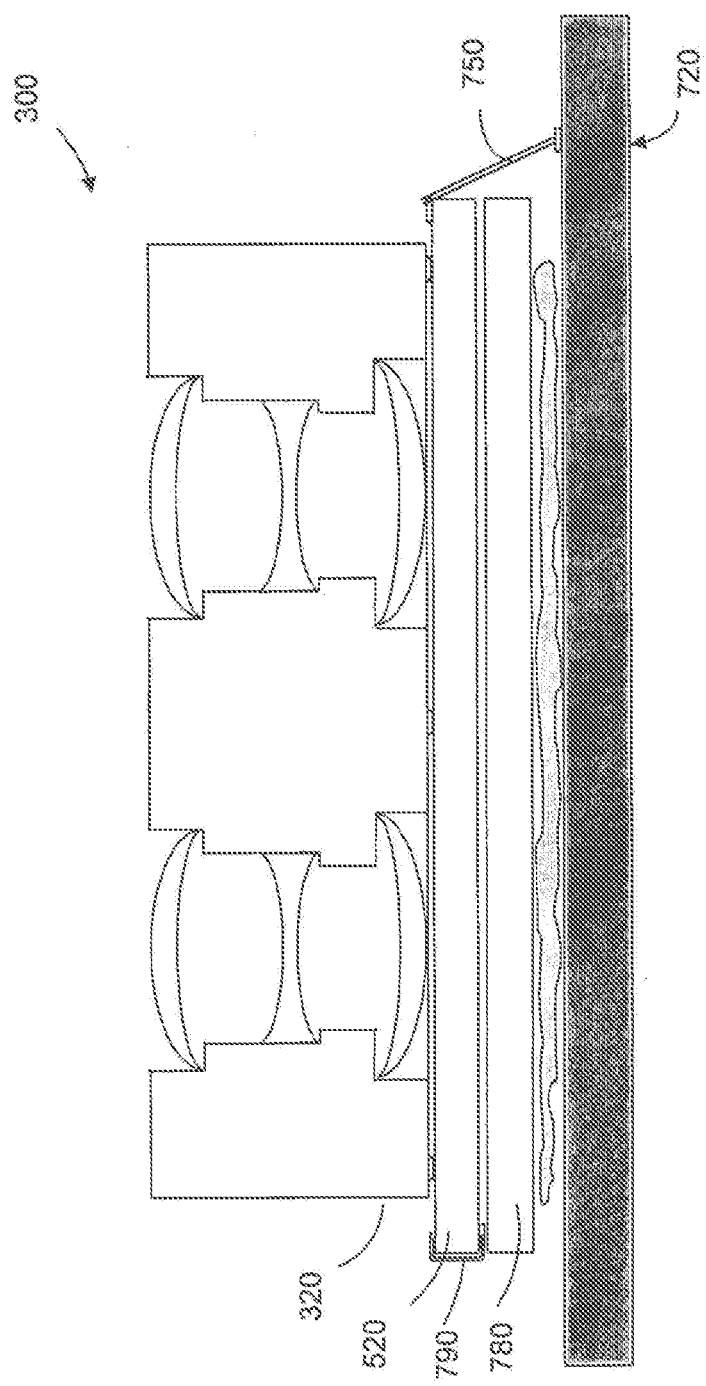
Figure 62:
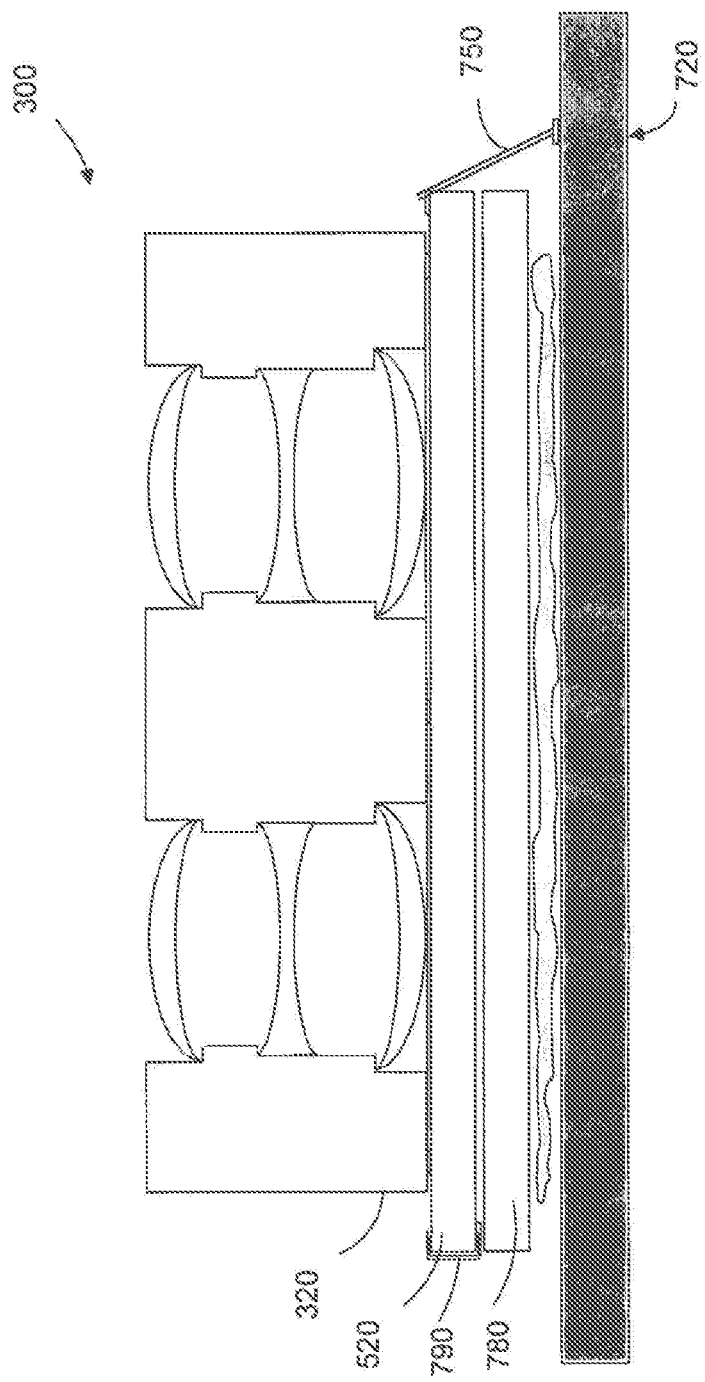
Figure 63:
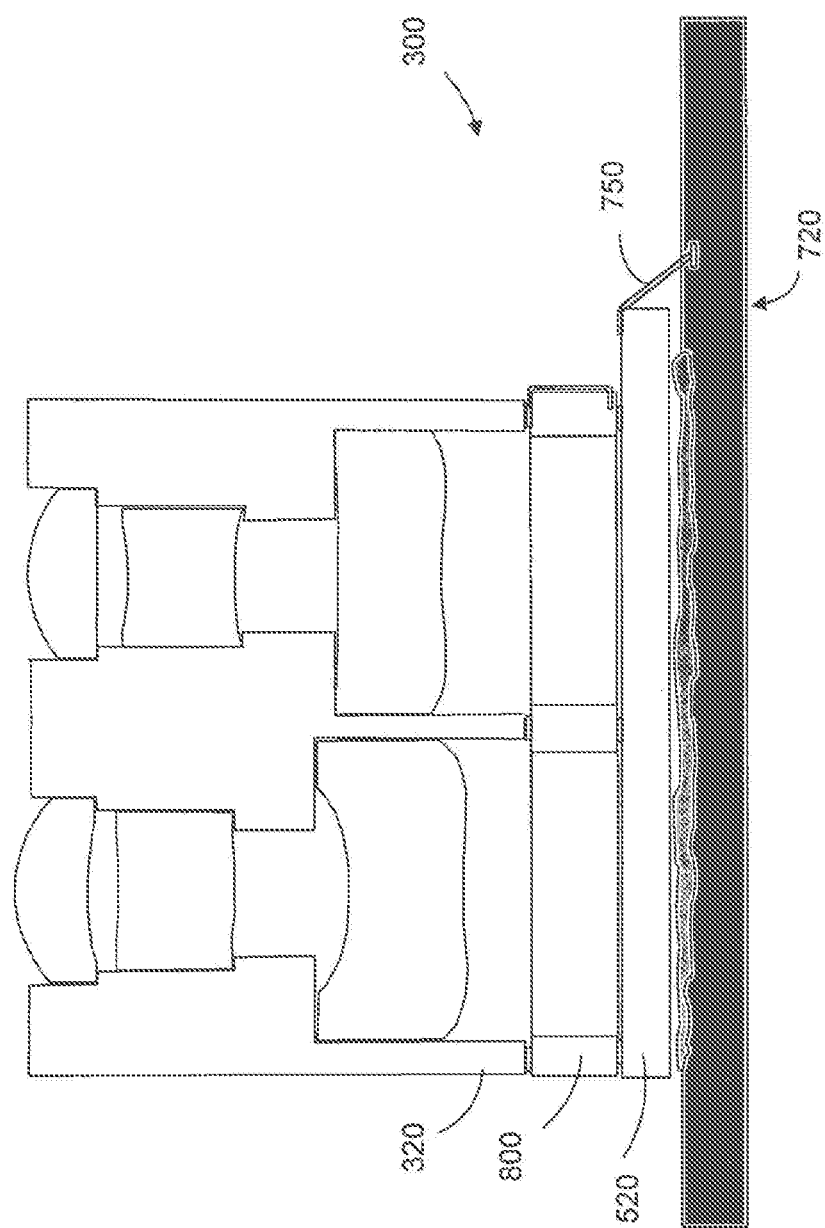
FIGS. 63-67 are schematic cross-sectional views of digital camera apparatus and printed circuit boards of digital cameras on which the digital camera apparatus may be mounted, in accordance with further embodiments of the present invention.
Figure 64:
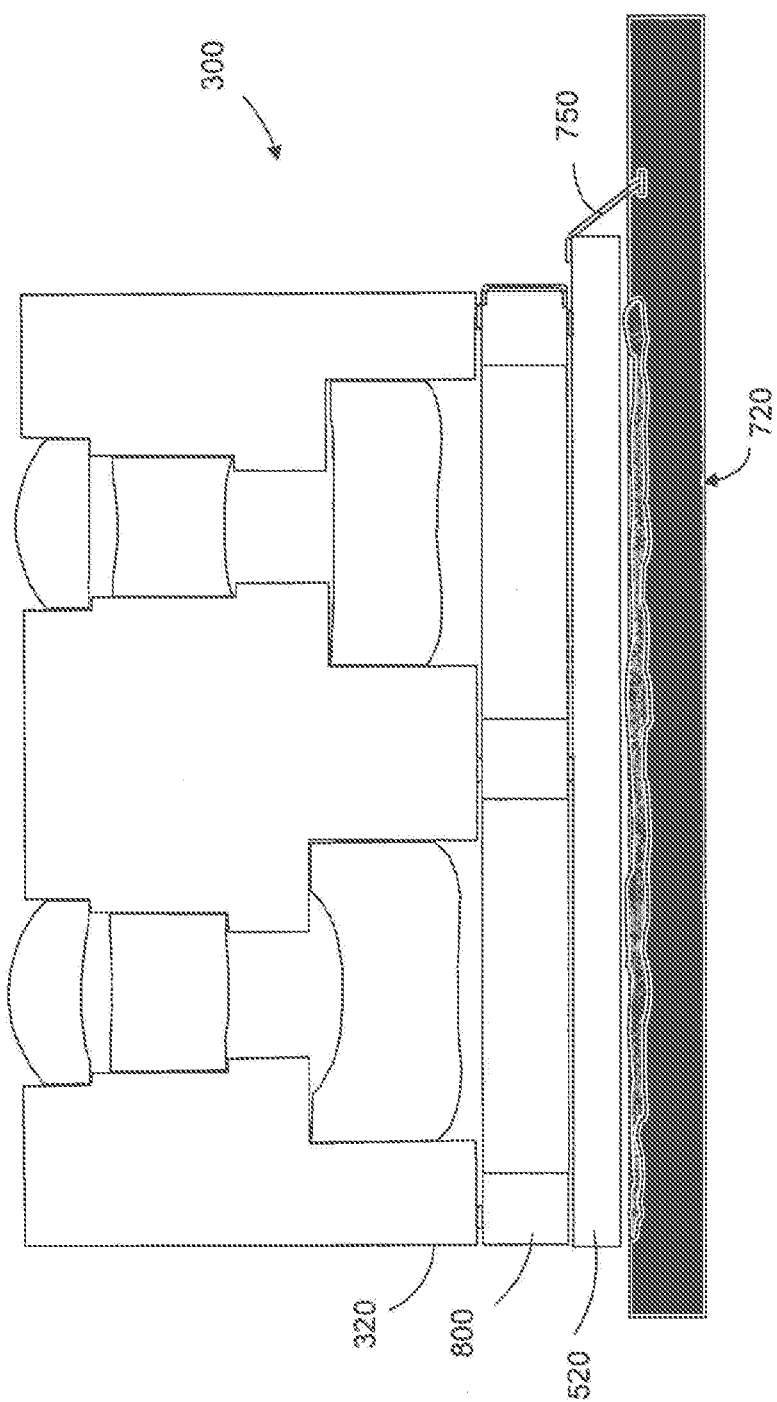
Figure 65:
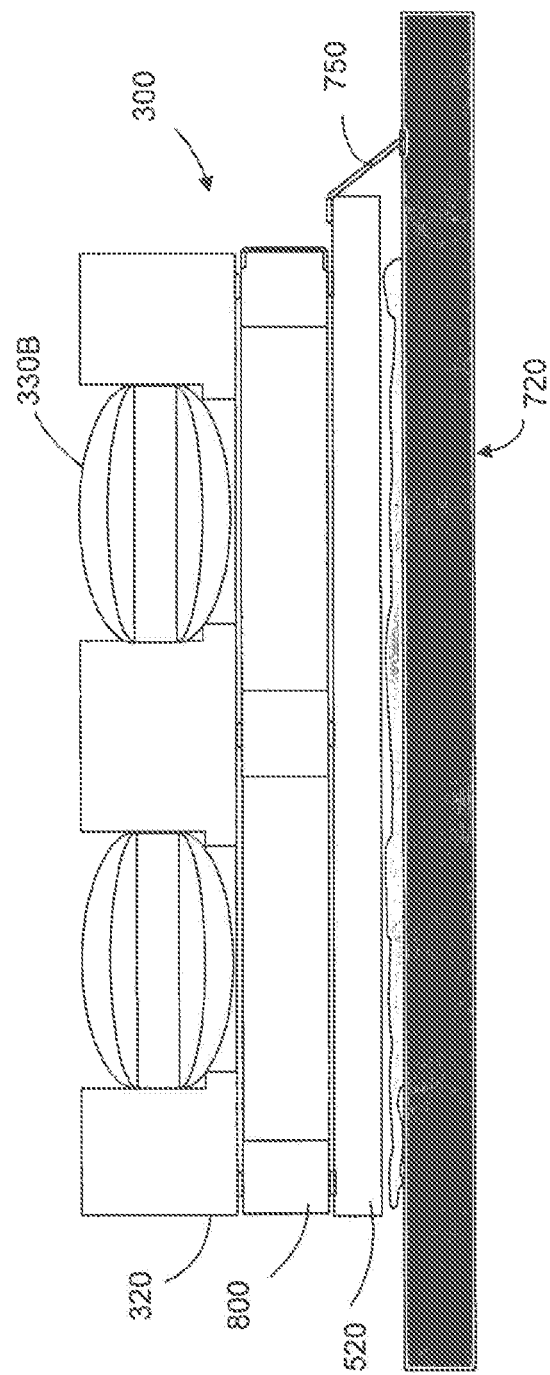
Figure 66:
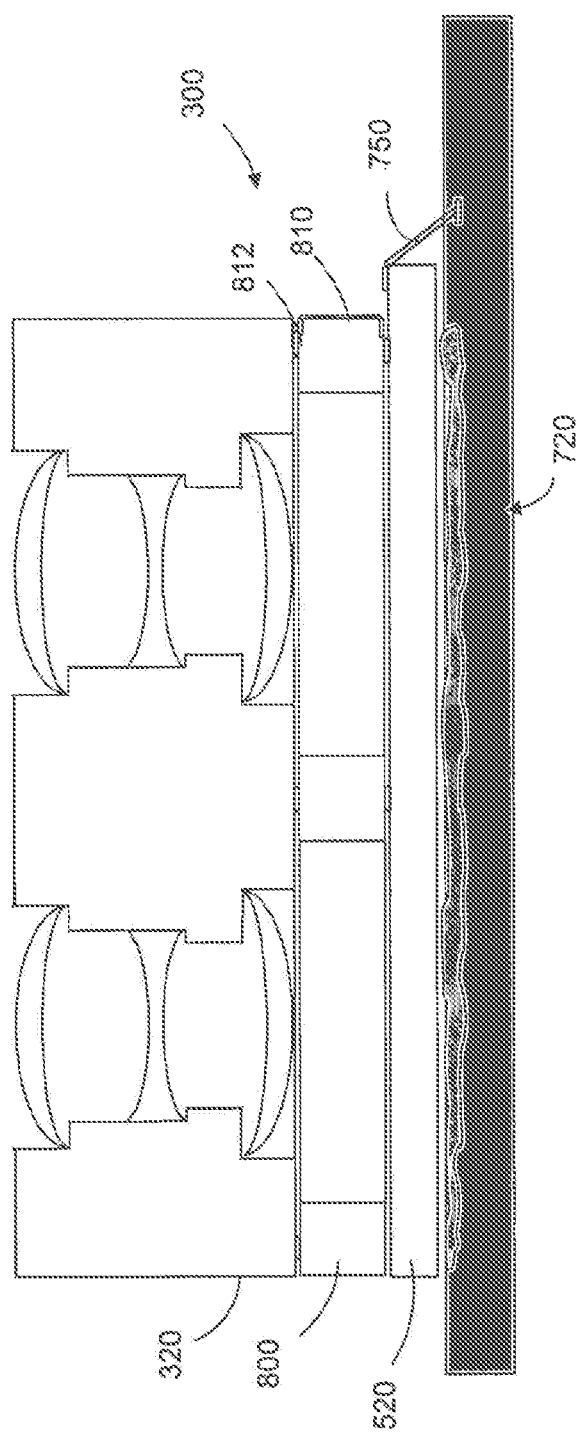
Figure 67:
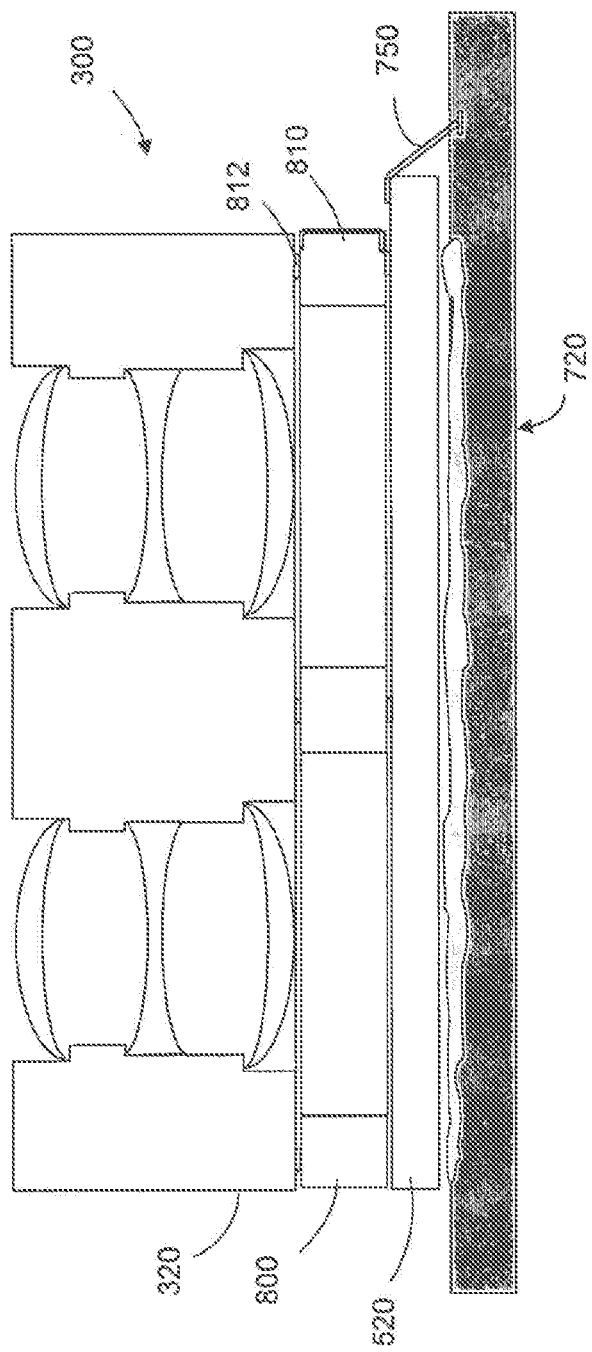
Figure 68:
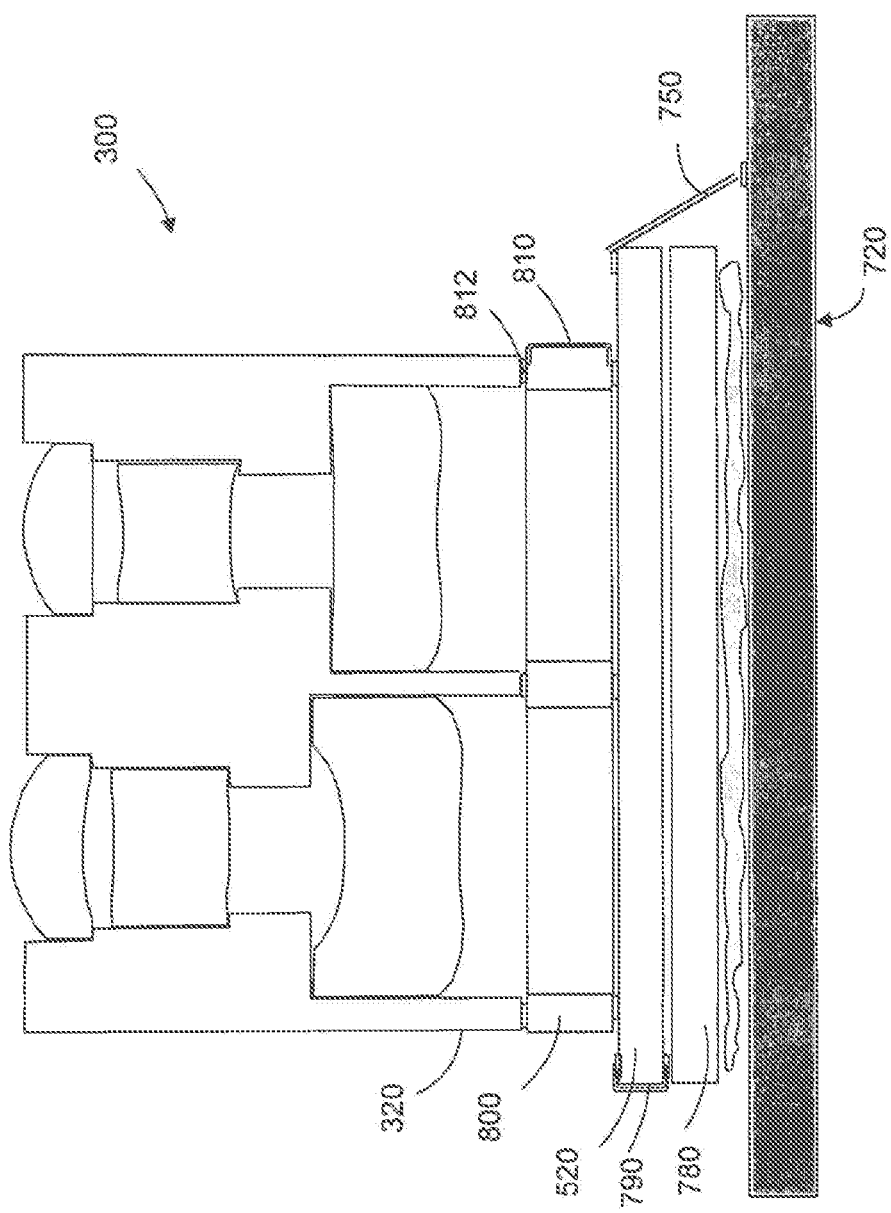
Figure 69:
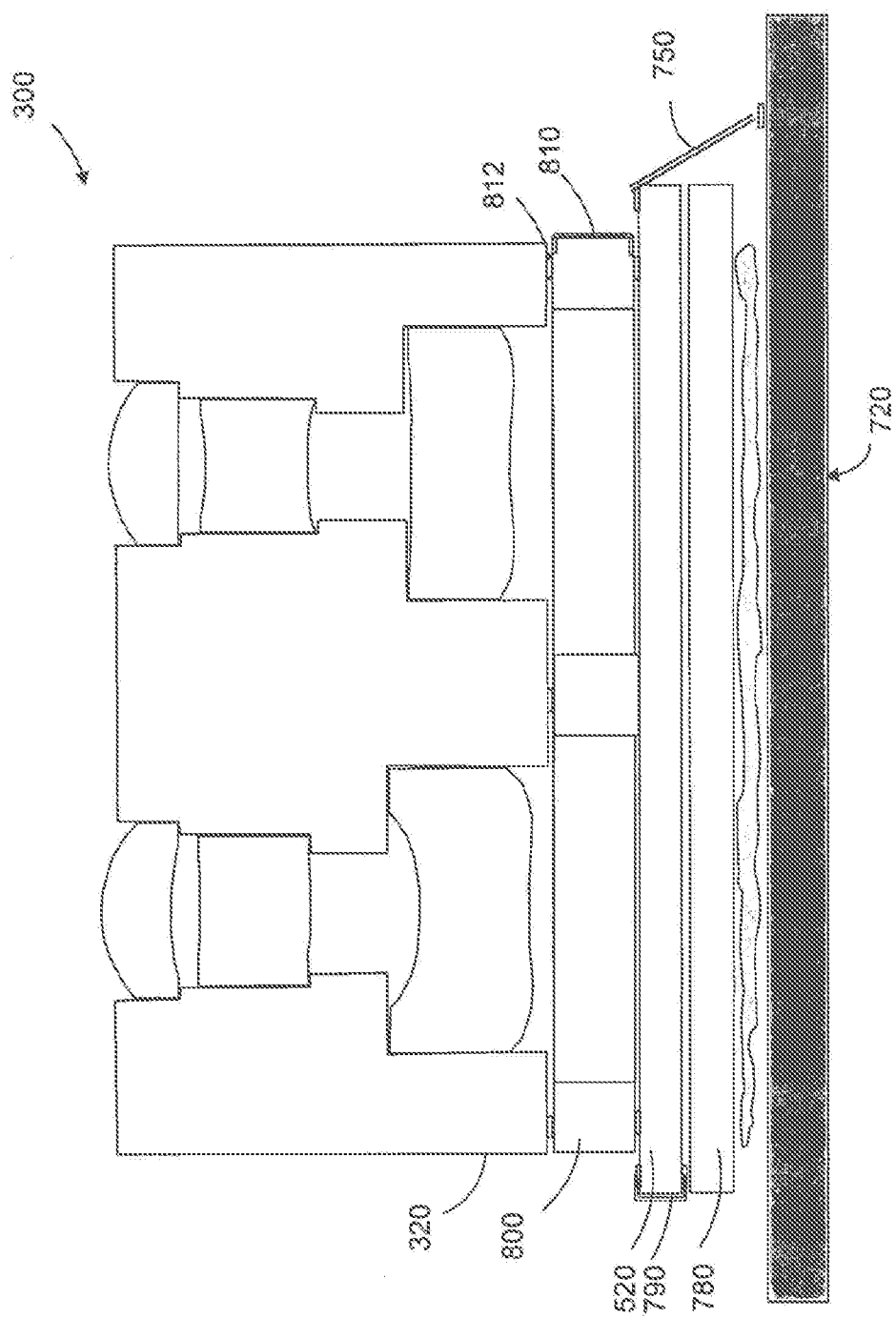
Figure 70:
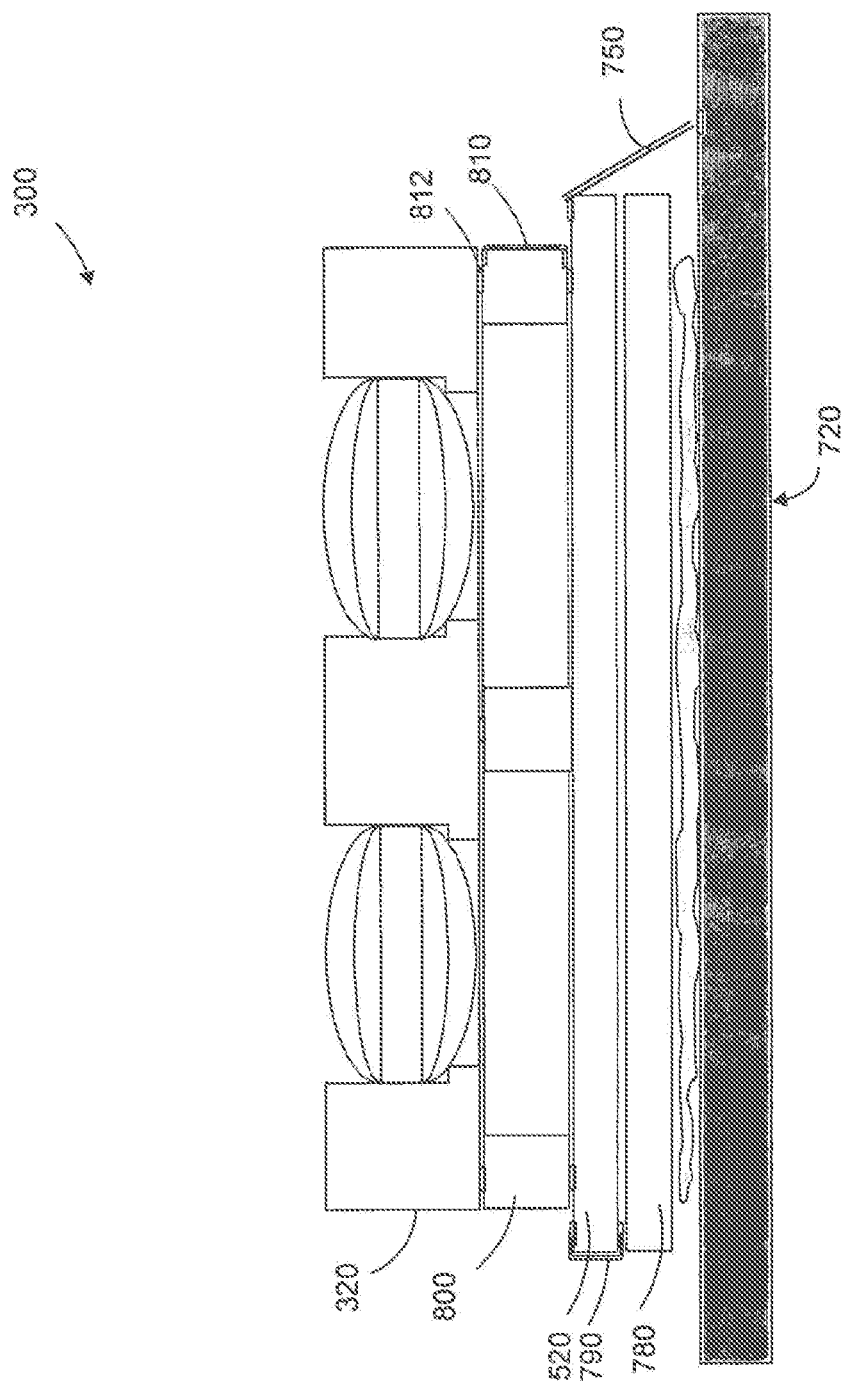
Figure 71:
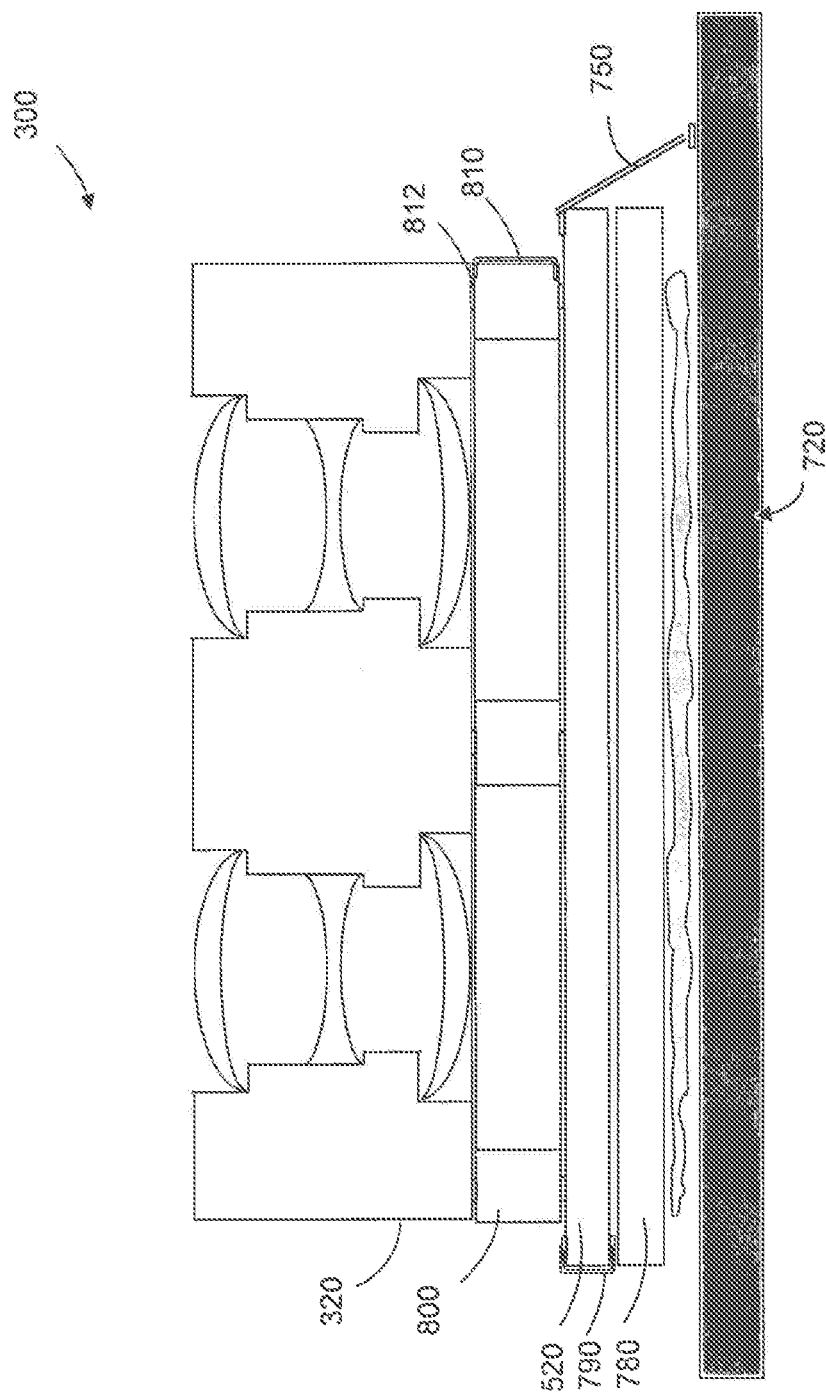

FIG. 56 is a schematic cross-sectional view of a digital camera apparatus 300 and a printed circuit board 720 of a digital camera on which the digital camera apparatus may be mounted, in accordance with another embodiment of the present invention. This embodiment is similar to the embodiment of the digital camera apparatus and printed circuit board shown in FIG. 53 except that this embodiment includes a second device 780. The second device 800 is disposed superjacent a bond layer 808, which is disposed superjacent printed circuit board 720.

The bond layer 808 may comprise any suitable material(s), for example, but not limited to adhesive, and may comprise any suitable configuration. The bond layer may comprise the same material(s) as other bond layers although this is not required.

In some embodiments, the digital camera apparatus has dimensions of about 2.5 mm×6 mm×6 mm. For example, the thickness may be equal to about 2.5 mm, the length may be equal to about 6 mm and the width may be equal to about 6 mm. In some of such embodiments, the digital camera apparatus has one or more sensor arrays having a total of 1.3 M pixels, although other configurations may be employed (e.g., different thickness, width, length and number of pixels).

The digital camera apparatus 300 may be assembled and mounted in any manner. FIGS. 57A-57F shows one such embodiment for assembling and mounting the digital camera apparatus. Referring to FIG. 57A, initially, the second device 780 is provided. Referring to FIG. 57B, a bond layer 724 is provided on one or more regions of one or more surfaces of the second device 780. Such regions define one or more mounting regions for the image device 520. Referring to FIG. 57C, the image device is thereafter positioned on the bond layer 724. In some embodiments, force may be applied to help drive any trapped air out from between the image device and second device 780. In some embodiments, heat and/or force may be applied to provide conditions to activate and/or cure the bond layer to form a bond between the image device and the second device 780. Referring to FIG. 57D, a bond layer 782 is provided on one or more regions of one or more surfaces of the image device. Such regions define one or more mounting regions for the spacer 800. Referring to FIG. 57E, the spacer 800 is thereafter positioned on the bond layer 782. In some embodiments, force may be applied to help drive any trapped air out from between the spacer and the image device. In some embodiments, heat and/or force may be applied to provide conditions to activate and/or cure the bond layer to form a bond between the spacer and the image device. Referring to FIGS. 54E-54G, a bond layer 722 is provided on one or more regions of one or more surfaces of the spacer 800. Such regions define one or more mounting regions for the one or more support portions of the support 320, which is thereafter positioned on the bond layer 722. In some embodiments, force may be applied to help drive any trapped air out from between the spacer and the one or more support portions of the support 320. In some embodiments, heat and/or force may be applied to provide conditions to activate and/or cure the bond layer to form a bond between the spacer 800 and the one or more support portions of the support 320. One or more optics portions, e.g., optics portions 330A-330D may thereafter be seated in and/or affixed to the support. Referring to FIG. 57G, a bond layer 808 is provided on one or more regions of one or more surfaces of the printed circuit board 720. Such regions define one or more mounting regions for the digital camera apparatus 300. Referring to FIG. 57H, the digital camera apparatus is thereafter positioned on the bond layer 782. One or more electrical conductors 750 may be installed to connect one or more of the pads 742 on the image device to one or more pads on the circuit board 732. One or more electrical conductors 790 may be installed to connect one or more of the pads 742 on the image device to one or more pads on the second device 780.

As stated above, each of the embodiments disclosed herein may be employed alone or in combination with one or more of the other embodiments disclosed herein, or portions thereof.

For example, in some embodiments, one or more of the supports shown in FIGS. 37-38 and 42-44 are employed in one or more of the embodiments of the digital camera apparatus shown in FIGS. 48-57.

For example, FIGS. 58-62 are schematic cross-sectional views of a digital camera apparatus and a printed circuit board of a digital camera on which the digital camera apparatus may be mounted, in accordance with further embodiments of the present invention. These embodiments are similar to the embodiment of the digital camera apparatus and printed circuit board shown in FIG. 49 except that the support and the optics portions have configurations similar to the support and optics portions shown in FIGS. 37-38, 42-44, respectively.

FIGS. 63-67 are schematic cross-sectional views of a digital camera apparatus and a printed circuit board of a digital camera on which the digital camera apparatus may be mounted, in accordance with further embodiments of the present invention. These embodiments are similar to the embodiment of the digital camera apparatus and printed circuit board shown in FIG. 53 except that the support and the optics portions have configurations similar to the support and optics portions shown in FIGS. 37-38, 42-44, respectively.

In some embodiments herein, one or more electrical or electro mechanical devices are disposed in or on a support and/or spacer. In some of such embodiment, one or more electrical conductors may connect one or more of such devices to one or more circuits on the image device and/or another device, for example, to provide power, control signals and/or data signals to and/or from one or more of such device. One or more of such electrical conductors may be in the form of an electrical connector, although this is not required. The electrical conductors may be disposed on one or more outside surface and/or may extend through one or more portion of one or more portions of the digital camera apparatus, e.g., a support, a spacer, an image device, if present, or combinations thereof. For example, in some embodiments, one or more electrical conductors, e.g., conductors 810, 812 (FIGS. 63-72) are provided and extend over one or more surfaces of, or through one or more portions of, a support (e.g., over or through one or more support portions, e.g., 600A-600D) and/or spacer (e.g., over or through one or more walls, e.g., walls 602) so as to connect to one or more circuits on or in the image device or another device.

FIGS. 68-72 are schematic cross-sectional views of a digital camera subsystem and a printed circuit board of a digital camera on which the digital camera apparatus may be mounted, in accordance with further embodiments of the present invention. These embodiments are similar to the embodiment of the digital camera apparatus and printed circuit board shown in FIG. 56 except that the support and the optics portions have configurations similar to the support and optics portions shown in FIGS. 37-38, 42-44, respectively.

FIGS. 73A-73B are schematic elevational and cross sectional views, respectively, of a support in accordance with another embodiment of the present invention. In this embodiment, one or more of the support portions are spaced apart from one another and/or isolated from one another, e.g., by on or more clearances or spaces, e.g., clearance 816.

FIG. 74 is a schematic cross sectional view of a support in accordance with another embodiment of the present invention. In this embodiment, the support includes one or more support portions disposed superjacent (e.g., on or above) one or more other support portions. In some such embodiments, the support portions may be spaced apart from one another and/or isolated from one another in the z direction, e.g., by clearances or spaces, e.g., clearance 816.

As stated above, it should be understood that each of the embodiments described above may be used alone or in combination with any other embodiment(s) or portion thereof described herein or known to those of ordinary skill in the art.

For example, in some embodiments the support is adapted to receive one or more optics portions of a first size and shape and one or more optics portions of a second size and shape that is different than the first size and/or first shape. In some embodiments, optics portions of further sizes and shapes may also be received, e.g., a third size and shape, a fourth size and shape, a fifth size and shape, etc.

Referring to FIG. 75, in some embodiments, one or more of the supports disclosed herein is provided with one or more curved portions, e.g., curved portions 818A-818D. Such aspect may be advantageous, for example, in some embodiments in which it is desired to reduce and/or minimize the dimensions of the digital camera apparatus.

FIGS. 76A-76C are schematic views of a digital camera apparatus that includes one or more output devices 820 in accordance with another embodiment of the present invention. FIG. 76A is a schematic perspective view of one embodiment of a digital camera apparatus that includes one or more output devices. FIGS. 76B-76C are schematic front and back perspective views, respectively, of an output device 820 in accordance with one embodiment of the present invention.

In some embodiments, the one or more output devices 820 are in the form of one or more display devices, however, other types of output devices may also be employed. In some embodiments, the one or more display devices are in the form of one or more micro displays.

The one or more display devices may be disposed in any suitable location or locations. In some embodiments, it may be advantageous to collect light (for the one or more camera channels) on one side of the digital camera assembly and to provide one or more of the one or more output displays, e.g., output display 820, on the other side of the digital camera assembly. In the illustrated embodiment, the digital camera apparatus has first and second sides generally opposite one another. The one or more camera channels are positioned to receive light through a first side of the digital camera apparatus. One or more of the display devices are positioned to transmit light (e.g., one or more display images) from the second side of the digital camera apparatus. In some embodiments, such a configuration may make it possible to provide a digital camera apparatus that is very thin (e.g., in the z direction). Other configurations may also be employed. In some embodiments, one or more of the display devices is positioned generally adjacent to the image device, although this is not required.

The one or more display devices may be connected to the processor, one or more of the camera channels or any combination thereof, via one or more communication links. In some embodiments, the one or more communication links include one or more pads on the image device and the one or more display devices and one or more electrical connectors having one or more electrically conductive members connecting one or more of the pads on the image device to one or more of the pads on the one or more display devices. In some embodiments, the one or more communication links include one or more bump bonds that electrically connect one or more circuits on the image device to one or more circuits on the one or more display devices.

The one or more display devices may have any size and shape and may or may not have the same configuration as one another (e.g., type, size, shape, resolution). In some embodiments, one or more of the one or more display devices has a length and a width that are less than or equal to the length and width, respectively of the optical assembly, the sensor subassembly and/or the image device. In some embodiments, one or more of the one or more display devices has a length or a width that is greater than the length or width, respectively of the optical assembly, the sensor subassembly and/or the image device. In some embodiments, each of the camera channels is connected to its own display device. In some other embodiments, two or more camera channels, e.g., camera channels 350A-350B, are connected to a first display and one or more of the other camera channels, e.g., camera channel 350C-350D, is connected to a second display. In some embodiments, one of the one or more displays is connected to the processor to display a combined image based at least in part on images from each of the camera channels.

As with each of the embodiments disclosed herein, the above embodiments may be employed alone or in combination with one or more of the other embodiments disclosed herein, or portions thereof.

Thus, in some embodiments, the digital camera apparatus 300 further include a spacer 800 (see for example, FIG. 76D) and/or one or more electrical conductors 822 to connect one or more circuits of the one or more output devices, e.g., output device 820, to one or more circuits in one or more other portions of the subsystem 300, one or more circuits of a processor 340 that may be disposed on the image device 520 (see for example, FIG. 76E).

Further, in some embodiments, the digital camera apparatus may further include one or more illumination devices and/or a support having one or more actuators (such a support may comprise, for example, a frame having one or more actuators) (e.g., MEMS actuators, for example, comb type MEMS actuators) to move one or more of the optics portions of the camera channels. In some of the latter embodiments, the digital camera apparatus includes one or more illumination devices and/or a support having one or more actuators (such a support may comprise, for example, a frame having one or more actuators) (e.g., MEMS actuators).

FIGS. 77A-77C are schematic views of a digital camera apparatus that includes one or more input devices 830 in accordance with another embodiment of the present invention. More particularly, FIG. 77A is a schematic perspective view of one embodiment of a digital camera apparatus that includes one or more input devices. FIGS. 77B-77C are enlarged schematic front and back perspective views, respectively, of an input device in accordance with one embodiment of the present invention. In this embodiment, the one or more input devices are in the form of one or more audio input devices, e.g., one or more microphones, however, other types of input devices may also be employed. In some embodiments, the one or more microphones are in the form of one or more silicon microphones.

The one or more audio input devices may be disposed in any suitable location or locations. In some embodiments, it may be advantageous to collect light (for the one or more camera channels) on one side of the digital camera assembly and to collect sound from the same side of the digital camera subassembly. In the illustrated embodiment, the digital camera apparatus has first and second sides generally opposite one another. The one or more camera channels are positioned to receive light through a first side of the digital camera apparatus. One or more of the audio input devices may be positioned to receive audio input (e.g., sound) from the first side of the digital camera apparatus. In some embodiments, such a configuration may make it possible to provide a digital camera apparatus that is very thin (e.g., in the z direction). Other configurations may also be employed. In some embodiments, one or more of the audio input devices is disposed on and/or integral with one or more portions of the support, although this is not required. [0607] The one or more audio input devices may be connected to the processor via one or more communication links. In some embodiments, the one or more communication links include one or more pads on the image device and the one or more audio input devices and one or more electrical connectors having one or more electrically conductive members connecting one or more of the pads on the image device to one or more of the pads on the audio input devices. In some embodiments, the one or more communication links include one or more bump bonds that electrically connect one or more circuits on the image device to one or more circuits on the one or more audio input devices.

The one or more audio input devices may have any size and shape and may or may not have the same configuration as one another (e.g., type, size, shape, resolution). In some embodiments, one or more of the one or more audio input devices has a length and a width that are less than or equal to the length and width, respectively of the optical assembly, the sensor subassembly and/or the image device. In some embodiments, one or more of the one or more audio input devices has a length or a width that is greater than the length or width, respectively of the optical assembly, the sensor subassembly and/or the image device.

FIGS. 77G-77L are schematic perspective view of digital camera apparatus in accordance with further embodiments. Such embodiments have input devices with configurations and/or in arrangements that are different than the configuration and/or arrangement of the input device shown in FIG. 77A. Other configurations and/or arrangements may also be employed.

As with each of the embodiments disclosed herein, this embodiment of the present invention may be employed alone or in combination with one or more of the other embodiments disclosed herein, or portion thereof.

Thus, in some embodiments, the digital camera apparatus 300 further include a spacer 800, one or more electrical conductors 822 to connect one or more circuits of the one or more input devices, e.g., input device 830, to one or more circuits in one or more other portions of the subsystem 300, one or more circuits of a processor 340 that may be disposed on the image device 520 and/or one or more additional devices, e.g., one or more output devices 820.

For example, FIG. 77D is a schematic perspective view of one embodiment of a digital camera apparatus that includes an input device and a spacer 800. FIG. 77E is a schematic perspective view of one embodiment of a digital camera apparatus 300 that includes spacer 800 and one or more additional devices, e.g., one or more output devices 820. The image device is shown with one or more pads connected to one or more circuits disposed on or in the image device. FIG. 77F is a schematic perspective view of one embodiment of a digital camera apparatus that includes an input device, a spacer and an additional device (e.g., a display and/or a second integrated circuit device adjacent to the image device). The image device is shown with one or more pads connected to one or more circuits disposed on or in the image device.

Moreover, in some embodiments, the digital camera apparatus may further include a support having one or more actuators (such a support may comprise, for example, a frame having one or more actuators) (e.g., MEMS actuators, for example, comb type MEMS actuators) to move one or more of the optics portions of the camera channels, one or more display devices and/or one or more illumination devices (e.g., one or more light emitting diodes (LEDs) with high output intensity. In some of the latter embodiments, the digital camera apparatus includes one or more audio input devices, a support having one or more actuators (such a support may comprise, for example, a frame having one or more actuators) (e.g., MEMS actuators, for example, comb type MEMS actuators) to move one or more of the optics portions of the camera channels, one or more display devices and one or more illumination devices.

The digital camera apparatus may be assembled and/or mounted in any manner, for example, but not limited to in a manner similar to that employed in one or more of the embodiments disclosed herein.

Any of the embodiments of the present invention may include one or more illumination units to improve and/or enhance image acquisition by the one or more camera channels (and, in particular, the one or more sensor arrays), facilitate range detection to an object, shape detection of an object, and covert imaging (i.e., imaging that is not observable to the human eye).

Figure 78B:
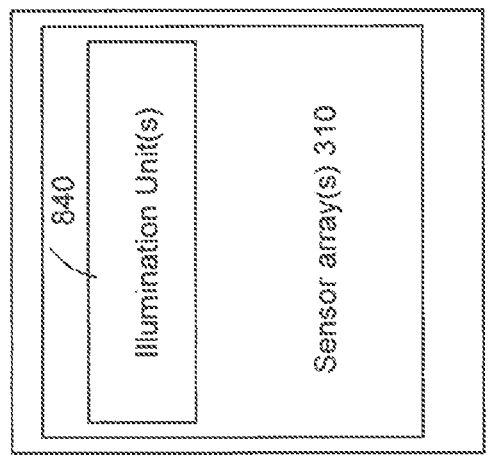
Figure 78A:
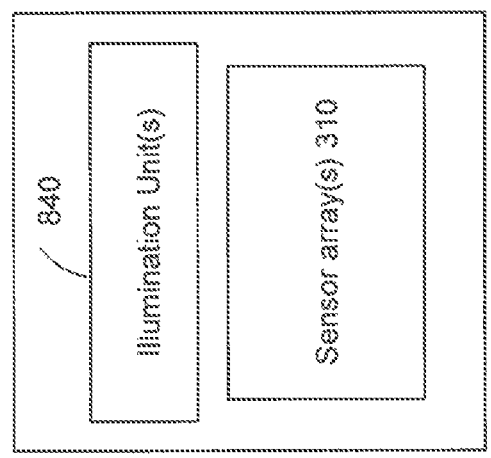
FIG. 78A is a schematic view of a digital camera apparatus that includes one or more illumination devices in accordance with another embodiment of the present invention.
Figure 78O:
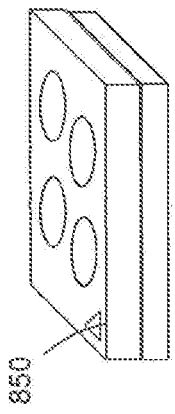
FIGS. 78M-78P are schematic views of digital camera apparatus that include one or more illumination devices in accordance with further embodiments of the present invention.

FIGS. 78A-78B are schematic block diagrams of digital camera apparatus having one or more illumination units, e.g., illumination units 840, in accordance with further embodiments of the present invention. The illumination units may provide passive (for example, no illumination), active (for example, constant illumination), constant and/or gated active illumination (for example, pulsed illumination that is predetermined, preset or processor controlled, and/or pulsed illumination that is user/operator programmable). The one or more illumination units may be disposed on or integrated in the support frame and/or the substrate of the sensor arrays. Indeed, the one or more illumination units may be disposed on or integrated in any element or component of the one or more of the camera channels.

Figure 78P:
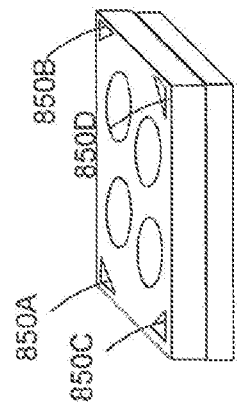
Figure 78L:
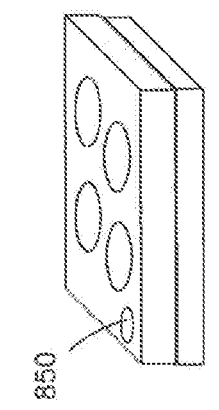
Figure 78M:
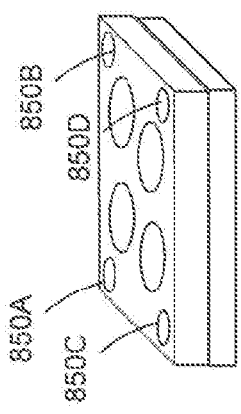
Figure 78N:
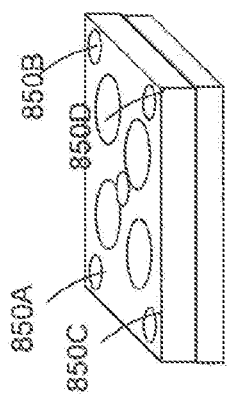
Figure 78I:
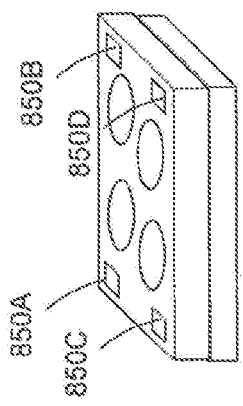
Figure 78J:
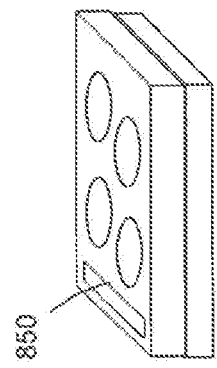
Figure 78K:
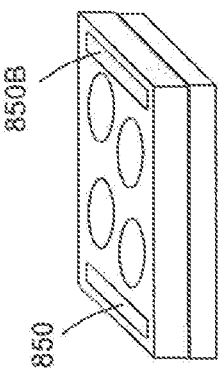

FIGS. 78C-78P are schematic views of a digital camera apparatus that includes one or more output devices in accordance with another embodiment of the present invention. More particularly, FIG. 78C is a schematic perspective view of one embodiment of a digital camera apparatus that includes one or more output devices. In some embodiments, the one or more output devices are in the form of one or more illumination devices, e.g., one or more illumination devices 850, however, other types of output devices may also be employed. FIGS. 78D-78E are enlarged schematic front and back perspective views, respectively, of an illumination device 850 in accordance with one embodiment of the present invention. In some embodiments, the one or more illumination devices are in the form of one or more LED's (e.g., one or more high power LED's).

The one or more illumination devices may be disposed in any suitable location or locations. In some embodiments, it may be advantageous to collect light (for the one or more camera channels) on one side of the digital camera assembly and to provide illumination from the same side of the digital camera subassembly. In the illustrated embodiment, the digital camera apparatus has first and second sides generally opposite one another. The one or more camera channels are positioned to receive light through a first side of the digital camera apparatus. One or more of the illumination devices may be positioned to illuminate (e.g., supply light) from the same side of the digital camera apparatus. In some embodiments, such a configuration may help make it possible to provide a digital camera apparatus that is very thin (e.g., in the z direction). Other configurations may also be employed. In some embodiments, one or more of the illumination devices is disposed on and/or integral with one or more portions of the support, although this is not required.

The one or more illumination devices may be connected to the processor via one or more communication links. In some embodiments, the one or more communication links include one or more pads on the image device and the one or more illumination devices and one or more electrical connectors having one or more electrically conductive members connecting one or more of the pads on the image device to one or more of the pads on the illumination devices. In some embodiments, the one or more communication links include one or more bump bonds that electrically connect one or more circuits on the image device to one or more circuits on the one or more illumination devices.

The one or more illumination devices may have any size and shape and may or may not have the same configuration as one another (e.g., type, size, shape, resolution). In some embodiments, one or more of the one or more illumination devices has a length and a width that are less than or equal to the length and width, respectively of the optical assembly, the sensor subassembly and/or the image device. In some embodiments, one or more of the one or more illumination devices has a length or a width that is greater than the length or width, respectively of the optical assembly, the sensor subassembly and/or the image device.

FIGS. 78F-78P are schematic perspective views of digital camera apparatus in accordance with further embodiments. Such embodiments have one or more illumination devices with configurations and/or in arrangements that are different than the configuration and/or arrangement of the illumination device shown in FIG. 78C. Other configurations and/or arrangements may also be employed.

As with each of the embodiments disclosed herein, this embodiment of the present invention may be employed alone or in combination with one or more of the other embodiments disclosed herein, or portion thereof.

For example, FIG. 78F is a schematic perspective view of one embodiment of a digital camera apparatus that includes an output device and a spacer. FIG. 78G is a schematic perspective view of one embodiment of a digital camera apparatus that includes an output device and a spacer. The image device is shown with one or more pads connected to one or more circuits disposed on or in the image device. FIG. 77H is a schematic perspective view of one embodiment of a digital camera apparatus that includes an output device, a spacer and an additional device (e.g., a display and/or a second device 780 adjacent to the image device). The image device is shown with one or more pads connected to one or more circuits disposed on or in the image device.

Moreover, in some embodiments, the digital camera apparatus may further include a support having one or more actuators (such a support may comprise, for example, a frame having one or more actuators) (e.g., MEMS actuators, for example, comb type MEMS actuators) to move one or more of the optics portions of the camera channels, one or more display devices and/or one or more audio input devices. In some of the latter embodiments, the digital camera apparatus includes one or more audio input devices, a support having one or more actuators (such a support may comprise, for example, a frame having one or more actuators) (e.g., MEMS actuators, for example, comb type MEMS actuators) to move one or more of the optics portions of the camera channels, one or more display devices and one or more illumination devices.

The digital camera apparatus may be assembled and/or mounted in any manner, for example, but not limited to in a manner similar to that employed in one or more of the embodiments disclosed herein.

Figure 78Q:
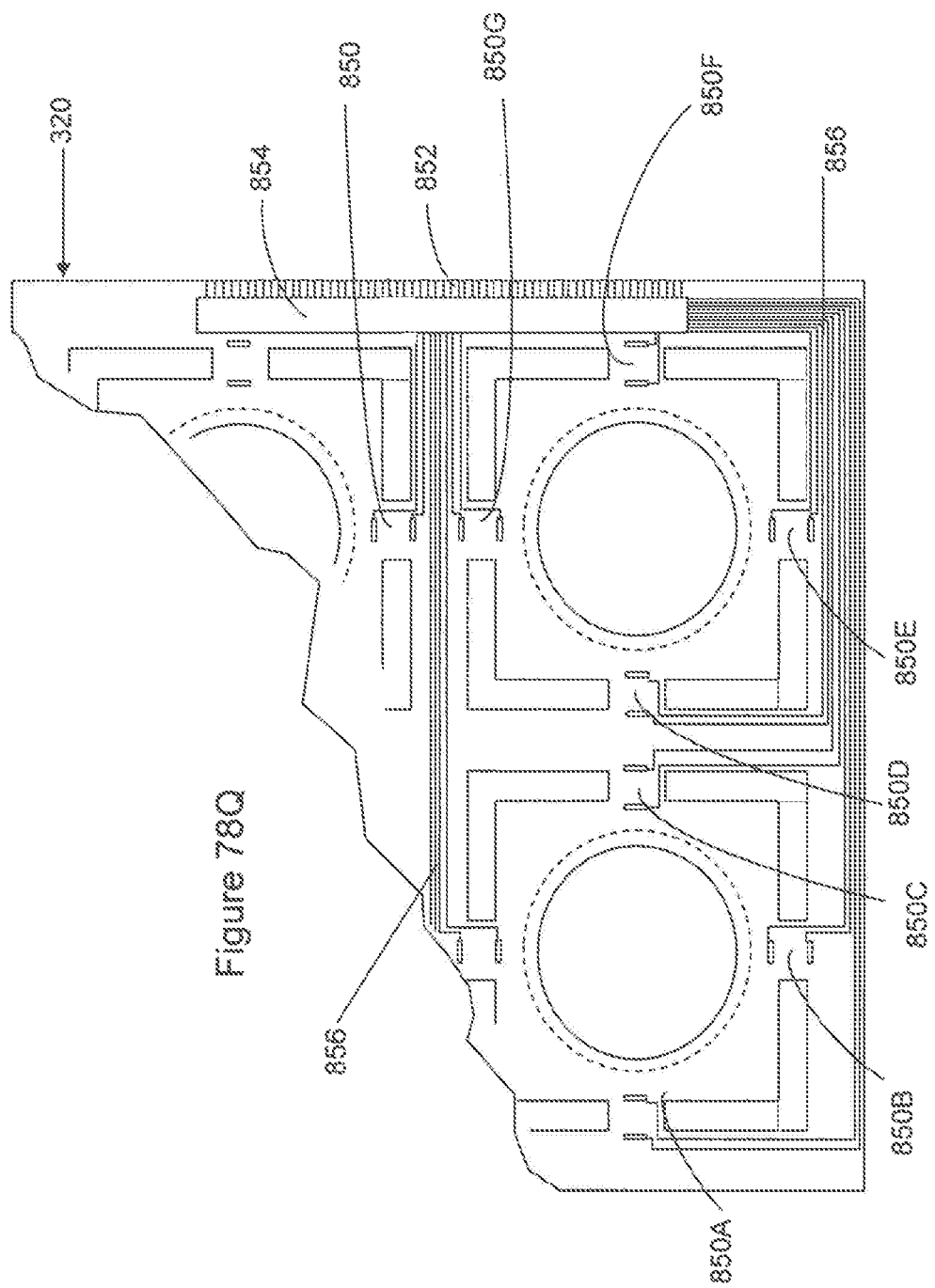
FIG. 78Q is a schematic plan view of an underside of a support in a digital camera apparatus in accordance with one embodiment of the present invention.

FIG. 78Q is a schematic plan view of an underside of the support 320 (e.g., a major outer surface facing toward the one or more sensor arrays) in accordance with one embodiment of the present invention. In this embodiment, one or more devices 850 are disposed on or in the support 320 and receive/supply power, control signals and/or data signals through pads 852 disposed on a surface of the support 320. A plurality of electrical conductors (see for example, FIGS. 63-72) may connect one or more of the pads on the support 320 to one or more circuits disposed elsewhere in the digital camera apparatus 300.

In some embodiments, an integrated circuit 854 may be disposed on the support 320 to provide, for example, but not limited to, one or more circuits to help interface (e.g., control or communicate in any other way) with any of devices disposed on the support 320. A plurality of electrically conductive traces 856 (some of which are shown) may connect the outputs of the integrated circuit 854 to one or more of the devices mounted on the support 320. Although shown on the surface, it should be understood that one, some or all of such traces may be disposed within the support 320 so as not to reside on the outer surface thereof.

Figure 79C:
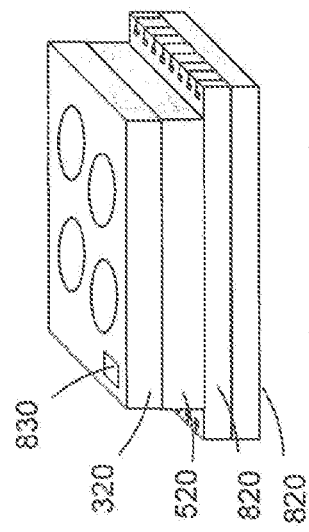
FIGS. 79A-79C are schematic perspective views of digital camera apparatus that include one or more input devices and one or more output devices, in accordance with further embodiments of the present invention.
Figure 79B:
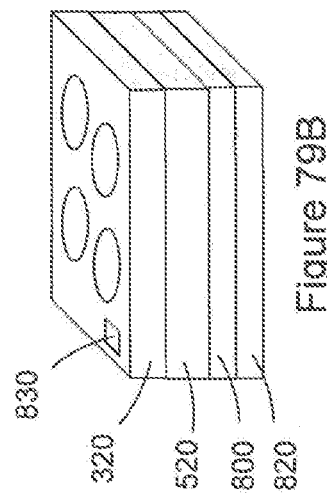
Figure 79A:
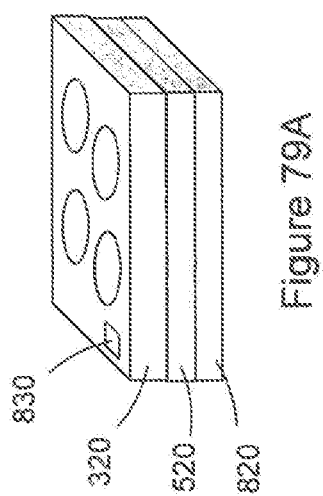

FIGS. 79A-79C are schematic perspective views of digital camera apparatus that include one or more input devices 830, e.g., one or more audio input devices (e.g., a silicon microphone) and one or more output devices 820, e.g., one or more display devices (e.g., a micro display device), in accordance with further embodiments of the present invention.

FIGS. 80A-80F are schematic perspective views of digital camera apparatus that include one or more input devices 830, e.g., one or more audio input devices (e.g., a silicon microphone), one or more output devices 820, e.g., one or more display devices (e.g., a micro displays), wherein one or more of the input devices comprise one or more illumination devices (e.g., a high illumination LED), in accordance with further embodiments of the inventions.

The digital camera apparatus may be assembled and/or mounted in any manner, for example, but not limited to in a manner similar to that employed in one or more of the embodiments disclosed herein.

As stated above, the digital camera apparatus may have any number of camera channels each of which may have any configuration. Referring to FIGS. 81A-81C, in some embodiments, the digital camera apparatus includes a housing, for example, but not limited to a hermetic package. One or more portions of a housing may be defined by one or more of the structures described herein, for example, one or more of the optics portions, one or more portions of the frame, one or more portions of the image device and/or combinations thereof.

In some embodiments, one or more portions of the housing are defined by plastic material(s), ceramic material(s) and/or any combination thereof.

FIG. 81A is a schematic perspective view a digital camera apparatus 300 that includes a housing in accordance with one embodiment of the present invention. FIGS. 81B-81C are schematic exploded perspective views of the digital camera apparatus 300. The housing may comprise a molded plastic package although this is not required. In the illustrated embodiment, the digital camera apparatus includes a first housing portion (e.g., a molded plastic base or bottom) that supports an image sensor. The image device may include the one or more sensor portions and may further include one or more portions of the processor. A second housing portion (e.g., a molded plastic top or cover) defines a frame having one or more frame portions to receive and position the one or more optics portions. One or more terminals may be provided, for example, one or more terminals 860, and may be disposed, for example, on one or more outer surfaces of the molded plastic packaging. One or more electrically conductive members, e.g., bond wires, may electrically connect one or more of the terminals to one or more circuits on the image device, e.g., one or more circuits of one or more portions of the processor. In some embodiments, the first housing portion, the second housing portion and the one or more optics portions define a substantial portion of the housing, for example, but not limited to a hermetic package. In some embodiments, one or more of the optics portions have a top surface that is generally flush with one or more portions of the major outer surface of the second housing portion (e.g., molded plastic top).

The digital camera apparatus may be assembled in any manner. In some embodiments, the image device, terminals and electrically conductive members are supported superjacent the major outer surface of the first housing portion (e.g., a molded plastic base). The second housing portion (e.g., a molded plastic top) may be provided thereafter. Heat, pressure and/or bonding material may be employed before, during, and/or after the assembly process. The bonding material may be any type or types of bonding material for example but not limited to a hermetic bonding material or materials.

The molded plastic packaging may make the digital camera subassembly more easily removable and/or installable, for example, to facilitate repair and/or upgrade, although this is not required. Molded plastic packaging may also be advantageous, for example, for digital camera apparatus employed in wearable sensors, such as, for example, a badge or broach that does not contain a display but transmits data to a base station. Molded plastic packaging may be employed in combination with any one or more of the embodiments disclosed herein.

Other configurations may also be employed. In some embodiments, for example, the first housing portion and/or the second housing portion are formed of any type of hermetic material(s), for example, but not limited to ceramic material(s). The use of ceramic packaging may be advantageous in harsh environments and/or in applications (e.g., vacuum systems) where outgassing from plastics present a problem, although this is not required. Ceramic packaging may be employed in combination with any one or more of the embodiments disclosed herein.

Figure 81D:
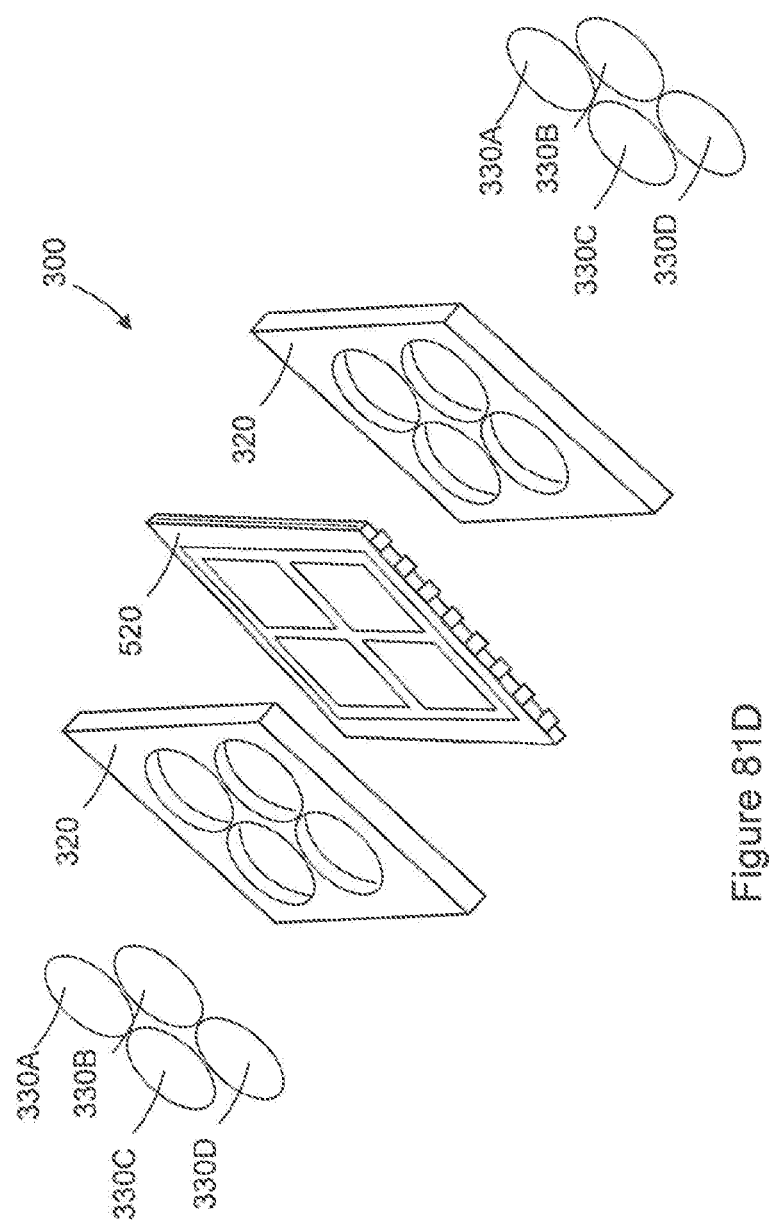
FIG. 81D is a schematic exploded perspective view of a digital camera apparatus that includes molded plastic packaging in accordance with one embodiment of the present invention.

Referring to FIG. 81D, a schematic exploded perspective view a digital camera apparatus that includes molded plastic packaging in accordance with another embodiment of the present invention, in some embodiment, two digital camera apparatus are disposed in a single housing. For example, in some embodiments, the first housing portion (e.g., the base) defines a frame having one or more frame portions to receive and position a second set of one or more optics portions that face in a direction opposite the one or more optics portions seated in the second housing portion. A second set of one or more sensor arrays may be associated with the second set of one or more optics portions and may be disposed, for example, on the image device or on a second image device that may also be disposed in the housing.

In some embodiments, one of the camera channels, e.g., camera channel 350A, is dedicated to two or more separate colors or two or more separate bands of colors (e.g., blue or a blue band and red or a red band). In some of such embodiments, the optical portion may itself have the capability to provide color separation, for example, similar to that provided by a color filter array (e.g., a Bayer pattern or variation thereof). (See for example, FIG. 82).

Figure 82:
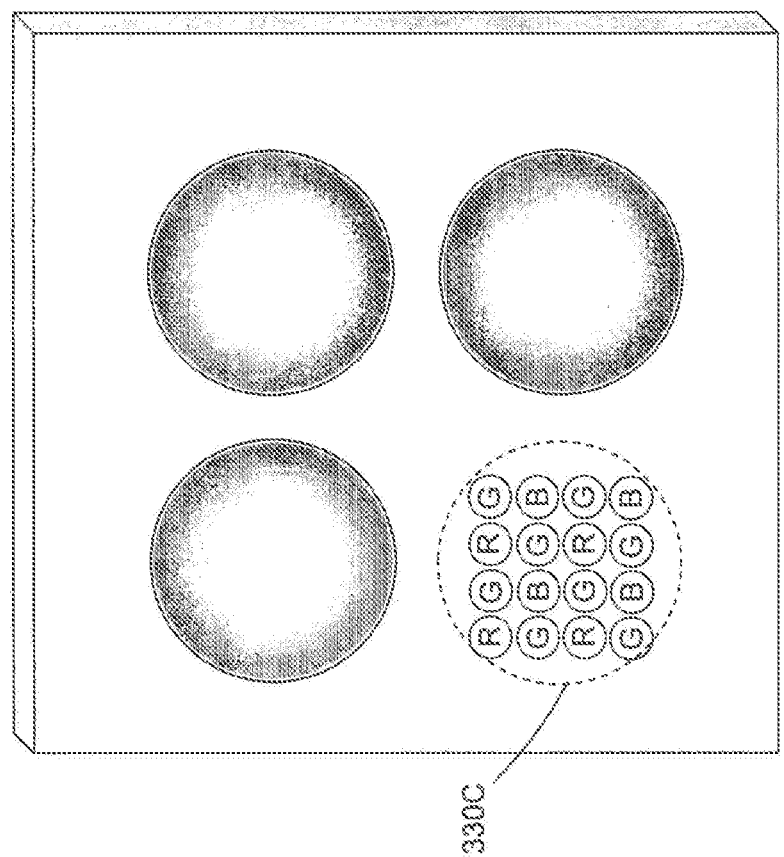
FIG. 82 is an enlarged schematic front perspective view of a digital camera apparatus in accordance with another embodiment of the present invention.

FIG. 82 is a schematic perspective view of a digital camera apparatus having one or more optics portions with the capability to provide color separation in accordance with one embodiment of the present invention. In some of such embodiments, one or more of the optics portions, e.g., optics portion 330C includes an array of color filters, for example, but not limited to a Bayer pattern. In some of such embodiments, one or more of the optics portions, e.g., optics portion 330C has the capability to provide color separation similar to that which is provided by a color filter array.

In some embodiments, the lens and/or filter of the camera channel may transmit both of such colors or bands of colors and the camera channel may include one or mechanisms elsewhere in the camera channel to separate the two colors or two bands of colors. For example, a color filter array may be disposed between the lens and the sensor array and/or the camera channel may employ a sensor capable of separating the colors or bands of colors. In some of the latter embodiments, the sensor array may be provided with pixels that have multiband capability, e.g., two or three colors. For example, each pixel may comprise two or three photodiodes, wherein a first photodiode is adapted to detect a first color or first band of colors, a second photodiode is adapted to detect a second color or band of colors and a third photodiode is adapted to detect a third color or band of colors. One way to accomplish this is to provide the photodiodes with different structures/characteristics that make them selective, such that first photodiode has a higher sensitivity to the first color or first band of colors than to the second color or band of colors, and the second photodiode has a higher sensitivity to the second color or second band of colors than to the first color or first band of colors. Another way is to dispose the photodiodes at different depths in the pixel, which takes advantage of the different penetration and absorption characteristics of the different colors or bands of colors. For example, blue and blue bands of colors penetrate less (and are thus absorbed at a lesser depth) than green and green bands of colors, which in turn penetrate less (and are thus absorbed at a lesser depth) than red and red bands of colors. In some embodiments, such a sensor array is employed even though the pixels may see only one particular color or band of colors, for example, to in order to adapt such sensor array to the particular color or band of colors.

Four Camera Channels

In some embodiments (see for example FIG. 8), the digital camera apparatus includes four or more camera channels, e.g., camera channels 350A-350D. In some of such embodiments, the first camera channel, e.g., camera channel 350A, is dedicated to a first color or first band of colors (e.g., red or a red band of colors), the second camera channel, e.g., camera channel 350B, is dedicated to second color or second band of colors (e.g., blue or a blue band of colors), different than the first color or first band of colors, and the third camera channel, e.g., camera channel 350C, is dedicated to third color or third band of colors (e.g., green or a green band of colors), different than the first and second colors or band of colors, and the fourth camera channel, e.g., camera channel 350D, is dedicated to fourth color or fourth band of colors (e.g., green or a green band of colors) different than the first, second and third colors or band of colors. In some embodiments, one or more of the camera channels employs a pixel size that matches the color optical blur for the respective camera channel, an integration time and/or other electrical characteristic of the sensor array adapted to increase or optimize performance of the respective camera channel, and/or a design/layout of the pixel circuitry and photodiode that is adapted to increase or maximize sensitivity of the respective camera channel. In some embodiments, one of the camera channels is a broadband camera channel, an infrared (IR) camera channel or an ultraviolet (UV) camera channel.

The sensor arrays of the one or more camera channels may or may not have the same field of view as one another. In some embodiments, each of the sensor arrays has the same field of view as one another. In some embodiments, one or more of the sensor arrays has a field of view that is different field than the field of view of one or more of the other camera channels.

In some embodiments, one of the camera channels, e.g., camera channel 350A, is dedicated to two or more separate colors or two or more separate bands of colors (e.g., blue or a blue band and red or a red band). In some of such embodiments, the optical portion may itself have the capability to provide color separation, for example, similar to that provided by a color filter array (e.g., a Bayer pattern or variation thereof) (see for example, FIG. 82). In some embodiments, the lens and/or filter of the camera channel may transmit both of such colors or bands of colors and the camera channel may include one or mechanisms elsewhere in the camera channel to separate the two colors or two bands of colors. For example, a color filter array may be disposed between the lens and the sensor array and/or the camera channel may employ a sensor capable of separating the colors or bands of colors. In some of the latter embodiments, the sensor array may be provided with pixels that have multiband capability, e.g., two or three colors. For example, each pixel may comprise two or three photodiodes, wherein a first photodiode is adapted to detect a first color or first band of colors, a second photodiode is adapted to detect a second color or band of colors and a third photodiode is adapted to detect a third color or band of colors. One way to accomplish this is to provide the photodiodes with different structures/characteristics that make them selective, such that first photodiode has a higher sensitivity to the first color or first band of colors than to the second color or band of colors, and the second photodiode has a higher sensitivity to the second color or second band of colors than to the first color or first band of colors. Another way is to dispose the photodiodes at different depths in the pixel, which takes advantage of the different penetration and absorption characteristics of the different colors or bands of colors. For example, blue and blue bands of colors penetrate less (and are thus absorbed at a lesser depth) than green and green bands of colors, which in turn penetrate less (and are thus absorbed at a lesser depth) than red and red bands of colors. In some embodiments, such a sensor array is employed even though the pixels may see only one particular color or band of colors, for example, to in order to adapt such sensor array to the particular color or band of colors.

In some of the latter embodiments, the second camera channel, e.g., camera channel 350B, is also dedicated to two or more separate colors or two or more separate bands of colors. For example, the first camera channel may be dedicated to red or a red band and green or a green band (e.g., G1). The second camera channel may be dedicated to blue or a blue band and green or a green band (e.g., G2). In some other of the latter embodiments, the second camera channel, e.g., camera channel 350B, is dedicated to a single color or single band of colors (e.g., green or a green band) different from the colors or bands of colors to which the first camera channel is dedicated, and the third camera channel, e.g., camera channel 350C, is dedicated to a single color or single band of colors different from the colors or bands of colors to which the first and second camera channels are dedicated.

The camera channels may or may not have the same configuration (e.g., size, shape, resolution, or degree or range of sensitivity) as one another. In some embodiments, for example, each of the camera channels has the same size, shape, resolution and/or a degree or range of sensitivity as the other camera channels. In some other embodiments, one or more of the camera channels has a size, shape, resolution and/or a degree or range of sensitivity that is different than one or more of the other camera channels. In that regard, in some embodiments, each of the camera channels, e.g., camera channels 350A-350D, has the same resolution as one another. In some other embodiments, one or more of the camera channels has a resolution that is less than the resolution of one or more of the other camera channels. For example, one or more of the camera channels, e.g., camera channel 350A, may have a sensor array with fewer pixels than the sensor array of one or more of the other camera channels, e.g., camera channel 350B, for a comparable portion of the field of view. In one embodiment, for example, the number of pixels in one of the camera channels is forty four percent greater (e.g., approximately twenty percent more pixels in the x direction and twenty percent more pixels in the y direction) than the number of pixels in another camera channel, for a comparable portion of the field of view. In another embodiment, for example, the number of pixels in one of the camera channels is thirty six percent greater than the number of pixels in the other camera channels, for a comparable portion of the field of view.

In some embodiments, one or more of the camera channels may have a sensor array with a size that is different than the size of the sensor array of one or more of the other camera channels. In some of such embodiments, the optics portion of such one or more camera channels may have a f/# and/or a focal length that is different from the f/# and/or a focal length of the one or more of the other camera channels.

In some embodiments, one or more of the camera channels are dedicated to a wavelength or band of wavelengths and the sensor array and/or optics portion of such one or more camera channels are optimized for the respective wavelength or band of wavelengths to which the respective camera channel is dedicated. In some embodiments, the design, operation, array size and/or pixel size of each sensor array is optimized for the respective wavelength or bands of wavelengths to which the camera channels are dedicated. In some embodiments the design of each optical portion is optimized for the respective wavelength or bands of wavelengths to which the respective camera channel is dedicated.

It should be understood, however, that any other configurations may also be employed.

The four or more camera channels may be arranged in any manner. In some embodiments, the four or more camera channels are arranged in a 2×2 matrix to help provide compactness and symmetry in optical collection.

In some embodiments, the digital camera apparatus employs a processor that is disposed on the same integrated circuit as the sensor arrays. The processor may have any layout, including for example, a layout that is the same as or similar to one or more of the layouts described herein or shown, for example, in FIGS. 83A-83C. FIGS. 83A-83C are block diagrams of sensor arrays 310A, 310B, 310C, and 310D for various embodiments. FIG. 83A includes a red sensor array 310A, a green sensor array 310B, an IR sensor array 310C, and a blue sensor array 310D. FIG. 83A further includes circuitry 340, which in an embodiment includes analog to digital conversion (ADC) circuitry, image pipeline circuitry, digital interface circuitry, and timing and control circuitry. FIG. 83B shows an alternative embodiment in which sensor arrays 310A-310D are different types of sensor arrays than the corresponding sensor arrays of FIG. 38A, and are of different sizes. FIG. 83C and circuitry 310 shows an alternative embodiment in which sensor arrays 310A-310D are different types of sensor arrays than the corresponding sensor arrays of FIG. 38A, and in which circuitry 340 includes any types of circuitry.

Figure 83E:
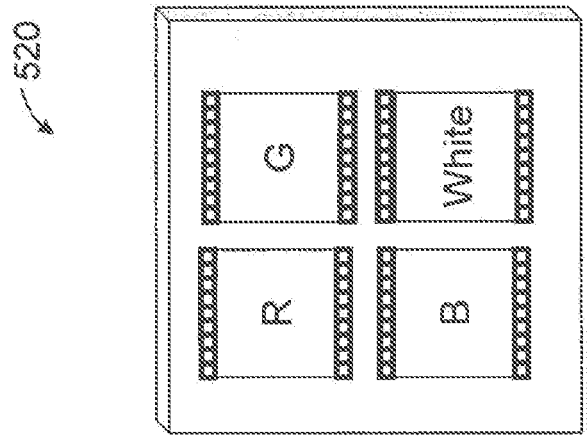
FIGS. 83D-83E are schematic front perspective views of sensor array configurations, in accordance with further embodiments of the present invention.
Figure 83D:
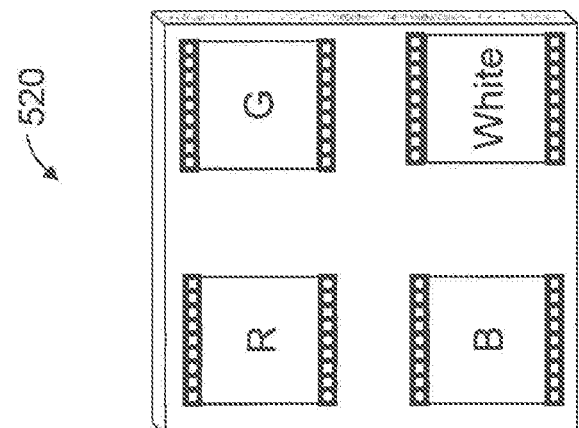
Figure 84A:
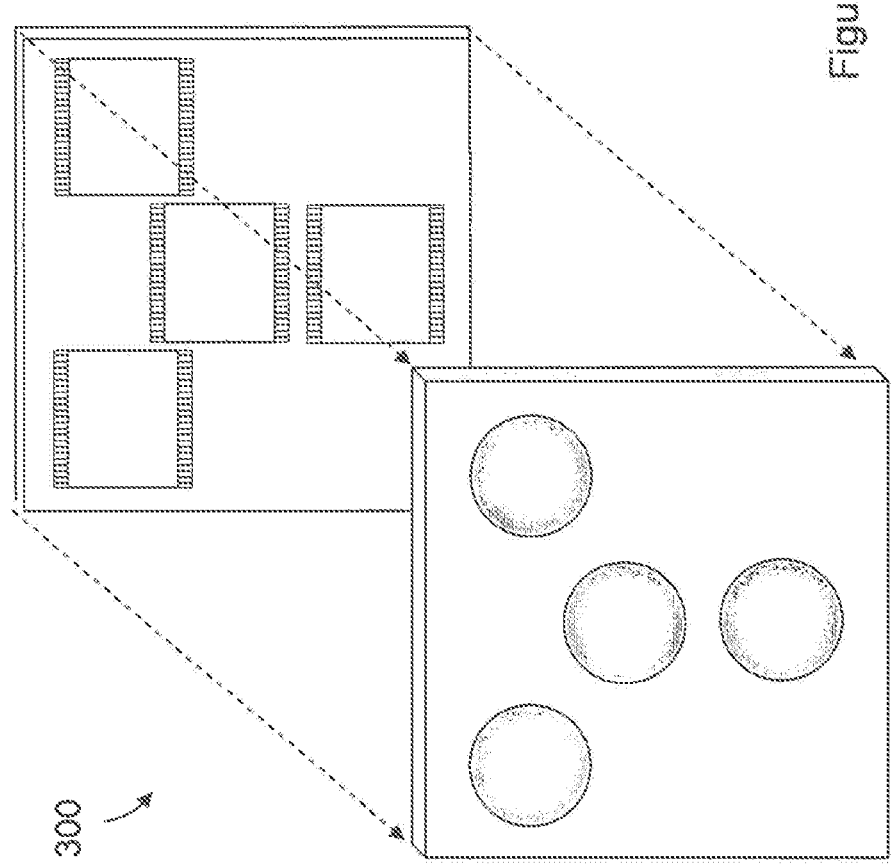
Figure 84B:
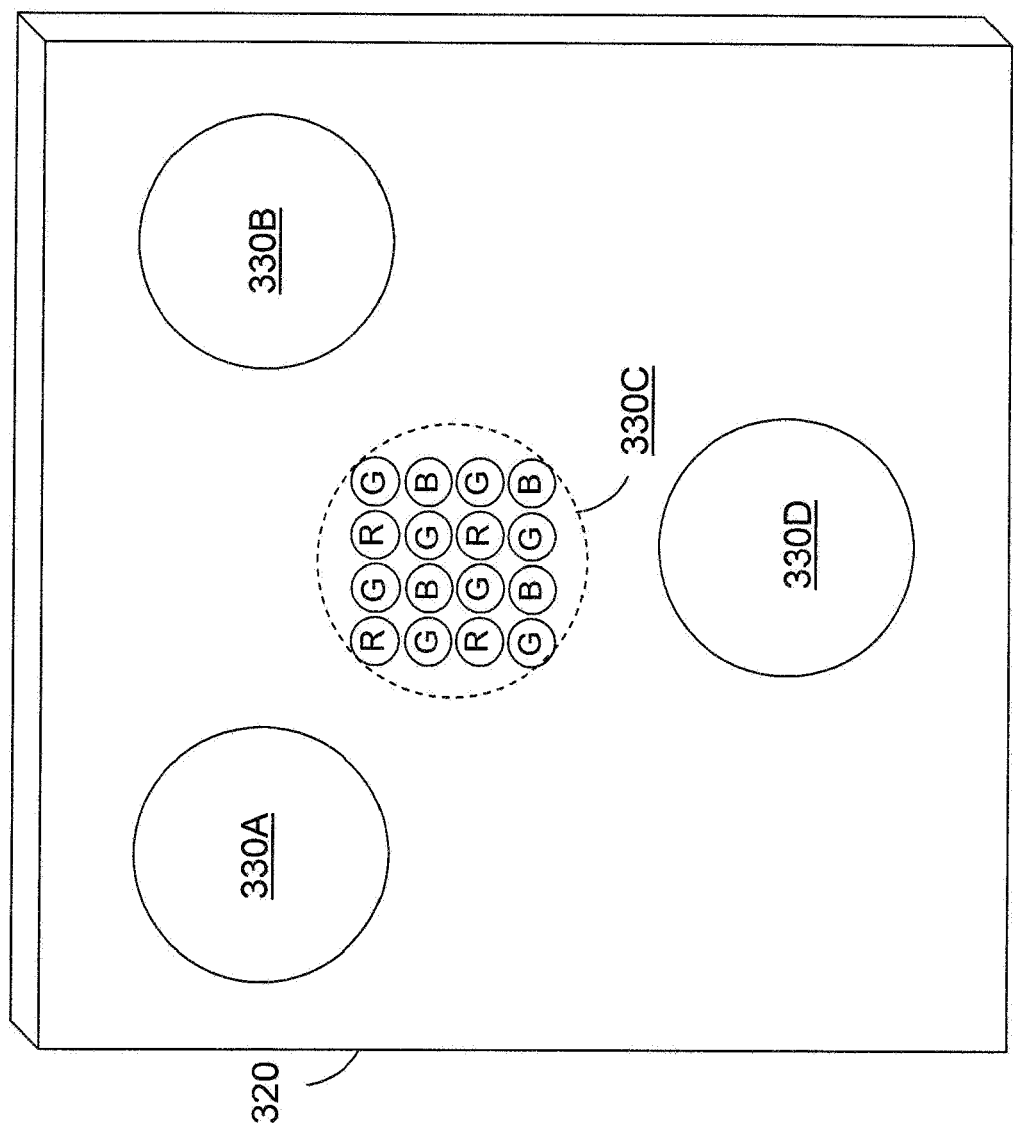
Figure 84D:
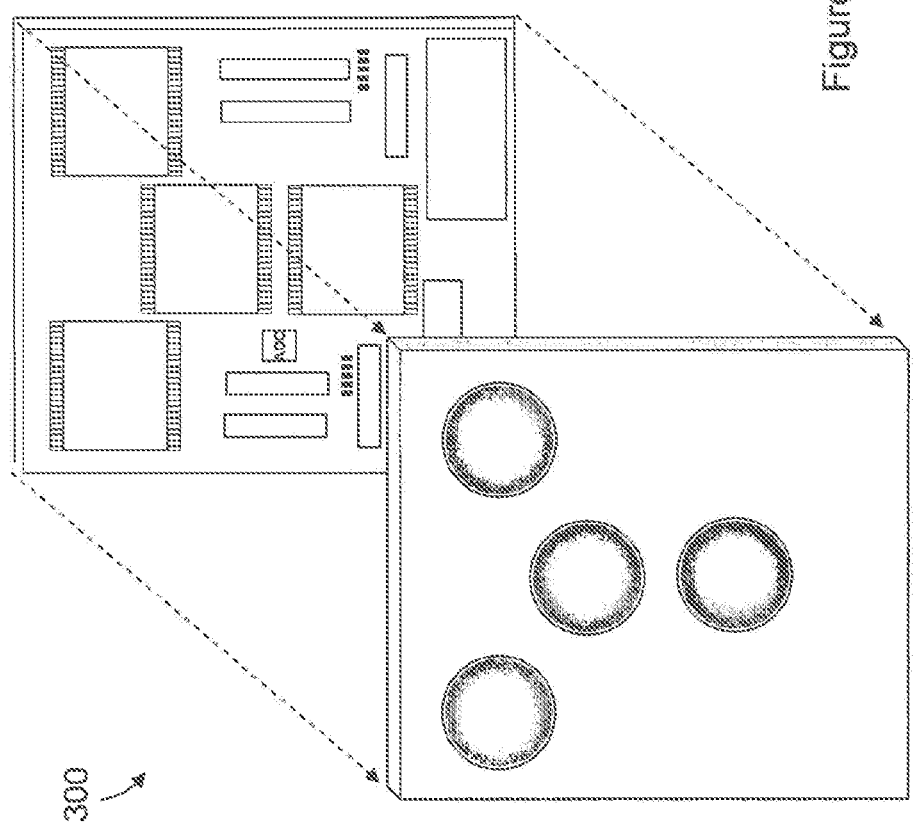
Figure 84E:
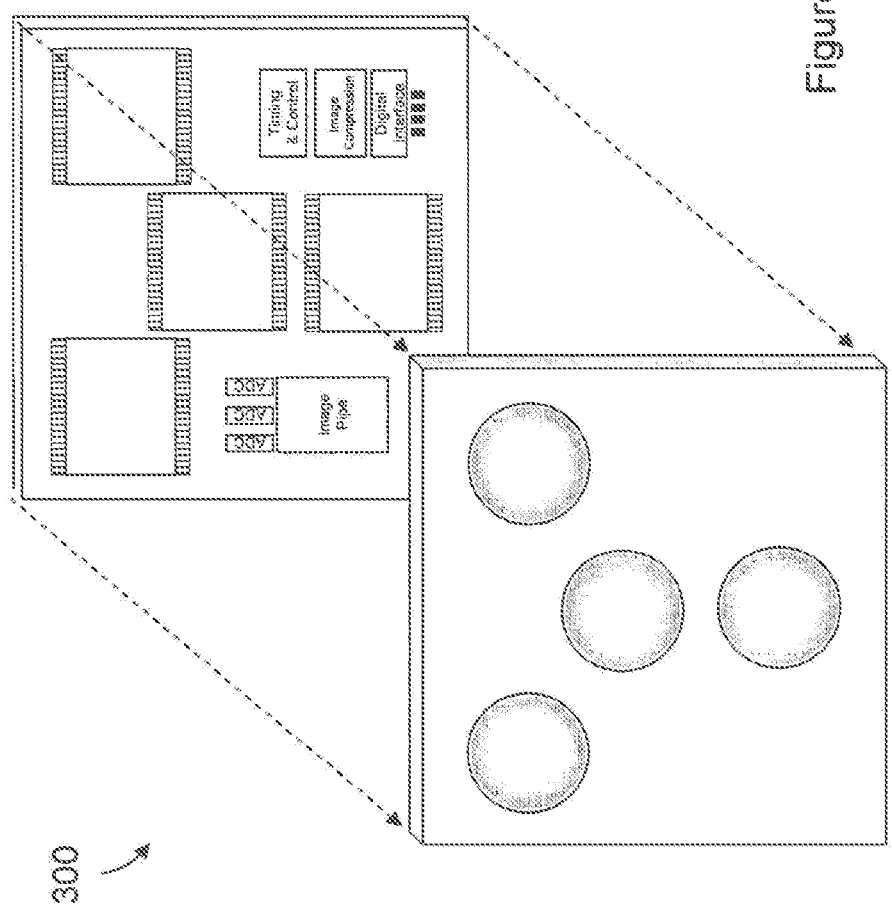
Figure 85A:
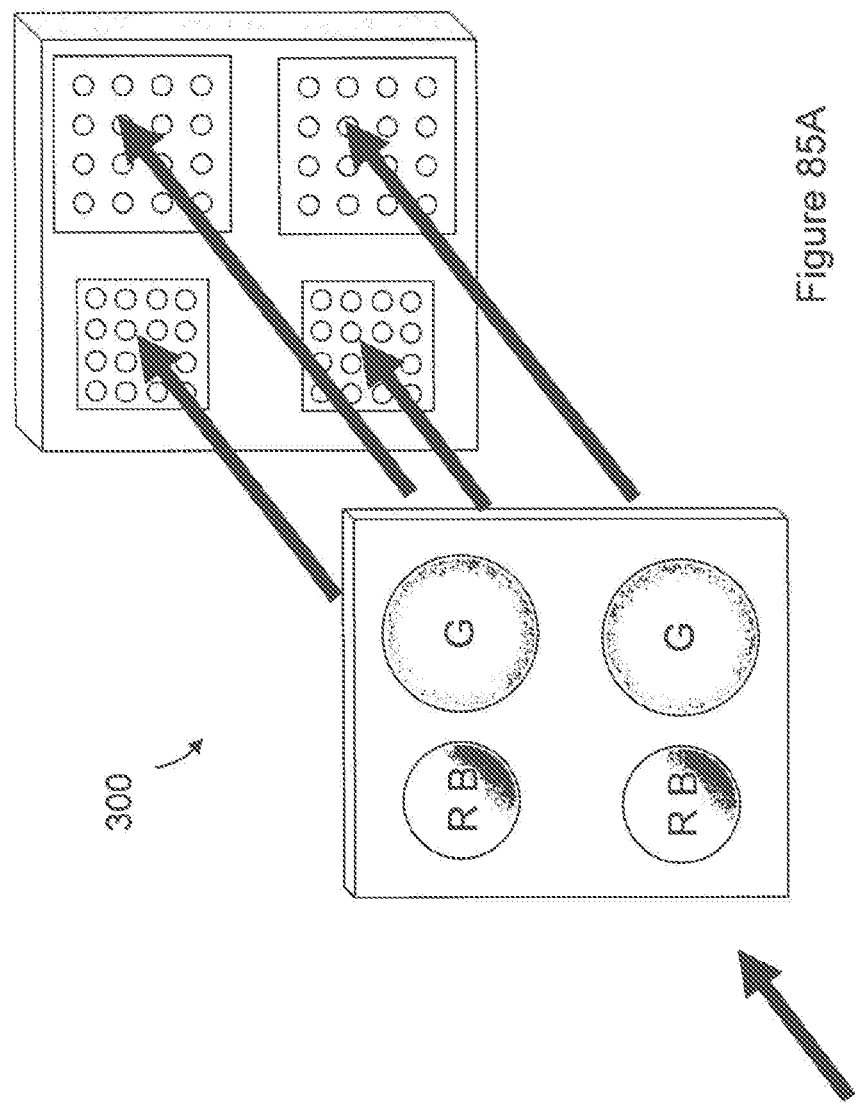
Figure 85C:
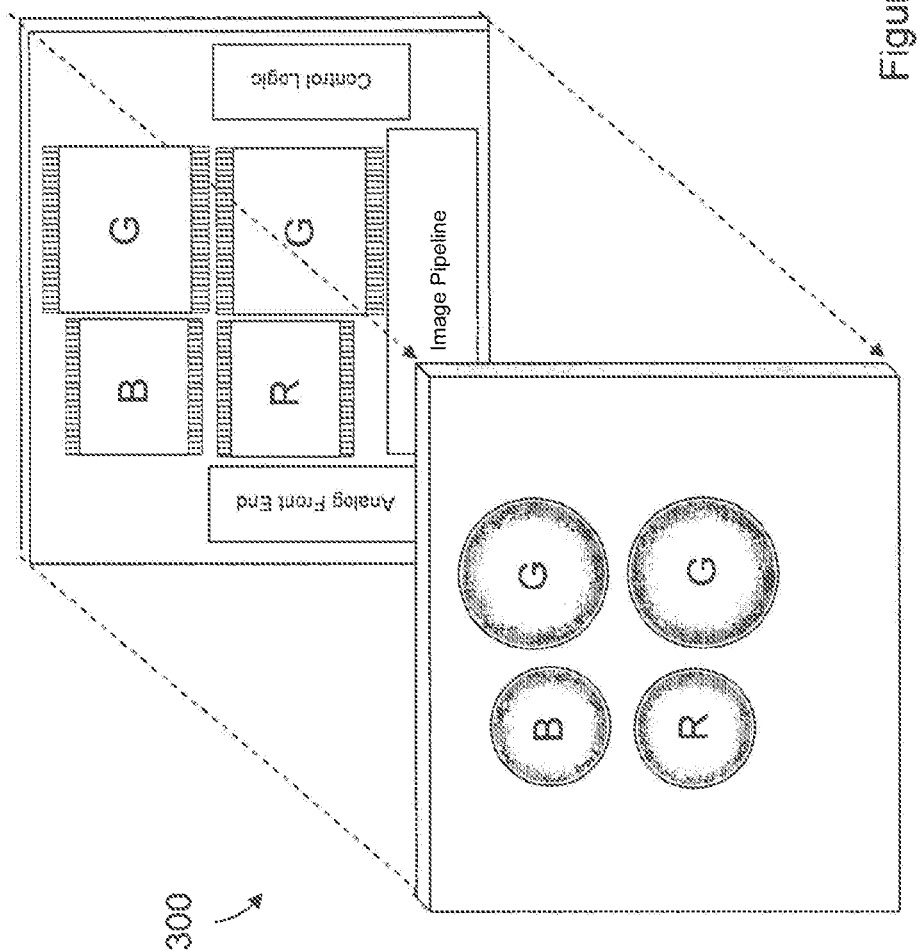
Figure 85E:
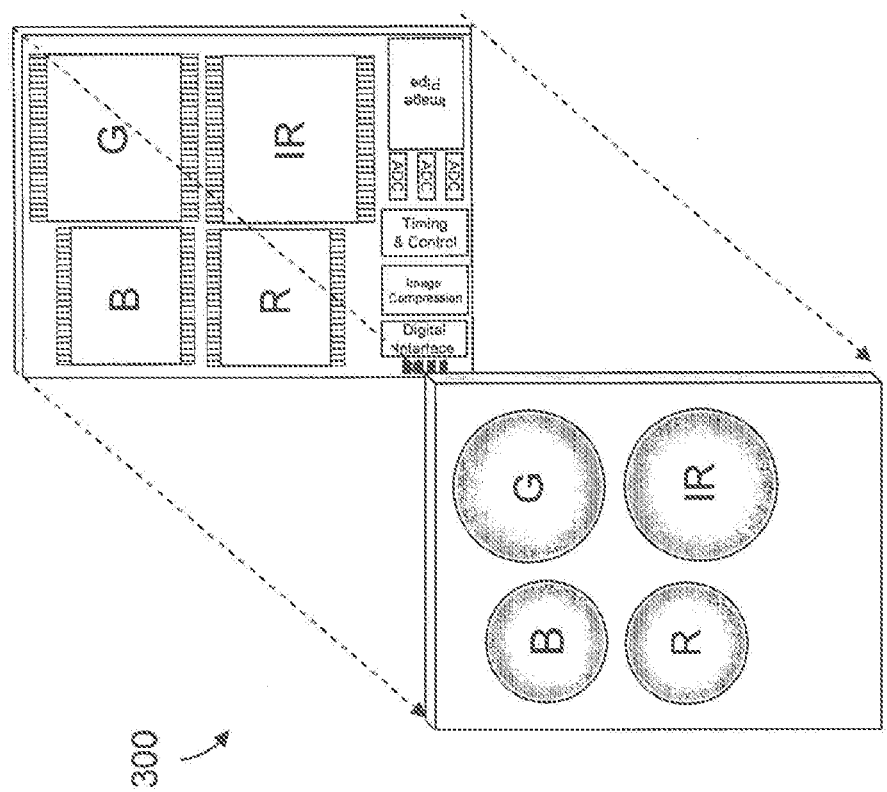
Figure 86A:
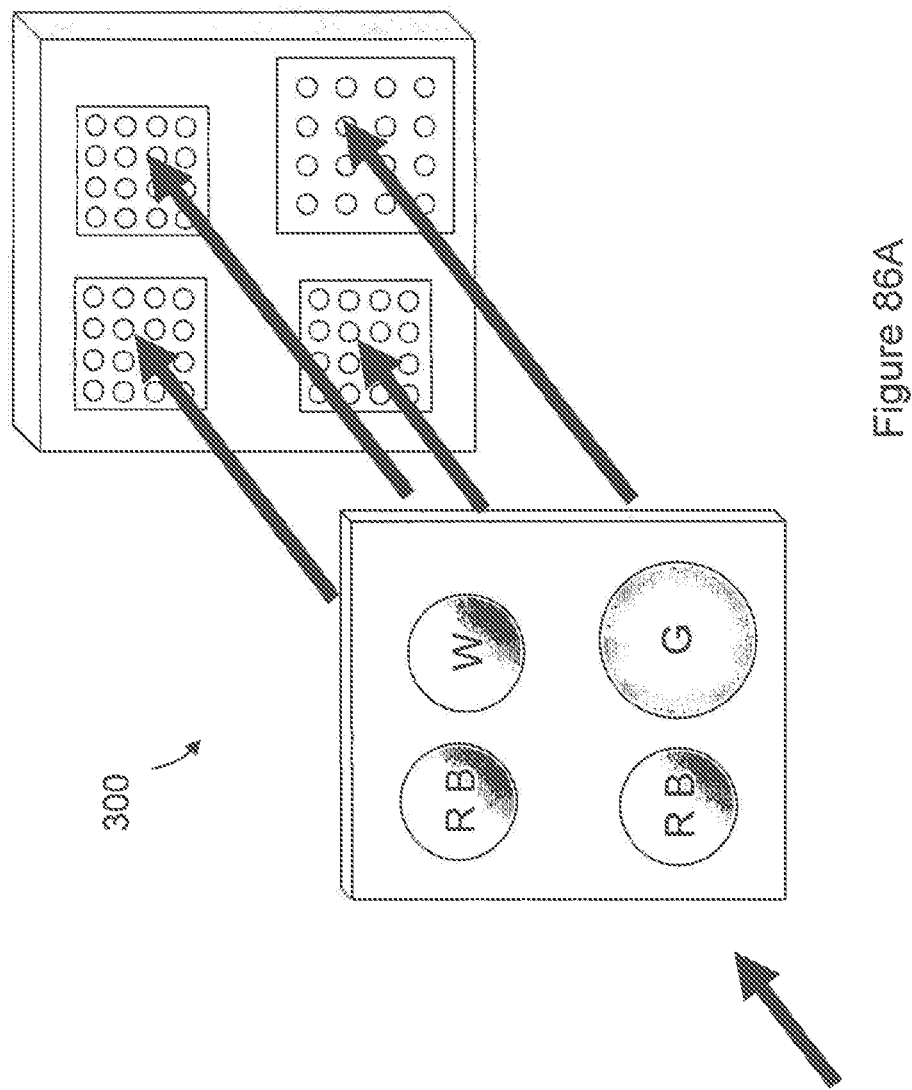
Figure 86B:
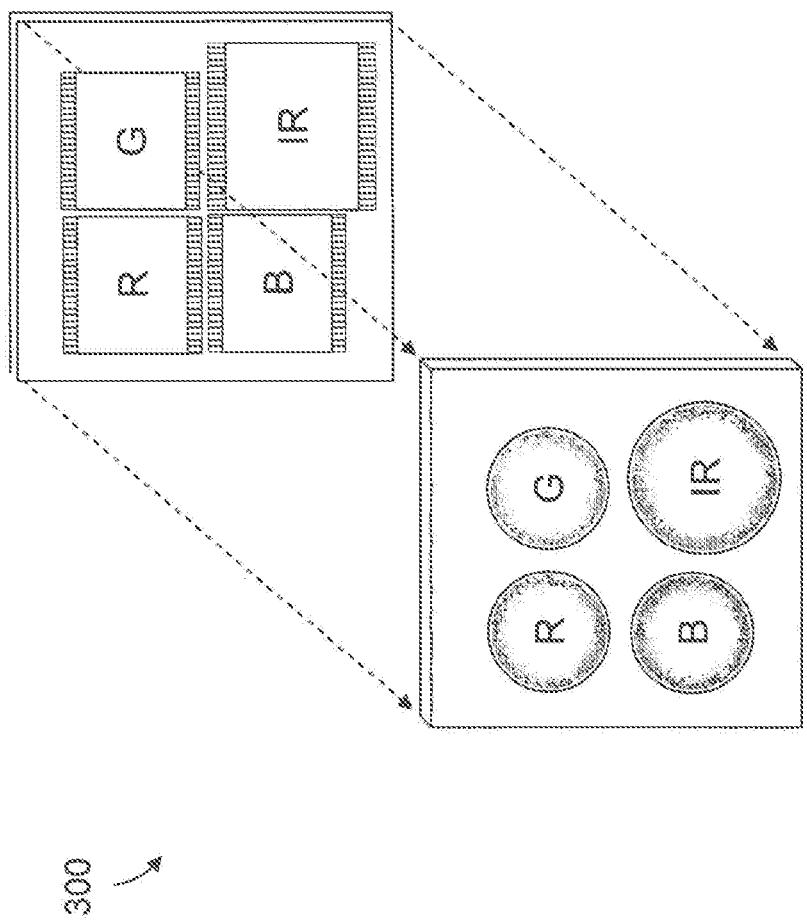
Figure 86C:
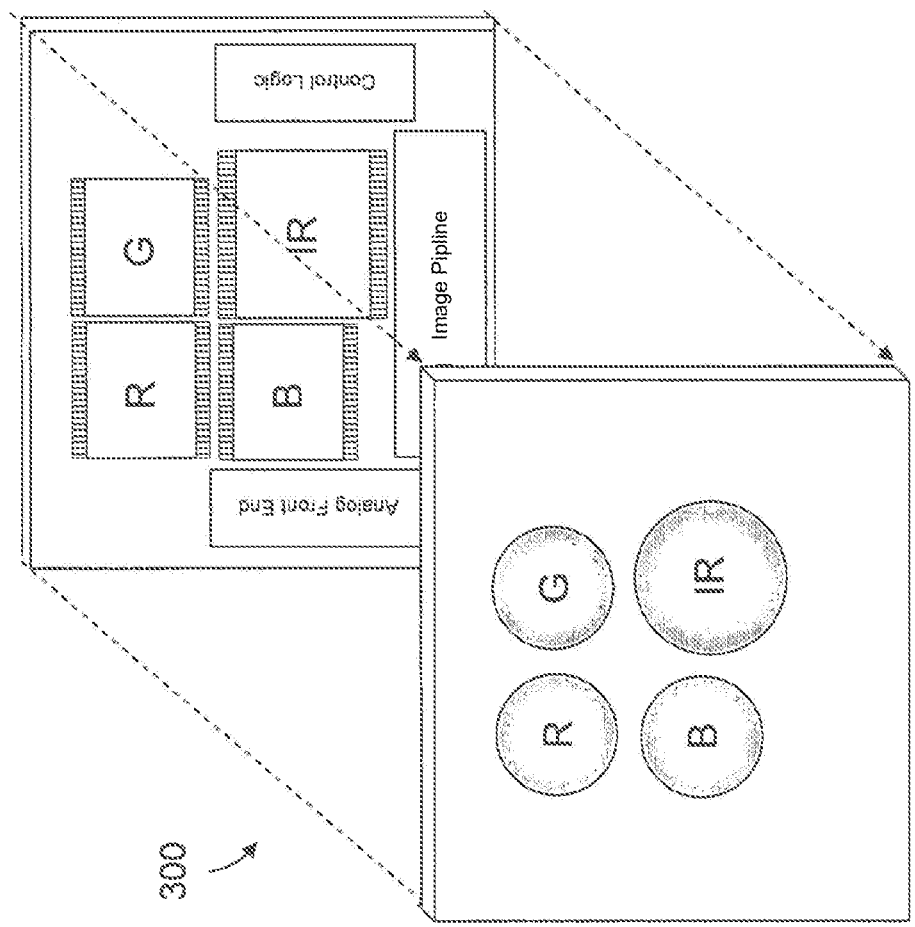

In some embodiments, the processor may have one or more portions that are not integrated on the same integrated circuit as the sensor arrays and/or may not have any portions disposed on the same integrated circuit as the sensor arrays (see for example, FIGS. 83D-83E).

As stated above, each of the embodiments described above may be used alone or in combination with any other embodiment(s) or portion thereof described herein or known to those of ordinary skill in the art.

In some embodiments, the camera channels, e.g., camera channels 350A-350D, are connected via one or more communication links to one or more displays. In some such embodiments, each of the camera channels is connected to its own display. The displays may or may not have the same characteristics as one another. In some other embodiments, the four camera channels, e.g., camera channels 350A-350D, are each connected to the same display.

Four Camera Channels in Y Configuration

FIGS. 84A-84E are schematic representations of digital camera apparatus 300 in accordance with further embodiments of the present invention. In each of these embodiments, the digital camera apparatus includes four or more camera channels, e.g., camera channels 350A-350D, wherein four of the camera channels, e.g., camera channels 350A-350D, are arranged in a "Y" configuration.

In some embodiments, one of the camera channels, e.g., camera channel 350C, is a broadband camera channel, an infrared (IR) camera channel or an ultraviolet (UV) camera channel.

In some embodiments, a first one of the camera channels, e.g., camera channel 350A, is dedicated to a first color or first band of colors (e.g., red or a red band of colors), a second one the camera channels, e.g., camera channel 350B, is dedicated to second color or second band of colors (e.g., blue or a blue band of colors), different than the first color or first band of colors, and a third one of the camera channels, e.g., camera channel 350D, is dedicated to a third color or third band of colors (e.g., green or a green band of colors), different than the first and second colors or band of colors. In some of such embodiments, the other camera channel, e.g., camera channels 350D, is a broadband camera channel, e.g., using a color filter array with a Bayer pattern, an infrared (IR) camera channel or an ultraviolet (UV) camera channel.

In some embodiments, one of the camera channels, e.g., camera channel 350C, is dedicated to two or more colors or two or more bands of colors. In some of such embodiments, the optical portion may itself have the capability to provide color separation, for example, similar to that provided by a color filter array (e.g., a Bayer pattern or variation thereof) (see for example, FIG. 84B). In some embodiments, the lens and/or filter of the camera channel may transmit both of such colors or bands of colors and the camera channel may include one or mechanisms elsewhere in the camera channel to separate the two colors or two bands of colors. For example, a color filter array may be disposed between the lens and the sensor array and/or the camera channel may employ a sensor capable of separating the colors or bands of colors. In some of the latter embodiments, the sensor array may be provided with pixels that have multiband capability, e.g., two or three colors. For example, each pixel may comprise two or three photodiodes, wherein a first photodiode is adapted to detect a first color or first band of colors, a second photodiode is adapted to detect a second color or band of colors and a third photodiode is adapted to detect a third color or band of colors. One way to accomplish this is to provide the photodiodes with different structures/characteristics that make them selective, such that first photodiode has a higher sensitivity to the first color or first band of colors than to the second color or band of colors, and the second photodiode has a higher sensitivity to the second color or second band of colors than to the first color or first band of colors. Another way is to dispose the photodiodes at different depths in the pixel, which takes advantage of the different penetration and absorption characteristics of the different colors or bands of colors. For example, blue and blue bands of colors penetrate less (and are thus absorbed at a lesser depth) than green and green bands of colors, which in turn penetrate less (and are thus absorbed at a lesser depth) than red and red bands of colors. In some embodiments, such a sensor array is employed even though the pixels may see only one particular color or band of colors, for example, to in order to adapt such sensor array to the particular color or band of colors.

In some embodiments, the digital camera apparatus employs a processor that is disposed on the same integrated circuit as the sensor arrays. The processor may have any layout, including for example, a layout that is the same as or similar to one or more of the layouts described herein (see for example, FIGS. 84C-84E). In some embodiments, one, some or all portions of the processor are not disposed on the same integrated circuit as the sensor arrays. (see for example, FIG. 84A).

As stated above, each of the embodiments described above may be used alone or in combination with any other embodiment(s) or portion thereof described herein or known to those of ordinary skill in the art.

Four Channels, Two Smaller than Other Two

FIGS. 85A-85E are schematic representations of digital camera apparatus 300 in accordance with further embodiments of the present invention. In each of these embodiments, the digital camera apparatus includes four or more camera channels, e.g., camera channels 350A-350D. Two of the camera channels, e.g., camera channels 350A, 350C, are each smaller in size than two of the other camera channel, e.g., camera channel 350B, 350D.

In some embodiments, the smaller camera channels, e.g., camera channels 350A, 350C, each have a resolution that is less than the resolution of the larger camera channels, e.g., camera channel 350B, 350D, although in such embodiments, the smaller camera channels may or may not have the same resolution as one another and the larger camera channels may or may not have the same resolution as one another. For example, each of the smaller camera channels, may have a sensor array with fewer pixels than is provided in the sensor array of each of the larger camera channels for a comparable portion of the field of view. In one embodiment, for example, the number of pixels in one or more of the larger camera channels is forty four percent greater than the number of pixels in one or more of the smaller camera channels, for a comparable portion of the field of view. In another embodiment, for example, the number of pixels in one or more of the larger camera channels is thirty six percent greater than the number of pixels in one or more of the smaller camera channels, for a comparable portion of the field of view. It should be understood, however, that any other sizes and/or architectures may also be employed.

In some other embodiments, one or more of the smaller camera channels has a resolution that is equal to the resolution of one or more of the larger camera channels. For example, one or more of the smaller camera channels, e.g., camera channels 350A, 350C, may have a sensor array with the same number of pixels as is provided in the sensor array of the larger camera channels, e.g., camera channel 350B, 350D, for a comparable portion of the field of view. In one embodiment, for example, the pixels in the larger camera channels are forty four percent larger in size (e.g., twenty percent larger in the x direction and twenty percent larger in the y direction) than the pixels in the smaller camera channels. In another embodiment, for example, the pixels in the larger camera channels are thirty six percent larger in size (e.g., seventeen percent larger in the x direction and seventeen percent larger in the y direction) than the pixels in the smaller camera channels. It should be understood, however, that any other sizes and/or architectures may also be employed.

In some embodiments, one or more of the camera channels may have a sensor array with a size that is different than the size of the sensor array of one or more of the other camera channels. In some of such embodiments, the optics portion of such one or more camera channels may have a f/# and/or a focal length that is different from the f/# and/or a focal length of the one or more of the other camera channels.

In some embodiments, one of the smaller camera channels, e.g., camera channel 350A, is dedicated to a first color or first band of colors (e.g., red or a red band of colors), one of the larger camera channel, e.g., camera channel 350B, is dedicated to second color or second band of colors (e.g., blue or a blue band of colors), different than the first color or first band of colors, and the other larger camera channel, e.g., camera channel 350D, is dedicated to third color or third band of colors (e.g., green or a green band of colors), different than the first and second colors or band of colors. In some of such embodiments, the smaller camera channel, e.g., camera channels 350A, has a resolution that is equal to the resolution of the two larger camera channels, e.g., camera channels 350B, 350D.

In some embodiments, one of the smaller camera channels, e.g., camera channel 350C, is a broadband camera channel, an infrared (IR) camera channel or an ultraviolet (UV) camera channel.

In some embodiments, the digital camera apparatus employs a processor that is disposed on the same integrated circuit as the sensor arrays. The processor may have any layout, including for example, a layout that is the same as or similar to one or more of the layouts described herein (see for example, FIGS. 85C-85E). In some embodiments, the processor may have one or more portions that are not disposed on the same integrated circuit as the sensor arrays and/or may not have any portions disposed on the same integrated circuit as the sensor arrays (see for example, FIG. 85B).

As stated above, each of the embodiments described above may be used alone or in combination with any other embodiment(s) or portion thereof described herein or known to those of ordinary skill in the art.

In some embodiments, the four or more camera channels, e.g., camera channels 350A-350D, are connected via one or more communication links to one or more displays. In some such embodiments, each of the camera channels is connected to its own display. The displays may or may not have the same characteristics as one another. In some other embodiments, two or more camera channels, e.g., camera channels 350A-350B, 350D, are connected to a first display and one or more of the other camera channels, e.g., camera channel 350C, is connected to a second display. The first and second displays may or may not have the same characteristics. In some such embodiments, the first display has a resolution equal to the resolution of one or more of the camera channels connected thereto. The second display may have a resolution equal to the resolution of one or more camera channels connected thereto. For example, in some embodiments, one or more of the camera channels have a resolution that is less than the resolution of one or more other camera channels. In such embodiments, the one or more display connected to the one or more lower resolution camera channels may have a resolution/resolutions that is/are lower than the resolution/resolutions of the one or more displays connected to the one or more other camera channels. In some embodiments, the first display has a resolution equal to the resolution of one or more of the camera channels connected thereto. The second display may have a resolution equal to the resolution of one or more camera channels connected thereto, however, other resolutions may be employed.

Four Channels, Three Smaller than Other

FIGS. 86A-86E are schematic representations of digital camera apparatus 300 in accordance with further embodiments of the present invention. In each of these embodiments, the digital camera apparatus includes four or more camera channels, e.g., camera channels 350A-350D. Three of the camera channels, e.g., camera channels 350A-350C, are each smaller in size than the other camera channel, e.g., camera channel 350D.

In some embodiments, the smaller camera channels, e.g., camera channels 350A-350C, each have a resolution that is less than the resolution of the larger camera channel, e.g., camera channel 350D, although in such embodiments, the smaller camera channels may or may not have the same resolution as one another. For example, each of the smaller camera channels may have a sensor array with fewer pixels than is provided in the sensor array of the larger camera channel for a comparable portion of the field of view. In one embodiment, for example, the number of pixels in the larger camera channels is forty four percent greater than the number of pixels in one or more of the smaller camera channels, for a comparable portion of the field of view. In another embodiment, for example, the number of pixels in the larger camera channel is thirty six percent greater than the number of pixels in one or more of the smaller camera channels, for a comparable portion of the field of view. It should be understood, however, that any other sizes and/or architectures may also be employed.

In some other embodiments, one or more of the smaller camera channels has a resolution that is equal to the resolution of the larger camera channel. For example, one or more of the smaller camera channels, e.g., camera channels 350A-350C, may have a sensor array with the same number of pixels as is provided in the sensor array of the larger camera channel, e.g., camera channel 350D, for a comparable portion of the field of view. In one embodiment, for example, the pixels in the larger camera channel are forty four percent larger in size (e.g., twenty percent larger in the x direction and twenty percent larger in the y direction) than the pixels in the smaller camera channels. In another embodiment, for example, the pixels in the larger camera channel are thirty six percent larger in size (e.g., seventeen percent larger in the x direction and seventeen percent larger in the y direction) than the pixels in the smaller camera channels. It should be understood, however, that any other sizes and/or architectures may also be employed.

In some embodiments, one of the camera channels, e.g., camera channel 350D, is a broadband camera channel, an infrared (IR) camera channel or an ultraviolet (UV) camera channel.

In some embodiments, a first one of the camera channels, e.g., camera channel 350A, is dedicated to a first color or first band of colors (e.g., red or a red band of colors), a second one the camera channels, e.g., camera channel 350B, is dedicated to second color or second band of colors (e.g., blue or a blue band of colors), different than the first color or first band of colors, and a third one of the camera channels, e.g., camera channel 350C, is dedicated to a third color or third band of colors (e.g., green or a green band of colors), different than the first and second colors or band of colors. In some of such embodiments, the other camera channel, e.g., camera channels 350D, is a broadband camera channel, e.g., using a color filter array with a Bayer pattern.

In some embodiments, the digital camera apparatus employs a processor that is disposed on the same integrated circuit as the sensor arrays. The processor may have any layout, including for example, a layout that is the same as, or similar to, the layouts described herein (see for example, FIGS. 86C-86E). In some embodiments, the processor may have one or more portions that are not disposed on the same integrated circuit as the sensor arrays and/or may not have any portions disposed on the same integrated circuit as the sensor arrays (see for example, FIG. 86B).

As stated above, each of the embodiments described above may be used alone or in combination with any other embodiment(s) or portion thereof described herein or known to those of ordinary skill in the art.

In some embodiments, the four or more camera channels, e.g., camera channels 350A-350D, are connected via one or more communication links to one or more displays. In some such embodiments, each of the camera channels is connected to its own display. The displays may or may not have the same characteristics as one another. In some other embodiments, three or more camera channels, e.g., camera channels 350A-350C, are connected to a first display and the other camera channel, e.g., camera channel 350D, is connected to a second display. The first and second displays may or may not have the same characteristics as one another. For example, in some embodiments, one or more of the camera channels have a resolution that is less than the resolution of one or more other camera channels. In such embodiments, the one or more display connected to the one or more lower resolution camera channels may have a resolution/resolutions that is/are lower than the resolution/resolutions of the one or more displays connected to the one or more other camera channels. In some embodiments, the first display has a resolution equal to the resolution of one or more of the camera channels connected thereto. The second display may have a resolution equal to the resolution of one or more camera channels connected thereto, however, other resolutions may be employed.

Four Elliptical Channels

Figure 87A:
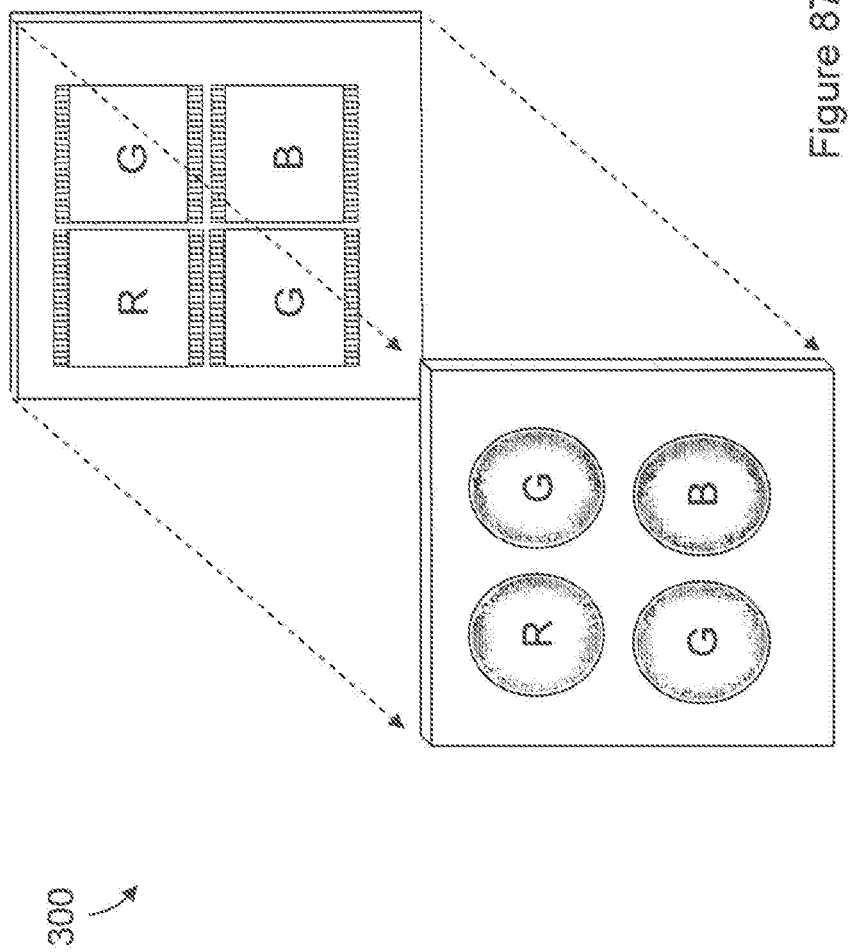
Figure 88D:
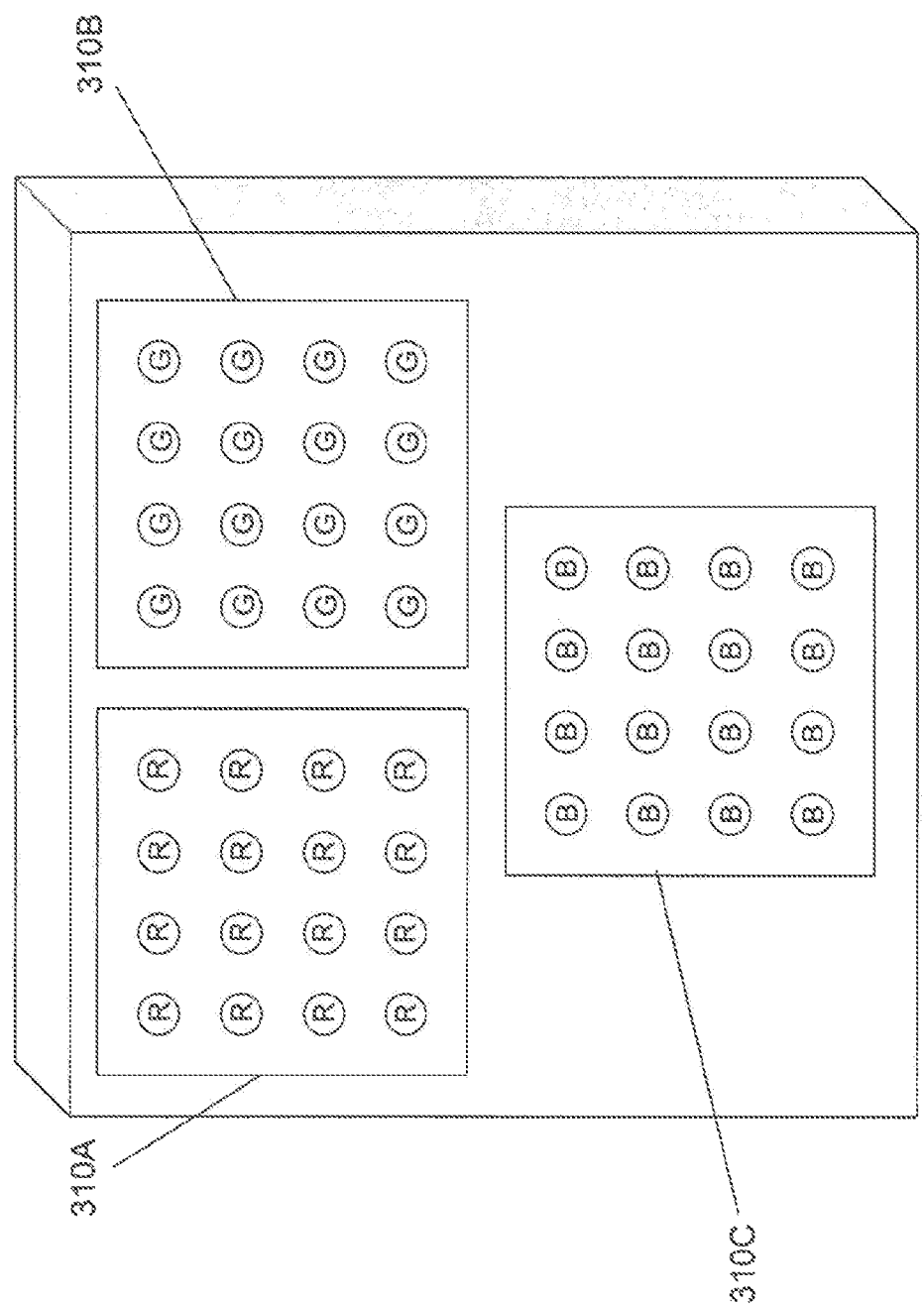
Figure 89C:
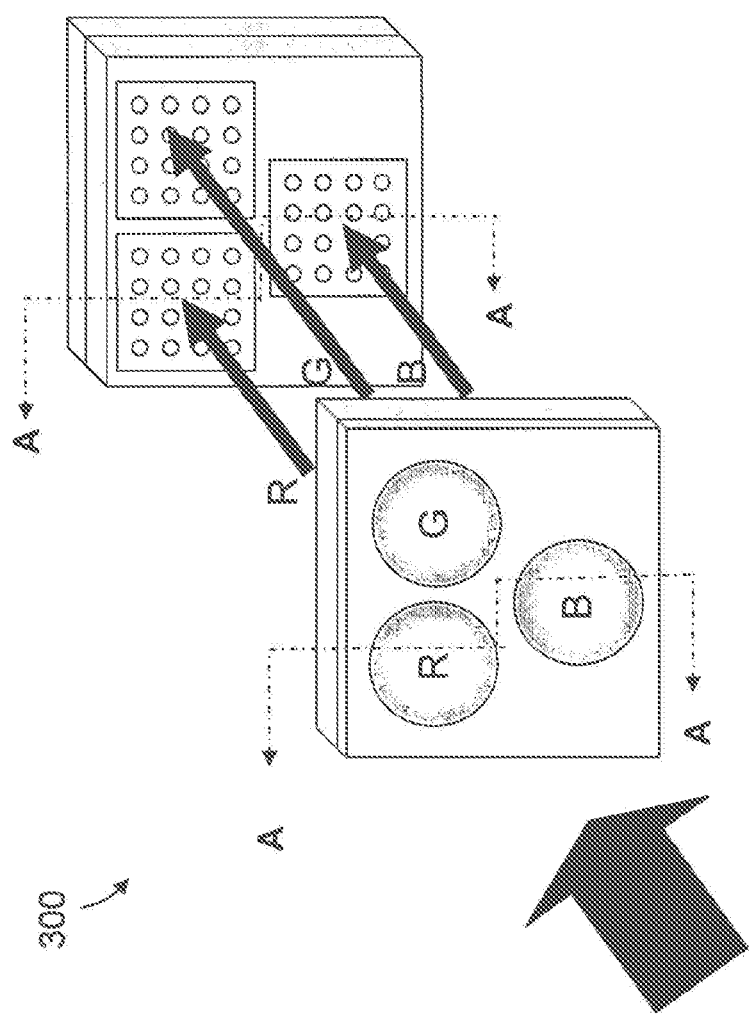
Figure 89E:
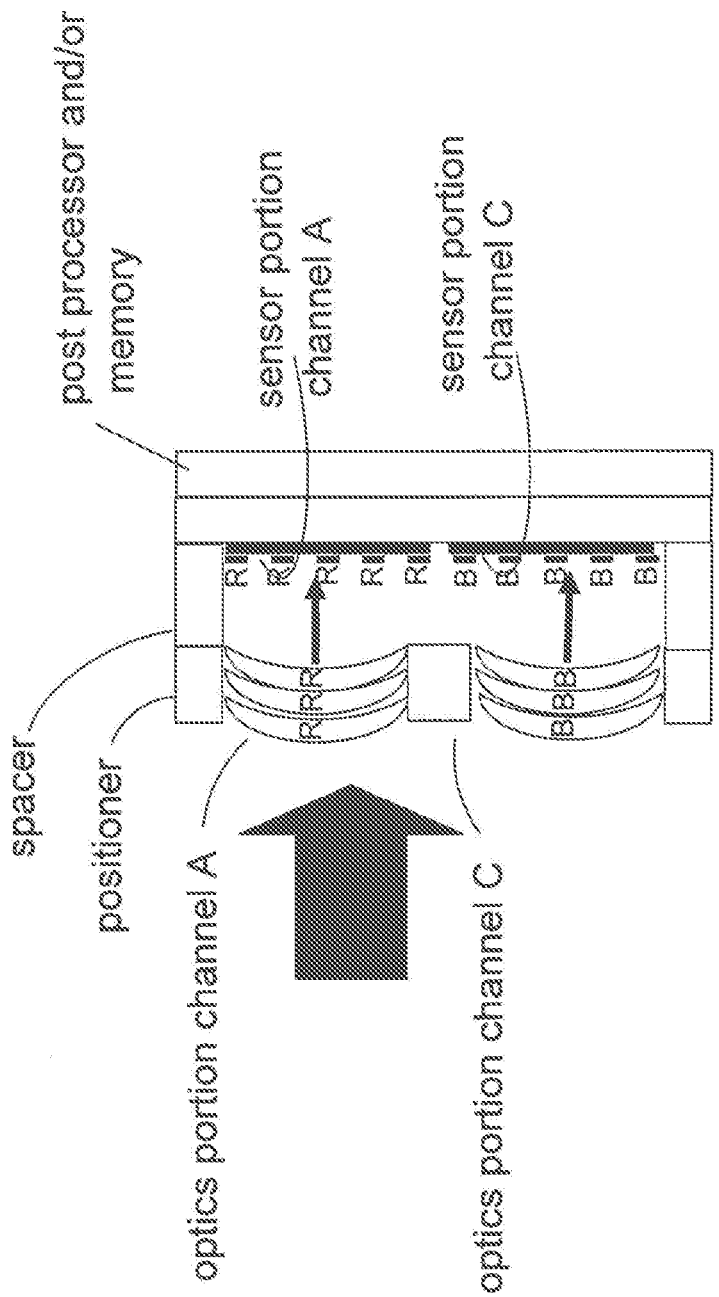

FIGS. 87A-87B are schematic representation of digital camera apparatus 300 in accordance with further embodiments of the present invention. In each of these embodiments, the digital camera apparatus includes one or more camera channels, e.g., camera channels 350A-350D, one or more of which having optical portion, e.g., optical portions 330A-330D, respectively, with an elliptical or other non circular shape.

In some embodiments, a first one of the camera channels, e.g., camera channel 350A, is dedicated to a first color or first band of colors (e.g., red or a red band of colors), a second one the camera channels, e.g., camera channel 350B, is dedicated to second color or second band of colors (e.g., blue or a blue band of colors), different than the first color or first band of colors, and a third one of the camera channels, e.g., camera channel 350D, is dedicated to a third color or third band of colors (e.g., green or a green band of colors), different than the first and second colors or band of colors. In some of such embodiments, the other camera channel, e.g., camera channels 350D, is a broadband camera channel, e.g., using a color filter array with a Bayer pattern, an infrared (IR) camera channel or an ultraviolet (UV) camera channel.

In some other embodiments, a first one of the camera channels, e.g., camera channel 350A, is dedicated to a first color or first band of colors (e.g., red or a red band of colors), a second one the camera channels, e.g., camera channel 350B, is dedicated to second color or second band of colors (e.g., green or a green band of colors), different than the first color or first band of colors, a third one of the camera channels, e.g., camera channel 350C, is dedicated to a third color or third band of colors (e.g., blue or a blue band of colors), different than the first and second colors or band of color, and a fourth one of the camera channels, e.g., camera channel 350D, is dedicated to a color or band of colors (e.g., green or a green band of colors), different than the first and third colors or bands of colors.

In some other embodiments, a first one of the camera channels, e.g., camera channel 350A, is dedicated to a red or a red band of colors, a second one the camera channels, e.g., camera channel 350B, is dedicated to blue or a blue band of colors, a third one of the camera channels, e.g., camera channel 350C, is dedicated to green1 or a green1 band of colors, and a fourth one of the camera channels, e.g., camera channel 350D, is dedicated to a green2 or green2 band of colors.

In some embodiments, one of the camera channels, e.g., camera channel 350C, is a broadband camera channel, an infrared (IR) camera channel or an ultraviolet (UV) camera channel.

In some embodiments, the digital camera apparatus employs a processor that is disposed on the same integrated circuit as the sensor arrays. The processor may have any layout, including for example, a layout that is the same as, or similar to, the layouts described herein. In some embodiments, the processor may have one or more portions that are not disposed on the same integrated circuit as the sensor arrays and/or may not have any portions disposed on the same integrated circuit as the sensor arrays (see for example, FIGS. 87A-87B).

As stated above, each of the embodiments described above may be used alone or in combination with any other embodiment(s) or portion thereof described herein or known to those of ordinary skill in the art.

Three Camera Channels

FIGS. 88A-88E and 89A-89E are schematic representation of digital camera apparatus 300 in accordance with further embodiments of the present invention. In each of these embodiments, the digital camera apparatus includes three or more camera channels, e.g., camera channels 350A-350C.

In some embodiments, the first camera channel, e.g., camera channel 350A, is dedicated to a first color or first band of colors (e.g., red or a red band of colors), the second camera channel, e.g., camera channel 350B, is dedicated to second color or second band of colors (e.g., blue or a blue band of colors), different than the first color or first band of colors, and the third camera channel, e.g., camera channel 350C, is dedicated to third color or third band of colors (e.g., green or a green band of colors), different than the first and second colors or band of colors. In some embodiments, one or more of the camera channels employs a pixel size that matches a color optical blur for the respective camera channel, an integration time and/or other electrical characteristic of the sensor array adapted to increase or optimize performance of the respective camera channel, and/or a design/layout of the pixel circuitry and photodiode that is adapted to increase or maximize sensitivity of the respective camera channel.

In some embodiments, one of the camera channels is a broadband camera channel, an infrared (IR) camera channel or an ultraviolet (UV) camera channel.

In some embodiments, one of the camera channel, e.g., camera channel 350A, is dedicated to two or more separate colors or two or more separate bands of colors (e.g., blue or a blue band and red or a red band). In some of such embodiments, the optical portion may itself have the capability to provide color separation, for example, similar to that provided by a color filter array (e.g., a Bayer pattern or variation thereof). In some embodiments, the lens and/or filter of the camera channel may transmit both of such colors or bands of colors and the camera channel may include one or mechanisms elsewhere in the camera channel to separate the two colors or two bands of colors. For example, a color filter array may be disposed between the lens and the sensor array and/or the camera channel may employ a sensor capable of separating the colors or bands of colors. In some of the latter embodiments, the sensor array may be provided with pixels that have multiband capability, e.g., two or three colors. For example, each pixel may comprise two or three photodiodes, wherein a first photodiode is adapted to detect a first color or first band of colors, a second photodiode is adapted to detect a second color or band of colors and a third photodiode is adapted to detect a third color or band of colors. One way to accomplish this is to provide the photodiodes with different structures/characteristics that make them selective, such that first photodiode has a higher sensitivity to the first color or first band of colors than to the second color or band of colors, and the second photodiode has a higher sensitivity to the second color or second band of colors than to the first color or first band of colors. Another way is to dispose the photodiodes at different depths in the pixel, which takes advantage of the different penetration and absorption characteristics of the different colors or bands of colors. For example, blue and blue bands of colors penetrate less (and are thus absorbed at a lesser depth) than green and green bands of colors, which in turn penetrate less (and are thus absorbed at a lesser depth) than red and red bands of colors. In some embodiments, such a sensor array is employed even though the pixels may see only one particular color or band of colors, for example, to in order to adapt such sensor array to the particular color or band of colors.

In some of the latter embodiments, the second camera channel, e.g., camera channel 350B, may also be dedicated to two or more separate colors or two or more separate bands of colors. For example, the first camera channel may be dedicated to red or a red band and green or a green band (e.g., G1). The second camera channel may be dedicated to blue or a blue band and green or a green band (e.g., G2). In some other of the latter embodiments, the second camera channel, e.g., camera channel 350B, may be dedicated to a single color or single band of colors (e.g., green or a green band) different from the colors or bands of colors to which the first camera channel is dedicated, and the third camera channel, e.g., camera channel 350C, is dedicated to a single color or single band of colors different from the colors or bands of colors to which the first and second camera channels are dedicated.

The three or more camera channels may or may not have the same configuration (e.g., size, shape, resolution, or degree or range of sensitivity) as one another. In some embodiments, each of the camera channels has the same size, shape, resolution and/or a degree or range of sensitivity as the other camera channels. In some other embodiments, for example, one or more of the camera channels has a size, shape, resolution and/or a degree or range of sensitivity that is different than one or more of the other camera channels. For example, one or more of the camera channels may have a sensor array with fewer pixels than is provided in the sensor array of one or more of the other camera channels, for a comparable portion of a field of view.

In some embodiments, one or more of the camera channels may have a sensor array with a size that is different than the size of the sensor array of one or more of the other camera channels. In some of such embodiments, the optics portion of such one or more camera channels may have a f/# and/or a focal length that is different from the f/# and/or a focal length of the one or more of the other camera channels.

In some embodiments, one or more of the camera channels are dedicated to a wavelength or band of wavelengths and the sensor array and/or optics portion of such one or more camera channels are optimized for the respective wavelength or band of wavelengths to which the respective camera channel is dedicated. In some embodiments, the design, operation, array size and/or pixel size of each sensor array is optimized for the respective wavelength or bands of wavelengths to which the camera channels are dedicated. In some embodiments the design of each optical portion is optimized for the respective wavelength or bands of wavelengths to which the respective camera channel is dedicated.

It should be understood, however, that any other configurations may be employed.

The three or more camera channels may be arranged in any manner. In some embodiments, the three or more camera channels are arranged in a triangle, as shown to help provide compactness and symmetry in optical collection.

In some embodiments, the digital camera apparatus employs a processor that is disposed on the same integrated circuit as the sensor arrays. The processor may have any layout, including for example, a layout that is the same as, or similar to, the layouts described herein (see for example, 8A-98B. In some embodiments, the processor may have one or more portions that are not disposed on the same integrated circuit as the sensor arrays and/or may not have any portions disposed on the same integrated circuit as the sensor arrays.

As stated above, each of the embodiments described above may be used alone or in combination with any other embodiment(s) or portion thereof described herein or known to those of ordinary skill in the art.

In some embodiments, the camera channels, e.g., camera channels 350A-350C, are connected via one or more communication links to one or more displays. In some such embodiments, each of the camera channels is connected to its own display. The displays may or may not have the same characteristics as one another. In some other embodiments, the three camera channels, e.g., camera channels 350A-350C, are each connected to the same display.

Figure 90:
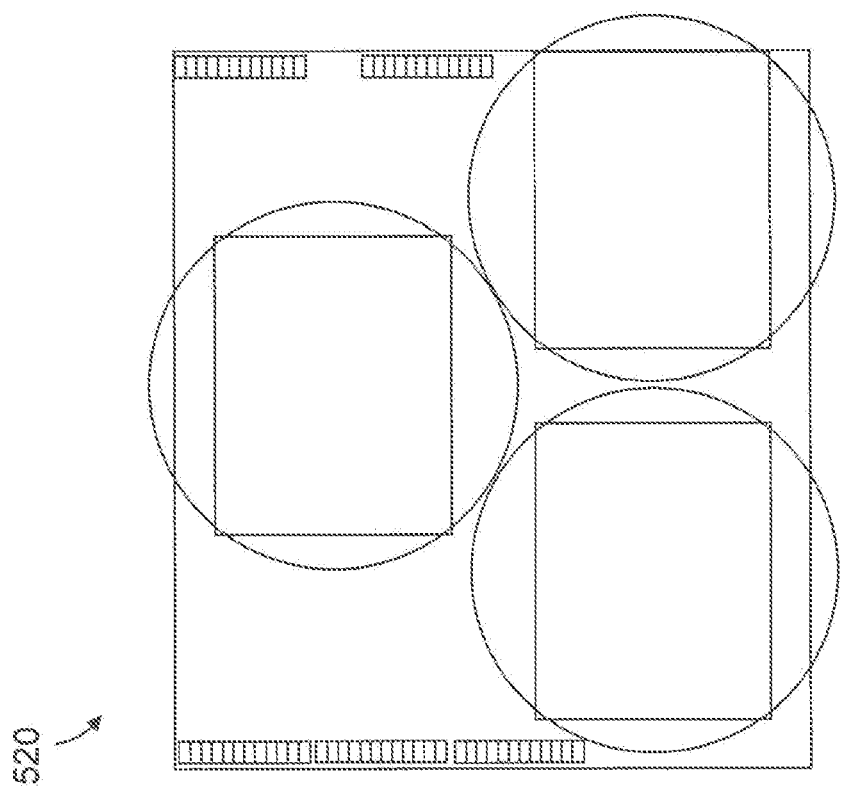
FIG. 90 is a schematic plan view of an image device in accordance with another embodiment of the present invention.
Figure 99B:
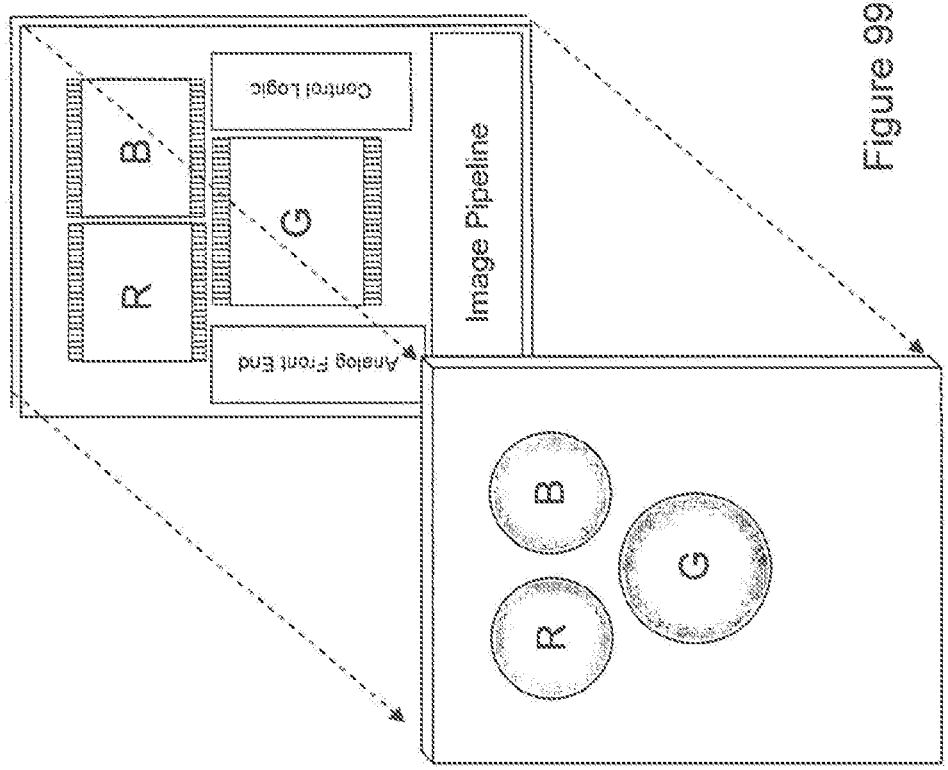
Figure 99C:
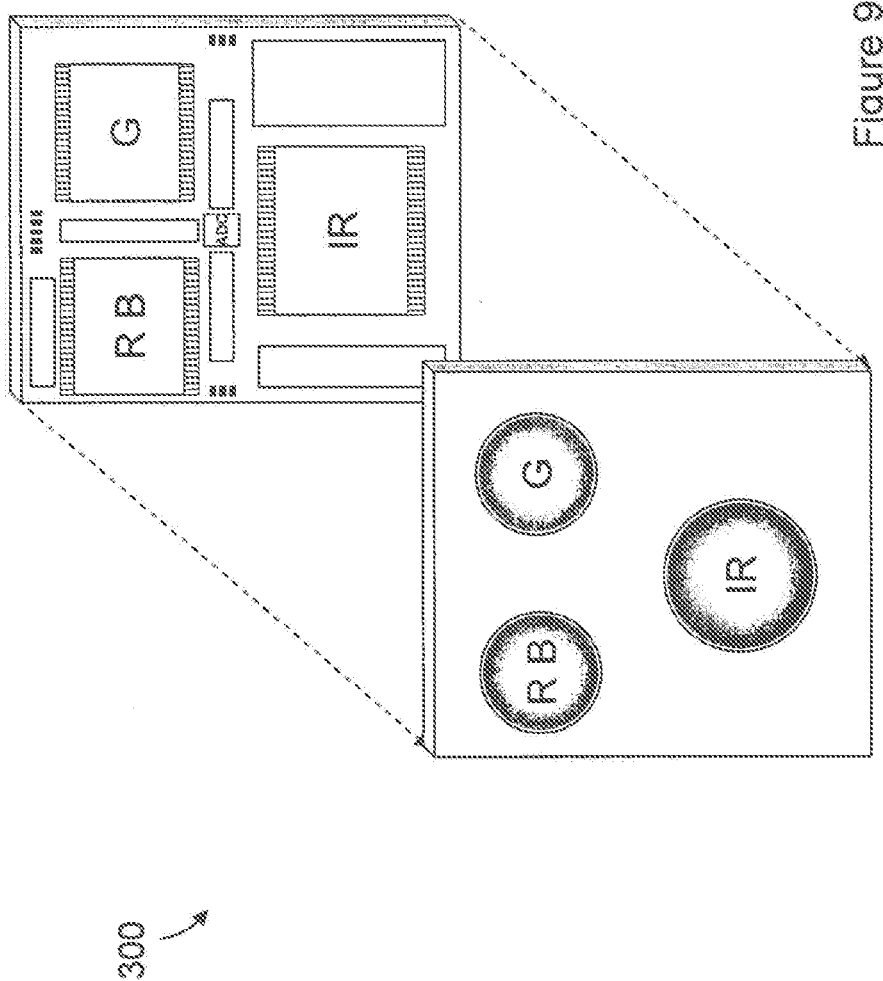
Figure 99D:
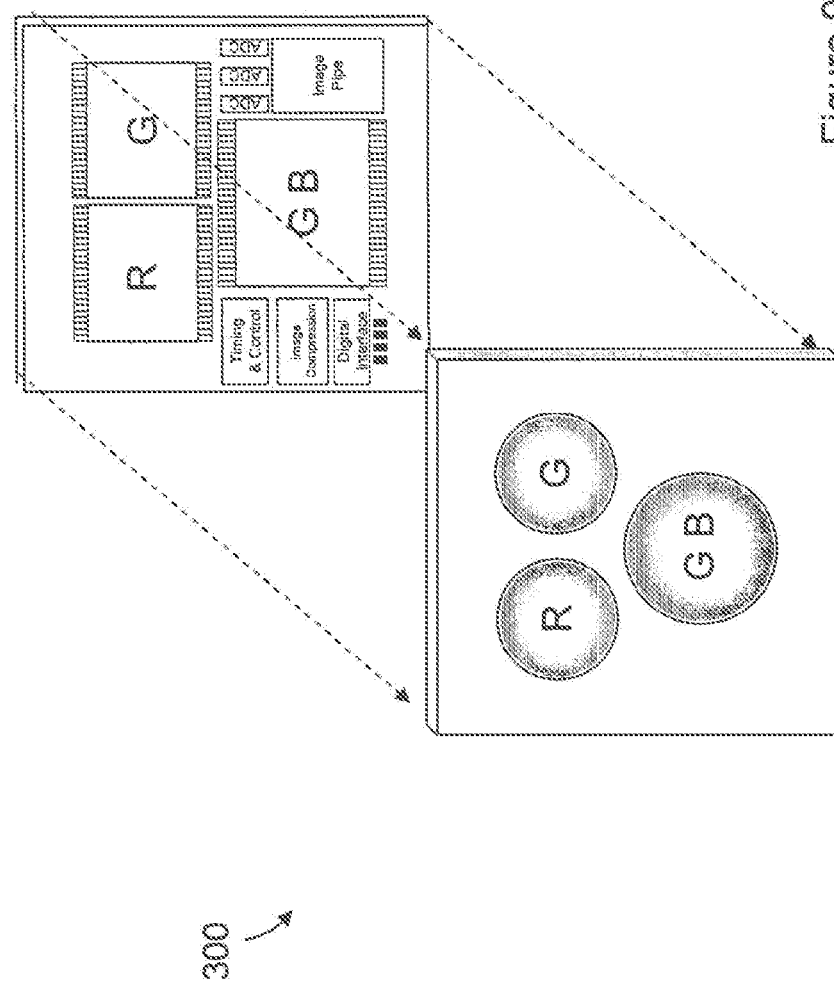
Figure 100A:
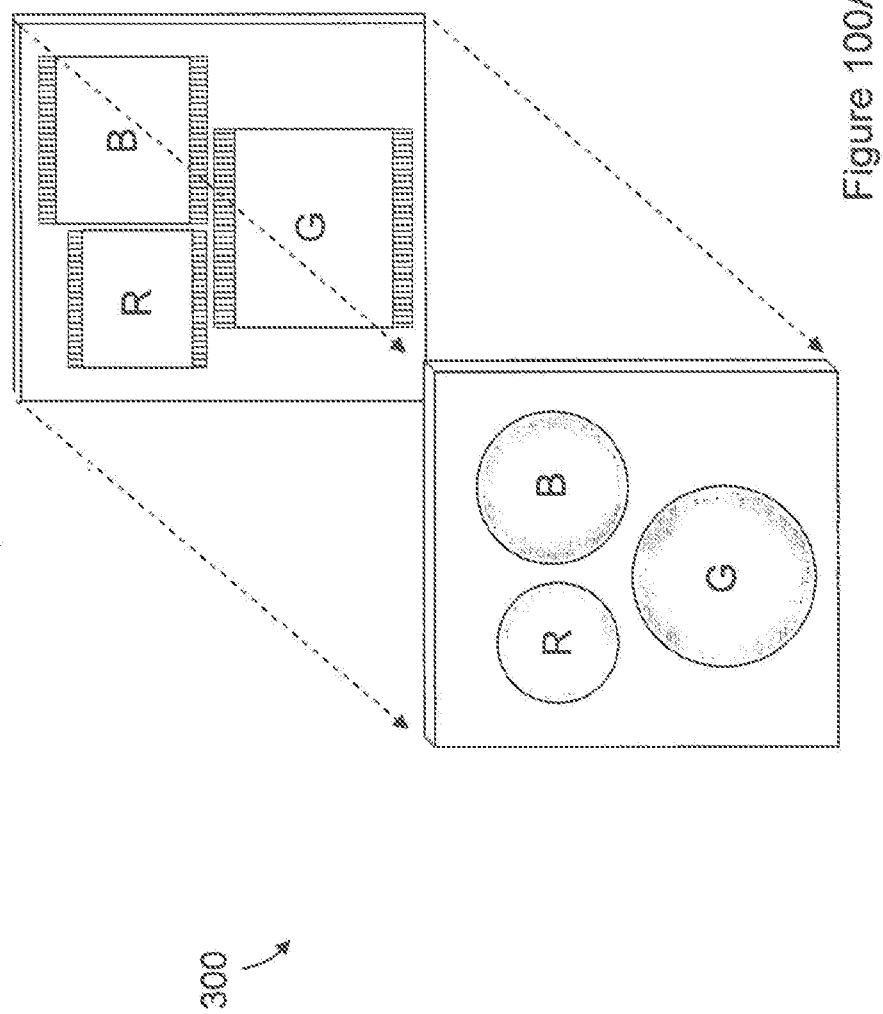
Figure 100B:
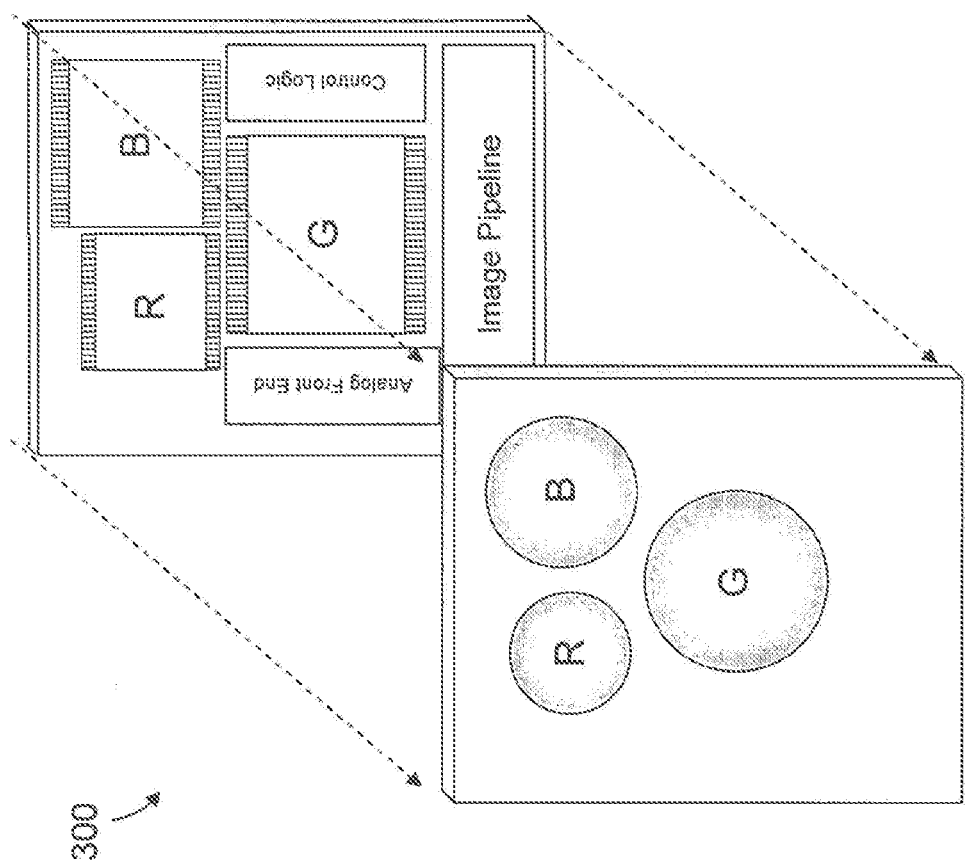
Figure 100C:
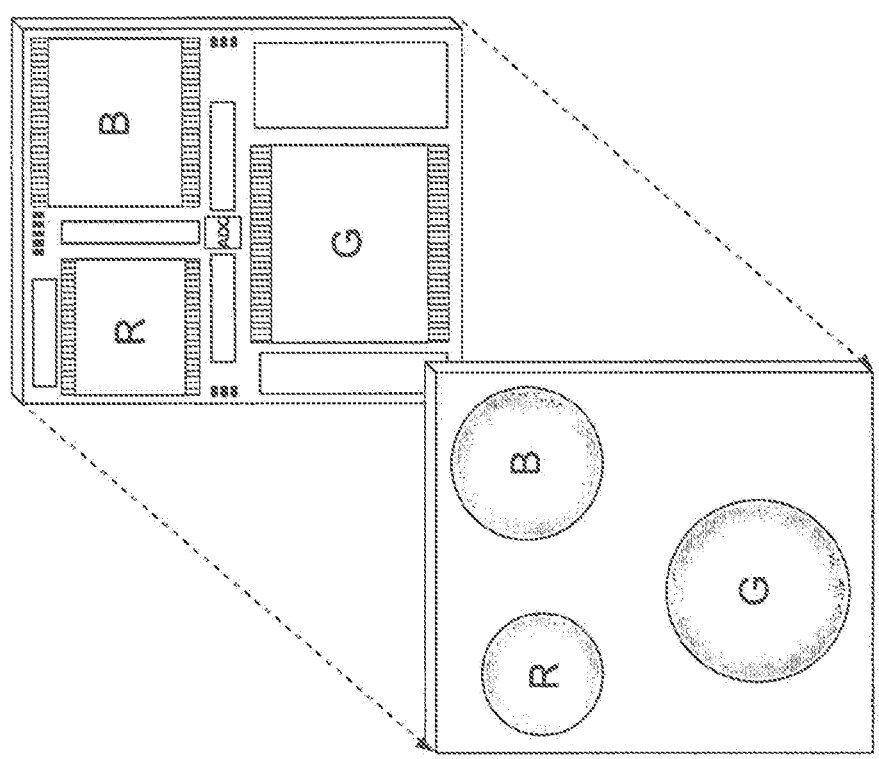
Figure 100D:
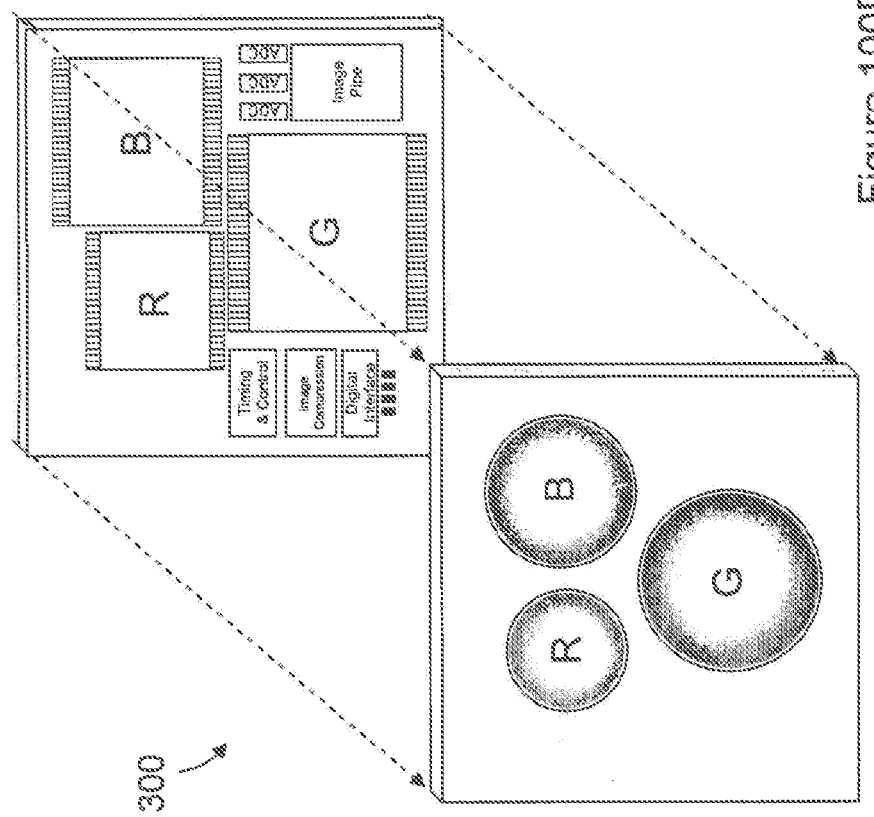

FIG. 90 is a schematic plan view of an embodiment of the image device 520 that may be employed in association with a digital camera apparatus having three or more camera channels. FIGS. 91A-91B, 92A-92B, 93A-93, 94A-94B, 95A-95B and 96A-96B are a schematic cross sectional view of the image device 520 that may be employed in association with a digital camera apparatus having three or more camera channels. In this embodiment, the image device has first and second major surfaces and an outer perimeter defined by edges. The image device defines the one or more regions for the active areas of the one or more sensor arrays. The image device further defines one or more regions for the buffer and/or logic associated with the one or more sensor arrays.

The image device, sensor arrays and image areas may each have any size(s) and shape(s). In some embodiments, the image areas are generally about the same size as the respective sensor arrays, and therefore, the image areas may differ from one another in size and shape depending upon the dimensions of the underlying sensor arrays. Of course, there is no requirement that an image area cover all, or only, the underlying array. In alternative embodiments an image area could cover only a portion of an array, and could extend beyond the array.

The image device 520 has a generally rectangular shape and dimensions equal to about 10 mm on a first side and about 8.85 mm on a second side. Each of the image areas has a generally circular shape and a width or diameter equal to about 5 mm. Each of the active areas has a generally rectangular shape having a first dimension equal to about 4.14 mm and a second dimension equal to about 3.27 mm. The active area, may define, for example, a matrix of 1200×900 pixels (i.e., 1200 columns, 900 rows).

In some embodiments, the image device 520 has a generally square shape and dimensions equal to about 10 mm on a side, with each quadrant being 5 mm on a side. Each of the image areas has a generally circular shape and a width or diameter equal to about 5 millimeters (mm). Each of the active areas has a generally rectangular shape having a first dimension equal to about 4 mm and a second dimension equal to about 3 mm. The active area, may define for example, a matrix of 1200×900 pixels (i.e., 1200 columns, 900 rows).

Referring to FIGS. 97A-97D, the optics portions of the three or more camera channels are supported by one or more supports, e.g., support 320, which position each of the optics portions in registration with a respective sensor array, at least in part. In this embodiment, for example, optics portion 330A is positioned in registration with sensor array 310A. Optics portion 330B is positioned in registration with sensor array 310B. Optics portion 330C is positioned in registration with sensor array 310C. Optics portion 330B is positioned in registration with sensor array 310B. In some embodiments, the support also helps to limit, minimize and/or eliminate light "cross talk" between the camera channels.

In this embodiment, the support 320 includes a support that defines one or more support portions, e.g., three support portions 600A-600C, each of which supports and/or helps position a respective one of the one or more optics portions. In this embodiment, for example, support portion 600A supports and positions optics portion 330A in registration with sensor array 310A. Support portion 600B supports and positions optics portion 330B in registration with sensor array 310B. Support portion 600C supports and positions optics portion 330C in registration with sensor array 310C. In this embodiment, the support also helps to limit, minimize and/or eliminate light "cross talk" between the camera channels.

Each of the support portions 600A-600C defines an aperture 616 and a seat 618. The aperture 616 defines a passage for the transmission of light for the respective camera channel. The seat 618 is adapted to receive a respective one of the optics portions (or portion thereof) and to support and/or position the respective optics portion, at least in part. In this regard, the seat 618 may include one or more surfaces (e.g., surfaces 620, 622) adapted to abut one or more surfaces of the optics portion to support and/or position the optics portion, at least in part, relative to the support portion and/or one or more of the sensor arrays 310A-310C. In this embodiment, surface 620 is disposed about the perimeter of the optics portion to support and help position the optics portion in the x direction and the y direction). Surface 622 (sometimes referred to herein as "stop" surface) positions or helps position the optics portion in the z direction.

The position and/or orientation of the stop surface 622 may be adapted to position the optics portion at a specific distance (or range of distance) and/or orientation with respect to the respective sensor array. In this regard, the seat 618 controls the depth at which the lens is positioned (e.g., seated) within the support. The depth may be different for each lens and is based, at least in part, on the focal length of the lens. For example, if a camera channel is dedicated to a specific color (or band of colors), the lens or lenses for that camera channel may have a focal length specifically adapted to the color (or band of colors) to which the camera channel is dedicated. If each camera channels is dedicated to a different color (or band of colors) than the other camera channels, then each of the lenses may have a different focal length, for example, to tailor the lens to the respective sensor array, and each of the seats have a different depth.

Each optics portion may be secured in the respective seat 618 in any suitable manner, for example, but not limited to, mechanically (e.g., press fit, physical stops), chemically (e.g., adhesive), electronically (e.g., electronic bonding) and/or any combination thereof. In some embodiments, the seat 618 has dimensions adapted to provide a press fit for the respective optics portion.

The aperture (or portions thereof) may have any configuration (e.g., shape and/or size) including for example, cylindrical, conical, rectangular, irregular and/or any combination thereof. The configuration may be based, for example, on the desired configuration of the optical path, the configuration of the respective optical portion, the configuration of the respective sensor array and/or any combination thereof.

The supports 320 may comprise any type of material(s) and may have any configuration and/or construction. In some embodiments, for example, the support 320 comprises silicon, semiconductor, glass, ceramic, plastic, or metallic materials and/or a combination thereof. If the support 320 has more than one portion, such portions may be fabricated separate from one another, integral with one another and/or any combination thereof. If the support defines more than one support portion, each of such support portions, e.g., support portions 600A-600C, may be coupled to one, some or all of the other support portions, as shown, or completely isolated from the other support portions. If the support 320 is a single integral component, each of the one or more support portions define one or more portions of such integral component. Moreover, the positioner may be a solid device that may offer a wide range of options for manufacturing and material, however other forms of devices may also be employed. In some embodiments, for example, the support 320 comprises a plate (e.g., a thin plate) that defines the support and one or more support portions, with the apertures and seats being formed by machining (e.g., boring) or any other suitable manner. In some other embodiments, the support 320 is fabricated as a casting with the apertures defined therein (e.g., using a mold with projections that define the apertures and seats of the one or more support portions).

In some embodiments, the lens and support are manufactured as a single molded component. In some embodiments the lens may be manufactured with tabs that may be used to form the support.

In some embodiments, the support 320 is coupled and/or affixed directly or indirectly, to the image device. For example, the support 320 may be directly coupled and affixed to the image device (e.g., using adhesive) or indirectly coupled and/or or affixed to the image device via an intermediate support member (not shown).

The x and y dimensions of the support 320 may be, for example, approximately the same (in one or more dimensions) as the image device, approximately the same (in one or more dimensions) as the arrangement of the optics portions 330A-330C and/or approximately the same (in one or more dimensions) as the arrangement of the sensor arrays 310A-310C. One advantage of such dimensioning is that it helps keep the x and y dimensions of the digital camera apparatus as small as possible.

In some embodiments, it may be advantageous to provide the seat 618 with a height A that is the same as the height of a portion of the optics that will abut the stop surface 620. It may be advantageous for the stop surface 622 to be disposed at a height B (e.g., the distance between the stop surface 622 and the base of the support portion) that is at least as high as needed to allow the seat 618 to provide a firm stop for an optics portion (e.g., the lens) to be seated thereon. The width or diameter C of the portion of the aperture 616 disposed above the height of the stop surface 622 may be based, for example, on the width or diameter of the optics portion (e.g., the lens) to be seated therein and the method used to affix and/or retain that optics portion in the seat 618. The width of the stop surface 622 is preferably large enough to help provide a firm stop for the optics portion (e.g., the lens) yet small enough to minimize unnecessary blockage of the light transmitted by the optics portion. It may be desirable to make the width or diameter D of the portion of the aperture 616 disposed below the height of the stop surface 622 large enough to help minimize unnecessary blockage of the light transmitted by the optics portion. It may be desirable to provide the support with a height E equal to the minimum dimension needed to result in a support sturdy enough to support the one or more optics portions to be seated therein, in view of the considerations above, and may be advantageous to space the one or more apertures 616A-616C of the one or more support portions 600A-600C by a distance F that is as small as possible yet large enough that the support will be sturdy enough to support the optics portions to be seated therein. The support may have a length J and a width K.

In some embodiments, it is desirable to provide the seat 618 with a height A equal to 2.2 mm, to provide the stop surface 622 at a height B in the range of from 0.25 mm to 3 mm, to make the width or diameter C of the portion of the aperture above the height B of the stop surface 622 equal to approximately 3 mm, to make the width or diameter D of the lower portion of the aperture approximately 2.8 mm, to provide the support portion with a height E in the range from 2.45 mm to 5.2 mm and to space the apertures apart by a distance F of at least 1 mm. In some of such embodiments, it may be desirable to provide the support with a length J equal to 10 mm and a width K equal to 10 mm or to provide the support with a length J equal to 10 mm and a width K equal to 8.85 mm.

In some embodiments, one or more of the optics portions comprises a cylindrical type of lens, e.g., a NT45-090 lens manufactured by Edmunds Optics. Such lens has a cylindrical portion with a diameter G up to 3 millimeters (mm) and a height H of 2.19 mm. In such embodiments, it may be desirable to employ a support having the dimensions and ranges set forth in the paragraph above.

In some embodiments, the support has a length J equal to 10 mm and a width K equal to 10 mm. In some other embodiments, it may be desirable to provide the support with a length J equal to 10 mm and a width K equal to 8.85 mm.

Three Channels, Two Smaller than Other

FIGS. 99A-99D are schematic representations of digital camera apparatus 300 in accordance with further embodiments of the present invention. In each of these embodiments, the digital camera apparatus include three or more camera channels, e.g., camera channels 350A-350C. Two of the camera channels, e.g., camera channels 350A-350B, are each smaller in size than a third camera channel, e.g., camera channel 350C. The smaller camera channels may or may not have the same size as one another.

In some embodiments, the smaller camera channels, e.g., camera channels 350A-350B, each have a resolution that is less than the resolution of the larger camera channel, e.g., camera channel 350C, although in such embodiments, the smaller camera channels may or may not have the same resolution as one another. For example, each of the smaller camera channels, e.g., camera channel 350A-350B, may have a sensor array with fewer pixels than is provided in the sensor array of the larger camera channel, e.g., camera channel 350B, for a comparable portion of the field of view. In one embodiment, for example, the number of pixels in the larger camera channel is forty four percent greater than the number of pixels in one or more of the smaller camera channels, for a comparable portion of the field of view. In another embodiment, for example, the number of pixels in the larger camera channel is thirty six percent greater than the number of pixels in one or more of the smaller camera channels, for a comparable portion of the field of view. It should be understood, however, that any other sizes and/or architectures may also be employed.

In some other embodiments, one or more of the smaller camera channels has a resolution that is equal to the resolution of the larger camera channel. For example, one or more of the smaller camera channels, e.g., camera channels 350A-350B, may have a sensor array with the same number of pixels as is provided in the sensor array of the larger camera channel, e.g., camera channel 350C, for a comparable portion of the field of view. In one embodiment, for example, the pixels in the larger camera channel are forty four percent larger in size (e.g., twenty percent larger in the x direction and twenty percent larger in the y direction) than the pixels in the smaller camera channels. In another embodiment, for example, the pixels in the larger camera channel are thirty six percent larger in size (e.g., seventeen percent larger in the x direction and seventeen percent larger in the y direction) than the pixels in the smaller camera channels. It should be understood, however, that any other sizes and/or architectures may also be employed.

In some embodiments, the first camera channel, e.g., camera channel 350A, is dedicated to a first color or first band of colors (e.g., red or a red band of colors), the second camera channel, e.g., camera channel 350B, is dedicated to second color or second band of colors (e.g., blue or a blue band of colors), different than the first color or first band of colors, and the third camera channel, e.g., camera channel 350C, is dedicated to third color or third band of colors (e.g., green or a green band of colors), different than the first and second colors or band of colors. In some of such embodiments, the two smaller camera channels, e.g., camera channels 350A-350B, each have a lower resolution than the third camera channel, e.g., camera channel 350C.

In some embodiments, one of the camera channels is a broadband camera channel, an infrared (IR) camera channel or an ultraviolet (UV) camera channel.

In some embodiments, the digital camera apparatus employs a processor that is disposed on the same integrated circuit as the sensor arrays. The processor may have any layout, including for example, a layout that is the same as, or similar to, the layouts described herein (see for example, 99B-99D). In some embodiments, the processor may have one or more portions that are not disposed on the same integrated circuit as the sensor arrays and/or may not have any portions disposed on the same integrated circuit as the sensor arrays (see for example, FIG. 99A).

As stated above, each of the embodiments described above may be used alone or in combination with any other embodiment(s) or portion thereof described herein or known to those of ordinary skill in the art.

In some embodiments, the camera channels, e.g., camera channels 350A-350C, are connected via one or more communication links to one or more displays. In some such embodiments, each of the camera channels is connected to its own display. The displays may or may not have the same characteristics as one another. In some other embodiments, the smaller camera channels, e.g., camera channels 350A-350B, are connected to a first display and the larger camera channel, e.g., camera channel 350C, is connected to a second display. The first and second displays may or may not have the same characteristics. In some embodiments, the first display has a resolution equal to the resolution of one or more of the camera channels connected thereto. The second display may have a resolution equal to the resolution of one or more camera channels connected thereto, however, other resolutions may be employed.

Three Channels of all Different Sizes

FIGS. 100A-100D are schematic representations of digital camera apparatus 300 in accordance with further embodiments of the present invention. In each of these embodiments, the digital camera apparatus include three or more camera channels, e.g., camera channels 350A-350C. A first one of the camera channels, e.g., camera channel 350A, is smaller in size than a second one of the camera channels, e.g., camera channel 350B, which is in turn smaller in size than a third one of the camera channels, e.g., camera channel 350C.

Referring to FIGS. 10A-10G, in some embodiments, the smallest camera channels, e.g., camera channels 350A, has a resolution that is smaller than the resolution of the second camera channel, e.g., camera channel 350B, which has a resolution that is smaller than the resolution of the largest camera channel, e.g., camera channel 350C. For example, the smallest camera channels, e.g., camera channel 350A, may have a sensor array with fewer pixels than is provided in the sensor array of the second camera channel, e.g., camera channel 350B, for a comparable portion of the field of view, and the second camera channel, e.g., camera channel 350B, may have a sensor array with fewer pixels than is provided in the sensor array of the largest camera channel, e.g., camera channel 350C, for a comparable portion of the field of view. In one embodiment, for example, the number of pixels in the second camera channel, e.g., camera channel 350B, is forty four percent greater than the number of pixels in the smallest camera channel, e.g., camera channel 350A, for a comparable portion of the field of view, and the number of pixels in the largest camera channel, e.g., camera channel 350C, is thirty six percent greater than the number of pixels in the second camera channel, e.g., camera channel 350B, for a comparable portion of the field of view. It should be understood, however, that any other sizes and/or architectures may also be employed.

Referring to FIGS. 102A-102G, in some other embodiments, one or more of the smaller camera channels, e.g., camera channels 350A-350B, has a resolution that is equal to the resolution of the larger camera channel, e.g., camera channel 350C. For example, one or more of the smaller camera channels, e.g., camera channels 350A-350B, may have a sensor array with the same number of pixels as is provided in the sensor array of the larger camera channel, e.g., camera channel 350C, for a comparable portion of the field of view.

In one embodiment, for example, the pixels in the second camera channel, e.g., camera channel 350B, are forty four percent larger in size (e.g., twenty percent larger in the x direction and twenty percent larger in the y direction) than the pixels in the smallest camera channel, e.g., camera channel 350A. In another embodiment, for example, the pixels in the largest camera channel, e.g., camera channel 350C, are thirty six percent larger in size (e.g., seventeen percent larger in the x direction and seventeen percent larger in the y direction) than the pixels in the second camera channel, e.g., camera channel 350B. It should be understood, however, that any other sizes and/or architectures may also be employed.

In some embodiments, the first camera channel, e.g., camera channel 350A, is dedicated to a first color or first band of colors (e.g., red or a red band of colors), the second camera channel, e.g., camera channel 350B, is dedicated to second color or second band of colors (e.g., blue or a blue band of colors), different than the first color or first band of colors, and the third camera channel, e.g., camera channel 350C, is dedicated to third color or third band of colors (e.g., green or a green band of colors), different than the first and second colors or band of colors. In some of such embodiments, the two smaller camera channels, e.g., camera channels 350A-350B, each have a lower resolution than the third camera channel, e.g., camera channel 350C. In some other embodiments, each of the camera channels, e.g., camera channels 350A-350C, has the same resolution.

In some embodiments, the number of pixels and/or the design of the pixels in the sensor array of a camera channel are adapted to match a wavelength or band of wavelengths of incident light to which such camera channels may be dedicated.

In some embodiments, the size of the sensor array and/or the design of the optics (e.g., f/# and focal length) for one or more of the camera channels are adapted to provide a desired field of view and/or sensitivity for such camera channels.

In some embodiments, one of the camera channels is a broadband camera channel, an infrared (IR) camera channel or an ultraviolet (UV) camera channel.

In some embodiments, one or more of the camera channels are dedicated to a wavelength or band of wavelengths and the sensor array and/or optics portion of such one or more camera channels are optimized for the respective wavelength or band of wavelengths to which the respective camera channel is dedicated. In some embodiments, the design, operation, array size and/or pixel size of each sensor array is optimized for the respective wavelength or bands of wavelengths to which the camera channels are dedicated. In some embodiments the design of each optical portion is optimized for the respective wavelength or bands of wavelengths to which the respective camera channel is dedicated.

In some embodiments, the digital camera apparatus employs a processor that is disposed on the same integrated circuit as the sensor arrays. The processor may have any layout, including for example, a layout that is the same as, or similar to, the layouts described herein (see for example, FIGS. 100B-100D. In some embodiments, the processor may have one or more portions that are not disposed on the same integrated circuit as the sensor arrays and/or may not have any portions disposed on the same integrated circuit as the sensor arrays (see for example, FIG. 100A).

As stated above, each of the embodiments described above may be used alone or in combination with any other embodiment(s) or portion thereof described herein or known to those of ordinary skill in the art.

In some embodiments, the camera channels, e.g., camera channels 350A-350C, are connected via one or more communication links to one or more displays. In some such embodiments, each of the camera channels is connected to its own display. The displays may or may not have the same characteristics. For example, in some embodiments, one or more of the camera channels have a resolution that is less than the resolution of one or more other camera channels and the one or more display connected to the one or more lower resolution camera channels may have a resolution/resolutions that is/are lower than the resolution/resolutions of the one or more displays connected to the one or more other camera channels.

Three Elliptical Channels of all Different Sizes

FIGS. 103A-103E are schematic representations of digital camera apparatus 300 in accordance with further embodiments of the present invention. In each of these embodiments, the digital camera apparatus include one or more camera channels, e.g., camera channels 350A-350C, having an optical portion, e.g., optical portions 330A-330C, respectively, with an elliptical or other type of non circular shape.

In some embodiments, one or more of the camera channels, e.g., camera channels 350A-350B, are smaller in size than a third camera channel, e.g., camera channel 350C. In some of such embodiments, the one or more smaller camera channels, e.g., camera channels 350A-350B, may each have a resolution that is less than the resolution of the larger camera channel, e.g., camera channel 350C, although in such embodiments, the smaller camera channels may or may not have the same resolution as one another. For example, each of the smaller camera channels, e.g., camera channel 350A-350B, may have a sensor array with fewer pixels than is provided in the sensor array of the larger camera channel, e.g., camera channel 350B, for a comparable portion of the field of view. In one embodiment, for example, the number of pixels in the larger camera channel is forty four percent greater than the number of pixels in one or more of the smaller camera channels, for a comparable portion of the field of view. In another embodiment, for example, the number of pixels in the larger camera channel is thirty six percent greater than the number of pixels in one or more of the smaller camera channels, for a comparable portion of the field of view. It should be understood, however, that any other sizes and/or architectures may also be employed.

If one or more of the camera channels, e.g., camera channels 350A-350B, are smaller in size than a third camera channel, e.g., camera channel 350C, the one or more of the smaller camera channels, may have a resolution that is equal to the resolution of the larger camera channel. For example, one or more of the smaller camera channels, e.g., camera channels 350A-350B, may have a sensor array with the same number of pixels as is provided in the sensor array of the larger camera channel, e.g., camera channel 350C, for a comparable portion of the field of view. In one embodiment, for example, the pixels in the larger camera channel are forty four percent larger in size (e.g., twenty percent larger in the x direction and twenty percent larger in the y direction) than the pixels in the smaller camera channels. In another embodiment, for example, the pixels in the larger camera channel are thirty six percent larger in size (e.g., seventeen percent larger in the x direction and seventeen percent larger in the y direction) than the pixels in the smaller camera channels. It should be understood, however, that any other sizes and/or architectures may also be employed.

In some embodiments, the first camera channel, e.g., camera channel 350A, is dedicated to a first color or first band of colors (e.g., red or a red band of colors), the second camera channel, e.g., camera channel 350B, is dedicated to second color or second band of colors (e.g., blue or a blue band of colors), different than the first color or first band of colors, and the third camera channel, e.g., camera channel 350C, is dedicated to third color or third band of colors (e.g., green or a green band of colors), different than the first and second colors or band of colors. In some of such embodiments, the two smaller camera channels, e.g., camera channels 350A-350B, each have a lower resolution than the third camera channel, e.g., camera channel 350C.

In some embodiments, one of the camera channels is a broadband camera channel, an infrared (IR) camera channel or an ultraviolet (UV) camera channel.

In some embodiments, the digital camera apparatus employs a processor that is disposed on the same integrated circuit as the sensor arrays. The processor may have any layout, including for example, a layout that is the same as, or similar to, the layouts described herein (see for example, FIGS. 103C-103E). In some embodiments, the processor may have one or more portions that are not disposed on the same integrated circuit as the sensor arrays and/or may not have any portions disposed on the same integrated circuit as the sensor arrays (see for example, FIG. 103A).

As stated above, each of the embodiments described above may be used alone or in combination with any other embodiment(s) or portion thereof described herein or known to those of ordinary skill in the art.

In some embodiments, one or more of the camera channels, e.g., camera channels 350A-350C, are connected via one or more communication links to one or more displays. In some such embodiments, each of the camera channels is connected to its own display. The displays may or may not have the same characteristics as one another. For example, if the camera channels have different resolutions from one another, the displays may also have different resolutions from one another. For example, in some embodiments, the smaller channels, e.g., camera channels 350A-350B, have a resolution that is less than the resolution of the larger channel, e.g., camera channel 350B, and the displays connected to the smaller channels have resolution that is less than the resolution of the display connected to the larger camera channel. In some other embodiments, the two smaller camera channels, e.g., camera channels 350A-350B, are connected to a first display and the larger camera channel, e.g., camera channel 350C is connected to a second display. The first and second displays may or may not have the same characteristics as one another. For example, in some embodiments, the smaller channels, e.g., camera channels 350A-350B, have a resolution that is less than the resolution of the larger channel, e.g., camera channel 350B, and the display connected to the smaller channels has a resolution that is less than the resolution of the display connected to the larger camera channel.

Two Camera Channels

FIGS. 104A-104E are schematic representations of digital camera apparatus 300 in accordance with further embodiments of the present invention. In each of these embodiments, the digital camera apparatus include two or more camera channels, e.g., camera channels 350A-350B.

In some embodiments, the first camera channel, e.g., camera channel 350A, is dedicated to a single color or a single band of colors (e.g., red or a red band) and the second camera channel, e.g., camera channel 350B, is dedicated to a single color or single band of colors (e.g., green or a green band), different from the color or band of colors to which the first camera channel is dedicated. In some embodiments, one or more of the camera channels employs a pixel size that matches the color optical blur for the respective camera channel, an integration time and/or other electrical characteristic of the sensor array adapted to increase or optimize performance of the respective camera channel, and/or a design/layout of the pixel circuitry and photodiode that is adapted to increase or maximize sensitivity of the respective camera channel.

In some embodiments, one of the camera channels is a broadband camera channel, an infrared (IR) camera channel or an ultraviolet (UV) camera channel.

In some other embodiments, the first camera channel, e.g., camera channel 350A, is dedicated to two or more separate colors or two or more separate bands of colors (e.g., blue or a blue band and red or a red band). In some of such embodiments, the optical portion may itself have the capability to provide color separation, for example, similar to that provided by a color filter array (e.g., a Bayer pattern or variation thereof). In some embodiments, the lens and/or filter of the camera channel may transmit both of such colors or bands of colors and the camera channel may include one or mechanisms elsewhere in the camera channel to separate the two colors or two bands of colors. For example, a color filter array may be disposed between the lens and the sensor array and/or the camera channel may employ a sensor capable of separating the colors or bands of colors. In some of the latter embodiments, the sensor array may be provided with pixels that have multiband capability, e.g., two or three colors. For example, each pixel may comprise two or three photodiodes, wherein a first photodiode is adapted to detect a first color or first band of colors, a second photodiode is adapted to detect a second color or band of colors and a third photodiode is adapted to detect a third color or band of colors. One way to accomplish this is to provide the photodiodes with different structures/characteristics that make them selective, such that first photodiode has a higher sensitivity to the first color or first band of colors than to the second color or band of colors, and the second photodiode has a higher sensitivity to the second color or second band of colors than to the first color or first band of colors. Another way is to dispose the photodiodes at different depths in the pixel, which takes advantage of the different penetration and absorption characteristics of the different colors or bands of colors. For example, blue and blue bands of colors penetrate less (and are thus absorbed at a lesser depth) than green and green bands of colors, which in turn penetrate less (and are thus absorbed at a lesser depth) than red and red bands of colors. In some embodiments, such a sensor array is employed even though the pixels may see only one particular color or band of colors, for example, to in order to adapt such sensor array to the particular color or band of colors.

In some of the latter embodiments, the second camera channel, e.g., camera channel 350B, is dedicated to a single color or a single band of colors (e.g., green or a green band), different from the colors or band of colors to which the first camera channel is dedicated. In some other embodiments, the second camera channel, e.g., camera channel 350B, is also dedicated to two or more separate colors or two or more separate bands of colors. For example, the first camera channel may be dedicated to red or a red band and green or a green band (e.g., G1). The second camera channel may be dedicated to blue or a blue band and green or a green band (e.g., G2).

The two or more camera channels may or may not have the same configuration (e.g., size, shape, resolution, or degree or range of sensitivity) as one another. In some embodiments, for example, each of the camera channels has the same size, shape, resolution and/or degree or range of sensitivity as one another. In some other embodiments, one or more of the camera channels has a size, shape, resolution and/or a degree or range of sensitivity that is different than one or more of the other camera channels. For example, one or more of the camera channels may have a sensor array with fewer pixels than is provided in the sensor array of one or more of the other camera channels, for a comparable portion of the field of view.

In some embodiments, one of the camera channels may have a sensor array with a size that is different than the size of the sensor array of the other camera channels. In some of such embodiments, the optics portion of such one or more camera channels may have a f/# and/or a focal length that is different from the f/# and/or a focal length of the one or more of the other camera channels.

In some embodiments, one or more of the camera channels are dedicated to a wavelength or band of wavelengths and the sensor array and/or optics portion of such one or more camera channels are optimized for the respective wavelength or band of wavelengths to which the respective camera channel is dedicated. In some embodiments, the design, operation, array size and/or pixel size of each sensor array is optimized for the respective wavelength or bands of wavelengths to which the camera channels are dedicated. In some embodiments the design of each optical portion is optimized for the respective wavelength or bands of wavelengths to which the respective camera channel is dedicated.

It should be understood however, that any other configurations may be employed.

The two or more camera may be arranged in any manner. In some embodiments, the two or more camera channels are arranged in linear array, as shown.

In some embodiments, the digital camera apparatus employs a processor that is disposed on the same integrated circuit as the sensor arrays. The processor may have any layout, including for example, a layout that is the same as, or similar to, the layouts described herein (see for example, 104C-104E). In some embodiments, the processor may have one or more portions that are not disposed on the same integrated circuit as the sensor arrays and/or may not have any portions integrated in or disposed on the same integrated circuit as the sensor arrays (see for example, FIG. 104B).

As stated above, each of the embodiments described above may be used alone or in combination with any other embodiment(s) or portion thereof described herein or known to those of ordinary skill in the art.

In some embodiments, one or more of the camera channels, e.g., camera channels 350A-350B, are connected via one or more communication links to one or more displays. In some such embodiments, each of the camera channels is connected to a separate display, i.e., the smaller camera channel, e.g., camera channel 350A, is connected to a first display and the larger camera channel, e.g., camera channel 350B, is connected to a second display. The first and second displays may or may not have the same characteristics. In some embodiments, the first display has a resolution equal to the resolution of the camera channel connected thereto. The second display may have a resolution equal to the resolution of the camera channels connected thereto, however, other resolutions may be employed. Other resolutions may also be employed.

Two Channels, One Smaller than Other

FIGS. 105A-105E are schematic representations of digital camera apparatus 300 in accordance with further embodiments of the present invention. In each of these embodiments, the digital camera apparatus include two or more camera channels, e.g., camera channels 350A-350B. A first one of the camera channels, e.g., camera channel 350A, is smaller in size than a second one of the camera channel, e.g., camera channel 350B.

In some embodiments, the smaller camera channel, e.g., camera channel 350A, has resolution that is less than the resolution of the larger camera channel, e.g., camera channel 350B. For example, the smaller camera channel, e.g., camera channel 350A, may have a sensor array with fewer pixels than the sensor array of the larger camera channel, e.g., camera channel 350B, for a comparable portion of the field of view. In one embodiment, for example, the number of pixels in the larger camera channel is forty four percent greater than the number of pixels in the smaller camera channel, for a comparable portion of the field of view. In another embodiment, for example, the number of pixels in the larger camera channel is thirty six percent greater than the number of pixels in the smaller camera channel, for a comparable portion of the field of view. It should be understood, however, that any other sizes and/or architectures may also be employed.

In some other embodiments, the smaller camera channel, e.g., camera channel 350A, has a resolution that is equal to the resolution of the larger camera channel, e.g., camera channel 350B. For example, the smaller camera channel, e.g., camera channel 350A, may have a sensor array with pixels that are equal in number but smaller than the pixels of the sensor array of the larger camera channel, e.g., camera channel 350B, for a comparable portion of the field of view. In one embodiment, for example, the pixels in the larger camera channel are forty four percent larger in size (e.g., twenty percent larger in the x direction and twenty percent larger in the y direction) than the pixels in the smaller camera channel. In another embodiment, for example, the pixels in the larger camera channel are thirty six percent larger in size (e.g., seventeen percent larger in the x direction and seventeen percent larger in the y direction) than the pixels in the smaller camera channel. It should be understood, however, that any other sizes and/or architectures may also be employed.

In some embodiments, one of the camera channels is a broadband camera channel, an infrared (IR) camera channel or an ultraviolet (UV) camera channel.

In some embodiments, the first camera channel, i.e., the smaller camera channel, is dedicated to a single color or a single band of colors (e.g., red or a red band) and the second camera channel, i.e., the larger camera channel, is dedicated to a single color or single band of colors (e.g., green or a green band), different from the color or band of colors to which the first camera channel is dedicated.

In some other embodiments, one of the camera channels, e.g., the smaller camera channel, is dedicated to two or more separate colors or two or more separate bands of colors (e.g., blue or a blue band and red or a red band). In some of such embodiments, the lens and/or filter of the camera channel may transmit both of such colors or bands of colors and the camera channel may include one or mechanisms elsewhere in the camera channel to separate the two colors or two bands of colors. For example, a color filter array may be disposed between the lens and the sensor array and/or the camera channel may employ a sensor capable of separating the colors or bands of colors. In some of the latter embodiments, the sensor may be provided with sensor elements or pixels that each comprise two photodiodes, wherein the first photodiode is adapted to detect the a first color or first band of colors and the second photodiode is adapted to detect the second color or band of colors. One way to accomplish this is to provide the photodiodes with different structures/characteristics that make them selective, such that first photodiode has a higher sensitivity to the first color or first band of colors than to the second color or band of colors, and the second photodiode has a higher sensitivity to the second color or second band of colors than to the first color or first band of colors. Another way is to dispose the photodiodes at different depths in the pixel, which takes advantage of the different penetration and absorption characteristics of the different colors or bands of colors. For example, blue and blue bands of colors penetrate less (and are thus absorbed at a lesser depth) than green and green bands of colors, which in turn penetrate less (and are thus absorbed at a lesser depth) than red and red bands of colors.

In some embodiments, the digital camera apparatus employs a processor that is disposed on the same integrated circuit as the sensor arrays. The processor may have any layout, including for example, a layout that is the same as, or similar to, the layouts described herein (see for example, 105C-105E). In some embodiments, the processor may have one or more portions that are not disposed on the same integrated circuit as the sensor arrays and/or may not have any portions integrated in or disposed on the same integrated circuit as the sensor arrays (see for example, FIG. 105B). As stated above, each of the embodiments described above may be used alone or in combination with any other embodiment(s) or portion thereof described herein or known to those of ordinary skill in the art.

To that effect, in some embodiments, the smaller camera channel is dedicated to two or more separate colors (or two or more separate bands of colors) and in addition, has a resolution that is less than the resolution of the larger camera channel.

In some embodiments, the camera channels, e.g., camera channels 350A-350B, are connected via one or more communication links to one or more displays. In some such embodiments, each of the camera channels is connected to a separate display, i.e., the smaller camera channel, e.g., camera channel 350A, is connected to a first display and the larger camera channel, e.g., camera channel 350B, is connected to a second display, different than the first display. The first and second displays may or may not have the same characteristics. In some embodiments, the first display has a resolution equal to the resolution of the camera channel connected thereto. The second display may have a resolution equal to the resolution of the camera channels connected thereto, however, other resolutions may be employed.

Group of Image Sensor Chips

FIGS. 106A-106C are schematic perspective views of a system having a plurality of digital camera apparatus, e.g., two digital camera apparatus, in accordance with another embodiment of the present invention. The plurality of digital camera apparatus may be arranged in any desired manner. In some embodiments, it may be desired to collect images from opposing directions. In some embodiments, the digital camera apparatus are mounted back to back, as shown. Some of such embodiments may allow concurrent imaging in opposing directions.

In some embodiments, the one or more optics portions for the first camera subsystem face in a direction that is opposite to the direction that the one or more optics portions for the second digital camera apparatus face. In the illustrated embodiment, for example, the system has first and second sides generally opposite one another. A first one of the digital camera apparatus may be positioned to receive light through a first side of the digital camera apparatus. A second one of the digital camera apparatus may be positioned to receive light through the second side of the system. Other configurations may also be employed.

In some embodiments, each of the subsystems has its own sets of optics, filters and sensors arrays, and may or may not have the same applications and/or configurations as one another, for example, in some embodiments, one of the subsystems may be a color system and the other may be a monochromatic system, one of the subsystems may have a first field of view and the other may have a separate field of view, one of the subsystems may provide video imaging and the other may provide still imaging.

The plurality of digital camera subassemblies may have any size and shape and may or may not have the same configuration as one another (e.g., type, size, shape, resolution). In the illustrated embodiment, one of the subsystems has a length and a width that are equal to the length and width, respectively of the other subsystem, although this is not required.

In some embodiments, one or more sensor portions for the second digital camera apparatus are disposed on the same device (e.g., image device) as one or more sensor portions for the first digital camera apparatus. In some embodiments, one or more sensor portions for the second digital camera apparatus are disposed on a second device (e.g., a second image device), which may be disposed, for example, adjacent to the image device on which the one or more sensor portions for the first digital camera apparatus are disposed.

In some embodiments, two or more of the digital camera apparatus share a processor, or a portion thereof. In some other embodiments, each of the digital camera apparatus has its own dedicated processor separate from the processor for the other digital camera apparatus.

In some embodiments, the system defines a hermetic package, although this is not required.

As with each of the embodiments disclosed herein, this embodiment of the present invention may be employed alone or in combination with one or more of the other embodiments disclosed herein, or portion thereof.

The digital camera apparatus may be assembled and/or mounted in any manner, for example, but not limited to in a manner similar to that employed in one or more of the embodiments disclosed herein.

FIGS. 107A-107B are a schematic representation of another embodiment. This embodiment includes a plurality of image devices. In this embodiment each of the each image devices has one or more sensor arrays for one or more camera channels. In some embodiments, the image devices may or may not be similar to one another.

Although many of the Figures herein show a digital camera subassembly in the form of a layered assembly, it should be understood that the digital camera subassembly may or may not have such a configuration. Indeed, the one or more camera channels of a digital camera subassembly may have any configuration. Thus, some embodiments may have the form of a layered assembly. Some other embodiments may not have the form of a layered assembly.

For example, FIGS. 108A-108B are a schematic representation of digital camera sub assemblies in accordance with further embodiments of the present invention. The digital camera subassemblies each employ one or more of the embodiments described herein, or portions thereof. However, the digital camera subassemblies may or may not have the form of a layered assembly.

In this embodiment, the digital camera assembly includes one or more camera channels. The camera channels may have any configurations and may or may not have the same configuration as one another.

In some embodiments, each of the camera channels comprises a 2 M pixel narrow band camera, e.g., a red camera channel, a blue camera channel and a green camera channel.

In some embodiments, each of the camera channels comprises a 1.3 M pixel narrow band camera, e.g., a red camera channel, a blue camera channel and a green camera channel.

In some embodiments, one of the camera channels is a broadband camera channel, an infrared (IR) camera channel or an ultraviolet (UV) camera channel.

However, as stated above, other configurations may also be employed.

As with each of the embodiments disclosed herein, this embodiment of the present invention may be employed alone or in combination with one or more of the other embodiments disclosed herein, or portion thereof.

Active Support

In some embodiments, the position of each optics portion relative to the respective sensor portion is fixed. In some alternative embodiments however, one or more actuators may be provided to provide movement of one or more of the optics portions, or portions thereof, and/or one or more sensor arrays, or portions thereof. In some embodiments, one or more of such actuators are provided in the support (such a support may comprise, for example, a frame provided with one or more actuators).

For example, it may be desirable to provide relative movement between an optics portion (or one or more portions thereof) and a sensor array (or one or more portions thereof), including, for example, but not limited to relative movement in the x and/or y direction, z direction, tilting, rotation (e.g., rotation of less than, greater than and/or equal to 360 degrees) and/or combinations thereof, may be used in providing various features and/or in the various applications disclosed herein, including, for example, but not limited to, increasing resolution (e.g., increasing detail), zoom, 3D enhancement, image stabilization, image alignment, lens alignment, masking, image discrimination, auto focus, mechanical shutter, mechanical iris, hyperspectral imaging, a snapshot mode, range finding and/or combinations thereof.

Notably, the inventions described and illustrated in the U.S. Provisional Application Ser. No. 60/695,946, entitled "Method and Apparatus for use in Camera and Systems Employing Same", filed Jul. 1, 2005, may be employed in conjunction with the present inventions. For the sake of brevity, those discussions will not be repeated. It is expressly noted that the entire contents of the aforementioned U.S. Provisional Application, including, for example, the features, attributes, alternatives, materials, techniques and/or advantages of all of the inventions/embodiments thereof, are incorporated by reference herein.

Such movement may be provided for example using actuators, e.g., MEMS actuators and by applying appropriate control signal(s) to one or more of the actuators to cause the one or more actuators to move, expand and/or contract to thereby move the associated optics portion. It may be advantageous to make the amount of movement equal to a small distance, e.g., 2 microns (2 um), which may be sufficient for many applications. In some embodiments, for example, the amount of movement may be as small as about ½ of the width of one sensor element (e.g., ½ of the width of one pixel) on one of the sensor arrays. In some embodiments, for example, the magnitude of movement may be equal to the magnitude of the width of one sensor element or two times the magnitude of the width of one sensor element.

In some embodiments, the relative movement is in the form of a ⅓ pixel×⅓ pixel pitch shift in a 3×3 format. In other embodiments, the relative movement is in the form of dithering. In some dithered systems, it may be desirable to employ a reduced optical fill factor. In some embodiments, snap-shot integration is employed. Some embodiments provide the capability to read out a signal while integrating.

In some embodiments, the digital camera apparatus employs relative movement by itself, in lieu of or in combination with one or more embodiments disclosed herein in providing various features and/or in the various applications disclosed herein, for example, but not limited to, increasing resolution (e.g., increasing detail), zoom, 3D effects, image stabilization, image alignment, lens alignment, masking, image discrimination, auto focus, auto exposure, mechanical shutter, mechanical iris, hyperspectral imaging, snapshot mode, range finding and/or combinations thereof.

In addition, it should also be understood that such relative movement may be employed in providing any other features and/or in various applications now known or later developed, and may also be employed, if desired, with any methods and/or apparatus, now known or later developed.

FIGS. 109A-109E are block diagram representation showing configurations employed in some embodiments of the present invention.

Although some of the Figures herein show the processor separate from the sensor arrays, the processor, or portions thereof, may have any configuration and may be disposed in any location or locations. In some embodiments, one, some or all portions of the processor are disposed on the same substrate or substrates as one or more of the one or more of the sensor arrays, e.g., sensor arrays 310A-310D. However, in some embodiments one, some or all portions of the processor are disposed on one or more substrates that are separate from (and possibly remote from) one or more substrates on which one or more of the one or more sensor arrays, e.g., sensor arrays 310A-310D, may be disposed.

In some embodiments, one or more portions of the digital camera apparatus include circuitry to facilitate wired, wireless and/or optical communication to and/or from the subsystem and/or within the subsystem. Such circuitry may have any form. In some embodiments, one or more portions of such circuitry may be part of the processor 340 and may be disposed in the same integrated circuit as one or more other portions of the processor 340 and/or may be in a discrete form, separate from the processor 340 or other portions thereof.

FIG. 110A is a block diagram representation of the processor 340 in accordance with one embodiment of aspects of the present invention. In this embodiment, the processor 340 includes one or more channel processors, one or more image pipelines, and/or one or more image post processors. Each of the channel processors is coupled to a respective one of the camera channels and generates an image based at least in part on the signal(s) received from the respective camera channel. In some embodiments the processor 340 generates a combined imaged based at least in part on the images from two or more of the camera channels. In some embodiments, one or more of the channel processors are tailored to its respective camera channel, for example, as described herein. For example, if one of the camera channels is dedicated to a specific wavelength or color (or band of wavelengths or colors), the respective channel processor may also be adapted to such wavelength or color (or band of wavelengths or colors). Any of the other embodiments described herein or combinations thereof, may also be employed.

For example, the gain, noise reduction, dynamic range, linearity and/or any other characteristic of the processor, or combinations of such characteristics, may be adapted to improve and/or optimize the processor to such wavelength or color (or band of wavelengths or colors). Tailoring the channel processing to the respective camera channel may help to make it possible to generate an image of a quality that is higher than the quality of images resulting from traditional image sensors of like pixel count. In such embodiments, providing each camera channel with a dedicated channel processor may help to reduce or simplify the amount of logic in the channel processors as the channel processor may not need to accommodate extreme shifts in color or wavelength, e.g., from a color (or band of colors) or wavelength (or band of wavelengths) at one extreme to a color (or band of colors) or wavelength (or band of wavelengths) at another extreme The images (and/or data which is representative thereof) generated by the channel processors are supplied to the image pipeline, which may combine the images to form a full color or black/white image. The output of the image pipeline is supplied to the post processor, which generates output data in accordance with one or more output formats.

FIG. 110B shows one embodiment of a channel processor. In this embodiment, the channel processor includes column logic, analog signal logic, black level control and exposure control. The column logic is coupled to the sensor and reads the signals from the pixels. If the channel processor is coupled to a camera channel that is dedicated to a specific wavelength (or band of wavelengths), it may be advantageous for the column logic to be adapted to such wavelength (or band of wavelengths). For example, the column logic may employ an integration time or integration times adapted to provide a particular dynamic range in response to the wavelength (or band of wavelengths) to which the color channel is dedicated. Thus, it may be advantageous for the column logic in one of the channel processors to employ an integration time or times that is different than the integration time or times employed by the column logic in one or more of the other channel processors.

The analog signal logic receives the output from the column logic. If the channel processor is coupled to a camera channel dedicated to a specific wavelength or color (or band of wavelengths or colors), it may be advantageous for the analog signal logic to be specifically adapted to such wavelength or color (or band of wavelengths or colors). As such, the analog signal logic can be optimized, if desired, for gain, noise, dynamic range and/or linearity, etc. For example, if the camera channel is dedicated to a specific wavelength or color (or band of wavelengths or colors), dramatic shifts in the logic and settling time may not be required as each of the sensor elements in the camera channel are dedicated to the same wavelength or color (or band of wavelengths or colors). By contrast, such optimization may not be possible if the camera channel must handle all wavelength and colors and employs a Bayer arrangement in which adjacent sensor elements are dedicated to different colors, e.g., red-blue, red-green or blue-green.

The output of the analog signal logic is supplied to the black level logic, which determines the level of noise within the signal, and filters out some or all of such noise. If the sensor coupled to the channel processor is focused upon a narrower band of visible spectrum than traditional image sensors, the black level logic can be more finely tuned to eliminate noise. If the channel processor is coupled to a camera channel that is dedicated to a specific wavelength or color (or band of wavelengths or colors), it may be advantageous for the analog signal logic to be specifically adapted to such wavelength or color (or band of wavelengths or colors).

The output of the black level logic is supplied to the exposure control, which measures the overall volume of light being captured by the array and adjusts the capture time for image quality. Traditional cameras must make this determination on a global basis (for all colors). If the sensor coupled to the channel processor is dedicated to a specific color (or band of colors, the exposure control can be specifically adapted to the wavelength (or band of wavelengths) to which the sensor is targeted. Each channel processor is thus able to provide a capture time that is specifically adapted to the sensor and/or specific color (or band of colors) targeted thereby and different than the capture time provided by one or more of the other channel processors for one or more of the other camera channels.

FIG. 110C shows one embodiment of the image pipeline. In this embodiment, the image pipeline includes two portions. The first portion includes a color plane integrator and an image adjustor. The color plane integrator receives an output from each of the channel processors and integrates the multiple color planes into a single color image. The output of the color plane integrator, which is indicative of the single color image, is supplied to the image adjustor, which adjusts the single color image for saturation, sharpness, intensity and hue. The adjustor also adjusts the image to remove artifacts and any undesired effects related to bad pixels in the one or more color channels. The output of the image adjustor is supplied to the second portion of the pipeline, which provides auto focus, zoom, windowing, pixel binning and camera functions.

FIG. 110D shows one embodiment of the image post processor. In this embodiment, the image post processor includes an encoder and an output interface. The encoder receives the output signal from the image pipeline and provides encoding to supply an output signal in accordance with one or more standard protocols (e.g., MPEG and/or JPEG).

The output of the encoder is supplied to the output interface, which provides encoding to supply an output signal in accordance with a standard output interface, e.g., universal serial bus (USB) interface.

FIG. 110E shows one embodiment of the system control. In this embodiment, the system control portion includes a serial interface, configuration registers, power management, voltage regulation and control, timing and control, and a camera control interface. In some embodiments, the camera interface comprises an interface that processes signals that are in the form of high level language (HLL) instructions. The following paragraphs describe one such embodiment of the system control. It should be understood however, that the camera interface is not limited to such an embodiment and may have any configuration. In some embodiments the camera interface comprises an interface that processes control signals that are in the form of low level language (LLL) instructions and/or of any other form now known or later developed. Some embodiments may process both HLL instructions and LLL instructions.

In the operation of this embodiment, communication occurs through the serial interface which is connected to a serial port. For example, signals indicative of instructions (e.g., HLL camera control instructions), desired settings, operations and/or data are supplied to the serial interface and control portion through the through the serial port. If the signals are not indicative of a HLL camera control instruction (i.e., a HLL instruction having to do with the camera), signals indicative of the desired settings, operations and/or data are supplied to the configuration registers to be stored therein. If the signals are indicative of a HLL camera control instruction, then the HLL instruction is supplied to the HLL camera control interface. The HLL camera control interface decodes the instruction to generate signals indicative of desired (by the user or other device) settings, operations and/or data, which are supplied to the configuration registers to be stored therein.

Signals indicative of the desired settings, operations and/or data are supplied to the power management, sensor timing and control portion, channel processors, image pipeline and image post processor, as appropriate. The power management portion receives the signals supplied and, in response at least thereto, supplies control signals to the voltage regulation power and control portion, which in turn connects to circuits in the digital camera apparatus. The sensor timing and control portion receives the signals supplied and, in response at least thereto, supplies control signals to the sensor arrays to control the operation thereof. The channel processors receive the signals supplied through (or lines), and further receives one or more signals from one or more of the sensor arrays and performs, in response at least thereto, one or more channel processor operations.

The image pipeline receives the signals and further receives one or more signals from one or more of the channel processors and performs, in response at least thereto, one or more image pipeline operations.

The image post processor receives the signals and further receives one or more signals from the image pipeline and performs, in response at least thereto, one or more image post processor operations.

FIG. 110F shows an example of a high level language camera control instruction, according to one embodiment of the present invention. The instruction format has an op code, e.g., COMBINE, which in this case identifies the instruction as a type of camera control instruction and requests that the digital camera apparatus generate a combined image. The instruction format also has one or more operands fields, e.g., channel id1, channel id2, which identify the camera channels to be used in generating the combined image, at least in part.

As used herein, the term "combined image" means an image based, at least in part, on information captured by two or more camera channels. The combined image may be generated in any manner Example camera channels include but are not limited to camera channels 350A-350D.

An example of a HLL camera control instruction that uses the instruction format of FIG. 110E is "COMBINE 1, 2"—this instruction calls for an output image based at least in part on information captured by a camera channel designated as "camera channel 1", e.g., camera channel 350A, and a camera channel designated as "camera channel 2", e.g., camera channel 350B.

Another example is COMBINE 1, 2, 3, 4—this instruction calls for an output image based at least in part on information captured by a camera channel designated as "camera channel 1", e.g., camera channel 350A, and a camera channel designated as "camera channel 2", e.g., camera channel 350B, a camera channel designated as "camera channel 3", e.g., camera channel 350C, and a camera channel designated as "camera channel 4", e.g., camera channel 350D.

The availability of a COMBINE and other HLL instruction for the digital camera apparatus provides instructions in a form that is closer to human language than is the form of machine language and/or assembly language, thereby helping to bring about writing, reading and/or maintaining programs for the digital camera apparatus.

It should be recognized that the present invention is not limited to the COMBINE instruction and HLL instruction format shown in FIG. 110E and that other instruction formats including for example other HLL instruction formats may be used.

For example, in some embodiments, the camera channels are not specified in the instruction, but rather are implied, for example, based on the op code. In such embodiments, the digital camera apparatus may be configured, for example, to automatically generate a combined image based at least in part on a group of predetermined camera channels whenever a COMBINE instruction is supplied. Alternatively, for example, a plurality of different COMBINE or other HLL instructions may be supported, each having a different op code. The different op codes may implicitly identify the particular camera channels of interest. For example, the instruction "COMBINE12" may call for an output image based at least in part on information captured by a camera channel designated as "camera channel 1", e.g., camera channel 350A, and a camera channel designated as "camera channel 2", e.g., camera channel 350B.

The instruction "COMBINE1234" may call for an output image based at least in part on information captured by a camera channel designated as "camera channel 1", e.g., camera channel 350A, and a camera channel designated as "camera channel 2", e.g., camera channel 350B, a camera channel designated as "camera channel 3", e.g., camera channel 350C, and a camera channel designated as "camera channel 4", e.g., camera channel 350D.

In some embodiments, a single COMBINE instruction causes more than one combined image to be generated. The camera channels of interest for the additional(s) combined images may be implied based on the opcode (e.g., as discussed above). Alternatively, for example the camera channels of interest for the additional combined images may be implied based on the supplied operands.

FIG. 110G shows high level language instructions in accordance with further embodiments of the present invention.

In some embodiments, one or more of the instructions may cause the camera interface to initiate the operation suggested thereby. For example, if the instruction "White Balance Manual" is received, the camera interface may instruct the white balance control to operate in manual mode and/or initiate signals that eventually cause the camera to operate in such a mode.

These instructions may be used, for example, to control the camera set-up and/or the operating mode of one or more aspects of the camera that have two or more states, e.g., "on/off" and/or "manual/auto".

Some embodiments include one, some or all of the instructions of FIG. 110G. Some other embodiments may not employ any of the instructions listed in FIG. 110G.

FIG. 110H shows high level language instructions in accordance with further embodiments of the present invention.

In some embodiments, one or more of the instructions may cause the camera interface to initiate the operation suggested thereby. For example, if the instruction "Single Frame Capture" is received, the camera interface may initiate capture of a single frame.

Some embodiments include one, some or all of the instructions of FIG. 110H. Some other embodiments may not employ any of the instructions listed in FIG. 110H. Some embodiments may include one or more instructions from FIG. 110G and one or more instructions from FIG. 110H, alone and/or in combination with signals of any other form.

In some embodiments, the camera interface can be configured to provide limited access to Low Level Commands to provide specific user defined functionality.

The form of the signals for the camera interface may be predetermined, adaptively determined and/or user determined. In some embodiments, for example, a user may define an instruction set and/or a format for the interface.

As stated above, the camera interface is not limited to embodiments that employ a HLL camera control interface. The camera interface may have any configuration. In some embodiments the camera interface comprises an interface that processes control signals that are in the form of low level language (LLL) instructions and/or of any other form now known or later developed. Some embodiments may process both HLL instructions and LLL instructions.

It should be understood that the processor 340 is not limited to the portions and/or operations set forth above. For example, the processor 340 may comprise any type of portions or combination thereof and/or may carry out any operation or operations.

It should also be understood that the processor 340 may be implemented in any manner. For example, the processor 340 may be programmable or non programmable, general purpose or special purpose, dedicated or non dedicated, distributed or non distributed, shared or not shared, and/or any combination thereof. If the processor 340 has two or more distributed portions, the two or more portions may communicate via one or more communication links. A processor may include, for example, but is not limited to, hardware, software, firmware, hardwired circuits and/or any combination thereof. In some embodiments, one or more portions of the processor 340 may be implemented in the form of one or more ASICs. The processor 340 may or may not execute one or more computer programs that have one or more subroutines, or modules, each of which may include a plurality of instructions, and may or may not perform tasks in addition to those described herein. If a computer program includes more than one module, the modules may be parts of one computer program, or may be parts of separate computer programs. As used herein, the term module is not limited to a subroutine but rather may include, for example, hardware, software, firmware, hardwired circuits and/or any combination thereof.

In some embodiments, the processor 340 includes circuitry to facilitate wired, wireless and/or optical communication to and/or from the digital camera apparatus. Such circuitry may have any form. In some embodiments, one or more portions of such circuitry is disposed in the same integrated circuit as the other portions of the processor 340. In some embodiments, one or more portions of such circuitry are in a discrete form, separate from the integrated circuit for the other portions of the processor 340 or portions thereof.

In some embodiments, the processor 340 comprises at least one processing unit connected to a memory system via an interconnection mechanism (e.g., a data bus). A memory system may include a computer-readable and writeable recording medium. The medium may or may not be non-volatile. Examples of non-volatile medium include, but are not limited to, magnetic disk, magnetic tape, non-volatile optical media and non-volatile integrated circuits (e.g., read only memory and flash memory). A disk may be removable, e.g., known as a floppy disk, or permanent, e.g., known as a hard drive. Examples of volatile memory include but are not limited to random access memory, e.g., dynamic random access memory (DRAM) or static random access memory (SRAM), which may or may not be of a type that uses one or more integrated circuits to store information.

If the processor 340 executes one or more computer programs, the one or more computer programs may be implemented as a computer program product tangibly embodied in a machine-readable storage medium or device for execution by a computer. Further, if the processor 340 is a computer, such computer is not limited to a particular computer platform, particular processor, or programming language. Computer programming languages may include but are not limited to procedural programming languages, object oriented programming languages, and combinations thereof.

A computer may or may not execute a program called an operating system, which may or may not control the execution of other computer programs and provides scheduling, debugging, input/output control, accounting, compilation, storage assignment, data management, communication control, and/or related services. A computer may for example be programmable using a computer language such as C, C++, Java or other language, such as a scripting language or even assembly language. The computer system may also be specially programmed, special purpose hardware, or an application specific integrated circuit (ASIC).

Example output devices include, but are not limited to, displays (e.g., cathode ray tube (CRT) devices, liquid crystal displays (LCD), plasma displays and other video output devices), printers, communication devices for example modems, storage devices such as a disk or tape and audio output, and devices that produce output on light transmitting films or similar substrates. An output device may include one or more interfaces to facilitate communication with the output device. The interface may be any type of interface, e.g., proprietary or not proprietary, standard (for example, universal serial bus (USB) or micro USB) or custom or any combination thereof.

Example input devices include but are not limited to buttons, knobs, switches, keyboards, keypads, track ball, mouse, pen and tablet, light pen, touch screens, and data input devices such as audio and video capture devices. An output device may include one or more interfaces to facilitate communication with the output device. The interface may be any type of interface, for example, but not limited to, proprietary or not proprietary, standard (for example, universal serial bus (USB) or micro USB) or custom or any combination thereof.

In addition, as stated above, it should be understood that the features disclosed herein can be used in any combination.

Input signals to the processor 340 may have any form and may be supplied from any source, for example, but not limited to, one or more sources within the digital camera apparatus (e.g., the user peripheral interface on the digital camera) and/or one or more other devices. For example, in some embodiments, the peripheral user interface includes one or more input devices by which a user can indicate one or more preferences in regard to one or more desired operating modes (e.g., resolution, manual exposure control) and the peripheral user interface generates one or more signals indicative of such preference or preferences. In some embodiments, one or more portions of the processor 340 generates one or more signals indicative of one or more desired operating mode. In some embodiments, the one or more portions of the processor 340 generates one or more of such signals in response to one or more inputs from the peripheral user interface.

In some embodiments, one or more portions of the digital camera apparatus include circuitry to facilitate wired, wireless and/or optical communication to and/or from the subsystem and/or within the subsystem. Such circuitry may have any form. In some embodiments, one or more portions of such circuitry may be part of the processor 340 and may be disposed in the same integrated circuit as one or more other portions of the processor 340 and/or may be in a discrete form, separate from the processor 340 or other portions thereof.

In some embodiments, the digital camera apparatus includes a memory section that is supplied with and/or stores one, some or all of the images and/or other information generated or used by the digital camera apparatus and/or or any other information from any source and desired to be stored for any duration. The memory section may supply one or more of such images and/or such other information to one or more other devices and/or to one or more portions of the processor 340, for example, to be further processed and/or to be supplied to one or more other devices. The memory section may be, for example, part of the processor 340 and/or coupled to one or more portions of the processor 340 via one or more communication links. In some embodiments, the memory section is also coupled to one or more other devices via one or more communication links. In such embodiments, the memory section may supply one or more of the stored images and/or other information to one or more of the one or more other devices, directly (i.e., without passing through the any other portion of the processor 340) via one or more of the one or more communication links, although this is not required.

FIG. 111A shows another embodiment of the channel processor. In this embodiment, the channel processor includes a double sampler, an analog to digital converter, a black level clamp and a deviant pixel correction.

An image may be represented as a plurality of picture element (pixel) magnitudes. Each pixel magnitude indicates the picture intensity (relative darkness or relative lightness) at an associated location of the image. A relatively low pixel magnitude indicates a relatively low picture intensity (i.e., relatively dark location). Conversely, a relatively high pixel magnitude indicates a relatively high picture intensity (i.e., relatively light location). The pixel magnitudes are selected from a range that depends on the resolution of the sensor.

FIG. 111B is a graphical representation of a neighborhood of pixel values. FIG. 111B further illustrates a plurality of prescribed spatial directions, namely, a first prescribed spatial direction (e.g., the horizontal direction), a second prescribed spatial direction (e.g., the vertical direction), a third prescribed spatial direction (e.g., a first diagonal direction), and a fourth prescribed spatial direction (e.g., a second diagonal direction). The pixel P22 is adjacent to pixels P12, P21, P32 and P23. The pixel P22 is offset in the horizontal direction from the pixel P32. The pixel P22 is offset in the vertical direction from the pixel P23. The pixel P22 is offset in the first diagonal direction from the pixel P11. The pixel P22 is offset in the second diagonal direction from the pixel P31.

The double sampler determines the amount by which the value of each pixel changes during the exposure period, thereby in effect providing an estimate of the amount of light received by each pixel during an exposure period. For example, a pixel may have a first value, Vstart, prior to an exposure period. The first value, Vstart, may or may not be equal to zero. The same pixel may have a second value, Vend, after the exposure period. The difference between the first and second values, i.e., Vend-Vstart, is indicative of the amount of light received by the pixel.

FIG. 111C shows a flowchart of operations employed in this embodiment of double sampling.

The value of a plurality of pixels in a sensor array are reset to an initial state prior to the beginning of an exposure period. The value of each pixel is sampled prior to the start of an exposure period. The value of each pixel is sampled after the exposure period and signals indicative thereof are supplied to the double sampler. The double sampler generates a signal for each pixel, indicative of the difference between the start and end values for such pixel.

As stated above, the magnitude of each difference signal is indicative of the amount of light received at a respective location of the sensor array. A difference signal with a relatively low magnitude indicates that a relatively low amount of light is received at the respective location of the sensor array. A difference signal with a relatively high magnitude indicates that a relatively high amount of light is received at the respective location of the sensor array.

Referring again to FIG. 111A, the difference signals generated by the double sampler are supplied to an analog to digital converter, which samples each of such signals and generates a sequence of multi-bit digital signals in response thereto, each multi-bit digital signal being indicative of a respective one of the difference signals.

The multi-bit digital signals are supplied to a black level clamp, which compensates for drift in the sensor array of the camera channel.

The difference signals should have a magnitude equal to zero unless the pixels are exposed to light. However, due to imperfection in the sensor (e.g., leakage currents) the value of the pixels may change (e.g., increase) even without exposure to light. For example, a pixel may have a first value, Vstart, prior to an exposure period. The same pixel may have a second value, Vend, after the exposure period. If drift is present, the second value may not be equal to the first value, even if the pixel was not exposed to light. The black level clamp compensates for such drift.

To accomplish this, in some embodiments, a permanent cover is applied over one or more portions (e.g., one or more rows and/or one or more columns) of the sensor array to prevent light from reaching such portions. The cover is applied, for example, during manufacture of the sensor array. The difference signals for the pixels in the covered portion(s) can be used in estimating the magnitude (and direction) of the drift in the sensor array.

In this embodiment, the black level clamp generates a reference value (which represents an estimate of the drift within the sensor array) having a magnitude equal to the average of the difference signals for the pixels in the covered portion(s). The black level clamp thereafter compensates for the estimated drift by generating a compensated difference signal for each of the pixels in the uncovered portions, each compensated difference signal having a magnitude equal to the magnitude of the respective uncompensated difference signal reduced by the magnitude of the reference value (which as stated above, represents an estimate of the drift).

The output of the black level clamp is supplied to the deviant pixel identifier, which seeks to identify defective pixels and help reduce the effects thereof.

In this embodiment, a defective pixel is defined as pixel for which one or more values, difference signal and/or compensated difference signal fails to meet one or more criteria, in which case one or more actions are then taken to help reduce the effects of such pixel. In this embodiment, for example, a pixel is defective if the magnitude of the compensated difference signal for the pixel is outside of a range of reference values (i.e., less than a first reference value or greater than a second reference value). The range of reference values may be a predetermined, adaptively determined and/or any combination thereof.

If the magnitude of the compensated difference signal is outside such range, then the magnitude of the compensated difference signal is set equal to a value that is based, at least in part, on the compensated difference signals for one or more pixels adjacent to the defective pixel, for example, an average of the pixel offset in the positive x direction and the pixel offset in the negative x direction.

FIG. 111D shows a flowchart of operations employed in this embodiment of the defective pixel identifier. The magnitude of each compensated difference signal is compared to a range of reference values. If a magnitude of a compensated difference signal is outside of the range of reference values, then the pixel is defective and the magnitude of difference signal is set to a value in accordance with the methodology set forth above.

FIG. 111E shows another embodiment of the image pipeline.

In this embodiment, the image pipeline includes an image plane integrator, image plane alignment and stitching, exposure control, focus control, zoom control, gamma correction, color correction, edge enhancement, chroma noise reduction, white balance, color enhancement, image scaling and color space conversion.

The output of a channel processor is a data set that represents a compensated version of the image captured by the camera channel. The data set may be output as a data stream. For example, the output from the channel processor for camera channel A represents a compensated version of the image captured by camera channel A and may be in the form of a data stream $P_{A1}, P_{A2}, \ldots P_{An}$. The output from the channel processor for camera channel B represents a compensated version of the image captured by camera channel B and may be in the form of a data stream $P_{B1}, P_{B2}, \ldots P_{Bn}$. The output from the channel processor for camera channel C represents a compensated version of the image captured by camera channel C and is in the form of a data stream $P_{C1}, P_{C2}, \ldots P_{Cn}$. The output from the channel processor for camera channel D represents a compensated version of the image captured by camera channel D and is in the form of a data stream $P_{D1}, P_{D2}, \ldots P_{Dn}$.

The image plane integrator receives the data from each of the two or more channel processors and combines such data into a single data set, e.g., $P_{A1}, P_{B1}, P_{C1}, P_{D1}, P_{A2}, P_{B2}, P_{C2}, P_{D2}, P_{A3}, P_{B3}, P_{C3}, P_{D3}, P_{An}, P_{Bn}, P_{Cn}, P_{Dn}$. FIG. 111F shows one embodiment of the image plane integrator.

In this embodiment, the image plane integrator includes a multiplexer and a multi-phase phase clock.

The multiplexer has a plurality of inputs in0, in1, in2, in3, each of which is adapted to receive a stream (or sequence) of multi-bit digital signals. The data stream of multi-bit signals, $P_{A1}, P_{A2}, \ldots P_{An}$, from the channel processor for camera channel A is supplied to input in0. The data stream $P_{B1}, P_{B2}, \ldots P_{Bn}$ from the channel processor for camera channel B is supplied to input in1. The data stream $P_{C1}, P_{C2}, \ldots P_{Cn}$ from the channel processor for camera channel C is supplied to input in2. The data stream $P_{D1}, P_{D2}, \ldots P_{Dn}$ from the channel processor for camera channel D is supplied to the input in3. The multiplexer has an output, out, that supplies a multi-bit output signal. Note that in some embodiments, the multiplexer comprises of a plurality of four input multiplexers each of which is one bit wide.

The multi-phase clock has an input enable that receives a signal. The multi-phase clock has outputs, c0, c1, which are supplied to the inputs s0, s1 of the multiplexer. In this embodiment, the multi-phase clock has four phases, shown in FIG. 111G.

The operation of the image plane integrator is as follows. The integrator has two states. One state is a wait state. The other state is a multiplexing state. Selection of the operating state is controlled by the logic state of the enable signal supplied to the multi-phase clock. The multiplexing state has four phases, which correspond to the four phases of the multi-phase clock. In phase 0, neither of the clock signals c1, c0 are asserted causing the multiplexer to output one of the multi-bit signals from the A camera channel, e.g., $P_{m}$. In phase 1, clock signals c0, is asserted causing the multiplexer to output one of the multi-bit signals from the B camera channel, e.g., $P_{B1}$. In phase 2, clock signal c1, is asserted causing the multiplexer to output one of the multi-bit signals from the C camera channel, e.g., $P_{C1}$. In phase 0, both of the clock signals c1, c0 are asserted causing the multiplexer to output one of the multi-bit signals from the D camera channel, e.g., $P_{D1}$.

Thereafter, the clock returns to phase 0, causing the multiplexer to output another one of the multi-bit signals from the A camera channel, e.g., $P_{A2}$. Thereafter, in phase 1, the multiplexer outputs another one of the multi-bit signals from the B camera channel, e.g., $P_{B2}$. In phase 2, the multiplexer outputs another one of the multi-bit signals from the C camera channel, e.g., $P_{C2}$. In phase 3, the multiplexer outputs another one of the multi-bit signals from the D camera channel, e.g., $P_{D2}$.

This operation is repeated until the multiplexer has output the last multi-bit signal from each of the camera channels, e.g., $P_{An}, P_{Bn}, P_{Cn}$, and $P_{Dn}$.

The output of the image plane integrator is supplied to the image planes alignment and stitching portion. The purpose of this portion is to determine how the images should be aligned so that a target captured by different camera channels is aligned at the same position within the respective images e.g., to make sure that a target captured by different camera channels appears at the same place within each of the camera channel images).

For example, our eyes are good example of 2 channel image plane system. When we hold a pencil about 1 ft in front of our eyes, close our left eye and use our right eye to see the pencil, we will see the pencil at a particular location that is different than when we close our right eye and use the left eye to see the pencil. This is because our brain only receives 1 image at a time and couldn't correlate it with the other image from the other eye that was received at different time. When we open both of our eyes and try to see the pencil again (hold it at the same location as previous experiment), our brain will receive the 2 images of the pencil at the same time. In this case, our brain will automatically try to align the 2 images of the same pencil and we will perceive a single image of a pencil in front of us, except this one becomes a stereo image.

In the case of the digital camera apparatus, the automatic image planes alignment and stitching portion determines how the 2, 3, 4, 5 or more image channels should be aligned.

FIGS. 111H-111J are explanatory views showing representations of images generated by three camera channels, e.g., camera channels 350A, 350B, 350C, respectively, arranged in a triangular constellation in accordance with one embodiment of the present invention and employed in one embodiment of the automatic image planes alignment and stitching portion.

Each image has a plurality of pixels arranged in a plurality of rows. More particularly, the image for a first camera channel, e.g., camera channel 350A, has rows 1-n. The image for a second camera channel, e.g., camera channel 350B, has rows 1-n. The image for a third camera channel, e.g., camera channel 350C, has rows 1-n. A reference line identifies a horizontal reference point (e.g., midpoint) in the image for the first camera channel. A reference line identifies a horizontal reference point (e.g., midpoint) in the image for the second camera channel. A reference line identifies a horizontal reference point (e.g., midpoint) in the image for the third camera channel.

An object appears in each of the three images. In this embodiment, the object appears at a different position in each image, for example as a result of spatial offset between the camera channels. For example, the object has two edges that intersect at an apex. In the image for the first camera channel, e.g., camera channel 350A, the apex appears in row 2 and in line with the horizontal reference point. In the image for the second camera channel, e.g., camera channel 350B, the apex appears in row 3 and to the left of the horizontal reference point. In the image for the third camera channel, e.g., camera channel 350C, the apex appears in row 3 and to the right of the horizontal reference point.

FIGS. 111K-111Q are explanatory views showing a representation of a process carried out by the automatic image alignment portion for the system with three camera channels, in accordance with one embodiment of the present invention. In this embodiment, the automatic image alignment performs vertical and horizontal alignment.

In that regard, vertical alignment may be performed first, although any order could be employed. The portion uses one of the images (e.g., the image for the first camera channel, e.g., camera channel 350A) as a reference image for comparison with the other images. The automatic image alignment portion may initially compare row 1 of the reference image to row 1 of the other images and determines whether such rows of such images defines a similar edge feature. In this example, none of the images have an edge feature in the first row and thus there is not a similar edge feature in each of such rows. As a result, the portion outputs data corresponding to such rows (i.e., row 1 of each of the three images) to the image scaling portion. In the next comparison operation, the automatic image alignment portion compares row 1 of the first image to row 2 of the other images. In this example, none of such rows have an edge feature and thus there is not a similar edge feature in each of such rows. As a result, the portion outputs data corresponding to such rows (i.e., row 1 of the first image and row 2 of each of the other images) to the image scaling portion. In the next comparison operation, the automatic image alignment portion compares row 1 of the first image to row 3 of the other images. Although row 3 of the images for the second and third channels each have an edge feature, row 1 the image for the first channel does not have an edge.

The maximum number of comparison operations that use a particular row (of the reference image) may be selected based on the physical spacing between the camera channels. In this embodiment, for example, a particular row of the reference image is used for three comparison operations at most. Thus, in subsequent comparison operations, the automatic image alignment uses row 2 of the image for the first camera channel, rather than row 1 of the image for the first camera channel. In the next comparison operation, the automatic image alignment portion compares row 2 of the first image to row 2 of the other images. Although row 2 of the image for the first camera channel has an edge, row 2 of the other camera channels does not have any edge. In the next comparison operation, the automatic image alignment portion compares row 2 of the first image to row 3 of the other images. In this example, each of such rows has a similar edge feature. The automatic image alignment portion uses this as an indication of an overlapping image (or portion thereof).

Horizontal alignment is then performed. The portion determines the magnitude and the direction by which the image for the second channel and the image for the third channel should be shifted to align the edge feature in such images with the edge feature in the image for the first camera channel and determines the width of the overlap of the images (e.g., the extent by which the images overlap in the horizontal direction).

In the next comparison operation, the portion compares the next row of the reference image (e.g., row 3) to the next rows of the other images (e.g., row 4) and repeats the operations set forth above to determine a minimum width of the overlap of the images.

The images may be cropped in accordance with the vertical overlap and the minimum horizontal overlap. The output of the automatic image alignment portion is a cropped aligned image, which is supplied to the image scaling portion. In some embodiments, the image scaling portion enlarges (e.g., upsamples) the cropped aligned image to generate an image that has the same size as that of the original images.

Some embodiments employ additional alignment methods, alone or in combination with any of the methods described herein. For example, in some embodiments, the above method is used in cases when the objects are relatively far from the camera and other methods are used when objects are relatively close to the camera.

FIG. 111AF shows a flowchart of operations that may be employed in the alignment portion, in accordance with another embodiment of the present invention. This embodiment of alignment may be used for example, for images that include one or more close objects.

In this embodiment, edges are extracted at one of the planes. Neighborhood pixels (kernel) are defined for each edge pixel. Thereafter, the kernels of each edge pixel may be matched with pixels in the other color planes, for example, by shifting the kernel towards the direction where the other color plane is relatively located. One or more determinations may be made as to how well the kernels of each edge pixel are matched with pixels in the other color plane. In this regard, a matching cost function may be employed to quantify how well the kernels of each edge pixel are matched with pixels in the other color plane. In the course of determining the best positions of each edge in the next plane, the relative positions of each edge may be checked to confirm that they preserve the same structure after shifting according to the best matches.

After the final positions of the edges are set, the intervals between edges may be mapped, for example, using a linear mapping and/or shifting. Post processing may be performed on the shift amounts to confirm that there are no outliers (no unexpected shifts relative to the surrounding pixels).

The initial matching of the first two color planes may be employed as a reference in regard to how much shift to expect at each pixel in the other color planes.

The above operations may be applied, for example, between the initial color plane and all the other color planes.

It should be understood that the automatic image alignment portion is not limited to the embodiment above. For example, in some embodiments, fewer than three or more than three camera channels are aligned. Moreover, any other technique may be employed to align two or more images.

The alignment carried out by the automatic image alignment portion may be predetermined, processor controlled and/or user controlled. In some embodiments, the automatic alignment portion has the ability to align fewer than all of the camera channels (e.g., any two or more). In such embodiments, one or more signals may be supplied to the automatic image alignment portion to indicate the camera channels to align, and the automatic image alignment portion may align the indicated camera channels in response, at least in part, to such one or more signals. The one or more signals, may be predetermined or adaptively determined, processor controlled and/or user controlled.

It should also be understood that automatic image alignment may not be required in every embodiment.

The output of the image planes alignment and stitching is supplied to the exposure control, the purpose of which is to help make sure that the captured images are not over exposed or under exposed. An over exposed image is too bright. An under exposed image is too dark.

FIG. 111R shows one embodiment of the automatic exposure control. In some embodiments, the auto exposure control generates a brightness value indicative of the brightness of the image supplied thereto. The auto exposure control compares the generated brightness value against one or more reference values, e.g., two values where the first value is indicative of a minimum desired brightness and the second value is indicative of a maximum desired brightness. The minimum and/or maximum brightness may be predetermined, processor controlled and/or user controlled. In some embodiments, for example, the minimum desired brightness and maximum desired brightness values are supplied by the user so that images provided by the digital camera apparatus will not be too bright or too dark, in the opinion of the user.

If the brightness value is within the minimum desired brightness and maximum desired brightness (i.e., greater than or equal to the minimum and less than or equal to the maximum), then the auto exposure control does not change the exposure time. If the brightness value is less than the minimum desired brightness value, the auto exposure control supplies control signals that cause the exposure time to increase until the brightness is greater than or equal to the minimum desired brightness. If the brightness value is greater than the maximum brightness value, then the auto exposure control supplies control signals that cause the exposure time to decrease until the brightness is less than or equal to the maximum brightness value. After the brightness value is within the minimum and maximum brightness values (i.e., greater than or equal to the minimum and less than or equal to the maximum), the auto exposure control supplies a signal that enables a capture mode, wherein the user is able to press the capture button to initiate capture of an image and the setting for the exposure time causes an exposure time that results in a brightness level (for the captured image) that is within the user preferred range. In some embodiments, the digital camera apparatus provides the user with the ability to manually adjust the exposure time directly, similar to adjusting an iris on a conventional film camera.

In some embodiments, the digital camera apparatus employs relative movement between an optics portion (or one or more portions thereof) and a sensor array (or one or more portions thereof), to provide a mechanical iris for use in auto exposure control and/or manual exposure control. As stated above, such movement may be provided for example using actuators, e.g., MEMS actuators and by applying appropriate control signal(s) to one or more of the actuators to cause the one or more actuators to move, expand and/or contract to thereby move the associated optics portion.

As with each of the embodiments disclosed herein, the above embodiments may be employed alone or in combination with one or more other embodiments disclosed herein, or portions thereof.

In addition, it should also be understood that the embodiments disclosed herein may also be used in combination with one or more other methods and/or apparatus, now known or later developed.

As mentioned above, the inventions described and illustrated in the U.S. Provisional Application Ser. No. 60/695, 946, entitled "Method and Apparatus for use in Camera and Systems Employing Same", filed Jul. 1, 2005, may be employed in conjunction with the present inventions. For the sake of brevity, those discussions will not be repeated. It is expressly noted that the entire contents of the aforementioned U.S. Provisional Application, including, for example, the features, attributes, alternatives, materials, techniques and/or advantages of all of the inventions/embodiments thereof, are incorporated by reference herein.

The output of the exposure control is supplied to the Auto/Manual focus control portion, which helps make the objects (e.g., the target(s) of an image) that are within the field of view appear in focus. Generally, objects in an image appear blurred if the image is over focus or under focus. The image may have peak sharpness when the lens is in focus point. In some embodiments, the auto focus control portion detect the amount of blurriness of an image, e.g., while the digital camera apparatus is in a preview mode, and provides control signals that cause the lens assembly to move back and forth, accordingly, until the auto focus control portion determines that the lens is at the focus point. Many of the digital still cameras available today utilize such type of mechanism.

In some embodiments, the auto/manual focus portion is adapted to help increase the Depth of Focus of the digital camera apparatus. Depth of Focus can be viewed as a measure of how much an object that is in focus within a field of view can be moved forward or backward before the object becomes "out of focus". Depth of Focus is based at least in part on the lens employed in the optical portion. Some embodiments employ one or more optical filters in combination with a one or more algorithms to increase the Depth of Focus. The optical filter or filters may be conventional optical filters for increasing Depth of Focus and may be disposed superjacent (on or above) the top of the lens, although this is not required. Any type of optical filter and positioning thereof may be employed. Similarly, the algorithm or algorithms may be a conventional wave front encoding algorithm, although this is not required. Any type of algorithm or algorithms may be employed. In some embodiments, the auto focus mechanism increases the Depth of Focus by a factor of ten (e.g., the Depth of Focus provided with the auto focus mechanism is ten time as large as the Depth of Focus of the lens alone (without the auto focus mechanism), to make the system less sensitive or insensitive to the position of objects within a field of view. In some embodiments, the auto focus mechanism increases the Depth of Focus by a factor of twenty or more (e.g., the Depth of Focus provided with the auto focus mechanism is twenty time as large as the Depth of Focus of the lens alone (without the auto focus mechanism), to further decrease the sensitivity of the position of the object within a field of view and/or to make the system insensitive to the position of objects within a field of view.

In some embodiments, the digital camera apparatus may provide the user with the ability to manually adjust the focus.

In some embodiments, the digital camera apparatus employs relative movement between an optics portion (or one or more portions thereof) and a sensor array (or one or more portions thereof), to help provide an auto focus and/or manual focus. As stated above, such movement may be provided for example using actuators, e.g., MEMS actuators and by applying appropriate control signal(s) to one or more of the actuators to cause the one or more actuators to move, expand and/or contract to thereby move the associated optics portion. (See, for example, U.S. Provisional Application Ser. No. 60/695, 946, entitled "Method and Apparatus for use in Camera and Systems Employing Same", filed Jul. 1, 2005, which is again incorporated by reference).

The auto/manual focus is not limited to the above embodiments. Indeed, any other type of auto/manual focus now known or later developed may be employed.

In addition, as with each of the embodiments disclosed herein, the above embodiments may be employed alone or in combination with one or more other embodiments disclosed herein, or portions thereof.

It should be understood that each of the embodiments disclosed herein may also be used in combination with one or more other methods and/or apparatus, now known or later developed.

It should also be understood that auto focus and manual focus are not required. Further, the focus portion may provide auto focus without regard to whether the ability to manual focus is provided. Similarly, the focus portion may provide manual focus without regard to whether the ability to auto focus is provided.

The output of the auto focus control is supplied to the zoom controller.

FIG. 111S is schematic block diagram of one embodiment of the zoom controller, which may for example, help provide "optical zoom" and/or "digital zoom" capability. The optical zoom may be any type of optical zoom now know or later developed. An example of conventional optical zoom (which moves the one or more lens elements backward and forward) is described herein above. Similarly, the digital zoom may be any type of digital zoom now know or later developed. Note that the determination of the desired zoom window may be predetermined, processor controlled and/or user controlled.

One drawback to digital zooming is a phenomenon referred to as aliasing. For example, when a television anchor on a news channels wears a striped tie, the television image of the striped tie sometimes includes color phenomena that do not appear on the actual tie. Aliasing of this type is common when a system does not have sufficient resolution to accurately represent one or more features of an object within the field of view. In the above example, the television camera does not have enough resolution to accurately capture the striped pattern on the tie.

In some embodiments, the digital camera apparatus employs relative movement between an optics portion (or one or more portions thereof) and a sensor array (or one or more portions thereof), to help increase resolution, thereby helping to reduce and/or minimize aliasing that might otherwise occur as a result of digital zooming. As stated above, such relative movement may be provided for example using actuators, e.g., MEMS actuators and by applying appropriate control signal(s) to one or more of the actuators to cause the one or more actuators to move, expand and/or contract to thereby move the associated optics portion.

In some embodiments, for example, an image is captured and an optics portion is thereafter moved in the x direction by a distance equal to ½ of the width of a pixel. An image is captured with the optics in the new position. The captured images may be combined to increase the effective resolution. In some embodiments, the optics portion is moved in the y direction instead of the x direction. In some other embodiments, the optics portion is moved in the x direction and the y direction and an image is captured at such position. In further embodiments, an image is also captured at all four positions (i.e., no movement, moved in x direction, moved in y direction, moved in x direction and y direction) and the images are then combined to further increase the resolution and further help reduce, minimize and or eliminate aliasing as a result of zooming. For example, by doubling the resolution, it may be possible to zoom in by a factor of two without significantly increasing the aliasing.

In some embodiments, the relative movement is in the form of a ⅓ pixel×⅓ pixel pitch shift in a 3×3 format. In some embodiments, it may be desirable to employ a reduced optical fill factor. In some embodiments, one or more of the sensor arrays provides enough resolution to allow the digital camera apparatus to perform digital zoom without excessive aliasing. For example, if an embodiment requires 640×480 pixels for each every image, with or without zoom, one or more of the sensor arrays may be provided with 1280×1024 pixels. In such embodiment, such sensor portion(s) have enough pixels to provide the digital camera apparatus with the resolution needed to zoom on ¼ of the image and yet still provide the required resolution of 640×480 pixels (e.g., ½×1280=640, ½×1024=512).

FIGS. 111T-111V are explanatory views of a process carried out by a zoom portion of a digital camera apparatus in accordance with one such embodiment of the present invention. In some embodiments, the subsystem may use only ¼ of the pixels (e.g., ½×1280=640, ½×1024=512) when not in zoom mode, or may employ downsampling to reduce the number of pixels. In some other of such embodiments, the digital camera apparatus output all of the pixels, e.g., 1280×1024, even when not in zoom mode. The determination as to how many pixels to use and the number of pixels to output when not in zoom mode may be predetermined, processor controlled and/or user controlled.

The output of the zoom controller is supplied to the gamma correction portion, which helps to map the values received from the camera channels into values that more closely match the dynamic range characteristics of a display device (e.g., a liquid crystal display or cathode ray tube device). The values from the camera channels are based, at least in part, on the dynamic range characteristics of the sensor, which often does not match the dynamic range characteristics of the display device. The mapping provided by gamma correction portion helps to compensate for the mismatch between the dynamic ranges.

FIG. 111W is a graphical representation showing an example of the operation of the gamma correction portion.

FIG. 111X shows one embodiment of the gamma correction portion. In this embodiment, the gamma correction portion employs a conventional transfer function to provide gamma correction. The transfer function may be any type of transfer function including a linear transfer function, a non-linear transfer function and/or combinations thereof. The transfer function may have any suitable form including but not limited to one or more equations, lookup tables and/or combinations thereof. The transfer function may be predetermined, adaptively determined and/or combinations thereof.

The output of the gamma correction portion is supplied to the color correction portion, which helps to map the output of the camera into a form that matches the color preferences of a user.

In this embodiment, the color correction portion generates corrected color values using a correction matrix that contains a plurality of reference values to implement color preferences as follows (The correction matrix contains sets of parameters that are defined, for example, by the user and/or the manufacturer of the digital camera):

$$\left[\begin{pmatrix} Rc \\ Gc \\ Bc \end{pmatrix}\right] = \begin{pmatrix} Rr & Gr & Br \\ Rg & Gg & Bg \\ Rb & Gb & Bb \end{pmatrix} \times \begin{pmatrix} R \\ G \\ B \end{pmatrix}$$

such that:

R corrected=(Rr×R un-corrected)+(Gr×G un-corrected)+(Br×B un-corrected),

G corrected=(Rg×R un-corrected)+(Gg×G un-corrected)+(Bg×B un-corrected), and

B corrected=(Rb×R un-corrected)+(Gb×G un-corrected)+(Bb×B Un-Corrected)

where

Rr is a value indicating the relationship between the output values from the red camera channel and the amount of red light desired from the display device in response thereto, Gr is a value indicating the relationship between the output values from the green camera channel and the amount of red light desired from the display device in response thereto, Br is a value indicating the relationship between the output values from the blue camera channel and the amount of red light desired from the display device in response thereto, Rg is a value indicating the relationship between the output values from the red camera channel and the amount of green light desired from the display device in response thereto, Gg is a value indicating the relationship between the output values from the green camera channel and the amount of green light desired from the display device in response thereto, Bg is a value indicating the relationship between the output values from the blue camera channel and the amount of green light desired from the display device in response thereto, Rb is a value indicating the relationship between the output values from the red camera channel and the amount of blue light desired from the display device in response thereto, Gb is a value indicating the relationship between the output values from the green camera channel and the amount of blue light desired from the display device in response thereto, and Bb is a value indicating the relationship between the output values from the blue camera channel and the amount of blue light desired from the display device in response thereto.

FIG. 111Y shows one embodiment of the color correction portion. In this embodiment, the color correction portion includes a red color correction circuit, a green color correction circuit and a blue color correction circuit.

The red color correction circuit includes three multipliers. The first multiplier receives the red value (e.g., $P_{An}$) and the transfer characteristic Rr and generates a first signal indicative of the product thereof. The second multiplier receives the green value (e.g., $P_{Bn}$) and the transfer characteristic Gr and generates a second signal indicative of the product thereof. The third multiplier receives the green value (e.g., $P_{Cn}$) and the transfer characteristic Br and generates a third signal indicative of the product thereof. The first, second and third signals are supplied to an adder which produces a sum that is indicative of a corrected red value (e.g., P An corrected).

The green color correction circuit includes three multipliers. The first multiplier receives the red value (e.g., $P_{An}$) and the transfer characteristic Rg and generates a first signal indicative of the product thereof. The second multiplier receives the green value (e.g., $P_{Bn}$) and the transfer characteristic Gg and generates a second signal indicative of the product thereof. The third multiplier receives the green value (e.g., $P_{Cn}$) and the transfer characteristic Bg and generates a third signal indicative of the product thereof. The first, second and third signals are supplied to an adder which produces a sum indicative of a corrected green value (e.g., $P_{Bn}$ corrected).

The blue color correction circuit includes three multipliers. The first multiplier receives the red value (e.g., $Pb._{An}$) and the transfer characteristic Rb and generates a first signal indicative of the product thereof. The second multiplier receives the green value (e.g., $P_{Bn}$) and the transfer characteristic Gb and generates a second signal indicative of the product thereof. The third multiplier receives the green value (e.g., $P_{Cn}$) and the transfer characteristic Bb and generates a third signal indicative of the product thereof. The first, second and third signals are supplied to an adder which produces a sum indicative of a corrected blue value (e.g., $P_{Cn}$ corrected).

The output of the color corrector is supplied to the edge enhancer/sharpener, the purpose of which is to help enhance features that may appear in an image.

FIG. 111Z shows one embodiment of the edge enhancer/sharpener. In this embodiment, the edge enhancer/sharpener comprises a high pass filter that is applied to extract the details and edges and apply the extraction information back to the original image.

The output of the edge enhancer/sharpener is supplied to a random noise reduction portion, which reduces random noise in the image. Random noise reduction may include, for example, a linear or non-linear low pass filter with adaptive and edge preserving features. Such noise reduction may look at the local neighborhood of the pixel in consideration. In the vicinity of edges, the low pass filtering may be carried out in the direction of the edge so as to prevent blurring of such edge. Some embodiments may apply an adaptive scheme. For example, a low pass filter (linear and/or non linear) with a neighborhood of relatively large size may be employed for smooth regions. In the vicinity of edges, a low pass filter (linear and/or non-linear) and a neighborhood of smaller size may be employed, for example, so as not to blur such edges.

Other random noise reduction may also be employed, if desired, alone or in combination with one or more embodiments disclosed herein. In some embodiments, random noise reduction is carried out in the channel processor, for example, after deviant pixel correction. Such noise reduction may be in lieu of, or in addition to, any random noise reduction that may be carried out in the image pipeline.

The output of the random noise reduction portion is supplied to the chroma noise reduction portion, the purpose of which is to reduce color noise.

FIG. 111AA shows one embodiment of the chroma noise reduction portion. In this embodiment, the chroma noise reduction portion includes an RGB to YUV converter, first and second low pass filters and a YUV to RGB converter. The output of the random noise reduction portion, which is a signal in the form of RGB values, is supplied to the RGB to YUV converter, which generates a sequence of YUV values in response thereto, each YUV value being indicative of a respective one of the RGB values.

The Y values or components (which indicate the brightness of an image) are supplied to the YUV to RGB converter. The U and V values or components (which indicate the color components of the image) are supplied to the first and second low pass filters, respectively, which reduce the color noise on the U and V components, respectively. The output of the filters are supplied to the YUV to RGB converter, which generates a sequence of RGB values in response thereto, each RGB value being indicative of a respective one of the YUV values.

The output of the chroma noise reduction portion is supplied to the Auto/Manual white balance portion, the purpose of which is to help make sure that a white colored target appears as a white colored target, rather than reddish, greenish, or bluish.

FIG. 111AB is an explanatory view showing a representation of a process carried out by the white balance portion in one embodiment. More particularly, FIG. 111AB depicts a rectangular coordinate plane having an R/G axis and a B/G axis. The rectangular coordinate plane has three regions, i.e., a redish region, a white region and a bluish region. A first reference line defines a color temperature that separates the redish region from the white region. A second reference line defines a color temperature that separates the white region from the bluish region. The first reference line is disposed, for example at color temperature of 4700 Kelvin. The second reference line is disposed, for example at color temperature of 7000 Kelvin.

In this embodiment, the automatic white balance portion determines the positions, in the rectangular coordinate plane defined by the R/G axis and the B/G axis, of a plurality of pixels that define the original image. The positions of the plurality of pixels are treated as representing a cluster of points in the rectangular coordinate plane. The automatic white balance portion determines a center of the cluster of points and changes that could be applied to the R, G, B, pixel values of the original image to effectively translate the center of the cluster into the white image region of the coordinate plane, e.g., to a color temperature of 6500 Kelvin. The output of the automatic white balance portion is an output image where a pixel value in the output image is based on the corresponding pixel value of the original image and the changes to the R, G, B pixel values that had been determined could be used to translate the center of the cluster for the original image into the white region, such that the center of a cluster for the output image is disposed in the white image region of the coordinate plane, e.g., a color temperature of 6500 Kelvin.

The desired color temperature may be predetermined, processor controlled and/or user controlled. In some embodiments, for example, a reference value indicative of a desired color temperature is supplied by the user so that images provided by the digital camera apparatus will have color temperature characteristics desired by the user. In such embodiments, manual white balance may be performed by determining the changes that could be applied to translate the center of the cluster for the original image to a color temperature corresponding to a reference value provided by the user.

The white balance strategy may use, for example, one or more conventional color enhancement algorithms, now know or later developed.

It should be understood that the white balance portion is not limited to the techniques set forth above. Indeed, the white balance portion may employ any white balance technique now known or later developed. It should also be understood that color white balance is not required. The output of the white balance portion is supplied to the Auto/Manual color enhancement portion.

FIG. 111AC is a block diagram of one embodiment of the color enhancement portion, in accordance with one embodiment. In this embodiment, the color enhancement portion adjusts the brightness, contrast and/or saturation to enhance the color appearance in accordance with one or more enhancement strategies. This process is similar in some respects to adjusting color settings of a TV or computer monitor. Some embodiments may also adjust the hue. The enhancement strategy may use, for example, one or more conventional color enhancement algorithms, now know or later developed.

Referring to FIG. 111AC, data indicative of the image is supplied to the brightness enhancement portion, which further receives an adjustment value and generates output data indicative of an image adjusted for brightness in accordance therewith. In this embodiment, each pixel value in the output image is equal to the sum of an adjustment value and a corresponding pixel in the input image. The adjustment value may be predetermined, processor controlled and/or user controlled. In some embodiments, for example, the adjustment value is supplied by the user so that images provided by the digital camera apparatus will have the characteristics desired by the user. In some embodiments, an adjustment value having a positive magnitude makes the output image appear brighter than the input image. An adjustment value having a negative magnitude may make the output image appear darker than the input image.

The output of the brightness enhancement portion is supplied to the contrast enhancement portion, which further receives an adjustment value and generates an output image adjusted for contrast in accordance therewith. In this embodiment, contrast adjustment can be viewed as "stretching" the distance between dark (e.g., indicated by a pixel value having a small magnitude) and light (e.g., indicated by a pixel value having a large magnitude). An adjustment value having a positive magnitude makes dark areas in the input image appear darker in the output image and makes light areas in the input image appear lighter in the output image. An adjustment value having a negative magnitude may have the opposite effect. One or more conventional algorithms, for example, now know or later developed may be employed. The adjustment value may be predetermined, processor controlled and/or user controlled. In some embodiments, for example, the adjustment value is supplied by the user so that images provided by the digital camera apparatus will have the characteristics desired by the user.

The output of the contrast enhancement portion is supplied to the saturation enhancement portion, which further receives an adjustment value and generates an output image adjusted for saturation in accordance therewith. In this embodiment, saturation adjustment can be viewed as "stretching" the distance between R, G, B, components of a pixel (which is similar in some respects to contrast adjustment). An adjustment value having a positive magnitude makes dark areas in the input image appear darker in the output image and makes light areas in the input image appear lighter in the output image. An adjustment value having a negative magnitude may have the opposite effect. One or more conventional techniques, for example, now know or later developed may be employed. The technique may employ a color correction matrix, for example, similar to that employed by the color correction portion described hereinabove. The adjustment value may be predetermined, processor controlled and/or user controlled. In some embodiments, for example, the adjustment value is supplied by the user so that images provided by the digital camera apparatus will have the characteristics desired by the user.

It should be understood that the color enhancement portion is not limited to the enhancement techniques set forth above. Indeed, the color enhancement portion may employ any enhancement technique now known or later developed. It should also be understood that color enhancement is not required.

The output of the Auto/Manual color enhancement portion is supplied to the image scaling portion, the purpose of which is to reduce or enlarge the image, for example, by removing or adding pixels to adjust the size of an image.

The image scaling portion receives data, indicative of an imaged to be scaled (e.g., enlarged or reduced). The magnitude of the scaling may be predetermined or preset, processor controlled or manually controlled. In some embodiments, a signal indicative of the magnitude of the scaling, if any, is received. If the signal indicative of the desired scaling magnitude indicates that the image is to be enlarged, then the scaling portion performs upscaling. If the signal indicative of the desired scaling magnitude indicates that the image is to be reduced, then the scaling portion performs downscaling.

FIG. 111AD-111AE are a schematic block diagram and an explanatory view, showing a representation of upscaling, respectively, in accordance with one embodiment. More particularly, FIG. 111AE depicts a portion of an image to be enlarged and a portion of the image to be formed therefrom. In this example, the portion of the image to be enlarged includes nine pixels, indicated for purposes of explanation as $P_{11}$-$P_{33}$, shown arranged in an array having three rows and three columns. The portion of the image to be formed therefrom includes twenty five pixels, indicated for purposes of explanation as A-Y, shown arranged in an array having five rows and five columns. (Note that the portion of the image to be formed could alternatively be represented as $P_{11}$-$P_{55}$.)

In this embodiment, the image scaling portion employs an upscaling strategy in which the pixel values at the intersection of an odd numbered column and an odd numbered row, i.e., A, C, E, K, M, O, U, W and Y, are taken from the pixel values in the image to be enlarged. For example, $A = P_{11}$ $C = P_{21}$ $E = P_{31}$ $K = P_{12}$ $M = P_{22}$ $O = P_{32}$ $U = P_{13}$ $W = P_{23}$ $Y = P_{33}$ The other pixel values, i.e., pixel values disposed in either an even numbered column or an even numbered row, i.e., B, D, F, G, H, I, J, L, N, P, Q, R, S, T, V and X, are generated by interpolation. Each pixel value is generated based on two or more adjacent pixel values, for example, $B = (A+C)/2$ $D = (C+E)/2$ $F = (A+K)/2$ $H = (C+M)/2$ $J = (E+O)/2$ $L = (K+M)/2$ $N = (M+O)/2$ $P = (K+U)/2$ $R = (M+W)/2$ $T = (O+Y)/2$ $V = (U+W)/2$ $X = (W+Y)/2$ $G = (B+L)/2$ $I = (D+N)/2$ $Q = (L+V)/2$ $S = (N+X)/2$ In some embodiments, upscaling increases the number of pixels from 640×480 pixels to 1280×1024 pixels, however, any magnitude of upscaling may be employed. In some embodiments, the digital camera apparatus provides the user with the ability to determine whether upscaling is to be performed and if so, the magnitude of the upscaling.

In some embodiments, the scaling portion employ one or more of the techniques described herein for the zoom controller, with or without cropping.

It should be understood that the scaling portion is not limited to the upscaling strategy set forth above. Indeed, the scaling portion may employ any upscaling technique now known or later developed. It should also be understood that upscaling is not required.

The scaling portion may have the ability to downscale, without regard to whether scaling portion has the ability to upscale. In some embodiments, downscaling decreases the number of pixels from 1280×1024 pixels to 640×480 pixels, however, any magnitude of downscaling may be employed. In some embodiments, the digital camera apparatus provides the user with the ability to determine whether downscaling is to be performed and if so, the magnitude of the downscaling.

It should be understood that any downscaling technique now known or later developed may be employed. It should also be understood that downscaling is not required.

The output of the image scaling portion is supplied to the color space conversion portion, the purpose of which is to convert color format from RGB to YCrCB or YUV for compression. In this embodiment, the conversion is accomplished using the following equations:

$Y = (0.257*R) + (0.504*G) + (0.098*B) + 16$ $Cr = V = (0.439*R) - (0.368*G) - (0.071*B) + 128$ $Cb = U = -(0.148*R) - (0.291*G) + (0.439*B) + 128$

The output of the color space conversion portion is supplied to the image compression portion of the post processor. The purpose of the image compression portion is to reduce the size of image file. This may be accomplished, or example, using an off the shelf JPEG, MPEG and/or WMV compression algorithm available from Joint Photographic Expert Group, Motion Expert Group and Microsoft Corporation.

The output of the image compression portion is supplied to the image transmission formatter, the purpose of which is to format the image data stream to comply with YUV422, RGB565, etc format both in bi-directional parallel or serial 8-16 bit interface.

FIG. 112 shows another embodiment of the channel processor. In this embodiment, the double sampler receives the output of the analog to digital converter instead of the output of the sensor array FIGS. 113 and 114A show another embodiment of the channel processor and image pipeline respectively. In this embodiment, the deviant pixel corrector is disposed in the image pipeline rather than the channel processor. In this embodiment, the deviant pixel corrector receives the output of the image plane alignment and stitching rather than the output of the black level clamp.

FIG. 114B is a block diagram of an image pipeline in accordance with another embodiment of the present invention;

FIG. 114C is a schematic block diagram of a chroma noise reduction portion that may be employed, for example, in the image pipeline of FIG. 114B. In this embodiment, the U and V values or components (which indicate the color components of the image) are supplied to the first and second low pass filters, respectively, which reduce the color noise on the U and V components, respectively.

It should be understood that the channel processor, the image pipeline and/or the post processor may have any configuration. For example, in some other embodiments, the image pipeline employs fewer than all of the portions shown in FIGS. 110C, 110E and/or FIG. 114A, with or without other portions, now known or later developed, and in any suitable order.

Parallax

If the digital camera apparatus has more than one camera channel, the camera channels will necessarily be spatially offset from one another (albeit, potentially by a small distance). This spatial offset can introduce a parallax between the camera channels, e.g., an apparent change in position of an object as a result of changing the position from which the object is viewed.

FIGS. 115A-115E show an example of parallax in a digital camera apparatus. More particularly, FIG. 115A shows an object (i.e., a lightning bolt) and a digital camera apparatus having two camera channels spatially offset by a distance. The first camera channel has a sensor and a first field of view centered about a first axis. The second camera channel has a sensor and a second field of view that is centered about a second axis and spatially offset from the first field of view. The offset between the fields of view causes the position of the object within the first field of view to differ from the position of the object within the second field of view.

FIG. 115B is a representation of an image of the object, as viewed by the first camera channel, striking the sensor in the first camera channel. The sensor has a plurality of sensor elements shown schematically as circles.

FIG. 115C is a representation of an image of the object, as viewed by the second camera channel, striking the sensor in the second camera channel. The sensor has a plurality of sensor elements shown schematically as circles.

FIG. 115D shows the image viewed by the first camera channel superimposed with the image viewed by the second camera channel. In this embodiment, the parallax is in the x direction.

FIG. 115E shows the image viewed by the first camera channel superimposed with the image viewed by the second camera channel if such parallax is eliminated.

FIGS. 115F-115H show an example of parallax in the y direction. FIG. 115I shows the image viewed by the first camera channel superimposed with the image viewed by the second camera channel if such parallax is eliminated.

FIGS. 115J-115L show an example of parallax having an x component and a y component. FIG. 115M shows the image viewed by the first camera channel superimposed with the image viewed by the second camera channel if such parallax is eliminated.

FIG. 115N shows an object (i.e., a lightning bolt) and a digital camera apparatus having two camera channels spatially offset by a distance. The first camera channel has a sensor and a first field of view centered about a first axis. The second camera channel has a sensor and a second field of view that is centered about a second axis and spatially offset from the first field of view. The offset between the fields of view causes the position of the object within the first field of view to differ from the position of the object within the second field of view.

FIG. 115O is a representation of an image of the object, as viewed by the first camera channel, striking the sensor in the first camera channel. The sensor has a plurality of sensor elements shown schematically as circles.

FIG. 115P is a representation of an image of the object, as viewed by the second camera channel, striking the sensor in the second camera channel. The sensor has a plurality of sensor elements shown schematically as circles.

FIG. 115Q shows the image viewed by the first camera channel superimposed with the image viewed by the second camera channel. In this embodiment, the parallax is in the x direction.

FIG. 115R shows the image viewed by the first camera channel superimposed with the image viewed by the second camera channel if such parallax is eliminated.

FIG. 115S shows an object (i.e., a lightning bolt) and a digital camera apparatus having two camera channels spatially offset by a distance. The first camera channel has a sensor and a first field of view centered about a first axis. The second camera channel has a sensor and a second field of view that is centered about a second axis and spatially offset from the first field of view. The offset between the fields of view causes the position of the object within the first field of view to differ from the position of the object within the second field of view.

FIG. 115T is a representation of an image of the object, as viewed by the first camera channel, striking the sensor in the first camera channel. The sensor has a plurality of sensor elements shown schematically as circles.

FIG. 115U is a representation of an image of the object, as viewed by the second camera channel, striking the sensor in the second camera channel. The sensor has a plurality of sensor elements shown schematically as circles.

FIG. 115V shows the image viewed by the first camera channel superimposed with the image viewed by the second camera channel. In this embodiment, the parallax is in the x direction.

FIG. 115W shows the image viewed by the first camera channel superimposed with the image viewed by the second camera channel if such parallax is eliminated.

Range Finding

In some embodiments, it is desirable to be able to generate an estimate of the distance to an object within the field of view. This capability is sometimes referred to as "range finding".

One method for determining an estimate of a distance to an object is to employ parallax.

FIG. 116 shows a flowchart of operations that may be employed in generating an estimate of a distance to an object, or portion thereof, according to another embodiment of the present invention.

The system receives a signal indicative of a desired amount of parallax and/or one or more movements The system identifies one or more movements to provide or help provide the desired amount of parallax.

The system initiates one, some or all of the one or more movements.

An image is captured from each camera channel to be used in generating the estimate of the distance to the object (or portion thereof). For example, if two camera channels are to be used in generating the estimate, then an image is captured from the first camera channel and an image is captured from the second camera channel.

In some embodiments, the system receives one or more signals indicative of the position of the object in the images or determines the position of the object within each image. For example, if two camera channels are to be used in generating the estimate of the distance to the object, the system may receive one or more signals indicative of the position of the object in the image from the first camera channel and the position of the object in the image from the second camera channel. In some other embodiments, the system determines the position of the object within each image, e.g., the position of the object within the image for the first channel and the position of the object within the image for the second channel.

The system generates a signal indicative of the difference between the positions in the images. For example, if two camera channels are being used, the system generates a signal indicative of the difference between the position of the object in the image for the first camera channel and the position of the object in the image for the second camera channel.

The system generates an estimate of the distance to the object (or portion thereof) based at least in part on (1) the signal indicative of the difference between the position of the object in the image for the first camera channel and the position of the object in the image for the second camera channel (2) the signal indicative of the relative positioning of the first camera channel and the second camera channel and (3) data indicative of a correlation between (a) the difference between the position of the object in the image for the first camera channel and the position of the object in the image for second camera channel, (b) the relative positioning of the first camera channel and the second camera channel and (c) the distance to an object.

FIG. 117 is a block diagram showing a portion of one embodiment the range finder. In this embodiment, the range finder includes a differencer and an estimator. The differencer has one or more inputs that receive one or more signals indicative of the position of the object in a first image and the position of the object in a second image. The differencer further includes one or more outputs that supply a difference signal, Difference. The difference signal, Difference, is indicative of the difference between the position of the object in the first image and the position of the object in the second image.

The difference signal is supplied to the estimator, which also receives a signal indicative of the relative positioning between the camera channel that provided the first image and the camera channel that provided the second image. In response, the estimator provides an output signal, estimate, indicate of an estimate of the distance to the object (or portion thereof).

In order to accomplish this, the estimator includes data indicative of the relationship between (a) the difference between the position of the object in the first image and the position of the object in the second image, (b) the relative positioning of the camera channel generating the first image and the camera channel generating the second image and (c) the distance to an object.

This data may be in any form, including for example, but not limited to, a mapping of a relationship between inputs (e.g., (a) the difference between the position of the object in the first image and the position of the object in the second image and (b) the relative positioning of the camera channel generating the first image and the camera channel generating the second image) and the output (e.g., an estimate of the distance to the object).

The mapping may have any of various forms known to those skilled in the art, including but not limited to a formula and/or a look-up table. The mapping may be implemented in hardware, software, firmware or any combination thereof.

The mapping is preferably generated "off-line" by placing an object at a known distance from the digital camera apparatus, capturing two or more images with two or more camera channels having a known relative positioning and determining the difference between the position of the object in the image from the first camera channel and the position of the object in the image from the second camera channel.

This above process may be repeated so as to cover different combinations of known distance to the object and relative positioning of the camera channels. It may be advantageous to cover an entire range of interest (e.g. known distances and relative positioning), however, as explained below, it is generally not be necessary to cover every conceivable combination. Each combination of known distance to object, relative positioning of camera channels and difference between the position of the object in the image from the first camera channel and the position of the object in the image from the second camera channel represents one data point in the overall input output relation.

The data points may be used to create a look-up table that provides, for each of a plurality of combinations of input magnitudes, an associated output. Or, instead of a look-up table, the data points may be input to a statistical package to produce a formula for calculating the output based on the inputs. The formula can typically provide an appropriate output for any input combination in the sensor input range of interest, including combinations for which data points were not generated.

A look-up table embodiment may employ interpolation to determine an appropriate output for any input combination not in the look-up table.

The differencer may be any type of differencer that is adapted to provide one or more difference signals indicative of the difference between the position of the object in the first image and the position of the object in the second image. In this embodiment, for example, the differencer comprises an absolute value subtractor that generates a difference signal equal to the absolute value of the difference between the position of the object in the first image and the position of the object in the second image. In some other embodiments, the differencer may be a ratiometric type of differencer that generates a ratiometric difference signal indicative of the difference between the position of the object in the first image and the position of the object in the second image.

The signal indicative of the relative position of the camera channels may have any form. For example, the signal may be in the form of a single signal that is directly indicative of the difference in position between the camera channels. The signal may also be in the form of a plurality of signals, for example, two or more signals each of which indicates the position of a respective one of the camera channels such that the plurality of signals are indirectly indicative of the relative position of the camera channels.

Although the portion of range finder is shown having a differencer preceding the estimator, the range finder is not limited to such. For example, a differencer may be embodied within the estimator and/or a difference signal may be provided or generated in some other way. In some embodiments, the estimator may be responsive to absolute magnitudes rather than difference signals.

Furthermore, while the disclosed embodiment includes three inputs and one output, the range finder is not limited to such. The range finder may be employed with any number of inputs and outputs.

Range finding may also be carried out using only one camera channel. For example, one of the camera channels may be provided with a first view of an object and an image may be captured. Thereafter, one or more movements may be applied to one or more portions of the camera channel so as to provide the camera channel with a second view of the object (the second view being different that the first view). Such movements may be provided by the positioning system. A second image may be captured with the second view of the object. The first and second images may thereafter be processed by the range finder using the operations set forth above to generate an estimate of a distance to the object (or portion thereof).

FIG. 118 is a block diagram representation of a locator portion of the range finder.

3D Imaging

Referring to FIGS. 119A-119D, in some embodiments, it is desired to be able to produce images for use in providing one or more 3D effects, sometimes referred to herein as "3D imaging".

One type of 3D imaging is referred to as stereovision. Stereovision is based, at least in part, on the ability to provide two views of an object, e.g., one to be provided to the right eye, one to be provided the left eye. In some embodiment, the views are combined into a single stereo image. In one embodiment, for example, the view for the right eye may be blue and the view for the left eye may be red, in which case, a person wearing appropriate eyewear (e.g., blue eyepiece in front of left eye, red eyepiece in front of right eye) will see the appropriate view in the appropriate eye (i.e., right view in the right eye and the left view in the left eye). In another embodiment, the view for the right eye may be polarized in a first direction(s) and the view for the left eye may be polarized in a second direction(s) different than the first, in which case, a person wearing appropriate eyewear (e.g., eyepiece polarized in first direction(s) in front of left eye, eyepiece polarized in second direction(s) in front of left eye) will see the appropriate view in the appropriate eye (i.e., right view in the right eye and the left view in the left eye).

Referring to FIG. 120, another type of 3D imaging is referred to as 3D graphics, which is based, at least in part, on the ability to provide an image with an appearance of depth.

It is desirable to employ parallax when producing images for use in providing 3D effects.

Increasing the amount of parallax may help improve one or more characteristics of the 3D imaging.

FIG. 121-122 shows a flowchart of operations that may be employed in providing 3D imaging, according to another embodiment of the present invention.

The system receives a signal indicative of a desired amount of parallax and/or one or movements.

The system identifies one or more movements to provide or help provide the desired amount of parallax.

The system initiates one, some or all of the one or more movements identified.

The system generates one or more images with the desired 3D effect.

An image is captured from each camera channel to be used in the 3D imaging. For example, if two camera channels are to be used in the 3D imaging, then an image is captured from the first camera channel and an image is captured from the second camera channel.

The system determines whether stereovision is desired or whether 3D graphics is desired. If stereovision is desired, the image captured from the first camera channel and the image captured from the second camera channel are each supplied to a formatter, which generates two images, one suitable to be provided to one eye and one suitable to be provided to the other eye. For example, in one embodiment, for example, the view for the right eye may be blue and the view for the left eye may be red, in which case, a person wearing appropriate eyewear will see the appropriate view in the appropriate eye (i.e., right view in the right eye and the left view in the left eye). In another embodiment, the view for the right eye may be polarized in a first direction(s) and the view for the left eye may be polarized in a second direction(s) different than the first, in which case, a person wearing appropriate eyewear will see the appropriate view in the appropriate eye (i.e., right view in the right eye and the left view in the left eye).

The two images may be combined into a single stereo image.

If 3D graphics is desired instead of stereovision, the system characterizes the images using one or more characterization criteria. In one embodiment, for example, the characterization criteria includes identifying one or more features (e.g., edges) in the images and an estimate of the distance to one or more portions of such features. A range finder as set forth above may be used to generate estimates of distances to features or portions thereof. The system generates a 3D graphical image having the appearance of depth, at least in part, based, at least in part, on (1) the characterization data and (2) 3D rendering criteria.

The characterization criteria and the 3D graphical criteria may be predetermined, adaptively determined, and or combinations thereof.

It should be understood that 3D imaging may also be carried out using only one camera channel. For example, one of the camera channels may be provided with a first view of an object and an image may be captured. Thereafter, one or more movements may be applied to one or more portions of the camera channel so as to provide the camera channel with a second view of the object (the second view being different that the first view). Such movements may be provided by the positioning system. A second image may be captured with the second view of the object. The first and second images may thereafter be processed by the 3D imager using the operations set forth above to generate an estimate of a distance to the object (or portion thereof).

FIG. 123 is a block diagram representation of one embodiment for generating an image with a 3D effect.

FIG. 124 is a block diagram representation of one embodiment for generating an image with 3D graphics.

Image Discrimination

FIG. 125 shows a flowchart of operations that may be employed in providing image discrimination, according to another embodiment of the present invention.

FIGS. 126A-126B shows a flowchart of operations that may be employed in providing image discrimination, according to another embodiment of the present invention.

Other Embodiments

FIG. 127 is a schematic block diagram representation of one or more portions of a digital camera apparatus in accordance with another embodiment of the present invention.

FIG. 128 is a schematic block diagram representation of one or more portions of a digital camera apparatus in accordance with another embodiment of the present invention.

FIG. 129 is a schematic block diagram representation of one or more portions of a digital camera apparatus in accordance with another embodiment of the present invention.

FIG. 130 is a schematic block diagram representation of one or more portions of a digital camera apparatus in accordance with another embodiment of the present invention.

FIG. 131 is a schematic block diagram representation of one or more portions of a digital camera apparatus in accordance with another embodiment of the present invention.

FIG. 132 is a schematic block diagram representation of one or more portions of a digital camera apparatus in accordance with another embodiment of the present invention.

FIG. 133 is a schematic block diagram representation of one or more portions of a digital camera apparatus in accordance with another embodiment of the present invention.

FIG. 134 is a schematic block diagram representation of one or more portions of a digital camera apparatus in accordance with another embodiment of the present invention.

FIG. 135 is a schematic block diagram representation of one or more portions of a digital camera apparatus in accordance with another embodiment of the present invention.

FIG. 136 is a schematic block diagram representation of one or more portions of a digital camera apparatus in accordance with another embodiment of the present invention.

FIG. 137 is a schematic block diagram representation of one or more portions of a digital camera apparatus in accordance with another embodiment of the present invention.

FIG. 138 is one or more aspects/techniques/embodiments for implementing spectral optimization of one or more components of a digital camera apparatus in accordance with further embodiments of the present invention; one or more of the aspects/techniques/embodiments may be implemented in any of the embodiments described and/or illustrated herein.

Certain Other Applications

In some embodiments, the number of image sensors, size and/or type are selected based on application requirements. Described are three examples and how it can impact camera elements, and if desired, feature/operational optimization. It should be understood that any of the above embodiments, or portions thereof, may be employed in implementing any of the following examples.

1): Simultaneous Imaging Hyper-Spectral Digital Camera:

Hyper-spectral imagers take data in as many as one hundred distinct color bands. This can be accomplished by electronically tunable or mechanically selected narrow band filters. One problem with this tunable or selectable filter approach is that the color bands in the image are selected time sequentially. It takes many frames of data to collect the full hyper-spectral image (called a datacube) with 3-D pixel identifiers: x, y and color. In many system applications, acquiring the entire hyper-spectral datacube simultaneously in one frame of data is desired.

The disclosed multiple optical/imager approach can be used to acquire all color bands simultaneously using a separate color narrow band-pass filter in each sensor optical path. An example would be 64 individual sensors (custom optical assemblies, optional MEMs mechanical dither mechanisms and optimized color or multiple color imager sensors) arranged in, for example, a 8×8 or 1×64 or other sensor arrangements. This would give a hyper-spectral capability of sixty four unique color bands. Each sensor would have some suitable number of pixels in the image sensor to cover a desired field-of-view (for example: 256×256 pixels on the imager array assembled with a 3.mu.m pixel pitch).

Each image sensor can have a different pixel pitch and/or array size with the imager integrated circuit (IC) optimized for the incident color or color bands. If the frame rate of each sensor is 60 frames per second, data in 64 unique color bands would be acquired in one frame time (16.67 msec). This capability or similar capability is desirable for many hyper-spectral imaging applications.

2): Object (Threat) Detection and Identification Multi-Color Active/Passive Digital Camera:

Some camera systems need to acquire data from a wide field of view (WFOV) to detect an object of interest, then fast frame around that object in a narrow field of view (NFOV) with multiple color imaging capability and higher spatial resolution capability to identify that object.

The WFOV sensor, for example, could have a 128×128 array size with 20-micron pitch pixels to determine an object of interest within one or more pixels in the WFOV. The optics and pixels in the 128×128 array could be broadband visible capable for high sensitivity.

The entire digital camera (with the WFOV image sensor and multiple NFOV image sensors) can be pointed by a gimbal mechanism. The data from the WFOV image sensor can adjust the gimbal pointing direction such that the detected object is in the center of all FOVs.

The NFOV image sensors with higher resolution than the WFOV imager sensor can image and identify the object. The WFOV image sensor can continue to image a WFOV for detection of other objects of interest.

There can be multiple NFOV image sensors. The NFOV can be selected by pixel size, number of pixels (in x and y) and the focal length of the optics. As an example, the camera could contain six NFOV image sensors. The NFOV could image a region 1/100 that of the WFOV image sensor. If the focal lengths of the WFOV and NFOV optics are the same, a 128×128 image array with a 2.0.mu.m pixel pitch, for example, would provide the desired NFOV.

The six NFOV image sensors can all be different. One example is image sensors optimized for ultraviolet (UV), blue, green, red, broadband visible, 880 nm continuous laser illumination and 880 nm pulsed laser illumination. These six sensors can be optimizes for pixel size and array size to match the NFOV. In general, the pixel pitch will increase for longer wavelengths to match the optical blur circle. The pulsed 880 nm laser array can have special circuitry within each pixel to measure the amplitude and arrival time of the reflected laser pulse off the object; this capability called LADAR, provides distance to object, reflected signal amplitude and in some cases 3D information of the object's shape.

The WFOV imager sensor and the other six NFOV images sensors can be processed on a single integrated circuit. The location of the image sensors on the integrated circuit can be chosen to minimize integrated circuit area or for other considerations. Each sensor is optimized for its intended operation. The optical stack above each sensor provides the desired color transmission and other desired optical features. The optical stacks or portions there of can be mechanically dithered by a MEMs mechanical mechanism if desired to achieve higher spatial resolution or provide other capability (such as image stabilization or image focus).

The NFOV image sensors can go into a widowing readout with the reduced FOV (perhaps 32×32 pixels at 8× faster frame rate). The data from the NFOV sensors can be used to point the gimbal to keep the object of interest in the center of the reduced FOV.

3: Large Dynamic Range Color Digital Camera

Digital cameras may have a maximum photo-signal storage capacity that limits the dynamic range of the particular system. The photo-signal charge is stored on a capacitor within the pixel area. The charge handling capacity is limited by the maximum voltage swing in the integrated circuitry and the storage capacitance within the pixel. The amount of integrated photo-charge is directly related to the time the image sensor collects and integrates signal from the scene. This is known as integration time. A long integration time is desired for weak signals since more photo-charge is integrated within the pixel and the signal-to-noise of the digital camera is improved.

Once a maximum charge capacity is reached, the sensor can no longer tell how much brighter the image was. This creates an imaging dilemma by setting a single integration time for the entire field of view. The digital camera's integration time can be set to image low light levels and saturate bright signals or image high light levels and not detect low light levels (since the integrated photo-charge from low light levels is below the signal-to-noise of the sensor).

The use of multiple optics and image sensors on a single IC, all looking at the same field of view simultaneously, and each having different integration times, solves this dynamic range problem. The digital camera could have, for example a 3×3 assembly of image sensors, perhaps three of each color (R, G, and B) and the integration time in each color can be varied, for example each color can have three distinct values (perhaps 0.1, 1 and 10 msec). The data from each color of cameras can be digitally combined to provide a much greater dynamic range within one frame of digital camera data. While it would be difficult to display this wide dynamic range of imagery without compression, the raw digital camera data could be used by digital signal processing of the scene. The digital data can also be stored and displayed to exhibit low light or bright light characteristics as desired.

The optical stack can also contain other optical features that are desired for digital camera functionality and performance. This can be things such as electronically tunable filters, polarizers, wavefront coding, spatial filters (masks), and other features not yet anticipated. Some of the new features (in addition to the lenses) can be electrically operated (such as a tunable filter) or be moved mechanically with MEMs mechanisms.

The manufacture of the optical stacks and image sensors may be done on a single wafer, fabricated on separate wafers (perhaps two wafers: one for the IC, and one for optics) and bonded together at the wafer level. It is also possible to use pick and place methods and apparatus to attach the optical assemblies to the wafer IC, or the image sensor die and other assemblies (optical stack) can be assembled individually In embodiments that employ MEMS, manufacture of the optical stacks, MEMs and image sensors may be done on a single wafer, fabricated on separate wafers (perhaps up to three wafers: one for the IC, one for MEMs and one for optics) and bonded together at the wafer level. It is also possible to use pick and place methods and apparatus to attach the optical assemblies and MEMs to the wafer IC, or the image sensor die and other assemblies (MEMs and optical stack) can be assembled individually.

It should also be understood that although the digital camera apparatus 210 is shown employed in a digital camera 200, the present invention is not limited to such. Indeed, a digital camera apparatus and/or any of the methods and/or apparatus that may be employed therein may be used by itself or in any type of device, including for example, but not limited to, still and video cameras, cell phones, other personal communications devices, surveillance equipment, automotive applications, computers, manufacturing and inspection devices, toys, and/or a wide range of other and continuously expanding applications. Moreover, other devices that may employ a digital camera apparatus and/or any of the methods and/or apparatus employed may or may not include the housing, circuit board, peripheral user interface, power supply, electronic image storage media and aperture depicted in FIG. 2 (for example, the circuit board may not be unique to the camera function but rather the DCS be an add-on to an existing circuit board, such as in a cell phone) and may or may not employ methods and/or apparatus not shown in FIG. 2.

A digital camera may be a stand-alone product or may be imbedded in other appliances, such as cell phones, computers or the myriad of other imaging platforms now available or may be created in the future, such as those that become feasible as a result of this invention.

One or more embodiments of one or more aspects of the present invention may have one or more of the advantages below. A device according to the present invention can have multiple separate arrays on a single image sensor, each with its own lens. The simple geometry of a smaller, multiple arrays allows for a smaller lens (diameter, thickness and focal length), which allows for reduced stack height in the digital camera.

Each array can advantageously be focused on one band of visible spectrum. Among other things, each lens may be tuned for passage of that one specific band of wavelength. Since each lens would therefore not need to pass the entire light spectrum, the number of elements will be reduced, likely to one or two.

Further, due to the focused bandwidth for each lens, each of the lenses may be dyed during the manufacturing process for its respective bandwidth (e.g., red for the array targeting the red band of visible spectrum). Alternatively, a single color filter may be applied across each lens. This process eliminates the traditional color filters (the sheet of individual pixel filters) thereby reducing cost, improving signal strength and eliminating the pixel reduction barrier.

In some embodiments, once the integrated circuit die with the sensor arrays (and possibly one or more portions of the processor) have been assembled, the assembly is in the form of a hermetically sealed device. Consequently, such device does not need a "package" and as such, if desired, can be mounted directly to a circuit board which in some embodiments saves part cost and/or manufacturing costs. As stated above, the method and apparatus of the present invention is not limited to use in digital camera systems but rather may be used in any type of system including but not limited to any type of information system.

It should be understood that the features disclosed herein can be used in any combination.

Note that, except where otherwise stated, terms such as, for example, "comprises", "has", "includes", and all forms thereof, are considered open-ended, so as not to preclude additional elements and/or features. Further, except where otherwise stated, terms such as, for example, "in response to" and "based on" mean "in response at least to" and "based at least on", respectively, so as not to preclude being responsive to and/or based on, more than one thing.

As used herein identifying, determining, and generating includes identifying, determining, and generating, respectively, in any way, including, but not limited to, computing, accessing stored data and/or mapping (e.g., in a look up table) and/or combinations thereof.

While there have been shown and described various embodiments, it will be understood by those skilled in the art that the present invention is not limited to such embodiments, which have been presented by way of example only, and various changes and modifications may be made without departing from the scope of the invention.

What is claimed is:

1. An image capture device comprising:
a plurality of arrays of photodetectors, including:
a first array of photodetectors to sample an intensity of light for a first integration time; and
a second array of photodetectors to sample an intensity of light for a second integration time; and
signal processing circuitry, coupled to the first and second arrays of photodetectors, configured to generate a composite image using data which is representative of the intensity of light sampled by the first array of photodetectors for the first integration time and data which is representative of the intensity of light sampled by the second array of photodetectors for the second integration time.

2. The image capture device of claim 1, wherein the first integration time is different than the second integration time.

3. The image capture device of claim 1, wherein:
the first array of photodetectors sample an intensity of light of a first band of wavelengths for the first integration time; and
the second array of photodetectors sample an intensity of light of a second band of wavelengths for the second integration time, and wherein the first band of wavelengths is different from the second band of wavelengths.

4. The image capture device of claim 3, wherein the first band of wavelengths is associated with a first color and the second band of wavelengths is associated with a second color, and wherein the first color is different from the second color.

5. The image capture device of claim 1, wherein the first array of photodetectors and the second array of photodetectors are disposed on the same semiconductor substrate.

6. The image capture device of claim 1, further comprising:
a first optics portion associated with the first array of photodetectors; and
a second optics portion associated with the second array of photodetectors.

7. The image capture device of claim 6, wherein:
the first optics portion produces a first image area at an image plane; and
the second optics portion produces a second image area at the image plane.

8. The image capture device of claim 1, further comprising:
a first lens disposed in an optical path of the first array of photodetectors; and
a second lens disposed in an optical path of the second array of photodetectors.

9. A method comprising:
sampling an intensity of light for a first integration time using a first array of photodetectors;
sampling an intensity of light for a second integration time using a second array of photodetectors; and
generating a composite image using data representative of the intensity of light sampled by the first array of photodetectors for the first integration time and data representative of the intensity of light sampled by the second array of photodetectors for the second integration time.

10. The method of claim 9, wherein the first integration time is different than the second integration time.

11. The method of claim 9, wherein:
sampling an intensity of light for a first integration time comprises sampling an intensity of light of a first band of wavelengths for the first integration time; and
sampling an intensity of light for a second integration time comprises sampling an intensity of light of a second band of wavelengths for the second integration time.

12. The method of claim 11, further comprising:
passing light of the first band of wavelengths onto an image plane of the photodetectors of the first array; and
passing light of the second band of wavelengths onto an image plane of the photodetectors of the second array.

13. The method of claim 12, further comprising:
filtering light of the second band of wavelengths from the optical path of the first array of photo detectors; and
filtering light of the first band of wavelengths from the optical path of the second array of photo detectors.

14. The method of claim 13, wherein the first array of photodetectors and the second array of photodetectors are disposed on the same semiconductor substrate.

15. The method of claim 13, wherein the first array of photodetectors and the second array of photodetectors are integrated on or in the same semiconductor substrate.

16. The method of claim 13, wherein the first band of wavelengths is associated with a first color and the second band of wavelengths is associated with a second color, and wherein the first color is different from the second color.

17. A computer readable storage device including instructions stored thereon, the instructions being configured to perform operations comprising:
sampling an intensity of light for a first integration time using a first array of photodetectors;
sampling an intensity of light for a second integration time using a second array of photodetectors; and
generating a composite image using data representative of the intensity of light sampled by the first array of photodetectors for the first integration time and data representative of the intensity of light sampled by the second array of photodetectors for the second integration time.

18. The computer readable medium of claim 17, wherein the first integration time is different than the second integration time.

19. The computer readable medium of claim 17, wherein:
sampling an intensity of light for a first integration time comprises sampling an intensity of light of a first band of wavelengths for the first integration time; and
sampling an intensity of light for a second integration time comprises sampling an intensity of light of a second band of wavelengths for the second integration time.

20. The computer readable medium of claim 17, wherein the first array of photodetectors and the second array of photodetectors are integrated on or in the same semiconductor substrate.

* * * * *